US012122794B2

(12) United States Patent
Boudreault

(10) Patent No.: US 12,122,794 B2
(45) Date of Patent: *Oct. 22, 2024

(54) ORGANIC ELECTROLUMINESCENT MATERIALS AND DEVICES

(71) Applicant: UNIVERSAL DISPLAY CORPORATION, Ewing, NJ (US)

(72) Inventor: Pierre-Luc T. Boudreault, Pennington, NJ (US)

(73) Assignee: UNIVERSAL DISPLAY CORPORATION, Ewing, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/323,762

(22) Filed: May 25, 2023

(65) Prior Publication Data

US 2023/0312628 A1 Oct. 5, 2023

Related U.S. Application Data

(63) Continuation of application No. 17/502,329, filed on Oct. 15, 2021, now Pat. No. 11,697,662, which is a (Continued)

(51) Int. Cl.
*H01L 51/50* (2006.01)
*C07F 1/08* (2006.01)
(Continued)

(52) U.S. Cl.
CPC ............ *C07F 15/0033* (2013.01); *C07F 1/08* (2013.01); *C07F 1/12* (2013.01); *C07F 15/002* (2013.01);
(Continued)

(58) Field of Classification Search
None
See application file for complete search history.

(56) References Cited

U.S. PATENT DOCUMENTS 4,769,292 A 9/1988 Tang et al.
5,061,569 A 10/1991 VanSlyke et al.
(Continued)

FOREIGN PATENT DOCUMENTS

EP 0650955 5/1995
EP 1725079 11/2006
(Continued)

OTHER PUBLICATIONS

Padhi, S.K., et al., "Photo and Electrochemical Redox Behavior of Cyclometalated Ru (II) Complexes Having 3-Phenylbenzo [b] [1,6] naphthyridine Ligand", Inorg Chem., Nov. 2011, vol. 50(21):10718-23.
(Continued)

*Primary Examiner* — Gregory D Clark
(74) *Attorney, Agent, or Firm* — DUANE MORRIS LLP

(57) ABSTRACT

A compound comprising a first ligand $L_A$ of Formula I,

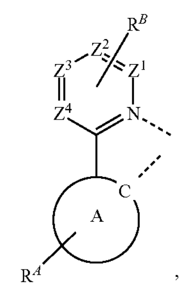

is disclosed. In the structure of Formula I, ring A is a 5-membered or 6-membered carbocyclic or heterocyclic
(Continued)

ring, $Z^1$-$Z^4$ are each independently C or N; at least two consecutive $Z^1$-$Z^4$ are C, and are fused to a structure of Formula II

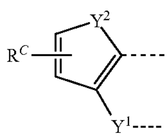

or Formula III

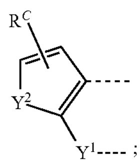

$Y^1$ and $Y^2$ are each independently O, S, Se, CRR', SiRR', or GeRR'; each $R^A$, $R^B$, $R^C$, R, and R' is a hydrogen or a substituent; and any two substituents may be joined or fused together to form a ring. In the compound, $L_A$ is complexed to a metal M by the dashed lines in Formula I to form a five-membered chelate ring, and M has an atomic weight greater than 40. Organic light emitting devices and consumer products containing the compounds are also disclosed.

20 Claims, 2 Drawing Sheets

Related U.S. Application Data continuation of application No. 16/260,432, filed on Jan. 29, 2019, now Pat. No. 11,180,519.

(60) Provisional application No. 62/628,434, filed on Feb. 9, 2018.

(51) Int. Cl.

| | |
|---|---|
| ***C07F 1/12*** | (2006.01) |
| ***C07F 15/00*** | (2006.01) |
| ***H10K 50/11*** | (2023.01) |
| ***H10K 50/17*** | (2023.01) |
| ***H10K 50/18*** | (2023.01) |
| ***H10K 50/82*** | (2023.01) |
| ***H10K 85/30*** | (2023.01) |
| ***H10K 85/60*** | (2023.01) |
| *H10K 50/15* | (2023.01) |
| *H10K 50/16* | (2023.01) |
| *H10K 101/10* | (2023.01) |
| *H10K 102/00* | (2023.01) |

(52) U.S. Cl.

CPC ........ *C07F 15/006* (2013.01); *C07F 15/0086* (2013.01); *H10K 50/11* (2023.02); *H10K 50/17* (2023.02); *H10K 50/18* (2023.02); *H10K 50/82* (2023.02); *H10K 85/342* (2023.02); *H10K 85/346* (2023.02); *H10K 85/348* (2023.02); *H10K 85/371* (2023.02); *H10K 85/622* (2023.02); *H10K 85/654* (2023.02); *H10K 85/6572* (2023.02); *H10K 85/6576* (2023.02); *H10K 50/15* (2023.02); *H10K 50/16* (2023.02); *H10K 85/631* (2023.02); *H10K 2101/10* (2023.02); *H10K 2102/321* (2023.02); *H10K 2102/351* (2023.02)

(56) References Cited

U.S. PATENT DOCUMENTS

| | | | |
|---|---|---|---|
| 5,247,190 | A | 9/1993 | Friend et al. |
| 5,703,436 | A | 12/1997 | Forrest et al. |
| 5,707,745 | A | 1/1998 | Forrest et al. |
| 5,834,893 | A | 11/1998 | Bulovic et al. |
| 5,844,363 | A | 12/1998 | Gu et al. |
| 6,013,982 | A | 1/2000 | Thompson et al. |
| 6,087,196 | A | 7/2000 | Sturm et al. |
| 6,091,195 | A | 7/2000 | Forrest et al. |
| 6,097,147 | A | 8/2000 | Baldo et al. |
| 6,294,398 | B1 | 9/2001 | Kim et al. |
| 6,303,238 | B1 | 10/2001 | Thompson et al. |
| 6,337,102 | B1 | 1/2002 | Forrest et al. |
| 6,468,819 | B1 | 10/2002 | Kim et al. |
| 6,528,187 | B1 | 3/2003 | Okada |
| 6,687,266 | B1 | 2/2004 | Ma et al. |
| 6,835,469 | B2 | 12/2004 | Kwong et al. |
| 6,921,915 | B2 | 7/2005 | Takiguchi et al. |
| 7,087,321 | B2 | 8/2006 | Kwong et al. |
| 7,090,928 | B2 | 8/2006 | Thompson et al. |
| 7,154,114 | B2 | 12/2006 | Brooks et al. |
| 7,250,226 | B2 | 7/2007 | Tokito et al. |
| 7,279,704 | B2 | 10/2007 | Walters et al. |
| 7,332,232 | B2 | 2/2008 | Ma et al. |
| 7,338,722 | B2 | 3/2008 | Thompson et al. |
| 7,393,599 | B2 | 7/2008 | Thompson et al. |
| 7,396,598 | B2 | 7/2008 | Takeuchi et al. |
| 7,431,968 | B1 | 10/2008 | Shtein et al. |
| 7,445,855 | B2 | 11/2008 | Mackenzie et al. |
| 7,534,505 | B2 | 5/2009 | Lin et al. |
| 2002/0034656 | A1 | 3/2002 | Thompson et al. |
| 2002/0134984 | A1 | 9/2002 | Igarashi |
| 2002/0158242 | A1 | 10/2002 | Son et al. |
| 2003/0108771 | A1 | 6/2003 | Lecloux |
| 2003/0138657 | A1 | 7/2003 | Li et al. |
| 2003/0152802 | A1 | 8/2003 | Tsuboyama et al. |
| 2003/0162053 | A1 | 8/2003 | Marks et al. |
| 2003/0175553 | A1 | 9/2003 | Thompson et al. |
| 2003/0230980 | A1 | 12/2003 | Forrest et al. |
| 2004/0036077 | A1 | 2/2004 | Ise |
| 2004/0137267 | A1 | 7/2004 | Igarashi et al. |
| 2004/0137268 | A1 | 7/2004 | Igarashi et al. |
| 2004/0174116 | A1 | 9/2004 | Lu et al. |
| 2005/0025993 | A1 | 2/2005 | Thompson et al. |
| 2005/0112407 | A1 | 5/2005 | Ogasawara et al. |
| 2005/0238919 | A1 | 10/2005 | Ogasawara |
| 2005/0244673 | A1 | 11/2005 | Satoh et al. |
| 2005/0260441 | A1 | 11/2005 | Thompson et al. |
| 2005/0260449 | A1 | 11/2005 | Walters et al. |
| 2006/0008670 | A1 | 1/2006 | Lin et al. |
| 2006/0202194 | A1 | 9/2006 | Jeong et al. |
| 2006/0240279 | A1 | 10/2006 | Adamovich et al. |
| 2006/0251923 | A1 | 11/2006 | Lin et al. |
| 2006/0263635 | A1 | 11/2006 | Ise |
| 2006/0280965 | A1 | 12/2006 | Kwong et al. |
| 2007/0190359 | A1 | 8/2007 | Knowles et al. |
| 2007/0278938 | A1 | 12/2007 | Yabunouchi et al. |
| 2008/0015355 | A1 | 1/2008 | Schafer et al. |
| 2008/0018221 | A1 | 1/2008 | Egen et al. |
| 2008/0106190 | A1 | 5/2008 | Yabunouchi et al. |
| 2008/0124572 | A1 | 5/2008 | Mizuki et al. |
| 2008/0220265 | A1 | 9/2008 | Xia et al. |
| 2008/0297033 | A1 | 12/2008 | Knowles et al. |
| 2009/0008605 | A1 | 1/2009 | Kawamura et al. |
| 2009/0009065 | A1 | 1/2009 | Nishimura et al. |
| 2009/0017330 | A1 | 1/2009 | Iwakuma et al. |
| 2009/0030202 | A1 | 1/2009 | Iwakuma et al. |
| 2009/0039776 | A1 | 2/2009 | Yamada et al. |
| 2009/0045730 | A1 | 2/2009 | Nishimura et al. |
| 2009/0045731 | A1 | 2/2009 | Nishimura et al. |

(56) References Cited

U.S. PATENT DOCUMENTS

| | | | |
|---|---|---|---|
| 2009/0101870 | A1 | 4/2009 | Prakash et al. |
| 2009/0108737 | A1 | 4/2009 | Kwong et al. |
| 2009/0115316 | A1 | 5/2009 | Zheng et al. |
| 2009/0165846 | A1 | 7/2009 | Johannes et al. |
| 2009/0167162 | A1 | 7/2009 | Lin et al. |
| 2009/0179554 | A1 | 7/2009 | Kuma et al. |
| 2016/0365520 | A1 | 12/2016 | Stoessel |

FOREIGN PATENT DOCUMENTS

| | | | |
|---|---|---|---|
| EP | 2034538 | 3/2009 | |
| JP | 200511610 | 1/2005 | |
| JP | 2007123392 | 5/2007 | |
| JP | 2007254297 | 10/2007 | |
| JP | 2008074939 | 4/2008 | |
| JP | 2016219490 | * 12/2016 | ............ H01L 51/50 |
| WO | 01/39234 | 5/2001 | |
| WO | 02/02714 | 1/2002 | |
| WO | 02015654 | 2/2002 | |
| WO | 03040257 | 5/2003 | |
| WO | 03060956 | 7/2003 | |
| WO | 2004093207 | 10/2004 | |
| WO | 2004107822 | 12/2004 | |
| WO | 2005014551 | 2/2005 | |
| WO | 2005019373 | 3/2005 | |
| WO | 2005030900 | 4/2005 | |
| WO | 2005089025 | 9/2005 | |
| WO | 2005123873 | 12/2005 | |
| WO | 2006009024 | 1/2006 | |
| WO | 2006056418 | 6/2006 | |
| WO | 2006072002 | 7/2006 | |
| WO | 2006082742 | 8/2006 | |
| WO | 2006098120 | 9/2006 | |
| WO | 2006100298 | 9/2006 | |
| WO | 2006103874 | 10/2006 | |
| WO | 2006114966 | 11/2006 | |
| WO | 2006132173 | 12/2006 | |
| WO | 2007002683 | 1/2007 | |
| WO | 2007004380 | 1/2007 | |
| WO | 2007063754 | 6/2007 | |
| WO | 2007063796 | 6/2007 | |
| WO | 2008056746 | 5/2008 | |
| WO | 2008101842 | 8/2008 | |
| WO | 2008132085 | 11/2008 | |
| WO | 2009000673 | 12/2008 | |
| WO | 2009003898 | 1/2009 | |
| WO | 2009008311 | 1/2009 | |
| WO | 2009018009 | 2/2009 | |
| WO | 2009021126 | 2/2009 | |
| WO | 2009050290 | 4/2009 | |
| WO | 2009062578 | 5/2009 | |
| WO | 2009063833 | 5/2009 | |
| WO | 2009066778 | 5/2009 | |
| WO | 2009066779 | 5/2009 | |
| WO | 2009086028 | 7/2009 | |
| WO | 2009100991 | 8/2009 | |

OTHER PUBLICATIONS

Yang, L., et al., “Electro and spectroelectrochemistry of platinum (II) bipyridine complexes and related species”, Journal of Organometallic Chemistry, vol. 525, Issues 1-2, Nov. 15, 1996, pp. 1-8.

Adachi, Chihaya et al., “Organic Electroluminescent Device Having a Hole Conductor as an Emitting Layer,” Appl. Phys. Lett., 55(15): 1489-1491 (1989).

Adachi, Chihaya et al., “Nearly 100% Internal Phosphorescence Efficiency in an Organic Light Emitting Device,” J. Appl. Phys., 90(10): 5048-5051 (2001).

Adachi, Chihaya et al., “High-Efficiency Red Electrophosphorescence Devices,” Appl. Phys. Lett., 78(11)1622-1624 (2001).

Aonuma, Masaki et al., “Material Design of Hole Transport Materials Capable of Thick-Film Formation in Organic Light Emitting Diodes,” Appl. Phys. Lett., 90, Apr. 30, 2007, 183503-1-183503-3.

Baldo et al., Highly Efficient Phosphorescent Emission from Organic Electroluminescent Devices, Nature, vol. 395, 151-154, (1998).

Baldo et al., Very high-efficiency green organic light-emitting devices based on electrophosphorescence, Appl. Phys. Lett., vol. 75, No. 1, 4-6 (1999).

Gao, Zhiqiang et al., “Bright-Blue Electroluminescence From a Silyl-Substituted ter-(phenylene-vinylene) derivative,” Appl. Phys. Lett., 74(6): 865-867 (1999).

Guo, Tzung-Fang et al., “Highly Efficient Electrophosphorescent Polymer Light-Emitting Devices,” Organic Electronics, 1: 15-20 (2000).

Hamada, Yuji et al., “High Luminance in Organic Electroluminescent Devices with Bis(10-hydroxybenzo[h]quinolinato) beryllium as an Emitter,” Chem. Lett., 905-906 (1993).

Holmes, R.J. et al., “Blue Organic Electrophosphorescence Using Exothermic Host-Guest Energy Transfer,” Appl. Phys. Lett., 82(15):2422-2424 (2003).

Hu, Nan-Xing et al., “Novel High Tg Hole-Transport Molecules Based on Indolo[3,2-b]carbazoles for Organic Light-Emitting Devices,” Synthetic Metals, 111-112:421-424 (2000).

Huang, Jinsong et al., “Highly Efficient Red-Emission Polymer Phosphorescent Light-Emitting Diodes Based on Two Novel Tris(1-phenylisoquinolinato-C2,N)iridium(III) Derivatives,” Adv. Mater., 19:739-743 (2007).

Huang, Wei-Sheng et al., “Highly Phosphorescent Bis-Cyclometalated Iridium Complexes Containing Benzoimidazole-Based Ligands,” Chem. Mater., 16(12):2480-2488 (2004).

Hung, L.S. et al., “Anode Modification in Organic Light-Emitting Diodes by Low-Frequency Plasma Polymerization of CHF3,” Appl. Phys. Lett., 78(5):673-675 (2001).

Ikai, Masamichi et al., “Highly Efficient Phosphorescence From Organic Light-Emitting Devices with an Exciton-Block Layer,” Appl. Phys. Lett., 79(2):156-158 (2001).

Ikeda, Hisao et al., “P-185 Low-Drive-Voltage OLEDs with a Buffer Layer Having Molybdenum Oxide,” SID Symposium Digest, 37:923-926 (2006).

Inada, Hiroshi and Shirota, Yasuhiko, “1,3,5-Tris[4-(diphenylamino)phenyl]benzene and its Methylsubstituted Derivatives as a Novel Class of Amorphous Molecular Materials,” J. Mater. Chem., 3(3):319-320 (1993).

Kanno, Hiroshi et al., “Highly Efficient and Stable Red Phosphorescent Organic Light-Emitting Device Using bis [2-(2-benzothiazoyl)phenolato]zinc(II) as host material,” Appl. Phys. Lett., 90:123509-1-123509-3 (2007).

Kido, Junji et al., 1,2,4-Triazole Derivative as an Electron Transport Layer in Organic Electroluminescent Devices, Jpn. J. Appl. Phys., 32:L917-L920 (1993).

Kuwabara, Yoshiyuki et al., “Thermally Stable Multilayered Organic Electroluminescent Devices Using Novel Starburst Molecules, 4,4',4"-Tri(N-carbazolyl)triphenylamine (TCTA) and 4,4',4"-Tris(3-methylphenylphenyl-amino) triphenylamine (m-MTDATA), as Hole-Transport Materials,” Adv. Mater., 6(9):677-679 (1994).

Kwong, Raymond C. et al., “High Operational Stability of Electrophosphorescent Devices,” Appl. Phys. Lett., 81(1) 162-164 (2002).

Lamansky, Sergey et al., “Synthesis and Characterization of Phosphorescent Cyclometalated Iridium Complexes,” Inorg. Chem., 40(7):1704-1711 (2001).

Lee, Chang-Lyoul et al., “Polymer Phosphorescent Light-Emitting Devices Doped with Tris(2-phenylpyridine) Iridium as a Triplet Emitter,” Appl. Phys. Lett., 77(15):2280-2282 (2000).

Lo, Shih-Chun et al., “Blue Phosphorescence from Iridium(III) Complexes at Room Temperature,” Chem. Mater., 18(21)5119-5129 (2006).

Ma, Yuguang et al., “Triplet Luminescent Dinuclear-Gold(I) Complex-Based Light-Emitting Diodes with Low Turn-On voltage,” Appl. Phys. Lett., 74(10):1361-1363 (1999).

Mi, Bao-Xiu et al., “Thermally Stable Hole-Transporting Material for Organic Light-Emitting Diode an Isoindole Derivative,” Chem. Mater., 15(16):3148-3151 (2003).

(56) References Cited

OTHER PUBLICATIONS

Nishida, Jun-ichi et al., "Preparation, Characterization, and Electroluminescence Characteristics of α-Diimine-type Platinum(II) Complexes with Perfluorinated Phenyl Groups as Ligands," Chem. Lett., 34(4): 592-593 (2005).
Niu, Yu-Hua et al., "Highly Efficient Electrophosphorescent Devices with Saturated Red Emission from a Neutral Osmium Complex," Chem. Mater., 17(13):3532-3536 (2005).
Noda, Tetsuya and Shirota, Yasuhiko, "5,5'-Bis(dimesitylboryl)-2,2'-bithiophene and 5,5"-Bis (dimesitylboryl)-2,2'5',2"-terthiophene as a Novel Family of Electron-Transporting Amorphous Molecular Materials," J. Am. Chem. Soc., 120 (37):9714-9715 (1998).
Okumoto, Kenji et al., "Green Fluorescent Organic Light-Emitting Device with External Quantum Efficiency of Nearly 10%," Appl. Phys. Lett., 89:063504-1-063504-3 (2006).
Palilis, Leonidas C., "High Efficiency Molecular Organic Light-Emitting Diodes Based on Silole Derivatives and Their Exciplexes," Organic Electronics, 4:113-121 (2003).
Paulose, Betty Marie Jennifer S. et al., "First Examples of Alkenyl Pyridines as Organic Ligands for Phosphorescent Iridium Complexes," Adv. Mater., 16(22):2003-2007 (2004).
Ranjan, Sudhir et al., "Realizing Green Phosphorescent Light-Emitting Materials from Rhenium(I) Pyrazolato Diimine Complexes," Inorg. Chem., 42(4):1248-1255 (2003).
Sakamoto, Youichi et al., "Synthesis, Characterization, and Electron-Transport Property of Perfluorinated Phenylene Dendrimers," J. Am. Chem. Soc., 122(8):1832-1833 (2000).
Salbeck, J. et al., "Low Molecular Organic Glasses for Blue Electroluminescence," Synthetic Metals, 91: 209-215 (1997).
Shirota, Yasuhiko et al., "Starburst Molecules Based on pi-Electron Systems as Materials for Organic Electroluminescent Devices," Journal of Luminescence, 72-74:985-991 (1997).
Sotoyama, Wataru et al., "Efficient Organic Light-Emitting Diodes with Phosphorescent Platinum Complexes Containing N^C^N-Coordinating Tridentate Ligand," Appl. Phys. Lett., 86:153505-1-153505-3 (2005).
Sun, Yiru and Forrest, Stephen R., "High-Efficiency White Organic Light Emitting Devices with Three Separate Phosphorescent Emission Layers," Appl. Phys. Lett., 91:263503-1-263503-3 (2007).
T. Östergård et al., "Langmuir-Blodgett Light-Emitting Diodes of Poly(3-Hexylthiophene) Electro-Optical Characteristics Related to Structure," Synthetic Metals, 88:171-177 (1997).
Takizawa, Shin-ya et al., "Phosphorescent Iridium Complexes Based on 2-Phenylimidazo[1,2-α]pyridine Ligands Tuning of Emission Color toward the Blue Region and Application to Polymer Light-Emitting Devices," Inorg. Chem., 46(10):4308-4319 (2007).
Tang, C.W. and VanSlyke, S.A., "Organic Electroluminescent Diodes," Appl. Phys. Lett., 51(12):913-915 (1987).
Tung, Yung-Liang et al., "Organic Light-Emitting Diodes Based on Charge-Neutral Ru II PHosphorescent Emitters," Adv. Mater., 17(8)1059-1064 (2005).
Van Slyke, S. A. et al., "Organic Electroluminescent Devices with Improved Stability," Appl. Phys. Lett., 69(15):2160-2162 (1996).
Wang, Y. et al., "Highly Efficient Electroluminescent Materials Based on Fluorinated Organometallic Iridium Compounds," Appl. Phys. Lett., 79(4):449-451 (2001).
Wong, Keith Man-Chung et al., A Novel Class of Phosphorescent Gold(III) Alkynyl-Based Organic Light-Emitting Devices with Tunable Colour, Chem. Commun., 2906-2908 (2005).
Wong, Wai-Yeung, "Multifunctional Iridium Complexes Based on Carbazole Modules as Highly Efficient Electrophosphors," Angew. Chem. Int. Ed., 45:7800-7803 (2006).

* cited by examiner

ORGANIC ELECTROLUMINESCENT MATERIALS AND DEVICES

CROSS-REFERENCE TO RELATED APPLICATIONS

This application is a continuation of U.S. application Ser. No. 17/502,329, filed Oct. 15, 2021, is a continuation of U.S. application Ser. No. 16/260,432, filed Jan. 29, 2019, now U.S. Pat. No. 11,180,519, which claims priority under 35 U.S.C. § 119(e) to U.S. Provisional Application No. 62/628,434, filed Feb. 9, 2018, the entire contents of which are incorporated herein by reference.

FIELD

The present invention relates to compounds for use as emitters, and devices, such as organic light emitting diodes, including the same.

BACKGROUND

Opto-electronic devices that make use of organic materials are becoming increasingly desirable for a number of reasons. Many of the materials used to make such devices ae relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

One example of a green emissive molecule is tris(2-phenylpyridine) iridium, denoted $Ir(ppy)_3$, which has the following structure:

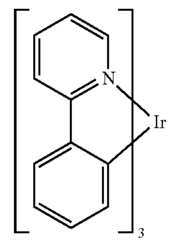

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processable" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher"

HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY

According to an aspect of the present disclosure, a compound comprising a first ligand $L_A$ of Formula I,

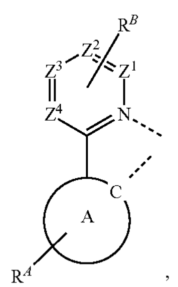

is disclosed. In the structure of Formula I:

- ring A is a 5-membered or 6-membered carbocyclic or heterocyclic ring;
- $Z^1$-$Z^4$ are each independently C or N;
- at least two consecutive $Z^1$-$Z^4$ are C, and are fused to a structure of Formula II

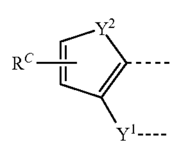

or Formula III

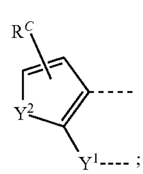

- $Y^1$ and $Y^2$ are each independently selected from the group consisting of O, S, Se, CRR', SiRR', and GeRR';
- $R^A$ and $R^C$ represent mono to a maximum possible number of substitutions on the carbon atoms of the ring attached thereto, or no substitution;

- $R^B$ represents di-, tri-, or tetra-substitution;
- each $R^A$, $R^B$, $R^C$, R, and R' is a hydrogen or a substituent selected independently from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof;
- any two substituents may be joined or fused together to form a ring,
- $L_A$ is complexed to a metal M by the dashed lines in Formula I to form a five-membered chelate ring, and M has an atomic weight greater than 40;
- M is optionally coordinated to other ligands;
- the ligand $L_A$ is optionally linked with other ligands to comprise a tridentate, tetradentate, pentadentate, or hexadentate ligand.

An OLED comprising the compound of the present disclosure in an organic layer therein is also disclosed.

A consumer product comprising the OLED is also disclosed.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

Figure 1:
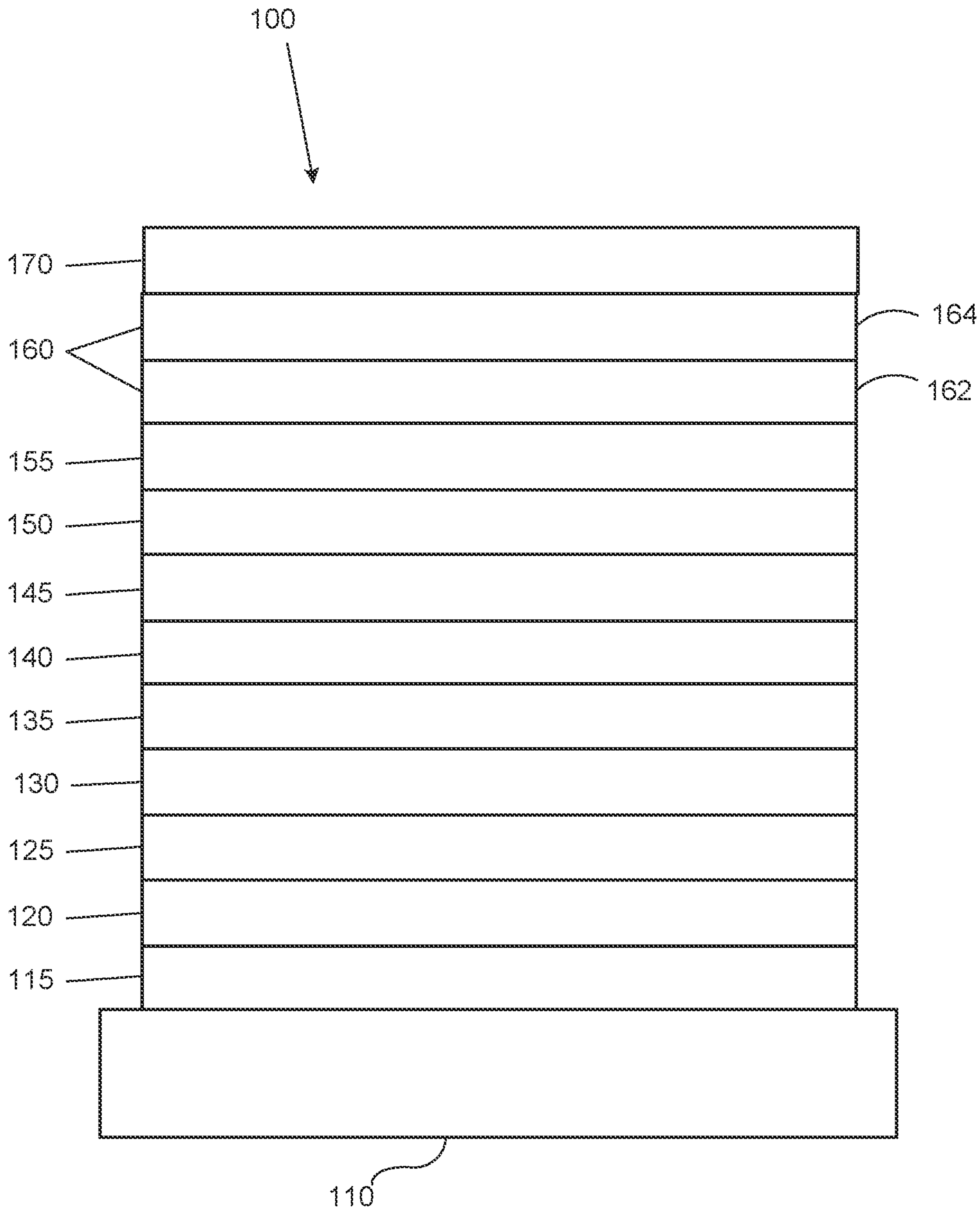
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
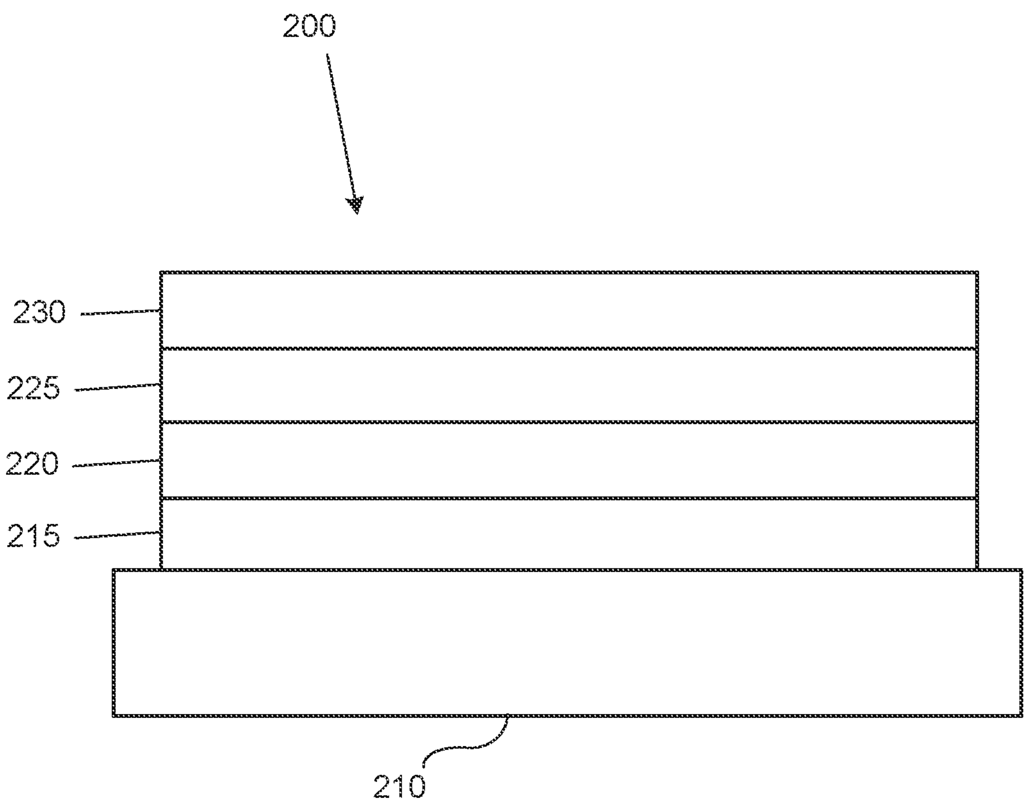
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and organic vapor jet printing (OVJP). Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include flat panel displays, curved displays, computer monitors, medical monitors, televisions, billboards, lights for interior or exterior illumination and/or signaling, heads-up displays, fully or partially transparent displays, flexible displays, rollable displays, foldable displays, stretchable displays, laser printers, telephones, mobile phones, tablets, phablets, personal digital assistants (PDAs), wearable devices, laptop computers, digital cameras, camcorders, viewfinders, micro-displays (displays that are less than 2 inches diagonal), 3-D displays, virtual reality or augmented reality displays, vehicles, video walls comprising multiple displays tiled together, theater or stadium screen, a light therapy device, and a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.), but could be used outside this temperature range, for example, from −40 degree C. to +80 degree C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms "halo," "halogen," and "halide" are used interchangeably and refer to fluorine, chlorine, bromine, and iodine.

The term "acyl" refers to a substituted carbonyl radical (C(O)—$R_s$).

The term "ester" refers to a substituted oxycarbonyl (—O—C(O)—$R_s$ or —C(O)—O—$R_s$) radical.

The term "ether" refers to an —$OR_s$ radical.

The terms "sulfanyl" or "thio-ether" are used interchangeably and refer to a —$SR_s$ radical.

The term "sulfrnyl" refers to a —S(O)—$R_s$ radical.

The term "sulfonyl" refers to a —SO—$R_s$ radical.

The term "phosphino" refers to a —$P(R_s)_3$ radical, wherein each $R_s$ can be same or different.

The term "silyl" refers to a —$Si(R_s)_3$ radical, wherein each $R_s$ can be same or different.

In each of the above, $R_s$ can be hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, and combination thereof. Preferred $R_s$ is selected from the group consisting of alkyl, cycloalkyl, aryl, heteroaryl, and combination thereof.

The term "alkyl" refers to and includes both straight and branched chain alkyl radicals. Preferred alkyl groups are those containing from one to fifteen carbon atoms and includes methyl, ethyl, propyl, 1-methylethyl, butyl, 1-methylpropyl, 2-methylpropyl, pentyl, 1-methylbutyl, 2-methylbutyl, 3-methylbutyl, 1,1-dimethylpropyl, 1,2-dimethylpropyl, 2,2-dimethylpropyl, and the like. Additionally, the alkyl group is optionally substituted.

The term "cycloalkyl" refers to and includes monocyclic, polycyclic, and spiro alkyl radicals. Preferred cycloalkyl groups are those containing 3 to 12 ring carbon atoms and includes cyclopropyl, cyclopentyl, cyclohexyl, bicyclo[3.1.1]heptyl, spiro[4.5]decyl, spiro[5.5]undecyl, adamantyl, and the like. Additionally, the cycloalkyl group is optionally substituted.

The terms "heteroalkyl" or "heterocycloalkyl" refer to an alkyl or a cycloalkyl radical, respectively, having at least one carbon atom replaced by a heteroatom. Optionally the at least one heteroatom is selected from O, S, N, P, B, Si and Se, preferably, O, S or N. Additionally, the heteroalkyl or heterocycloalkyl group is optionally substituted.

The term "alkenyl" refers to and includes both straight and branched chain alkene radicals. Alkenyl groups are essentially alkyl groups that include at least one carbon-carbon double bond in the alkyl chain. Cycloalkenyl groups are essentially cycloalkyl groups that include at least one carbon-carbon double bond in the cycloalkyl ring. The term "heteroalkenyl" as used herein refers to an alkenyl radical having at least one carbon atom replaced by a heteroatom. Optionally the at least one heteroatom is selected from O, S, N, P, B, Si, and Se, preferably, O, S, or N. Preferred alkenyl, cycloalkenyl, or heteroalkenyl groups are those containing two to fifteen carbon atoms. Additionally, the alkenyl, cycloalkenyl, or heteroalkenyl group is optionally substituted.

The term "alkynyl" refers to and includes both straight and branched chain alkyne radicals. Preferred alkynyl groups are those containing two to fifteen carbon atoms. Additionally, the alkynyl group is optionally substituted.

The terms "aralkyl" or "arylalkyl" are used interchangeably and refer to an alkyl group that is substituted with an aryl group. Additionally, the aralkyl group is optionally substituted.

The term "heterocyclic group" refers to and includes aromatic and non-aromatic cyclic radicals containing at least one heteroatom. Optionally the at least one heteroatom is selected from O, S, N, P, B, Si, and Se, preferably, O, S, or N. Hetero-aromatic cyclic radicals may be used interchangeably with heteroaryl. Preferred hetero-non-aromatic cyclic groups are those containing 3 to 7 ring atoms which includes at least one hetero atom, and includes cyclic amines such as morpholino, piperidino, pyrrolidino, and the like, and cyclic ethers/thio-ethers, such as tetrahydrofuran, tetrahydropyran, tetrahydrothiophene, and the like. Additionally, the heterocyclic group may be optionally substituted.

The term "aryl" refers to and includes both single-ring aromatic hydrocarbyl groups and polycyclic aromatic ring systems. The polycyclic rings may have two or more rings in which two carbons are common to two adjoining rings (the rings are "fused") wherein at least one of the rings is an aromatic hydrocarbyl group, e.g., the other rings can be cycloalkyls, cycloalkenyls, aryl, heterocycles, and/or heteroaryls. Preferred aryl groups are those containing six to thirty carbon atoms, preferably six to twenty carbon atoms, mom preferably six to twelve carbon atoms. Especially preferred is an aryl group having six carbons, ten carbons or twelve carbons. Suitable aryl groups include phenyl, biphenyl, triphenyl, triphenylene, tetraphenylene, naphthalene, anthracene, phenalene, phenanthrene, fluorene, pyrene, chrysene, perylene, and azulene, preferably phenyl, biphenyl, triphenyl, triphenylene, fluorene, and naphthalene. Additionally, the aryl group is optionally substituted.

The term "heteroaryl" refers to and includes both single-ring aromatic groups and polycyclic aromatic ring systems that include at least one heteroatom. The heteroatoms include, but are not limited to O, S, N, P, B, Si, and Se. In many instances, O, S, or N are the preferred heteroatoms. Hetero-single ring aromatic systems are preferably single rings with 5 or 6 ring atoms, and the ring can have from one to six heteroatoms. The hetero-polycyclic ring systems can have two or more rings in which two atoms are common to two adjoining rings (the rings are "fused") wherein at least one of the rings is a heteroaryl, e.g., the other rings can be cycloalkyls, cycloalkenyls, aryl, heterocycles, and/or heteroaryls. The hetero-polycyclic aromatic ring systems can have from one to six heteroatoms per ring of the polycyclic aromatic ring system. Preferred heteroaryl groups are those containing three to thirty carbon atoms, preferably three to twenty carbon atoms, more preferably three to twelve carbon atoms. Suitable heteroaryl groups include dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine, preferably dibenzothiophene, dibenzofuran, dibenzoselenophene, carbazole, indolocarbazole, imidazole, pyridine, triazine, benzimidazole, 1,2-azaborine, 1,3-azaborine, 1,4-azaborine, borazine, and aza-analogs thereof. Additionally, the heteroaryl group is optionally substituted.

Of the aryl and heteroaryl groups listed above, the groups of triphenylene, naphthalene, anthracene, dibenzothiophene, dibenzofuran, dibenzoselenophene, carbazole, indolocarbazole, imidazole, pyridine, pyrazine, pyrimidine, triazine, and benzimidazole, and the respective aza-analogs of each thereof are of particular interest.

The terms alkyl, cycloalkyl, heteroalkyl, heterocycloalkyl, alkenyl, cycloalkenyl, heteroalkenyl, alkynyl, aralkyl, heterocyclic group, aryl, and heteroaryl, as used herein, are independently unsubstituted, or independently substituted, with one or more general substituents.

In many instances, the general substituents are selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, and combinations thereof.

In some instances, the preferred general substituents are selected from the group consisting of deuterium, fluorine, alkyl, cycloalkyl, heteroalkyl, alkoxy, aryloxy, amino, silyl, alkenyl, cycloalkenyl, heteroalkenyl, aryl, heteroaryl, nitrile, isonitrile, sulfanyl, and combinations thereof.

In some instances, the preferred general substituents are selected from the group consisting of deuterium, fluorine, alkyl, cycloalkyl, alkoxy, aryloxy, amino, silyl, aryl, heteroaryl, sulfanyl, and combinations thereof.

In yet other instances, the more preferred general substituents are selected from the group consisting of deuterium, fluorine, alkyl, cycloalkyl, aryl, heteroaryl, and combinations thereof.

The terms "substituted" and "substitution" refer to a substituent other than H that is bonded to the relevant position, e.g., a carbon or nitrogen. For example, when $R^1$ represents mono-substitution, then one $R^1$ must be other than H (i.e., a substitution). Similarly, when $R^1$ represents di-substitution, then two of $R^1$ must be other than H. Similarly, when $R^1$ represents no substitution, $R^1$, for example, can be a hydrogen for available valencies of ring atoms, as in carbon atoms for benzene and the nitrogen atom in pyrrole, or simply represents nothing for ring atoms with fully filled valencies, e.g., the nitrogen atom in pyridine. The maximum number of substitutions possible in a ring structure will depend on the total number of available valencies in the ring atoms.

As used hemin, "combinations thereof" indicates that one or mom members of the applicable list am combined to form a known or chemically stable arrangement that one of ordinary skill in the art can envision from the applicable list. For example, an alkyl and deuterium can be combined to form a partial or fully deuterated alkyl group; a halogen and alkyl can be combined to form a halogenated alkyl substituent; and a halogen, alkyl, and aryl can be combined to form a halogenated arylalkyl. In one instance, the term substitution includes a combination of two to four of the listed groups. In another instance, the term substitution includes a combination of two to three groups. In yet another instance, the term substitution includes a combination of two groups. Preferred combinations of substituent groups are those that contain up to fifty atoms that are not hydrogen or deuterium, or those which include up to forty atoms that are not hydrogen or deuterium, or those that include up to thirty atoms that are not hydrogen or deuterium. In many instances, a preferred combination of substituent groups will include up to twenty atoms that are not hydrogen or deuterium.

The "aza" designation in the fragments described herein, i.e. aza-dibenzofuran, aza-dibenzothiophene, etc. means that one or more of the C—H groups in the respective fragment can be replaced by a nitrogen atom, for example, and without any limitation, azatriphenylene encompasses both dibenzo[f,h]quinoxaline and dibenzo[f,h]quinoline. One of ordinary skill in the art can readily envision other nitrogen analogs of the aza-derivatives described above, and all such analogs are intended to be encompassed by the terms as set forth herein.

As used herein, “deuterium” refers to an isotope of hydrogen. Deuterated compounds can be readily prepared using methods known in the art. For example, U.S. Pat. No. 8,557,400, Patent Pub. No. WO 2006/095951, and U.S. Pat. Application Pub. No. US 2011/0037057, which are hereby incorporated by reference in their entireties, describe the making of deuterium-substituted organometallic complexes. Further reference is made to Ming Yan, et al., *Tetrahedron* 2015, 71, 1425-30 and Atzrodt et al., *Angew. Chem. Int. Ed.* (*Reviews*) 2007, 46, 7744-65, which am incorporated by reference in their entireties, describe the deuteration of the methylene hydrogens in benzyl amines and efficient pathways to replace aromatic ring hydrogens with deuterium, respectively.

It is to be understood that when a molecular fragment is described as being a substituent or otherwise attached to another moiety, its name may be written as if it were a fragment (e.g. phenyl, phenylene, naphthyl, dibenzofuryl) or as if it were the whole molecule (e.g. benzene, naphthalene, dibenzofuran). As used herein, these different ways of designating a substituent or attached fragment are considered to be equivalent.

According to an aspect of the present disclosure, a compound comprising a first ligand $L_A$ of Formula I,

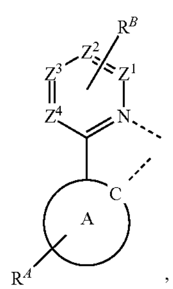

is disclosed. In the structure of Formula I:

ring A is a 5-membered or 6-membered carbocyclic or heterocyclic ring;

$Z^1$-$Z^4$ are each independently C or N;

at least two consecutive $Z^1$-$Z^4$ are C, and are fused to a structure of Formula II

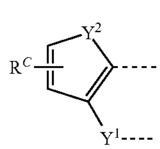

or Formula III

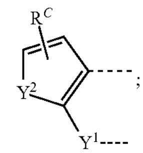

$Y^1$ and $Y^2$ are each independently selected from the group consisting of O, S, Se, CRR', SiRR', and GeRR';

$R^A$ and $R^C$ represent mono to a maximum possible number of substitutions on the carbon atoms of the ring attached thereto, or no substitution;

$R^B$ represents di-, tri-, or tetra-substitution;

each $R^A$, $R^B$, $R^C$, R, and R' is a hydrogen or one of the general substituents defined above;

any two substituents may be joined or fused together to form a ring;

$L_A$ is complexed to a metal M by the dashed lines in Formula I to form a five-membered chelate ring, and M has an atomic weight greater than 40;

M is optionally coordinated to other ligands;

the ligand $L_A$ is optionally linked with other ligands to comprise a tridentate, tetradentate, pentadentate, or hexadentate ligand. In some embodiments, each $R^A$, $R^B$, $R^C$, R, and R' is a hydrogen or one of the preferred general substituents or one of the more preferred general substituents defined above;

The claimed phosphorescent metal complexes contain ligands based on two or more fused 5-membered rings cores that can include substituents that are either aliphatic or aromatic. The fused 5-membered rings can include, but are not limited to, thiophene, furan, pyrrole, silole, germole, cyclopentene, and pyrrole. Based on the inventors' research, adding high rigid and planar moieties such as these in the ligand disclosed herein should allow significant bathochromic shift of the peak wavelength and also increase the external quantum efficiency (EQE) of the metal complexes if the structure is aligned properly. The modification of the phenyl ring covalently bonded to the iridium will allow fine tuning the color, lifetime, and emission lineshape. The addition of aliphatic side chain should allow the complexes to sublime properly.

The two fused 5-membered rings on the pyridine/pyrimidine/pyrazine building blocks will facilitate a significant bathochromic shift. It has been learned that a substantial drawback of having only one fused 5-membered ring is the difficulty achieving a true red color that is commercially interesting. In order to obtain the right color, too many substituents have to be added making the final complexes mom unstable and difficult to sublime cleanly. The additional fused 5-membered ring solves this problem while also increasing the EQE of the final metal complex. This also allows for easier fine tuning of the properties of the emitters by simply changing the nature of the 5-membered rings. The usual tools to fine tune even further the properties are also availed to tune the color, the EQE, and the lifetime.

In some embodiments, each $R^A$, $R^B$, $R^C$, R, and R' is independently a hydrogen or a substituent selected from the group consisting of deuterium, fluorine, alkyl, cycloalkyl, heteroalkyl, alkoxy, aryloxy, amino, silyl, alkenyl, cycloalkenyl, heteroalkenyl, aryl, heteroaryl, nitrile, isonitrile, sulfanyl, and combinations thereof.

In some embodiments, ring A is a 6-membered aromatic ring. In some embodiments, ring A is aryl. In some embodiments, ring A is heteroaryl. In some embodiments, ring A is a 6-membered aromatic ring with one or more alkyl substituents. In some embodiments, ring A is phenyl or napthyl.

In some embodiments, two $R^A$ join together to form a fused ring. In some embodiments, two $R^B$ join together to form a fused ring. In some embodiments, $R^C$ forms a fused ring. In some embodiments, $R^C$ does not form a fused ring.

In some embodiments, M is selected from the group consisting of Os, Ir, Pd, Pt, Cu, and Au. In some embodiments, M is selected from the group consisting of Ir and Pt.

In some embodiments, the compound is homoleptic. In some embodiments, the compound is heteroleptic. In some embodiments, the compound is neutral.

In some embodiments, $Y^1$ and $Y^2$ are both S. In some embodiments, $Y^1$ and $Y^2$ are both O. In some embodiments, one of $Y^1$ and $Y^2$ is S and the other of $Y^1$ and $Y^2$ is O.

In some embodiments, $Z^3$ and $Z^4$ are C and are fused to a structure of Formula II or Formula III. In some embodiments, $Z^2$ and $Z^3$ are C and are fused to a structure of Formula II or Formula III. In some embodiments, $Z^3$ and $Z^4$ are C and are fused to a structure of Formula II or Formula III.

In some embodiments, $Z^1$ to $Z^4$ are C. In some embodiments, at least one of $Z^1$ to $Z^4$ are N. In some embodiments, one of $Z^1$ to $Z^4$ is N. In some embodiments, two of $Z^1$ to $Z^4$ is N.

In some embodiments, the compound is selected from the group consisting of:

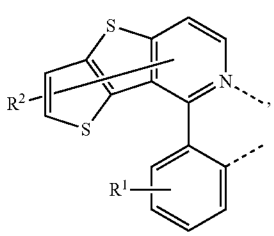
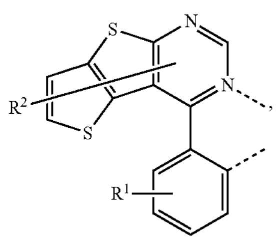
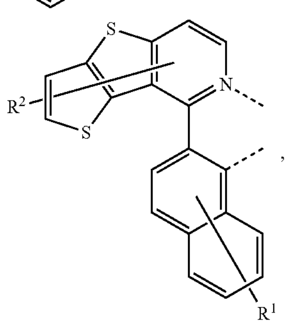
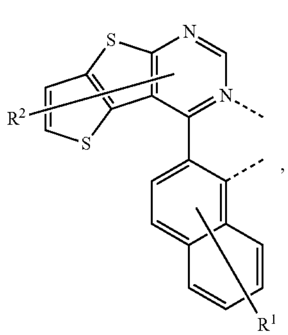

-continued

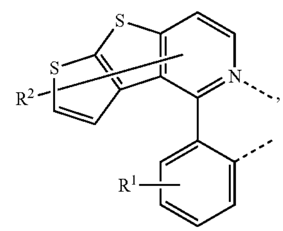
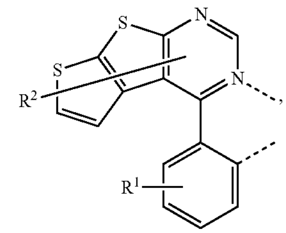
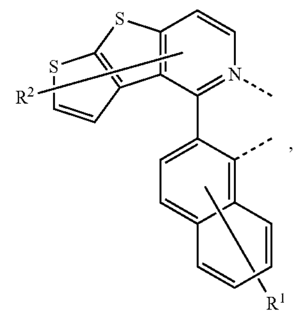
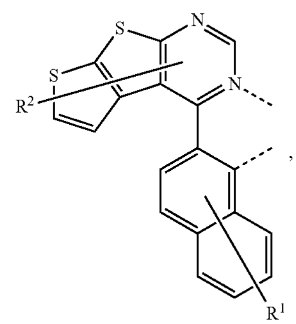
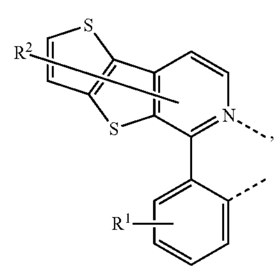
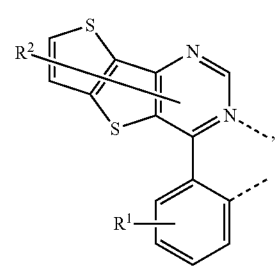
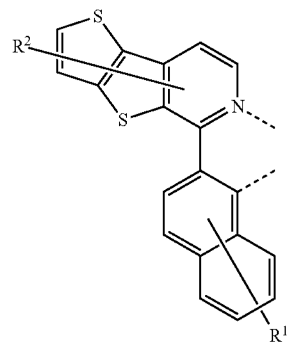

-continued
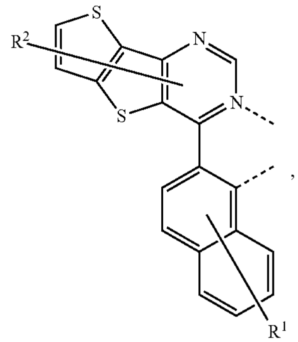
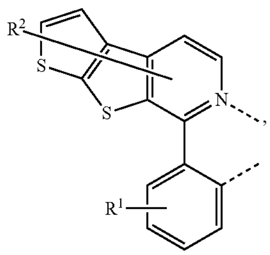
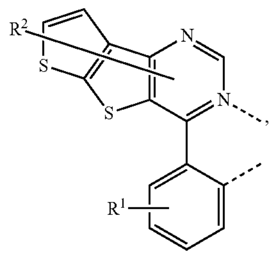
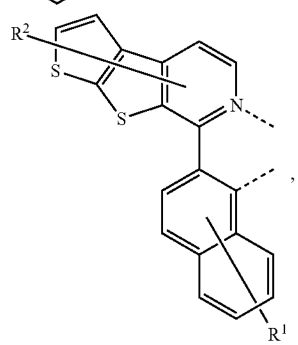
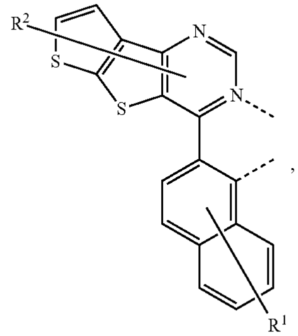
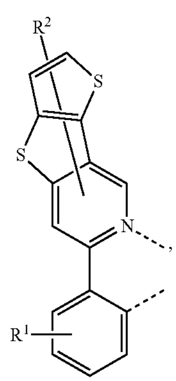
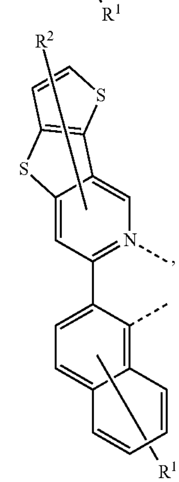
-continued
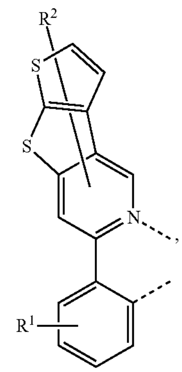
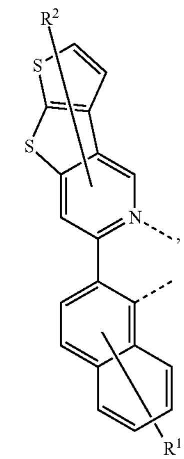
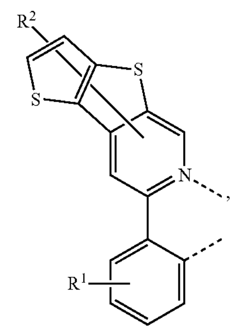
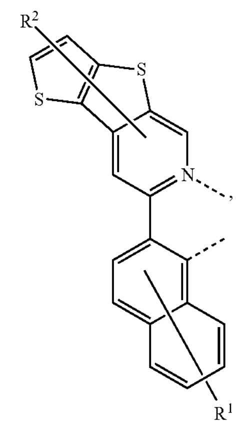
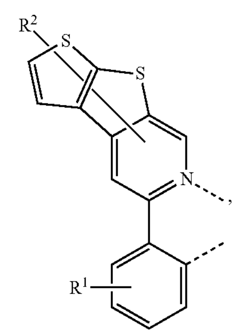
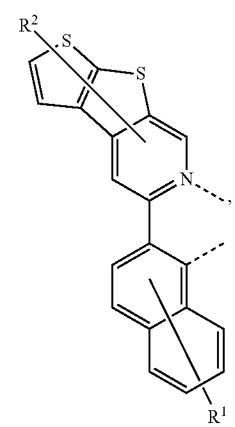
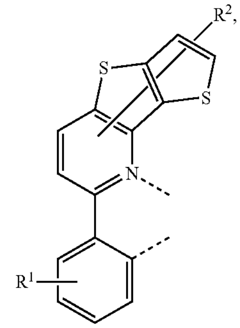
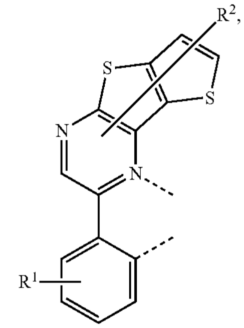

-continued

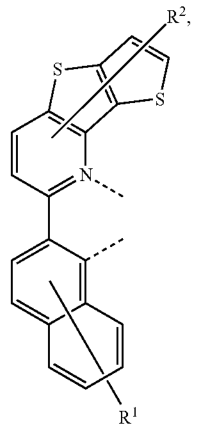
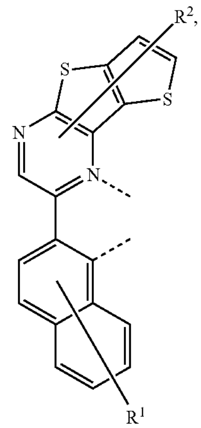
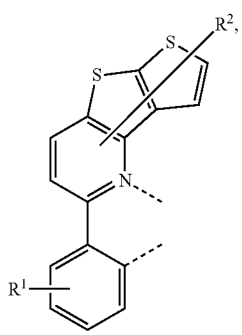
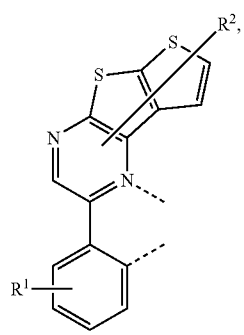
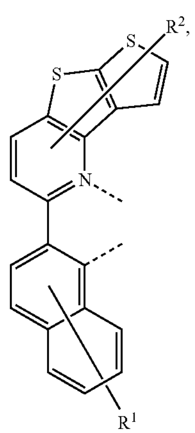
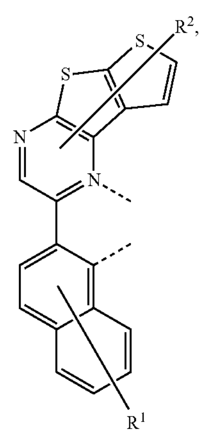
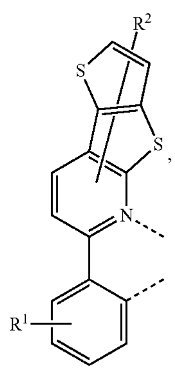
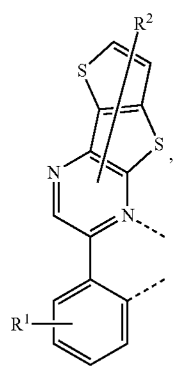

-continued

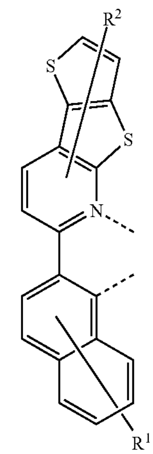
,
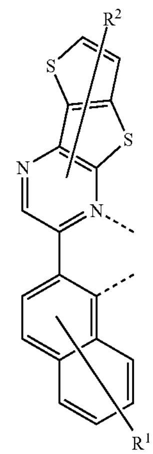
,
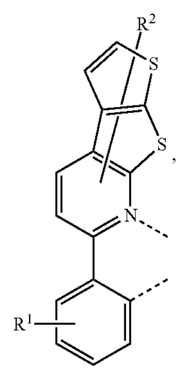
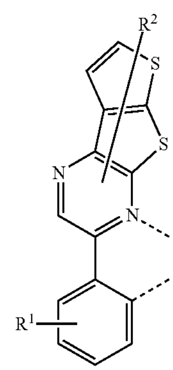
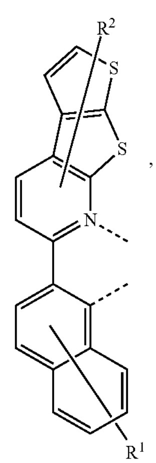
, and
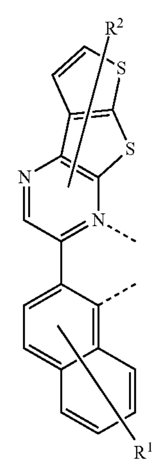
, where each $R^1$ and $R^2$ is a hydrogen or a substituent selected independently from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof.

In some embodiments, the ligand $L_A$ is selected from the group consisting of:

$L_{A1}$ though $L_{A381}$ are based on a structure of Formula IV,

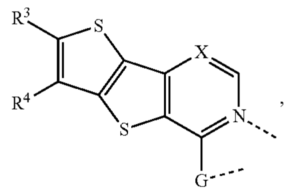

in which $R^3$, $R^4$, X and G are defined as:

-continued

| Ligand | $R^3$ | $R^4$ | G | X |
|---|---|---|---|---|
| $L_{A1}$ | H | H | $R^{C1}$ | C |
| $L_{A2}$ | $R^{B1}$ | H | $R^{C1}$ | C |
| $L_{A3}$ | $R^{B3}$ | H | $R^{C1}$ | C |
| $L_{A4}$ | $R^{B4}$ | H | $R^{C1}$ | C |
| $L_{A5}$ | $R^{B5}$ | H | $R^{C1}$ | C |
| $L_{A6}$ | $R^{B7}$ | H | $R^{C1}$ | C |
| $L_{A7}$ | $R^{A3}$ | H | $R^{C1}$ | C |
| $L_{A8}$ | $R^{A34}$ | H | $R^{C1}$ | C |
| $L_{A9}$ | $R^{A57}$ | H | $R^{C1}$ | C |
| $L_{A10}$ | H | $R^{B1}$ | $R^{C1}$ | C |
| $L_{A11}$ | H | $R^{B3}$ | $R^{C1}$ | C |
| $L_{A12}$ | H | $R^{B4}$ | $R^{C1}$ | C |
| $L_{A13}$ | H | $R^{B5}$ | $R^{C1}$ | C |
| $L_{A14}$ | H | $R^{B7}$ | $R^{C1}$ | C |
| $L_{A15}$ | H | $R^{A3}$ | $R^{C1}$ | C |
| $L_{A16}$ | H | $R^{A34}$ | $R^{C1}$ | C |
| $L_{A17}$ | H | $R^{A57}$ | $R^{C1}$ | C |
| $L_{A18}$ | $R^{B1}$ | $R^{B1}$ | $R^{C1}$ | C |
| $L_{A19}$ | $R^{B3}$ | $R^{B3}$ | $R^{C1}$ | C |
| $L_{A20}$ | $R^{B4}$ | $R^{B4}$ | $R^{C1}$ | C |
| $L_{A21}$ | $R^{B5}$ | $R^{B5}$ | $R^{C1}$ | C |
| $L_{A22}$ | $R^{B7}$ | $R^{B7}$ | $R^{C1}$ | C |
| $L_{A23}$ | $R^{A3}$ | $R^{A3}$ | $R^{C1}$ | C |
| $L_{A24}$ | $R^{A34}$ | $R^{A34}$ | $R^{C1}$ | C |
| $L_{A25}$ | $R^{A57}$ | $R^{A57}$ | $R^{C1}$ | C |
| $L_{A26}$ | $R^{B3}$ | $R^{B1}$ | $R^{C1}$ | C |
| $L_{A27}$ | $R^{B4}$ | $R^{B1}$ | $R^{C1}$ | C |
| $L_{A28}$ | $R^{B5}$ | $R^{B1}$ | $R^{C1}$ | C |
| $L_{A29}$ | $R^{B7}$ | $R^{B1}$ | $R^{C1}$ | C |
| $L_{A30}$ | $R^{A3}$ | $R^{B1}$ | $R^{C1}$ | C |
| $L_{A31}$ | $R^{A34}$ | $R^{B1}$ | $R^{C1}$ | C |
| $L_{A32}$ | $R^{A57}$ | $R^{B1}$ | $R^{C1}$ | C |
| $L_{A33}$ | $R^{B1}$ | $R^{B3}$ | $R^{C1}$ | C |
| $L_{A34}$ | $R^{B1}$ | $R^{B4}$ | $R^{C1}$ | C |
| $L_{A35}$ | $R^{B1}$ | $R^{B5}$ | $R^{C1}$ | C |
| $L_{A36}$ | $R^{B1}$ | $R^{B7}$ | $R^{C1}$ | C |
| $L_{A37}$ | $R^{B1}$ | $R^{A3}$ | $R^{C1}$ | C |
| $L_{A38}$ | $R^{B1}$ | $R^{A34}$ | $R^{C1}$ | C |
| $L_{A39}$ | $R^{B1}$ | $R^{A57}$ | $R^{C1}$ | C |
| $L_{A40}$ | $R^{B1}$ | H | $R^{C2}$ | C |
| $L_{A41}$ | $R^{B3}$ | H | $R^{C2}$ | C |
| $L_{A42}$ | $R^{B4}$ | H | $R^{C2}$ | C |
| $L_{A43}$ | $R^{B5}$ | H | $R^{C2}$ | C |
| $L_{A44}$ | $R^{B7}$ | H | $R^{C2}$ | C |
| $L_{A45}$ | $R^{A3}$ | H | $R^{C2}$ | C |
| $L_{A46}$ | $R^{A34}$ | H | $R^{C2}$ | C |
| $L_{A47}$ | $R^{A57}$ | H | $R^{C2}$ | C |
| $L_{A48}$ | H | $R^{B1}$ | $R^{C2}$ | C |
| $L_{A49}$ | H | $R^{B3}$ | $R^{C2}$ | C |
| $L_{A50}$ | H | $R^{B4}$ | $R^{C2}$ | C |
| $L_{A51}$ | H | $R^{B5}$ | $R^{C2}$ | C |
| $L_{A52}$ | H | $R^{B7}$ | $R^{C2}$ | C |
| $L_{A53}$ | H | $R^{A3}$ | $R^{C2}$ | C |
| $L_{A54}$ | H | $R^{A34}$ | $R^{C2}$ | C |
| $L_{A55}$ | H | $R^{A57}$ | $R^{C2}$ | C |
| $L_{A56}$ | $R^{B1}$ | $R^{B1}$ | $R^{C2}$ | C |
| $L_{A57}$ | $R^{B3}$ | $R^{B3}$ | $R^{C2}$ | C |
| $L_{A58}$ | $R^{B4}$ | $R^{B4}$ | $R^{C2}$ | C |
| $L_{A59}$ | $R^{B5}$ | $R^{B5}$ | $R^{C2}$ | C |
| $L_{A60}$ | $R^{B7}$ | $R^{B7}$ | $R^{C2}$ | C |
| $L_{A61}$ | $R^{A3}$ | $R^{A3}$ | $R^{C2}$ | C |
| $L_{A62}$ | $R^{A34}$ | $R^{A34}$ | $R^{C2}$ | C |
| $L_{A63}$ | $R^{A57}$ | $R^{A57}$ | $R^{C2}$ | C |
| $L_{A64}$ | $R^{B3}$ | $R^{B1}$ | $R^{C2}$ | C |
| $L_{A65}$ | $R^{B4}$ | $R^{B1}$ | $R^{C2}$ | C |
| $L_{A66}$ | $R^{B5}$ | $R^{B1}$ | $R^{C2}$ | C |
| $L_{A67}$ | $R^{B7}$ | $R^{B1}$ | $R^{C2}$ | C |
| $L_{A68}$ | $R^{A3}$ | $R^{B1}$ | $R^{C2}$ | C |
| $L_{A69}$ | $R^{A34}$ | $R^{B1}$ | $R^{C2}$ | C |
| $L_{A70}$ | $R^{A57}$ | $R^{B1}$ | $R^{C2}$ | C |
| $L_{A71}$ | $R^{B1}$ | $R^{B3}$ | $R^{C2}$ | C |
| $L_{A72}$ | $R^{B1}$ | $R^{B4}$ | $R^{C2}$ | C |
| $L_{A73}$ | $R^{B1}$ | $R^{B5}$ | $R^{C2}$ | C |
| $L_{A74}$ | $R^{B1}$ | $R^{B7}$ | $R^{C2}$ | C |
| $L_{A75}$ | $R^{B1}$ | $R^{A3}$ | $R^{C2}$ | C |
| $L_{A76}$ | $R^{B1}$ | $R^{A34}$ | $R^{C2}$ | C |
| $L_{A77}$ | $R^{B1}$ | $R^{A57}$ | $R^{C2}$ | C |
| $L_{A78}$ | $R^{B1}$ | H | $R^{C3}$ | C |
| $L_{A79}$ | $R^{B3}$ | H | $R^{C3}$ | C |
| $L_{A80}$ | $R^{B4}$ | H | $R^{C3}$ | C |
| $L_{A81}$ | $R^{B5}$ | H | $R^{C3}$ | C |
| $L_{A82}$ | $R^{B7}$ | H | $R^{C3}$ | C |
| $L_{A83}$ | $R^{A3}$ | H | $R^{C3}$ | C |
| $L_{A84}$ | $R^{A34}$ | H | $R^{C3}$ | C |
| $L_{A85}$ | $R^{A57}$ | H | $R^{C3}$ | C |
| $L_{A86}$ | H | $R^{B1}$ | $R^{C3}$ | C |
| $L_{A97}$ | H | $R^{B3}$ | $R^{C3}$ | C |
| $L_{A88}$ | H | $R^{B4}$ | $R^{C3}$ | C |
| $L_{A89}$ | H | $R^{B5}$ | $R^{C3}$ | C |
| $L_{A90}$ | H | $R^{B7}$ | $R^{C3}$ | C |
| $L_{A91}$ | H | $R^{A3}$ | $R^{C3}$ | C |
| $L_{A92}$ | H | $R^{A34}$ | $R^{C3}$ | C |
| $L_{A93}$ | H | $R^{A57}$ | $R^{C3}$ | C |
| $L_{A94}$ | $R^{B1}$ | $R^{B1}$ | $R^{C3}$ | C |
| $L_{A95}$ | $R^{B3}$ | $R^{B3}$ | $R^{C3}$ | C |
| $L_{A96}$ | $R^{B4}$ | $R^{B4}$ | $R^{C3}$ | C |
| $L_{A97}$ | $R^{B5}$ | $R^{B5}$ | $R^{C3}$ | C |
| $L_{A98}$ | $R^{B7}$ | $R^{B7}$ | $R^{C3}$ | C |
| $L_{A99}$ | $R^{A3}$ | $R^{A3}$ | $R^{C3}$ | C |
| $L_{A100}$ | $R^{A34}$ | $R^{A34}$ | $R^{C3}$ | C |
| $L_{A101}$ | $R^{A57}$ | $R^{A57}$ | $R^{C3}$ | C |
| $L_{A102}$ | $R^{B3}$ | $R^{B1}$ | $R^{C3}$ | C |
| $L_{A103}$ | $R^{B4}$ | $R^{B1}$ | $R^{C3}$ | C |
| $L_{A104}$ | $R^{B5}$ | $R^{B1}$ | $R^{C3}$ | C |
| $L_{A105}$ | $R^{B7}$ | $R^{B1}$ | $R^{C3}$ | C |
| $L_{A106}$ | $R^{A3}$ | $R^{B1}$ | $R^{C3}$ | C |
| $L_{A107}$ | $R^{A34}$ | $R^{B1}$ | $R^{C3}$ | C |
| $L_{A108}$ | $R^{A57}$ | $R^{B1}$ | $R^{C3}$ | C |
| $L_{A109}$ | $R^{B1}$ | $R^{B3}$ | $R^{C3}$ | C |
| $L_{A110}$ | $R^{B1}$ | $R^{B4}$ | $R^{C3}$ | C |
| $L_{A111}$ | $R^{B1}$ | $R^{B5}$ | $R^{C3}$ | C |
| $L_{A112}$ | $R^{B1}$ | $R^{B7}$ | $R^{C3}$ | C |
| $L_{A113}$ | $R^{B1}$ | $R^{A3}$ | $R^{C3}$ | C |
| $L_{A114}$ | $R^{B1}$ | $R^{A34}$ | $R^{C3}$ | C |
| $L_{A115}$ | H | H | $R^{C8}$ | C |
| $L_{A116}$ | $R^{B1}$ | H | $R^{C8}$ | C |
| $L_{A117}$ | $R^{B3}$ | H | $R^{C8}$ | C |
| $L_{A118}$ | $R^{B4}$ | H | $R^{C8}$ | C |
| $L_{A119}$ | $R^{B5}$ | H | $R^{C8}$ | C |
| $L_{A120}$ | $R^{B7}$ | H | $R^{C8}$ | C |
| $L_{A121}$ | $R^{A3}$ | H | $R^{C8}$ | C |
| $L_{A122}$ | $R^{A34}$ | H | $R^{C8}$ | C |
| $L_{A123}$ | $R^{A57}$ | H | $R^{C8}$ | C |
| $L_{A124}$ | H | $R^{B1}$ | $R^{C8}$ | C |
| $L_{A125}$ | H | $R^{B3}$ | $R^{C8}$ | C |
| $L_{A126}$ | H | $R^{B4}$ | $R^{C8}$ | C |
| $L_{A127}$ | H | $R^{B5}$ | $R^{C8}$ | C |
| $L_{A128}$ | H | $R^{B7}$ | $R^{C8}$ | C |
| $L_{A129}$ | H | $R^{A3}$ | $R^{C8}$ | C |
| $L_{A130}$ | H | $R^{A34}$ | $R^{C8}$ | C |
| $L_{A131}$ | H | $R^{A57}$ | $R^{C8}$ | C |
| $L_{A132}$ | $R^{B1}$ | $R^{B1}$ | $R^{C8}$ | C |
| $L_{A133}$ | $R^{B3}$ | $R^{B3}$ | $R^{C8}$ | C |
| $L_{A134}$ | $R^{B4}$ | $R^{B4}$ | $R^{C8}$ | C |
| $L_{A135}$ | $R^{B5}$ | $R^{B5}$ | $R^{C8}$ | C |
| $L_{A136}$ | $R^{B7}$ | $R^{B7}$ | $R^{C8}$ | C |
| $L_{A137}$ | $R^{A3}$ | $R^{A3}$ | $R^{C8}$ | C |

-continued

| Ligand | $R^3$ | $R^4$ | G | X |
|---|---|---|---|---|
| $L_{A138}$ | $R^{A34}$ | $R^{A34}$ | $R^{C8}$ | C |
| $L_{A139}$ | $R^{A57}$ | $R^{A57}$ | $R^{C8}$ | C |
| $L_{A140}$ | $R^{B3}$ | $R^{B1}$ | $R^{C8}$ | C |
| $L_{A141}$ | $R^{B4}$ | $R^{B1}$ | $R^{C8}$ | C |
| $L_{A142}$ | $R^{B5}$ | $R^{B1}$ | $R^{C8}$ | C |
| $L_{A143}$ | $R^{B7}$ | $R^{B1}$ | $R^{C8}$ | C |
| $L_{A144}$ | $R^{A3}$ | $R^{B1}$ | $R^{C8}$ | C |
| $L_{A145}$ | $R^{A34}$ | $R^{B1}$ | $R^{C8}$ | C |
| $L_{A146}$ | $R^{A57}$ | $R^{B1}$ | $R^{C8}$ | C |
| $L_{A147}$ | $R^{B1}$ | $R^{B3}$ | $R^{C8}$ | C |
| $L_{A148}$ | $R^{B1}$ | $R^{B4}$ | $R^{C8}$ | C |
| $L_{A149}$ | $R^{B1}$ | $R^{B5}$ | $R^{C8}$ | C |
| $L_{A150}$ | $R^{B1}$ | $R^{B7}$ | $R^{C8}$ | C |
| $L_{A151}$ | $R^{B1}$ | $R^{A3}$ | $R^{C8}$ | C |
| $L_{A152}$ | $R^{B1}$ | $R^{A34}$ | $R^{C8}$ | C |
| $L_{A153}$ | $R^{B1}$ | $R^{A57}$ | $R^{C8}$ | C |
| $L_{A154}$ | $R^{B1}$ | H | $R^{C9}$ | C |
| $L_{A155}$ | $R^{B3}$ | H | $R^{C9}$ | C |
| $L_{A156}$ | $R^{B4}$ | H | $R^{C9}$ | C |
| $L_{A157}$ | $R^{B5}$ | H | $R^{C9}$ | C |
| $L_{A158}$ | $R^{B7}$ | H | $R^{C9}$ | C |
| $L_{A159}$ | $R^{A3}$ | H | $R^{C9}$ | C |
| $L_{A160}$ | $R^{A34}$ | H | $R^{C9}$ | C |
| $L_{A161}$ | $R^{A57}$ | H | $R^{C9}$ | C |
| $L_{A162}$ | H | $R^{B1}$ | $R^{C9}$ | C |
| $L_{A163}$ | H | $R^{B3}$ | $R^{C9}$ | C |
| $L_{A164}$ | H | $R^{B4}$ | $R^{C9}$ | C |
| $L_{A165}$ | H | $R^{B5}$ | $R^{C9}$ | C |
| $L_{A166}$ | H | $R^{B7}$ | $R^{C9}$ | C |
| $L_{A167}$ | H | $R^{A3}$ | $R^{C9}$ | C |
| $L_{A168}$ | H | $R^{A34}$ | $R^{C9}$ | C |
| $L_{A169}$ | H | $R^{A57}$ | $R^{C9}$ | C |
| $L_{A170}$ | $R^{B1}$ | $R^{B1}$ | $R^{C9}$ | C |
| $L_{A171}$ | $R^{B3}$ | $R^{B3}$ | $R^{C9}$ | C |
| $L_{A172}$ | $R^{B4}$ | $R^{B4}$ | $R^{C9}$ | C |
| $L_{A173}$ | $R^{B5}$ | $R^{B5}$ | $R^{C9}$ | C |
| $L_{A174}$ | $R^{B7}$ | $R^{B7}$ | $R^{C9}$ | C |
| $L_{A175}$ | $R^{A3}$ | $R^{A3}$ | $R^{C9}$ | C |
| $L_{A176}$ | $R^{A34}$ | $R^{A34}$ | $R^{C9}$ | C |
| $L_{A177}$ | $R^{A57}$ | $R^{A57}$ | $R^{C9}$ | C |
| $L_{A178}$ | $R^{B3}$ | $R^{B1}$ | $R^{C9}$ | C |
| $L_{A179}$ | $R^{B4}$ | $R^{B1}$ | $R^{C9}$ | C |
| $L_{A180}$ | $R^{B5}$ | $R^{B1}$ | $R^{C9}$ | C |
| $L_{A181}$ | $R^{B7}$ | $R^{B1}$ | $R^{C9}$ | C |
| $L_{A182}$ | $R^{A3}$ | $R^{B1}$ | $R^{C9}$ | C |
| $L_{A183}$ | $R^{A34}$ | $R^{B1}$ | $R^{C9}$ | C |
| $L_{A184}$ | $R^{A57}$ | $R^{B1}$ | $R^{C9}$ | C |
| $L_{A185}$ | $R^{B1}$ | $R^{B3}$ | $R^{C9}$ | C |
| $L_{A186}$ | $R^{B1}$ | $R^{B4}$ | $R^{C9}$ | C |
| $L_{A187}$ | $R^{B1}$ | $R^{B5}$ | $R^{C9}$ | C |
| $L_{A188}$ | $R^{B1}$ | $R^{B7}$ | $R^{C9}$ | C |
| $L_{A189}$ | $R^{B1}$ | $R^{A3}$ | $R^{C9}$ | C |
| $L_{A190}$ | $R^{B1}$ | $R^{A34}$ | $R^{C9}$ | C |
| $L_{A191}$ | $R^{B1}$ | $R^{A57}$ | $R^{C9}$ | C |
| $L_{A192}$ | $R^{B1}$ | H | $R^{C1}$ | N |
| $L_{A193}$ | $R^{B3}$ | H | $R^{C1}$ | N |
| $L_{A194}$ | $R^{B4}$ | H | $R^{C1}$ | N |
| $L_{A195}$ | $R^{B5}$ | H | $R^{C1}$ | N |
| $L_{A196}$ | $R^{B7}$ | H | $R^{C1}$ | N |
| $L_{A197}$ | $R^{A3}$ | H | $R^{C1}$ | N |
| $L_{A198}$ | $R^{A34}$ | H | $R^{C1}$ | N |
| $L_{A199}$ | $R^{A57}$ | H | $R^{C1}$ | N |
| $L_{A200}$ | H | $R^{B1}$ | $R^{C1}$ | N |
| $L_{A201}$ | H | $R^{B3}$ | $R^{C1}$ | N |
| $L_{A202}$ | H | $R^{B4}$ | $R^{C1}$ | N |
| $L_{A203}$ | H | $R^{B5}$ | $R^{C1}$ | N |
| $L_{A204}$ | H | $R^{B7}$ | $R^{C1}$ | N |
| $L_{A205}$ | H | $R^{A3}$ | $R^{C1}$ | N |
| $L_{A206}$ | H | $R^{A34}$ | $R^{C1}$ | N |
| $L_{A207}$ | H | $R^{A57}$ | $R^{C1}$ | N |
| $L_{A208}$ | $R^{B1}$ | $R^{B1}$ | $R^{C1}$ | N |
| $L_{A209}$ | $R^{B3}$ | $R^{B3}$ | $R^{C1}$ | N |
| $L_{A210}$ | $R^{B4}$ | $R^{B4}$ | $R^{C1}$ | N |
| $L_{A211}$ | $R^{B5}$ | $R^{B5}$ | $R^{C1}$ | N |
| $L_{A212}$ | $R^{B7}$ | $R^{B7}$ | $R^{C1}$ | N |
| $L_{A213}$ | $R^{A3}$ | $R^{A3}$ | $R^{C1}$ | N |
| $L_{A214}$ | $R^{A34}$ | $R^{A34}$ | $R^{C1}$ | N |

-continued

| Ligand | $R^3$ | $R^4$ | G | X |
|---|---|---|---|---|
| $L_{A215}$ | $R^{A57}$ | $R^{A57}$ | $R^{C1}$ | N |
| $L_{A216}$ | $R^{B3}$ | $R^{B1}$ | $R^{C1}$ | N |
| $L_{A217}$ | $R^{B4}$ | $R^{B1}$ | $R^{C1}$ | N |
| $L_{A218}$ | $R^{B5}$ | $R^{B1}$ | $R^{C1}$ | N |
| $L_{A219}$ | $R^{B7}$ | $R^{B1}$ | $R^{C1}$ | N |
| $L_{A220}$ | $R^{A3}$ | $R^{B1}$ | $R^{C1}$ | N |
| $L_{A221}$ | $R^{A34}$ | $R^{B1}$ | $R^{C1}$ | N |
| $L_{A222}$ | $R^{A57}$ | $R^{B1}$ | $R^{C1}$ | N |
| $L_{A223}$ | $R^{B1}$ | $R^{B3}$ | $R^{C1}$ | N |
| $L_{A224}$ | $R^{B1}$ | $R^{B4}$ | $R^{C1}$ | N |
| $L_{A225}$ | $R^{B1}$ | $R^{B5}$ | $R^{C1}$ | N |
| $L_{A226}$ | $R^{B1}$ | $R^{B7}$ | $R^{C1}$ | N |
| $L_{A227}$ | $R^{B1}$ | $R^{A3}$ | $R^{C1}$ | N |
| $L_{A228}$ | $R^{B1}$ | $R^{A34}$ | $R^{C1}$ | N |
| $L_{A229}$ | $R^{B1}$ | $R^{A57}$ | $R^{C1}$ | N |
| $L_{A230}$ | $R^{B1}$ | H | $R^{C2}$ | N |
| $L_{A231}$ | $R^{B3}$ | H | $R^{C2}$ | N |
| $L_{A232}$ | $R^{B4}$ | H | $R^{C2}$ | N |
| $L_{A233}$ | $R^{B5}$ | H | $R^{C2}$ | N |
| $L_{A234}$ | $R^{B7}$ | H | $R^{C2}$ | N |
| $L_{A235}$ | $R^{A3}$ | H | $R^{C2}$ | N |
| $L_{A236}$ | $R^{A34}$ | H | $R^{C2}$ | N |
| $L_{A237}$ | $R^{A57}$ | H | $R^{C2}$ | N |
| $L_{A238}$ | H | $R^{B1}$ | $R^{C2}$ | N |
| $L_{A239}$ | H | $R^{B3}$ | $R^{C2}$ | N |
| $L_{A240}$ | H | $R^{B4}$ | $R^{C2}$ | N |
| $L_{A241}$ | H | $R^{B5}$ | $R^{C2}$ | N |
| $L_{A242}$ | H | $R^{B7}$ | $R^{C2}$ | N |
| $L_{A243}$ | H | $R^{A3}$ | $R^{C2}$ | N |
| $L_{A244}$ | H | $R^{A34}$ | $R^{C2}$ | N |
| $L_{A245}$ | H | $R^{A57}$ | $R^{C2}$ | N |
| $L_{A246}$ | $R^{B1}$ | $R^{B1}$ | $R^{C2}$ | N |
| $L_{A247}$ | $R^{B3}$ | $R^{B3}$ | $R^{C2}$ | N |
| $L_{A248}$ | $R^{B4}$ | $R^{B4}$ | $R^{C2}$ | N |
| $L_{A249}$ | $R^{B5}$ | $R^{B5}$ | $R^{C2}$ | N |
| $L_{A250}$ | $R^{B7}$ | $R^{B7}$ | $R^{C2}$ | N |
| $L_{A251}$ | $R^{A3}$ | $R^{A3}$ | $R^{C2}$ | N |
| $L_{A252}$ | $R^{A34}$ | $R^{A34}$ | $R^{C2}$ | N |
| $L_{A253}$ | $R^{A57}$ | $R^{A57}$ | $R^{C2}$ | N |
| $L_{A254}$ | $R^{B3}$ | $R^{B1}$ | $R^{C2}$ | N |
| $L_{A255}$ | $R^{B4}$ | $R^{B1}$ | $R^{C2}$ | N |
| $L_{A256}$ | $R^{B5}$ | $R^{B1}$ | $R^{C2}$ | N |
| $L_{A257}$ | $R^{B7}$ | $R^{B1}$ | $R^{C2}$ | N |
| $L_{A258}$ | $R^{A3}$ | $R^{B1}$ | $R^{C2}$ | N |
| $L_{A259}$ | $R^{A34}$ | $R^{B1}$ | $R^{C2}$ | N |
| $L_{A260}$ | $R^{A57}$ | $R^{B1}$ | $R^{C2}$ | N |
| $L_{A261}$ | $R^{B1}$ | $R^{B3}$ | $R^{C2}$ | N |
| $L_{A262}$ | $R^{B1}$ | $R^{B4}$ | $R^{C2}$ | N |
| $L_{A263}$ | $R^{B1}$ | $R^{B5}$ | $R^{C2}$ | N |
| $L_{A264}$ | $R^{B1}$ | $R^{B7}$ | $R^{C2}$ | N |
| $L_{A265}$ | $R^{B1}$ | $R^{A3}$ | $R^{C2}$ | N |
| $L_{A266}$ | $R^{B1}$ | $R^{A34}$ | $R^{C2}$ | N |
| $L_{A267}$ | $R^{B1}$ | $R^{A57}$ | $R^{C2}$ | N |
| $L_{A268}$ | $R^{B1}$ | H | $R^{C3}$ | N |
| $L_{A269}$ | $R^{B3}$ | H | $R^{C3}$ | N |
| $L_{A270}$ | $R^{B4}$ | H | $R^{C3}$ | N |
| $L_{A271}$ | $R^{B5}$ | H | $R^{C3}$ | N |
| $L_{A272}$ | $R^{B7}$ | H | $R^{C3}$ | N |
| $L_{A273}$ | $R^{A3}$ | H | $R^{C3}$ | N |
| $L_{A274}$ | $R^{A34}$ | H | $R^{C3}$ | N |
| $L_{A275}$ | $R^{A57}$ | H | $R^{C3}$ | N |
| $L_{A276}$ | H | $R^{B1}$ | $R^{C3}$ | N |
| $L_{A277}$ | H | $R^{B3}$ | $R^{C3}$ | N |
| $L_{A278}$ | H | $R^{B4}$ | $R^{C3}$ | N |
| $L_{A279}$ | H | $R^{B5}$ | $R^{C3}$ | N |
| $L_{A280}$ | H | $R^{B7}$ | $R^{C3}$ | N |
| $L_{A281}$ | H | $R^{A3}$ | $R^{C3}$ | N |
| $L_{A282}$ | H | $R^{A34}$ | $R^{C3}$ | N |
| $L_{A283}$ | H | $R^{A57}$ | $R^{C3}$ | N |
| $L_{A284}$ | $R^{B1}$ | $R^{B1}$ | $R^{C3}$ | N |
| $L_{A285}$ | $R^{B3}$ | $R^{B3}$ | $R^{C3}$ | N |
| $L_{A286}$ | $R^{B4}$ | $R^{B4}$ | $R^{C3}$ | N |
| $L_{A287}$ | $R^{B5}$ | $R^{B5}$ | $R^{C3}$ | N |
| $L_{A288}$ | $R^{B7}$ | $R^{B7}$ | $R^{C3}$ | N |
| $L_{A289}$ | $R^{A3}$ | $R^{A3}$ | $R^{C3}$ | N |
| $L_{A290}$ | $R^{A34}$ | $R^{A34}$ | $R^{C3}$ | N |
| $L_{A291}$ | $R^{A57}$ | $R^{A57}$ | $R^{C3}$ | N |

-continued

| Ligand | $R^3$ | $R^4$ | G | X |
|---|---|---|---|---|
| $L_{A292}$ | $R^{B3}$ | $R^{B1}$ | $R^{C3}$ | N |
| $L_{A293}$ | $R^{B4}$ | $R^{B1}$ | $R^{C3}$ | N |
| $L_{A294}$ | $R^{B5}$ | $R^{B1}$ | $R^{C3}$ | N |
| $L_{A295}$ | $R^{B7}$ | $R^{B1}$ | $R^{C3}$ | N |
| $L_{A296}$ | $R^{A3}$ | $R^{B1}$ | $R^{C3}$ | N |
| $L_{A297}$ | $R^{A34}$ | $R^{B1}$ | $R^{C3}$ | N |
| $L_{A298}$ | $R^{A57}$ | $R^{B1}$ | $R^{C3}$ | N |
| $L_{A299}$ | $R^{B1}$ | $R^{B3}$ | $R^{C3}$ | N |
| $L_{A300}$ | $R^{B1}$ | $R^{B4}$ | $R^{C3}$ | N |
| $L_{A301}$ | $R^{B1}$ | $R^{B5}$ | $R^{C3}$ | N |
| $L_{A302}$ | $R^{B1}$ | $R^{B7}$ | $R^{C3}$ | N |
| $L_{A303}$ | $R^{B1}$ | $R^{A3}$ | $R^{C3}$ | N |
| $L_{A304}$ | $R^{B1}$ | $R^{A34}$ | $R^{C3}$ | N |
| $L_{A305}$ | $R^{B1}$ | $R^{A57}$ | $R^{C3}$ | N |
| $L_{A306}$ | $R^{B1}$ | H | $R^{C8}$ | N |
| $L_{A307}$ | $R^{B3}$ | H | $R^{C8}$ | N |
| $L_{A309}$ | $R^{B4}$ | H | $R^{C8}$ | N |
| $L_{A309}$ | $R^{B5}$ | H | $R^{C8}$ | N |
| $L_{A310}$ | $R^{B7}$ | H | $R^{C8}$ | N |
| $L_{A311}$ | $R^{A3}$ | H | $R^{C8}$ | N |
| $L_{A312}$ | $R^{A34}$ | H | $R^{C8}$ | N |
| $L_{A313}$ | $R^{A57}$ | H | $R^{C8}$ | N |
| $L_{A314}$ | H | $R^{B1}$ | $R^{C8}$ | N |
| $L_{A315}$ | H | $R^{B3}$ | $R^{C8}$ | N |
| $L_{A316}$ | H | $R^{B4}$ | $R^{C8}$ | N |
| $L_{A317}$ | H | $R^{B5}$ | $R^{C8}$ | N |
| $L_{A318}$ | H | $R^{B7}$ | $R^{C8}$ | N |
| $L_{A319}$ | H | $R^{A3}$ | $R^{C8}$ | N |
| $L_{A320}$ | H | $R^{A34}$ | $R^{C8}$ | N |
| $L_{A321}$ | H | $R^{A57}$ | $R^{C8}$ | N |
| $L_{A322}$ | $R^{B1}$ | $R^{B1}$ | $R^{C8}$ | N |
| $L_{A323}$ | $R^{B3}$ | $R^{B3}$ | $R^{C8}$ | N |
| $L_{A324}$ | $R^{B4}$ | $R^{B4}$ | $R^{C8}$ | N |
| $L_{A325}$ | $R^{B5}$ | $R^{B5}$ | $R^{C8}$ | N |
| $L_{A326}$ | $R^{B7}$ | $R^{B7}$ | $R^{C8}$ | N |
| $L_{A327}$ | $R^{A3}$ | $R^{A3}$ | $R^{C8}$ | N |
| $L_{A328}$ | $R^{A34}$ | $R^{A34}$ | $R^{C8}$ | N |
| $L_{A329}$ | $R^{A57}$ | $R^{A57}$ | $R^{C8}$ | N |
| $L_{A330}$ | $R^{B3}$ | $R^{B1}$ | $R^{C8}$ | N |
| $L_{A331}$ | $R^{B4}$ | $R^{B1}$ | $R^{C8}$ | N |
| $L_{A332}$ | $R^{B5}$ | $R^{B1}$ | $R^{C8}$ | N |
| $L_{A333}$ | $R^{B7}$ | $R^{B1}$ | $R^{C8}$ | N |
| $L_{A334}$ | $R^{A3}$ | $R^{B1}$ | $R^{C8}$ | N |
| $L_{A335}$ | $R^{A34}$ | $R^{B1}$ | $R^{C8}$ | N |
| $L_{A336}$ | $R^{A57}$ | $R^{B1}$ | $R^{C8}$ | N |
| $L_{A337}$ | $R^{B1}$ | $R^{B3}$ | $R^{C8}$ | N |
| $L_{A338}$ | $R^{B1}$ | $R^{B4}$ | $R^{C8}$ | N |
| $L_{A339}$ | $R^{B1}$ | $R^{B5}$ | $R^{C8}$ | N |
| $L_{A340}$ | $R^{B1}$ | $R^{B7}$ | $R^{C8}$ | N |
| $L_{A341}$ | $R^{B1}$ | $R^{A3}$ | $R^{C8}$ | N |
| $L_{A342}$ | $R^{B1}$ | $R^{A34}$ | $R^{C8}$ | N |
| $L_{A343}$ | $R^{B1}$ | $R^{A57}$ | $R^{C8}$ | N |
| $L_{A344}$ | $R^{B1}$ | H | $R^{C9}$ | N |
| $L_{A345}$ | $R^{B3}$ | H | $R^{C9}$ | N |
| $L_{A346}$ | $R^{B4}$ | H | $R^{C9}$ | N |
| $L_{A347}$ | $R^{B5}$ | H | $R^{C9}$ | N |
| $L_{A348}$ | $R^{B7}$ | H | $R^{C9}$ | N |
| $L_{A349}$ | $R^{A3}$ | H | $R^{C9}$ | N |
| $L_{A350}$ | $R^{A34}$ | H | $R^{C9}$ | N |
| $L_{A351}$ | $R^{A57}$ | H | $R^{C9}$ | N |
| $L_{A352}$ | H | $R^{B1}$ | $R^{C9}$ | N |
| $L_{A353}$ | H | $R^{B3}$ | $R^{C9}$ | N |
| $L_{A354}$ | H | $R^{B4}$ | $R^{C9}$ | N |
| $L_{A355}$ | H | $R^{B5}$ | $R^{C9}$ | N |
| $L_{A356}$ | H | $R^{B7}$ | $R^{C9}$ | N |
| $L_{A357}$ | H | $R^{A3}$ | $R^{C9}$ | N |
| $L_{A358}$ | H | $R^{A34}$ | $R^{C9}$ | N |
| $L_{A359}$ | H | $R^{A57}$ | $R^{C9}$ | N |
| $L_{A360}$ | $R^{B1}$ | $R^{B1}$ | $R^{C9}$ | N |
| $L_{A361}$ | $R^{B3}$ | $R^{B3}$ | $R^{C9}$ | N |
| $L_{A362}$ | $R^{B4}$ | $R^{B4}$ | $R^{C9}$ | N |
| $L_{A363}$ | $R^{B5}$ | $R^{B5}$ | $R^{C9}$ | N |
| $L_{A364}$ | $R^{B7}$ | $R^{B7}$ | $R^{C9}$ | N |
| $L_{A365}$ | $R^{A3}$ | $R^{A3}$ | $R^{C9}$ | N |
| $L_{A366}$ | $R^{A34}$ | $R^{A34}$ | $R^{C9}$ | N |
| $L_{A367}$ | $R^{A57}$ | $R^{A57}$ | $R^{C9}$ | N |
| $L_{A368}$ | $R^{B3}$ | $R^{B1}$ | $R^{C9}$ | N |

-continued

| Ligand | $R^3$ | $R^4$ | G | X |
|---|---|---|---|---|
| $L_{A369}$ | $R^{B4}$ | $R^{B1}$ | $R^{C9}$ | N |
| $L_{A370}$ | $R^{B5}$ | $R^{B1}$ | $R^{C9}$ | N |
| $L_{A371}$ | $R^{B7}$ | $R^{B1}$ | $R^{C9}$ | N |
| $L_{A372}$ | $R^{A3}$ | $R^{B1}$ | $R^{C9}$ | N |
| $L_{A373}$ | $R^{A34}$ | $R^{B1}$ | $R^{C9}$ | N |
| $L_{A374}$ | $R^{A57}$ | $R^{B1}$ | $R^{C9}$ | N |
| $L_{A375}$ | $R^{B1}$ | $R^{B3}$ | $R^{C9}$ | N |
| $L_{A376}$ | $R^{B1}$ | $R^{B4}$ | $R^{C9}$ | N |
| $L_{A377}$ | $R^{B1}$ | $R^{B5}$ | $R^{C9}$ | N |
| $L_{A378}$ | $R^{B1}$ | $R^{B7}$ | $R^{C9}$ | N |
| $L_{A379}$ | $R^{B1}$ | $R^{A3}$ | $R^{C9}$ | N |
| $L_{A380}$ | $R^{B1}$ | $R^{A34}$ | $R^{C9}$ | N |
| $L_{A381}$ | $R^{B1}$ | $R^{A57}$ | $R^{C9}$ | N |

$L_{A382}$ through $L_{A762}$ are based on a structure of Formula V,

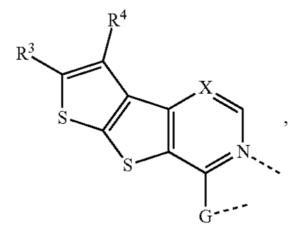

in which $R^3$, $R^4$, X and G are defined as:

| Ligand | $R^3$ | $R^4$ | G | X |
|---|---|---|---|---|
| $L_{A382}$ | H | H | $R^{C1}$ | C |
| $L_{A383}$ | $R^{B1}$ | H | $R^{C1}$ | C |
| $L_{A384}$ | $R^{B3}$ | H | $R^{C1}$ | C |
| $L_{A385}$ | $R^{B4}$ | H | $R^{C1}$ | C |
| $L_{A386}$ | $R^{B5}$ | H | $R^{C1}$ | C |
| $L_{A387}$ | $R^{B7}$ | H | $R^{C1}$ | C |
| $L_{A388}$ | $R^{A3}$ | H | $R^{C1}$ | C |
| $L_{A389}$ | $R^{A34}$ | H | $R^{C1}$ | C |
| $L_{A390}$ | $R^{A57}$ | H | $R^{C1}$ | C |
| $L_{A391}$ | H | $R^{B1}$ | $R^{C1}$ | C |
| $L_{A392}$ | H | $R^{B3}$ | $R^{C1}$ | C |
| $L_{A393}$ | H | $R^{B4}$ | $R^{C1}$ | C |
| $L_{A394}$ | H | $R^{B5}$ | $R^{C1}$ | C |
| $L_{A395}$ | H | $R^{B7}$ | $R^{C1}$ | C |
| $L_{A396}$ | H | $R^{A3}$ | $R^{C1}$ | C |
| $L_{A397}$ | H | $R^{A34}$ | $R^{C1}$ | C |
| $L_{A398}$ | H | $R^{A57}$ | $R^{C1}$ | C |
| $L_{A399}$ | $R^{B1}$ | $R^{B1}$ | $R^{C1}$ | C |
| $L_{A400}$ | $R^{B3}$ | $R^{B3}$ | $R^{C1}$ | C |
| $L_{A401}$ | $R^{B4}$ | $R^{B4}$ | $R^{C1}$ | C |
| $L_{A402}$ | $R^{B5}$ | $R^{B5}$ | $R^{C1}$ | C |
| $L_{A403}$ | $R^{B7}$ | $R^{B7}$ | $R^{C1}$ | C |
| $L_{A404}$ | $R^{A3}$ | $R^{A3}$ | $R^{C1}$ | C |
| $L_{A405}$ | $R^{A34}$ | $R^{A34}$ | $R^{C1}$ | C |
| $L_{A406}$ | $R^{A57}$ | $R^{A57}$ | $R^{C1}$ | C |
| $L_{A407}$ | $R^{B3}$ | $R^{B1}$ | $R^{C1}$ | C |
| $L_{A408}$ | $R^{B4}$ | $R^{B1}$ | $R^{C1}$ | C |
| $L_{A409}$ | $R^{B5}$ | $R^{B1}$ | $R^{C1}$ | C |
| $L_{A410}$ | $R^{B7}$ | $R^{B1}$ | $R^{C1}$ | C |
| $L_{A411}$ | $R^{A3}$ | $R^{B1}$ | $R^{C1}$ | C |
| $L_{A412}$ | $R^{A34}$ | $R^{B1}$ | $R^{C1}$ | C |
| $L_{A413}$ | $R^{A57}$ | $R^{B1}$ | $R^{C1}$ | C |
| $L_{A414}$ | $R^{B1}$ | $R^{B3}$ | $R^{C1}$ | C |
| $L_{A415}$ | $R^{B1}$ | $R^{B4}$ | $R^{C1}$ | C |
| $L_{A416}$ | $R^{B1}$ | $R^{B5}$ | $R^{C1}$ | C |
| $L_{A417}$ | $R^{B1}$ | $R^{B7}$ | $R^{C1}$ | C |
| $L_{A418}$ | $R^{B1}$ | $R^{A3}$ | $R^{C1}$ | C |
| $L_{A419}$ | $R^{B1}$ | $R^{A34}$ | $R^{C1}$ | C |
| $L_{A420}$ | $R^{B1}$ | $R^{A57}$ | $R^{C1}$ | C |
| $L_{A421}$ | $R^{B1}$ | H | $R^{C2}$ | C |
| $L_{A422}$ | $R^{B3}$ | H | $R^{C2}$ | C |

-continued

| Ligand | $R^3$ | $R^4$ | G | X |
|---|---|---|---|---|
| $L_{A423}$ | $R^{B4}$ | H | $R^{C2}$ | C |
| $L_{A424}$ | $R^{B5}$ | H | $R^{C2}$ | C |
| $L_{A425}$ | $R^{B7}$ | H | $R^{C2}$ | C |
| $L_{A426}$ | $R^{A3}$ | H | $R^{C2}$ | C |
| $L_{A427}$ | $R^{A34}$ | H | $R^{C2}$ | C |
| $L_{A428}$ | $R^{A57}$ | H | $R^{C2}$ | C |
| $L_{A429}$ | H | $R^{B1}$ | $R^{C2}$ | C |
| $L_{A430}$ | H | $R^{B3}$ | $R^{C2}$ | C |
| $L_{A431}$ | H | $R^{B4}$ | $R^{C2}$ | C |
| $L_{A432}$ | H | $R^{B5}$ | $R^{C2}$ | C |
| $L_{A433}$ | H | $R^{B7}$ | $R^{C2}$ | C |
| $L_{A434}$ | H | $R^{A3}$ | $R^{C2}$ | C |
| $L_{A435}$ | H | $R^{A34}$ | $R^{C2}$ | C |
| $L_{A436}$ | H | $R^{A57}$ | $R^{C2}$ | C |
| $L_{A437}$ | $R^{B1}$ | $R^{B1}$ | $R^{C2}$ | C |
| $L_{A438}$ | $R^{B3}$ | $R^{B3}$ | $R^{C2}$ | C |
| $L_{A439}$ | $R^{B4}$ | $R^{B4}$ | $R^{C2}$ | C |
| $L_{A440}$ | $R^{B5}$ | $R^{B5}$ | $R^{C2}$ | C |
| $L_{A441}$ | $R^{B7}$ | $R^{B7}$ | $R^{C2}$ | C |
| $L_{A442}$ | $R^{A3}$ | $R^{A3}$ | $R^{C2}$ | C |
| $L_{A443}$ | $R^{A34}$ | $R^{A34}$ | $R^{C2}$ | C |
| $L_{A444}$ | $R^{A57}$ | $R^{A57}$ | $R^{C2}$ | C |
| $L_{A445}$ | $R^{B3}$ | $R^{B1}$ | $R^{C2}$ | C |
| $L_{A446}$ | $R^{B4}$ | $R^{B1}$ | $R^{C2}$ | C |
| $L_{A447}$ | $R^{B5}$ | $R^{B1}$ | $R^{C2}$ | C |
| $L_{A448}$ | $R^{B7}$ | $R^{B1}$ | $R^{C2}$ | C |
| $L_{A449}$ | $R^{A3}$ | $R^{B1}$ | $R^{C2}$ | C |
| $L_{A450}$ | $R^{A34}$ | $R^{B1}$ | $R^{C2}$ | C |
| $L_{A451}$ | $R^{A57}$ | $R^{B1}$ | $R^{C2}$ | C |
| $L_{A452}$ | $R^{B1}$ | $R^{B3}$ | $R^{C2}$ | C |
| $L_{A453}$ | $R^{B1}$ | $R^{B4}$ | $R^{C2}$ | C |
| $L_{A454}$ | $R^{B1}$ | $R^{B5}$ | $R^{C2}$ | C |
| $L_{A455}$ | $R^{B1}$ | $R^{B7}$ | $R^{C2}$ | C |
| $L_{A456}$ | $R^{B1}$ | $R^{A3}$ | $R^{C2}$ | C |
| $L_{A457}$ | $R^{B1}$ | $R^{A34}$ | $R^{C2}$ | C |
| $L_{A458}$ | $R^{B1}$ | $R^{A57}$ | $R^{C2}$ | C |
| $L_{A459}$ | $R^{B1}$ | H | $R^{C3}$ | C |
| $L_{A460}$ | $R^{B3}$ | H | $R^{C3}$ | C |
| $L_{A461}$ | $R^{B4}$ | H | $R^{C3}$ | C |
| $L_{A462}$ | $R^{B5}$ | H | $R^{C3}$ | C |
| $L_{A463}$ | $R^{B7}$ | H | $R^{C3}$ | C |
| $L_{A464}$ | $R^{A3}$ | H | $R^{C3}$ | C |
| $L_{A465}$ | $R^{A34}$ | H | $R^{C3}$ | C |
| $L_{A466}$ | $R^{A57}$ | H | $R^{C3}$ | C |
| $L_{A467}$ | H | $R^{B1}$ | $R^{C3}$ | C |
| $L_{A468}$ | H | $R^{B3}$ | $R^{C3}$ | C |
| $L_{A469}$ | H | $R^{B4}$ | $R^{C3}$ | C |
| $L_{A470}$ | H | $R^{B5}$ | $R^{C3}$ | C |
| $L_{A471}$ | H | $R^{B7}$ | $R^{C3}$ | C |
| $L_{A472}$ | H | $R^{A3}$ | $R^{C3}$ | C |
| $L_{A473}$ | H | $R^{A34}$ | $R^{C3}$ | C |
| $L_{A474}$ | H | $R^{A57}$ | $R^{C3}$ | C |
| $L_{A475}$ | $R^{B1}$ | $R^{B1}$ | $R^{C3}$ | C |
| $L_{A476}$ | $R^{B3}$ | $R^{B3}$ | $R^{C3}$ | C |
| $L_{A477}$ | $R^{B4}$ | $R^{B4}$ | $R^{C3}$ | C |
| $L_{A478}$ | $R^{B5}$ | $R^{B5}$ | $R^{C3}$ | C |
| $L_{A479}$ | $R^{B7}$ | $R^{B7}$ | $R^{C3}$ | C |
| $L_{A480}$ | $R^{A3}$ | $R^{A3}$ | $R^{C3}$ | C |
| $L_{A481}$ | $R^{A34}$ | $R^{A34}$ | $R^{C3}$ | C |
| $L_{A482}$ | $R^{A57}$ | $R^{A57}$ | $R^{C3}$ | C |
| $L_{A483}$ | $R^{B3}$ | $R^{B1}$ | $R^{C3}$ | C |
| $L_{A484}$ | $R^{B4}$ | $R^{B1}$ | $R^{C3}$ | C |
| $L_{A485}$ | $R^{B5}$ | $R^{B1}$ | $R^{C3}$ | C |
| $L_{A486}$ | $R^{B7}$ | $R^{B1}$ | $R^{C3}$ | C |
| $L_{A487}$ | $R^{A3}$ | $R^{B1}$ | $R^{C3}$ | C |
| $L_{A488}$ | $R^{A34}$ | $R^{B1}$ | $R^{C3}$ | C |
| $L_{A489}$ | $R^{A57}$ | $R^{B1}$ | $R^{C3}$ | C |
| $L_{A490}$ | $R^{B1}$ | $R^{B3}$ | $R^{C3}$ | C |
| $L_{A491}$ | $R^{B1}$ | $R^{B4}$ | $R^{C3}$ | C |
| $L_{A492}$ | $R^{B1}$ | $R^{B5}$ | $R^{C3}$ | C |
| $L_{A493}$ | $R^{B1}$ | $R^{B7}$ | $R^{C3}$ | C |
| $L_{A494}$ | $R^{B1}$ | $R^{A3}$ | $R^{C3}$ | C |
| $L_{A495}$ | $R^{B1}$ | $R^{A34}$ | $R^{C3}$ | C |
| $L_{A496}$ | $R^{B1}$ | $R^{A57}$ | $R^{C3}$ | C |
| $L_{A497}$ | $R^{B1}$ | H | $R^{C8}$ | C |
| $L_{A498}$ | $R^{B3}$ | H | $R^{C8}$ | C |
| $L_{A499}$ | $R^{B4}$ | H | $R^{C8}$ | C |

-continued

| Ligand | $R^3$ | $R^4$ | G | X |
|---|---|---|---|---|
| $L_{A500}$ | $R^{B5}$ | H | $R^{C8}$ | C |
| $L_{A501}$ | $R^{B7}$ | H | $R^{C8}$ | C |
| $L_{A502}$ | $R^{A3}$ | H | $R^{C8}$ | C |
| $L_{A503}$ | $R^{A34}$ | H | $R^{C8}$ | C |
| $L_{A504}$ | $R^{A57}$ | H | $R^{C8}$ | C |
| $L_{A505}$ | H | $R^{B1}$ | $R^{C8}$ | C |
| $L_{A506}$ | H | $R^{B3}$ | $R^{C8}$ | C |
| $L_{A502}$ | H | $R^{B4}$ | $R^{C8}$ | C |
| $L_{A508}$ | H | $R^{B5}$ | $R^{C8}$ | C |
| $L_{A509}$ | H | $R^{B7}$ | $R^{C8}$ | C |
| $L_{A510}$ | H | $R^{A3}$ | $R^{C8}$ | C |
| $L_{A511}$ | H | $R^{A34}$ | $R^{C8}$ | C |
| $L_{A512}$ | H | $R^{A57}$ | $R^{C8}$ | C |
| $L_{A513}$ | $R^{B1}$ | $R^{B1}$ | $R^{C8}$ | C |
| $L_{A514}$ | $R^{B3}$ | $R^{B3}$ | $R^{C8}$ | C |
| $L_{A515}$ | $R^{B4}$ | $R^{B4}$ | $R^{C8}$ | C |
| $L_{A516}$ | $R^{B5}$ | $R^{B5}$ | $R^{C8}$ | C |
| $L_{A512}$ | $R^{B7}$ | $R^{B7}$ | $R^{C8}$ | C |
| $L_{A518}$ | $R^{A3}$ | $R^{A3}$ | $R^{C8}$ | C |
| $L_{A519}$ | $R^{A34}$ | $R^{A34}$ | $R^{C8}$ | C |
| $L_{A520}$ | $R^{A57}$ | $R^{A57}$ | $R^{C8}$ | C |
| $L_{A521}$ | $R^{B3}$ | $R^{B1}$ | $R^{C8}$ | C |
| $L_{A522}$ | $R^{B4}$ | $R^{B1}$ | $R^{C8}$ | C |
| $L_{A523}$ | $R^{B5}$ | $R^{B1}$ | $R^{C8}$ | C |
| $L_{A524}$ | $R^{B7}$ | $R^{B1}$ | $R^{C8}$ | C |
| $L_{A525}$ | $R^{A3}$ | $R^{B1}$ | $R^{C8}$ | C |
| $L_{A526}$ | $R^{A34}$ | $R^{B1}$ | $R^{C8}$ | C |
| $L_{A527}$ | $R^{A57}$ | $R^{B1}$ | $R^{C8}$ | C |
| $L_{A528}$ | $R^{B1}$ | $R^{B3}$ | $R^{C8}$ | C |
| $L_{A529}$ | $R^{B1}$ | $R^{B4}$ | $R^{C8}$ | C |
| $L_{A530}$ | $R^{B1}$ | $R^{B5}$ | $R^{C8}$ | C |
| $L_{A531}$ | $R^{B1}$ | $R^{B7}$ | $R^{C8}$ | C |
| $L_{A532}$ | $R^{B1}$ | $R^{A3}$ | $R^{C8}$ | C |
| $L_{A533}$ | $R^{B1}$ | $R^{A34}$ | $R^{C8}$ | C |
| $L_{A534}$ | $R^{B1}$ | $R^{A57}$ | $R^{C8}$ | C |
| $L_{A535}$ | $R^{B1}$ | H | $R^{C9}$ | C |
| $L_{A536}$ | $R^{B3}$ | H | $R^{C9}$ | C |
| $L_{A537}$ | $R^{B4}$ | H | $R^{C9}$ | C |
| $L_{A538}$ | $R^{B5}$ | H | $R^{C9}$ | C |
| $L_{A539}$ | $R^{B7}$ | H | $R^{C9}$ | C |
| $L_{A540}$ | $R^{A3}$ | H | $R^{C9}$ | C |
| $L_{A541}$ | $R^{A34}$ | H | $R^{C9}$ | C |
| $L_{A542}$ | $R^{A57}$ | H | $R^{C9}$ | C |
| $L_{A543}$ | H | $R^{B1}$ | $R^{C9}$ | C |
| $L_{A544}$ | H | $R^{B3}$ | $R^{C9}$ | C |
| $L_{A545}$ | H | $R^{B4}$ | $R^{C9}$ | C |
| $L_{A546}$ | H | $R^{B5}$ | $R^{C9}$ | C |
| $L_{A547}$ | H | $R^{B7}$ | $R^{C9}$ | C |
| $L_{A548}$ | H | $R^{A3}$ | $R^{C9}$ | C |
| $L_{A549}$ | H | $R^{A34}$ | $R^{C9}$ | C |
| $L_{A550}$ | H | $R^{A57}$ | $R^{C9}$ | C |
| $L_{A551}$ | $R^{B1}$ | $R^{B1}$ | $R^{C9}$ | C |
| $L_{A552}$ | $R^{B3}$ | $R^{B3}$ | $R^{C9}$ | C |
| $L_{A553}$ | $R^{B4}$ | $R^{B4}$ | $R^{C9}$ | C |
| $L_{A554}$ | $R^{B5}$ | $R^{B5}$ | $R^{C9}$ | C |
| $L_{A555}$ | $R^{B7}$ | $R^{B7}$ | $R^{C9}$ | C |
| $L_{A556}$ | $R^{A3}$ | $R^{A3}$ | $R^{C9}$ | C |
| $L_{A557}$ | $R^{A34}$ | $R^{A34}$ | $R^{C9}$ | C |
| $L_{A558}$ | $R^{A57}$ | $R^{A57}$ | $R^{C9}$ | C |
| $L_{A559}$ | $R^{B3}$ | $R^{B1}$ | $R^{C9}$ | C |
| $L_{A560}$ | $R^{B4}$ | $R^{B1}$ | $R^{C9}$ | C |
| $L_{A561}$ | $R^{B5}$ | $R^{B1}$ | $R^{C9}$ | C |
| $L_{A562}$ | $R^{B7}$ | $R^{B1}$ | $R^{C9}$ | C |
| $L_{A563}$ | $R^{A3}$ | $R^{B1}$ | $R^{C9}$ | C |
| $L_{A564}$ | $R^{A34}$ | $R^{B1}$ | $R^{C9}$ | C |
| $L_{A565}$ | $R^{A57}$ | $R^{B1}$ | $R^{C9}$ | C |
| $L_{A566}$ | $R^{B1}$ | $R^{B3}$ | $R^{C9}$ | C |
| $L_{A567}$ | $R^{B1}$ | $R^{B4}$ | $R^{C9}$ | C |
| $L_{A568}$ | $R^{B1}$ | $R^{B5}$ | $R^{C9}$ | C |
| $L_{A569}$ | $R^{B1}$ | $R^{B7}$ | $R^{C9}$ | C |
| $L_{A570}$ | $R^{B1}$ | $R^{A3}$ | $R^{C9}$ | C |
| $L_{A571}$ | $R^{B1}$ | $R^{A34}$ | $R^{C9}$ | C |
| $L_{A572}$ | $R^{B1}$ | $R^{A57}$ | $R^{C9}$ | C |
| $L_{A573}$ | $R^{B1}$ | H | $R^{C1}$ | N |
| $L_{A574}$ | $R^{B3}$ | H | $R^{C1}$ | N |
| $L_{A575}$ | $R^{B4}$ | H | $R^{C1}$ | N |
| $L_{A576}$ | $R^{B5}$ | H | $R^{C1}$ | N |

-continued

| Ligand | $R^3$ | $R^4$ | G | X |
|---|---|---|---|---|
| $L_{A577}$ | $R^{B7}$ | H | $R^{C1}$ | N |
| $L_{A578}$ | $R^{A3}$ | H | $R^{C1}$ | N |
| $L_{A579}$ | $R^{A34}$ | H | $R^{C1}$ | N |
| $L_{A580}$ | $R^{A57}$ | H | $R^{C1}$ | N |
| $L_{A581}$ | H | $R^{B1}$ | $R^{C1}$ | N |
| $L_{A582}$ | H | $R^{B3}$ | $R^{C1}$ | N |
| $L_{A583}$ | H | $R^{B4}$ | $R^{C1}$ | N |
| $L_{A584}$ | H | $R^{B5}$ | $R^{C1}$ | N |
| $L_{A585}$ | H | $R^{B7}$ | $R^{C1}$ | N |
| $L_{A586}$ | H | $R^{A3}$ | $R^{C1}$ | N |
| $L_{A587}$ | H | $R^{A34}$ | $R^{C1}$ | N |
| $L_{A588}$ | H | $R^{A57}$ | $R^{C1}$ | N |
| $L_{A589}$ | $R^{B1}$ | $R^{B1}$ | $R^{C1}$ | N |
| $L_{A590}$ | $R^{B3}$ | $R^{B3}$ | $R^{C1}$ | N |
| $L_{A591}$ | $R^{B4}$ | $R^{B4}$ | $R^{C1}$ | N |
| $L_{A592}$ | $R^{B5}$ | $R^{B5}$ | $R^{C1}$ | N |
| $L_{A593}$ | $R^{B7}$ | $R^{B7}$ | $R^{C1}$ | N |
| $L_{A594}$ | $R^{A3}$ | $R^{A3}$ | $R^{C1}$ | N |
| $L_{A595}$ | $R^{A34}$ | $R^{A34}$ | $R^{C1}$ | N |
| $L_{A596}$ | $R^{A57}$ | $R^{A57}$ | $R^{C1}$ | N |
| $L_{A597}$ | $R^{B3}$ | $R^{B1}$ | $R^{C1}$ | N |
| $L_{A598}$ | $R^{B4}$ | $R^{B1}$ | $R^{C1}$ | N |
| $L_{A599}$ | $R^{B5}$ | $R^{B1}$ | $R^{C1}$ | N |
| $L_{A600}$ | $R^{B7}$ | $R^{B1}$ | $R^{C1}$ | N |
| $L_{A601}$ | $R^{A3}$ | $R^{B1}$ | $R^{C1}$ | N |
| $L_{A602}$ | $R^{A34}$ | $R^{B1}$ | $R^{C1}$ | N |
| $L_{A603}$ | $R^{A57}$ | $R^{B1}$ | $R^{C1}$ | N |
| $L_{A604}$ | $R^{B1}$ | $R^{B3}$ | $R^{C1}$ | N |
| $L_{A605}$ | $R^{B1}$ | $R^{B4}$ | $R^{C1}$ | N |
| $L_{A606}$ | $R^{B1}$ | $R^{B5}$ | $R^{C1}$ | N |
| $L_{A607}$ | $R^{B1}$ | $R^{B7}$ | $R^{C1}$ | N |
| $L_{A608}$ | $R^{B1}$ | $R^{A3}$ | $R^{C1}$ | N |
| $L_{A609}$ | $R^{B1}$ | $R^{A34}$ | $R^{C1}$ | N |
| $L_{A610}$ | $R^{B1}$ | $R^{A57}$ | $R^{C1}$ | N |
| $L_{A611}$ | $R^{B1}$ | H | $R^{C2}$ | N |
| $L_{A612}$ | $R^{B3}$ | H | $R^{C2}$ | N |
| $L_{A613}$ | $R^{B4}$ | H | $R^{C2}$ | N |
| $L_{A614}$ | $R^{B5}$ | H | $R^{C2}$ | N |
| $L_{A615}$ | $R^{B7}$ | H | $R^{C2}$ | N |
| $L_{A616}$ | $R^{A3}$ | H | $R^{C2}$ | N |
| $L_{A617}$ | $R^{A34}$ | H | $R^{C2}$ | N |
| $L_{A618}$ | $R^{A57}$ | H | $R^{C2}$ | N |
| $L_{A619}$ | H | $R^{B1}$ | $R^{C2}$ | N |
| $L_{A620}$ | H | $R^{B3}$ | $R^{C2}$ | N |
| $L_{A621}$ | H | $R^{B4}$ | $R^{C2}$ | N |
| $L_{A622}$ | H | $R^{B5}$ | $R^{C2}$ | N |
| $L_{A623}$ | H | $R^{B7}$ | $R^{C2}$ | N |
| $L_{A624}$ | H | $R^{A3}$ | $R^{C2}$ | N |
| $L_{A625}$ | H | $R^{A34}$ | $R^{C2}$ | N |
| $L_{A626}$ | H | $R^{A57}$ | $R^{C2}$ | N |
| $L_{A627}$ | $R^{B1}$ | $R^{B1}$ | $R^{C2}$ | N |
| $L_{A628}$ | $R^{B3}$ | $R^{B3}$ | $R^{C2}$ | N |
| $L_{A629}$ | $R^{B4}$ | $R^{B4}$ | $R^{C2}$ | N |
| $L_{A630}$ | $R^{B5}$ | $R^{B5}$ | $R^{C2}$ | N |
| $L_{A631}$ | $R^{B7}$ | $R^{B7}$ | $R^{C2}$ | N |
| $L_{A632}$ | $R^{A3}$ | $R^{A3}$ | $R^{C2}$ | N |
| $L_{A633}$ | $R^{A34}$ | $R^{A34}$ | $R^{C2}$ | N |
| $L_{A634}$ | $R^{A57}$ | $R^{A57}$ | $R^{C2}$ | N |
| $L_{A635}$ | $R^{B3}$ | $R^{B1}$ | $R^{C2}$ | N |
| $L_{A636}$ | $R^{B4}$ | $R^{B1}$ | $R^{C2}$ | N |
| $L_{A637}$ | $R^{B5}$ | $R^{B1}$ | $R^{C2}$ | N |
| $L_{A638}$ | $R^{B7}$ | $R^{B1}$ | $R^{C2}$ | N |
| $L_{A639}$ | $R^{A3}$ | $R^{B1}$ | $R^{C2}$ | N |
| $L_{A640}$ | $R^{A34}$ | $R^{B1}$ | $R^{C2}$ | N |
| $L_{A641}$ | $R^{A57}$ | $R^{B1}$ | $R^{C2}$ | N |
| $L_{A642}$ | $R^{B1}$ | $R^{B3}$ | $R^{C2}$ | N |
| $L_{A643}$ | $R^{B1}$ | $R^{B4}$ | $R^{C2}$ | N |
| $L_{A644}$ | $R^{B1}$ | $R^{B5}$ | $R^{C2}$ | N |
| $L_{A645}$ | $R^{B1}$ | $R^{B7}$ | $R^{C2}$ | N |
| $L_{A646}$ | $R^{B1}$ | $R^{A3}$ | $R^{C2}$ | N |
| $L_{A647}$ | $R^{B1}$ | $R^{A34}$ | $R^{C2}$ | N |
| $L_{A648}$ | $R^{B1}$ | $R^{A57}$ | $R^{C2}$ | N |
| $L_{A649}$ | $R^{B1}$ | H | $R^{C3}$ | N |
| $L_{A650}$ | $R^{B3}$ | H | $R^{C3}$ | N |
| $L_{A651}$ | $R^{B4}$ | H | $R^{C3}$ | N |
| $L_{A652}$ | $R^{B5}$ | H | $R^{C3}$ | N |
| $L_{A653}$ | $R^{B7}$ | H | $R^{C3}$ | N |

-continued

| Ligand | $R^3$ | $R^4$ | G | X |
|---|---|---|---|---|
| $L_{A654}$ | $R^{A3}$ | H | $R^{C3}$ | N |
| $L_{A655}$ | $R^{A34}$ | H | $R^{C3}$ | N |
| $L_{A656}$ | $R^{A57}$ | H | $R^{C3}$ | N |
| $L_{A657}$ | H | $R^{B1}$ | $R^{C3}$ | N |
| $L_{A658}$ | H | $R^{B3}$ | $R^{C3}$ | N |
| $L_{A659}$ | H | $R^{B4}$ | $R^{C3}$ | N |
| $L_{A660}$ | H | $R^{B5}$ | $R^{C3}$ | N |
| $L_{A661}$ | H | $R^{B7}$ | $R^{C3}$ | N |
| $L_{A662}$ | H | $R^{A3}$ | $R^{C3}$ | N |
| $L_{A663}$ | H | $R^{A34}$ | $R^{C3}$ | N |
| $L_{A664}$ | H | $R^{A57}$ | $R^{C3}$ | N |
| $L_{A665}$ | $R^{B1}$ | $R^{B1}$ | $R^{C3}$ | N |
| $L_{A666}$ | $R^{B3}$ | $R^{B3}$ | $R^{C3}$ | N |
| $L_{A667}$ | $R^{B4}$ | $R^{B4}$ | $R^{C3}$ | N |
| $L_{A668}$ | $R^{B5}$ | $R^{B5}$ | $R^{C3}$ | N |
| $L_{A669}$ | $R^{B7}$ | $R^{B7}$ | $R^{C3}$ | N |
| $L_{A670}$ | $R^{A3}$ | $R^{A3}$ | $R^{C3}$ | N |
| $L_{A671}$ | $R^{A34}$ | $R^{A34}$ | $R^{C3}$ | N |
| $L_{A672}$ | $R^{A57}$ | $R^{A57}$ | $R^{C3}$ | N |
| $L_{A673}$ | $R^{B3}$ | $R^{B1}$ | $R^{C3}$ | N |
| $L_{A674}$ | $R^{B4}$ | $R^{B1}$ | $R^{C3}$ | N |
| $L_{A675}$ | $R^{B5}$ | $R^{B1}$ | $R^{C3}$ | N |
| $L_{A676}$ | $R^{B7}$ | $R^{B1}$ | $R^{C3}$ | N |
| $L_{A677}$ | $R^{A3}$ | $R^{B1}$ | $R^{C3}$ | N |
| $L_{A678}$ | $R^{A34}$ | $R^{B1}$ | $R^{C3}$ | N |
| $L_{A679}$ | $R^{A57}$ | $R^{B1}$ | $R^{C3}$ | N |
| $L_{A680}$ | $R^{B1}$ | $R^{B3}$ | $R^{C3}$ | N |
| $L_{A681}$ | $R^{B1}$ | $R^{B4}$ | $R^{C3}$ | N |
| $L_{A682}$ | $R^{B1}$ | $R^{B5}$ | $R^{C3}$ | N |
| $L_{A683}$ | $R^{B1}$ | $R^{B7}$ | $R^{C3}$ | N |
| $L_{A684}$ | $R^{B1}$ | $R^{A3}$ | $R^{C3}$ | N |
| $L_{A685}$ | $R^{B1}$ | $R^{A34}$ | $R^{C3}$ | N |
| $L_{A686}$ | $R^{B1}$ | $R^{A57}$ | $R^{C3}$ | N |
| $L_{A687}$ | $R^{B1}$ | H | $R^{C8}$ | N |
| $L_{A688}$ | $R^{B3}$ | H | $R^{C8}$ | N |
| $L_{A689}$ | $R^{B4}$ | H | $R^{C8}$ | N |
| $L_{A690}$ | $R^{B5}$ | H | $R^{C8}$ | N |
| $L_{A691}$ | $R^{B7}$ | H | $R^{C8}$ | N |
| $L_{A692}$ | $R^{A3}$ | H | $R^{C8}$ | N |
| $L_{A693}$ | $R^{A34}$ | H | $R^{C8}$ | N |
| $L_{A694}$ | $R^{A57}$ | H | $R^{C8}$ | N |
| $L_{A695}$ | H | $R^{B1}$ | $R^{C8}$ | N |
| $L_{A696}$ | H | $R^{B3}$ | $R^{C8}$ | N |
| $L_{A697}$ | H | $R^{B4}$ | $R^{C8}$ | N |
| $L_{A698}$ | H | $R^{B5}$ | $R^{C8}$ | N |
| $L_{A699}$ | H | $R^{B7}$ | $R^{C8}$ | N |
| $L_{A700}$ | H | $R^{A3}$ | $R^{C8}$ | N |
| $L_{A701}$ | H | $R^{A34}$ | $R^{C8}$ | N |
| $L_{A702}$ | H | $R^{A57}$ | $R^{C8}$ | N |
| $L_{A703}$ | $R^{B1}$ | $R^{B1}$ | $R^{C8}$ | N |
| $L_{A704}$ | $R^{B3}$ | $R^{B3}$ | $R^{C8}$ | N |
| $L_{A705}$ | $R^{B4}$ | $R^{B4}$ | $R^{C8}$ | N |
| $L_{A706}$ | $R^{B5}$ | $R^{B5}$ | $R^{C8}$ | N |
| $L_{A707}$ | $R^{B7}$ | $R^{B7}$ | $R^{C8}$ | N |
| $L_{A708}$ | $R^{A3}$ | $R^{A3}$ | $R^{C8}$ | N |
| $L_{A709}$ | $R^{A34}$ | $R^{A34}$ | $R^{C8}$ | N |
| $L_{A710}$ | $R^{A57}$ | $R^{A57}$ | $R^{C8}$ | N |
| $L_{A711}$ | $R^{B3}$ | $R^{B1}$ | $R^{C8}$ | N |
| $L_{A712}$ | $R^{B4}$ | $R^{B1}$ | $R^{C8}$ | N |
| $L_{A713}$ | $R^{B5}$ | $R^{B1}$ | $R^{C8}$ | N |
| $L_{A714}$ | $R^{B7}$ | $R^{B1}$ | $R^{C8}$ | N |
| $L_{A715}$ | $R^{A3}$ | $R^{B1}$ | $R^{C8}$ | N |
| $L_{A716}$ | $R^{A34}$ | $R^{B1}$ | $R^{C8}$ | N |
| $L_{A717}$ | $R^{A57}$ | $R^{B1}$ | $R^{C8}$ | N |
| $L_{A718}$ | $R^{B1}$ | $R^{B3}$ | $R^{C8}$ | N |
| $L_{A719}$ | $R^{B1}$ | $R^{B4}$ | $R^{C8}$ | N |
| $L_{A720}$ | $R^{B1}$ | $R^{B5}$ | $R^{C8}$ | N |
| $L_{A721}$ | $R^{B1}$ | $R^{B7}$ | $R^{C8}$ | N |
| $L_{A722}$ | $R^{B1}$ | $R^{A3}$ | $R^{C8}$ | N |
| $L_{A723}$ | $R^{B1}$ | $R^{A34}$ | $R^{C8}$ | N |
| $L_{A724}$ | $R^{B1}$ | $R^{A57}$ | $R^{C8}$ | N |
| $L_{A725}$ | $R^{B1}$ | H | $R^{C9}$ | N |
| $L_{A726}$ | $R^{B3}$ | H | $R^{C9}$ | N |
| $L_{A727}$ | $R^{B4}$ | H | $R^{C9}$ | N |
| $L_{A728}$ | $R^{B5}$ | H | $R^{C9}$ | N |
| $L_{A729}$ | $R^{B7}$ | H | $R^{C9}$ | N |
| $L_{A730}$ | $R^{A3}$ | H | $R^{C9}$ | N |

-continued

| Ligand | $R^3$ | $R^4$ | G | X |
|---|---|---|---|---|
| $L_{A731}$ | $R^{A34}$ | H | $R^{C9}$ | N |
| $L_{A732}$ | $R^{A57}$ | H | $R^{C9}$ | N |
| $L_{A733}$ | H | $R^{B1}$ | $R^{C9}$ | N |
| $L_{A734}$ | H | $R^{B3}$ | $R^{C9}$ | N |
| $L_{A735}$ | H | $R^{B4}$ | $R^{C9}$ | N |
| $L_{A736}$ | H | $R^{B5}$ | $R^{C9}$ | N |
| $L_{A737}$ | H | $R^{B7}$ | $R^{C9}$ | N |
| $L_{A738}$ | H | $R^{A3}$ | $R^{C9}$ | N |
| $L_{A739}$ | H | $R^{A34}$ | $R^{C9}$ | N |
| $L_{A740}$ | H | $R^{A57}$ | $R^{C9}$ | N |
| $L_{A741}$ | $R^{B1}$ | $R^{B1}$ | $R^{C9}$ | N |
| $L_{A742}$ | $R^{B3}$ | $R^{B3}$ | $R^{C9}$ | N |
| $L_{A743}$ | $R^{B4}$ | $R^{B4}$ | $R^{C9}$ | N |
| $L_{A744}$ | $R^{B5}$ | $R^{B5}$ | $R^{C9}$ | N |
| $L_{A745}$ | $R^{B7}$ | $R^{B7}$ | $R^{C9}$ | N |
| $L_{A746}$ | $R^{A3}$ | $R^{A3}$ | $R^{C9}$ | N |
| $L_{A747}$ | $R^{A34}$ | $R^{A34}$ | $R^{C9}$ | N |
| $L_{A748}$ | $R^{A57}$ | $R^{A57}$ | $R^{C9}$ | N |
| $L_{A749}$ | $R^{B3}$ | $R^{B1}$ | $R^{C9}$ | N |
| $L_{A750}$ | $R^{B4}$ | $R^{B1}$ | $R^{C9}$ | N |
| $L_{A751}$ | $R^{B5}$ | $R^{B1}$ | $R^{C9}$ | N |
| $L_{A752}$ | $R^{B7}$ | $R^{B1}$ | $R^{C9}$ | N |
| $L_{A753}$ | $R^{A3}$ | $R^{B1}$ | $R^{C9}$ | N |
| $L_{A754}$ | $R^{A34}$ | $R^{B1}$ | $R^{C9}$ | N |
| $L_{A755}$ | $R^{A57}$ | $R^{B1}$ | $R^{C9}$ | N |
| $L_{A756}$ | $R^{B1}$ | $R^{B3}$ | $R^{C9}$ | N |
| $L_{A757}$ | $R^{B1}$ | $R^{B4}$ | $R^{C9}$ | N |
| $L_{A758}$ | $R^{B1}$ | $R^{B5}$ | $R^{C9}$ | N |
| $L_{A759}$ | $R^{B1}$ | $R^{B7}$ | $R^{C9}$ | N |
| $L_{A760}$ | $R^{B1}$ | $R^{A3}$ | $R^{C9}$ | N |
| $L_{A761}$ | $R^{B1}$ | $R^{A34}$ | $R^{C9}$ | N |
| $L_{A762}$ | $R^{B1}$ | $R^{A57}$ | $R^{C9}$ | N |

$L_{A763}$ through $L_{A1143}$ are based on a structure of Formula V,

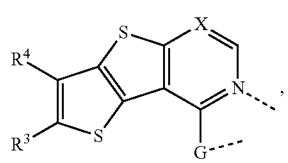

in which $R^3$, $R^4$, X and G are defined as:

| Ligand | $R^3$ | $R^4$ | G | X |
|---|---|---|---|---|
| $L_{A763}$ | H | H | $R^{C1}$ | C |
| $L_{A764}$ | $R^{B1}$ | H | $R^{C1}$ | C |
| $L_{A765}$ | $R^{B3}$ | H | $R^{C1}$ | C |
| $L_{A766}$ | $R^{B4}$ | H | $R^{C1}$ | C |
| $L_{A767}$ | $R^{B5}$ | H | $R^{C1}$ | C |
| $L_{A768}$ | $R^{B7}$ | H | $R^{C1}$ | C |
| $L_{A769}$ | $R^{A3}$ | H | $R^{C1}$ | C |
| $L_{A770}$ | $R^{A34}$ | H | $R^{C1}$ | C |
| $L_{A771}$ | $R^{A57}$ | H | $R^{C1}$ | C |
| $L_{A772}$ | H | $R^{B1}$ | $R^{C1}$ | C |
| $L_{A773}$ | H | $R^{B3}$ | $R^{C1}$ | C |
| $L_{A774}$ | H | $R^{B4}$ | $R^{C1}$ | C |
| $L_{A775}$ | H | $R^{B5}$ | $R^{C1}$ | C |
| $L_{A776}$ | H | $R^{B7}$ | $R^{C1}$ | C |
| $L_{A777}$ | H | $R^{A3}$ | $R^{C1}$ | C |
| $L_{A778}$ | H | $R^{A34}$ | $R^{C1}$ | C |
| $L_{A779}$ | H | $R^{A57}$ | $R^{C1}$ | C |
| $L_{A780}$ | $R^{B1}$ | $R^{B1}$ | $R^{C1}$ | C |
| $L_{A781}$ | $R^{B3}$ | $R^{B3}$ | $R^{C1}$ | C |
| $L_{A782}$ | $R^{B4}$ | $R^{B4}$ | $R^{C1}$ | C |
| $L_{A783}$ | $R^{B5}$ | $R^{B5}$ | $R^{C1}$ | C |
| $L_{A784}$ | $R^{B7}$ | $R^{B7}$ | $R^{C1}$ | C |
| $L_{A785}$ | $R^{A3}$ | $R^{A3}$ | $R^{C1}$ | C |
| $L_{A786}$ | $R^{A34}$ | $R^{A34}$ | $R^{C1}$ | C |
| $L_{A787}$ | $R^{A57}$ | $R^{A57}$ | $R^{C1}$ | C |
| $L_{A788}$ | $R^{B3}$ | $R^{B1}$ | $R^{C1}$ | C |

-continued

| Ligand | $R^3$ | $R^4$ | G | X |
|---|---|---|---|---|
| $L_{A789}$ | $R^{B4}$ | $R^{B1}$ | $R^{C1}$ | C |
| $L_{A790}$ | $R^{B5}$ | $R^{B1}$ | $R^{C1}$ | C |
| $L_{A791}$ | $R^{B7}$ | $R^{B1}$ | $R^{C1}$ | C |
| $L_{A792}$ | $R^{A3}$ | $R^{B1}$ | $R^{C1}$ | C |
| $L_{A793}$ | $R^{A34}$ | $R^{B1}$ | $R^{C1}$ | C |
| $L_{A794}$ | $R^{A57}$ | $R^{B1}$ | $R^{C1}$ | C |
| $L_{A795}$ | $R^{B1}$ | $R^{B3}$ | $R^{C1}$ | C |
| $L_{A796}$ | $R^{B1}$ | $R^{B4}$ | $R^{C1}$ | C |
| $L_{A797}$ | $R^{B1}$ | $R^{B5}$ | $R^{C1}$ | C |
| $L_{A798}$ | $R^{B1}$ | $R^{B7}$ | $R^{C1}$ | C |
| $L_{A799}$ | $R^{B1}$ | $R^{B3}$ | $R^{C1}$ | C |
| $L_{A800}$ | $R^{B1}$ | $R^{A3}$ | $R^{C1}$ | C |
| $L_{A801}$ | $R^{B1}$ | $R^{A57}$ | $R^{C1}$ | C |
| $L_{A802}$ | $R^{B1}$ | H | $R^{C2}$ | C |
| $L_{A803}$ | $R^{B3}$ | H | $R^{C2}$ | C |
| $L_{A804}$ | $R^{B4}$ | H | $R^{C2}$ | C |
| $L_{A805}$ | $R^{B5}$ | H | $R^{C2}$ | C |
| $L_{A806}$ | $R^{B7}$ | H | $R^{C2}$ | C |
| $L_{A807}$ | $R^{A3}$ | H | $R^{C2}$ | C |
| $L_{A808}$ | $R^{A34}$ | H | $R^{C2}$ | C |
| $L_{A809}$ | $R^{A57}$ | H | $R^{C2}$ | C |
| $L_{A810}$ | H | $R^{B1}$ | $R^{C2}$ | C |
| $L_{A811}$ | H | $R^{B3}$ | $R^{C2}$ | C |
| $L_{A812}$ | H | $R^{B4}$ | $R^{C2}$ | C |
| $L_{A813}$ | H | $R^{B5}$ | $R^{C2}$ | C |
| $L_{A814}$ | H | $R^{B7}$ | $R^{C2}$ | C |
| $L_{A815}$ | H | $R^{A3}$ | $R^{C2}$ | C |
| $L_{A816}$ | H | $R^{A34}$ | $R^{C2}$ | C |
| $L_{A817}$ | H | $R^{A57}$ | $R^{C2}$ | C |
| $L_{A818}$ | $R^{B1}$ | $R^{B1}$ | $R^{C2}$ | C |
| $L_{A819}$ | $R^{B3}$ | $R^{B3}$ | $R^{C2}$ | C |
| $L_{A820}$ | $R^{B4}$ | $R^{B4}$ | $R^{C2}$ | C |
| $L_{A821}$ | $R^{B5}$ | $R^{B5}$ | $R^{C2}$ | C |
| $L_{A822}$ | $R^{B7}$ | $R^{B7}$ | $R^{C2}$ | C |
| $L_{A823}$ | $R^{A3}$ | $R^{A3}$ | $R^{C2}$ | C |
| $L_{A824}$ | $R^{A34}$ | $R^{A34}$ | $R^{C2}$ | C |
| $L_{A825}$ | $R^{A57}$ | $R^{A57}$ | $R^{C2}$ | C |
| $L_{A826}$ | $R^{B3}$ | $R^{B1}$ | $R^{C2}$ | C |
| $L_{A827}$ | $R^{B4}$ | $R^{B1}$ | $R^{C2}$ | C |
| $L_{A828}$ | $R^{B5}$ | $R^{B1}$ | $R^{C2}$ | C |
| $L_{A829}$ | $R^{B7}$ | $R^{B1}$ | $R^{C2}$ | C |
| $L_{A830}$ | $R^{A3}$ | $R^{B1}$ | $R^{C2}$ | C |
| $L_{A831}$ | $R^{A34}$ | $R^{B1}$ | $R^{C2}$ | C |
| $L_{A832}$ | $R^{A57}$ | $R^{B1}$ | $R^{C2}$ | C |
| $L_{A833}$ | $R^{B1}$ | $R^{B3}$ | $R^{C2}$ | C |
| $L_{A834}$ | $R^{B1}$ | $R^{B4}$ | $R^{C2}$ | C |
| $L_{A835}$ | $R^{B1}$ | $R^{B5}$ | $R^{C2}$ | C |
| $L_{A836}$ | $R^{B1}$ | $R^{B7}$ | $R^{C2}$ | C |
| $L_{A837}$ | $R^{B1}$ | $R^{A3}$ | $R^{C2}$ | C |
| $L_{A838}$ | $R^{B1}$ | $R^{A34}$ | $R^{C2}$ | C |
| $L_{A839}$ | $R^{B1}$ | $R^{A57}$ | $R^{C2}$ | C |
| $L_{A840}$ | $R^{B1}$ | H | $R^{C3}$ | C |
| $L_{A841}$ | $R^{B3}$ | H | $R^{C3}$ | C |
| $L_{A842}$ | $R^{B4}$ | H | $R^{C3}$ | C |
| $L_{A843}$ | $R^{B5}$ | H | $R^{C3}$ | C |
| $L_{A844}$ | $R^{B7}$ | H | $R^{C3}$ | C |
| $L_{A845}$ | $R^{A3}$ | H | $R^{C3}$ | C |
| $L_{A846}$ | $R^{A34}$ | H | $R^{C3}$ | C |
| $L_{A847}$ | $R^{A57}$ | H | $R^{C3}$ | C |
| $L_{A848}$ | H | $R^{B1}$ | $R^{C3}$ | C |
| $L_{A849}$ | H | $R^{B3}$ | $R^{C3}$ | C |
| $L_{A850}$ | H | $R^{B4}$ | $R^{C3}$ | C |
| $L_{A851}$ | H | $R^{B5}$ | $R^{C3}$ | C |
| $L_{A852}$ | H | $R^{B7}$ | $R^{C3}$ | C |
| $L_{A853}$ | H | $R^{A3}$ | $R^{C3}$ | C |
| $L_{A854}$ | H | $R^{A34}$ | $R^{C3}$ | C |
| $L_{A855}$ | H | $R^{A57}$ | $R^{C3}$ | C |
| $L_{A856}$ | $R^{B1}$ | $R^{B1}$ | $R^{C3}$ | C |
| $L_{A857}$ | $R^{B3}$ | $R^{B3}$ | $R^{C3}$ | C |
| $L_{A858}$ | $R^{B4}$ | $R^{B4}$ | $R^{C3}$ | C |
| $L_{A859}$ | $R^{B5}$ | $R^{B5}$ | $R^{C3}$ | C |
| $L_{A860}$ | $R^{B7}$ | $R^{B7}$ | $R^{C3}$ | C |
| $L_{A861}$ | $R^{A3}$ | $R^{A3}$ | $R^{C3}$ | C |
| $L_{A862}$ | $R^{A34}$ | $R^{A34}$ | $R^{C3}$ | C |
| $L_{A863}$ | $R^{A57}$ | $R^{A57}$ | $R^{C3}$ | C |
| $L_{A864}$ | $R^{B3}$ | $R^{B1}$ | $R^{C3}$ | C |
| $L_{A865}$ | $R^{B4}$ | $R^{B1}$ | $R^{C3}$ | C |

-continued

| Ligand | $R^3$ | $R^4$ | G | X |
|---|---|---|---|---|
| $L_{A4866}$ | $R^{B5}$ | $R^{B1}$ | $R^{C3}$ | C |
| $L_{A4867}$ | $R^{B7}$ | $R^{B1}$ | $R^{C3}$ | C |
| $L_{A4868}$ | $R^{A3}$ | $R^{B1}$ | $R^{C3}$ | C |
| $L_{A4869}$ | $R^{A34}$ | $R^{B1}$ | $R^{C3}$ | C |
| $L_{A4870}$ | $R^{A57}$ | $R^{B1}$ | $R^{C3}$ | C |
| $L_{A4871}$ | $R^{B1}$ | $R^{B3}$ | $R^{C3}$ | C |
| $L_{A4872}$ | $R^{B1}$ | $R^{B4}$ | $R^{C3}$ | C |
| $L_{A4873}$ | $R^{B1}$ | $R^{B5}$ | $R^{C3}$ | C |
| $L_{A4874}$ | $R^{B1}$ | $R^{B7}$ | $R^{C3}$ | C |
| $L_{A4875}$ | $R^{B1}$ | $R^{A3}$ | $R^{C3}$ | C |
| $L_{A4876}$ | $R^{B1}$ | $R^{A34}$ | $R^{C3}$ | C |
| $L_{A4877}$ | $R^{B1}$ | $R^{A57}$ | $R^{C3}$ | C |
| $L_{A4878}$ | $R^{B1}$ | H | $R^{C8}$ | C |
| $L_{A4879}$ | $R^{B3}$ | H | $R^{C8}$ | C |
| $L_{A4880}$ | $R^{B4}$ | H | $R^{C8}$ | C |
| $L_{A4881}$ | $R^{B5}$ | H | $R^{C8}$ | C |
| $L_{A4882}$ | $R^{B7}$ | H | $R^{C8}$ | C |
| $L_{A4883}$ | $R^{A3}$ | H | $R^{C8}$ | C |
| $L_{A4884}$ | $R^{A34}$ | H | $R^{C8}$ | C |
| $L_{A4885}$ | $R^{A57}$ | H | $R^{C8}$ | C |
| $L_{A4886}$ | H | $R^{B1}$ | $R^{C8}$ | C |
| $L_{A4887}$ | H | $R^{B3}$ | $R^{C8}$ | C |
| $L_{A4888}$ | H | $R^{B4}$ | $R^{C8}$ | C |
| $L_{A4889}$ | H | $R^{B5}$ | $R^{C8}$ | C |
| $L_{A4890}$ | H | $R^{B7}$ | $R^{C8}$ | C |
| $L_{A4891}$ | H | $R^{B3}$ | $R^{C8}$ | C |
| $L_{A4892}$ | H | $R^{A34}$ | $R^{C8}$ | C |
| $L_{A4893}$ | H | $R^{A57}$ | $R^{C8}$ | C |
| $L_{A4894}$ | $R^{B1}$ | $R^{B1}$ | $R^{C8}$ | C |
| $L_{A4895}$ | $R^{B3}$ | $R^{B3}$ | $R^{C8}$ | C |
| $L_{A4896}$ | $R^{B4}$ | $R^{B4}$ | $R^{C8}$ | C |
| $L_{A4897}$ | $R^{B5}$ | $R^{B5}$ | $R^{C8}$ | C |
| $L_{A4898}$ | $R^{B7}$ | $R^{B7}$ | $R^{C8}$ | C |
| $L_{A4899}$ | $R^{A3}$ | $R^{A3}$ | $R^{C8}$ | C |
| $L_{A4900}$ | $R^{A34}$ | $R^{A34}$ | $R^{C8}$ | C |
| $L_{A4901}$ | $R^{A57}$ | $R^{A57}$ | $R^{C8}$ | C |
| $L_{A4902}$ | $R^{B3}$ | $R^{B1}$ | $R^{C8}$ | C |
| $L_{A4903}$ | $R^{B4}$ | $R^{B1}$ | $R^{C8}$ | C |
| $L_{A4904}$ | $R^{B5}$ | $R^{B1}$ | $R^{C8}$ | C |
| $L_{A4905}$ | $R^{B7}$ | $R^{B1}$ | $R^{C8}$ | C |
| $L_{A4906}$ | $R^{A3}$ | $R^{B1}$ | $R^{C8}$ | C |
| $L_{A4907}$ | $R^{A34}$ | $R^{B1}$ | $R^{C8}$ | C |
| $L_{A4908}$ | $R^{A57}$ | $R^{B1}$ | $R^{C8}$ | C |
| $L_{A4909}$ | $R^{B1}$ | $R^{B3}$ | $R^{C8}$ | C |
| $L_{A4910}$ | $R^{B1}$ | $R^{B4}$ | $R^{C8}$ | C |
| $L_{A4911}$ | $R^{B1}$ | $R^{B5}$ | $R^{C8}$ | C |
| $L_{A4912}$ | $R^{B1}$ | $R^{B7}$ | $R^{C8}$ | C |
| $L_{A4913}$ | $R^{B1}$ | $R^{A3}$ | $R^{C8}$ | C |
| $L_{A4914}$ | $R^{B1}$ | $R^{A34}$ | $R^{C8}$ | C |
| $L_{A4915}$ | $R^{B1}$ | $R^{A57}$ | $R^{C8}$ | C |
| $L_{A4916}$ | $R^{B1}$ | H | $R^{C9}$ | C |
| $L_{A4917}$ | $R^{B3}$ | H | $R^{C9}$ | C |
| $L_{A4918}$ | $R^{B4}$ | H | $R^{C9}$ | C |
| $L_{A4919}$ | $R^{B5}$ | H | $R^{C9}$ | C |
| $L_{A4920}$ | $R^{B7}$ | H | $R^{C9}$ | C |
| $L_{A4921}$ | $R^{A3}$ | H | $R^{C9}$ | C |
| $L_{A4922}$ | $R^{A34}$ | H | $R^{C9}$ | C |
| $L_{A4923}$ | $R^{A57}$ | H | $R^{C9}$ | C |
| $L_{A4924}$ | H | $R^{B1}$ | $R^{C9}$ | C |
| $L_{A4925}$ | H | $R^{B3}$ | $R^{C9}$ | C |
| $L_{A4926}$ | H | $R^{B4}$ | $R^{C9}$ | C |
| $L_{A4927}$ | H | $R^{B5}$ | $R^{C9}$ | C |
| $L_{A4928}$ | H | $R^{B7}$ | $R^{C9}$ | C |
| $L_{A4929}$ | H | $R^{A3}$ | $R^{C9}$ | C |
| $L_{A4930}$ | H | $R^{A34}$ | $R^{C9}$ | C |
| $L_{A4931}$ | H | $R^{A57}$ | $R^{C9}$ | C |
| $L_{A4932}$ | $R^{B1}$ | $R^{B1}$ | $R^{C9}$ | C |
| $L_{A4933}$ | $R^{B3}$ | $R^{B3}$ | $R^{C9}$ | C |
| $L_{A4934}$ | $R^{B4}$ | $R^{B4}$ | $R^{C9}$ | C |
| $L_{A4935}$ | $R^{B5}$ | $R^{B5}$ | $R^{C9}$ | C |
| $L_{A4936}$ | $R^{B7}$ | $R^{B7}$ | $R^{C9}$ | C |
| $L_{A4937}$ | $R^{A3}$ | $R^{A3}$ | $R^{C9}$ | C |
| $L_{A4938}$ | $R^{A34}$ | $R^{A34}$ | $R^{C9}$ | C |
| $L_{A4939}$ | $R^{A57}$ | $R^{A57}$ | $R^{C9}$ | C |
| $L_{A4940}$ | $R^{B3}$ | $R^{B1}$ | $R^{C9}$ | C |
| $L_{A4941}$ | $R^{B4}$ | $R^{B1}$ | $R^{C9}$ | C |
| $L_{A4942}$ | $R^{B5}$ | $R^{B1}$ | $R^{C9}$ | C |
| $L_{A4943}$ | $R^{B7}$ | $R^{B1}$ | $R^{C9}$ | C |
| $L_{A4944}$ | $R^{A3}$ | $R^{B1}$ | $R^{C9}$ | C |
| $L_{A4945}$ | $R^{A34}$ | $R^{B1}$ | $R^{C9}$ | C |
| $L_{A4946}$ | $R^{A57}$ | $R^{B1}$ | $R^{C9}$ | C |
| $L_{A4947}$ | $R^{B1}$ | $R^{B3}$ | $R^{C9}$ | C |
| $L_{A4948}$ | $R^{B1}$ | $R^{B4}$ | $R^{C9}$ | C |
| $L_{A4949}$ | $R^{B1}$ | $R^{B5}$ | $R^{C9}$ | C |
| $L_{A4950}$ | $R^{B1}$ | $R^{B7}$ | $R^{C9}$ | C |
| $L_{A4951}$ | $R^{B1}$ | $R^{A3}$ | $R^{C9}$ | C |
| $L_{A4952}$ | $R^{B1}$ | $R^{A34}$ | $R^{C9}$ | C |
| $L_{A4953}$ | $R^{B1}$ | $R^{A57}$ | $R^{C9}$ | C |
| $L_{A4954}$ | $R^{B1}$ | H | $R^{C1}$ | N |
| $L_{A4955}$ | $R^{B3}$ | H | $R^{C1}$ | N |
| $L_{A4956}$ | $R^{B4}$ | H | $R^{C1}$ | N |
| $L_{A4957}$ | $R^{BB}$ | H | $R^{C1}$ | N |
| $L_{A4958}$ | $R^{B7}$ | H | $R^{C1}$ | N |
| $L_{A4959}$ | $R^{A3}$ | H | $R^{C1}$ | N |
| $L_{A4960}$ | $R^{A34}$ | H | $R^{C1}$ | N |
| $L_{A4961}$ | $R^{A57}$ | H | $R^{C1}$ | N |
| $L_{A4962}$ | H | $R^{B1}$ | $R^{C1}$ | N |
| $L_{A4963}$ | H | $R^{B3}$ | $R^{C1}$ | N |
| $L_{A4964}$ | H | $R^{B4}$ | $R^{C1}$ | N |
| $L_{A4965}$ | H | $R^{B5}$ | $R^{C1}$ | N |
| $L_{A4966}$ | H | $R^{B7}$ | $R^{C1}$ | N |
| $L_{A4967}$ | H | $R^{A3}$ | $R^{C1}$ | N |
| $L_{A4968}$ | H | $R^{A34}$ | $R^{C1}$ | N |
| $L_{A4969}$ | H | $R^{A57}$ | $R^{C1}$ | N |
| $L_{A4970}$ | $R^{B1}$ | $R^{B1}$ | $R^{C1}$ | N |
| $L_{A4971}$ | $R^{B3}$ | $R^{B3}$ | $R^{C1}$ | N |
| $L_{A4972}$ | $R^{B4}$ | $R^{B4}$ | $R^{C1}$ | N |
| $L_{A4973}$ | $R^{B5}$ | $R^{B5}$ | $R^{C1}$ | N |
| $L_{A4974}$ | $R^{B7}$ | $R^{B7}$ | $R^{C1}$ | N |
| $L_{A4975}$ | $R^{A3}$ | $R^{A3}$ | $R^{C1}$ | N |
| $L_{A4976}$ | $R^{A34}$ | $R^{A34}$ | $R^{C1}$ | N |
| $L_{A4977}$ | $R^{A57}$ | $R^{A57}$ | $R^{C1}$ | N |
| $L_{A4978}$ | $R^{B3}$ | $R^{B1}$ | $R^{C1}$ | N |
| $L_{A4979}$ | $R^{B4}$ | $R^{B1}$ | $R^{C1}$ | N |
| $L_{A4980}$ | $R^{B5}$ | $R^{B1}$ | $R^{C1}$ | N |
| $L_{A4981}$ | $R^{B7}$ | $R^{B1}$ | $R^{C1}$ | N |
| $L_{A4982}$ | $R^{A3}$ | $R^{B1}$ | $R^{C1}$ | N |
| $L_{A4983}$ | $R^{A34}$ | $R^{B1}$ | $R^{C1}$ | N |
| $L_{A4984}$ | $R^{A57}$ | $R^{B1}$ | $R^{C1}$ | N |
| $L_{A4985}$ | $R^{B1}$ | $R^{B3}$ | $R^{C1}$ | N |
| $L_{A4986}$ | $R^{B1}$ | $R^{B4}$ | $R^{C1}$ | N |
| $L_{A4987}$ | $R^{B1}$ | $R^{B5}$ | $R^{C1}$ | N |
| $L_{A4988}$ | $R^{B1}$ | $R^{B7}$ | $R^{C1}$ | N |
| $L_{A4989}$ | $R^{B1}$ | $R^{A3}$ | $R^{C1}$ | N |
| $L_{A4990}$ | $R^{B1}$ | $R^{A34}$ | $R^{C1}$ | N |
| $L_{A4991}$ | $R^{B1}$ | $R^{A57}$ | $R^{C1}$ | N |
| $L_{A4992}$ | $R^{B1}$ | H | $R^{C2}$ | N |
| $L_{A4993}$ | $R^{B3}$ | H | $R^{C2}$ | N |
| $L_{A4994}$ | $R^{B4}$ | H | $R^{C2}$ | N |
| $L_{A4995}$ | $R^{B5}$ | H | $R^{C2}$ | N |
| $L_{A4996}$ | $R^{B7}$ | H | $R^{C2}$ | N |
| $L_{A4997}$ | $R^{A3}$ | H | $R^{C2}$ | N |
| $L_{A4998}$ | $R^{A34}$ | H | $R^{C2}$ | N |
| $L_{A4999}$ | $R^{A57}$ | H | $R^{C2}$ | N |
| $L_{A1000}$ | H | $R^{B1}$ | $R^{C2}$ | N |
| $L_{A1001}$ | H | $R^{B3}$ | $R^{C2}$ | N |
| $L_{A1002}$ | H | $R^{B4}$ | $R^{C2}$ | N |
| $L_{A1003}$ | H | $R^{B5}$ | $R^{C2}$ | N |
| $L_{A1004}$ | H | $R^{B7}$ | $R^{C2}$ | N |
| $L_{A1005}$ | H | $R^{A3}$ | $R^{C2}$ | N |
| $L_{A1006}$ | H | $R^{A34}$ | $R^{C2}$ | N |
| $L_{A1007}$ | H | $R^{A57}$ | $R^{C2}$ | N |
| $L_{A1008}$ | $R^{B1}$ | $R^{B1}$ | $R^{C2}$ | N |
| $L_{A1009}$ | $R^{B3}$ | $R^{B3}$ | $R^{C2}$ | N |
| $L_{A1010}$ | $R^{B4}$ | $R^{B4}$ | $R^{C2}$ | N |
| $L_{A1011}$ | $R^{B5}$ | $R^{B5}$ | $R^{C2}$ | N |
| $L_{A1012}$ | $R^{B7}$ | $R^{B7}$ | $R^{C2}$ | N |
| $L_{A1013}$ | $R^{A3}$ | $R^{A3}$ | $R^{C2}$ | N |
| $L_{A1014}$ | $R^{A34}$ | $R^{A34}$ | $R^{C2}$ | N |
| $L_{A1015}$ | $R^{A57}$ | $R^{A57}$ | $R^{C2}$ | N |
| $L_{A1016}$ | $R^{B3}$ | $R^{B1}$ | $R^{C2}$ | N |
| $L_{A1017}$ | $R^{B4}$ | $R^{B1}$ | $R^{C2}$ | N |
| $L_{A1018}$ | $R^{B5}$ | $R^{B1}$ | $R^{C2}$ | N |
| $L_{A1019}$ | $R^{B7}$ | $R^{B1}$ | $R^{C2}$ | N |

-continued

| Ligand | $R^3$ | $R^4$ | G | X |
|---|---|---|---|---|
| $L_{A1020}$ | $R^{A3}$ | $R^{B1}$ | $R^{C2}$ | N |
| $L_{A1021}$ | $R^{A34}$ | $R^{B1}$ | $R^{C2}$ | N |
| $L_{A1022}$ | $R^{A57}$ | $R^{B1}$ | $R^{C2}$ | N |
| $L_{A1023}$ | $R^{B1}$ | $R^{B3}$ | $R^{C2}$ | N |
| $L_{A1024}$ | $R^{B1}$ | $R^{B4}$ | $R^{C2}$ | N |
| $L_{A1025}$ | $R^{B1}$ | $R^{B5}$ | $R^{C2}$ | N |
| $L_{A1026}$ | $R^{B1}$ | $R^{B7}$ | $R^{C2}$ | N |
| $L_{A1027}$ | $R^{B1}$ | $R^{A3}$ | $R^{C2}$ | N |
| $L_{A1028}$ | $R^{B1}$ | $R^{A34}$ | $R^{C2}$ | N |
| $L_{A1029}$ | $R^{B1}$ | $R^{A57}$ | $R^{C2}$ | N |
| $L_{A1030}$ | $R^{B1}$ | H | $R^{C3}$ | N |
| $L_{A1031}$ | $R^{B3}$ | H | $R^{C3}$ | N |
| $L_{A1032}$ | $R^{B4}$ | H | $R^{C3}$ | N |
| $L_{A1033}$ | $R^{B5}$ | H | $R^{C3}$ | N |
| $L_{A1034}$ | $R^{B7}$ | H | $R^{C3}$ | N |
| $L_{A1035}$ | $R^{A3}$ | H | $R^{C3}$ | N |
| $L_{A1036}$ | $R^{A34}$ | H | $R^{C3}$ | N |
| $L_{A1037}$ | $R^{A57}$ | H | $R^{C3}$ | N |
| $L_{A1038}$ | H | $R^{B1}$ | $R^{C3}$ | N |
| $L_{A1039}$ | H | $R^{B3}$ | $R^{C3}$ | N |
| $L_{A1040}$ | H | $R^{B4}$ | $R^{C3}$ | N |
| $L_{A1041}$ | H | $R^{B5}$ | $R^{C3}$ | N |
| $L_{A1042}$ | H | $R^{B7}$ | $R^{C3}$ | N |
| $L_{A1043}$ | H | $R^{A3}$ | $R^{C3}$ | N |
| $L_{A1044}$ | H | $R^{A34}$ | $R^{C3}$ | N |
| $L_{A1045}$ | H | $R^{A57}$ | $R^{C3}$ | N |
| $L_{A1046}$ | $R^{B1}$ | $R^{B1}$ | $R^{C3}$ | N |
| $L_{A1047}$ | $R^{B3}$ | $R^{B3}$ | $R^{C3}$ | N |
| $L_{A1048}$ | $R^{B4}$ | $R^{B4}$ | $R^{C3}$ | N |
| $L_{A1049}$ | $R^{B5}$ | $R^{B5}$ | $R^{C3}$ | N |
| $L_{A1050}$ | $R^{B7}$ | $R^{B7}$ | $R^{C3}$ | N |
| $L_{A1051}$ | $R^{A3}$ | $R^{A3}$ | $R^{C3}$ | N |
| $L_{A1052}$ | $R^{A34}$ | $R^{A34}$ | $R^{C3}$ | N |
| $L_{A1053}$ | $R^{A57}$ | $R^{A57}$ | $R^{C3}$ | N |
| $L_{A1054}$ | $R^{B3}$ | $R^{B1}$ | $R^{C3}$ | N |
| $L_{A1055}$ | $R^{B4}$ | $R^{B1}$ | $R^{C3}$ | N |
| $L_{A1056}$ | $R^{B5}$ | $R^{B1}$ | $R^{C3}$ | N |
| $L_{A1057}$ | $R^{B7}$ | $R^{B1}$ | $R^{C3}$ | N |
| $L_{A1058}$ | $R^{A3}$ | $R^{B1}$ | $R^{C3}$ | N |
| $L_{A1059}$ | $R^{A34}$ | $R^{B1}$ | $R^{C3}$ | N |
| $L_{A1060}$ | $R^{A57}$ | $R^{B1}$ | $R^{C3}$ | N |
| $L_{A1061}$ | $R^{B1}$ | $R^{B3}$ | $R^{C3}$ | N |
| $L_{A1062}$ | $R^{B1}$ | $R^{B4}$ | $R^{C3}$ | N |
| $L_{A1063}$ | $R^{B1}$ | $R^{B5}$ | $R^{C3}$ | N |
| $L_{A1064}$ | $R^{B1}$ | $R^{B7}$ | $R^{C3}$ | N |
| $L_{A1065}$ | $R^{B1}$ | $R^{A3}$ | $R^{C3}$ | N |
| $L_{A1066}$ | $R^{B1}$ | $R^{A34}$ | $R^{C3}$ | N |
| $L_{A1067}$ | $R^{B1}$ | $R^{A57}$ | $R^{C3}$ | N |
| $L_{A1068}$ | $R^{B1}$ | H | $R^{C8}$ | N |
| $L_{A1069}$ | $R^{B3}$ | H | $R^{C8}$ | N |
| $L_{A1070}$ | $R^{B4}$ | H | $R^{C8}$ | N |
| $L_{A1071}$ | $R^{B5}$ | H | $R^{C8}$ | N |
| $L_{A1072}$ | $R^{B7}$ | H | $R^{C8}$ | N |
| $L_{A1073}$ | $R^{A3}$ | H | $R^{C8}$ | N |
| $L_{A1074}$ | $R^{A34}$ | H | $R^{C8}$ | N |
| $L_{A1075}$ | $R^{A57}$ | H | $R^{C8}$ | N |
| $L_{A1076}$ | H | $R^{B1}$ | $R^{C8}$ | N |
| $L_{A1077}$ | H | $R^{B3}$ | $R^{C8}$ | N |
| $L_{A1078}$ | H | $R^{B4}$ | $R^{C8}$ | N |
| $L_{A1079}$ | H | $R^{B5}$ | $R^{C8}$ | N |
| $L_{A1080}$ | H | $R^{B7}$ | $R^{C8}$ | N |
| $L_{A1081}$ | H | $R^{A3}$ | $R^{C8}$ | N |
| $L_{A1082}$ | H | $R^{A34}$ | $R^{C8}$ | N |
| $L_{A1083}$ | H | $R^{A57}$ | $R^{C8}$ | N |
| $L_{A1084}$ | $R^{B1}$ | $R^{B1}$ | $R^{C8}$ | N |
| $L_{A1085}$ | $R^{B3}$ | $R^{B3}$ | $R^{C8}$ | N |
| $L_{A1086}$ | $R^{B4}$ | $R^{B4}$ | $R^{C8}$ | N |
| $L_{A1087}$ | $R^{B5}$ | $R^{B5}$ | $R^{C8}$ | N |
| $L_{A1088}$ | $R^{B7}$ | $R^{B7}$ | $R^{C8}$ | N |
| $L_{A1089}$ | $R^{A3}$ | $R^{A3}$ | $R^{C8}$ | N |
| $L_{A1090}$ | $R^{A34}$ | $R^{A34}$ | $R^{C8}$ | N |
| $L_{A1091}$ | $R^{A57}$ | $R^{A57}$ | $R^{C8}$ | N |
| $L_{A1092}$ | $R^{B3}$ | $R^{B1}$ | $R^{C8}$ | N |
| $L_{A1093}$ | $R^{B4}$ | $R^{B1}$ | $R^{C8}$ | N |
| $L_{A1094}$ | $R^{B5}$ | $R^{B1}$ | $R^{C8}$ | N |
| $L_{A1095}$ | $R^{B7}$ | $R^{B1}$ | $R^{C8}$ | N |
| $L_{A1096}$ | $R^{A3}$ | $R^{B1}$ | $R^{C8}$ | N |

-continued

| Ligand | $R^3$ | $R^4$ | G | X |
|---|---|---|---|---|
| $L_{A1097}$ | $R^{A34}$ | $R^{B1}$ | $R^{C8}$ | N |
| $L_{A1098}$ | $R^{A57}$ | $R^{B1}$ | $R^{C8}$ | N |
| $L_{A1099}$ | $R^{B1}$ | $R^{B3}$ | $R^{C8}$ | N |
| $L_{A1100}$ | $R^{B1}$ | $R^{B4}$ | $R^{C8}$ | N |
| $L_{A1101}$ | $R^{B1}$ | $R^{B5}$ | $R^{C8}$ | N |
| $L_{A1102}$ | $R^{B1}$ | $R^{B7}$ | $R^{C8}$ | N |
| $L_{A1103}$ | $R^{B1}$ | $R^{A3}$ | $R^{C8}$ | N |
| $L_{A1104}$ | $R^{B1}$ | $R^{A34}$ | $R^{C8}$ | N |
| $L_{A1105}$ | $R^{B1}$ | $R^{A57}$ | $R^{C8}$ | N |
| $L_{A1106}$ | $R^{B1}$ | H | $R^{C9}$ | N |
| $L_{A1107}$ | $R^{B3}$ | H | $R^{C9}$ | N |
| $L_{A1108}$ | $R^{B4}$ | H | $R^{C9}$ | N |
| $L_{A1109}$ | $R^{B5}$ | H | $R^{C9}$ | N |
| $L_{A1110}$ | $R^{B7}$ | H | $R^{C9}$ | N |
| $L_{A1111}$ | $R^{A3}$ | H | $R^{C9}$ | N |
| $L_{A1112}$ | $R^{A34}$ | H | $R^{C9}$ | N |
| $L_{A1113}$ | $R^{A57}$ | H | $R^{C9}$ | N |
| $L_{A1114}$ | H | $R^{B1}$ | $R^{C9}$ | N |
| $L_{A1115}$ | H | $R^{B3}$ | $R^{C9}$ | N |
| $L_{A1116}$ | H | $R^{B4}$ | $R^{C9}$ | N |
| $L_{A1117}$ | H | $R^{B5}$ | $R^{C9}$ | N |
| $L_{A1118}$ | H | $R^{B7}$ | $R^{C9}$ | N |
| $L_{A1119}$ | H | $R^{A3}$ | $R^{C9}$ | N |
| $L_{A1120}$ | H | $R^{A34}$ | $R^{C9}$ | N |
| $L_{A1121}$ | H | $R^{A57}$ | $R^{C9}$ | N |
| $L_{A1122}$ | $R^{B1}$ | $R^{B1}$ | $R^{C9}$ | N |
| $L_{A1123}$ | $R^{B3}$ | $R^{B3}$ | $R^{C9}$ | N |
| $L_{A1124}$ | $R^{B4}$ | $R^{B4}$ | $R^{C9}$ | N |
| $L_{A1125}$ | $R^{B5}$ | $R^{B5}$ | $R^{C9}$ | N |
| $L_{A1126}$ | $R^{B7}$ | $R^{B7}$ | $R^{C9}$ | N |
| $L_{A1127}$ | $R^{A3}$ | $R^{A3}$ | $R^{C9}$ | N |
| $L_{A1128}$ | $R^{A34}$ | $R^{A34}$ | $R^{C9}$ | N |
| $L_{A1129}$ | $R^{A57}$ | $R^{A57}$ | $R^{C9}$ | N |
| $L_{A1130}$ | $R^{B3}$ | $R^{B1}$ | $R^{C9}$ | N |
| $L_{A1131}$ | $R^{B4}$ | $R^{B1}$ | $R^{C9}$ | N |
| $L_{A1132}$ | $R^{B5}$ | $R^{B1}$ | $R^{C9}$ | N |
| $L_{A1133}$ | $R^{B7}$ | $R^{B1}$ | $R^{C9}$ | N |
| $L_{A1134}$ | $R^{A3}$ | $R^{B1}$ | $R^{C9}$ | N |
| $L_{A1135}$ | $R^{A34}$ | $R^{B1}$ | $R^{C9}$ | N |
| $L_{A1136}$ | $R^{A57}$ | $R^{B1}$ | $R^{C9}$ | N |
| $L_{A1137}$ | $R^{B1}$ | $R^{B3}$ | $R^{C9}$ | N |
| $L_{A1138}$ | $R^{B1}$ | $R^{B4}$ | $R^{C9}$ | N |
| $L_{A1139}$ | $R^{B1}$ | $R^{B5}$ | $R^{C9}$ | N |
| $L_{A1140}$ | $R^{B1}$ | $R^{B7}$ | $R^{C9}$ | N |
| $L_{A1141}$ | $R^{B1}$ | $R^{A3}$ | $R^{C9}$ | N |
| $L_{A1142}$ | $R^{B1}$ | $R^{A34}$ | $R^{C9}$ | N |
| $L_{A1143}$ | $R^{B1}$ | $R^{A57}$ | $R^{C9}$ | N |

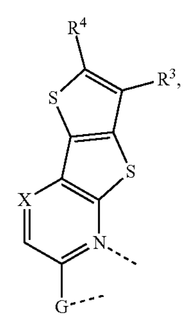

$L_{A1144}$ through $L_{A1524}$ are based on a structure of Formula V, in which $R^3$, $R^4$, X and G are defined as:

| Ligand | $R^3$ | $R^4$ | G | X |
|---|---|---|---|---|
| $L_{A1144}$ | H | H | $R^{C1}$ | C |
| $L_{A1145}$ | $R^{B1}$ | H | $R^{C1}$ | C |
| $L_{A1146}$ | $R^{B3}$ | H | $R^{C1}$ | C |

-continued

| Ligand | $R^3$ | $R^4$ | G | X |
|---|---|---|---|---|
| $L_{A1147}$ | $R^{B4}$ | H | $R^{C1}$ | C |
| $L_{A1148}$ | $R^{B5}$ | H | $R^{C1}$ | C |
| $L_{A1149}$ | $R^{B7}$ | H | $R^{C1}$ | C |
| $L_{A1150}$ | $R^{A3}$ | H | $R^{C1}$ | C |
| $L_{A1151}$ | $R^{A34}$ | H | $R^{C1}$ | C |
| $L_{A1152}$ | $R^{A57}$ | H | $R^{C1}$ | C |
| $L_{A1153}$ | H | $R^{B1}$ | $R^{C1}$ | C |
| $L_{A1154}$ | H | $R^{B3}$ | $R^{C1}$ | C |
| $L_{A1155}$ | H | $R^{B4}$ | $R^{C1}$ | C |
| $L_{A1156}$ | H | $R^{B5}$ | $R^{C1}$ | C |
| $L_{A1157}$ | H | $R^{B7}$ | $R^{C1}$ | C |
| $L_{A1158}$ | H | $R^{A3}$ | $R^{C1}$ | C |
| $L_{A1159}$ | H | $R^{A34}$ | $R^{C1}$ | C |
| $L_{A1160}$ | H | $R^{A57}$ | $R^{C1}$ | C |
| $L_{A1161}$ | $R^{B1}$ | $R^{B1}$ | $R^{C1}$ | C |
| $L_{A1162}$ | $R^{B3}$ | $R^{B3}$ | $R^{C1}$ | C |
| $L_{A1163}$ | $R^{B4}$ | $R^{B4}$ | $R^{C1}$ | C |
| $L_{A1164}$ | $R^{B5}$ | $R^{B5}$ | $R^{C1}$ | C |
| $L_{A1165}$ | $R^{B7}$ | $R^{B7}$ | $R^{C1}$ | C |
| $L_{A1166}$ | $R^{A3}$ | $R^{A3}$ | $R^{C1}$ | C |
| $L_{A1167}$ | $R^{A34}$ | $R^{A34}$ | $R^{C1}$ | C |
| $L_{A1168}$ | $R^{A57}$ | $R^{A57}$ | $R^{C1}$ | C |
| $L_{A1169}$ | $R^{B3}$ | $R^{B1}$ | $R^{C1}$ | C |
| $L_{A1170}$ | $R^{B4}$ | $R^{B1}$ | $R^{C1}$ | C |
| $L_{A1171}$ | $R^{B5}$ | $R^{B}$ | $R^{C1}$ | C |
| $L_{A1172}$ | $R^{B7}$ | $R^{B1}$ | $R^{C1}$ | C |
| $L_{A1173}$ | $R^{A3}$ | $R^{B1}$ | $R^{C1}$ | C |
| $L_{A1174}$ | $R^{A34}$ | $R^{B1}$ | $R^{C1}$ | C |
| $L_{A1175}$ | $R^{A57}$ | $R^{B1}$ | $R^{C1}$ | C |
| $L_{A1176}$ | $R^{B1}$ | $R^{B3}$ | $R^{C1}$ | C |
| $L_{A1177}$ | $R^{B1}$ | $R^{B4}$ | $R^{C1}$ | C |
| $L_{A1178}$ | $R^{B1}$ | $R^{B5}$ | $R^{C1}$ | C |
| $L_{A1179}$ | $R^{B1}$ | $R^{B7}$ | $R^{C1}$ | C |
| $L_{A1180}$ | $R^{B1}$ | $R^{A3}$ | $R^{C1}$ | C |
| $L_{A1181}$ | $R^{B1}$ | $R^{A34}$ | $R^{C1}$ | C |
| $L_{A1182}$ | $R^{B1}$ | $R^{A57}$ | $R^{C1}$ | C |
| $L_{A1183}$ | $R^{B1}$ | H | $R^{C2}$ | C |
| $L_{A1184}$ | $R^{B3}$ | H | $R^{C2}$ | C |
| $L_{A1185}$ | $R^{B4}$ | H | $R^{C2}$ | C |
| $L_{A1186}$ | $R^{B5}$ | H | $R^{C2}$ | C |
| $L_{A1187}$ | $R^{B7}$ | H | $R^{C2}$ | C |
| $L_{A1188}$ | $R^{A3}$ | H | $R^{C2}$ | C |
| $L_{A1189}$ | $R^{A34}$ | H | $R^{C2}$ | C |
| $L_{A1190}$ | $R^{A57}$ | H | $R^{C2}$ | C |
| $L_{A1191}$ | H | $R^{B1}$ | $R^{C2}$ | C |
| $L_{A1192}$ | H | $R^{B3}$ | $R^{C2}$ | C |
| $L_{A1193}$ | H | $R^{B4}$ | $R^{C2}$ | C |
| $L_{A1194}$ | H | $R^{B5}$ | $R^{C2}$ | C |
| $L_{A1195}$ | H | $R^{B7}$ | $R^{C2}$ | C |
| $L_{A1196}$ | H | $R^{A3}$ | $R^{C2}$ | C |
| $L_{A1197}$ | H | $R^{A34}$ | $R^{C2}$ | C |
| $L_{A1198}$ | H | $R^{A57}$ | $R^{C2}$ | C |
| $L_{A1199}$ | $R^{B1}$ | $R^{B1}$ | $R^{C2}$ | C |
| $L_{A1200}$ | $R^{B3}$ | $R^{B3}$ | $R^{C2}$ | C |
| $L_{A1201}$ | $R^{B4}$ | $R^{B4}$ | $R^{C2}$ | C |
| $L_{A1202}$ | $R^{B5}$ | $R^{B5}$ | $R^{C2}$ | C |
| $L_{A1203}$ | $R^{B7}$ | $R^{B7}$ | $R^{C2}$ | C |
| $L_{A1204}$ | $R^{A3}$ | $R^{A3}$ | $R^{C2}$ | C |
| $L_{A1205}$ | $R^{A34}$ | $R^{A34}$ | $R^{C2}$ | C |
| $L_{A1206}$ | $R^{A57}$ | $R^{A57}$ | $R^{C2}$ | C |
| $L_{A1207}$ | $R^{B3}$ | $R^{B1}$ | $R^{C2}$ | C |
| $L_{A1208}$ | $R^{B4}$ | $R^{B1}$ | $R^{C2}$ | C |
| $L_{A1209}$ | $R^{B5}$ | $R^{B1}$ | $R^{C2}$ | C |
| $L_{A1210}$ | $R^{B7}$ | $R^{B1}$ | $R^{C2}$ | C |
| $L_{A1211}$ | $R^{A3}$ | $R^{B1}$ | $R^{C2}$ | C |
| $L_{A1212}$ | $R^{A34}$ | $R^{B1}$ | $R^{C2}$ | C |
| $L_{A1213}$ | $R^{A57}$ | $R^{B1}$ | $R^{C2}$ | C |
| $L_{A1214}$ | $R^{B1}$ | $R^{B3}$ | $R^{C2}$ | C |
| $L_{A1215}$ | $R^{B1}$ | $R^{B4}$ | $R^{C2}$ | C |
| $L_{A1216}$ | $R^{B1}$ | $R^{B5}$ | $R^{C2}$ | C |
| $L_{A1217}$ | $R^{B1}$ | $R^{B7}$ | $R^{C2}$ | C |
| $L_{A1218}$ | $R^{B1}$ | $R^{A3}$ | $R^{C2}$ | C |
| $L_{A1219}$ | $R^{B1}$ | $R^{A34}$ | $R^{C2}$ | C |
| $L_{A1220}$ | $R^{B1}$ | $R^{A57}$ | $R^{C2}$ | C |
| $L_{A1221}$ | $R^{B1}$ | H | $R^{C3}$ | C |
| $L_{A1222}$ | $R^{B3}$ | H | $R^{C3}$ | C |
| $L_{A1223}$ | $R^{B4}$ | H | $R^{C3}$ | C |
| $L_{A1224}$ | $R^{B5}$ | H | $R^{C3}$ | C |
| $L_{A1225}$ | $R^{B7}$ | H | $R^{C3}$ | C |
| $L_{A1226}$ | $R^{A3}$ | H | $R^{C3}$ | C |
| $L_{A1227}$ | $R^{A34}$ | H | $R^{C3}$ | C |
| $L_{A1228}$ | $R^{A57}$ | H | $R^{C3}$ | C |
| $L_{A1229}$ | H | $R^{B1}$ | $R^{C3}$ | C |
| $L_{A1230}$ | H | $R^{B3}$ | $R^{C3}$ | C |
| $L_{A1231}$ | H | $R^{B4}$ | $R^{C3}$ | C |
| $L_{A1232}$ | H | $R^{B5}$ | $R^{C3}$ | C |
| $L_{A1233}$ | H | $R^{B7}$ | $R^{C3}$ | C |
| $L_{A1234}$ | H | $R^{A3}$ | $R^{C3}$ | C |
| $L_{A1235}$ | H | $R^{A34}$ | $R^{C3}$ | C |
| $L_{A1236}$ | H | $R^{A57}$ | $R^{C3}$ | C |
| $L_{A1237}$ | $R^{B1}$ | $R^{B1}$ | $R^{C3}$ | C |
| $L_{A1238}$ | $R^{B3}$ | $R^{B3}$ | $R^{C3}$ | C |
| $L_{A1239}$ | $R^{B4}$ | $R^{B4}$ | $R^{C3}$ | C |
| $L_{A1240}$ | $R^{B5}$ | $R^{B5}$ | $R^{C3}$ | C |
| $L_{A1241}$ | $R^{B7}$ | $R^{B7}$ | $R^{C3}$ | C |
| $L_{A1242}$ | $R^{A3}$ | $R^{A3}$ | $R^{C3}$ | C |
| $L_{A1243}$ | $R^{A34}$ | $R^{A34}$ | $R^{C3}$ | C |
| $L_{A1244}$ | $R^{A57}$ | $R^{A57}$ | $R^{C3}$ | C |
| $L_{A1245}$ | $R^{B3}$ | $R^{B1}$ | $R^{C3}$ | C |
| $L_{A1246}$ | $R^{B4}$ | $R^{B1}$ | $R^{C3}$ | C |
| $L_{A1247}$ | $R^{B5}$ | $R^{B1}$ | $R^{C3}$ | C |
| $L_{A1248}$ | $R^{B7}$ | $R^{B1}$ | $R^{C3}$ | C |
| $L_{A1249}$ | $R^{A3}$ | $R^{B1}$ | $R^{C3}$ | C |
| $L_{A1250}$ | $R^{A34}$ | $R^{B1}$ | $R^{C3}$ | C |
| $L_{A1251}$ | $R^{A57}$ | $R^{B1}$ | $R^{C3}$ | C |
| $L_{A1252}$ | $R^{B1}$ | $R^{B3}$ | $R^{C3}$ | C |
| $L_{A1253}$ | $R^{B1}$ | $R^{B4}$ | $R^{C3}$ | C |
| $L_{A1254}$ | $R^{B1}$ | $R^{B5}$ | $R^{C3}$ | C |
| $L_{A1255}$ | $R^{B1}$ | $R^{B7}$ | $R^{C3}$ | C |
| $L_{A1256}$ | $R^{B1}$ | $R^{A3}$ | $R^{C3}$ | C |
| $L_{A1257}$ | $R^{B1}$ | $R^{A34}$ | $R^{C3}$ | C |
| $L_{A1258}$ | $R^{B1}$ | $R^{A57}$ | $R^{C3}$ | C |
| $L_{A1259}$ | $R^{B1}$ | H | $R^{C8}$ | C |
| $L_{A1260}$ | $R^{B3}$ | H | $R^{C8}$ | C |
| $L_{A1261}$ | $R^{B4}$ | H | $R^{C8}$ | C |
| $L_{A1262}$ | $R^{B5}$ | H | $R^{C8}$ | C |
| $L_{A1263}$ | $R^{B7}$ | H | $R^{C8}$ | C |
| $L_{A1264}$ | $R^{A3}$ | H | $R^{C8}$ | C |
| $L_{A1265}$ | $R^{A34}$ | H | $R^{C8}$ | C |
| $L_{A1266}$ | $R^{A57}$ | H | $R^{C8}$ | C |
| $L_{A1267}$ | H | $R^{B1}$ | $R^{C8}$ | C |
| $L_{A1268}$ | H | $R^{B3}$ | $R^{C8}$ | C |
| $L_{A1269}$ | H | $R^{B4}$ | $R^{C8}$ | C |
| $L_{A1270}$ | H | $R^{B5}$ | $R^{C8}$ | C |
| $L_{A1271}$ | H | $R^{B7}$ | $R^{C8}$ | C |
| $L_{A1272}$ | H | $R^{A3}$ | $R^{C8}$ | C |
| $L_{A1273}$ | H | $R^{A34}$ | $R^{C8}$ | C |
| $L_{A1274}$ | H | $R^{A57}$ | $R^{C8}$ | C |
| $L_{A1275}$ | $R^{B1}$ | $R^{B1}$ | $R^{C8}$ | C |
| $L_{A1276}$ | $R^{B3}$ | $R^{B3}$ | $R^{C8}$ | C |
| $L_{A1277}$ | $R^{B4}$ | $R^{B4}$ | $R^{C8}$ | C |
| $L_{A1278}$ | $R^{B5}$ | $R^{B5}$ | $R^{C8}$ | C |
| $L_{A1279}$ | $R^{B7}$ | $R^{B7}$ | $R^{C8}$ | C |
| $L_{A1280}$ | $R^{A3}$ | $R^{A3}$ | $R^{C8}$ | C |
| $L_{A1281}$ | $R^{A34}$ | $R^{A34}$ | $R^{C8}$ | C |
| $L_{A1282}$ | $R^{A57}$ | $R^{A57}$ | $R^{C8}$ | C |
| $L_{A1283}$ | $R^{B3}$ | $R^{B1}$ | $R^{C8}$ | C |
| $L_{A1284}$ | $R^{B4}$ | $R^{B1}$ | $R^{C8}$ | C |
| $L_{A1285}$ | $R^{B5}$ | $R^{B1}$ | $R^{C8}$ | C |
| $L_{A1286}$ | $R^{B7}$ | $R^{B1}$ | $R^{C8}$ | C |
| $L_{A1287}$ | $R^{A3}$ | $R^{B1}$ | $R^{C8}$ | C |
| $L_{A1288}$ | $R^{A34}$ | $R^{B1}$ | $R^{C8}$ | C |
| $L_{A1289}$ | $R^{A57}$ | $R^{B1}$ | $R^{C8}$ | C |
| $L_{A1290}$ | $R^{B1}$ | $R^{B3}$ | $R^{C8}$ | C |
| $L_{A1291}$ | $R^{B1}$ | $R^{B4}$ | $R^{C8}$ | C |
| $L_{A1292}$ | $R^{B1}$ | $R^{B5}$ | $R^{C8}$ | C |
| $L_{A1293}$ | $R^{B1}$ | $R^{B7}$ | $R^{C8}$ | C |
| $L_{A1294}$ | $R^{B1}$ | $R^{A3}$ | $R^{C8}$ | C |
| $L_{A1295}$ | $R^{B1}$ | $R^{A34}$ | $R^{C8}$ | C |
| $L_{A1296}$ | $R^{B1}$ | $R^{A57}$ | $R^{C8}$ | C |
| $L_{A1297}$ | $R^{B1}$ | H | $R^{C9}$ | C |
| $L_{A1298}$ | $R^{B3}$ | H | $R^{C9}$ | C |
| $L_{A1299}$ | $R^{B4}$ | H | $R^{C9}$ | C |
| $L_{A1300}$ | $R^{B5}$ | H | $R^{C9}$ | C |

-continued

| Ligand | $R^3$ | $R^4$ | G | X |
|---|---|---|---|---|
| $L_{A1301}$ | $R^{B7}$ | H | $R^{C9}$ | C |
| $L_{A1302}$ | $R^{A3}$ | H | $R^{C9}$ | C |
| $L_{A1303}$ | $R^{A34}$ | H | $R^{C9}$ | C |
| $L_{A1304}$ | $R^{A57}$ | H | $R^{C9}$ | C |
| $L_{A1305}$ | H | $R^{B1}$ | $R^{C9}$ | C |
| $L_{A1306}$ | H | $R^{B3}$ | $R^{C9}$ | C |
| $L_{A1307}$ | H | $R^{B4}$ | $R^{C9}$ | C |
| $L_{A1308}$ | H | $R^{B5}$ | $R^{C9}$ | C |
| $L_{A1309}$ | H | $R^{B7}$ | $R^{C9}$ | C |
| $L_{A1310}$ | H | $R^{A3}$ | $R^{C9}$ | C |
| $L_{A1311}$ | H | $R^{A34}$ | $R^{C9}$ | C |
| $L_{A1312}$ | H | $R^{A57}$ | $R^{C9}$ | C |
| $L_{A1313}$ | $R^{B1}$ | $R^{B1}$ | $R^{C9}$ | C |
| $L_{A1314}$ | $R^{B3}$ | $R^{B3}$ | $R^{C9}$ | C |
| $L_{A1315}$ | $R^{B4}$ | $R^{B4}$ | $R^{C9}$ | C |
| $L_{A1316}$ | $R^{B5}$ | $R^{B5}$ | $R^{C9}$ | C |
| $L_{A1317}$ | $R^{B7}$ | $R^{B7}$ | $R^{C9}$ | C |
| $L_{A1318}$ | $R^{A3}$ | $R^{A3}$ | $R^{C9}$ | C |
| $L_{A1319}$ | $R^{A34}$ | $R^{A34}$ | $R^{C9}$ | C |
| $L_{A1320}$ | $R^{A57}$ | $R^{A57}$ | $R^{C9}$ | C |
| $L_{A1321}$ | $R^{B3}$ | $R^{B1}$ | $R^{C9}$ | C |
| $L_{A1322}$ | $R^{B4}$ | $R^{B1}$ | $R^{C9}$ | C |
| $L_{A1323}$ | $R^{B5}$ | $R^{B1}$ | $R^{C9}$ | C |
| $L_{A1324}$ | $R^{B7}$ | $R^{B1}$ | $R^{C9}$ | C |
| $L_{A1325}$ | $R^{A3}$ | $R^{B1}$ | $R^{C9}$ | C |
| $L_{A1326}$ | $R^{A34}$ | $R^{B1}$ | $R^{C9}$ | C |
| $L_{A1327}$ | $R^{A57}$ | $R^{B1}$ | $R^{C9}$ | C |
| $L_{A1328}$ | $R^{B1}$ | $R^{B3}$ | $R^{C9}$ | C |
| $L_{A1329}$ | $R^{B1}$ | $R^{B4}$ | $R^{C9}$ | C |
| $L_{A1330}$ | $R^{B1}$ | $R^{B5}$ | $R^{C9}$ | C |
| $L_{A1331}$ | $R^{B1}$ | $R^{B7}$ | $R^{C9}$ | C |
| $L_{A1332}$ | $R^{B1}$ | $R^{A3}$ | $R^{C9}$ | C |
| $L_{A1333}$ | $R^{B1}$ | $R^{A34}$ | $R^{C9}$ | C |
| $L_{A1334}$ | $R^{B1}$ | $R^{A57}$ | $R^{C9}$ | C |
| $L_{A1335}$ | $R^{B1}$ | H | $R^{C1}$ | N |
| $L_{A1336}$ | $R^{B3}$ | H | $R^{C1}$ | N |
| $L_{A1337}$ | $R^{B4}$ | H | $R^{C1}$ | N |
| $L_{A1338}$ | $R^{B5}$ | H | $R^{C1}$ | N |
| $L_{A1339}$ | $R^{B7}$ | H | $R^{C1}$ | N |
| $L_{A1340}$ | $R^{A3}$ | H | $R^{C1}$ | N |
| $L_{A1341}$ | $R^{A34}$ | H | $R^{C1}$ | N |
| $L_{A1342}$ | $R^{A57}$ | H | $R^{C1}$ | N |
| $L_{A1343}$ | H | $R^{B1}$ | $R^{C1}$ | N |
| $L_{A1344}$ | H | $R^{B3}$ | $R^{C1}$ | N |
| $L_{A1345}$ | H | $R^{B4}$ | $R^{C1}$ | N |
| $L_{A1346}$ | H | $R^{B5}$ | $R^{C1}$ | N |
| $L_{A1347}$ | H | $R^{B7}$ | $R^{C1}$ | N |
| $L_{A1348}$ | H | $R^{A3}$ | $R^{C1}$ | N |
| $L_{A1349}$ | H | $R^{A34}$ | $R^{C1}$ | N |
| $L_{A1350}$ | H | $R^{A57}$ | $R^{C1}$ | N |
| $L_{A1351}$ | $R^{B1}$ | $R^{B1}$ | $R^{C1}$ | N |
| $L_{A1352}$ | $R^{B3}$ | $R^{B3}$ | $R^{C1}$ | N |
| $L_{A1353}$ | $R^{B4}$ | $R^{B4}$ | $R^{C1}$ | N |
| $L_{A1354}$ | $R^{B5}$ | $R^{B5}$ | $R^{C1}$ | N |
| $L_{A1355}$ | $R^{B7}$ | $R^{B7}$ | $R^{C1}$ | N |
| $L_{A1356}$ | $R^{A3}$ | $R^{A3}$ | $R^{C1}$ | N |
| $L_{A1357}$ | $R^{A34}$ | $R^{A34}$ | $R^{C1}$ | N |
| $L_{A1358}$ | $R^{A57}$ | $R^{A57}$ | $R^{C1}$ | N |
| $L_{A1359}$ | $R^{B3}$ | $R^{B1}$ | $R^{C1}$ | N |
| $L_{A1360}$ | $R^{B4}$ | $R^{B1}$ | $R^{C1}$ | N |
| $L_{A1361}$ | $R^{B5}$ | $R^{B1}$ | $R^{C1}$ | N |
| $L_{A1362}$ | $R^{B7}$ | $R^{B1}$ | $R^{C1}$ | N |
| $L_{A1363}$ | $R^{A3}$ | $R^{B1}$ | $R^{C1}$ | N |
| $L_{A1364}$ | $R^{A34}$ | $R^{B1}$ | $R^{C1}$ | N |
| $L_{A1365}$ | $R^{A57}$ | $R^{B1}$ | $R^{C1}$ | N |
| $L_{A1366}$ | $R^{B1}$ | $R^{B3}$ | $R^{C1}$ | N |
| $L_{A1367}$ | $R^{B1}$ | $R^{B4}$ | $R^{C1}$ | N |
| $L_{A1368}$ | $R^{B1}$ | $R^{B5}$ | $R^{C1}$ | N |
| $L_{A1369}$ | $R^{B1}$ | $R^{B7}$ | $R^{C1}$ | N |
| $L_{A1370}$ | $R^{B1}$ | $R^{A3}$ | $R^{C1}$ | N |
| $L_{A1371}$ | $R^{B1}$ | $R^{A34}$ | $R^{C1}$ | N |
| $L_{A1372}$ | $R^{B1}$ | $R^{A57}$ | $R^{C1}$ | N |
| $L_{A1373}$ | $R^{B1}$ | H | $R^{C2}$ | N |
| $L_{A1374}$ | $R^{B3}$ | H | $R^{C2}$ | N |
| $L_{A1375}$ | $R^{B4}$ | H | $R^{C2}$ | N |
| $L_{A1376}$ | $R^{B5}$ | H | $R^{C2}$ | N |
| $L_{A1377}$ | $R^{B7}$ | H | $R^{C2}$ | N |

-continued

| Ligand | $R^3$ | $R^4$ | G | X |
|---|---|---|---|---|
| $L_{A1378}$ | $R^{A3}$ | H | $R^{C2}$ | N |
| $L_{A1379}$ | $R^{A34}$ | H | $R^{C2}$ | N |
| $L_{A1380}$ | $R^{A57}$ | H | $R^{C2}$ | N |
| $L_{A1381}$ | H | $R^{B1}$ | $R^{C2}$ | N |
| $L_{A1382}$ | H | $R^{B3}$ | $R^{C2}$ | N |
| $L_{A1383}$ | H | $R^{B4}$ | $R^{C2}$ | N |
| $L_{A1384}$ | H | $R^{B5}$ | $R^{C2}$ | N |
| $L_{A1385}$ | H | $R^{B7}$ | $R^{C2}$ | N |
| $L_{A1386}$ | H | $R^{A3}$ | $R^{C2}$ | N |
| $L_{A1387}$ | H | $R^{A34}$ | $R^{C2}$ | N |
| $L_{A1388}$ | H | $R^{A57}$ | $R^{C2}$ | N |
| $L_{A1389}$ | $R^{B1}$ | $R^{B1}$ | $R^{C2}$ | N |
| $L_{A1390}$ | $R^{B3}$ | $R^{B3}$ | $R^{C2}$ | N |
| $L_{A1391}$ | $R^{B4}$ | $R^{B4}$ | $R^{C2}$ | N |
| $L_{A1392}$ | $R^{B5}$ | $R^{B5}$ | $R^{C2}$ | N |
| $L_{A1393}$ | $R^{B7}$ | $R^{B7}$ | $R^{C2}$ | N |
| $L_{A1394}$ | $R^{A3}$ | $R^{A3}$ | $R^{C2}$ | N |
| $L_{A1395}$ | $R^{A34}$ | $R^{A34}$ | $R^{C2}$ | N |
| $L_{A1396}$ | $R^{A57}$ | $R^{A57}$ | $R^{C2}$ | N |
| $L_{A1397}$ | $R^{B3}$ | $R^{B1}$ | $R^{C2}$ | N |
| $L_{A1398}$ | $R^{B4}$ | $R^{B1}$ | $R^{C2}$ | N |
| $L_{A1399}$ | $R^{B5}$ | $R^{B1}$ | $R^{C2}$ | N |
| $L_{A1400}$ | $R^{B7}$ | $R^{B1}$ | $R^{C2}$ | N |
| $L_{A1401}$ | $R^{A3}$ | $R^{B1}$ | $R^{C2}$ | N |
| $L_{A1402}$ | $R^{A34}$ | $R^{B1}$ | $R^{C2}$ | N |
| $L_{A1403}$ | $R^{A57}$ | $R^{B1}$ | $R^{C2}$ | N |
| $L_{A1404}$ | $R^{B1}$ | $R^{B3}$ | $R^{C2}$ | N |
| $L_{A1405}$ | $R^{B1}$ | $R^{B4}$ | $R^{C2}$ | N |
| $L_{A1406}$ | $R^{B1}$ | $R^{B5}$ | $R^{C2}$ | N |
| $L_{A1407}$ | $R^{B1}$ | $R^{B7}$ | $R^{C2}$ | N |
| $L_{A1408}$ | $R^{B1}$ | $R^{A3}$ | $R^{C2}$ | N |
| $L_{A1409}$ | $R^{B1}$ | $R^{A34}$ | $R^{C2}$ | N |
| $L_{A1410}$ | $R^{B1}$ | $R^{A57}$ | $R^{C2}$ | N |
| $L_{A1411}$ | $R^{B1}$ | H | $R^{C3}$ | N |
| $L_{A1412}$ | $R^{B3}$ | H | $R^{C3}$ | N |
| $L_{A1413}$ | $R^{B4}$ | H | $R^{C3}$ | N |
| $L_{A1414}$ | $R^{B5}$ | H | $R^{C3}$ | N |
| $L_{A1415}$ | $R^{B7}$ | H | $R^{C3}$ | N |
| $L_{A1416}$ | $R^{A3}$ | H | $R^{C3}$ | N |
| $L_{A1417}$ | $R^{A34}$ | H | $R^{C3}$ | N |
| $L_{A1418}$ | $R^{A57}$ | H | $R^{C3}$ | N |
| $L_{A1419}$ | H | $R^{B1}$ | $R^{C3}$ | N |
| $L_{A1420}$ | H | $R^{B3}$ | $R^{C3}$ | N |
| $L_{A1421}$ | H | $R^{B4}$ | $R^{C3}$ | N |
| $L_{A1422}$ | H | $R^{B5}$ | $R^{C3}$ | N |
| $L_{A1423}$ | H | $R^{B7}$ | $R^{C3}$ | N |
| $L_{A1424}$ | H | $R^{A3}$ | $R^{C3}$ | N |
| $L_{A1425}$ | H | $R^{A34}$ | $R^{C3}$ | N |
| $L_{A1426}$ | H | $R^{A57}$ | $R^{C3}$ | N |
| $L_{A1427}$ | $R^{B1}$ | $R^{B1}$ | $R^{C3}$ | N |
| $L_{A1428}$ | $R^{B3}$ | $R^{B3}$ | $R^{C3}$ | N |
| $L_{A1429}$ | $R^{B4}$ | $R^{B4}$ | $R^{C3}$ | N |
| $L_{A1430}$ | $R^{B5}$ | $R^{B5}$ | $R^{C3}$ | N |
| $L_{A1431}$ | $R^{B7}$ | $R^{B7}$ | $R^{C3}$ | N |
| $L_{A1432}$ | $R^{A3}$ | $R^{A3}$ | $R^{C3}$ | N |
| $L_{A1433}$ | $R^{A34}$ | $R^{A34}$ | $R^{C3}$ | N |
| $L_{A1434}$ | $R^{A57}$ | $R^{A57}$ | $R^{C3}$ | N |
| $L_{A1435}$ | $R^{B3}$ | $R^{B1}$ | $R^{C3}$ | N |
| $L_{A1436}$ | $R^{B4}$ | $R^{B1}$ | $R^{C3}$ | N |
| $L_{A1437}$ | $R^{B5}$ | $R^{B1}$ | $R^{C3}$ | N |
| $L_{A1438}$ | $R^{B7}$ | $R^{B1}$ | $R^{C3}$ | N |
| $L_{A1439}$ | $R^{A3}$ | $R^{B1}$ | $R^{C3}$ | N |
| $L_{A1440}$ | $R^{A34}$ | $R^{B1}$ | $R^{C3}$ | N |
| $L_{A1441}$ | $R^{A57}$ | $R^{B1}$ | $R^{C3}$ | N |
| $L_{A1442}$ | $R^{B1}$ | $R^{B3}$ | $R^{C3}$ | N |
| $L_{A1443}$ | $R^{B1}$ | $R^{B4}$ | $R^{C3}$ | N |
| $L_{A1444}$ | $R^{B1}$ | $R^{B5}$ | $R^{C3}$ | N |
| $L_{A1445}$ | $R^{B1}$ | $R^{B7}$ | $R^{C3}$ | N |
| $L_{A1446}$ | $R^{B1}$ | $R^{A3}$ | $R^{C3}$ | N |
| $L_{A1447}$ | $R^{B1}$ | $R^{A34}$ | $R^{C3}$ | N |
| $L_{A1448}$ | $R^{B1}$ | $R^{A57}$ | $R^{C3}$ | N |
| $L_{A1449}$ | $R^{B1}$ | H | $R^{C8}$ | N |
| $L_{A1450}$ | $R^{B3}$ | H | $R^{C8}$ | N |
| $L_{A1451}$ | $R^{B4}$ | H | $R^{C8}$ | N |
| $L_{A1452}$ | $R^{B5}$ | H | $R^{C8}$ | N |
| $L_{A1453}$ | $R^{B7}$ | H | $R^{C8}$ | N |
| $L_{A1454}$ | $R^{A3}$ | H | $R^{C8}$ | N |

-continued

| Ligand | $R^3$ | $R^4$ | G | X |
|---|---|---|---|---|
| $L_{A1455}$ | $R^{A34}$ | H | $R^{C8}$ | N |
| $L_{A1456}$ | $R^{A57}$ | H | $R^{C8}$ | N |
| $L_{A1457}$ | H | $R^{B1}$ | $R^{C8}$ | N |
| $L_{A1458}$ | H | $R^{B3}$ | $R^{C8}$ | N |
| $L_{A1459}$ | H | $R^{B4}$ | $R^{C8}$ | N |
| $L_{A1460}$ | H | $R^{B5}$ | $R^{C8}$ | N |
| $L_{A1461}$ | H | $R^{B7}$ | $R^{C8}$ | N |
| $L_{A1462}$ | H | $R^{A3}$ | $R^{C8}$ | N |
| $L_{A1463}$ | H | $R^{A34}$ | $R^{C8}$ | N |
| $L_{A1464}$ | H | $R^{A57}$ | $R^{C8}$ | N |
| $L_{A1465}$ | $R^{B1}$ | $R^{B1}$ | $R^{C8}$ | N |
| $L_{A1466}$ | $R^{B3}$ | $R^{B3}$ | $R^{C8}$ | N |
| $L_{A1467}$ | $R^{B4}$ | $R^{B4}$ | $R^{C8}$ | N |
| $L_{A1468}$ | $R^{B5}$ | $R^{B5}$ | $R^{C8}$ | N |
| $L_{A1469}$ | $R^{B7}$ | $R^{B7}$ | $R^{C8}$ | N |
| $L_{A1470}$ | $R^{A3}$ | $R^{A3}$ | $R^{C8}$ | N |
| $L_{A1471}$ | $R^{A34}$ | $R^{A34}$ | $R^{C8}$ | N |
| $L_{A1472}$ | $R^{A57}$ | $R^{A57}$ | $R^{C8}$ | N |
| $L_{A1473}$ | $R^{B3}$ | $R^{B1}$ | $R^{C8}$ | N |
| $L_{A1474}$ | $R^{B4}$ | $R^{B1}$ | $R^{C8}$ | N |
| $L_{A1475}$ | $R^{B5}$ | $R^{B1}$ | $R^{C8}$ | N |
| $L_{A1476}$ | $R^{B7}$ | $R^{B1}$ | $R^{C8}$ | N |
| $L_{A1477}$ | $R^{A3}$ | $R^{B1}$ | $R^{C8}$ | N |
| $L_{A1478}$ | $R^{A34}$ | $R^{B1}$ | $R^{C8}$ | N |
| $L_{A1479}$ | $R^{A57}$ | $R^{B1}$ | $R^{C8}$ | N |
| $L_{A1480}$ | $R^{B1}$ | $R^{B3}$ | $R^{C8}$ | N |
| $L_{A1481}$ | $R^{B1}$ | $R^{B4}$ | $R^{C8}$ | N |
| $L_{A1482}$ | $R^{B1}$ | $R^{B5}$ | $R^{C8}$ | N |
| $L_{A1483}$ | $R^{B1}$ | $R^{B7}$ | $R^{C8}$ | N |
| $L_{A1484}$ | $R^{B1}$ | $R^{A3}$ | $R^{C8}$ | N |
| $L_{A1485}$ | $R^{B1}$ | $R^{A34}$ | $R^{C8}$ | N |
| $L_{A1486}$ | $R^{B1}$ | $R^{A57}$ | $R^{C8}$ | N |
| $L_{A1487}$ | $R^{B1}$ | H | $R^{C9}$ | N |
| $L_{A1488}$ | $R^{B3}$ | H | $R^{C9}$ | N |
| $L_{A1489}$ | $R^{B4}$ | H | $R^{C9}$ | N |
| $L_{A1490}$ | $R^{B5}$ | H | $R^{C9}$ | N |
| $L_{A1491}$ | $R^{B7}$ | H | $R^{C9}$ | N |
| $L_{A1492}$ | $R^{A3}$ | H | $R^{C9}$ | N |
| $L_{A1493}$ | $R^{A34}$ | H | $R^{C9}$ | N |
| $L_{A1494}$ | $R^{A57}$ | H | $R^{C9}$ | N |
| $L_{A1495}$ | H | $R^{B1}$ | $R^{C9}$ | N |
| $L_{A1496}$ | H | $R^{B3}$ | $R^{C9}$ | N |
| $L_{A1497}$ | H | $R^{B4}$ | $R^{C9}$ | N |
| $L_{A1498}$ | H | $R^{B5}$ | $R^{C9}$ | N |
| $L_{A1499}$ | H | $R^{B7}$ | $R^{C9}$ | N |
| $L_{A1500}$ | H | $R^{A3}$ | $R^{C9}$ | N |
| $L_{A1501}$ | H | $R^{A34}$ | $R^{C9}$ | N |
| $L_{A1502}$ | H | $R^{A57}$ | $R^{C9}$ | N |
| $L_{A1503}$ | $R^{B1}$ | $R^{B1}$ | $R^{C9}$ | N |
| $L_{A1504}$ | $R^{B3}$ | $R^{B3}$ | $R^{C9}$ | N |
| $L_{A1505}$ | $R^{B4}$ | $R^{B4}$ | $R^{C9}$ | N |
| $L_{A1506}$ | $R^{B5}$ | $R^{B5}$ | $R^{C9}$ | N |
| $L_{A1507}$ | $R^{B7}$ | $R^{B7}$ | $R^{C9}$ | N |
| $L_{A1508}$ | $R^{A3}$ | $R^{A3}$ | $R^{C9}$ | N |
| $L_{A1509}$ | $R^{A34}$ | $R^{A34}$ | $R^{C9}$ | N |
| $L_{A1510}$ | $R^{A57}$ | $R^{A57}$ | $R^{C9}$ | N |
| $L_{A1511}$ | $R^{B3}$ | $R^{B1}$ | $R^{C8}$ | N |
| $L_{A1512}$ | $R^{B4}$ | $R^{B1}$ | $R^{C9}$ | N |
| $L_{A1513}$ | $R^{B5}$ | $R^{B1}$ | $R^{C9}$ | N |
| $L_{A1514}$ | $R^{B7}$ | $R^{B1}$ | $R^{C9}$ | N |
| $L_{A1515}$ | $R^{A3}$ | $R^{B1}$ | $R^{C9}$ | N |
| $L_{A1516}$ | $R^{A34}$ | $R^{B1}$ | $R^{C9}$ | N |
| $L_{A1517}$ | $R^{A57}$ | $R^{B1}$ | $R^{C9}$ | N |
| $L_{A1518}$ | $R^{B1}$ | $R^{B3}$ | $R^{C9}$ | N |
| $L_{A1519}$ | $R^{B1}$ | $R^{B4}$ | $R^{C9}$ | N |
| $L_{A1520}$ | $R^{B1}$ | $R^{B5}$ | $R^{C9}$ | N |
| $L_{A1521}$ | $R^{B1}$ | $R^{B7}$ | $R^{C9}$ | N |
| $L_{A1522}$ | $R^{B1}$ | $R^{A3}$ | $R^{C9}$ | N |
| $L_{A1523}$ | $R^{B1}$ | $R^{A34}$ | $R^{C9}$ | N |
| $L_{A1524}$ | $R^{B1}$ | $R^{A57}$ | $R^{C9}$ | N |

$L_{A1525}$ through $L_{A1095}$ are based on a structure of Formula V,

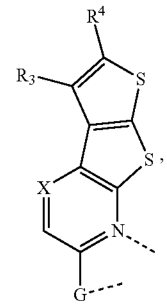

in which $R^3$, $R^4$, X and G are defined as:

| Ligand | $R^3$ | $R^4$ | G | X |
|---|---|---|---|---|
| $L_{A1525}$ | H | H | $R^{C1}$ | C |
| $L_{A1526}$ | $R^{B1}$ | H | $R^{C1}$ | C |
| $L_{A1527}$ | $R^{B3}$ | H | $R^{C1}$ | C |
| $L_{A1528}$ | $R^{B4}$ | H | $R^{C1}$ | C |
| $L_{A1529}$ | $R^{B5}$ | H | $R^{C1}$ | C |
| $L_{A1530}$ | $R^{B7}$ | H | $R^{C1}$ | C |
| $L_{A1531}$ | $R^{A3}$ | H | $R^{C1}$ | C |
| $L_{A1532}$ | $R^{A34}$ | H | $R^{C1}$ | C |
| $L_{A1533}$ | $R^{A57}$ | H | $R^{C1}$ | C |
| $L_{A1534}$ | H | $R^{B1}$ | $R^{C1}$ | C |
| $L_{A1535}$ | H | $R^{B3}$ | $R^{C1}$ | C |
| $L_{A1536}$ | H | $R^{B4}$ | $R^{C1}$ | C |
| $L_{A1537}$ | H | $R^{B5}$ | $R^{C1}$ | C |
| $L_{A1538}$ | H | $R^{B7}$ | $R^{C1}$ | C |
| $L_{A1539}$ | H | $R^{A3}$ | $R^{C1}$ | C |
| $L_{A1540}$ | H | $R^{A34}$ | $R^{C1}$ | C |
| $L_{A1541}$ | H | $R^{A57}$ | $R^{C1}$ | C |
| $L_{A1542}$ | $R^{B1}$ | $R^{B1}$ | $R^{C1}$ | C |
| $L_{A1543}$ | $R^{B3}$ | $R^{B3}$ | $R^{C1}$ | C |
| $L_{A1544}$ | $R^{B4}$ | $R^{B4}$ | $R^{C1}$ | C |
| $L_{A1545}$ | $R^{B5}$ | $R^{B5}$ | $R^{C1}$ | C |
| $L_{A1546}$ | $R^{B7}$ | $R^{B7}$ | $R^{C1}$ | C |
| $L_{A1547}$ | $R^{A3}$ | $R^{A3}$ | $R^{C1}$ | C |
| $L_{A1548}$ | $R^{A34}$ | $R^{A34}$ | $R^{C1}$ | C |
| $L_{A1549}$ | $R^{A57}$ | $R^{A57}$ | $R^{C1}$ | C |
| $L_{A1550}$ | $R^{B3}$ | $R^{B1}$ | $R^{C1}$ | C |
| $L_{A1551}$ | $R^{B4}$ | $R^{B1}$ | $R^{C1}$ | C |
| $L_{A1552}$ | $R^{B5}$ | $R^{B1}$ | $R^{C1}$ | C |
| $L_{A1553}$ | $R^{B7}$ | $R^{B1}$ | $R^{C1}$ | C |
| $L_{A1554}$ | $R^{A3}$ | $R^{B1}$ | $R^{C1}$ | C |
| $L_{A1555}$ | $R^{A34}$ | $R^{B1}$ | $R^{C1}$ | C |
| $L_{A1556}$ | $R^{A57}$ | $R^{B1}$ | $R^{C1}$ | C |
| $L_{A1557}$ | $R^{B1}$ | $R^{B3}$ | $R^{C1}$ | C |
| $L_{A1558}$ | $R^{B1}$ | $R^{B4}$ | $R^{C1}$ | C |
| $L_{A1559}$ | $R^{B1}$ | $R^{B5}$ | $R^{C1}$ | C |
| $L_{A1560}$ | $R^{B1}$ | $R^{B7}$ | $R^{C1}$ | C |
| $L_{A1561}$ | $R^{B1}$ | $R^{A3}$ | $R^{C1}$ | C |
| $L_{A1562}$ | $R^{B1}$ | $R^{A34}$ | $R^{C1}$ | C |
| $L_{A1563}$ | $R^{B1}$ | $R^{A57}$ | $R^{C1}$ | C |
| $L_{A1564}$ | $R^{B1}$ | H | $R^{C2}$ | C |
| $L_{A1565}$ | $R^{B3}$ | H | $R^{C2}$ | C |
| $L_{A1566}$ | $R^{B4}$ | H | $R^{C2}$ | C |
| $L_{A1567}$ | $R^{B5}$ | H | $R^{C2}$ | C |
| $L_{A1568}$ | $R^{B7}$ | H | $R^{C2}$ | C |
| $L_{A1569}$ | $R^{A3}$ | H | $R^{C2}$ | C |
| $L_{A1570}$ | $R^{A34}$ | H | $R^{C2}$ | C |
| $L_{A1571}$ | $R^{A57}$ | H | $R^{C2}$ | C |
| $L_{A1572}$ | H | $R^{B1}$ | $R^{C2}$ | C |
| $L_{A1573}$ | H | $R^{B3}$ | $R^{C2}$ | C |
| $L_{A1574}$ | H | $R^{B4}$ | $R^{C2}$ | C |
| $L_{A1575}$ | H | $R^{B5}$ | $R^{C2}$ | C |
| $L_{A1576}$ | H | $R^{B7}$ | $R^{C2}$ | C |
| $L_{A1577}$ | H | $R^{A3}$ | $R^{C2}$ | C |
| $L_{A1578}$ | H | $R^{A34}$ | $R^{C2}$ | C |
| $L_{A1579}$ | H | $R^{A57}$ | $R^{C2}$ | C |
| $L_{A1580}$ | $R^{B1}$ | $R^{B1}$ | $R^{C2}$ | C |
| $L_{A1581}$ | $R^{B3}$ | $R^{B3}$ | $R^{C2}$ | C |
| $L_{A1582}$ | $R^{B4}$ | $R^{B4}$ | $R^{C2}$ | C |
| $L_{A1583}$ | $R^{B5}$ | $R^{B5}$ | $R^{C2}$ | C |

-continued

| Ligand | $R^3$ | $R^4$ | G | X |
|---|---|---|---|---|
| $L_{A1584}$ | $R^{B7}$ | $R^{B7}$ | $R^{C2}$ | C |
| $L_{A1585}$ | $R^{A3}$ | $R^{A3}$ | $R^{C2}$ | C |
| $L_{A1586}$ | $R^{A34}$ | $R^{A34}$ | $R^{C2}$ | C |
| $L_{A1587}$ | $R^{A57}$ | $R^{A57}$ | $R^{C2}$ | C |
| $L_{A1588}$ | $R^{B3}$ | $R^{B1}$ | $R^{C2}$ | C |
| $L_{A1589}$ | $R^{B4}$ | $R^{B1}$ | $R^{C2}$ | C |
| $L_{A1590}$ | $R^{B5}$ | $R^{B1}$ | $R^{C2}$ | C |
| $L_{A1591}$ | $R^{B7}$ | $R^{B1}$ | $R^{C2}$ | C |
| $L_{A1592}$ | $R^{A3}$ | $R^{B1}$ | $R^{C2}$ | C |
| $L_{A1593}$ | $R^{A34}$ | $R^{B1}$ | $R^{C2}$ | C |
| $L_{A1594}$ | $R^{A57}$ | $R^{B1}$ | $R^{C2}$ | C |
| $L_{A1595}$ | $R^{B1}$ | $R^{B3}$ | $R^{C2}$ | C |
| $L_{A1596}$ | $R^{B1}$ | $R^{B4}$ | $R^{C2}$ | C |
| $L_{A1597}$ | $R^{B1}$ | $R^{B5}$ | $R^{C2}$ | C |
| $L_{A1598}$ | $R^{B1}$ | $R^{B7}$ | $R^{C2}$ | C |
| $L_{A1599}$ | $R^{B1}$ | $R^{A3}$ | $R^{C2}$ | C |
| $L_{A1600}$ | $R^{B1}$ | $R^{A34}$ | $R^{C2}$ | C |
| $L_{A1601}$ | $R^{B1}$ | $R^{A57}$ | $R^{C2}$ | C |
| $L_{A1602}$ | $R^{B1}$ | H | $R^{C3}$ | C |
| $L_{A1603}$ | $R^{B3}$ | H | $R^{C3}$ | C |
| $L_{A1604}$ | $R^{B4}$ | H | $R^{C3}$ | C |
| $L_{A1605}$ | $R^{B5}$ | H | $R^{C3}$ | C |
| $L_{A1606}$ | $R^{B7}$ | H | $R^{C3}$ | C |
| $L_{A1607}$ | $R^{A3}$ | H | $R^{C3}$ | C |
| $L_{A1608}$ | $R^{A34}$ | H | $R^{C3}$ | C |
| $L_{A1609}$ | $R^{A57}$ | H | $R^{C3}$ | C |
| $L_{A1610}$ | H | $R^{B1}$ | $R^{C3}$ | C |
| $L_{A1611}$ | H | $R^{B3}$ | $R^{C3}$ | C |
| $L_{A1612}$ | H | $R^{B4}$ | $R^{C3}$ | C |
| $L_{A1613}$ | H | $R^{B5}$ | $R^{C3}$ | C |
| $L_{A1614}$ | H | $R^{B7}$ | $R^{C3}$ | C |
| $L_{A1615}$ | H | $R^{A3}$ | $R^{C3}$ | C |
| $L_{A1616}$ | H | $R^{A34}$ | $R^{C3}$ | C |
| $L_{A1617}$ | H | $R^{A57}$ | $R^{C3}$ | C |
| $L_{A1618}$ | $R^{B1}$ | $R^{B1}$ | $R^{C3}$ | C |
| $L_{A1619}$ | $R^{B3}$ | $R^{B3}$ | $R^{C3}$ | C |
| $L_{A1620}$ | $R^{B4}$ | $R^{B4}$ | $R^{C3}$ | C |
| $L_{A1621}$ | $R^{B5}$ | $R^{B5}$ | $R^{C3}$ | C |
| $L_{A1622}$ | $R^{B7}$ | $R^{B7}$ | $R^{C3}$ | C |
| $L_{A1623}$ | $R^{A3}$ | $R^{A3}$ | $R^{C3}$ | C |
| $L_{A1624}$ | $R^{A34}$ | $R^{A34}$ | $R^{C3}$ | C |
| $L_{A1625}$ | $R^{A57}$ | $R^{A57}$ | $R^{C3}$ | C |
| $L_{A1626}$ | $R^{B3}$ | $R^{B1}$ | $R^{C3}$ | C |
| $L_{A1627}$ | $R^{B4}$ | $R^{B1}$ | $R^{C3}$ | C |
| $L_{A1628}$ | $R^{B5}$ | $R^{B1}$ | $R^{C3}$ | C |
| $L_{A1629}$ | $R^{B7}$ | $R^{B1}$ | $R^{C3}$ | C |
| $L_{A1630}$ | $R^{A3}$ | $R^{B1}$ | $R^{C3}$ | C |
| $L_{A1631}$ | $R^{A34}$ | $R^{B1}$ | $R^{C3}$ | C |
| $L_{A1632}$ | $R^{A57}$ | $R^{B1}$ | $R^{C3}$ | C |
| $L_{A1633}$ | $R^{B1}$ | $R^{B3}$ | $R^{C3}$ | C |
| $L_{A1634}$ | $R^{B1}$ | $R^{B4}$ | $R^{C3}$ | C |
| $L_{A1635}$ | $R^{B1}$ | $R^{B5}$ | $R^{C3}$ | C |
| $L_{A1636}$ | $R^{B1}$ | $R^{B7}$ | $R^{C3}$ | C |
| $L_{A1637}$ | $R^{B1}$ | $R^{A3}$ | $R^{C3}$ | C |
| $L_{A1638}$ | $R^{B1}$ | $R^{A34}$ | $R^{C3}$ | C |
| $L_{A1639}$ | $R^{B1}$ | $R^{A57}$ | $R^{C3}$ | C |
| $L_{A1640}$ | $R^{B1}$ | H | $R^{C8}$ | C |
| $L_{A1641}$ | $R^{B3}$ | H | $R^{C8}$ | C |
| $L_{A1642}$ | $R^{B4}$ | H | $R^{C8}$ | C |
| $L_{A1643}$ | $R^{B5}$ | H | $R^{C8}$ | C |
| $L_{A1644}$ | $R^{B7}$ | H | $R^{C8}$ | C |
| $L_{A1645}$ | $R^{A3}$ | H | $R^{C8}$ | C |
| $L_{A1646}$ | $R^{A34}$ | H | $R^{C8}$ | C |
| $L_{A1647}$ | $R^{A57}$ | H | $R^{C8}$ | C |
| $L_{A1648}$ | H | $R^{B1}$ | $R^{C8}$ | C |
| $L_{A1649}$ | H | $R^{B3}$ | $R^{C8}$ | C |
| $L_{A1650}$ | H | $R^{B4}$ | $R^{C8}$ | C |
| $L_{A1651}$ | H | $R^{B5}$ | $R^{C8}$ | C |
| $L_{A1652}$ | H | $R^{B7}$ | $R^{C8}$ | C |
| $L_{A1653}$ | H | $R^{A3}$ | $R^{C8}$ | C |
| $L_{A1654}$ | H | $R^{A34}$ | $R^{C8}$ | C |
| $L_{A1655}$ | H | $R^{A57}$ | $R^{C8}$ | C |
| $L_{A1656}$ | $R^{B1}$ | $R^{B1}$ | $R^{C8}$ | C |
| $L_{A1657}$ | $R^{B3}$ | $R^{B3}$ | $R^{C8}$ | C |
| $L_{A1658}$ | $R^{B4}$ | $R^{B4}$ | $R^{C8}$ | C |
| $L_{A1659}$ | $R^{B5}$ | $R^{B5}$ | $R^{C8}$ | C |
| $L_{A1660}$ | $R^{B7}$ | $R^{B7}$ | $R^{C8}$ | C |
| $L_{A1661}$ | $R^{A3}$ | $R^{A3}$ | $R^{C8}$ | C |
| $L_{A1662}$ | $R^{A34}$ | $R^{A34}$ | $R^{C8}$ | C |
| $L_{A1663}$ | $R^{A57}$ | $R^{A57}$ | $R^{C8}$ | C |
| $L_{A1664}$ | $R^{B3}$ | $R^{B1}$ | $R^{C8}$ | C |
| $L_{A1665}$ | $R^{B4}$ | $R^{B1}$ | $R^{C8}$ | C |
| $L_{A1666}$ | $R^{B5}$ | $R^{B1}$ | $R^{C8}$ | C |
| $L_{A1667}$ | $R^{B7}$ | $R^{B1}$ | $R^{C8}$ | C |
| $L_{A1668}$ | $R^{A3}$ | $R^{B1}$ | $R^{C8}$ | C |
| $L_{A1669}$ | $R^{A34}$ | $R^{B1}$ | $R^{C8}$ | C |
| $L_{A1670}$ | $R^{A57}$ | $R^{B1}$ | $R^{C8}$ | C |
| $L_{A1671}$ | $R^{B1}$ | $R^{B3}$ | $R^{C8}$ | C |
| $L_{A1672}$ | $R^{B1}$ | $R^{B4}$ | $R^{C8}$ | C |
| $L_{A1673}$ | $R^{B1}$ | $R^{B5}$ | $R^{C8}$ | C |
| $L_{A1674}$ | $R^{B1}$ | $R^{B7}$ | $R^{C8}$ | C |
| $L_{A1675}$ | $R^{B1}$ | $R^{A3}$ | $R^{C8}$ | C |
| $L_{A1676}$ | $R^{B1}$ | $R^{A34}$ | $R^{C8}$ | C |
| $L_{A1677}$ | $R^{B1}$ | $R^{A57}$ | $R^{C8}$ | C |
| $L_{A1678}$ | $R^{B1}$ | H | $R^{C9}$ | C |
| $L_{A1679}$ | $R^{B3}$ | H | $R^{C9}$ | C |
| $L_{A1680}$ | $R^{B4}$ | H | $R^{C9}$ | C |
| $L_{A1681}$ | $R^{B5}$ | H | $R^{C9}$ | C |
| $L_{A1682}$ | $R^{B7}$ | H | $R^{C9}$ | C |
| $L_{A1683}$ | $R^{A3}$ | H | $R^{C9}$ | C |
| $L_{A1684}$ | $R^{A34}$ | H | $R^{C9}$ | C |
| $L_{A1685}$ | $R^{A57}$ | H | $R^{C9}$ | C |
| $L_{A1686}$ | H | $R^{B1}$ | $R^{C9}$ | C |
| $L_{A1687}$ | H | $R^{B3}$ | $R^{C9}$ | C |
| $L_{A1688}$ | H | $R^{B4}$ | $R^{C9}$ | C |
| $L_{A1689}$ | H | $R^{B5}$ | $R^{C9}$ | C |
| $L_{A1690}$ | H | $R^{B7}$ | $R^{C9}$ | C |
| $L_{A1691}$ | H | $R^{A3}$ | $R^{C9}$ | C |
| $L_{A1692}$ | H | $R^{A34}$ | $R^{C9}$ | C |
| $L_{A1693}$ | H | $R^{A57}$ | $R^{C9}$ | C |
| $L_{A1694}$ | $R^{B1}$ | $R^{B1}$ | $R^{C9}$ | C |
| $L_{A1695}$ | $R^{B3}$ | $R^{B3}$ | $R^{C9}$ | C |
| $L_{A1696}$ | $R^{B4}$ | $R^{B4}$ | $R^{C9}$ | C |
| $L_{A1697}$ | $R^{B5}$ | $R^{B5}$ | $R^{C9}$ | C |
| $L_{A1698}$ | $R^{B7}$ | $R^{B7}$ | $R^{C9}$ | C |
| $L_{A1699}$ | $R^{A3}$ | $R^{A3}$ | $R^{C9}$ | C |
| $L_{A1700}$ | $R^{A34}$ | $R^{A34}$ | $R^{C9}$ | C |
| $L_{A1701}$ | $R^{A57}$ | $R^{A57}$ | $R^{C9}$ | C |
| $L_{A1702}$ | $R^{B3}$ | $R^{B1}$ | $R^{C9}$ | C |
| $L_{A1703}$ | $R^{B4}$ | $R^{B1}$ | $R^{C9}$ | C |
| $L_{A1704}$ | $R^{B5}$ | $R^{B1}$ | $R^{C9}$ | C |
| $L_{A1705}$ | $R^{B7}$ | $R^{B1}$ | $R^{C9}$ | C |
| $L_{A1706}$ | $R^{A3}$ | $R^{B1}$ | $R^{C9}$ | C |
| $L_{A1707}$ | $R^{A34}$ | $R^{B1}$ | $R^{C9}$ | C |
| $L_{A1708}$ | $R^{A57}$ | $R^{B1}$ | $R^{C9}$ | C |
| $L_{A1709}$ | $R^{B1}$ | $R^{B3}$ | $R^{C9}$ | C |
| $L_{A1710}$ | $R^{B1}$ | $R^{B4}$ | $R^{C9}$ | C |
| $L_{A1711}$ | $R^{B1}$ | $R^{B5}$ | $R^{C9}$ | C |
| $L_{A1712}$ | $R^{B1}$ | $R^{B7}$ | $R^{C9}$ | C |
| $L_{A1713}$ | $R^{B1}$ | $R^{A3}$ | $R^{C9}$ | C |
| $L_{A1714}$ | $R^{B1}$ | $R^{A34}$ | $R^{C9}$ | C |
| $L_{A1715}$ | $R^{B1}$ | $R^{A57}$ | $R^{C9}$ | C |
| $L_{A1716}$ | $R^{B1}$ | H | $R^{C1}$ | N |
| $L_{A1717}$ | $R^{B3}$ | H | $R^{C1}$ | N |
| $L_{A1718}$ | $R^{B4}$ | H | $R^{C1}$ | N |
| $L_{A1719}$ | $R^{B5}$ | H | $R^{C1}$ | N |
| $L_{A1720}$ | $R^{B7}$ | H | $R^{C1}$ | N |
| $L_{A1721}$ | $R^{A3}$ | H | $R^{C1}$ | N |
| $L_{A1722}$ | $R^{A34}$ | H | $R^{C1}$ | N |
| $L_{A1723}$ | $R^{A57}$ | H | $R^{C1}$ | N |
| $L_{A1724}$ | H | $R^{B1}$ | $R^{C1}$ | N |
| $L_{A1725}$ | H | $R^{B3}$ | $R^{C1}$ | N |
| $L_{A1726}$ | H | $R^{B4}$ | $R^{C1}$ | N |
| $L_{A1727}$ | H | $R^{B5}$ | $R^{C1}$ | N |
| $L_{A1728}$ | H | $R^{B7}$ | $R^{C1}$ | N |
| $L_{A1729}$ | H | $R^{A3}$ | $R^{C1}$ | N |
| $L_{A1730}$ | H | $R^{A34}$ | $R^{C1}$ | N |
| $L_{A1731}$ | H | $R^{A57}$ | $R^{C1}$ | N |
| $L_{A1732}$ | $R^{B1}$ | $R^{B1}$ | $R^{C1}$ | N |
| $L_{A1733}$ | $R^{B3}$ | $R^{B3}$ | $R^{C1}$ | N |
| $L_{A1734}$ | $R^{B4}$ | $R^{B4}$ | $R^{C1}$ | N |
| $L_{A1735}$ | $R^{B5}$ | $R^{B5}$ | $R^{C1}$ | N |
| $L_{A1736}$ | $R^{B7}$ | $R^{B7}$ | $R^{C1}$ | N |
| $L_{A1737}$ | $R^{A3}$ | $R^{A3}$ | $R^{C1}$ | N |

-continued

| Ligand | $R^3$ | $R^4$ | G | X |
|---|---|---|---|---|
| $L_{A1738}$ | $R^{A34}$ | $R^{A34}$ | $R^{C1}$ | N |
| $L_{A1739}$ | $R^{A57}$ | $R^{A57}$ | $R^{C1}$ | N |
| $L_{A1740}$ | $R^{B3}$ | $R^{B1}$ | $R^{C1}$ | N |
| $L_{A1741}$ | $R^{B4}$ | $R^{B1}$ | $R^{C1}$ | N |
| $L_{A1742}$ | $R^{B5}$ | $R^{B1}$ | $R^{C1}$ | N |
| $L_{A1743}$ | $R^{B7}$ | $R^{B1}$ | $R^{C1}$ | N |
| $L_{A1744}$ | $R^{A3}$ | $R^{B1}$ | $R^{C1}$ | N |
| $L_{A1745}$ | $R^{A34}$ | $R^{B1}$ | $R^{C1}$ | N |
| $L_{A1746}$ | $R^{A57}$ | $R^{B1}$ | $R^{C1}$ | N |
| $L_{A1747}$ | $R^{B1}$ | $R^{B3}$ | $R^{C1}$ | N |
| $L_{A1748}$ | $R^{B1}$ | $R^{B4}$ | $R^{C1}$ | N |
| $L_{A1749}$ | $R^{B1}$ | $R^{B5}$ | $R^{C1}$ | N |
| $L_{A1750}$ | $R^{B1}$ | $R^{B7}$ | $R^{C1}$ | N |
| $L_{A1751}$ | $R^{B1}$ | $R^{A3}$ | $R^{C1}$ | N |
| $L_{A1752}$ | $R^{B1}$ | $R^{A34}$ | $R^{C1}$ | N |
| $L_{A1753}$ | $R^{B1}$ | $R^{A57}$ | $R^{C1}$ | N |
| $L_{A1754}$ | $R^{B1}$ | H | $R^{C2}$ | N |
| $L_{A1755}$ | $R^{B3}$ | H | $R^{C2}$ | N |
| $L_{A1756}$ | $R^{B4}$ | H | $R^{C2}$ | N |
| $L_{A1757}$ | $R^{B5}$ | H | $R^{C2}$ | N |
| $L_{A1758}$ | $R^{B7}$ | H | $R^{C2}$ | N |
| $L_{A1759}$ | $R^{A3}$ | H | $R^{C2}$ | N |
| $L_{A1760}$ | $R^{A34}$ | H | $R^{C2}$ | N |
| $L_{A1761}$ | $R^{A57}$ | H | $R^{C2}$ | N |
| $L_{A1762}$ | H | $R^{B1}$ | $R^{C2}$ | N |
| $L_{A1763}$ | H | $R^{B3}$ | $R^{C2}$ | N |
| $L_{A1764}$ | H | $R^{B4}$ | $R^{C2}$ | N |
| $L_{A1765}$ | H | $R^{B5}$ | $R^{C2}$ | N |
| $L_{A1766}$ | H | $R^{B7}$ | $R^{C2}$ | N |
| $L_{A1767}$ | H | $R^{A3}$ | $R^{C2}$ | N |
| $L_{A1768}$ | H | $R^{A34}$ | $R^{C2}$ | N |
| $L_{A1769}$ | H | $R^{A57}$ | $R^{C2}$ | N |
| $L_{A1770}$ | $R^{B1}$ | $R^{B1}$ | $R^{C2}$ | N |
| $L_{A1771}$ | $R^{B3}$ | $R^{B3}$ | $R^{C2}$ | N |
| $L_{A1772}$ | $R^{B4}$ | $R^{B4}$ | $R^{C2}$ | N |
| $L_{A1773}$ | $R^{B5}$ | $R^{B5}$ | $R^{C2}$ | N |
| $L_{A1774}$ | $R^{B7}$ | $R^{B7}$ | $R^{C2}$ | N |
| $L_{A1775}$ | $R^{A3}$ | $R^{A3}$ | $R^{C2}$ | N |
| $L_{A1776}$ | $R^{A34}$ | $R^{A34}$ | $R^{C2}$ | N |
| $L_{A1777}$ | $R^{A57}$ | $R^{A57}$ | $R^{C2}$ | N |
| $L_{A1778}$ | $R^{B3}$ | $R^{B1}$ | $R^{C2}$ | N |
| $L_{A1779}$ | $R^{B4}$ | $R^{B1}$ | $R^{C2}$ | N |
| $L_{A1780}$ | $R^{B5}$ | $R^{B1}$ | $R^{C2}$ | N |
| $L_{A1781}$ | $R^{B7}$ | $R^{B1}$ | $R^{C2}$ | N |
| $L_{A1782}$ | $R^{A3}$ | $R^{B1}$ | $R^{C2}$ | N |
| $L_{A1783}$ | $R^{A34}$ | $R^{B1}$ | $R^{C2}$ | N |
| $L_{A1784}$ | $R^{A57}$ | $R^{B1}$ | $R^{C2}$ | N |
| $L_{A1785}$ | $R^{B1}$ | $R^{B3}$ | $R^{C2}$ | N |
| $L_{A1786}$ | $R^{B1}$ | $R^{B4}$ | $R^{C2}$ | N |
| $L_{A1787}$ | $R^{B1}$ | $R^{B5}$ | $R^{C2}$ | N |
| $L_{A1788}$ | $R^{B1}$ | $R^{B7}$ | $R^{C2}$ | N |
| $L_{A1789}$ | $R^{B1}$ | $R^{A3}$ | $R^{C2}$ | N |
| $L_{A1790}$ | $R^{B1}$ | $R^{A34}$ | $R^{C2}$ | N |
| $L_{A1791}$ | $R^{B1}$ | $R^{A57}$ | $R^{C2}$ | N |
| $L_{A1792}$ | $R^{B1}$ | H | $R^{C3}$ | N |
| $L_{A1793}$ | $R^{B3}$ | H | $R^{C3}$ | N |
| $L_{A1794}$ | $R^{B4}$ | H | $R^{C3}$ | N |
| $L_{A1795}$ | $R^{B5}$ | H | $R^{C3}$ | N |
| $L_{A1796}$ | $R^{B7}$ | H | $R^{C3}$ | N |
| $L_{A1797}$ | $R^{A3}$ | H | $R^{C3}$ | N |
| $L_{A1798}$ | $R^{A34}$ | H | $R^{C3}$ | N |
| $L_{A1799}$ | $R^{A57}$ | H | $R^{C3}$ | N |
| $L_{A1800}$ | H | $R^{B1}$ | $R^{C3}$ | N |
| $L_{A1801}$ | H | $R^{B3}$ | $R^{C3}$ | N |
| $L_{A1802}$ | H | $R^{B4}$ | $R^{C3}$ | N |
| $L_{A1803}$ | H | $R^{B5}$ | $R^{C3}$ | N |
| $L_{A1804}$ | H | $R^{B7}$ | $R^{C3}$ | N |
| $L_{A1805}$ | H | $R^{A3}$ | $R^{C3}$ | N |
| $L_{A1806}$ | H | $R^{A34}$ | $R^{C3}$ | N |
| $L_{A1807}$ | H | $R^{A57}$ | $R^{C3}$ | N |
| $L_{A1808}$ | $R^{B1}$ | $R^{B1}$ | $R^{C3}$ | N |
| $L_{A1809}$ | $R^{B3}$ | $R^{B3}$ | $R^{C3}$ | N |
| $L_{A1810}$ | $R^{B4}$ | $R^{B4}$ | $R^{C3}$ | N |
| $L_{A1811}$ | $R^{B5}$ | $R^{B5}$ | $R^{C3}$ | N |
| $L_{A1812}$ | $R^{B7}$ | $R^{B7}$ | $R^{C3}$ | N |
| $L_{A1813}$ | $R^{A3}$ | $R^{A3}$ | $R^{C3}$ | N |
| $L_{A1814}$ | $R^{A34}$ | $R^{A34}$ | $R^{C3}$ | N |

-continued

| Ligand | $R^3$ | $R^4$ | G | X |
|---|---|---|---|---|
| $L_{A1815}$ | $R^{A57}$ | $R^{A57}$ | $R^{C3}$ | N |
| $L_{A1816}$ | $R^{B3}$ | $R^{B1}$ | $R^{C3}$ | N |
| $L_{A1817}$ | $R^{B4}$ | $R^{B1}$ | $R^{C3}$ | N |
| $L_{A1818}$ | $R^{B5}$ | $R^{B1}$ | $R^{C3}$ | N |
| $L_{A1819}$ | $R^{B7}$ | $R^{B1}$ | $R^{C3}$ | N |
| $L_{A1820}$ | $R^{A3}$ | $R^{B1}$ | $R^{C3}$ | N |
| $L_{A1821}$ | $R^{A34}$ | $R^{B1}$ | $R^{C3}$ | N |
| $L_{A1822}$ | $R^{A57}$ | $R^{B1}$ | $R^{C3}$ | N |
| $L_{A1823}$ | $R^{B1}$ | $R^{B3}$ | $R^{C3}$ | N |
| $L_{A1824}$ | $R^{B1}$ | $R^{B4}$ | $R^{C3}$ | N |
| $L_{A1825}$ | $R^{B1}$ | $R^{B5}$ | $R^{C3}$ | N |
| $L_{A1826}$ | $R^{B1}$ | $R^{B7}$ | $R^{C3}$ | N |
| $L_{A1827}$ | $R^{B1}$ | $R^{A3}$ | $R^{C3}$ | N |
| $L_{A1828}$ | $R^{B1}$ | $R^{A34}$ | $R^{C3}$ | N |
| $L_{A1829}$ | $R^{B1}$ | $R^{A57}$ | $R^{C3}$ | N |
| $L_{A1830}$ | $R^{B1}$ | H | $R^{C8}$ | N |
| $L_{A1831}$ | $R^{B3}$ | H | $R^{C8}$ | N |
| $L_{A1832}$ | $R^{B4}$ | H | $R^{C8}$ | N |
| $L_{A1833}$ | $R^{B5}$ | H | $R^{C8}$ | N |
| $L_{A1834}$ | $R^{B7}$ | H | $R^{C8}$ | N |
| $L_{A1835}$ | $R^{A3}$ | H | $R^{C8}$ | N |
| $L_{A1836}$ | $R^{A34}$ | H | $R^{C8}$ | N |
| $L_{A1837}$ | $R^{A57}$ | H | $R^{C8}$ | N |
| $L_{A1838}$ | H | $R^{B1}$ | $R^{C8}$ | N |
| $L_{A1839}$ | H | $R^{B3}$ | $R^{C8}$ | N |
| $L_{A1840}$ | H | $R^{B4}$ | $R^{C8}$ | N |
| $L_{A1841}$ | H | $R^{B5}$ | $R^{C8}$ | N |
| $L_{A1842}$ | H | $R^{B7}$ | $R^{C8}$ | N |
| $L_{A1843}$ | H | $R^{A3}$ | $R^{C8}$ | N |
| $L_{A1844}$ | H | $R^{A34}$ | $R^{C8}$ | N |
| $L_{A1845}$ | H | $R^{A57}$ | $R^{C8}$ | N |
| $L_{A1846}$ | $R^{B1}$ | $R^{B1}$ | $R^{C8}$ | N |
| $L_{A1847}$ | $R^{B3}$ | $R^{B3}$ | $R^{C8}$ | N |
| $L_{A1848}$ | $R^{B4}$ | $R^{B4}$ | $R^{C8}$ | N |
| $L_{A1849}$ | $R^{B5}$ | $R^{B5}$ | $R^{C8}$ | N |
| $L_{A1850}$ | $R^{B7}$ | $R^{B7}$ | $R^{C8}$ | N |
| $L_{A1851}$ | $R^{A3}$ | $R^{A3}$ | $R^{C8}$ | N |
| $L_{A1852}$ | $R^{A34}$ | $R^{A34}$ | $R^{C8}$ | N |
| $L_{A1853}$ | $R^{A57}$ | $R^{A57}$ | $R^{C8}$ | N |
| $L_{A1854}$ | $R^{B3}$ | $R^{B1}$ | $R^{C8}$ | N |
| $L_{A1855}$ | $R^{B4}$ | $R^{B1}$ | $R^{C8}$ | N |
| $L_{A1856}$ | $R^{B5}$ | $R^{B1}$ | $R^{C8}$ | N |
| $L_{A1857}$ | $R^{B7}$ | $R^{B1}$ | $R^{C8}$ | N |
| $L_{A1858}$ | $R^{A3}$ | $R^{B1}$ | $R^{C8}$ | N |
| $L_{A1859}$ | $R^{A34}$ | $R^{B1}$ | $R^{C8}$ | N |
| $L_{A1860}$ | $R^{A57}$ | $R^{B1}$ | $R^{C8}$ | N |
| $L_{A1861}$ | $R^{B1}$ | $R^{B3}$ | $R^{C8}$ | N |
| $L_{A1862}$ | $R^{B1}$ | $R^{B4}$ | $R^{C8}$ | N |
| $L_{A1863}$ | $R^{B1}$ | $R^{B5}$ | $R^{C8}$ | N |
| $L_{A1864}$ | $R^{B1}$ | $R^{B7}$ | $R^{C8}$ | N |
| $L_{A1865}$ | $R^{B1}$ | $R^{A3}$ | $R^{C8}$ | N |
| $L_{A1866}$ | $R^{B1}$ | $R^{A34}$ | $R^{C8}$ | N |
| $L_{A1867}$ | $R^{B1}$ | $R^{A57}$ | $R^{C8}$ | N |
| $L_{A1868}$ | $R^{B1}$ | H | $R^{C9}$ | N |
| $L_{A1869}$ | $R^{B3}$ | H | $R^{C9}$ | N |
| $L_{A1870}$ | $R^{B4}$ | H | $R^{C9}$ | N |
| $L_{A1871}$ | $R^{B5}$ | H | $R^{C9}$ | N |
| $L_{A1872}$ | $R^{B7}$ | H | $R^{C9}$ | N |
| $L_{A1873}$ | $R^{A3}$ | H | $R^{C9}$ | N |
| $L_{A1874}$ | $R^{A34}$ | H | $R^{C9}$ | N |
| $L_{A1875}$ | $R^{A57}$ | H | $R^{C9}$ | N |
| $L_{A1876}$ | H | $R^{B1}$ | $R^{C9}$ | N |
| $L_{A1877}$ | H | $R^{B3}$ | $R^{C9}$ | N |
| $L_{A1878}$ | H | $R^{B4}$ | $R^{C9}$ | N |
| $L_{A1879}$ | H | $R^{B5}$ | $R^{C9}$ | N |
| $L_{A1880}$ | H | $R^{B7}$ | $R^{C9}$ | N |
| $L_{A1881}$ | H | $R^{A3}$ | $R^{C9}$ | N |
| $L_{A1882}$ | H | $R^{A34}$ | $R^{C9}$ | N |
| $L_{A1883}$ | H | $R^{A57}$ | $R^{C9}$ | N |
| $L_{A1884}$ | $R^{B1}$ | $R^{B1}$ | $R^{C9}$ | N |
| $L_{A1885}$ | $R^{B3}$ | $R^{B3}$ | $R^{C9}$ | N |
| $L_{A1886}$ | $R^{B4}$ | $R^{B4}$ | $R^{C9}$ | N |
| $L_{A1887}$ | $R^{B5}$ | $R^{B5}$ | $R^{C9}$ | N |
| $L_{A1888}$ | $R^{B7}$ | $R^{B7}$ | $R^{C9}$ | N |
| $L_{A1889}$ | $R^{A3}$ | $R^{A3}$ | $R^{C9}$ | N |
| $L_{A1890}$ | $R^{A34}$ | $R^{A34}$ | $R^{C9}$ | N |
| $L_{A1891}$ | $R^{A57}$ | $R^{A57}$ | $R^{C9}$ | N |

-continued

| Ligand | $R^3$ | $R^4$ | G | X |
|---|---|---|---|---|
| $L_{A1892}$ | $R^{B3}$ | $R^{B1}$ | $R^{C9}$ | N |
| $L_{A1893}$ | $R^{B4}$ | $R^{B1}$ | $R^{C9}$ | N |
| $L_{A1894}$ | $R^{B5}$ | $R^{B1}$ | $R^{C9}$ | N |
| $L_{A1895}$ | $R^{B7}$ | $R^{B1}$ | $R^{C9}$ | N |
| $L_{A1896}$ | $R^{A3}$ | $R^{B1}$ | $R^{C9}$ | N |
| $L_{A1897}$ | $R^{A34}$ | $R^{B1}$ | $R^{C9}$ | N |
| $L_{A1898}$ | $R^{A57}$ | $R^{B1}$ | $R^{C9}$ | N |
| $L_{A1899}$ | $R^{B1}$ | $R^{B3}$ | $R^{C9}$ | N |
| $L_{A1900}$ | $R^{B1}$ | $R^{B4}$ | $R^{C9}$ | N |
| $L_{A1901}$ | $R^{B1}$ | $R^{B5}$ | $R^{C9}$ | N |
| $L_{A1902}$ | $R^{B1}$ | $R^{B7}$ | $R^{C9}$ | N |
| $L_{A1903}$ | $R^{B1}$ | $R^{A3}$ | $R^{C9}$ | N |
| $L_{A1904}$ | $R^{B1}$ | $R^{A34}$ | $R^{C9}$ | N |
| $L_{A1905}$ | $R^{B1}$ | $R^{A57}$ | $R^{C9}$ | N |

$L_{A1906}$ through $L_{A2286}$ are based on a structure of Formula V,

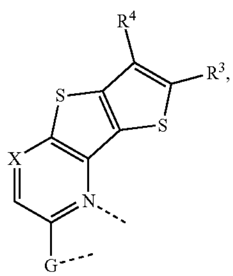

in which $R^3$, $R^4$, X and G are defined as:

| Ligand | $R^3$ | $R^4$ | G | X |
|---|---|---|---|---|
| $L_{A1906}$ | H | H | $R^{C1}$ | C |
| $L_{A1907}$ | $R^{B1}$ | H | $R^{C1}$ | C |
| $L_{A1908}$ | $R^{B3}$ | H | $R^{C1}$ | C |
| $L_{A1909}$ | $R^{B4}$ | H | $R^{C1}$ | C |
| $L_{A1910}$ | $R^{B5}$ | H | $R^{C1}$ | C |
| $L_{A1911}$ | $R^{B7}$ | H | $R^{C1}$ | C |
| $L_{A1912}$ | $R^{A3}$ | H | $R^{C1}$ | C |
| $L_{A1913}$ | $R^{A34}$ | H | $R^{C1}$ | C |
| $L_{A1914}$ | $R^{A57}$ | H | $R^{C1}$ | C |
| $L_{A1915}$ | H | $R^{B1}$ | $R^{C1}$ | C |
| $L_{A1916}$ | H | $R^{B3}$ | $R^{C1}$ | C |
| $L_{A1917}$ | H | $R^{B4}$ | $R^{C1}$ | C |
| $L_{A1918}$ | H | $R^{B5}$ | $R^{C1}$ | C |
| $L_{A1919}$ | H | $R^{B7}$ | $R^{C1}$ | C |
| $L_{A1920}$ | H | $R^{A3}$ | $R^{C1}$ | C |
| $L_{A1921}$ | H | $R^{A34}$ | $R^{C1}$ | C |
| $L_{A1922}$ | H | $R^{A57}$ | $R^{C1}$ | C |
| $L_{A1923}$ | $R^{B1}$ | $R^{B1}$ | $R^{C1}$ | C |
| $L_{A1924}$ | $R^{B3}$ | $R^{B3}$ | $R^{C1}$ | C |
| $L_{A1925}$ | $R^{B4}$ | $R^{B4}$ | $R^{C1}$ | C |
| $L_{A1926}$ | $R^{B5}$ | $R^{B5}$ | $R^{C1}$ | C |
| $L_{A1927}$ | $R^{B7}$ | $R^{B7}$ | $R^{C1}$ | C |
| $L_{A1928}$ | $R^{A3}$ | $R^{A3}$ | $R^{C1}$ | C |
| $L_{A1929}$ | $R^{A34}$ | $R^{A34}$ | $R^{C1}$ | C |
| $L_{A1930}$ | $R^{A57}$ | $R^{A57}$ | $R^{C1}$ | C |
| $L_{A1931}$ | $R^{B3}$ | $R^{B1}$ | $R^{C1}$ | C |
| $L_{A1932}$ | $R^{B4}$ | $R^{B1}$ | $R^{C1}$ | C |
| $L_{A1933}$ | $R^{B5}$ | $R^{B1}$ | $R^{C1}$ | C |
| $L_{A1934}$ | $R^{B7}$ | $R^{B1}$ | $R^{C1}$ | C |
| $L_{A1935}$ | $R^{A3}$ | $R^{B1}$ | $R^{C1}$ | C |
| $L_{A1936}$ | $R^{A34}$ | $R^{B1}$ | $R^{C1}$ | C |
| $L_{A1937}$ | $R^{A57}$ | $R^{B1}$ | $R^{C1}$ | C |
| $L_{A1938}$ | $R^{B1}$ | $R^{B3}$ | $R^{C1}$ | C |
| $L_{A1939}$ | $R^{B1}$ | $R^{B4}$ | $R^{C1}$ | C |
| $L_{A1940}$ | $R^{B1}$ | $R^{B5}$ | $R^{C1}$ | C |
| $L_{A1941}$ | $R^{B1}$ | $R^{B7}$ | $R^{C1}$ | C |
| $L_{A1942}$ | $R^{B1}$ | $R^{A3}$ | $R^{C1}$ | C |
| $L_{A1943}$ | $R^{B1}$ | $R^{A34}$ | $R^{C1}$ | C |

-continued

| Ligand | $R^3$ | $R^4$ | G | X |
|---|---|---|---|---|
| $L_{A1944}$ | $R^{B1}$ | $R^{A57}$ | $R^{C1}$ | C |
| $L_{A1945}$ | $R^{B1}$ | H | $R^{C2}$ | C |
| $L_{A1946}$ | $R^{B3}$ | H | $R^{C2}$ | C |
| $L_{A1947}$ | $R^{B4}$ | H | $R^{C2}$ | C |
| $L_{A1948}$ | $R^{B5}$ | H | $R^{C2}$ | C |
| $L_{A1949}$ | $R^{B7}$ | H | $R^{C2}$ | C |
| $L_{A1950}$ | $R^{A3}$ | H | $R^{C2}$ | C |
| $L_{A1951}$ | $R^{A34}$ | H | $R^{C2}$ | C |
| $L_{A1952}$ | $R^{A57}$ | H | $R^{C2}$ | C |
| $L_{A1953}$ | H | $R^{B1}$ | $R^{C2}$ | C |
| $L_{A1954}$ | H | $R^{B3}$ | $R^{C2}$ | C |
| $L_{A1955}$ | H | $R^{B4}$ | $R^{C2}$ | C |
| $L_{A1956}$ | H | $R^{B5}$ | $R^{C2}$ | C |
| $L_{A1957}$ | H | $R^{B7}$ | $R^{C2}$ | C |
| $L_{A1958}$ | H | $R^{A3}$ | $R^{C2}$ | C |
| $L_{A1959}$ | H | $R^{A34}$ | $R^{C2}$ | C |
| $L_{A1960}$ | H | $R^{A57}$ | $R^{C2}$ | C |
| $L_{A1961}$ | $R^{B1}$ | $R^{B1}$ | $R^{C2}$ | C |
| $L_{A1962}$ | $R^{B3}$ | $R^{B3}$ | $R^{C2}$ | C |
| $L_{A1963}$ | $R^{B4}$ | $R^{B4}$ | $R^{C2}$ | C |
| $L_{A1964}$ | $R^{B5}$ | $R^{B5}$ | $R^{C2}$ | C |
| $L_{A1965}$ | $R^{B7}$ | $R^{B7}$ | $R^{C2}$ | C |
| $L_{A1966}$ | $R^{A3}$ | $R^{A3}$ | $R^{C2}$ | C |
| $L_{A1967}$ | $R^{A34}$ | $R^{A34}$ | $R^{C2}$ | C |
| $L_{A1968}$ | $R^{A57}$ | $R^{A57}$ | $R^{C2}$ | C |
| $L_{A1969}$ | $R^{B3}$ | $R^{B1}$ | $R^{C2}$ | C |
| $L_{A1970}$ | $R^{B4}$ | $R^{B1}$ | $R^{C2}$ | C |
| $L_{A1971}$ | $R^{B5}$ | $R^{B1}$ | $R^{C2}$ | C |
| $L_{A1972}$ | $R^{B7}$ | $R^{B1}$ | $R^{C2}$ | C |
| $L_{A1973}$ | $R^{A3}$ | $R^{B1}$ | $R^{C2}$ | C |
| $L_{A1974}$ | $R^{A34}$ | $R^{B1}$ | $R^{C2}$ | C |
| $L_{A1975}$ | $R^{A57}$ | $R^{B1}$ | $R^{C2}$ | C |
| $L_{A1976}$ | $R^{B1}$ | $R^{B3}$ | $R^{C2}$ | C |
| $L_{A1977}$ | $R^{B1}$ | $R^{B4}$ | $R^{C2}$ | C |
| $L_{A1978}$ | $R^{B1}$ | $R^{B5}$ | $R^{C2}$ | C |
| $L_{A1979}$ | $R^{B1}$ | $R^{B7}$ | $R^{C2}$ | C |
| $L_{A1980}$ | $R^{B1}$ | $R^{A3}$ | $R^{C2}$ | C |
| $L_{A1981}$ | $R^{B1}$ | $R^{A34}$ | $R^{C2}$ | C |
| $L_{A1982}$ | $R^{B1}$ | $R^{A57}$ | $R^{C2}$ | C |
| $L_{A1983}$ | $R^{B1}$ | H | $R^{C3}$ | C |
| $L_{A1984}$ | $R^{B3}$ | H | $R^{C3}$ | C |
| $L_{A1985}$ | $R^{B4}$ | H | $R^{C3}$ | C |
| $L_{A1986}$ | $R^{B5}$ | H | $R^{C3}$ | C |
| $L_{A1987}$ | $R^{B7}$ | H | $R^{C3}$ | C |
| $L_{A1988}$ | $R^{A3}$ | H | $R^{C3}$ | C |
| $L_{A1989}$ | $R^{A34}$ | H | $R^{C3}$ | C |
| $L_{A1990}$ | $R^{A57}$ | H | $R^{C3}$ | C |
| $L_{A1991}$ | H | $R^{B1}$ | $R^{C3}$ | C |
| $L_{A1992}$ | H | $R^{B3}$ | $R^{C3}$ | C |
| $L_{A1993}$ | H | $R^{B4}$ | $R^{C3}$ | C |
| $L_{A1994}$ | H | $R^{B5}$ | $R^{C3}$ | C |
| $L_{A1995}$ | H | $R^{B7}$ | $R^{C3}$ | C |
| $L_{A1996}$ | H | $R^{A3}$ | $R^{C3}$ | C |
| $L_{A1997}$ | H | $R^{A34}$ | $R^{C3}$ | C |
| $L_{A1998}$ | H | $R^{A57}$ | $R^{C3}$ | C |
| $L_{A1999}$ | $R^{B1}$ | $R^{B1}$ | $R^{C3}$ | C |
| $L_{A2000}$ | $R^{B3}$ | $R^{B3}$ | $R^{C3}$ | C |
| $L_{A2001}$ | $R^{B4}$ | $R^{B4}$ | $R^{C3}$ | C |
| $L_{A2002}$ | $R^{B5}$ | $R^{B5}$ | $R^{C3}$ | C |
| $L_{A2003}$ | $R^{B7}$ | $R^{B7}$ | $R^{C3}$ | C |
| $L_{A2004}$ | $R^{A3}$ | $R^{A3}$ | $R^{C3}$ | C |
| $L_{A2005}$ | $R^{A34}$ | $R^{A34}$ | $R^{C3}$ | C |
| $L_{A2006}$ | $R^{A57}$ | $R^{A57}$ | $R^{C3}$ | C |
| $L_{A2007}$ | $R^{B3}$ | $R^{B1}$ | $R^{C3}$ | C |
| $L_{A2008}$ | $R^{B4}$ | $R^{B1}$ | $R^{C3}$ | C |
| $L_{A2009}$ | $R^{B5}$ | $R^{B1}$ | $R^{C3}$ | C |
| $L_{A2010}$ | $R^{B7}$ | $R^{B1}$ | $R^{C3}$ | C |
| $L_{A2011}$ | $R^{A3}$ | $R^{B1}$ | $R^{C3}$ | C |
| $L_{A2012}$ | $R^{A34}$ | $R^{B1}$ | $R^{C3}$ | C |
| $L_{A2013}$ | $R^{A57}$ | $R^{B1}$ | $R^{C3}$ | C |
| $L_{A2014}$ | $R^{B1}$ | $R^{B3}$ | $R^{C3}$ | C |
| $L_{A2015}$ | $R^{B1}$ | $R^{B4}$ | $R^{C3}$ | C |
| $L_{A2016}$ | $R^{B1}$ | $R^{B5}$ | $R^{C3}$ | C |
| $L_{A2017}$ | $R^{B1}$ | $R^{B7}$ | $R^{C3}$ | C |
| $L_{A2018}$ | $R^{B1}$ | $R^{A3}$ | $R^{C3}$ | C |
| $L_{A2019}$ | $R^{B1}$ | $R^{A34}$ | $R^{C3}$ | C |
| $L_{A2020}$ | $R^{B1}$ | $R^{A57}$ | $R^{C3}$ | C |

-continued

| Ligand | $R^3$ | $R^4$ | G | X |
|---|---|---|---|---|
| $L_{A2021}$ | $R^{B1}$ | H | $R^{C8}$ | C |
| $L_{A2022}$ | $R^{B3}$ | H | $R^{C8}$ | C |
| $L_{A2023}$ | $R^{B4}$ | H | $R^{C8}$ | C |
| $L_{A2024}$ | $R^{B5}$ | H | $R^{C8}$ | C |
| $L_{A2025}$ | $R^{B7}$ | H | $R^{C8}$ | C |
| $L_{A2026}$ | $R^{A3}$ | H | $R^{C8}$ | C |
| $L_{A2027}$ | $R^{A34}$ | H | $R^{C8}$ | C |
| $L_{A2028}$ | $R^{A57}$ | H | $R^{C8}$ | C |
| $L_{A2029}$ | H | $R^{B1}$ | $R^{C8}$ | C |
| $L_{A2030}$ | H | $R^{B3}$ | $R^{C8}$ | C |
| $L_{A2031}$ | H | $R^{B4}$ | $R^{C8}$ | C |
| $L_{A2032}$ | H | $R^{B5}$ | $R^{C8}$ | C |
| $L_{A2033}$ | H | $R^{B7}$ | $R^{C8}$ | C |
| $L_{A2034}$ | H | $R^{A3}$ | $R^{C8}$ | C |
| $L_{A2035}$ | H | $R^{A34}$ | $R^{C8}$ | C |
| $L_{A2036}$ | H | $R^{A57}$ | $R^{C8}$ | C |
| $L_{A2037}$ | $R^{B1}$ | $R^{B1}$ | $R^{C8}$ | C |
| $L_{A2038}$ | $R^{B3}$ | $R^{B3}$ | $R^{C8}$ | C |
| $L_{A2039}$ | $R^{B4}$ | $R^{B4}$ | $R^{C8}$ | C |
| $L_{A2040}$ | $R^{B5}$ | $R^{B5}$ | $R^{C8}$ | C |
| $L_{A2041}$ | $R^{B7}$ | $R^{B7}$ | $R^{C8}$ | C |
| $L_{A2042}$ | $R^{A3}$ | $R^{A3}$ | $R^{C8}$ | C |
| $L_{A2043}$ | $R^{A34}$ | $R^{A34}$ | $R^{C8}$ | C |
| $L_{A2044}$ | $R^{A57}$ | $R^{A57}$ | $R^{C8}$ | C |
| $L_{A2045}$ | $R^{B3}$ | $R^{B1}$ | $R^{C8}$ | C |
| $L_{A2046}$ | $R^{B4}$ | $R^{B1}$ | $R^{C8}$ | C |
| $L_{A2047}$ | $R^{B5}$ | $R^{B1}$ | $R^{C8}$ | C |
| $L_{A2048}$ | $R^{B7}$ | $R^{B1}$ | $R^{C8}$ | C |
| $L_{A2049}$ | $R^{A3}$ | $R^{B1}$ | $R^{C8}$ | C |
| $L_{A2050}$ | $R^{A34}$ | $R^{B1}$ | $R^{C8}$ | C |
| $L_{A2051}$ | $R^{A57}$ | $R^{B1}$ | $R^{C8}$ | C |
| $L_{A2052}$ | $R^{B1}$ | $R^{B3}$ | $R^{C8}$ | C |
| $L_{A2053}$ | $R^{B1}$ | $R^{B4}$ | $R^{C8}$ | C |
| $L_{A2054}$ | $R^{B1}$ | $R^{B5}$ | $R^{C8}$ | C |
| $L_{A2055}$ | $R^{B1}$ | $R^{B7}$ | $R^{C8}$ | C |
| $L_{A2056}$ | $R^{B1}$ | $R^{A3}$ | $R^{C8}$ | C |
| $L_{A2057}$ | $R^{B1}$ | $R^{A34}$ | $R^{C8}$ | C |
| $L_{A2058}$ | $R^{B1}$ | $R^{A57}$ | $R^{C8}$ | C |
| $L_{A2059}$ | $R^{B1}$ | H | $R^{C9}$ | C |
| $L_{A2060}$ | $R^{B3}$ | H | $R^{C9}$ | C |
| $L_{A2061}$ | $R^{B4}$ | H | $R^{C9}$ | C |
| $L_{A2062}$ | $R^{B5}$ | H | $R^{C9}$ | C |
| $L_{A2063}$ | $R^{B7}$ | H | $R^{C9}$ | C |
| $L_{A2064}$ | $R^{A3}$ | H | $R^{C9}$ | C |
| $L_{A2065}$ | $R^{A34}$ | H | $R^{C9}$ | C |
| $L_{A2066}$ | $R^{A57}$ | H | $R^{C9}$ | C |
| $L_{A2067}$ | H | $R^{B1}$ | $R^{C9}$ | C |
| $L_{A2068}$ | H | $R^{B3}$ | $R^{C9}$ | C |
| $L_{A2069}$ | H | $R^{B4}$ | $R^{C9}$ | C |
| $L_{A2070}$ | H | $R^{B5}$ | $R^{C9}$ | C |
| $L_{A2071}$ | H | $R^{B7}$ | $R^{C9}$ | C |
| $L_{A2072}$ | H | $R^{A3}$ | $R^{C9}$ | C |
| $L_{A2073}$ | H | $R^{A34}$ | $R^{C9}$ | C |
| $L_{A2074}$ | H | $R^{A57}$ | $R^{C9}$ | C |
| $L_{A2075}$ | $R^{B1}$ | $R^{B1}$ | $R^{C9}$ | C |
| $L_{A2076}$ | $R^{B3}$ | $R^{B3}$ | $R^{C9}$ | C |
| $L_{A2077}$ | $R^{B4}$ | $R^{B4}$ | $R^{C9}$ | C |
| $L_{A2078}$ | $R^{B5}$ | $R^{B5}$ | $R^{C9}$ | C |
| $L_{A2079}$ | $R^{B7}$ | $R^{B7}$ | $R^{C9}$ | C |
| $L_{A2080}$ | $R^{A3}$ | $R^{A3}$ | $R^{C9}$ | C |
| $L_{A2081}$ | $R^{A34}$ | $R^{A34}$ | $R^{C9}$ | C |
| $L_{A2082}$ | $R^{A57}$ | $R^{A57}$ | $R^{C9}$ | C |
| $L_{A2083}$ | $R^{B3}$ | $R^{B1}$ | $R^{C9}$ | C |
| $L_{A2084}$ | $R^{B4}$ | $R^{B1}$ | $R^{C9}$ | C |
| $L_{A2085}$ | $R^{B5}$ | $R^{B1}$ | $R^{C9}$ | C |
| $L_{A2086}$ | $R^{B7}$ | $R^{B1}$ | $R^{C9}$ | C |
| $L_{A2087}$ | $R^{A3}$ | $R^{B1}$ | $R^{C9}$ | C |
| $L_{A2088}$ | $R^{A34}$ | $R^{B1}$ | $R^{C9}$ | C |
| $L_{A2089}$ | $R^{A57}$ | $R^{B1}$ | $R^{C9}$ | C |
| $L_{A2090}$ | $R^{B1}$ | $R^{B3}$ | $R^{C9}$ | C |
| $L_{A2091}$ | $R^{B1}$ | $R^{B4}$ | $R^{C9}$ | C |
| $L_{A2092}$ | $R^{B1}$ | $R^{B5}$ | $R^{C9}$ | C |
| $L_{A2093}$ | $R^{B1}$ | $R^{B7}$ | $R^{C9}$ | C |
| $L_{A2094}$ | $R^{B1}$ | $R^{A3}$ | $R^{C9}$ | C |
| $L_{A2095}$ | $R^{B1}$ | $R^{A34}$ | $R^{C9}$ | C |
| $L_{A2096}$ | $R^{B1}$ | $R^{A57}$ | $R^{C9}$ | C |
| $L_{A2097}$ | $R^{B1}$ | H | $R^{C1}$ | N |

-continued

| Ligand | $R^3$ | $R^4$ | G | X |
|---|---|---|---|---|
| $L_{A2098}$ | $R^{B3}$ | H | $R^{C1}$ | N |
| $L_{A2099}$ | $R^{B4}$ | H | $R^{C1}$ | N |
| $L_{A2100}$ | $R^{B5}$ | H | $R^{C1}$ | N |
| $L_{A2101}$ | $R^{B7}$ | H | $R^{C1}$ | N |
| $L_{A2102}$ | $R^{A3}$ | H | $R^{C1}$ | N |
| $L_{A2103}$ | $R^{A34}$ | H | $R^{C1}$ | N |
| $L_{A2104}$ | $R^{A57}$ | H | $R^{C1}$ | N |
| $L_{A2105}$ | H | $R^{B1}$ | $R^{C1}$ | N |
| $L_{A2106}$ | H | $R^{B3}$ | $R^{C1}$ | N |
| $L_{A2107}$ | H | $R^{B4}$ | $R^{C1}$ | N |
| $L_{A2108}$ | H | $R^{B5}$ | $R^{C1}$ | N |
| $L_{A2109}$ | H | $R^{B7}$ | $R^{C1}$ | N |
| $L_{A2110}$ | H | $R^{A3}$ | $R^{C1}$ | N |
| $L_{A2111}$ | H | $R^{A34}$ | $R^{C1}$ | N |
| $L_{A2112}$ | H | $R^{A57}$ | $R^{C1}$ | N |
| $L_{A2113}$ | $R^{B1}$ | $R^{B1}$ | $R^{C1}$ | N |
| $L_{A2114}$ | $R^{B3}$ | $R^{B3}$ | $R^{C1}$ | N |
| $L_{A2115}$ | $R^{B4}$ | $R^{B4}$ | $R^{C1}$ | N |
| $L_{A2116}$ | $R^{B5}$ | $R^{B5}$ | $R^{C1}$ | N |
| $L_{A2117}$ | $R^{B7}$ | $R^{B7}$ | $R^{C1}$ | N |
| $L_{A2118}$ | $R^{A3}$ | $R^{A3}$ | $R^{C1}$ | N |
| $L_{A2119}$ | $R^{A34}$ | $R^{A34}$ | $R^{C1}$ | N |
| $L_{A2120}$ | $R^{A57}$ | $R^{A57}$ | $R^{C1}$ | N |
| $L_{A2121}$ | $R^{B3}$ | $R^{B1}$ | $R^{C1}$ | N |
| $L_{A2122}$ | $R^{B4}$ | $R^{B1}$ | $R^{C1}$ | N |
| $L_{A2123}$ | $R^{B5}$ | $R^{B1}$ | $R^{C1}$ | N |
| $L_{A2124}$ | $R^{B7}$ | $R^{B1}$ | $R^{C1}$ | N |
| $L_{A2125}$ | $R^{A3}$ | $R^{B1}$ | $R^{C1}$ | N |
| $L_{A2126}$ | $R^{A34}$ | $R^{B1}$ | $R^{C1}$ | N |
| $L_{A2127}$ | $R^{A57}$ | $R^{B1}$ | $R^{C1}$ | N |
| $L_{A2128}$ | $R^{B1}$ | $R^{B3}$ | $R^{C1}$ | N |
| $L_{A2129}$ | $R^{B1}$ | $R^{B4}$ | $R^{C1}$ | N |
| $L_{A2130}$ | $R^{B1}$ | $R^{B5}$ | $R^{C1}$ | N |
| $L_{A2131}$ | $R^{B1}$ | $R^{B7}$ | $R^{C1}$ | N |
| $L_{A2132}$ | $R^{B1}$ | $R^{A3}$ | $R^{C1}$ | N |
| $L_{A2133}$ | $R^{B1}$ | $R^{A34}$ | $R^{C1}$ | N |
| $L_{A2134}$ | $R^{B1}$ | $R^{A57}$ | $R^{C1}$ | N |
| $L_{A2135}$ | $R^{B1}$ | H | $R^{C2}$ | N |
| $L_{A2136}$ | $R^{B3}$ | H | $R^{C2}$ | N |
| $L_{A2137}$ | $R^{B4}$ | H | $R^{C2}$ | N |
| $L_{A2138}$ | $R^{B5}$ | H | $R^{C2}$ | N |
| $L_{A2139}$ | $R^{B7}$ | H | $R^{C2}$ | N |
| $L_{A2140}$ | $R^{A3}$ | H | $R^{C2}$ | N |
| $L_{A2141}$ | $R^{A34}$ | H | $R^{C2}$ | N |
| $L_{A2142}$ | $R^{A57}$ | H | $R^{C2}$ | N |
| $L_{A2143}$ | H | $R^{B1}$ | $R^{C2}$ | N |
| $L_{A2144}$ | H | $R^{B3}$ | $R^{C2}$ | N |
| $L_{A2145}$ | H | $R^{B4}$ | $R^{C2}$ | N |
| $L_{A2146}$ | H | $R^{B5}$ | $R^{C2}$ | N |
| $L_{A2147}$ | H | $R^{B7}$ | $R^{C2}$ | N |
| $L_{A2148}$ | H | $R^{A3}$ | $R^{C2}$ | N |
| $L_{A2149}$ | H | $R^{A34}$ | $R^{C2}$ | N |
| $L_{A2150}$ | H | $R^{A57}$ | $R^{C2}$ | N |
| $L_{A2151}$ | $R^{B1}$ | $R^{B1}$ | $R^{C2}$ | N |
| $L_{A2152}$ | $R^{B3}$ | $R^{B3}$ | $R^{C2}$ | N |
| $L_{A2153}$ | $R^{B4}$ | $R^{B4}$ | $R^{C2}$ | N |
| $L_{A2154}$ | $R^{B5}$ | $R^{B5}$ | $R^{C2}$ | N |
| $L_{A2155}$ | $R^{B7}$ | $R^{B7}$ | $R^{C2}$ | N |
| $L_{A2156}$ | $R^{A3}$ | $R^{A3}$ | $R^{C2}$ | N |
| $L_{A2157}$ | $R^{A34}$ | $R^{A34}$ | $R^{C2}$ | N |
| $L_{A2158}$ | $R^{A57}$ | $R^{A57}$ | $R^{C2}$ | N |
| $L_{A2159}$ | $R^{B3}$ | $R^{B1}$ | $R^{C2}$ | N |
| $L_{A2160}$ | $R^{B4}$ | $R^{B1}$ | $R^{C2}$ | N |
| $L_{A2161}$ | $R^{B5}$ | $R^{B1}$ | $R^{C2}$ | N |
| $L_{A2162}$ | $R^{B7}$ | $R^{B1}$ | $R^{C2}$ | N |
| $L_{A2163}$ | $R^{A3}$ | $R^{B1}$ | $R^{C2}$ | N |
| $L_{A2164}$ | $R^{A34}$ | $R^{B1}$ | $R^{C2}$ | N |
| $L_{A2165}$ | $R^{A57}$ | $R^{B1}$ | $R^{C2}$ | N |
| $L_{A2166}$ | $R^{B1}$ | $R^{B3}$ | $R^{C2}$ | N |
| $L_{A2167}$ | $R^{B1}$ | $R^{B4}$ | $R^{C2}$ | N |
| $L_{A2168}$ | $R^{B1}$ | $R^{B5}$ | $R^{C2}$ | N |
| $L_{A2169}$ | $R^{B1}$ | $R^{B7}$ | $R^{C2}$ | N |
| $L_{A2170}$ | $R^{B1}$ | $R^{A3}$ | $R^{C2}$ | N |
| $L_{A2171}$ | $R^{B1}$ | $R^{A34}$ | $R^{C2}$ | N |
| $L_{A2172}$ | $R^{B1}$ | $R^{A57}$ | $R^{C2}$ | N |
| $L_{A2173}$ | $R^{B1}$ | H | $R^{C3}$ | N |
| $L_{A2174}$ | $R^{B3}$ | H | $R^{C3}$ | N |

-continued

| Ligand | $R^3$ | $R^4$ | G | X |
|---|---|---|---|---|
| $L_{A2175}$ | $R^{B4}$ | H | $R^{C3}$ | N |
| $L_{A2176}$ | $R^{B5}$ | H | $R^{C3}$ | N |
| $L_{A2177}$ | $R^{B7}$ | H | $R^{C3}$ | N |
| $L_{A2178}$ | $R^{A3}$ | H | $R^{C3}$ | N |
| $L_{A2179}$ | $R^{A34}$ | H | $R^{C3}$ | N |
| $L_{A2180}$ | $R^{A57}$ | H | $R^{C3}$ | N |
| $L_{A2181}$ | H | $R^{B1}$ | $R^{C3}$ | N |
| $L_{A2182}$ | H | $R^{B3}$ | $R^{C3}$ | N |
| $L_{A2183}$ | H | $R^{B4}$ | $R^{C3}$ | N |
| $L_{A2184}$ | H | $R^{B5}$ | $R^{C3}$ | N |
| $L_{A2185}$ | H | $R^{B7}$ | $R^{C3}$ | N |
| $L_{A2186}$ | H | $R^{A3}$ | $R^{C3}$ | N |
| $L_{A2187}$ | H | $R^{A34}$ | $R^{C3}$ | N |
| $L_{A2188}$ | H | $R^{A57}$ | $R^{C3}$ | N |
| $L_{A2189}$ | $R^{B1}$ | $R^{B1}$ | $R^{C3}$ | N |
| $L_{A2190}$ | $R^{B3}$ | $R^{B3}$ | $R^{C3}$ | N |
| $L_{A2191}$ | $R^{B4}$ | $R^{B4}$ | $R^{C3}$ | N |
| $L_{A2192}$ | $R^{B5}$ | $R^{B5}$ | $R^{C3}$ | N |
| $L_{A2193}$ | $R^{B7}$ | $R^{B7}$ | $R^{C3}$ | N |
| $L_{A2194}$ | $R^{A3}$ | $R^{A3}$ | $R^{C3}$ | N |
| $L_{A2195}$ | $R^{A34}$ | $R^{A34}$ | $R^{C3}$ | N |
| $L_{A2196}$ | $R^{A57}$ | $R^{A57}$ | $R^{C3}$ | N |
| $L_{A2197}$ | $R^{B3}$ | $R^{B1}$ | $R^{C3}$ | N |
| $L_{A2198}$ | $R^{B4}$ | $R^{B1}$ | $R^{C3}$ | N |
| $L_{A2199}$ | $R^{B5}$ | $R^{B1}$ | $R^{C3}$ | N |
| $L_{A2200}$ | $R^{B7}$ | $R^{B1}$ | $R^{C3}$ | N |
| $L_{A2201}$ | $R^{A3}$ | $R^{B1}$ | $R^{C3}$ | N |
| $L_{A2202}$ | $R^{A34}$ | $R^{B1}$ | $R^{C3}$ | N |
| $L_{A2203}$ | $R^{A57}$ | $R^{B1}$ | $R^{C3}$ | N |
| $L_{A2204}$ | $R^{B1}$ | $R^{B3}$ | $R^{C3}$ | N |
| $L_{A2205}$ | $R^{B1}$ | $R^{B4}$ | $R^{C3}$ | N |
| $L_{A2206}$ | $R^{B1}$ | $R^{B5}$ | $R^{C3}$ | N |
| $L_{A2207}$ | $R^{B1}$ | $R^{B7}$ | $R^{C3}$ | N |
| $L_{A2208}$ | $R^{B1}$ | $R^{A3}$ | $R^{C3}$ | N |
| $L_{A2209}$ | $R^{B1}$ | $R^{A34}$ | $R^{C3}$ | N |
| $L_{A2210}$ | $R^{B1}$ | $R^{A57}$ | $R^{C3}$ | N |
| $L_{A2211}$ | $R^{B1}$ | H | $R^{C8}$ | N |
| $L_{A2212}$ | $R^{B3}$ | H | $R^{C8}$ | N |
| $L_{A2213}$ | $R^{B4}$ | H | $R^{C8}$ | N |
| $L_{A2214}$ | $R^{B5}$ | H | $R^{C8}$ | N |
| $L_{A2215}$ | $R^{B7}$ | H | $R^{C8}$ | N |
| $L_{A2216}$ | $R^{A3}$ | H | $R^{C8}$ | N |
| $L_{A2217}$ | $R^{A34}$ | H | $R^{C8}$ | N |
| $L_{A2218}$ | $R^{A57}$ | H | $R^{C8}$ | N |
| $L_{A2219}$ | H | $R^{B1}$ | $R^{C8}$ | N |
| $L_{A2220}$ | H | $R^{B3}$ | $R^{C8}$ | N |
| $L_{A2221}$ | H | $R^{B4}$ | $R^{C8}$ | N |
| $L_{A2222}$ | H | $R^{B5}$ | $R^{C8}$ | N |
| $L_{A2223}$ | H | $R^{B7}$ | $R^{C8}$ | N |
| $L_{A2224}$ | H | $R^{A3}$ | $R^{C8}$ | N |
| $L_{A2225}$ | H | $R^{A34}$ | $R^{C8}$ | N |
| $L_{A2226}$ | H | $R^{A57}$ | $R^{C8}$ | N |
| $L_{A2227}$ | $R^{B1}$ | $R^{B1}$ | $R^{C8}$ | N |
| $L_{A2228}$ | $R^{B3}$ | $R^{B3}$ | $R^{C8}$ | N |
| $L_{A2229}$ | $R^{B4}$ | $R^{B4}$ | $R^{C8}$ | N |
| $L_{A2230}$ | $R^{B5}$ | $R^{B5}$ | $R^{C8}$ | N |
| $L_{A2231}$ | $R^{B7}$ | $R^{B7}$ | $R^{C8}$ | N |
| $L_{A2232}$ | $R^{A3}$ | $R^{A3}$ | $R^{C8}$ | N |
| $L_{A2233}$ | $R^{A34}$ | $R^{A34}$ | $R^{C8}$ | N |
| $L_{A2234}$ | $R^{A57}$ | $R^{A57}$ | $R^{C8}$ | N |
| $L_{A2235}$ | $R^{B3}$ | $R^{B1}$ | $R^{C8}$ | N |
| $L_{A2236}$ | $R^{B4}$ | $R^{B1}$ | $R^{C8}$ | N |
| $L_{A2237}$ | $R^{B5}$ | $R^{B1}$ | $R^{C8}$ | N |
| $L_{A2238}$ | $R^{B7}$ | $R^{B1}$ | $R^{C8}$ | N |
| $L_{A2239}$ | $R^{A3}$ | $R^{B1}$ | $R^{C8}$ | N |
| $L_{A2240}$ | $R^{A34}$ | $R^{B1}$ | $R^{C8}$ | N |
| $L_{A2241}$ | $R^{A57}$ | $R^{B1}$ | $R^{C8}$ | N |
| $L_{A2242}$ | $R^{B1}$ | $R^{B3}$ | $R^{C8}$ | N |
| $L_{A2243}$ | $R^{B1}$ | $R^{B4}$ | $R^{C8}$ | N |
| $L_{A2244}$ | $R^{B1}$ | $R^{B5}$ | $R^{C8}$ | N |
| $L_{A2245}$ | $R^{B1}$ | $R^{B7}$ | $R^{C8}$ | N |
| $L_{A2246}$ | $R^{B1}$ | $R^{A3}$ | $R^{C8}$ | N |
| $L_{A2247}$ | $R^{B1}$ | $R^{A34}$ | $R^{C8}$ | N |
| $L_{A2248}$ | $R^{B1}$ | $R^{A57}$ | $R^{C8}$ | N |
| $L_{A2249}$ | $R^{B1}$ | H | $R^{C9}$ | N |
| $L_{A2250}$ | $R^{B3}$ | H | $R^{C9}$ | N |
| $L_{A2251}$ | $R^{B4}$ | H | $R^{C9}$ | N |

-continued

| Ligand | $R^3$ | $R^4$ | G | X |
|---|---|---|---|---|
| $L_{A2252}$ | $R^{B5}$ | H | $R^{C9}$ | N |
| $L_{A2253}$ | $R^{B7}$ | H | $R^{C9}$ | N |
| $L_{A2254}$ | $R^{A3}$ | H | $R^{C9}$ | N |
| $L_{A2255}$ | $R^{A34}$ | H | $R^{C9}$ | N |
| $L_{A2256}$ | $R^{A57}$ | H | $R^{C9}$ | N |
| $L_{A2257}$ | H | $R^{B1}$ | $R^{C9}$ | N |
| $L_{A2258}$ | H | $R^{B3}$ | $R^{C9}$ | N |
| $L_{A2259}$ | H | $R^{B4}$ | $R^{C9}$ | N |
| $L_{A2260}$ | H | $R^{B5}$ | $R^{C9}$ | N |
| $L_{A2261}$ | H | $R^{B7}$ | $R^{C9}$ | N |
| $L_{A2262}$ | H | $R^{A3}$ | $R^{C9}$ | N |
| $L_{A2263}$ | H | $R^{A34}$ | $R^{C9}$ | N |
| $L_{A2264}$ | H | $R^{A57}$ | $R^{C9}$ | N |
| $L_{A2265}$ | $R^{B1}$ | $R^{B1}$ | $R^{C9}$ | N |
| $L_{A2266}$ | $R^{B3}$ | $R^{B3}$ | $R^{C9}$ | N |
| $L_{A2267}$ | $R^{B4}$ | $R^{B4}$ | $R^{C9}$ | N |
| $L_{A2268}$ | $R^{B5}$ | $R^{B5}$ | $R^{C9}$ | N |
| $L_{A2269}$ | $R^{B7}$ | $R^{B7}$ | $R^{C9}$ | N |
| $L_{A2270}$ | $R^{A3}$ | $R^{A3}$ | $R^{C9}$ | N |
| $L_{A2271}$ | $R^{A34}$ | $R^{A34}$ | $R^{C9}$ | N |
| $L_{A2272}$ | $R^{A57}$ | $R^{A57}$ | $R^{C9}$ | N |
| $L_{A2273}$ | $R^{B3}$ | $R^{B1}$ | $R^{C9}$ | N |
| $L_{A2274}$ | $R^{B4}$ | $R^{B1}$ | $R^{C9}$ | N |
| $L_{A2275}$ | $R^{B5}$ | $R^{B1}$ | $R^{C9}$ | N |
| $L_{A2276}$ | $R^{B7}$ | $R^{B1}$ | $R^{C9}$ | N |
| $L_{A2277}$ | $R^{A3}$ | $R^{B1}$ | $R^{C9}$ | N |
| $L_{A2278}$ | $R^{A34}$ | $R^{B1}$ | $R^{C9}$ | N |
| $L_{A2279}$ | $R^{A57}$ | $R^{B1}$ | $R^{C9}$ | N |
| $L_{A2280}$ | $R^{B1}$ | $R^{B3}$ | $R^{C9}$ | N |
| $L_{A2281}$ | $R^{B1}$ | $R^{B4}$ | $R^{C9}$ | N |
| $L_{A2282}$ | $R^{B1}$ | $R^{B5}$ | $R^{C9}$ | N |
| $L_{A2283}$ | $R^{B1}$ | $R^{B7}$ | $R^{C9}$ | N |
| $L_{A2284}$ | $R^{B1}$ | $R^{A3}$ | $R^{C9}$ | N |
| $L_{A2285}$ | $R^{B1}$ | $R^{A34}$ | $R^{C9}$ | N |
| $L_{A2286}$ | $R^{B1}$ | $R^{A57}$ | $R^{C9}$ | N |

$L_{A2287}$ through $L_{A2667}$ are based on a structure of Formula V,

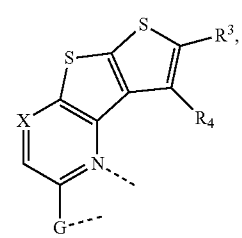

in which $R^3$, $R^4$, X and G are defined as:

| Ligand | $R^3$ | $R^4$ | G | X |
|---|---|---|---|---|
| $L_{A2287}$ | H | H | $R^{C1}$ | C |
| $L_{A2288}$ | $R^{B1}$ | H | $R^{C1}$ | C |
| $L_{A2289}$ | $R^{B3}$ | H | $R^{C1}$ | C |
| $L_{A2290}$ | $R^{B4}$ | H | $R^{C1}$ | C |
| $L_{A2291}$ | $R^{B5}$ | H | $R^{C1}$ | C |
| $L_{A2292}$ | $R^{B7}$ | H | $R^{C1}$ | C |
| $L_{A2293}$ | $R^{A3}$ | H | $R^{C1}$ | C |
| $L_{A2294}$ | $R^{A34}$ | H | $R^{C1}$ | C |
| $L_{A2295}$ | $R^{A57}$ | H | $R^{C1}$ | C |
| $L_{A2296}$ | H | $R^{B1}$ | $R^{C1}$ | C |
| $L_{A2297}$ | H | $R^{B3}$ | $R^{C1}$ | C |
| $L_{A2298}$ | H | $R^{B4}$ | $R^{C1}$ | C |
| $L_{A2299}$ | H | $R^{B5}$ | $R^{C1}$ | C |
| $L_{A2300}$ | H | $R^{B7}$ | $R^{C1}$ | C |
| $L_{A2301}$ | H | $R^{A3}$ | $R^{C1}$ | C |
| $L_{A2302}$ | H | $R^{A34}$ | $R^{C1}$ | C |
| $L_{A2303}$ | H | $R^{A57}$ | $R^{C1}$ | C |
| $L_{A2304}$ | $R^{B1}$ | $R^{B1}$ | $R^{C1}$ | C |
| $L_{A2305}$ | $R^{B3}$ | $R^{B3}$ | $R^{C1}$ | C |

-continued

| Ligand | $R^3$ | $R^4$ | G | X |
|---|---|---|---|---|
| $L_{A2306}$ | $R^{B4}$ | $R^{B4}$ | $R^{C1}$ | C |
| $L_{A2307}$ | $R^{B5}$ | $R^{B5}$ | $R^{C1}$ | C |
| $L_{A2308}$ | $R^{B7}$ | $R^{B7}$ | $R^{C1}$ | C |
| $L_{A2309}$ | $R^{A3}$ | $R^{A3}$ | $R^{C1}$ | C |
| $L_{A2310}$ | $R^{A34}$ | $R^{A34}$ | $R^{C1}$ | C |
| $L_{A2311}$ | $R^{A57}$ | $R^{A57}$ | $R^{C1}$ | C |
| $L_{A2312}$ | $R^{B3}$ | $R^{B1}$ | $R^{C1}$ | C |
| $L_{A2313}$ | $R^{B4}$ | $R^{B1}$ | $R^{C1}$ | C |
| $L_{A2314}$ | $R^{B5}$ | $R^{B1}$ | $R^{C1}$ | C |
| $L_{A2315}$ | $R^{B7}$ | $R^{B1}$ | $R^{C1}$ | C |
| $L_{A2316}$ | $R^{A3}$ | $R^{B1}$ | $R^{C1}$ | C |
| $L_{A2317}$ | $R^{A34}$ | $R^{B1}$ | $R^{C1}$ | C |
| $L_{A2318}$ | $R^{A57}$ | $R^{B1}$ | $R^{C1}$ | C |
| $L_{A2319}$ | $R^{B1}$ | $R^{B3}$ | $R^{C1}$ | C |
| $L_{A2320}$ | $R^{B1}$ | $R^{B4}$ | $R^{C1}$ | C |
| $L_{A2321}$ | $R^{B1}$ | $R^{B5}$ | $R^{C1}$ | C |
| $L_{A2322}$ | $R^{B1}$ | $R^{B7}$ | $R^{C1}$ | C |
| $L_{A2323}$ | $R^{B1}$ | $R^{A3}$ | $R^{C1}$ | C |
| $L_{A2324}$ | $R^{B1}$ | $R^{A34}$ | $R^{C1}$ | C |
| $L_{A2325}$ | $R^{B1}$ | $R^{A57}$ | $R^{C1}$ | C |
| $L_{A2326}$ | $R^{B1}$ | H | $R^{C2}$ | C |
| $L_{A2327}$ | $R^{B3}$ | H | $R^{C2}$ | C |
| $L_{A2328}$ | $R^{B4}$ | H | $R^{C2}$ | C |
| $L_{A2329}$ | $R^{B5}$ | H | $R^{C2}$ | C |
| $L_{A2330}$ | $R^{B7}$ | H | $R^{C2}$ | C |
| $L_{A2331}$ | $R^{A3}$ | H | $R^{C2}$ | C |
| $L_{A2332}$ | $R^{A34}$ | H | $R^{C2}$ | C |
| $L_{A2333}$ | $R^{A57}$ | H | $R^{C2}$ | C |
| $L_{A2334}$ | H | $R^{B1}$ | $R^{C2}$ | C |
| $L_{A2335}$ | H | $R^{B3}$ | $R^{C2}$ | C |
| $L_{A2336}$ | H | $R^{B4}$ | $R^{C2}$ | C |
| $L_{A2337}$ | H | $R^{B5}$ | $R^{C2}$ | C |
| $L_{A2338}$ | H | $R^{B7}$ | $R^{C2}$ | C |
| $L_{A2339}$ | H | $R^{A3}$ | $R^{C2}$ | C |
| $L_{A2340}$ | H | $R^{A34}$ | $R^{C2}$ | C |
| $L_{A2341}$ | H | $R^{A57}$ | $R^{C2}$ | C |
| $L_{A2342}$ | $R^{B1}$ | $R^{B1}$ | $R^{C2}$ | C |
| $L_{A2343}$ | $R^{B3}$ | $R^{B3}$ | $R^{C2}$ | C |
| $L_{A2344}$ | $R^{B4}$ | $R^{B4}$ | $R^{C2}$ | C |
| $L_{A2345}$ | $R^{B5}$ | $R^{B5}$ | $R^{C2}$ | C |
| $L_{A2346}$ | $R^{B7}$ | $R^{B7}$ | $R^{C2}$ | C |
| $L_{A2347}$ | $R^{A3}$ | $R^{A3}$ | $R^{C2}$ | C |
| $L_{A2348}$ | $R^{A34}$ | $R^{A34}$ | $R^{C2}$ | C |
| $L_{A2349}$ | $R^{A57}$ | $R^{A57}$ | $R^{C2}$ | C |
| $L_{A2350}$ | $R^{B3}$ | $R^{B1}$ | $R^{C2}$ | C |
| $L_{A2351}$ | $R^{B4}$ | $R^{B1}$ | $R^{C2}$ | C |
| $L_{A2352}$ | $R^{B5}$ | $R^{B1}$ | $R^{C2}$ | C |
| $L_{A2353}$ | $R^{B7}$ | $R^{B1}$ | $R^{C2}$ | C |
| $L_{A2354}$ | $R^{A3}$ | $R^{B1}$ | $R^{C2}$ | C |
| $L_{A2355}$ | $R^{A34}$ | $R^{B1}$ | $R^{C2}$ | C |
| $L_{A2356}$ | $R^{A57}$ | $R^{B1}$ | $R^{C2}$ | C |
| $L_{A2357}$ | $R^{B1}$ | $R^{B3}$ | $R^{C2}$ | C |
| $L_{A2358}$ | $R^{B1}$ | $R^{B4}$ | $R^{C2}$ | C |
| $L_{A2359}$ | $R^{B1}$ | $R^{B5}$ | $R^{C2}$ | C |
| $L_{A2360}$ | $R^{B1}$ | $R^{B7}$ | $R^{C2}$ | C |
| $L_{A2361}$ | $R^{B1}$ | $R^{A3}$ | $R^{C2}$ | C |
| $L_{A2362}$ | $R^{B1}$ | $R^{A34}$ | $R^{C2}$ | C |
| $L_{A2363}$ | $R^{B1}$ | $R^{A57}$ | $R^{C2}$ | C |
| $L_{A2364}$ | $R^{B1}$ | H | $R^{C3}$ | C |
| $L_{A2365}$ | $R^{B3}$ | H | $R^{C3}$ | C |
| $L_{A2366}$ | $R^{B4}$ | H | $R^{C3}$ | C |
| $L_{A2367}$ | $R^{B5}$ | H | $R^{C3}$ | C |
| $L_{A2368}$ | $R^{B7}$ | H | $R^{C3}$ | C |
| $L_{A2369}$ | $R^{A3}$ | H | $R^{C3}$ | C |
| $L_{A2370}$ | $R^{A34}$ | H | $R^{C3}$ | C |
| $L_{A2371}$ | $R^{A57}$ | H | $R^{C3}$ | C |
| $L_{A2372}$ | H | $R^{B1}$ | $R^{C3}$ | C |
| $L_{A2373}$ | H | $R^{B3}$ | $R^{C3}$ | C |
| $L_{A2374}$ | H | $R^{B4}$ | $R^{C3}$ | C |
| $L_{A2375}$ | H | $R^{B5}$ | $R^{C3}$ | C |
| $L_{A2376}$ | H | $R^{B7}$ | $R^{C3}$ | C |
| $L_{A2377}$ | H | $R^{A3}$ | $R^{C3}$ | C |
| $L_{A2378}$ | H | $R^{A34}$ | $R^{C3}$ | C |
| $L_{A2379}$ | H | $R^{A57}$ | $R^{C3}$ | C |
| $L_{A2380}$ | $R^{B1}$ | $R^{B1}$ | $R^{C3}$ | C |
| $L_{A2381}$ | $R^{B3}$ | $R^{B3}$ | $R^{C3}$ | C |
| $L_{A2382}$ | $R^{B4}$ | $R^{B4}$ | $R^{C3}$ | C |

-continued

| Ligand | $R^3$ | $R^4$ | G | X |
|---|---|---|---|---|
| $L_{A2383}$ | $R^{B5}$ | $R^{B5}$ | $R^{C3}$ | C |
| $L_{A2384}$ | $R^{B7}$ | $R^{B7}$ | $R^{C3}$ | C |
| $L_{A2385}$ | $R^{A3}$ | $R^{A3}$ | $R^{C3}$ | C |
| $L_{A2386}$ | $R^{A34}$ | $R^{A34}$ | $R^{C3}$ | C |
| $L_{A2387}$ | $R^{A57}$ | $R^{A57}$ | $R^{C3}$ | C |
| $L_{A2388}$ | $R^{B3}$ | $R^{B1}$ | $R^{C3}$ | C |
| $L_{A2389}$ | $R^{B4}$ | $R^{B1}$ | $R^{C3}$ | C |
| $L_{A2390}$ | $R^{B5}$ | $R^{B1}$ | $R^{C3}$ | C |
| $L_{A2391}$ | $R^{B7}$ | $R^{B1}$ | $R^{C3}$ | C |
| $L_{A2392}$ | $R^{A3}$ | $R^{B1}$ | $R^{C3}$ | C |
| $L_{A2393}$ | $R^{A34}$ | $R^{B1}$ | $R^{C3}$ | C |
| $L_{A2394}$ | $R^{A57}$ | $R^{B1}$ | $R^{C3}$ | C |
| $L_{A2395}$ | $R^{B1}$ | $R^{B3}$ | $R^{C3}$ | C |
| $L_{A2396}$ | $R^{B1}$ | $R^{B4}$ | $R^{C3}$ | C |
| $L_{A2397}$ | $R^{B1}$ | $R^{B5}$ | $R^{C3}$ | C |
| $L_{A2398}$ | $R^{B1}$ | $R^{B7}$ | $R^{C3}$ | C |
| $L_{A2399}$ | $R^{B1}$ | $R^{A3}$ | $R^{C3}$ | C |
| $L_{A2400}$ | $R^{B1}$ | $R^{A34}$ | $R^{C3}$ | C |
| $L_{A2401}$ | $R^{B1}$ | $R^{A57}$ | $R^{C3}$ | C |
| $L_{A2402}$ | $R^{B1}$ | H | $R^{C8}$ | C |
| $L_{A2403}$ | $R^{B3}$ | H | $R^{C8}$ | C |
| $L_{A2404}$ | $R^{B4}$ | H | $R^{C8}$ | C |
| $L_{A2405}$ | $R^{B5}$ | H | $R^{C8}$ | C |
| $L_{A2406}$ | $R^{B7}$ | H | $R^{C8}$ | C |
| $L_{A2407}$ | $R^{A3}$ | H | $R^{C8}$ | C |
| $L_{A2408}$ | $R^{A34}$ | H | $R^{C8}$ | C |
| $L_{A2409}$ | $R^{A57}$ | H | $R^{C8}$ | C |
| $L_{A2410}$ | H | $R^{B1}$ | $R^{C8}$ | C |
| $L_{A2411}$ | H | $R^{B3}$ | $R^{C8}$ | C |
| $L_{A2412}$ | H | $R^{B4}$ | $R^{C8}$ | C |
| $L_{A2413}$ | H | $R^{B5}$ | $R^{C8}$ | C |
| $L_{A2414}$ | H | $R^{B7}$ | $R^{C8}$ | C |
| $L_{A2415}$ | H | $R^{A3}$ | $R^{C8}$ | C |
| $L_{A2416}$ | H | $R^{A34}$ | $R^{C8}$ | C |
| $L_{A2417}$ | H | $R^{A57}$ | $R^{C8}$ | C |
| $L_{A2418}$ | $R^{B1}$ | $R^{B1}$ | $R^{C8}$ | C |
| $L_{A2419}$ | $R^{B3}$ | $R^{B3}$ | $R^{C8}$ | C |
| $L_{A2420}$ | $R^{B4}$ | $R^{B4}$ | $R^{C8}$ | C |
| $L_{A2421}$ | $R^{B5}$ | $R^{B5}$ | $R^{C8}$ | C |
| $L_{A2422}$ | $R^{B7}$ | $R^{B7}$ | $R^{C8}$ | C |
| $L_{A2423}$ | $R^{A3}$ | $R^{A3}$ | $R^{C8}$ | C |
| $L_{A2424}$ | $R^{A34}$ | $R^{A34}$ | $R^{C8}$ | C |
| $L_{A2425}$ | $R^{A57}$ | $R^{A57}$ | $R^{C8}$ | C |
| $L_{A2426}$ | $R^{B3}$ | $R^{B1}$ | $R^{C8}$ | C |
| $L_{A2427}$ | $R^{B4}$ | $R^{B1}$ | $R^{C8}$ | C |
| $L_{A2428}$ | $R^{B5}$ | $R^{B1}$ | $R^{C8}$ | C |
| $L_{A2429}$ | $R^{B7}$ | $R^{B1}$ | $R^{C8}$ | C |
| $L_{A2430}$ | $R^{A3}$ | $R^{B1}$ | $R^{C8}$ | C |
| $L_{A2431}$ | $R^{A34}$ | $R^{B1}$ | $R^{C8}$ | C |
| $L_{A2432}$ | $R^{A57}$ | $R^{B1}$ | $R^{C8}$ | C |
| $L_{A2433}$ | $R^{B1}$ | $R^{B3}$ | $R^{C8}$ | C |
| $L_{A2434}$ | $R^{B1}$ | $R^{B4}$ | $R^{C8}$ | C |
| $L_{A2435}$ | $R^{B1}$ | $R^{B5}$ | $R^{C8}$ | C |
| $L_{A2436}$ | $R^{B1}$ | $R^{B7}$ | $R^{C8}$ | C |
| $L_{A2437}$ | $R^{B1}$ | $R^{A3}$ | $R^{C8}$ | C |
| $L_{A2438}$ | $R^{B1}$ | $R^{A34}$ | $R^{C8}$ | C |
| $L_{A2439}$ | $R^{B1}$ | $R^{A57}$ | $R^{C8}$ | C |
| $L_{A2440}$ | $R^{B1}$ | H | $R^{C9}$ | C |
| $L_{A2441}$ | $R^{B3}$ | H | $R^{C9}$ | C |
| $L_{A2442}$ | $R^{B4}$ | H | $R^{C9}$ | C |
| $L_{A2443}$ | $R^{B5}$ | H | $R^{C9}$ | C |
| $L_{A2444}$ | $R^{B7}$ | H | $R^{C9}$ | C |
| $L_{A2445}$ | $R^{A3}$ | H | $R^{C9}$ | C |
| $L_{A2446}$ | $R^{A34}$ | H | $R^{C9}$ | C |
| $L_{A2447}$ | $R^{A57}$ | H | $R^{C9}$ | C |
| $L_{A2448}$ | H | $R^{B1}$ | $R^{C9}$ | C |
| $L_{A2449}$ | H | $R^{B3}$ | $R^{C9}$ | C |
| $L_{A2450}$ | H | $R^{B4}$ | $R^{C9}$ | C |
| $L_{A2451}$ | H | $R^{B5}$ | $R^{C9}$ | C |
| $L_{A2452}$ | H | $R^{B7}$ | $R^{C9}$ | C |
| $L_{A2453}$ | H | $R^{A3}$ | $R^{C9}$ | C |
| $L_{A2454}$ | H | $R^{A34}$ | $R^{C9}$ | C |
| $L_{A2455}$ | H | $R^{A57}$ | $R^{C9}$ | C |
| $L_{A2456}$ | $R^{B1}$ | $R^{B1}$ | $R^{C9}$ | C |
| $L_{A2457}$ | $R^{B3}$ | $R^{B3}$ | $R^{C9}$ | C |
| $L_{A2458}$ | $R^{B4}$ | $R^{B4}$ | $R^{C9}$ | C |
| $L_{A2459}$ | $R^{B5}$ | $R^{B5}$ | $R^{C9}$ | C |

| Ligand | $R^3$ | $R^4$ | G | X |
|---|---|---|---|---|
| $L_{A2460}$ | $R^{B7}$ | $R^{B7}$ | $R^{C9}$ | C |
| $L_{A2461}$ | $R^{A3}$ | $R^{A3}$ | $R^{C9}$ | C |
| $L_{A2462}$ | $R^{A34}$ | $R^{A34}$ | $R^{C9}$ | C |
| $L_{A2463}$ | $R^{A57}$ | $R^{A57}$ | $R^{C9}$ | C |
| $L_{A2464}$ | $R^{B3}$ | $R^{B1}$ | $R^{C9}$ | C |
| $L_{A2465}$ | $R^{B4}$ | $R^{B1}$ | $R^{C9}$ | C |
| $L_{A2466}$ | $R^{B5}$ | $R^{B1}$ | $R^{C9}$ | C |
| $L_{A2467}$ | $R^{B7}$ | $R^{B1}$ | $R^{C9}$ | C |
| $L_{A2468}$ | $R^{A3}$ | $R^{B1}$ | $R^{C9}$ | C |
| $L_{A2469}$ | $R^{A34}$ | $R^{B1}$ | $R^{C9}$ | C |
| $L_{A2470}$ | $R^{A57}$ | $R^{B1}$ | $R^{C9}$ | C |
| $L_{A2471}$ | $R^{B1}$ | $R^{B3}$ | $R^{C9}$ | C |
| $L_{A2472}$ | $R^{B1}$ | $R^{B4}$ | $R^{C9}$ | C |
| $L_{A2473}$ | $R^{B1}$ | $R^{B5}$ | $R^{C9}$ | C |
| $L_{A2474}$ | $R^{B1}$ | $R^{B7}$ | $R^{C9}$ | C |
| $L_{A2475}$ | $R^{B1}$ | $R^{A3}$ | $R^{C9}$ | C |
| $L_{A2476}$ | $R^{B1}$ | $R^{A34}$ | $R^{C9}$ | C |
| $L_{A2477}$ | $R^{B1}$ | $R^{A57}$ | $R^{C9}$ | C |
| $L_{A2478}$ | $R^{B1}$ | H | $R^{C1}$ | N |
| $L_{A2479}$ | $R^{B3}$ | H | $R^{C1}$ | N |
| $L_{A2480}$ | $R^{B4}$ | H | $R^{C1}$ | N |
| $L_{A2481}$ | $R^{B5}$ | H | $R^{C1}$ | N |
| $L_{A2482}$ | $R^{B7}$ | H | $R^{C1}$ | N |
| $L_{A2483}$ | $R^{A3}$ | H | $R^{C1}$ | N |
| $L_{A2484}$ | $R^{A34}$ | H | $R^{C1}$ | N |
| $L_{A2485}$ | $R^{A57}$ | H | $R^{C1}$ | N |
| $L_{A2486}$ | H | $R^{B1}$ | $R^{C1}$ | N |
| $L_{A2487}$ | H | $R^{B3}$ | $R^{C1}$ | N |
| $L_{A2488}$ | H | $R^{B4}$ | $R^{C1}$ | N |
| $L_{A2489}$ | H | $R^{B5}$ | $R^{C1}$ | N |
| $L_{A2490}$ | H | $R^{B7}$ | $R^{C1}$ | N |
| $L_{A2491}$ | H | $R^{A3}$ | $R^{C1}$ | N |
| $L_{A2492}$ | H | $R^{A34}$ | $R^{C1}$ | N |
| $L_{A2493}$ | H | $R^{A57}$ | $R^{C1}$ | N |
| $L_{A2494}$ | $R^{B1}$ | $R^{B1}$ | $R^{C1}$ | N |
| $L_{A2495}$ | $R^{B3}$ | $R^{B3}$ | $R^{C1}$ | N |
| $L_{A2496}$ | $R^{B4}$ | $R^{B4}$ | $R^{C1}$ | N |
| $L_{A2497}$ | $R^{B5}$ | $R^{B5}$ | $R^{C1}$ | N |
| $L_{A2498}$ | $R^{B7}$ | $R^{B7}$ | $R^{C1}$ | N |
| $L_{A2499}$ | $R^{A3}$ | $R^{A3}$ | $R^{C1}$ | N |
| $L_{A2500}$ | $R^{A34}$ | $R^{A34}$ | $R^{C1}$ | N |
| $L_{A2501}$ | $R^{A57}$ | $R^{A57}$ | $R^{C1}$ | N |
| $L_{A2502}$ | $R^{B3}$ | $R^{B1}$ | $R^{C1}$ | N |
| $L_{A2503}$ | $R^{B4}$ | $R^{B1}$ | $R^{C1}$ | N |
| $L_{A2504}$ | $R^{B5}$ | $R^{B1}$ | $R^{C1}$ | N |
| $L_{A2505}$ | $R^{B7}$ | $R^{B1}$ | $R^{C1}$ | N |
| $L_{A2506}$ | $R^{A3}$ | $R^{B1}$ | $R^{C1}$ | N |
| $L_{A2507}$ | $R^{A34}$ | $R^{B1}$ | $R^{C1}$ | N |
| $L_{A2508}$ | $R^{A57}$ | $R^{B1}$ | $R^{C1}$ | N |
| $L_{A2509}$ | $R^{B1}$ | $R^{B3}$ | $R^{C1}$ | N |
| $L_{A2510}$ | $R^{B1}$ | $R^{B4}$ | $R^{C1}$ | N |
| $L_{A2511}$ | $R^{B1}$ | $R^{B5}$ | $R^{C1}$ | N |
| $L_{A2512}$ | $R^{B1}$ | $R^{B7}$ | $R^{C1}$ | N |
| $L_{A2513}$ | $R^{B1}$ | $R^{A3}$ | $R^{C1}$ | N |
| $L_{A2514}$ | $R^{B1}$ | $R^{A34}$ | $R^{C1}$ | N |
| $L_{A2515}$ | $R^{B1}$ | $R^{A57}$ | $R^{C1}$ | N |
| $L_{A2516}$ | $R^{B1}$ | H | $R^{C2}$ | N |
| $L_{A2517}$ | $R^{B3}$ | H | $R^{C2}$ | N |
| $L_{A2518}$ | $R^{B4}$ | H | $R^{C2}$ | N |
| $L_{A2519}$ | $R^{B5}$ | H | $R^{C2}$ | N |
| $L_{A2520}$ | $R^{B7}$ | H | $R^{C2}$ | N |
| $L_{A2521}$ | $R^{A3}$ | H | $R^{C2}$ | N |
| $L_{A2522}$ | $R^{A34}$ | H | $R^{C2}$ | N |
| $L_{A2523}$ | $R^{A57}$ | H | $R^{C2}$ | N |
| $L_{A2524}$ | H | $R^{B1}$ | $R^{C2}$ | N |
| $L_{A2525}$ | H | $R^{B3}$ | $R^{C2}$ | N |
| $L_{A2526}$ | H | $R^{B4}$ | $R^{C2}$ | N |
| $L_{A2527}$ | H | $R^{B5}$ | $R^{C2}$ | N |
| $L_{A2528}$ | H | $R^{B7}$ | $R^{C2}$ | N |
| $L_{A2529}$ | H | $R^{A3}$ | $R^{C2}$ | N |
| $L_{A2530}$ | H | $R^{A34}$ | $R^{C2}$ | N |
| $L_{A2531}$ | H | $R^{A57}$ | $R^{C2}$ | N |
| $L_{A2532}$ | $R^{B1}$ | $R^{B1}$ | $R^{C2}$ | N |
| $L_{A2533}$ | $R^{B3}$ | $R^{B3}$ | $R^{C2}$ | N |
| $L_{A2534}$ | $R^{B4}$ | $R^{B4}$ | $R^{C2}$ | N |
| $L_{A2535}$ | $R^{B5}$ | $R^{B5}$ | $R^{C2}$ | N |
| $L_{A2536}$ | $R^{B7}$ | $R^{B7}$ | $R^{C2}$ | N |

| Ligand | $R^3$ | $R^4$ | G | X |
|---|---|---|---|---|
| $L_{A2537}$ | $R^{A3}$ | $R^{A3}$ | $R^{C2}$ | N |
| $L_{A2538}$ | $R^{A34}$ | $R^{A34}$ | $R^{C2}$ | N |
| $L_{A2539}$ | $R^{A57}$ | $R^{A57}$ | $R^{C2}$ | N |
| $L_{A2540}$ | $R^{B3}$ | $R^{B1}$ | $R^{C2}$ | N |
| $L_{A2541}$ | $R^{B4}$ | $R^{B1}$ | $R^{C2}$ | N |
| $L_{A2542}$ | $R^{B5}$ | $R^{B1}$ | $R^{C2}$ | N |
| $L_{A2543}$ | $R^{B7}$ | $R^{B1}$ | $R^{C2}$ | N |
| $L_{A2544}$ | $R^{A3}$ | $R^{B1}$ | $R^{C2}$ | N |
| $L_{A2545}$ | $R^{A34}$ | $R^{B1}$ | $R^{C2}$ | N |
| $L_{A2546}$ | $R^{A57}$ | $R^{B1}$ | $R^{C2}$ | N |
| $L_{A2547}$ | $R^{B1}$ | $R^{B3}$ | $R^{C2}$ | N |
| $L_{A2548}$ | $R^{B1}$ | $R^{B4}$ | $R^{C2}$ | N |
| $L_{A2549}$ | $R^{B1}$ | $R^{B5}$ | $R^{C2}$ | N |
| $L_{A2550}$ | $R^{B1}$ | $R^{B7}$ | $R^{C2}$ | N |
| $L_{A2551}$ | $R^{B1}$ | $R^{A3}$ | $R^{C2}$ | N |
| $L_{A2552}$ | $R^{B1}$ | $R^{A34}$ | $R^{C2}$ | N |
| $L_{A2553}$ | $R^{B1}$ | $R^{A57}$ | $R^{C2}$ | N |
| $L_{A2554}$ | $R^{B1}$ | H | $R^{C3}$ | N |
| $L_{A2555}$ | $R^{B3}$ | H | $R^{C3}$ | N |
| $L_{A2556}$ | $R^{B4}$ | H | $R^{C3}$ | N |
| $L_{A2557}$ | $R^{B5}$ | H | $R^{C3}$ | N |
| $L_{A2558}$ | $R^{B7}$ | H | $R^{C3}$ | N |
| $L_{A2559}$ | $R^{A3}$ | H | $R^{C3}$ | N |
| $L_{A2560}$ | $R^{A34}$ | H | $R^{C3}$ | N |
| $L_{A2561}$ | $R^{A57}$ | H | $R^{C3}$ | N |
| $L_{A2562}$ | H | $R^{B1}$ | $R^{C3}$ | N |
| $L_{A2563}$ | H | $R^{B3}$ | $R^{C3}$ | N |
| $L_{A2564}$ | H | $R^{B4}$ | $R^{C3}$ | N |
| $L_{A2565}$ | H | $R^{B5}$ | $R^{C3}$ | N |
| $L_{A2566}$ | H | $R^{B7}$ | $R^{C3}$ | N |
| $L_{A2567}$ | H | $R^{A3}$ | $R^{C3}$ | N |
| $L_{A2568}$ | H | $R^{A34}$ | $R^{C3}$ | N |
| $L_{A2569}$ | H | $R^{A57}$ | $R^{C3}$ | N |
| $L_{A2570}$ | $R^{B1}$ | $R^{B1}$ | $R^{C3}$ | N |
| $L_{A2571}$ | $R^{B3}$ | $R^{B3}$ | $R^{C3}$ | N |
| $L_{A2572}$ | $R^{B4}$ | $R^{B4}$ | $R^{C3}$ | N |
| $L_{A2573}$ | $R^{B5}$ | $R^{B5}$ | $R^{C3}$ | N |
| $L_{A2574}$ | $R^{B7}$ | $R^{B7}$ | $R^{C3}$ | N |
| $L_{A2575}$ | $R^{A3}$ | $R^{A3}$ | $R^{C3}$ | N |
| $L_{A2576}$ | $R^{A34}$ | $R^{A34}$ | $R^{C3}$ | N |
| $L_{A2577}$ | $R^{A57}$ | $R^{A57}$ | $R^{C3}$ | N |
| $L_{A2578}$ | $R^{B3}$ | $R^{B1}$ | $R^{C3}$ | N |
| $L_{A2579}$ | $R^{B4}$ | $R^{B1}$ | $R^{C3}$ | N |
| $L_{A2580}$ | $R^{B5}$ | $R^{B1}$ | $R^{C3}$ | N |
| $L_{A2581}$ | $R^{B7}$ | $R^{B1}$ | $R^{C3}$ | N |
| $L_{A2582}$ | $R^{A3}$ | $R^{B1}$ | $R^{C3}$ | N |
| $L_{A2583}$ | $R^{A34}$ | $R^{B1}$ | $R^{C3}$ | N |
| $L_{A2584}$ | $R^{A57}$ | $R^{B1}$ | $R^{C3}$ | N |
| $L_{A2585}$ | $R^{B1}$ | $R^{B3}$ | $R^{C3}$ | N |
| $L_{A2586}$ | $R^{B1}$ | $R^{B4}$ | $R^{C3}$ | N |
| $L_{A2587}$ | $R^{B1}$ | $R^{B5}$ | $R^{C3}$ | N |
| $L_{A2588}$ | $R^{B1}$ | $R^{B7}$ | $R^{C3}$ | N |
| $L_{A2589}$ | $R^{B1}$ | $R^{A3}$ | $R^{C3}$ | N |
| $L_{A2590}$ | $R^{B1}$ | $R^{A34}$ | $R^{C3}$ | N |
| $L_{A2591}$ | $R^{B1}$ | $R^{A57}$ | $R^{C3}$ | N |
| $L_{A2592}$ | $R^{B1}$ | H | $R^{C8}$ | N |
| $L_{A2593}$ | $R^{B3}$ | H | $R^{C8}$ | N |
| $L_{A2594}$ | $R^{B4}$ | H | $R^{C8}$ | N |
| $L_{A2595}$ | $R^{B5}$ | H | $R^{C8}$ | N |
| $L_{A2596}$ | $R^{B7}$ | H | $R^{C8}$ | N |
| $L_{A2597}$ | $R^{A3}$ | H | $R^{C8}$ | N |
| $L_{A2598}$ | $R^{A34}$ | H | $R^{C8}$ | N |
| $L_{A2599}$ | $R^{A57}$ | H | $R^{C8}$ | N |
| $L_{A2600}$ | H | $R^{B1}$ | $R^{C8}$ | N |
| $L_{A2601}$ | H | $R^{B3}$ | $R^{C8}$ | N |
| $L_{A2602}$ | H | $R^{B4}$ | $R^{C8}$ | N |
| $L_{A2603}$ | H | $R^{B5}$ | $R^{C8}$ | N |
| $L_{A2604}$ | H | $R^{B7}$ | $R^{C8}$ | N |
| $L_{A2605}$ | H | $R^{A3}$ | $R^{C8}$ | N |
| $L_{A2606}$ | H | $R^{A34}$ | $R^{C8}$ | N |
| $L_{A2607}$ | H | $R^{A57}$ | $R^{C8}$ | N |
| $L_{A2608}$ | $R^{B1}$ | $R^{B1}$ | $R^{C8}$ | N |
| $L_{A2609}$ | $R^{B3}$ | $R^{B3}$ | $R^{C8}$ | N |
| $L_{A2610}$ | $R^{B4}$ | $R^{B4}$ | $R^{C8}$ | N |
| $L_{A2611}$ | $R^{B5}$ | $R^{B5}$ | $R^{C8}$ | N |
| $L_{A2612}$ | $R^{B7}$ | $R^{B7}$ | $R^{C8}$ | N |
| $L_{A2613}$ | $R^{A3}$ | $R^{A3}$ | $R^{C8}$ | N |

-continued

| Ligand | $R^3$ | $R^4$ | G | X |
|---|---|---|---|---|
| $L_{A2614}$ | $R^{A34}$ | $R^{A34}$ | $R^{C8}$ | N |
| $L_{A2615}$ | $R^{A57}$ | $R^{A57}$ | $R^{C8}$ | N |
| $L_{A2616}$ | $R^{B3}$ | $R^{B1}$ | $R^{C8}$ | N |
| $L_{A2617}$ | $R^{B4}$ | $R^{B1}$ | $R^{C8}$ | N |
| $L_{A2618}$ | $R^{B5}$ | $R^{B1}$ | $R^{C8}$ | N |
| $L_{A2619}$ | $R^{B7}$ | $R^{B1}$ | $R^{C8}$ | N |
| $L_{A2620}$ | $R^{A3}$ | $R^{B1}$ | $R^{C8}$ | N |
| $L_{A2621}$ | $R^{A34}$ | $R^{B1}$ | $R^{C8}$ | N |
| $L_{A2622}$ | $R^{A57}$ | $R^{B1}$ | $R^{C8}$ | N |
| $L_{A2623}$ | $R^{B1}$ | $R^{B3}$ | $R^{C8}$ | N |
| $L_{A2624}$ | $R^{B1}$ | $R^{B4}$ | $R^{C8}$ | N |
| $L_{A2625}$ | $R^{B1}$ | $R^{B5}$ | $R^{C8}$ | N |
| $L_{A2626}$ | $R^{B1}$ | $R^{B7}$ | $R^{C8}$ | N |
| $L_{A2627}$ | $R^{B1}$ | $R^{A3}$ | $R^{C8}$ | N |
| $L_{A2628}$ | $R^{B1}$ | $R^{A34}$ | $R^{C8}$ | N |
| $L_{A2629}$ | $R^{B1}$ | $R^{A57}$ | $R^{C8}$ | N |
| $L_{A2630}$ | $R^{B1}$ | H | $R^{C9}$ | N |
| $L_{A2631}$ | $R^{B3}$ | H | $R^{C9}$ | N |
| $L_{A2632}$ | $R^{B4}$ | H | $R^{C9}$ | N |
| $L_{A2633}$ | $R^{B5}$ | H | $R^{C9}$ | N |
| $L_{A2634}$ | $R^{B7}$ | H | $R^{C9}$ | N |
| $L_{A2635}$ | $R^{A3}$ | H | $R^{C9}$ | N |
| $L_{A2636}$ | $R^{A34}$ | H | $R^{C9}$ | N |
| $L_{A2637}$ | $R^{A57}$ | H | $R^{C9}$ | N |
| $L_{A2638}$ | H | $R^{B1}$ | $R^{C9}$ | N |
| $L_{A2639}$ | H | $R^{B3}$ | $R^{C9}$ | N |
| $L_{A2640}$ | H | $R^{B4}$ | $R^{C9}$ | N |
| $L_{A2641}$ | H | $R^{B5}$ | $R^{C9}$ | N |
| $L_{A2642}$ | H | $R^{B7}$ | $R^{C9}$ | N |
| $L_{A2643}$ | H | $R^{A3}$ | $R^{C9}$ | N |
| $L_{A2644}$ | H | $R^{A34}$ | $R^{C9}$ | N |
| $L_{A2645}$ | H | $R^{A57}$ | $R^{C9}$ | N |
| $L_{A2646}$ | $R^{B1}$ | $R^{B1}$ | $R^{C9}$ | N |
| $L_{A2647}$ | $R^{B3}$ | $R^{B3}$ | $R^{C9}$ | N |
| $L_{A2648}$ | $R^{B4}$ | $R^{B4}$ | $R^{C9}$ | N |
| $L_{A2649}$ | $R^{B5}$ | $R^{B5}$ | $R^{C9}$ | N |
| $L_{A2650}$ | $R^{B7}$ | $R^{B7}$ | $R^{C9}$ | N |
| $L_{A2651}$ | $R^{A3}$ | $R^{A3}$ | $R^{C9}$ | N |
| $L_{A2652}$ | $R^{A34}$ | $R^{A34}$ | $R^{C9}$ | N |
| $L_{A2653}$ | $R^{A57}$ | $R^{A57}$ | $R^{C9}$ | N |
| $L_{A2654}$ | $R^{B3}$ | $R^{B1}$ | $R^{C9}$ | N |
| $L_{A2655}$ | $R^{B4}$ | $R^{B1}$ | $R^{C9}$ | N |
| $L_{A2656}$ | $R^{B5}$ | $R^{B1}$ | $R^{C9}$ | N |
| $L_{A2657}$ | $R^{B7}$ | $R^{B1}$ | $R^{C9}$ | N |
| $L_{A2658}$ | $R^{A3}$ | $R^{B1}$ | $R^{C9}$ | N |
| $L_{A2659}$ | $R^{A34}$ | $R^{B1}$ | $R^{C9}$ | N |
| $L_{A2660}$ | $R^{A57}$ | $R^{B1}$ | $R^{C9}$ | N |
| $L_{A2661}$ | $R^{B1}$ | $R^{B3}$ | $R^{C9}$ | N |
| $L_{A2662}$ | $R^{B1}$ | $R^{B4}$ | $R^{C9}$ | N |
| $L_{A2663}$ | $R^{B1}$ | $R^{B5}$ | $R^{C9}$ | N |
| $L_{A2664}$ | $R^{B1}$ | $R^{B7}$ | $R^{C9}$ | N |
| $L_{A2665}$ | $R^{B1}$ | $R^{A3}$ | $R^{C9}$ | N |
| $L_{A2666}$ | $R^{B1}$ | $R^{A34}$ | $R^{C9}$ | N |
| $L_{A2667}$ | $R^{B1}$ | $R^{A57}$ | $R^{C9}$ | N |

wherein $R^{A1}$ to $R^{A51}$ have the following structures:

$R^{A1}$

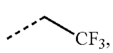

$R^{A2}$

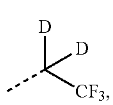

$R^{A3}$

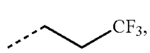

$R^{A4}$

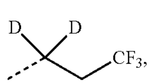

-continued $R^{A5}$

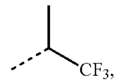

$R^{A6}$

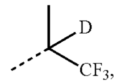

$R^{A7}$

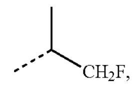

$R^{A8}$

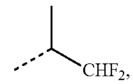

$R^{A9}$

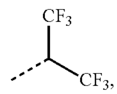

$R^{A10}$

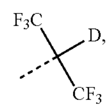

$R^{A11}$

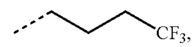

$R^{A12}$

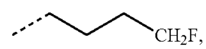

$R^{A13}$

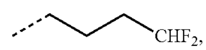

$R^{A14}$

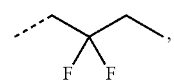

$R^{A15}$

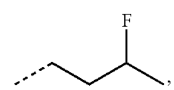

$R^{A16}$

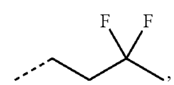

$R^{A17}$

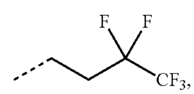

$R^{A18}$

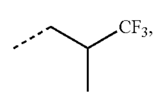

$R^{A19}$

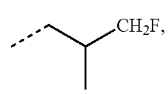

$R^{A20}$

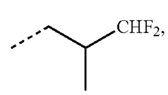

$R^{A21}$

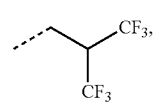

-continued
$R^{A22}$
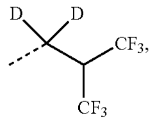
$R^{A23}$
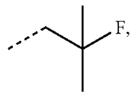
$R^{A24}$
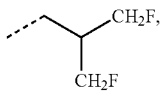
$R^{A25}$
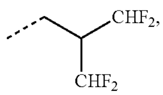
$R^{A26}$
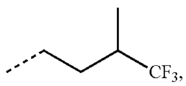
$R^{A27}$
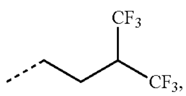
$R^{A28}$
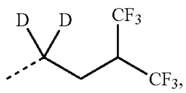
$R^{A29}$
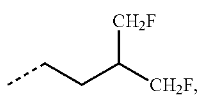
$R^{A30}$
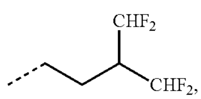
$R^{A31}$
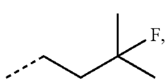
$R^{A32}$
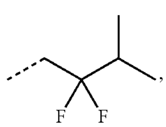
$R^{A33}$
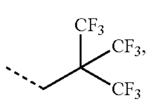
$R^{A34}$
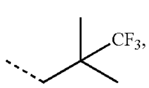
$R^{A35}$
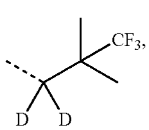
-continued
$R^{A36}$
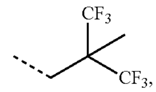
$R^{A37}$
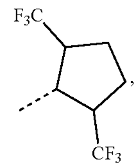
$R^{A38}$
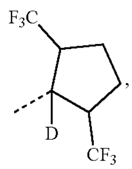
$R^{A39}$
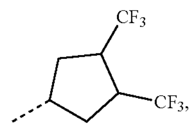
$R^{A40}$
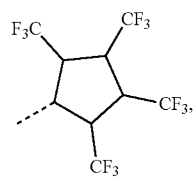
$R^{A41}$
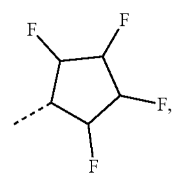
$R^{A42}$
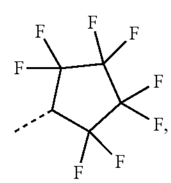
$R^{A43}$
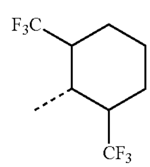
$R^{A44}$
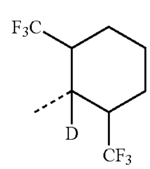

-continued
$R^{A45}$
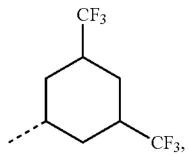
$R^{A46}$
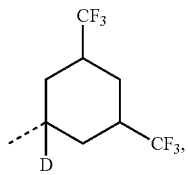
$R^{A47}$
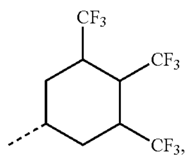
$R^{A48}$
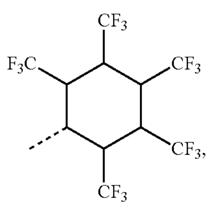
$R^{A49}$
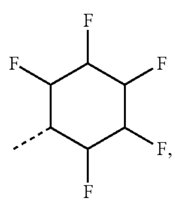
$R^{A50}$
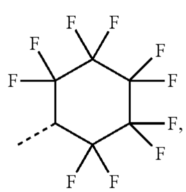
$R^{A51}$
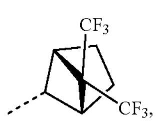
$R^{A52}$
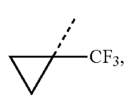
$R^{A53}$
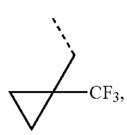
$R^{A54}$
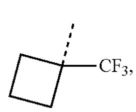
-continued
$R^{A55}$
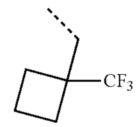
$R^{A56}$
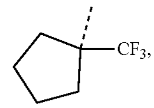
$R^{A57}$
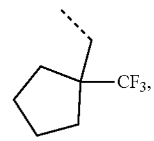
$R^{A58}$
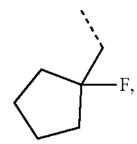
$R^{A59}$
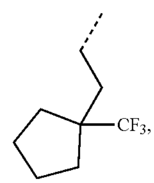
$R^{A60}$
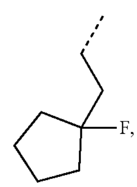
$R^{A61}$
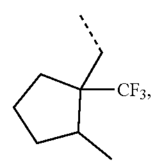
$R^{A62}$
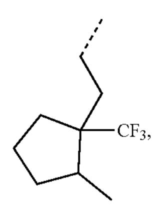
$R^{A63}$
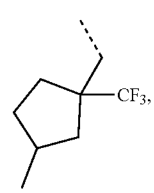

-continued
$R^{A64}$
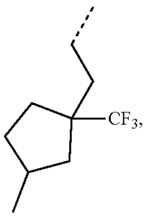
$R^{A65}$
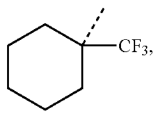
$R^{A66}$
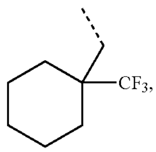
$R^{A67}$
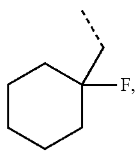
$R^{A68}$
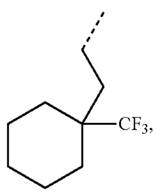
$R^{A69}$
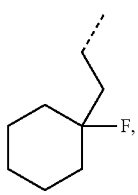
$R^{A70}$
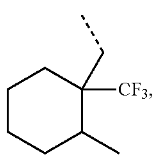
$R^{A71}$
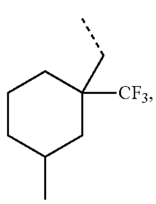
$R^{A72}$
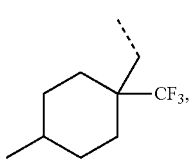
and
-continued
$R^{A73}$
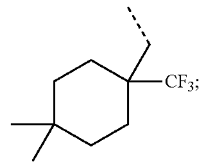
wherein $R^{B1}$ to $R^{B42}$ have the following structures:
$R^{B1}$
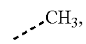
$R^{B2}$
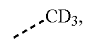
$R^{B3}$
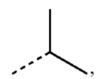
$R^{B4}$
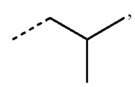
$R^{B5}$
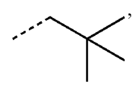
$R^{B6}$
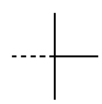
$R^{B7}$
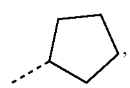
$R^{B8}$
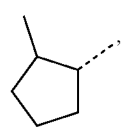
$R^{B9}$
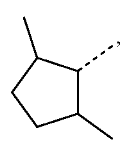
$R^{B10}$
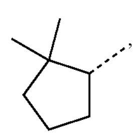
$R^{B11}$
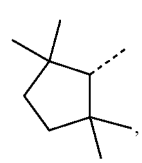

$R^{B12}$
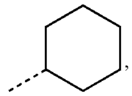
$R^{B13}$
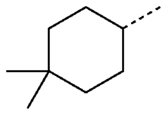
$R^{B14}$
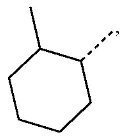
$R^{B15}$
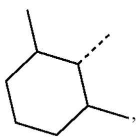
$R^{B16}$
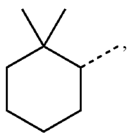
$R^{B17}$
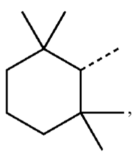
$R^{B18}$
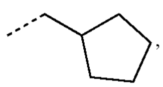
$R^{B19}$
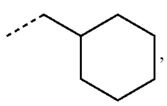
$R^{B20}$
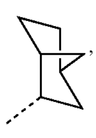
$R^{B21}$
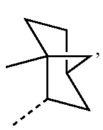
$R^{B22}$
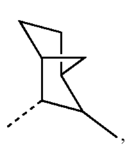
$R^{B23}$
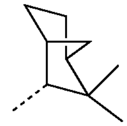
$R^{B24}$
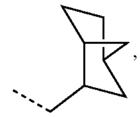
$R^{B25}$
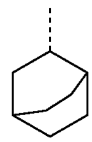
$R^{B26}$
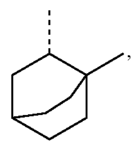
$R^{B27}$
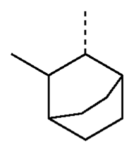
$R^{B28}$
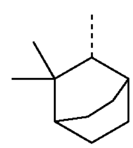
$R^{B29}$
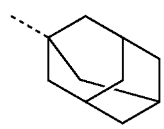
$R^{B30}$
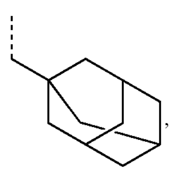
$R^{B31}$
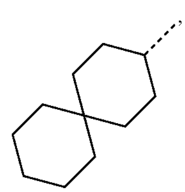

-continued
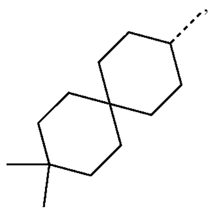
$R^{B32}$
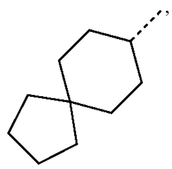
$R^{B33}$
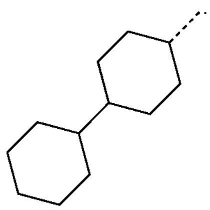
$R^{B34}$
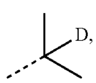
$R^{B35}$
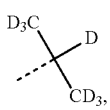
$R^{B36}$
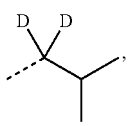
$R^{B37}$
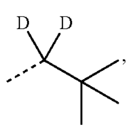
$R^{B38}$
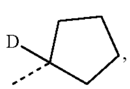
$R^{B39}$
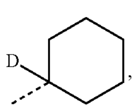
$R^{B40}$
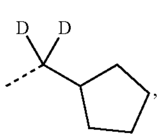
$R^{B41}$
and
-continued
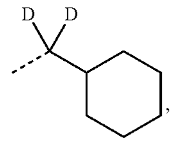
$R^{B42}$
and
wherein $R^{C1}$ to $R^{C19}$ have the following structures:
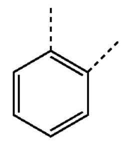
$R^{C1}$
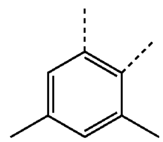
$R^{C2}$
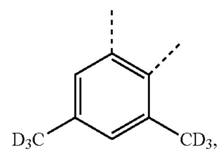
$R^{C3}$
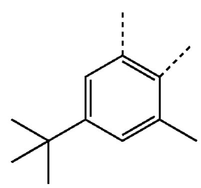
$R^{C4}$
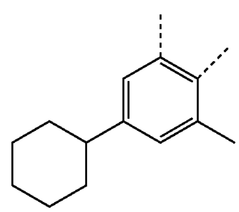
$R^{C5}$
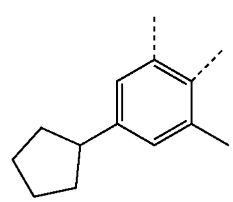
$R^{C6}$
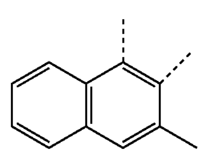
$R^{C7}$ -continued $R^{C8}$

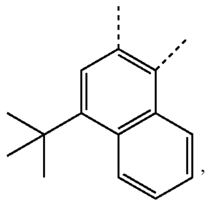

$R^{C9}$

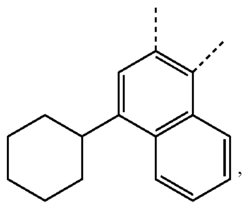

$R^{C10}$

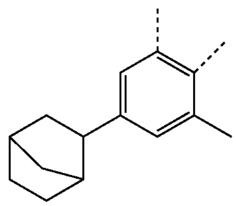

$R^{C11}$

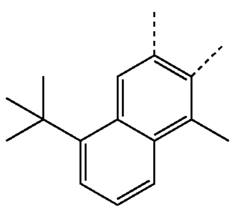

$R^{C12}$

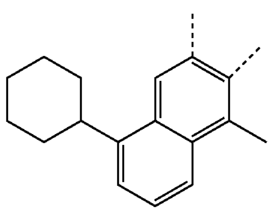

$R^{C13}$

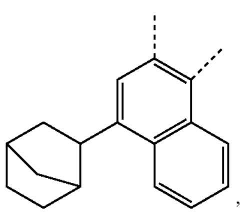

$R^{C14}$

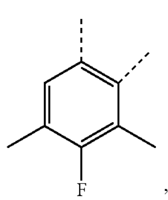

-continued $R^{C15}$

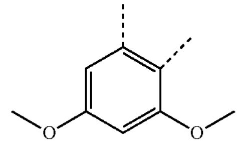

$R^{C16}$

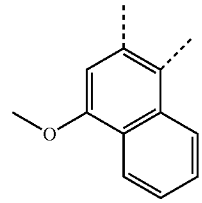

$R^{C17}$

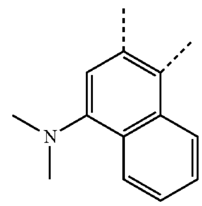

$R^{C18}$

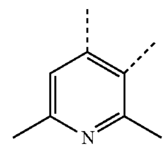

and $R^{C19}$

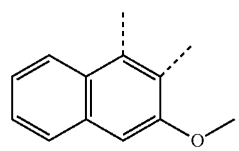

In some embodiments, the compound has a formula of $M(L_A)_x(L_B)_y(L_C)_z$ wherein $L_B$ and $L_C$ are each a bidentate ligand; and wherein x is 1, 2, or 3; y is 0, 1, or 2; z is 0, 1, or 2; and x+y+z is the oxidation state of the metal M.

In some embodiment where the compound has a formula of $M(L_A)_x(L_B)_y(L_C)_z$, the compound has a formula selected from the group consisting of $Ir(L_A)_3$, $Ir(L_A)(L_B)_2$, $Ir(L_A)_2(L_B)$, $Ir(L_A)_2(L_C)$, and $Ir(L_A)(L_B)(L_C)$; and wherein $L_A$, $L_B$, and $L_C$ are different from each other.

In some embodiment where the compound has a formula of $M(L_A)_x(L_B)_y(L_C)_z$, the compound has a formula of $Pt(L_A)(L_B)$; and wherein $L_A$ and $L_B$ can be same or different. In some such embodiments, $L_A$ and $L_B$ am connected to form a tetradentate ligand. In some such embodiments, $L_A$ and $L_B$ are connected at two places to form a macrocyclic tetradentate ligand.

In some embodiment where the compound has a formula of $M(L_A)_x(L_B)_y(L_C)_z$, $L_B$ and $L_C$ are each independently selected from the group consisting of:

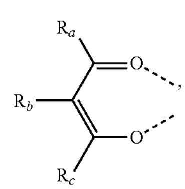

-continued
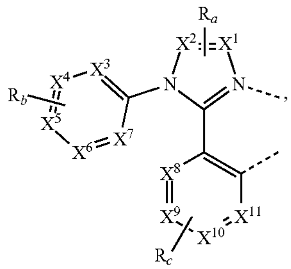
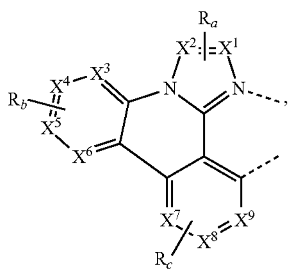
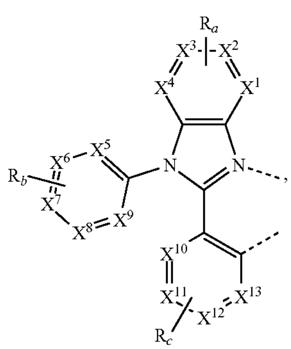
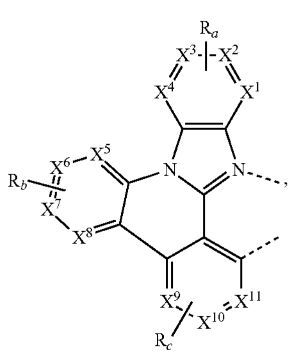
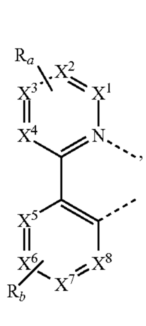
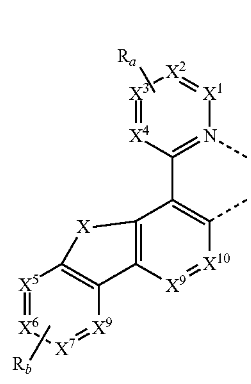
-continued
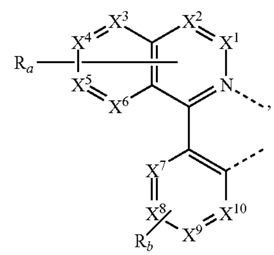
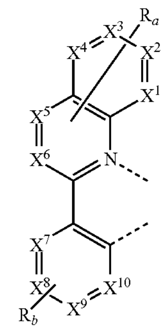
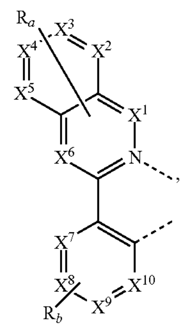
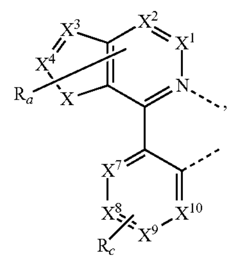
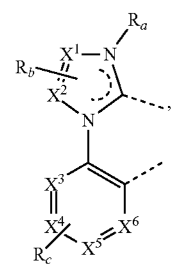
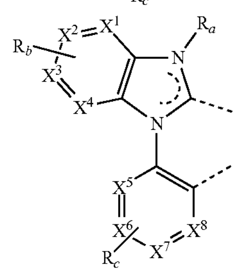
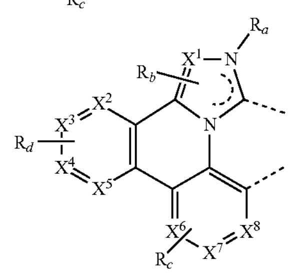
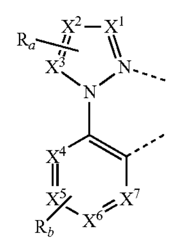
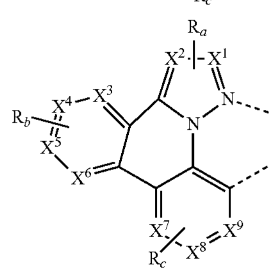
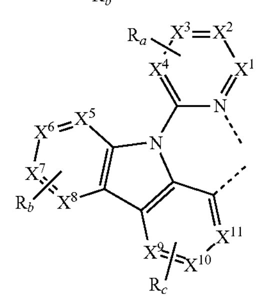
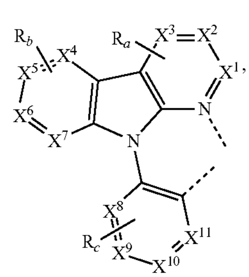
and -continued

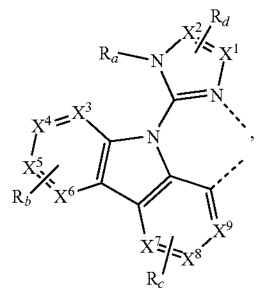

wherein:

each $X^1$ to $X^{13}$ are independently selected from the group consisting of carbon and nitrogen, X is selected from the group consisting of BR', NR', PR', O, S, Se, C═O, S═O, $SO_2$, CR'R", SiR'R", and GeR'R";

R' and R" are optionally fused or joined to form a ring;

each $R_a$, $R_b$, $R_c$, and $R_d$ may represent from mono substitution to the possible maximum number of substitution on the carbon atoms of the ring attached thereto, or no substitution;

R', R", $R_a$, $R_b$, $R_c$ and $R_d$ are each independently selected from the group consisting of hydrogen, deuterium, fluorine, alkyl, cycloalkyl, heteroalkyl, alkoxy, aryloxy, amino, silyl, alkenyl, cycloalkenyl, heteroalkenyl, aryl, heteroaryl, nitrile, isonitrile, and combinations thereof; and any two adjacent substitutents of $R_a$, $R_b$, $R_c$, and $R_d$ are optionally fused or joined to form a ring or form a multidentate ligand.

In some embodiment where the compound has a formula of $M(L_A)_x(L_B)_y(L_C)_z$, $L_B$ and $L_C$ are each independently selected from the group consisting of:

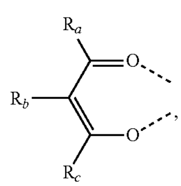

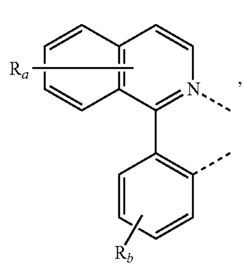

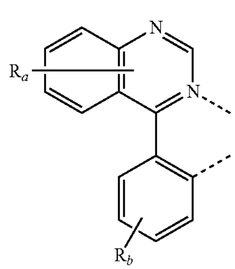

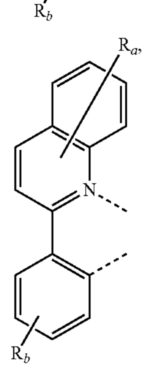

-continued

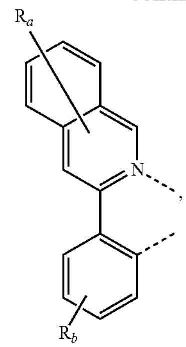

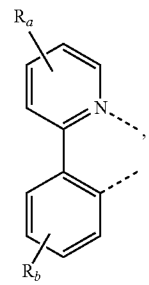

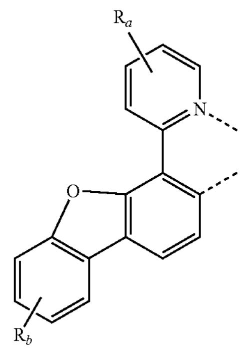

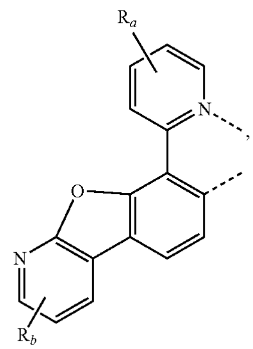

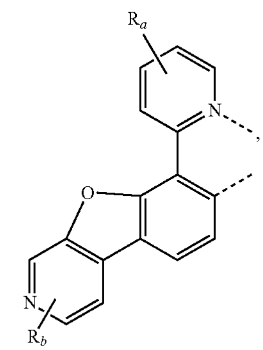

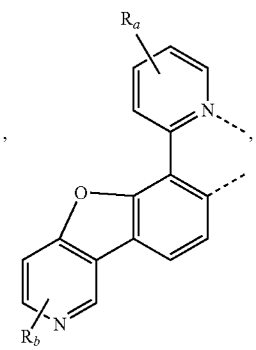

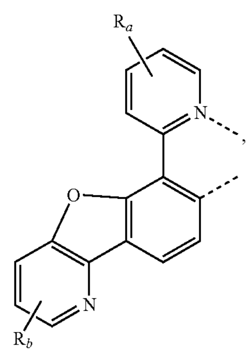

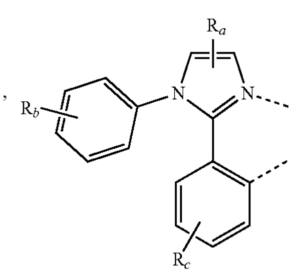

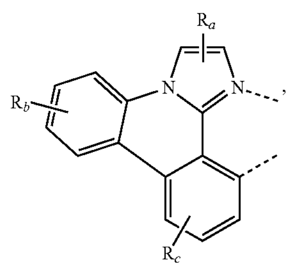

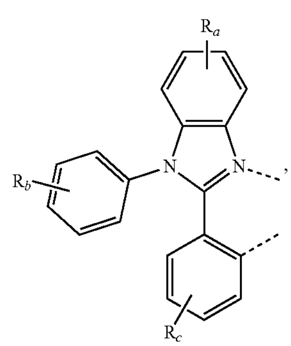

-continued

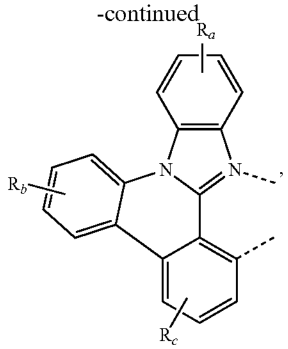

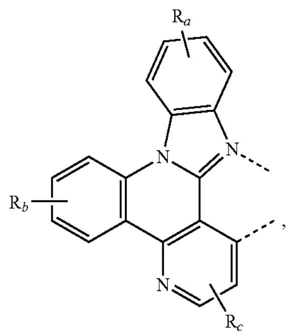

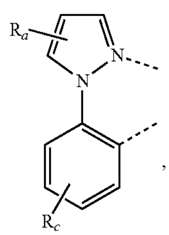

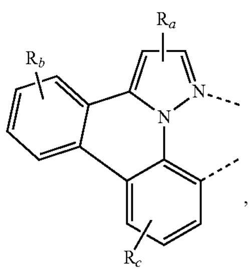

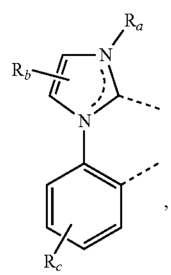

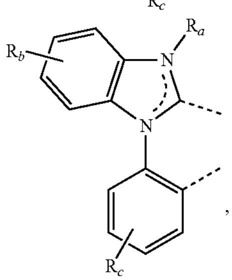

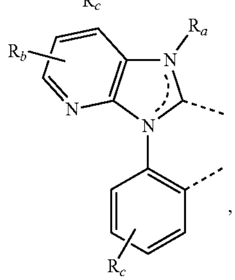

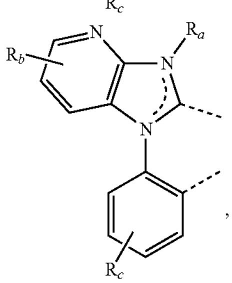

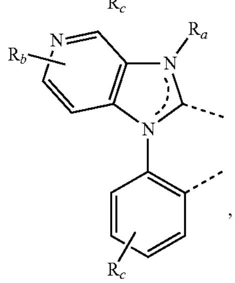

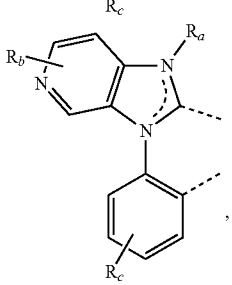

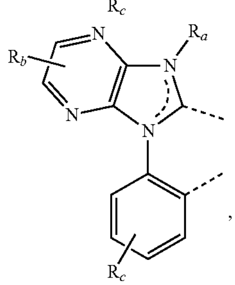

-continued

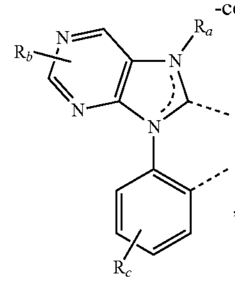

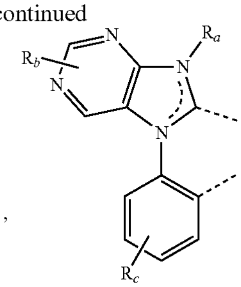

, and

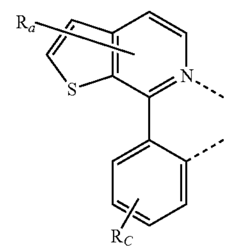

In some embodiments, the compound is the Compound Ax having the formula $Ir(L_{Ai})_3$, the Compound By having the formula $Ir(L_{Ai})(L_{Bk})_2$, or the Compound Cz having the formula $Ir(L_{Ai})_2(L_{Cj})$. In Compound Ax, Compound By, and Compound Cz, x=i, y=460i+k−460, and z=1260i+j−1260, where:

i is an integer from 1 to 2667, and k is an integer from 1 to 464, and j is an integer from 1 to 1260;

$L_{Ai}$ is as defined herein;

$L_{Bk}$ has the following structures:

$L_{B1}$

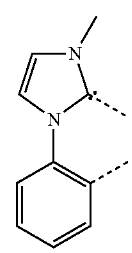

$L_{B2}$

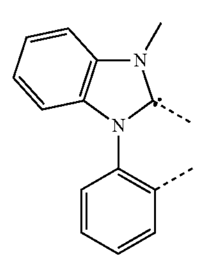

-continued
$L_{B3}$
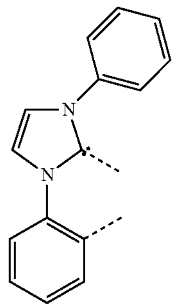
$L_{B4}$
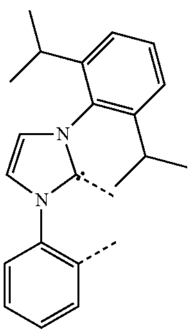
$L_{B5}$
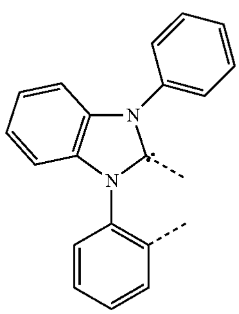
$L_{B6}$
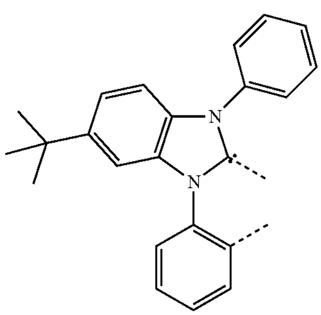
$L_{B7}$
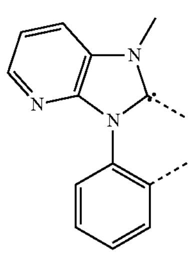
-continued
$L_{B8}$
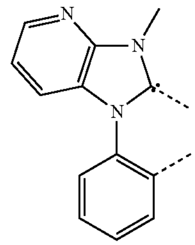
$L_{B9}$
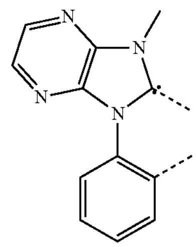
$L_{B10}$
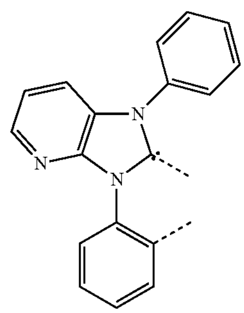
$L_{B11}$
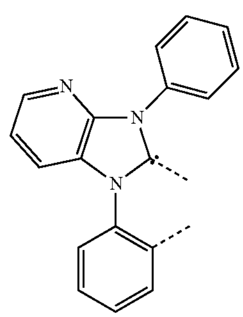
$L_{B12}$
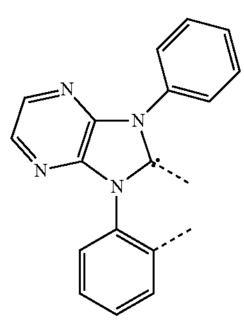

-continued
$L_{B13}$
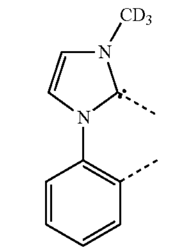
$L_{B14}$
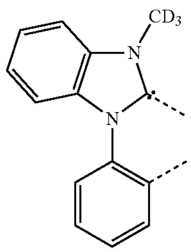
$L_{B15}$
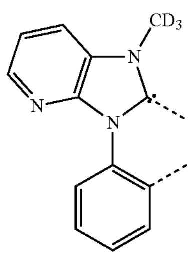
$L_{B16}$
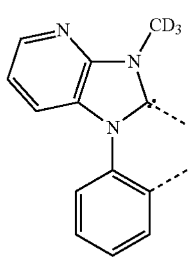
$L_{B17}$
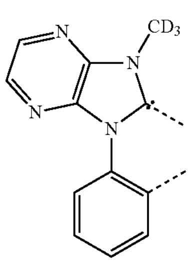
-continued
$L_{B18}$
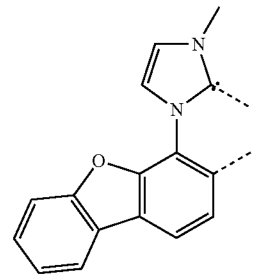
$L_{B19}$
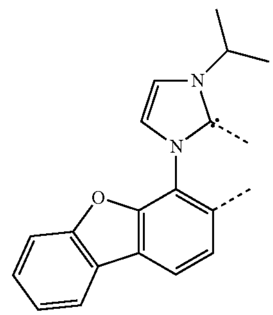
$L_{B20}$
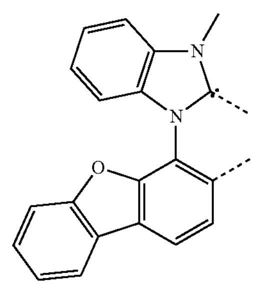
$L_{B21}$
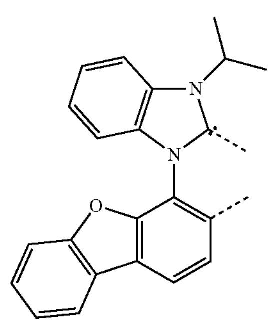
$L_{B22}$
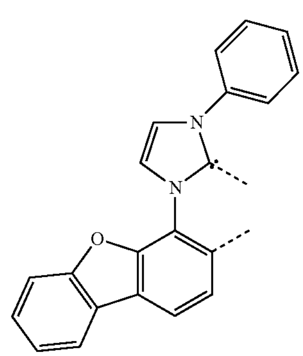

$L_{B23}$
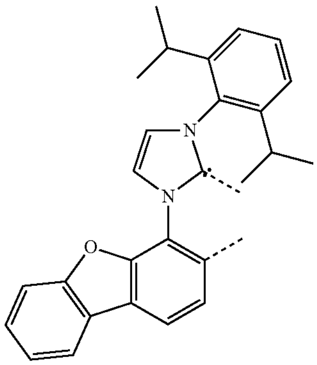
$L_{B24}$
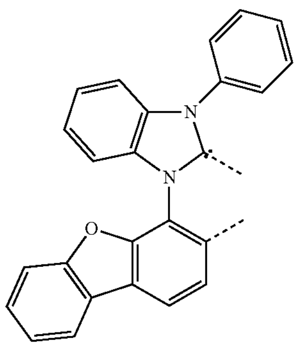
$L_{B25}$
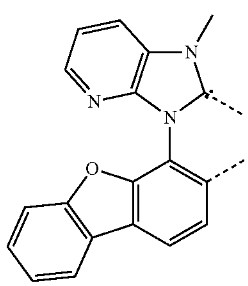
$L_{B26}$
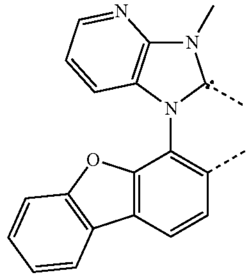
$L_{B27}$
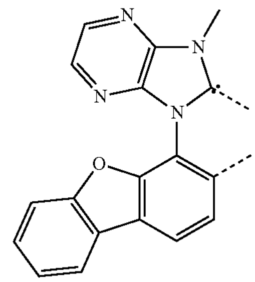
$L_{B28}$
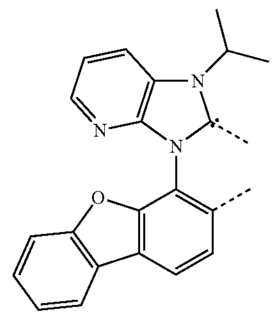
$L_{B29}$
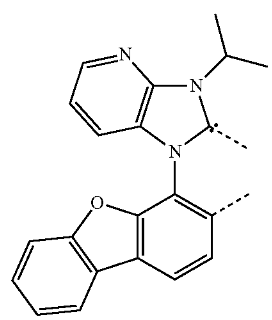
$L_{B30}$
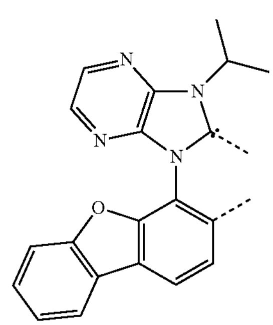

$L_{B31}$
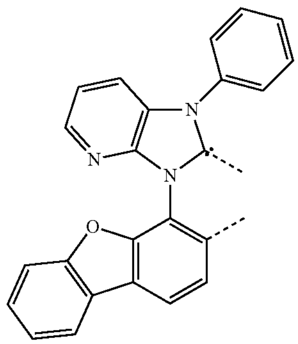
$L_{B32}$
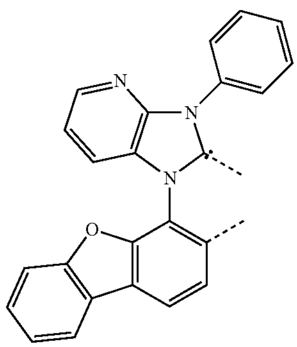
$L_{B33}$
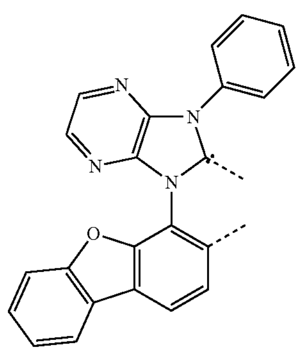
$L_{B34}$
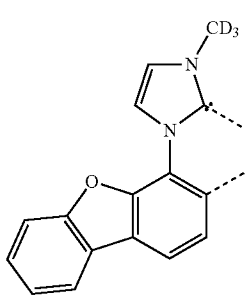
$L_{B35}$
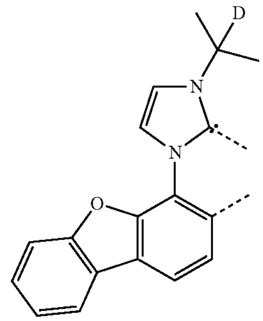
$L_{B36}$
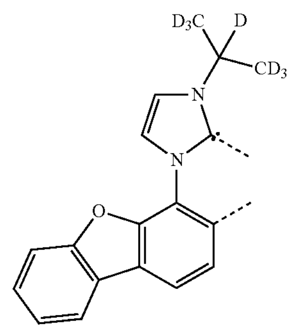
$L_{B37}$
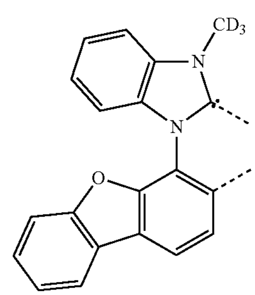
$L_{B38}$
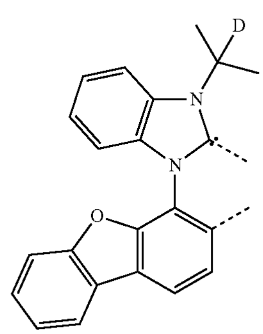

-continued
$L_{B39}$
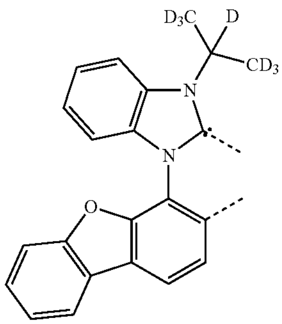
$L_{B40}$
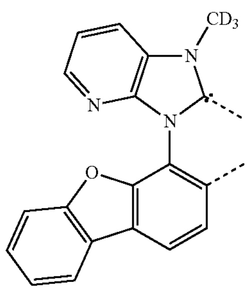
$L_{B41}$
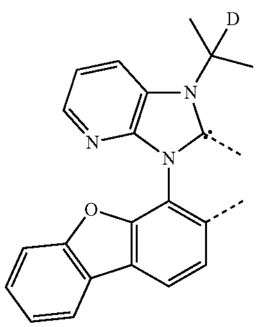
$L_{B42}$
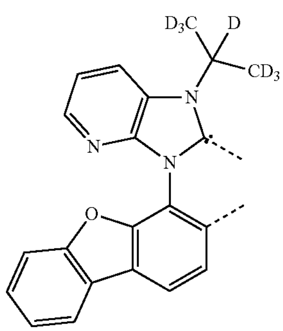
-continued
$L_{B43}$
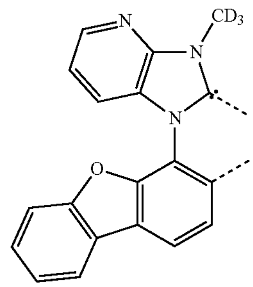
$L_{B44}$
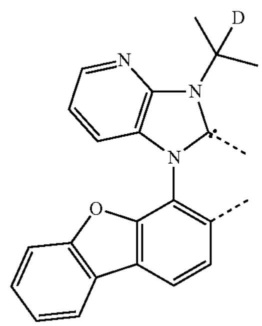
$L_{B45}$
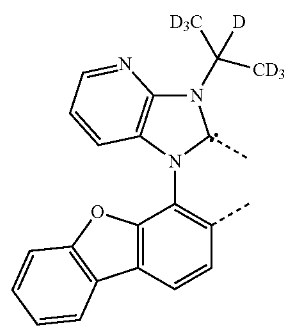
$L_{B46}$
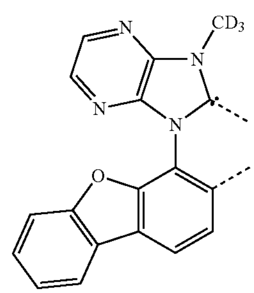
$L_{B47}$
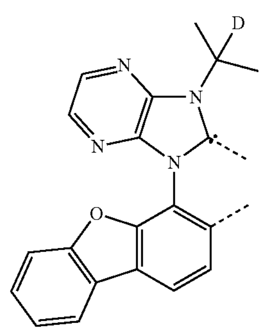

-continued
$L_{B48}$
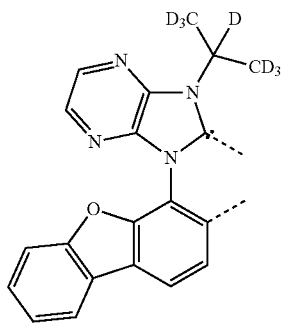
$L_{B49}$
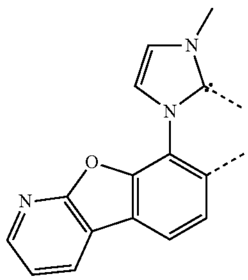
$L_{B50}$
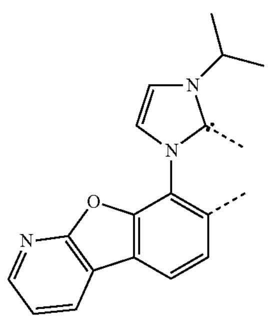
$L_{B51}$
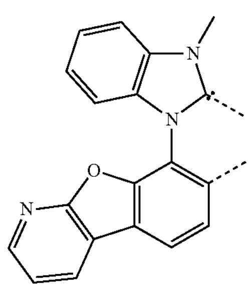
$L_{B52}$
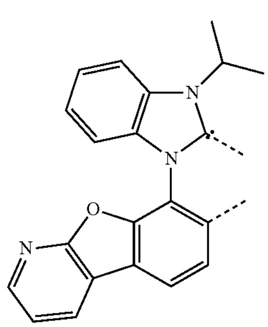
-continued
$L_{B53}$
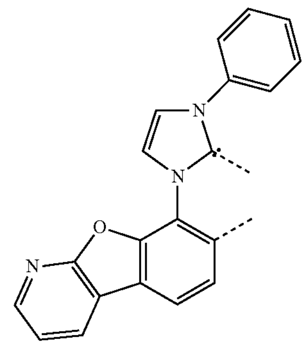
$L_{B54}$
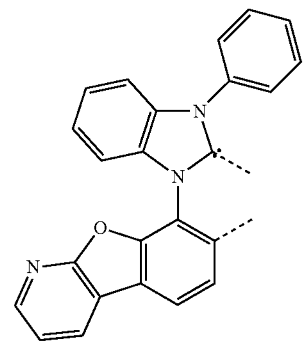
$L_{B55}$
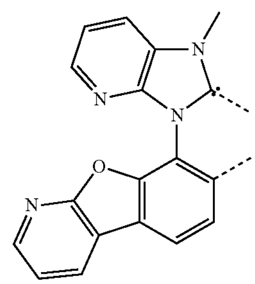
$L_{B56}$
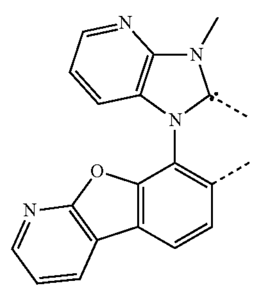
$L_{B57}$
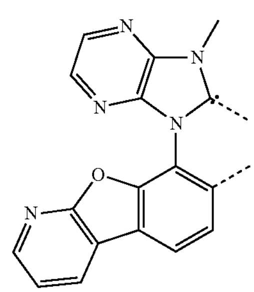

$L_{B58}$
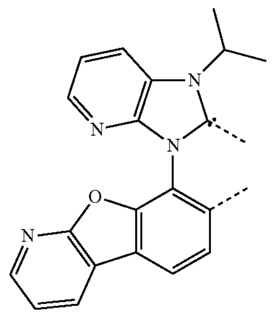
$L_{B59}$
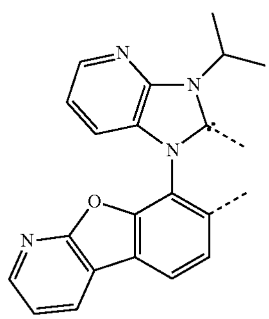
$L_{B60}$
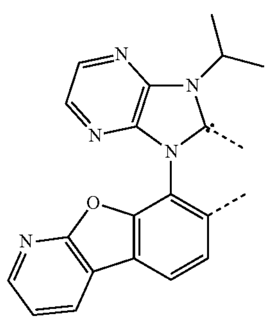
$L_{B61}$
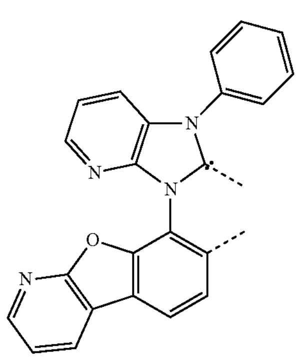
$L_{B62}$
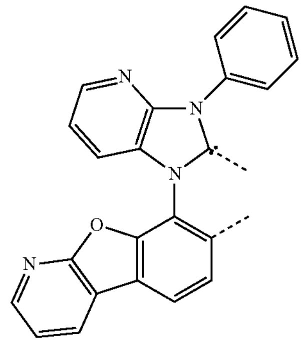
$L_{B63}$
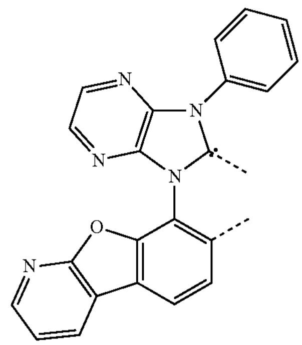
$L_{B64}$
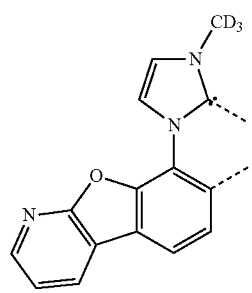
$L_{B65}$
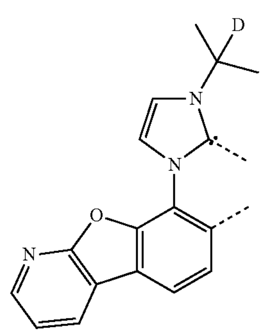

$L_{B66}$
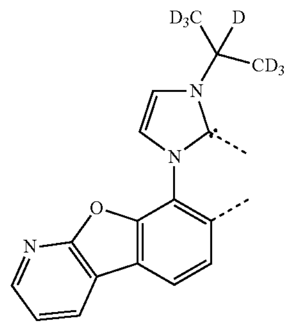
$L_{B67}$
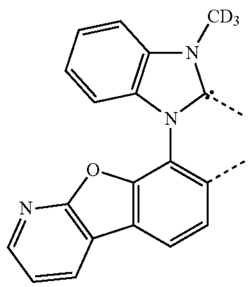
$L_{B68}$
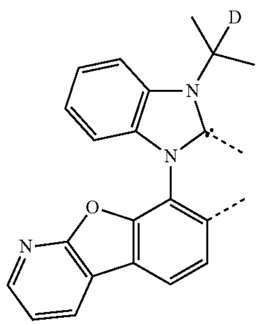
$L_{B69}$
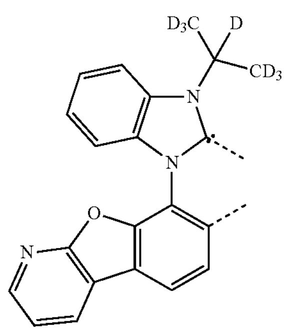
$L_{B70}$
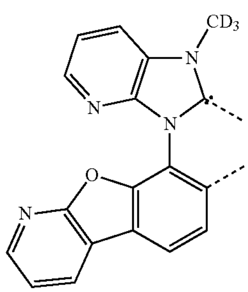
$L_{B71}$
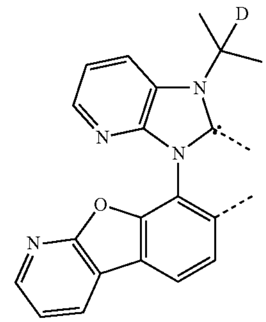
$L_{B72}$
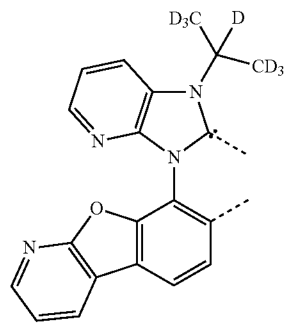
$L_{B73}$
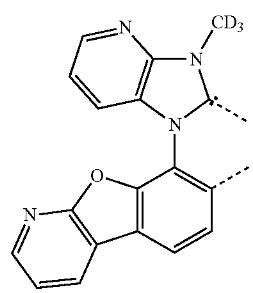
$L_{B74}$
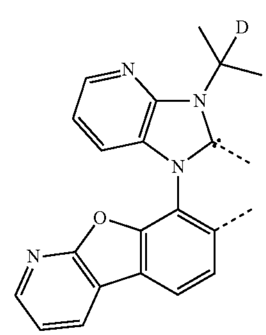

L$_{B75}$
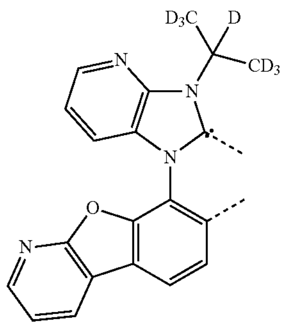
L$_{B76}$
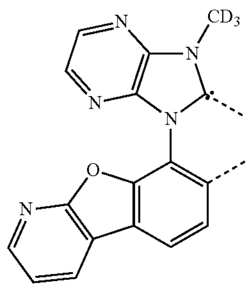
L$_{B77}$
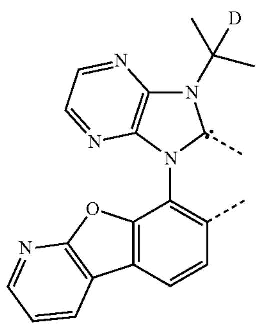
L$_{B78}$
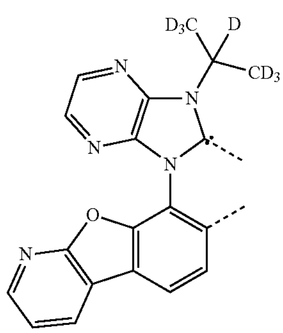
L$_{B79}$
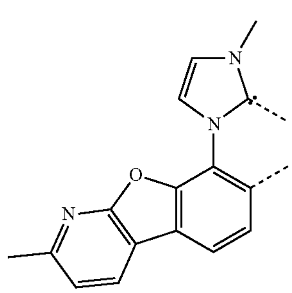
L$_{B80}$
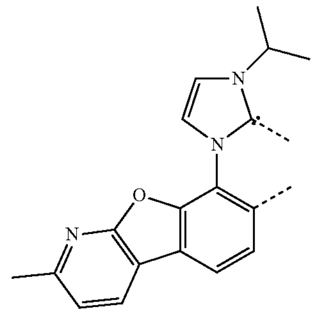
L$_{B81}$
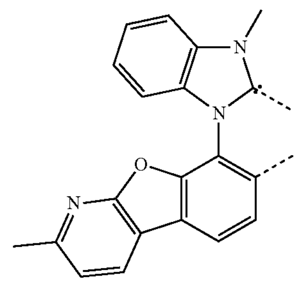
L$_{B82}$
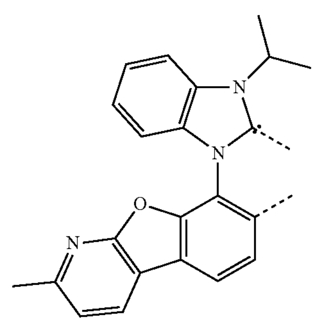
L$_{B83}$
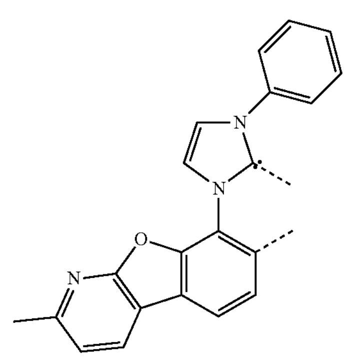

-continued
L$_{B84}$
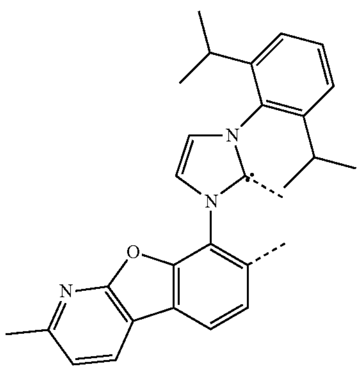
L$_{B85}$
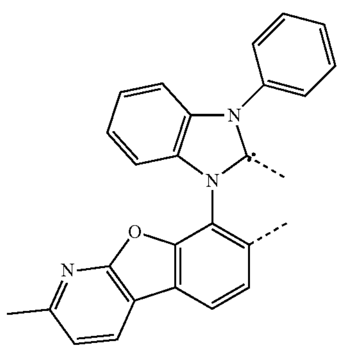
L$_{B86}$
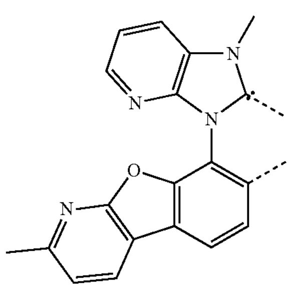
L$_{B87}$
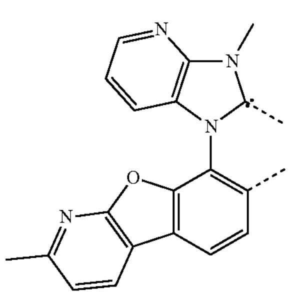
-continued
L$_{B88}$
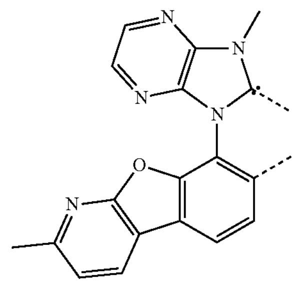
L$_{B89}$
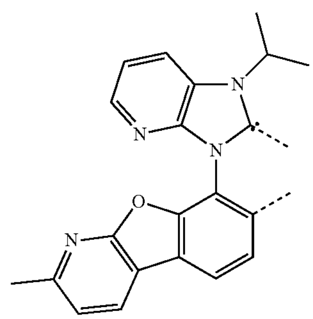
L$_{B90}$
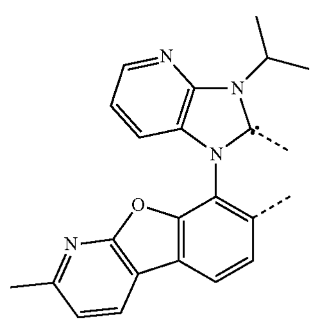
L$_{B91}$
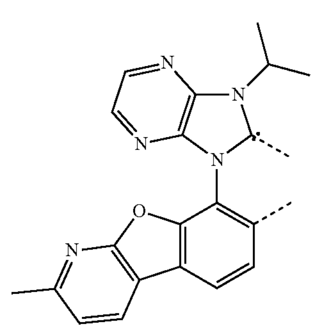

-continued
$L_{B92}$
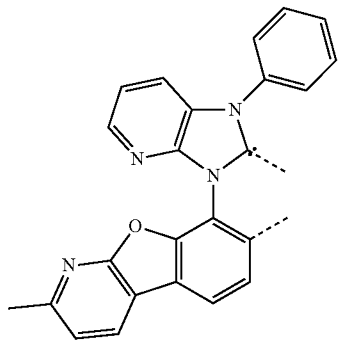
$L_{B93}$
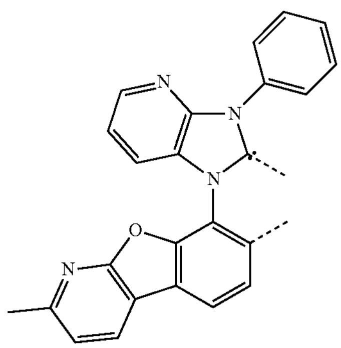
$L_{B94}$
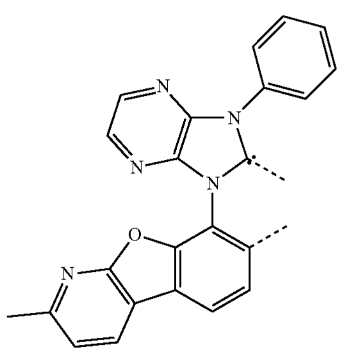
$L_{B95}$
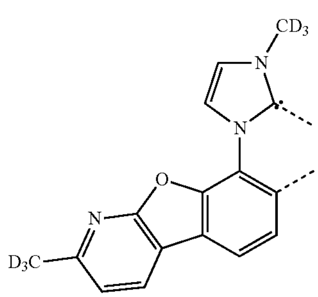
-continued
$L_{B96}$
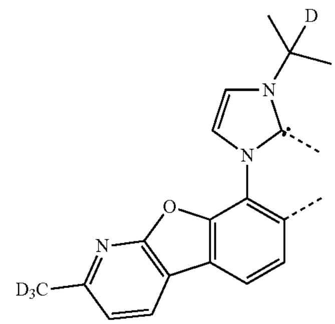
$L_{B97}$
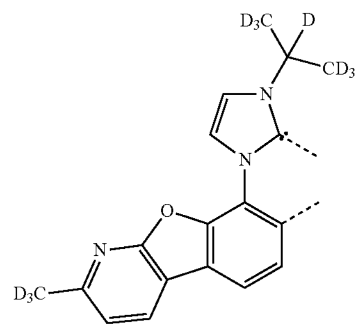
$L_{B98}$
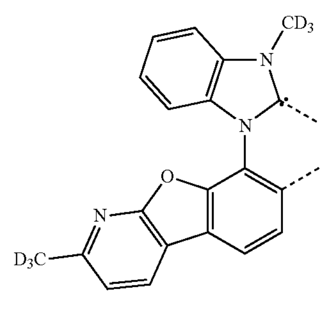
$L_{B99}$
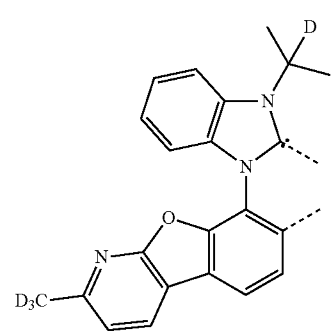

-continued
$L_{B100}$
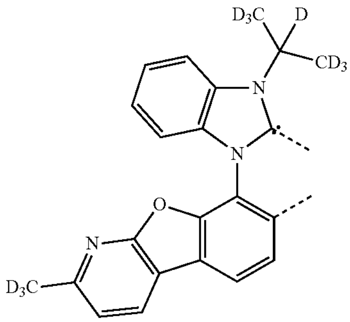
$L_{B101}$
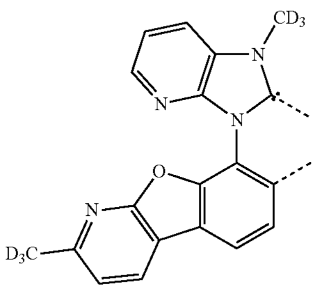
$L_{B102}$
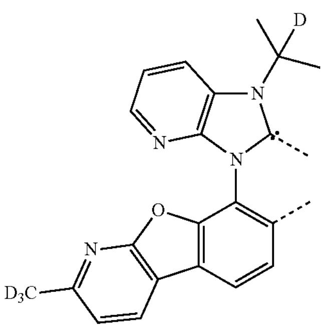
$L_{B103}$
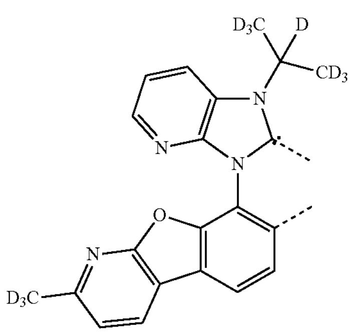
$L_{B104}$
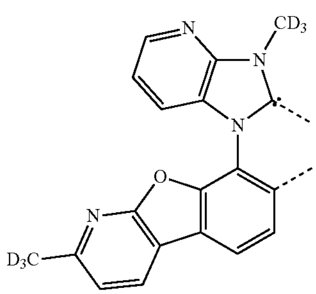
-continued
$L_{B105}$
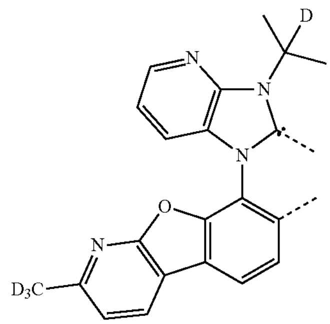
$L_{B106}$
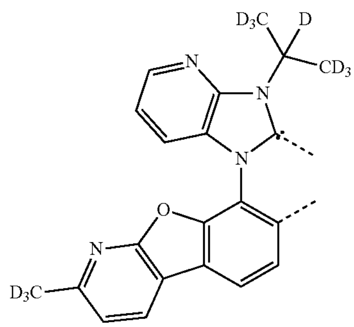
$L_{B107}$
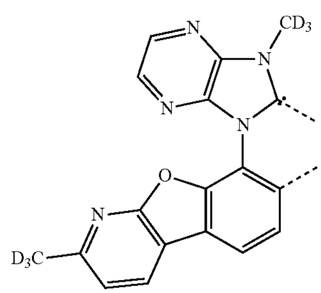
$L_{B108}$
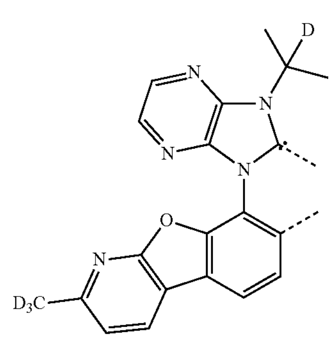

-continued
$L_{B109}$
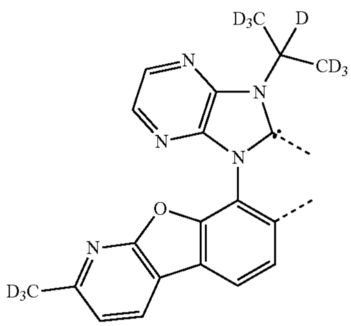
$L_{B110}$
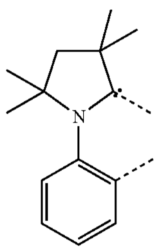
$L_{B111}$
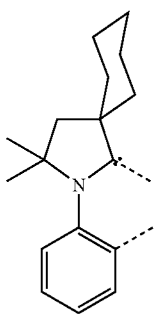
$L_{B112}$
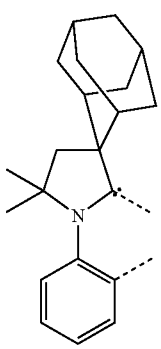
$L_{B113}$
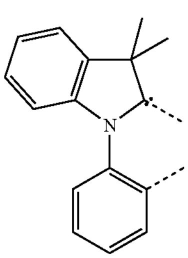
-continued
$L_{B114}$
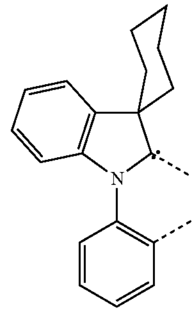
$L_{B115}$
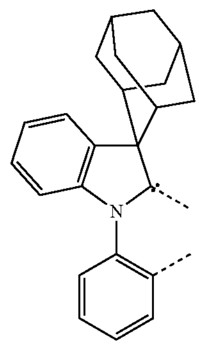
$L_{B116}$
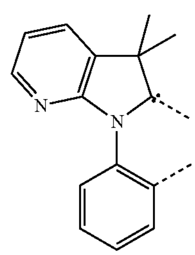
$L_{B117}$
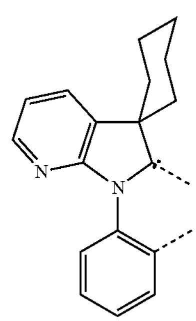

-continued
$L_{B118}$
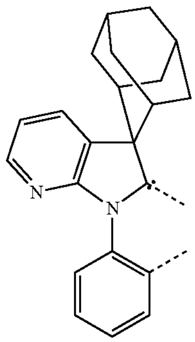
$L_{B119}$
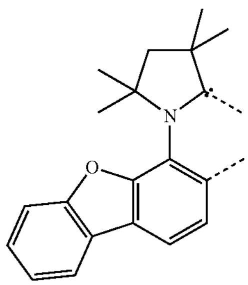
$L_{B120}$
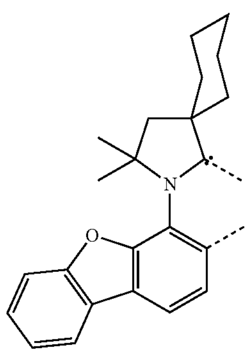
$L_{B121}$
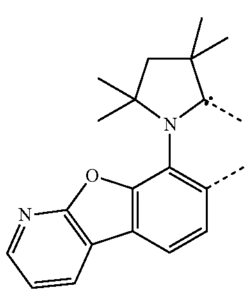
-continued
$L_{B122}$
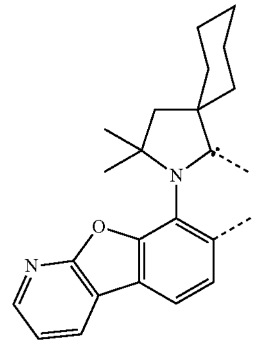
$L_{B123}$
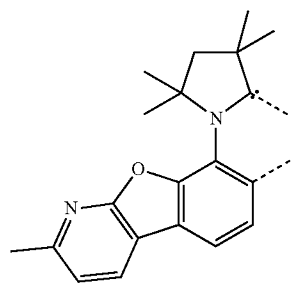
$L_{B124}$
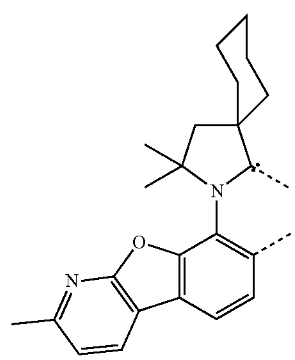
$L_{B125}$
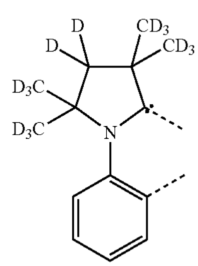

-continued
$L_{B126}$
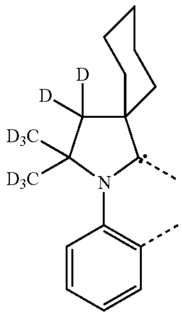
$L_{B127}$
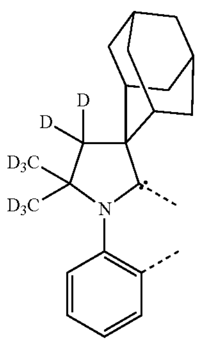
$L_{B128}$
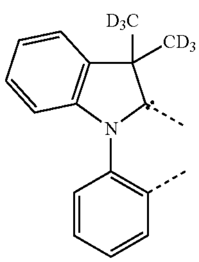
$L_{B129}$
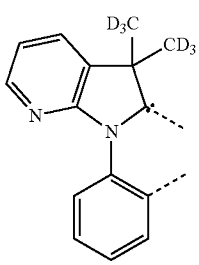
$L_{B130}$
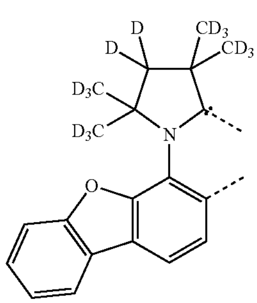
-continued
$L_{B131}$
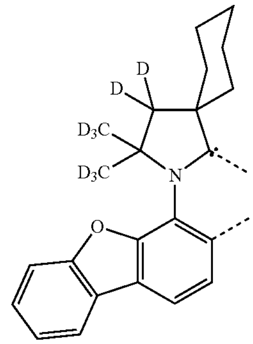
$L_{B132}$
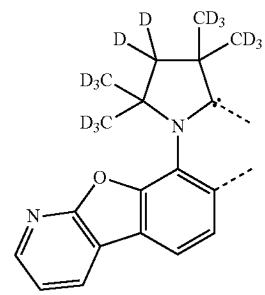
$L_{B133}$
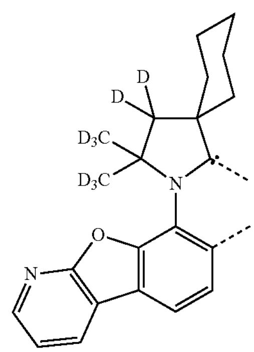
$L_{B134}$
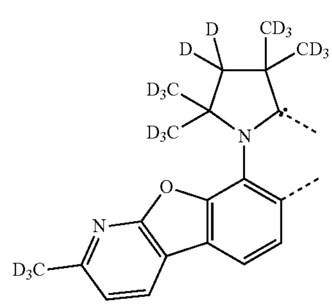

-continued
$L_{B135}$
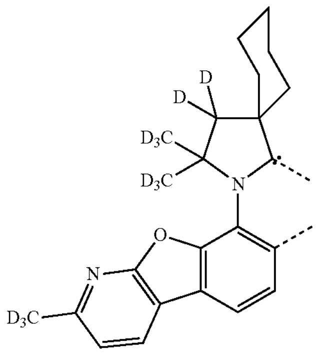
$L_{B136}$
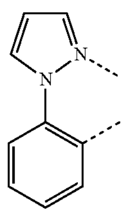
$L_{B137}$
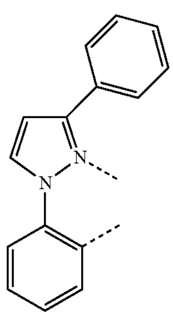
$L_{B138}$
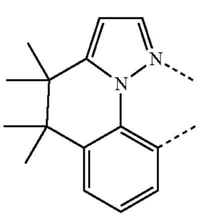
$L_{B139}$
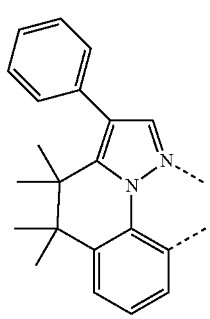
-continued
$L_{B140}$
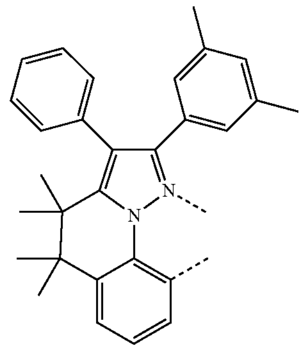
$L_{B141}$
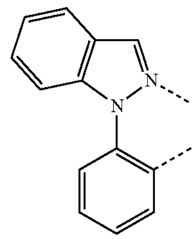
$L_{B142}$
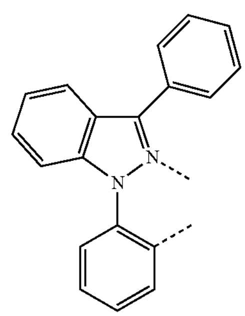
$L_{B143}$
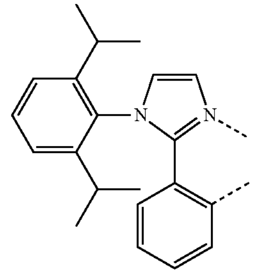
$L_{B144}$
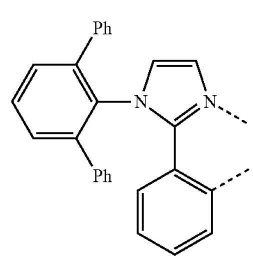

-continued
$L_{B145}$
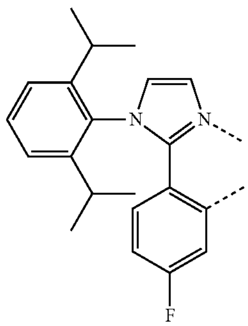
$L_{B146}$
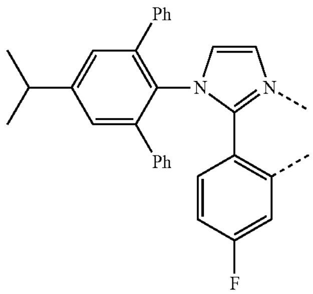
$L_{B147}$
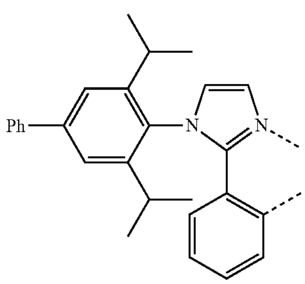
$L_{B148}$
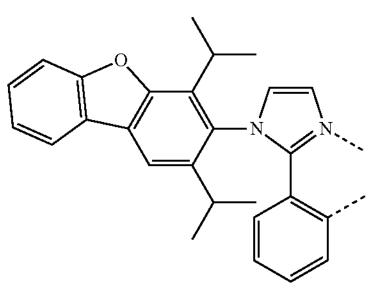
$L_{B149}$
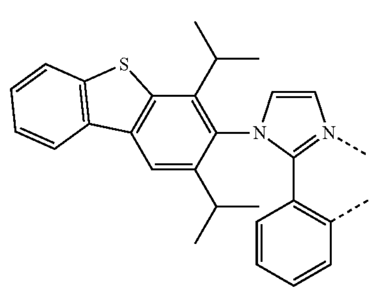
-continued
$L_{B150}$
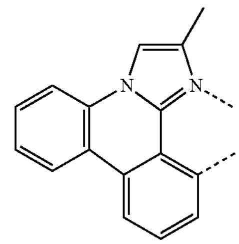
$L_{B151}$
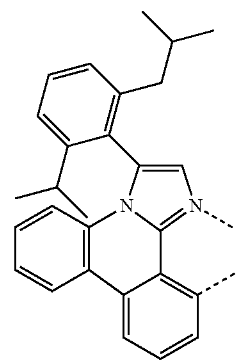
$L_{B152}$
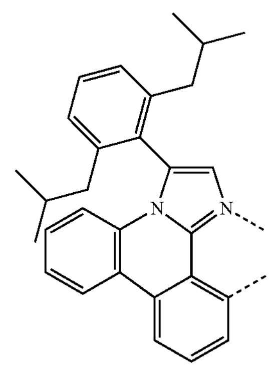
$L_{B153}$
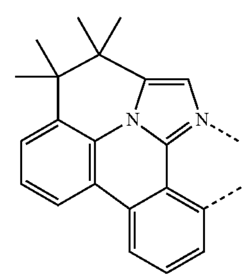
$L_{B154}$
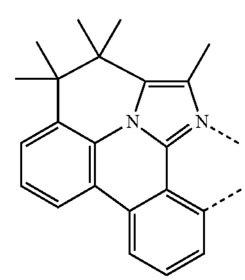

-continued
$L_{B155}$
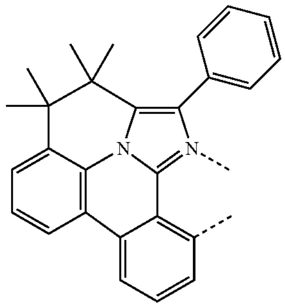
$L_{B156}$
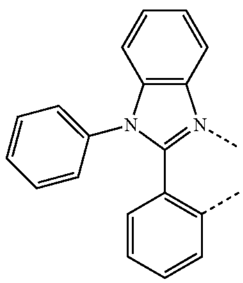
$L_{B157}$
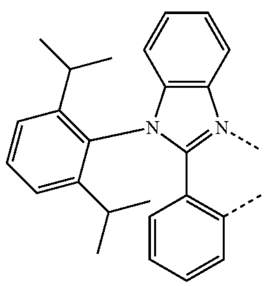
$L_{B158}$
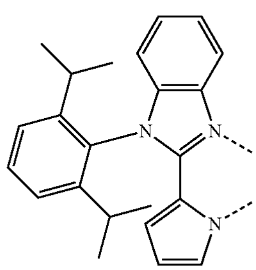
$L_{B159}$
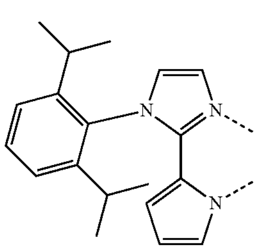
-continued
$L_{B160}$
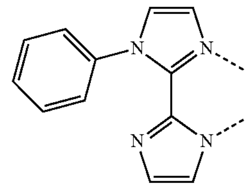
$L_{B161}$
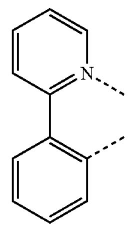
$L_{B162}$
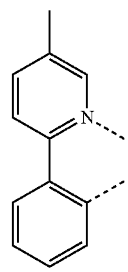
$L_{B163}$
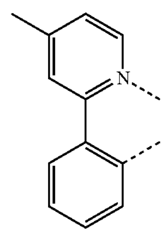
$L_{B164}$
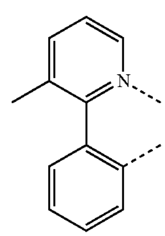
$L_{B165}$
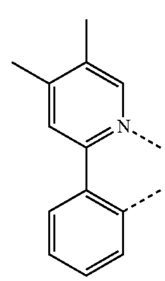

-continued
$L_{B166}$
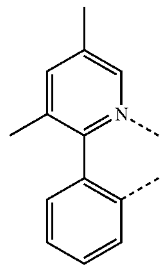
$L_{B167}$
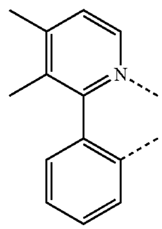
$L_{B168}$
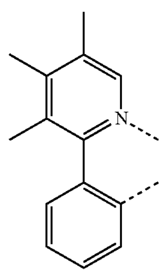
$L_{B169}$
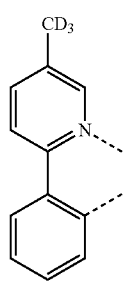
$L_{B170}$
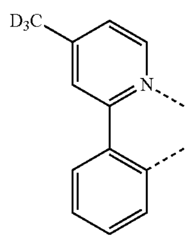
$L_{B171}$
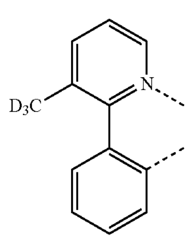
-continued
$L_{B172}$
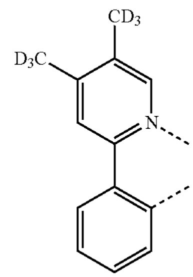
$L_{B173}$
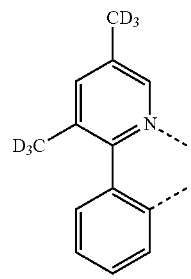
$L_{B174}$
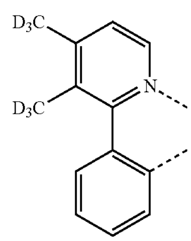
$L_{B175}$
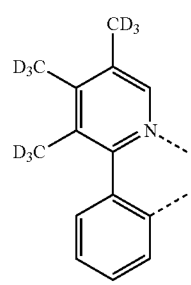
$L_{B176}$
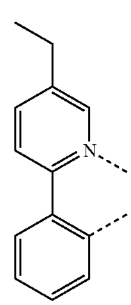

-continued
$L_{B177}$
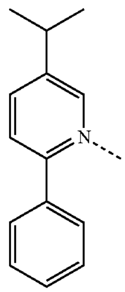
$L_{B178}$
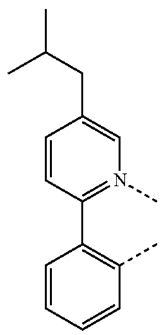
$L_{B179}$
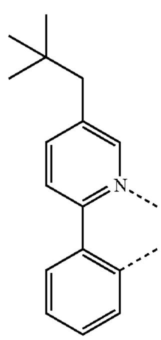
$L_{B180}$
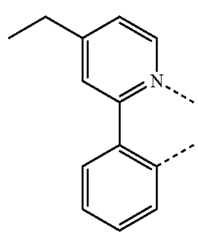
$L_{B181}$
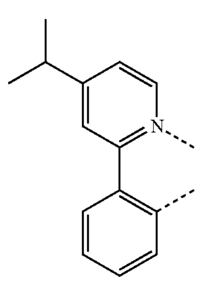
-continued
$L_{B182}$
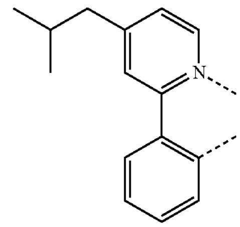
$L_{B183}$
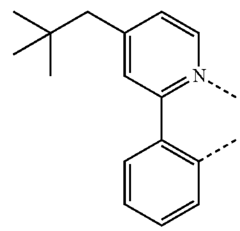
$L_{B184}$
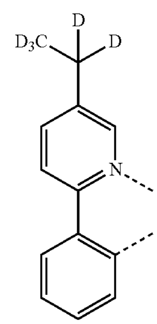
$L_{B185}$
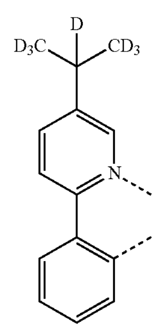
$L_{B186}$
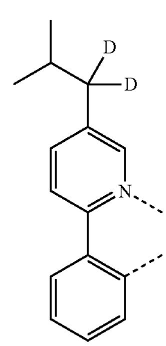

-continued
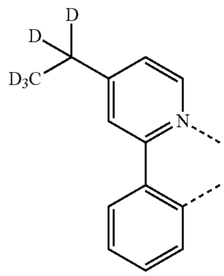
$L_{B187}$
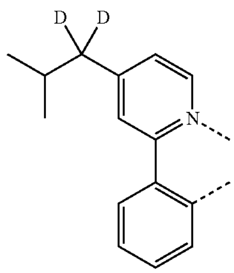
$L_{B188}$
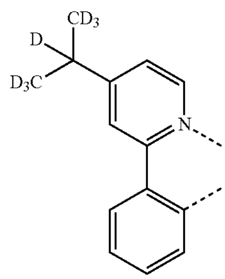
$L_{B189}$
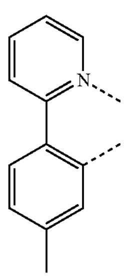
$L_{B190}$
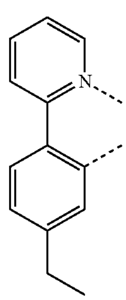
$L_{B191}$
-continued
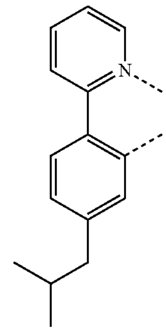
$L_{B192}$
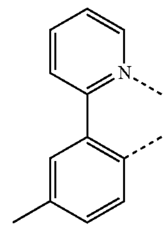
$L_{B193}$
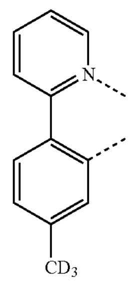
$L_{B194}$
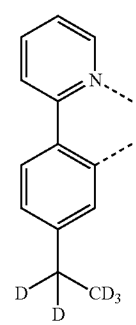
$L_{B195}$
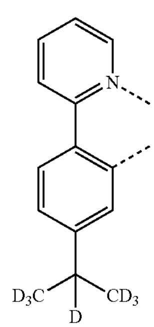
$L_{B196}$ -continued
$L_{B197}$
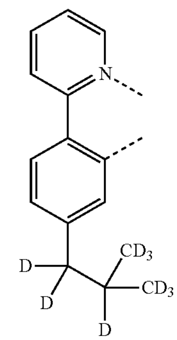
$L_{B198}$
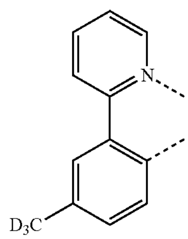
$L_{B199}$
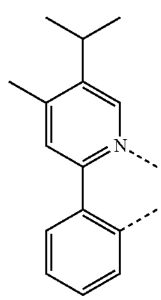
$L_{B200}$
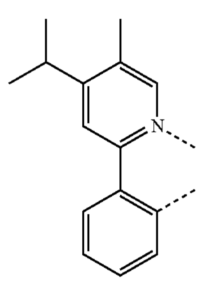
$L_{B201}$
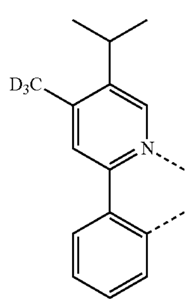
-continued
$L_{B202}$
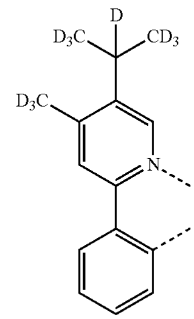
$L_{B203}$
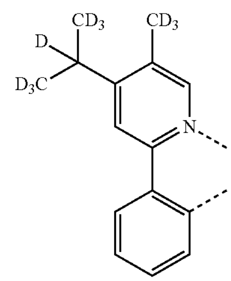
$L_{B204}$
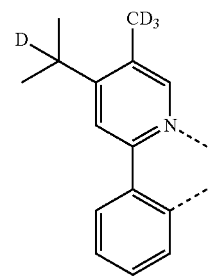
$L_{B205}$
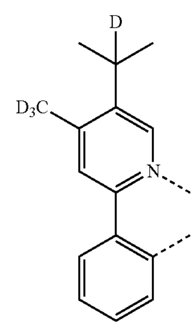
$L_{B206}$
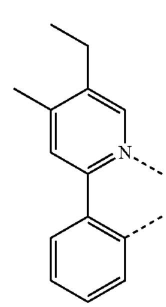

-continued
$L_{B207}$
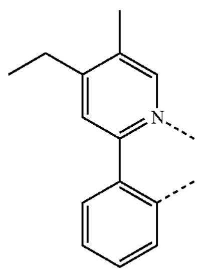
$L_{B208}$
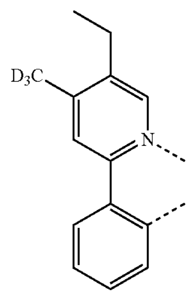
$L_{B209}$
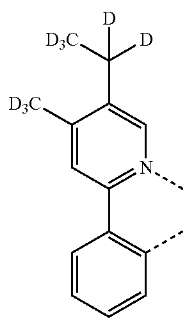
$L_{B210}$
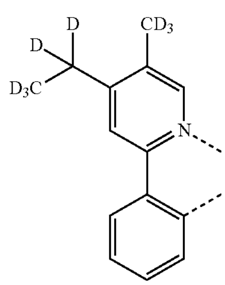
$L_{B211}$
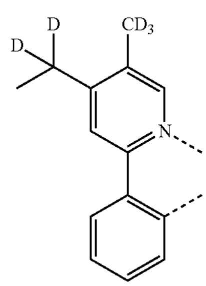
-continued
$L_{B212}$
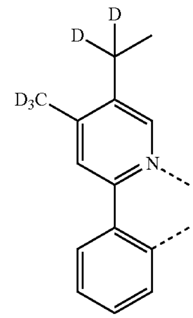
$L_{B213}$
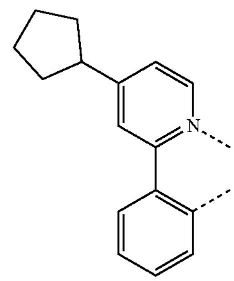
$L_{B214}$
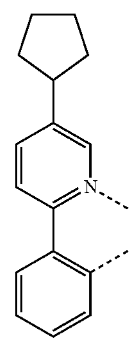
$L_{B215}$
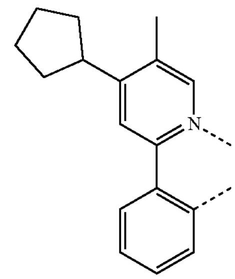
$L_{B216}$
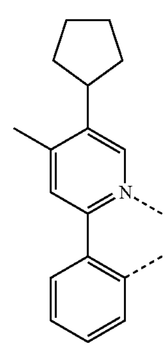

-continued
$L_{B217}$
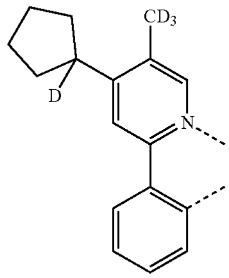
$L_{B218}$
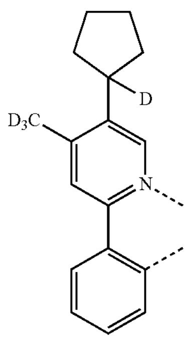
$L_{B219}$
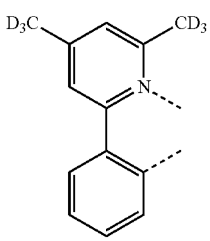
$L_{B220}$
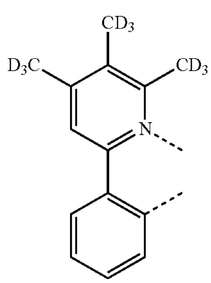
$L_{B221}$
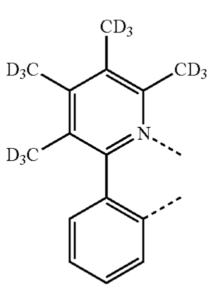
-continued
$L_{B222}$
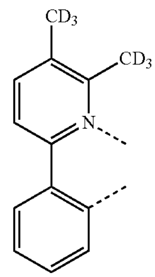
$L_{B223}$
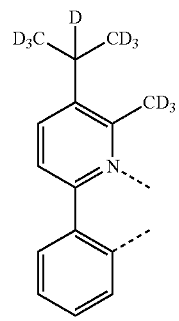
$L_{B224}$
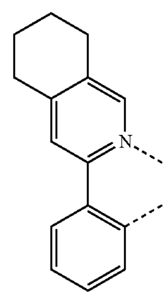
$L_{B225}$
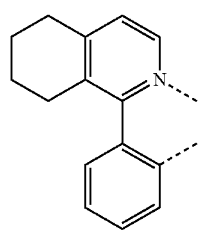
$L_{B226}$
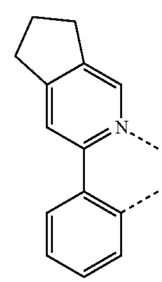

$L_{B227}$
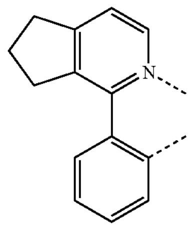
$L_{B228}$
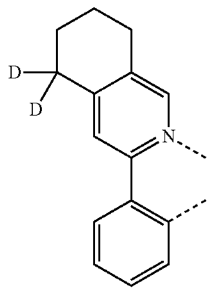
$L_{B229}$
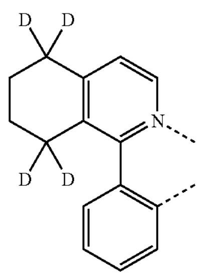
$L_{B230}$
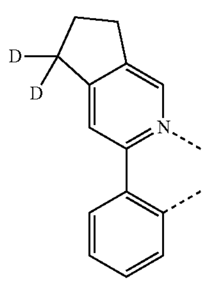
$L_{B231}$
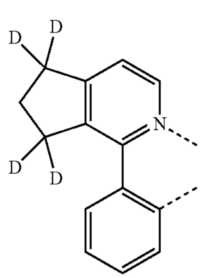
$L_{B232}$
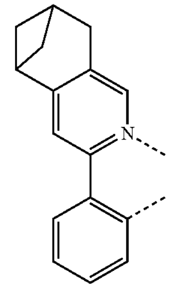
$L_{B233}$
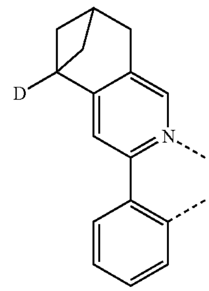
$L_{B234}$
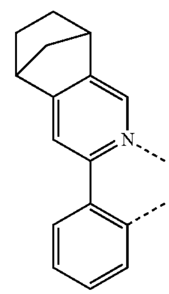
$L_{B235}$
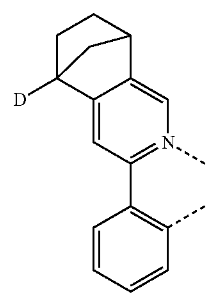
$L_{B236}$
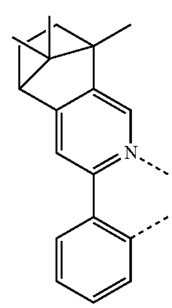

-continued
$L_{B237}$
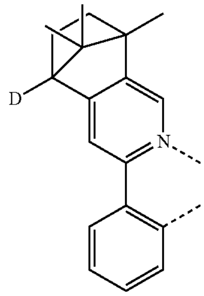
$L_{B238}$
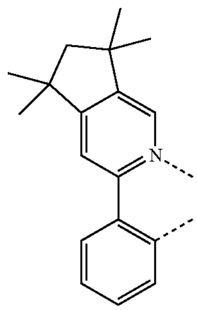
$L_{B239}$
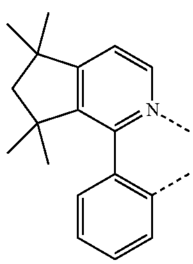
$L_{B240}$
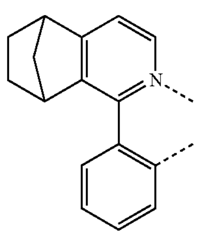
$L_{B241}$
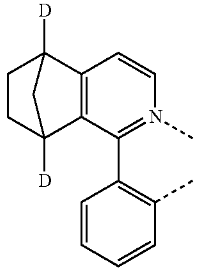
-continued
$L_{B242}$
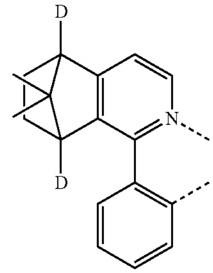
$L_{B243}$
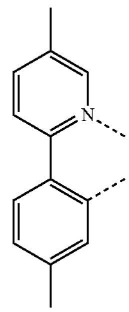
$L_{B244}$
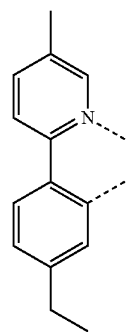
$L_{B245}$
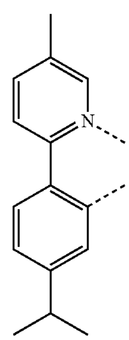
$L_{B246}$
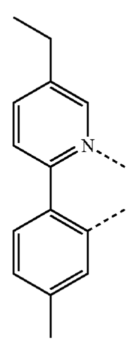

-continued
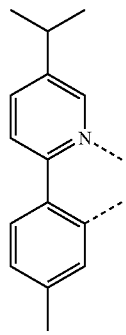
$L_{B247}$
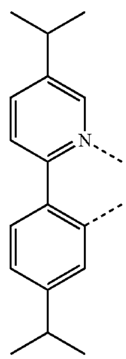
$L_{B248}$
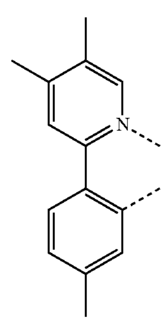
$L_{B249}$
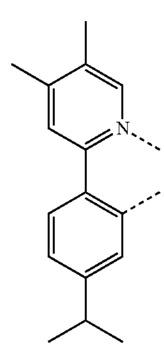
$L_{B250}$
-continued
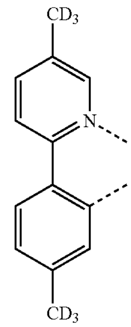
$L_{B251}$
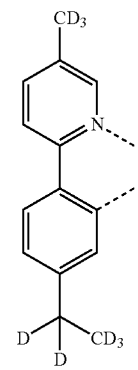
$L_{B252}$
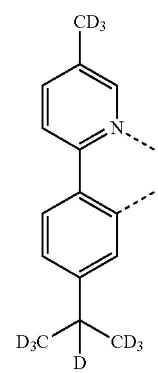
$L_{B253}$
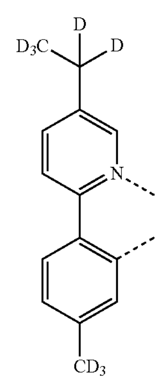
$L_{B254}$ -continued
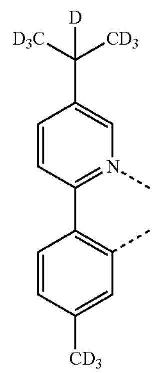
$L_{B255}$
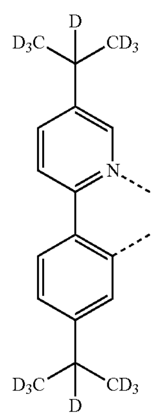
$L_{B256}$
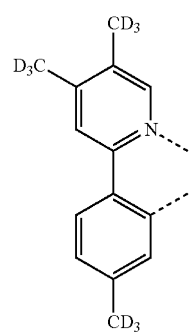
$L_{B257}$
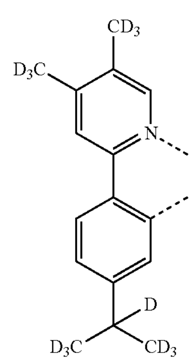
$L_{B258}$
-continued
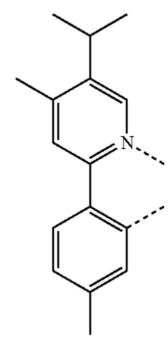
$L_{B259}$
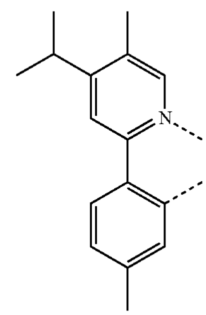
$L_{B260}$
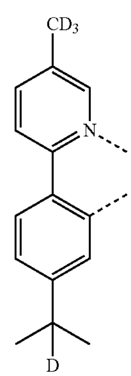
$L_{B261}$
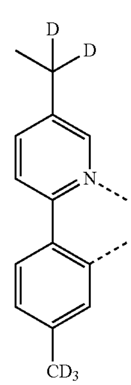
$L_{B262}$ -continued
$L_{B263}$
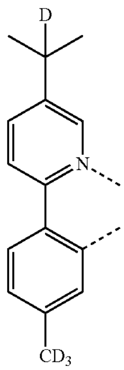
$L_{B264}$
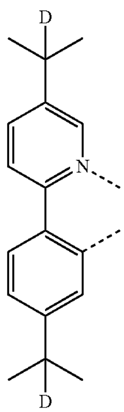
$L_{B265}$
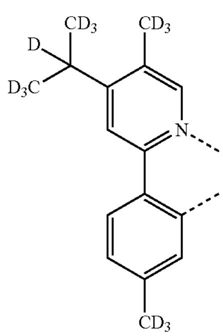
$L_{B266}$
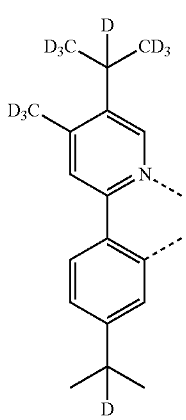
-continued
$L_{B267}$
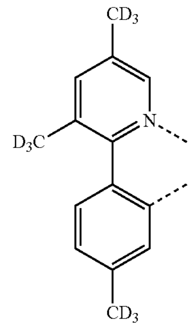
$L_{B268}$
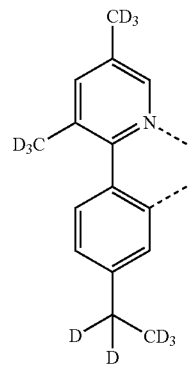
$L_{B269}$
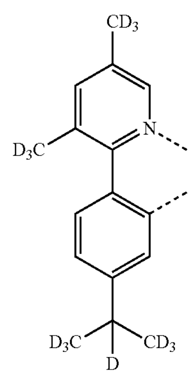
$L_{B270}$
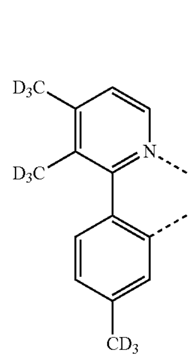

$L_{B271}$
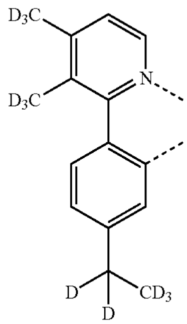
$L_{B272}$
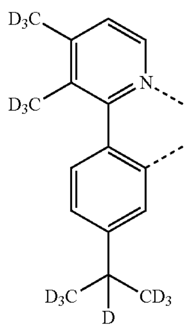
$L_{B273}$
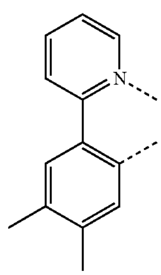
$L_{B274}$
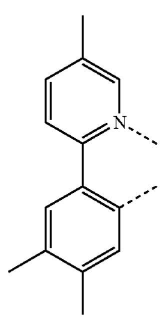
$L_{B275}$
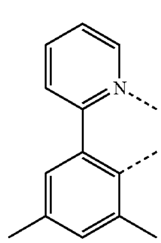
$L_{B276}$
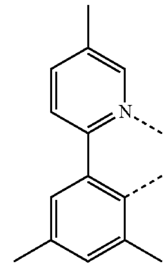
$L_{B277}$
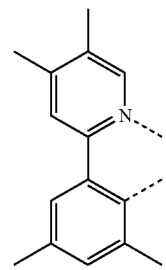
$L_{B278}$
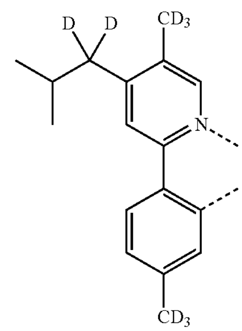
$L_{B279}$
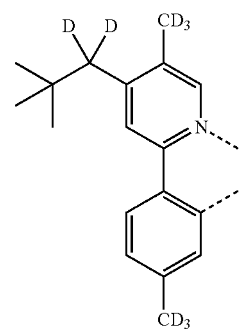
$L_{B280}$
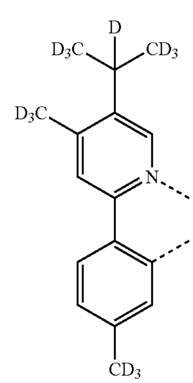

-continued
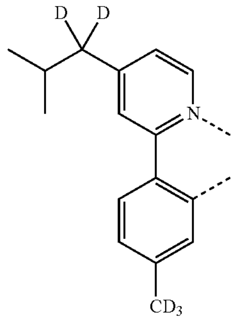
$L_{B281}$
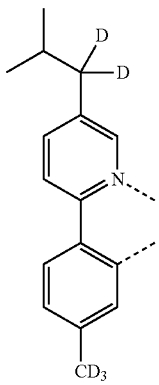
$L_{B282}$
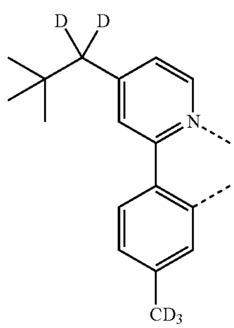
$L_{B283}$
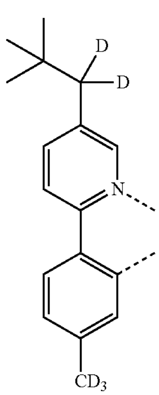
$L_{B284}$
-continued
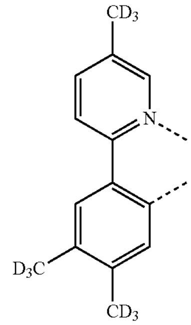
$L_{B285}$
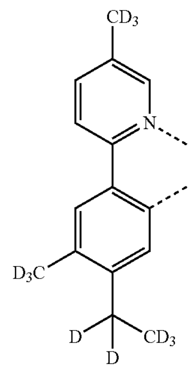
$L_{B286}$
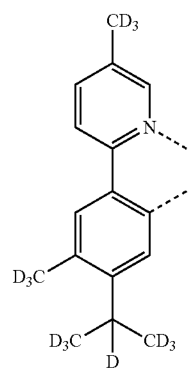
$L_{B287}$
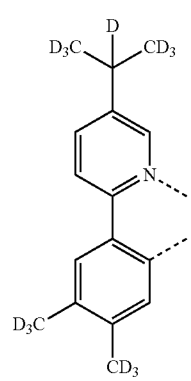
$L_{B288}$ $L_{B289}$
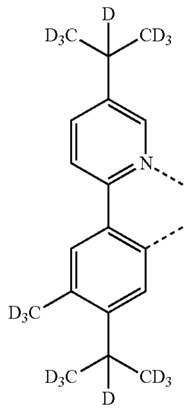
$L_{B290}$
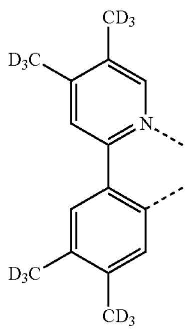
$L_{B291}$
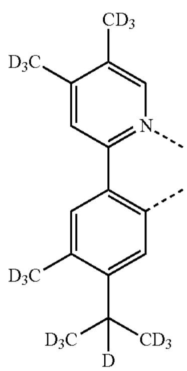
$L_{B292}$
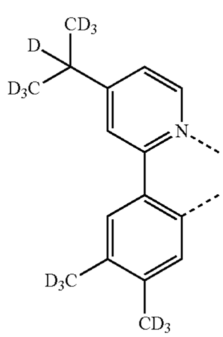
$L_{B293}$
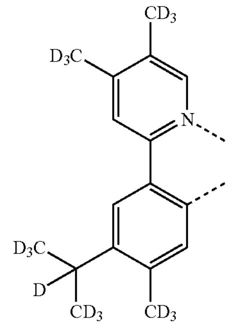
$L_{B294}$
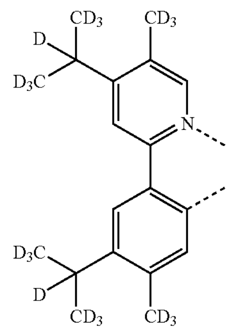
$L_{B295}$
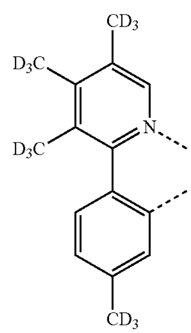
$L_{B296}$
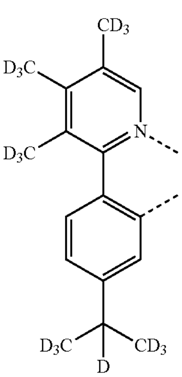

-continued
$L_{B297}$
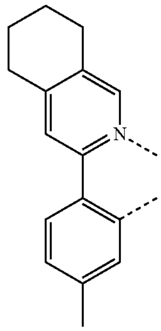
$L_{B298}$
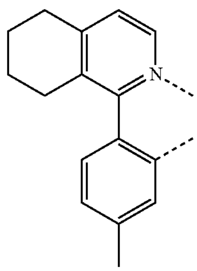
$L_{B299}$
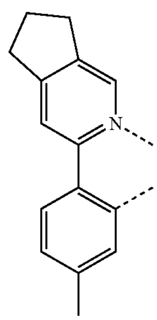
$L_{B300}$
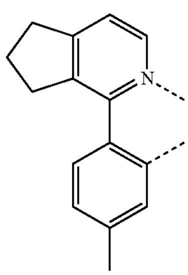
$L_{B301}$
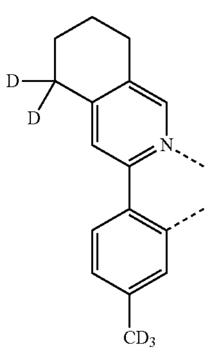
-continued
$L_{B302}$
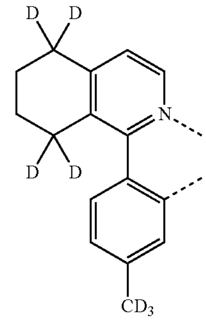
$L_{B303}$
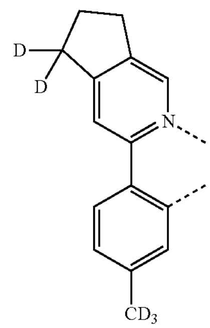
$L_{B304}$
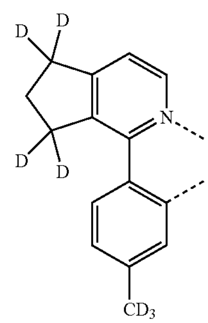
$L_{B305}$
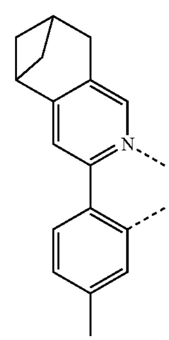

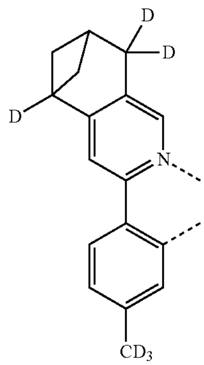
$L_{B306}$
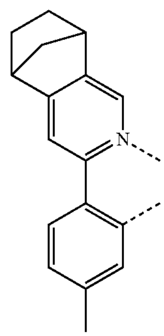
$L_{B307}$
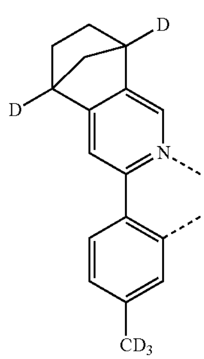
$L_{B308}$
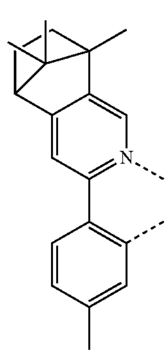
$L_{B309}$
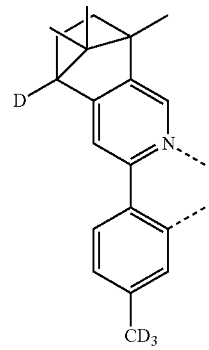
$L_{B310}$
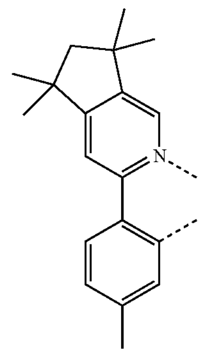
$L_{B311}$
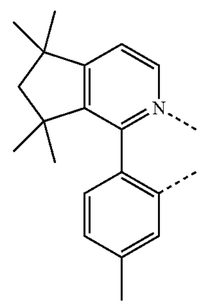
$L_{B312}$
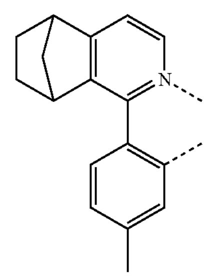
$L_{B313}$
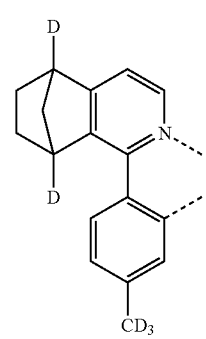
$L_{B314}$ $L_{B315}$
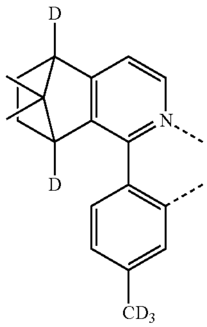
$L_{B316}$
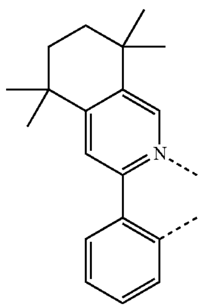
$L_{B317}$
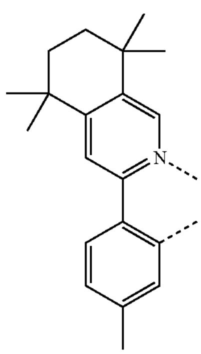
$L_{B318}$
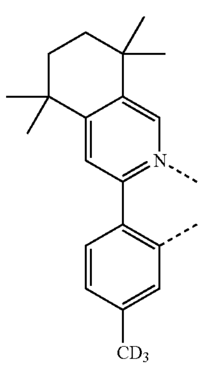
$L_{B319}$
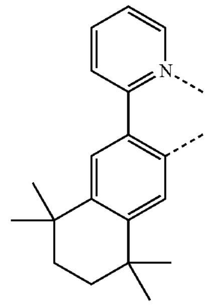
$L_{B320}$
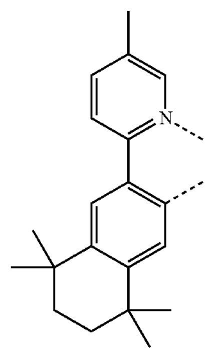
$L_{B321}$
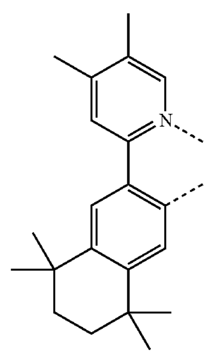
$L_{B322}$
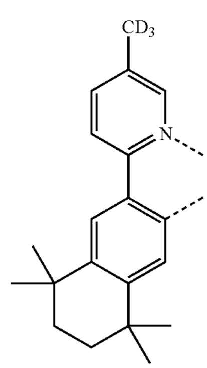

$L_{B323}$
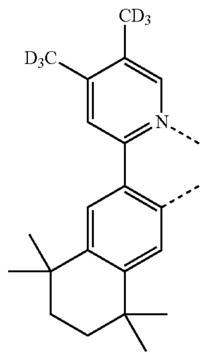
$L_{B324}$
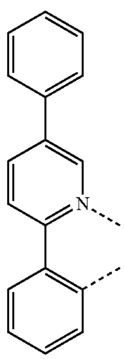
$L_{B325}$
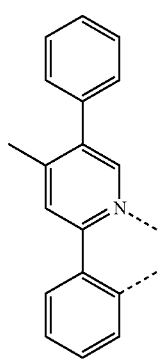
$L_{B326}$
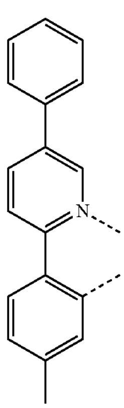
$L_{B327}$
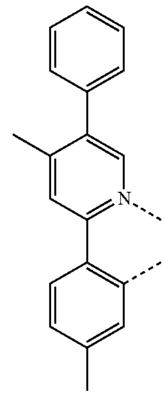
$L_{B328}$
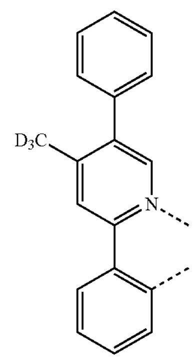
$L_{B329}$
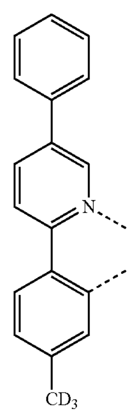
$L_{B330}$
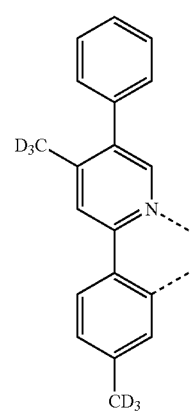

-continued
L$_{B331}$
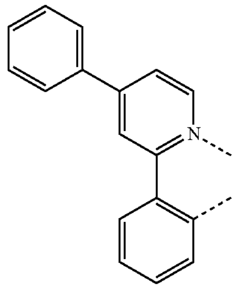
L$_{B332}$
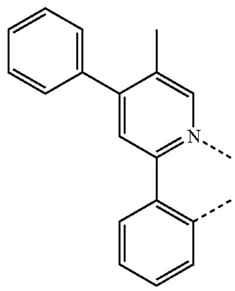
L$_{B333}$
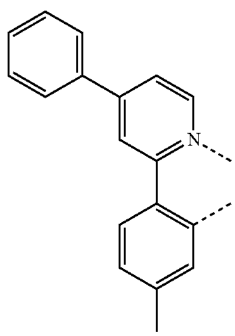
L$_{B334}$
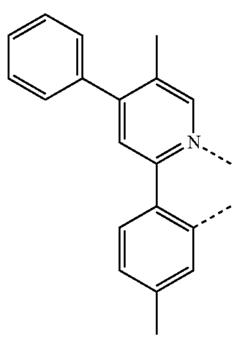
L$_{B335}$
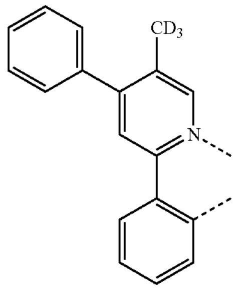
-continued
L$_{B336}$
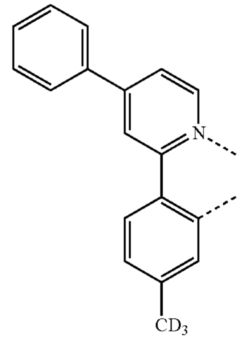
L$_{B337}$
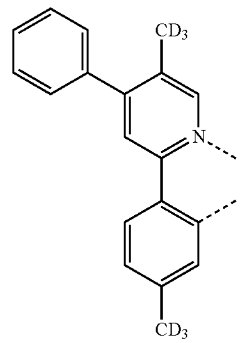
L$_{B338}$
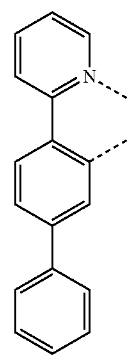
L$_{B339}$
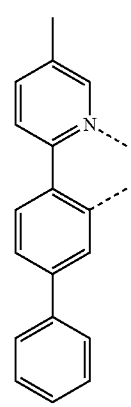

$L_{B340}$
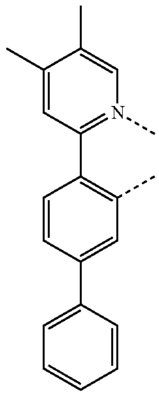
$L_{B341}$
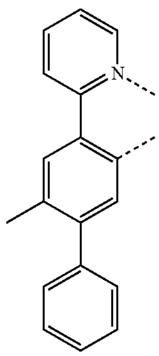
$L_{B342}$
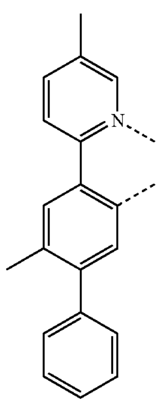
$L_{B343}$
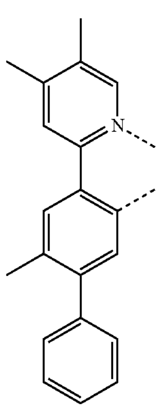
$L_{B344}$
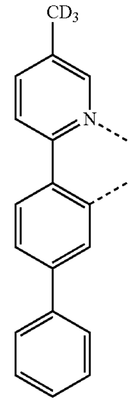
$L_{B345}$
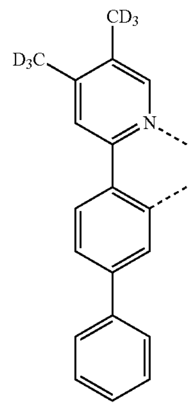
$L_{B346}$
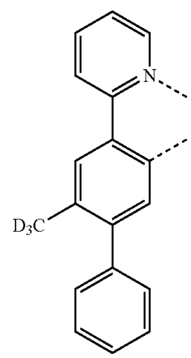
$L_{B347}$
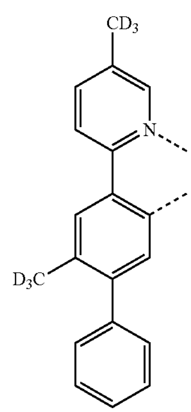

-continued
$L_{B348}$
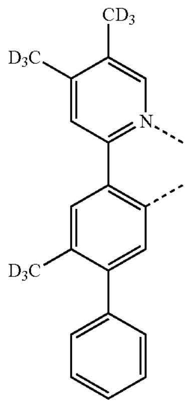
$L_{B349}$
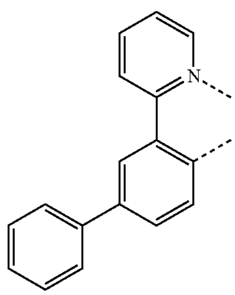
$L_{B350}$
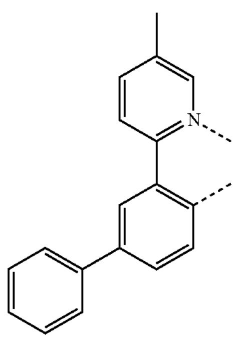
$L_{B351}$
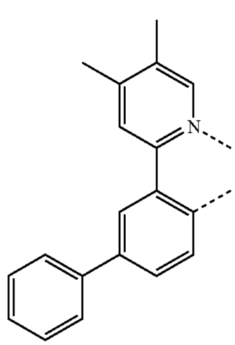
-continued
$L_{B352}$
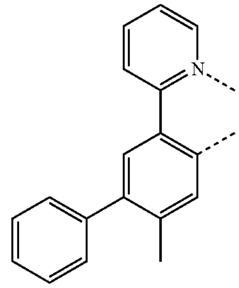
$L_{B353}$
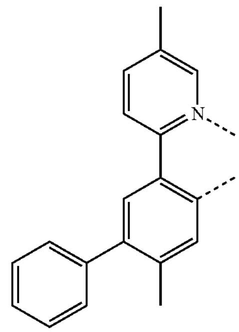
$L_{B354}$
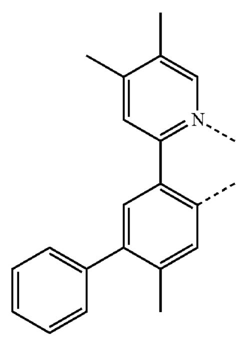
$L_{B355}$
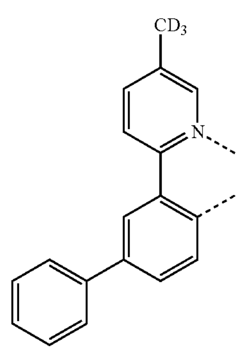

-continued
$L_{B356}$
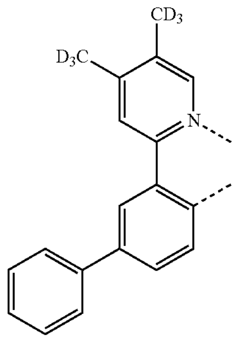
$L_{B357}$
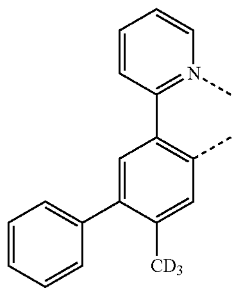
$L_{B358}$
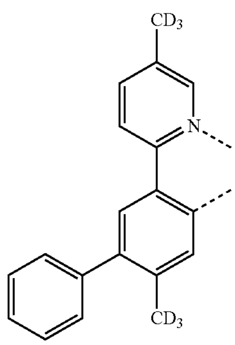
$L_{B359}$
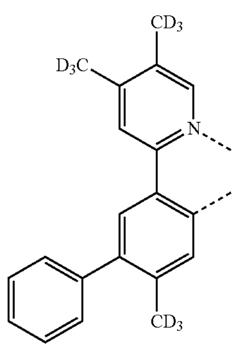
$L_{B360}$
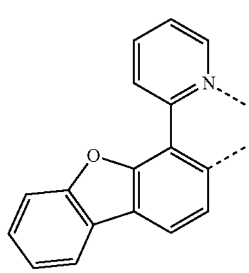
-continued
$L_{B361}$
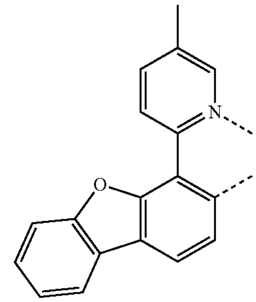
$L_{B362}$
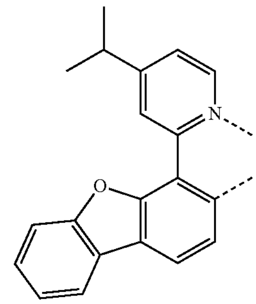
$L_{B363}$
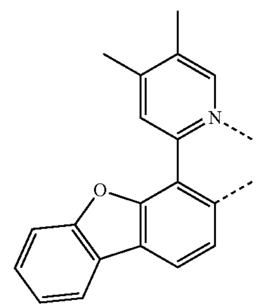
$L_{B364}$
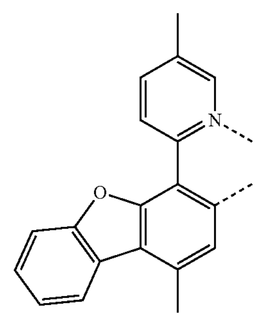
$L_{B365}$
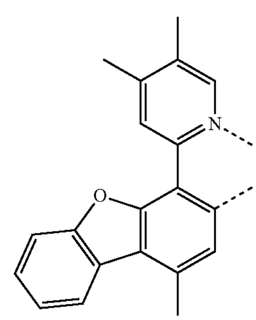

L$_{B366}$
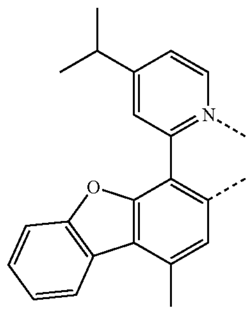
L$_{B367}$
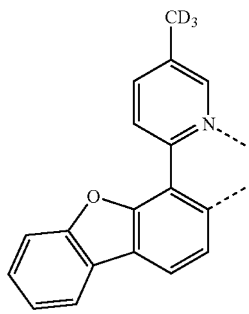
L$_{B368}$
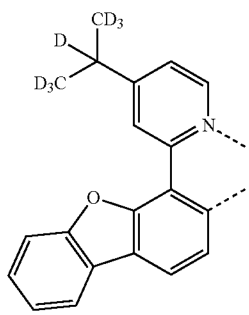
L$_{B369}$
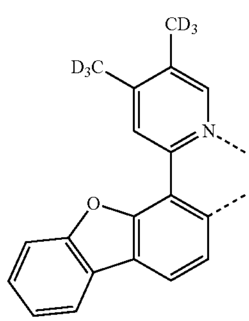
L$_{B370}$
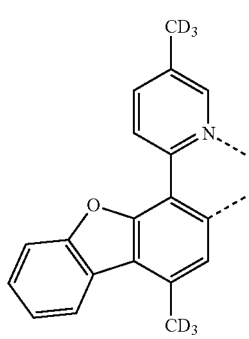
L$_{B371}$
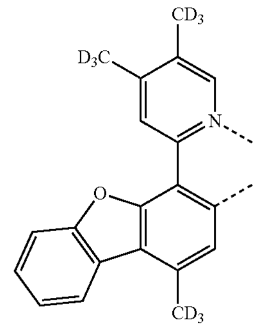
L$_{B372}$
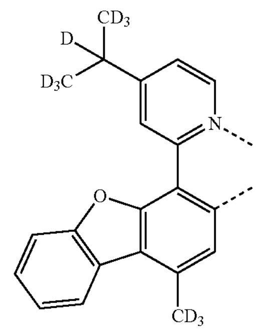
L$_{B373}$
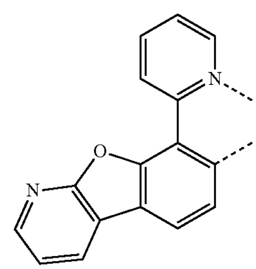
L$_{B374}$
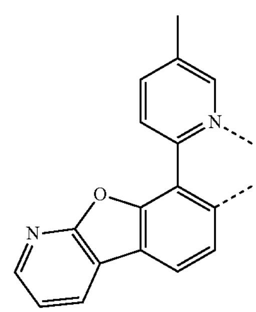
L$_{B375}$
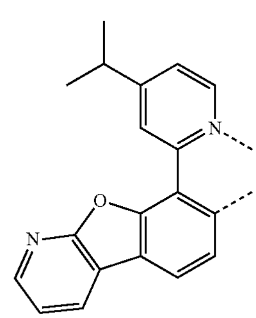

-continued
$L_{B376}$
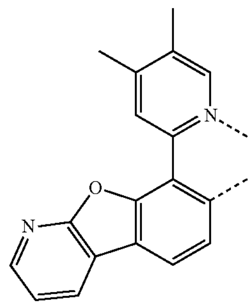
$L_{B377}$
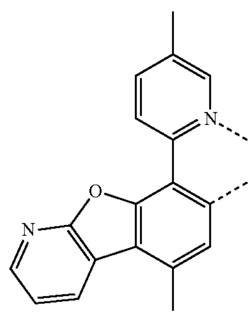
$L_{B378}$
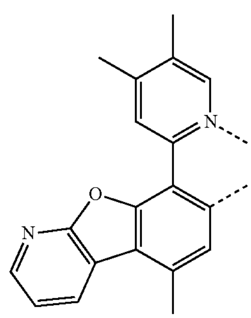
$L_{B379}$
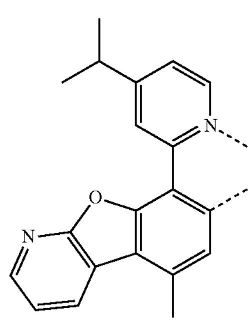
$L_{B380}$
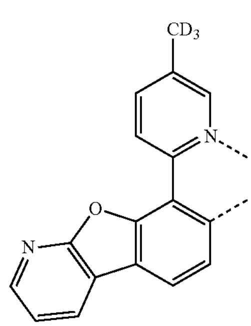
-continued
$L_{B381}$
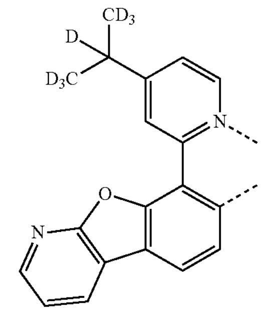
$L_{B382}$
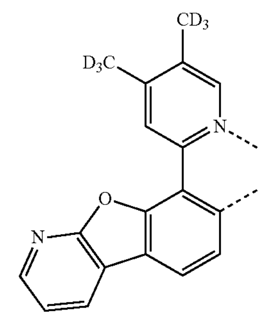
$L_{B383}$
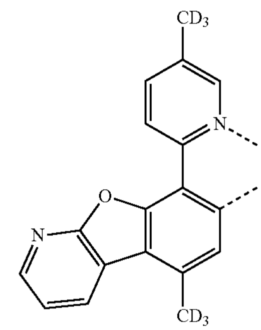
$L_{B384}$
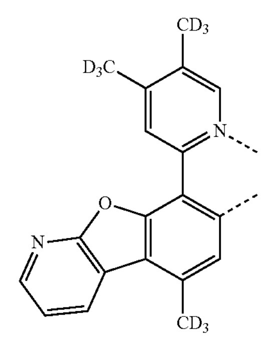
$L_{B385}$
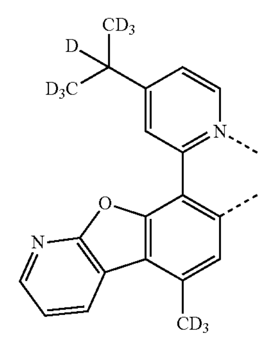

-continued
$L_{B386}$
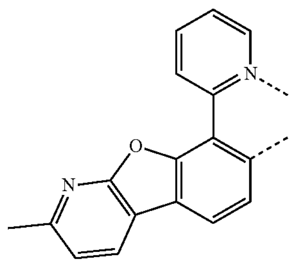
$L_{B387}$
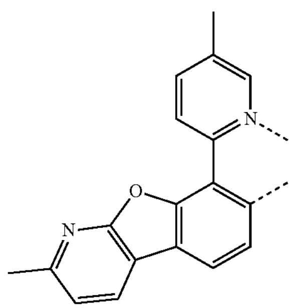
$L_{B388}$
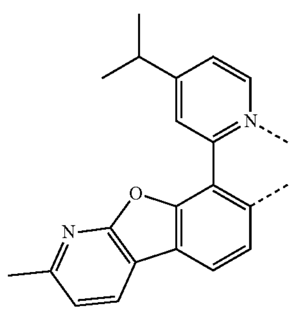
$L_{B389}$
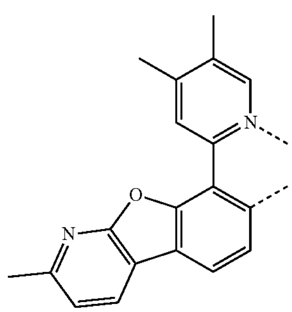
$L_{B390}$
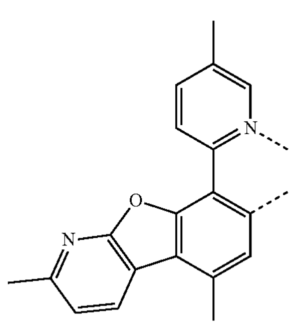
-continued
$L_{B391}$
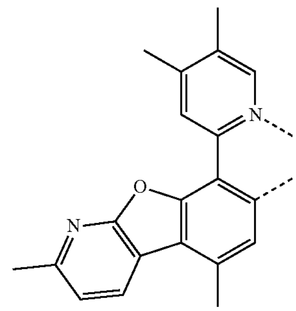
$L_{B392}$
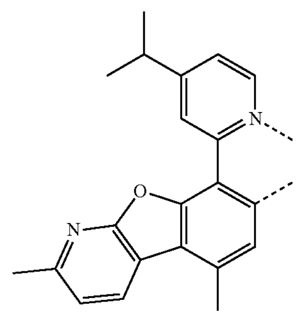
$L_{B393}$
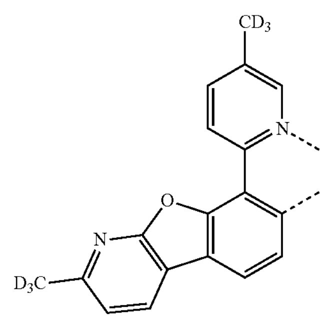
$L_{B394}$
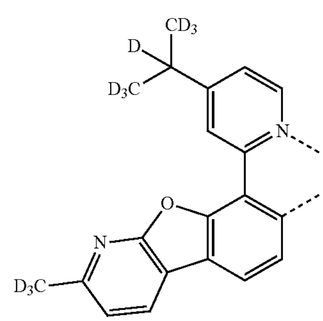
$L_{B395}$
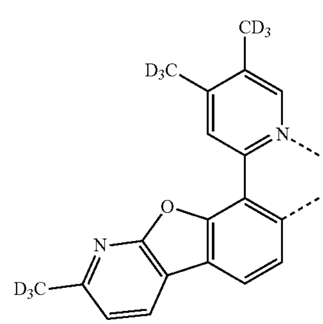

-continued
$L_{B396}$
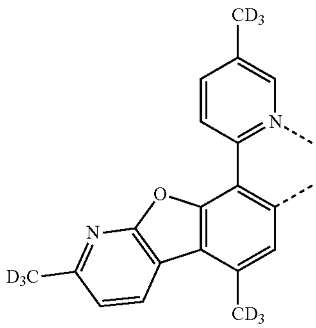
$L_{B397}$
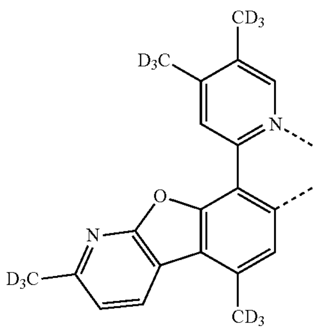
$L_{B398}$
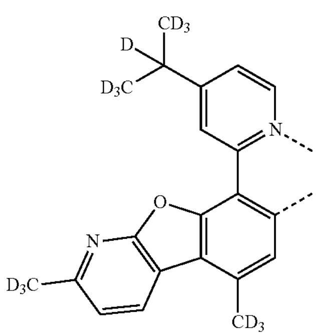
$L_{B399}$
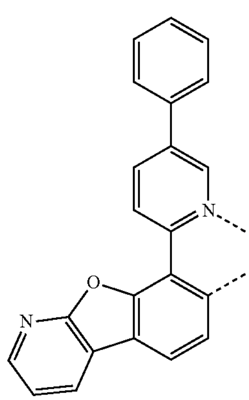
-continued
$L_{B400}$
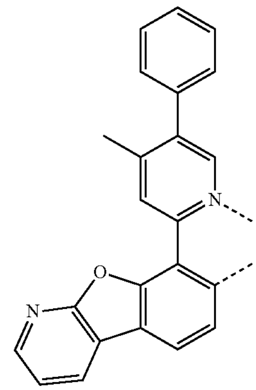
$L_{B401}$
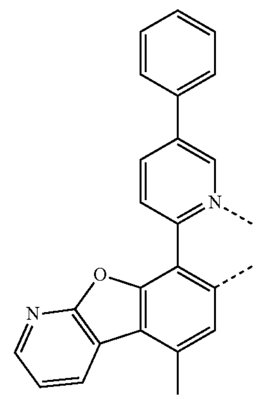
$L_{B402}$
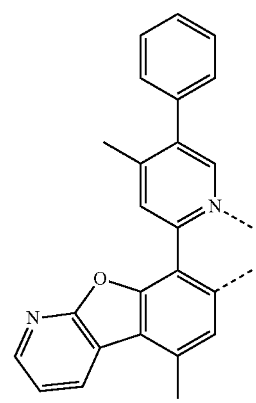
$L_{B403}$
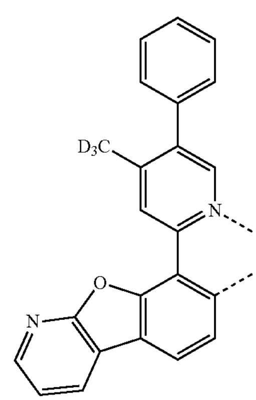

-continued
$L_{B404}$
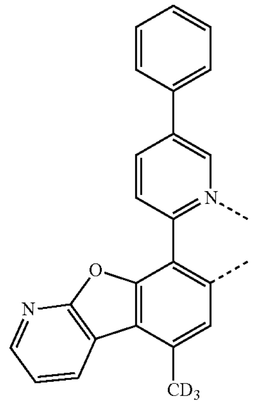
$L_{B405}$
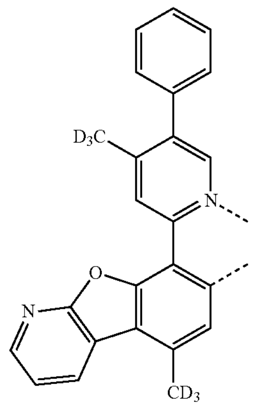
$L_{B406}$
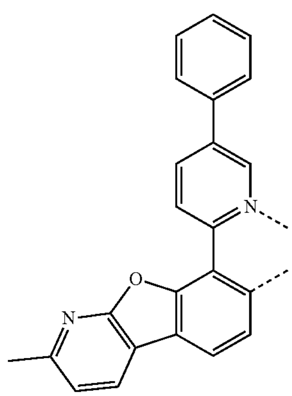
$L_{B407}$
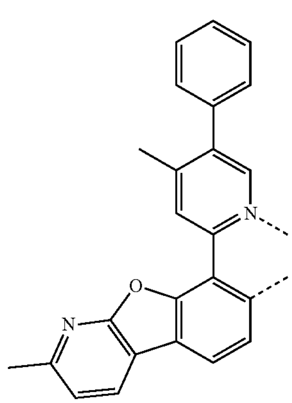
-continued
$L_{B408}$
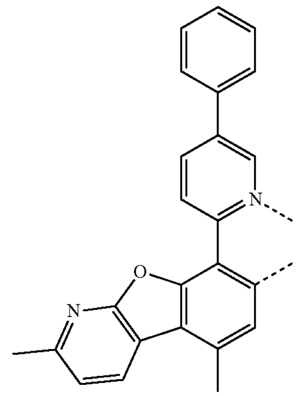
$L_{B409}$
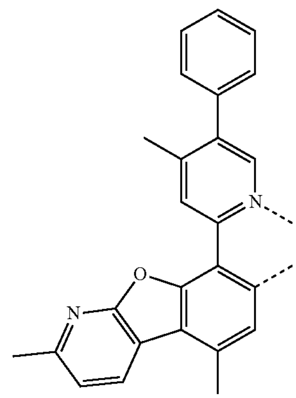
$L_{B410}$
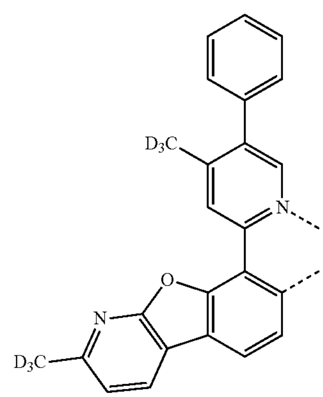
$L_{B411}$
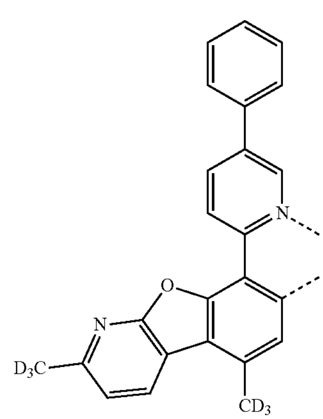

$L_{B412}$
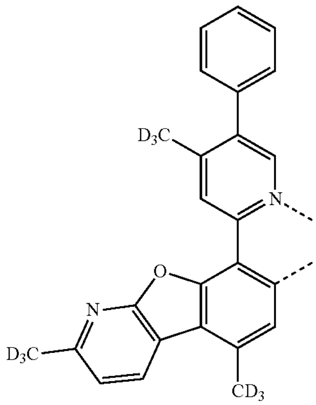
$L_{B413}$
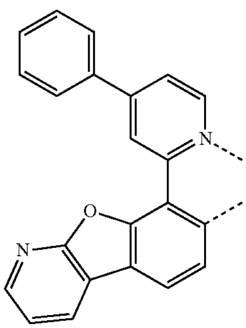
$L_{B414}$
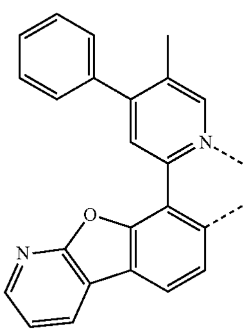
$L_{B415}$
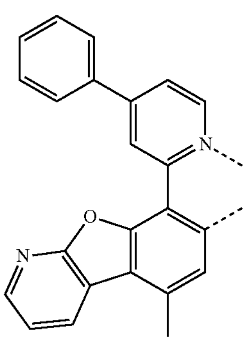
$L_{B416}$
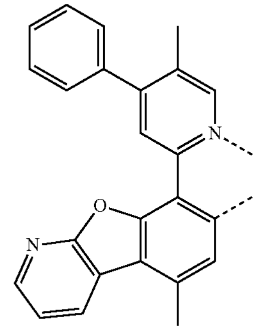
$L_{B417}$
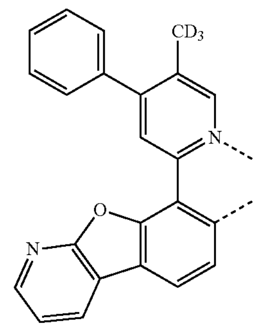
$L_{B418}$
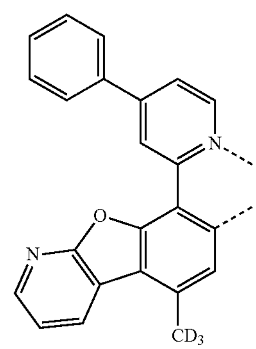
$L_{B419}$
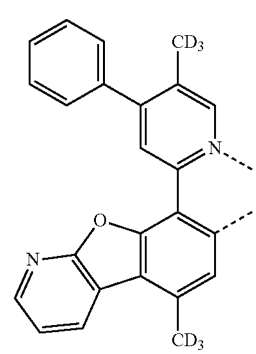

$L_{B420}$
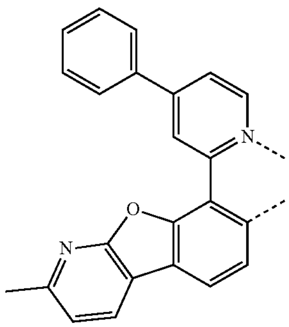
$L_{B421}$
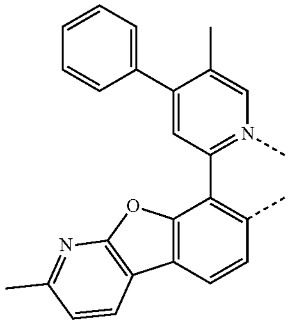
$L_{B422}$
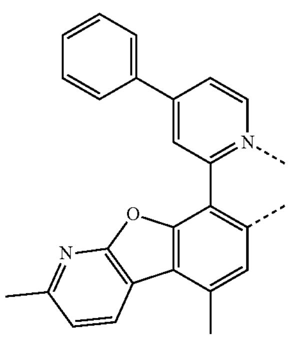
$L_{B423}$
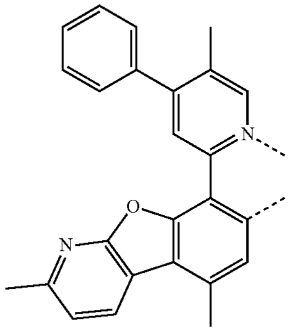
$L_{B424}$
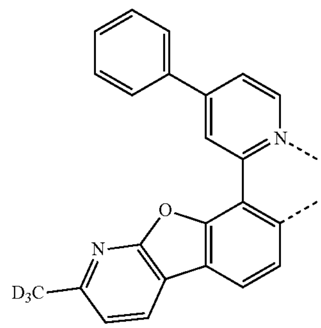
$L_{B425}$
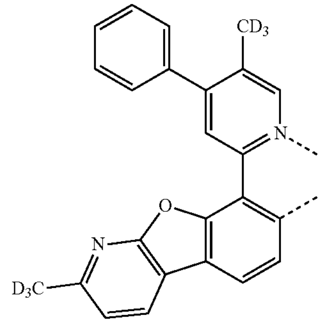
$L_{B426}$
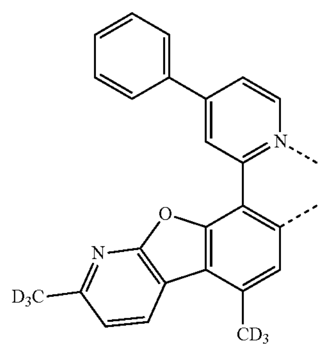
$L_{B427}$
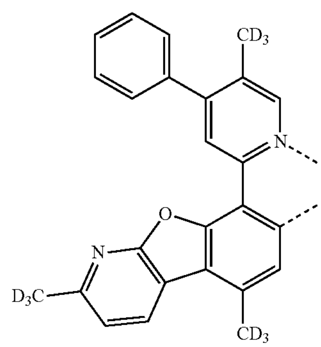
$L_{B428}$
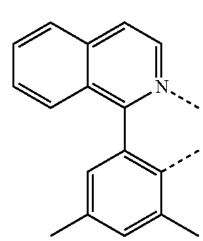

-continued
-continued
$L_{B429}$
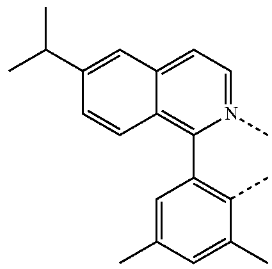
$L_{B430}$
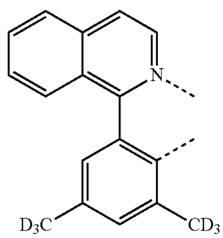
$L_{B431}$
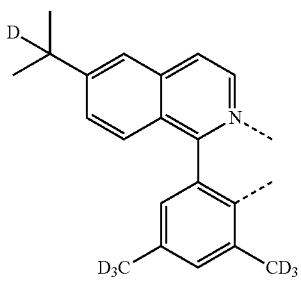
$L_{B432}$
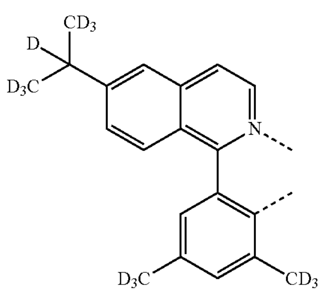
$L_{B433}$
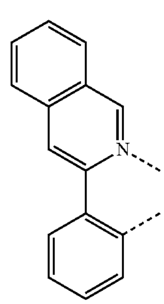
$L_{B434}$
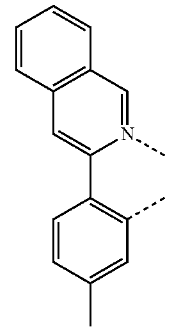
$L_{B435}$
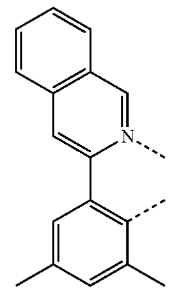
$L_{B436}$
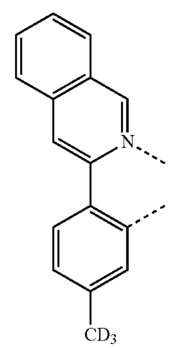
$L_{B437}$
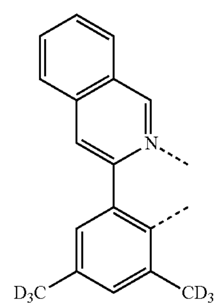
$L_{B438}$
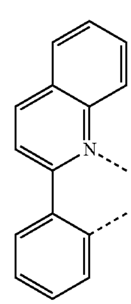

-continued
$L_{B439}$
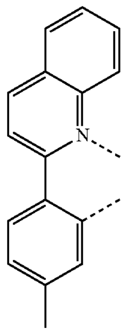
$L_{B440}$
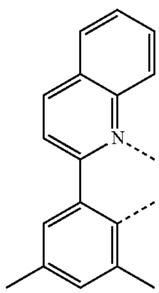
$L_{B441}$
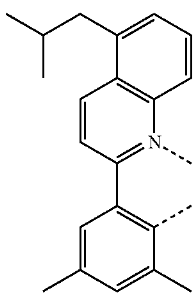
$L_{B442}$
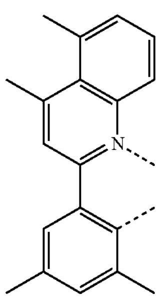
$L_{B443}$
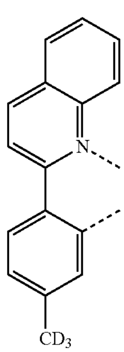
-continued
$L_{B444}$
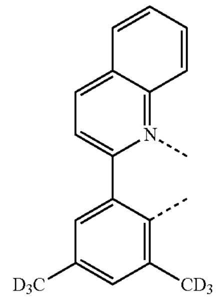
$L_{B445}$
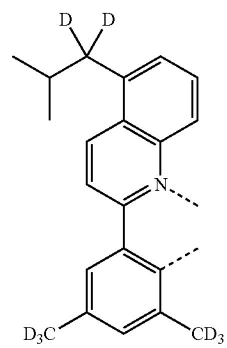
$L_{B446}$
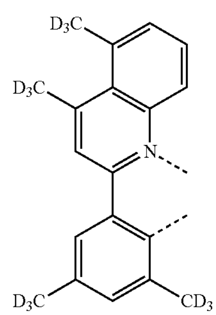
$L_{B447}$
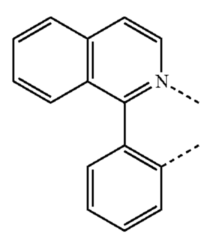
$L_{B448}$
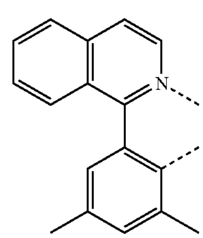

-continued
$L_{B449}$
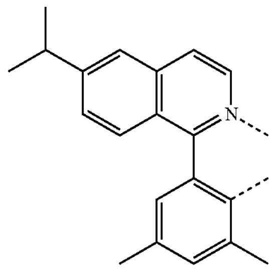
$L_{B450}$
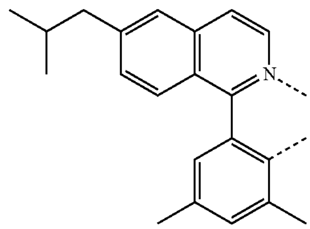
$L_{B451}$
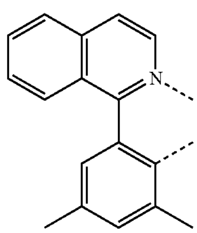
$L_{B452}$
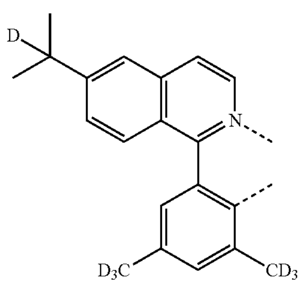
$L_{B453}$
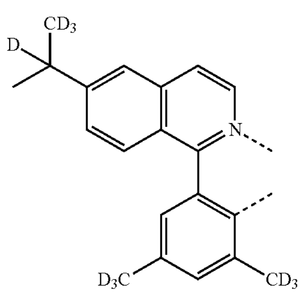
$L_{B454}$
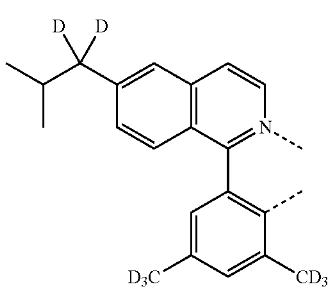
-continued
$L_{B455}$
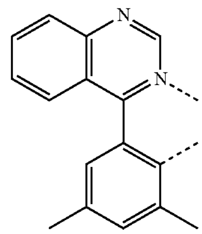
$L_{B456}$
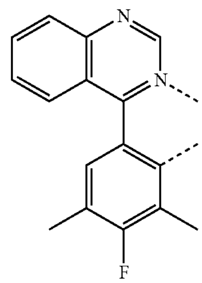
$L_{B457}$
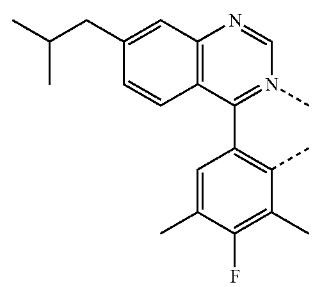
$L_{B458}$
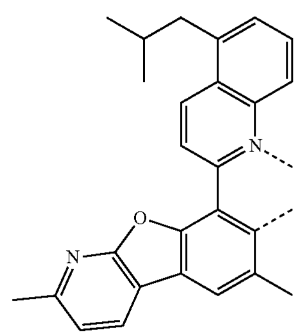
$L_{B459}$
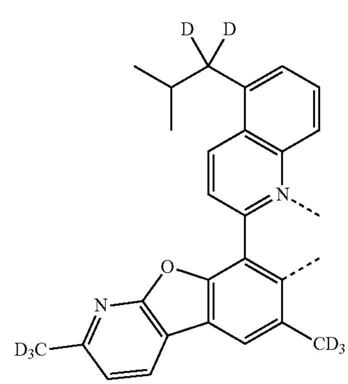

-continued

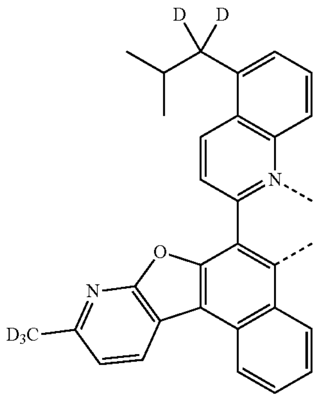
$L_{B460}$

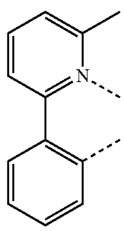
$L_{B461}$

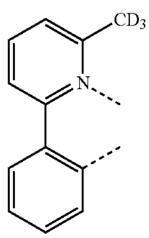
$L_{B462}$

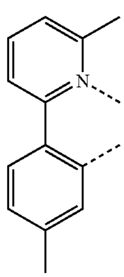
$L_{B463}$

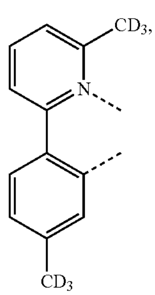
$L_{B464}$ and $L_{C1}$ through $L_{C1260}$ are based on a structure of Formula X,

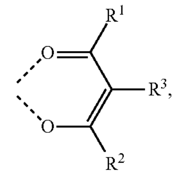

in which $R^1$, $R^2$, and $R^3$ are defined as:

| Ligand | $R^1$ | $R^2$ | $R^3$ |
|---|---|---|---|
| $L_{C1}$ | $R^{D1}$ | $R^{D1}$ | H |
| $L_{C2}$ | $R^{D2}$ | $R^{D2}$ | H |
| $L_{C3}$ | $R^{D3}$ | $R^{D3}$ | H |
| $L_{C4}$ | $R^{D4}$ | $R^{D4}$ | H |
| $L_{C5}$ | $R^{D5}$ | $R^{D5}$ | H |
| $L_{C6}$ | $R^{D6}$ | $R^{D6}$ | H |
| $L_{C7}$ | $R^{D7}$ | $R^{D7}$ | H |
| $L_{C8}$ | $R^{D8}$ | $R^{D8}$ | H |
| $L_{C9}$ | $R^{D9}$ | $R^{D9}$ | H |
| $L_{C10}$ | $R^{D10}$ | $R^{D10}$ | H |
| $L_{C11}$ | $R^{D11}$ | $R^{D11}$ | H |
| $L_{C12}$ | $R^{D12}$ | $R^{D12}$ | H |
| $L_{C13}$ | $R^{D13}$ | $R^{D13}$ | H |
| $L_{C14}$ | $R^{D14}$ | $R^{D14}$ | H |
| $L_{C15}$ | $R^{D15}$ | $R^{D15}$ | H |
| $L_{C16}$ | $R^{D16}$ | $R^{D16}$ | H |
| $L_{C17}$ | $R^{D17}$ | $R^{D17}$ | H |
| $L_{C18}$ | $R^{D18}$ | $R^{D18}$ | H |
| $L_{C19}$ | $R^{D19}$ | $R^{D19}$ | H |
| $L_{C20}$ | $R^{D20}$ | $R^{D20}$ | H |
| $L_{C21}$ | $R^{D21}$ | $R^{D21}$ | H |
| $L_{C22}$ | $R^{D22}$ | $R^{D22}$ | H |
| $L_{C23}$ | $R^{D23}$ | $R^{D23}$ | H |
| $L_{C24}$ | $R^{D24}$ | $R^{D24}$ | H |
| $L_{C25}$ | $R^{D25}$ | $R^{D25}$ | H |
| $L_{C26}$ | $R^{D26}$ | $R^{D26}$ | H |
| $L_{C27}$ | $R^{D27}$ | $R^{D27}$ | H |
| $L_{C28}$ | $R^{D28}$ | $R^{D28}$ | H |
| $L_{C29}$ | $R^{D29}$ | $R^{D29}$ | H |
| $L_{C30}$ | $R^{D30}$ | $R^{D30}$ | H |
| $L_{C31}$ | $R^{D31}$ | $R^{D31}$ | H |
| $L_{C32}$ | $R^{D32}$ | $R^{D32}$ | H |
| $L_{C33}$ | $R^{D33}$ | $R^{D33}$ | H |
| $L_{C34}$ | $R^{D34}$ | $R^{D34}$ | H |
| $L_{C35}$ | $R^{D35}$ | $R^{D35}$ | H |
| $L_{C36}$ | $R^{D40}$ | $R^{D40}$ | H |
| $L_{C37}$ | $R^{D41}$ | $R^{D41}$ | H |
| $L_{C38}$ | $R^{D42}$ | $R^{D42}$ | H |
| $L_{C39}$ | $R^{D64}$ | $R^{D64}$ | H |
| $L_{C40}$ | $R^{D66}$ | $R^{D66}$ | H |
| $L_{C41}$ | $R^{D68}$ | $R^{D68}$ | H |
| $L_{C42}$ | $R^{D76}$ | $R^{D76}$ | H |
| $L_{C43}$ | $R^{D1}$ | $R^{D2}$ | H |
| $L_{C44}$ | $R^{D1}$ | $R^{D3}$ | H |
| $L_{C45}$ | $R^{D1}$ | $R^{D4}$ | H |
| $L_{C46}$ | $R^{D1}$ | $R^{D5}$ | H |
| $L_{C47}$ | $R^{D1}$ | $R^{D6}$ | H |
| $L_{C48}$ | $R^{D1}$ | $R^{D7}$ | H |
| $L_{C49}$ | $R^{D1}$ | $R^{D8}$ | H |
| $L_{C50}$ | $R^{D1}$ | $R^{D9}$ | H |
| $L_{C51}$ | $R^{D1}$ | $R^{D10}$ | H |
| $L_{C52}$ | $R^{D1}$ | $R^{D11}$ | H |
| $L_{C53}$ | $R^{D1}$ | $R^{D12}$ | H |
| $L_{C54}$ | $R^{D1}$ | $R^{D13}$ | H |
| $L_{C55}$ | $R^{D1}$ | $R^{D14}$ | H |
| $L_{C56}$ | $R^{D1}$ | $R^{D15}$ | H |
| $L_{C57}$ | $R^{D1}$ | $R^{D16}$ | H |
| $L_{C58}$ | $R^{D1}$ | $R^{D17}$ | H |
| $L_{C59}$ | $R^{D1}$ | $R^{D18}$ | H |
| $L_{C60}$ | $R^{D1}$ | $R^{D19}$ | H |
| $L_{C61}$ | $R^{D1}$ | $R^{D20}$ | H |
| $L_{C62}$ | $R^{D1}$ | $R^{D21}$ | H |

-continued

| Ligand | $R^1$ | $R^2$ | $R^3$ |
|---|---|---|---|
| $L_{C63}$ | $R^{D1}$ | $R^{D22}$ | H |
| $L_{C64}$ | $R^{D1}$ | $R^{D23}$ | H |
| $L_{C65}$ | $R^{D1}$ | $R^{D24}$ | H |
| $L_{C66}$ | $R^{D1}$ | $R^{D25}$ | H |
| $L_{C67}$ | $R^{D1}$ | $R^{D26}$ | H |
| $L_{C68}$ | $R^{D1}$ | $R^{D27}$ | H |
| $L_{C69}$ | $R^{D1}$ | $R^{D28}$ | H |
| $L_{C70}$ | $R^{D1}$ | $R^{D29}$ | H |
| $L_{C71}$ | $R^{D1}$ | $R^{D30}$ | H |
| $L_{C72}$ | $R^{D1}$ | $R^{D31}$ | H |
| $L_{C73}$ | $R^{D1}$ | $R^{D32}$ | H |
| $L_{C74}$ | $R^{D1}$ | $R^{D33}$ | H |
| $L_{C75}$ | $R^{D1}$ | $R^{D34}$ | H |
| $L_{C76}$ | $R^{D1}$ | $R^{D35}$ | H |
| $L_{C77}$ | $R^{D1}$ | $R^{D40}$ | H |
| $L_{C78}$ | $R^{D1}$ | $R^{D41}$ | H |
| $L_{C79}$ | $R^{D1}$ | $R^{D42}$ | H |
| $L_{C80}$ | $R^{D1}$ | $R^{D64}$ | H |
| $L_{C81}$ | $R^{D1}$ | $R^{D66}$ | H |
| $L_{C82}$ | $R^{D1}$ | $R^{D68}$ | H |
| $L_{C83}$ | $R^{D1}$ | $R^{D76}$ | H |
| $L_{C84}$ | $R^{D2}$ | $R^{D1}$ | H |
| $L_{C85}$ | $R^{D2}$ | $R^{D3}$ | H |
| $L_{C86}$ | $R^{D2}$ | $R^{D4}$ | H |
| $L_{C87}$ | $R^{D2}$ | $R^{D5}$ | H |
| $L_{C88}$ | $R^{D2}$ | $R^{D6}$ | H |
| $L_{C89}$ | $R^{D2}$ | $R^{D7}$ | H |
| $L_{C90}$ | $R^{D2}$ | $R^{D8}$ | H |
| $L_{C91}$ | $R^{D2}$ | $R^{D9}$ | H |
| $L_{C92}$ | $R^{D2}$ | $R^{D10}$ | H |
| $L_{C93}$ | $R^{D2}$ | $R^{D11}$ | H |
| $L_{C94}$ | $R^{D2}$ | $R^{D12}$ | H |
| $L_{C95}$ | $R^{D2}$ | $R^{D13}$ | H |
| $L_{C96}$ | $R^{D2}$ | $R^{D14}$ | H |
| $L_{C97}$ | $R^{D2}$ | $R^{D15}$ | H |
| $L_{C98}$ | $R^{D2}$ | $R^{D16}$ | H |
| $L_{C99}$ | $R^{D2}$ | $R^{D17}$ | H |
| $L_{C100}$ | $R^{D2}$ | $R^{D18}$ | H |
| $L_{C101}$ | $R^{D2}$ | $R^{D19}$ | H |
| $L_{C102}$ | $R^{D2}$ | $R^{D20}$ | H |
| $L_{C103}$ | $R^{D2}$ | $R^{D21}$ | H |
| $L_{C104}$ | $R^{D2}$ | $R^{D22}$ | H |
| $L_{C105}$ | $R^{D2}$ | $R^{D23}$ | H |
| $L_{C106}$ | $R^{D2}$ | $R^{D24}$ | H |
| $L_{C107}$ | $R^{D2}$ | $R^{D25}$ | H |
| $L_{C108}$ | $R^{D2}$ | $R^{D26}$ | H |
| $L_{C109}$ | $R^{D2}$ | $R^{D27}$ | H |
| $L_{C110}$ | $R^{D2}$ | $R^{D28}$ | H |
| $L_{C111}$ | $R^{D2}$ | $R^{D29}$ | H |
| $L_{C112}$ | $R^{D2}$ | $R^{D30}$ | H |
| $L_{C113}$ | $R^{D2}$ | $R^{D31}$ | H |
| $L_{C114}$ | $R^{D2}$ | $R^{D32}$ | H |
| $L_{C115}$ | $R^{D2}$ | $R^{D33}$ | H |
| $L_{C116}$ | $R^{D2}$ | $R^{D34}$ | H |
| $L_{C117}$ | $R^{D2}$ | $R^{D35}$ | H |
| $L_{C118}$ | $R^{D2}$ | $R^{D40}$ | H |
| $L_{C119}$ | $R^{D2}$ | $R^{D41}$ | H |
| $L_{C120}$ | $R^{D2}$ | $R^{D42}$ | H |
| $L_{C121}$ | $R^{D2}$ | $R^{D64}$ | H |
| $L_{C122}$ | $R^{D}$ | $R^{D66}$ | H |
| $L_{C123}$ | $R^{D}$ | $R^{D68}$ | H |
| $L_{C124}$ | $R^{D}$ | $R^{D76}$ | H |
| $L_{C125}$ | $R^{D3}$ | $R^{D4}$ | H |
| $L_{C126}$ | $R^{D3}$ | $R^{D5}$ | H |
| $L_{C127}$ | $R^{D3}$ | $R^{D6}$ | H |
| $L_{C128}$ | $R^{D3}$ | $R^{D7}$ | H |
| $L_{C129}$ | $R^{D3}$ | $R^{D8}$ | H |
| $L_{C130}$ | $R^{D3}$ | $R^{D9}$ | H |
| $L_{C131}$ | $R^{D3}$ | $R^{D10}$ | H |
| $L_{C132}$ | $R^{D3}$ | $R^{D11}$ | H |
| $L_{C133}$ | $R^{D3}$ | $R^{D12}$ | H |
| $L_{C134}$ | $R^{D3}$ | $R^{D13}$ | H |
| $L_{C135}$ | $R^{D3}$ | $R^{D14}$ | H |
| $L_{C136}$ | $R^{D3}$ | $R^{D15}$ | H |
| $L_{C137}$ | $R^{D3}$ | $R^{D16}$ | H |
| $L_{C138}$ | $R^{D3}$ | $R^{D17}$ | H |
| $L_{C139}$ | $R^{D3}$ | $R^{D18}$ | H |

-continued

| Ligand | $R^1$ | $R^2$ | $R^3$ |
|---|---|---|---|
| $L_{C140}$ | $R^{D3}$ | $R^{D19}$ | H |
| $L_{C141}$ | $R^{D3}$ | $R^{D20}$ | H |
| $L_{C142}$ | $R^{D3}$ | $R^{D21}$ | H |
| $L_{C143}$ | $R^{D3}$ | $R^{D22}$ | H |
| $L_{C144}$ | $R^{D3}$ | $R^{D23}$ | H |
| $L_{C145}$ | $R^{D3}$ | $R^{D24}$ | H |
| $L_{C146}$ | $R^{D3}$ | $R^{D25}$ | H |
| $L_{C147}$ | $R^{D3}$ | $R^{D26}$ | H |
| $L_{C148}$ | $R^{D3}$ | $R^{D27}$ | H |
| $L_{C149}$ | $R^{D3}$ | $R^{D28}$ | H |
| $L_{C150}$ | $R^{D3}$ | $R^{D29}$ | H |
| $L_{C151}$ | $R^{D3}$ | $R^{D30}$ | H |
| $L_{C152}$ | $R^{D3}$ | $R^{D31}$ | H |
| $L_{C153}$ | $R^{D3}$ | $R^{D32}$ | H |
| $L_{C154}$ | $R^{D3}$ | $R^{D33}$ | H |
| $L_{C155}$ | $R^{D3}$ | $R^{D34}$ | H |
| $L_{C156}$ | $R^{D3}$ | $R^{D35}$ | H |
| $L_{C157}$ | $R^{D3}$ | $R^{D40}$ | H |
| $L_{C158}$ | $R^{D3}$ | $R^{D41}$ | H |
| $L_{C159}$ | $R^{D3}$ | $R^{D42}$ | H |
| $L_{C160}$ | $R^{D3}$ | $R^{D64}$ | H |
| $L_{C161}$ | $R^{D3}$ | $R^{D66}$ | H |
| $L_{C162}$ | $R^{D3}$ | $R^{D68}$ | H |
| $L_{C163}$ | $R^{D3}$ | $R^{D76}$ | H |
| $L_{C164}$ | $R^{D4}$ | $R^{D5}$ | H |
| $L_{C165}$ | $R^{D4}$ | $R^{D6}$ | H |
| $L_{C166}$ | $R^{D4}$ | $R^{D7}$ | H |
| $L_{C167}$ | $R^{D4}$ | $R^{D8}$ | H |
| $L_{C168}$ | $R^{D4}$ | $R^{D9}$ | H |
| $L_{C169}$ | $R^{D4}$ | $R^{D10}$ | H |
| $L_{C170}$ | $R^{D4}$ | $R^{D11}$ | H |
| $L_{C171}$ | $R^{D4}$ | $R^{D12}$ | H |
| $L_{C172}$ | $R^{D4}$ | $R^{D13}$ | H |
| $L_{C173}$ | $R^{D4}$ | $R^{D14}$ | H |
| $L_{C174}$ | $R^{D4}$ | $R^{D15}$ | H |
| $L_{C175}$ | $R^{D4}$ | $R^{D16}$ | H |
| $L_{C176}$ | $R^{D4}$ | $R^{D17}$ | H |
| $L_{C177}$ | $R^{D4}$ | $R^{D18}$ | H |
| $L_{C178}$ | $R^{D4}$ | $R^{D19}$ | H |
| $L_{C179}$ | $R^{D4}$ | $R^{D20}$ | H |
| $L_{C180}$ | $R^{D4}$ | $R^{D21}$ | H |
| $L_{C181}$ | $R^{D4}$ | $R^{D22}$ | H |
| $L_{C182}$ | $R^{D4}$ | $R^{D23}$ | H |
| $L_{C183}$ | $R^{D4}$ | $R^{D24}$ | H |
| $L_{C184}$ | $R^{D4}$ | $R^{D25}$ | H |
| $L_{C185}$ | $R^{D4}$ | $R^{D26}$ | H |
| $L_{C186}$ | $R^{D4}$ | $R^{D27}$ | H |
| $L_{C187}$ | $R^{D4}$ | $R^{D28}$ | H |
| $L_{C188}$ | $R^{D4}$ | $R^{D29}$ | H |
| $L_{C189}$ | $R^{D4}$ | $R^{D30}$ | H |
| $L_{C190}$ | $R^{D4}$ | $R^{D31}$ | H |
| $L_{C191}$ | $R^{D4}$ | $R^{D32}$ | H |
| $L_{C192}$ | $R^{D4}$ | $R^{D33}$ | H |
| $L_{C193}$ | $R^{D4}$ | $R^{D34}$ | H |
| $L_{C194}$ | $R^{D4}$ | $R^{D35}$ | H |
| $L_{C195}$ | $R^{D4}$ | $R^{D40}$ | H |
| $L_{C196}$ | $R^{D4}$ | $R^{D41}$ | H |
| $L_{C197}$ | $R^{D4}$ | $R^{D42}$ | H |
| $L_{C198}$ | $R^{D4}$ | $R^{D64}$ | H |
| $L_{C199}$ | $R^{D4}$ | $R^{D66}$ | H |
| $L_{C200}$ | $R^{D4}$ | $R^{D68}$ | H |
| $L_{C201}$ | $R^{D4}$ | $R^{D76}$ | H |
| $L_{C202}$ | $R^{D4}$ | $R^{D1}$ | H |
| $L_{C203}$ | $R^{D7}$ | $R^{D5}$ | H |
| $L_{C204}$ | $R^{D7}$ | $R^{D6}$ | H |
| $L_{C205}$ | $R^{D7}$ | $R^{D8}$ | H |
| $L_{C206}$ | $R^{D7}$ | $R^{D9}$ | H |
| $L_{C207}$ | $R^{D7}$ | $R^{D10}$ | H |
| $L_{C208}$ | $R^{D7}$ | $R^{D11}$ | H |
| $L_{C209}$ | $R^{D7}$ | $R^{D12}$ | H |
| $L_{C210}$ | $R^{D7}$ | $R^{D13}$ | H |
| $L_{C211}$ | $R^{D7}$ | $R^{D14}$ | H |
| $L_{C212}$ | $R^{D7}$ | $R^{D15}$ | H |
| $L_{C213}$ | $R^{D7}$ | $R^{D16}$ | H |
| $L_{C214}$ | $R^{D7}$ | $R^{D17}$ | H |
| $L_{C215}$ | $R^{D7}$ | $R^{D18}$ | H |
| $L_{C216}$ | $R^{D7}$ | $R^{D19}$ | H |

-continued

| Ligand | $R^1$ | $R^2$ | $R^3$ |
|---|---|---|---|
| $L_{C217}$ | $R^{D7}$ | $R^{D20}$ | H |
| $L_{C218}$ | $R^{D7}$ | $R^{D21}$ | H |
| $L_{C219}$ | $R^{D7}$ | $R^{D22}$ | H |
| $L_{C220}$ | $R^{D7}$ | $R^{D23}$ | H |
| $L_{C221}$ | $R^{D7}$ | $R^{D24}$ | H |
| $L_{C222}$ | $R^{D7}$ | $R^{D25}$ | H |
| $L_{C223}$ | $R^{D7}$ | $R^{D26}$ | H |
| $L_{C224}$ | $R^{D7}$ | $R^{D27}$ | H |
| $L_{C225}$ | $R^{D7}$ | $R^{D28}$ | H |
| $L_{C226}$ | $R^{D7}$ | $R^{D29}$ | H |
| $L_{C227}$ | $R^{D7}$ | $R^{D30}$ | H |
| $L_{C228}$ | $R^{D7}$ | $R^{D31}$ | H |
| $L_{C229}$ | $R^{D7}$ | $R^{D32}$ | H |
| $L_{C230}$ | $R^{D7}$ | $R^{D33}$ | H |
| $L_{C231}$ | $R^{D7}$ | $R^{D34}$ | H |
| $L_{C232}$ | $R^{D7}$ | $R^{D35}$ | H |
| $L_{C233}$ | $R^{D7}$ | $R^{D40}$ | H |
| $L_{C234}$ | $R^{D7}$ | $R^{D41}$ | H |
| $L_{C235}$ | $R^{D7}$ | $R^{D42}$ | H |
| $L_{C236}$ | $R^{D7}$ | $R^{D64}$ | H |
| $L_{C237}$ | $R^{D7}$ | $R^{D66}$ | H |
| $L_{C238}$ | $R^{D7}$ | $R^{D68}$ | H |
| $L_{C239}$ | $R^{D7}$ | $R^{D76}$ | H |
| $L_{C240}$ | $R^{D8}$ | $R^{D5}$ | H |
| $L_{C241}$ | $R^{D8}$ | $R^{D6}$ | H |
| $L_{C242}$ | $R^{D8}$ | $R^{D9}$ | H |
| $L_{C243}$ | $R^{D8}$ | $R^{D10}$ | H |
| $L_{C244}$ | $R^{D8}$ | $R^{D11}$ | H |
| $L_{C245}$ | $R^{D8}$ | $R^{D12}$ | H |
| $L_{C246}$ | $R^{D8}$ | $R^{D13}$ | H |
| $L_{C247}$ | $R^{D8}$ | $R^{D14}$ | H |
| $L_{C248}$ | $R^{D8}$ | $R^{D15}$ | H |
| $L_{C249}$ | $R^{D8}$ | $R^{D16}$ | H |
| $L_{C250}$ | $R^{D8}$ | $R^{D17}$ | H |
| $L_{C251}$ | $R^{D8}$ | $R^{D18}$ | H |
| $L_{C252}$ | $R^{D8}$ | $R^{D19}$ | H |
| $L_{C253}$ | $R^{D8}$ | $R^{D20}$ | H |
| $L_{C254}$ | $R^{D8}$ | $R^{D21}$ | H |
| $L_{C255}$ | $R^{D8}$ | $R^{D22}$ | H |
| $L_{C256}$ | $R^{D8}$ | $R^{D23}$ | H |
| $L_{C257}$ | $R^{D8}$ | $R^{D24}$ | H |
| $L_{C258}$ | $R^{D8}$ | $R^{D25}$ | H |
| $L_{C259}$ | $R^{D8}$ | $R^{D26}$ | H |
| $L_{C260}$ | $R^{D8}$ | $R^{D27}$ | H |
| $L_{C261}$ | $R^{D8}$ | $R^{D28}$ | H |
| $L_{C262}$ | $R^{D8}$ | $R^{D29}$ | H |
| $L_{C263}$ | $R^{D8}$ | $R^{D30}$ | H |
| $L_{C264}$ | $R^{D8}$ | $R^{D31}$ | H |
| $L_{C265}$ | $R^{D8}$ | $R^{D32}$ | H |
| $L_{C266}$ | $R^{D8}$ | $R^{D33}$ | H |
| $L_{C267}$ | $R^{D8}$ | $R^{D34}$ | H |
| $L_{C268}$ | $R^{D8}$ | $R^{D35}$ | H |
| $L_{C269}$ | $R^{D8}$ | $R^{D40}$ | H |
| $L_{C270}$ | $R^{D8}$ | $R^{D41}$ | H |
| $L_{C271}$ | $R^{D8}$ | $R^{D42}$ | H |
| $L_{C272}$ | $R^{D8}$ | $R^{D64}$ | H |
| $L_{C273}$ | $R^{D8}$ | $R^{D66}$ | H |
| $L_{C274}$ | $R^{D8}$ | $R^{D68}$ | H |
| $L_{C275}$ | $R^{D8}$ | $R^{D76}$ | H |
| $L_{C276}$ | $R^{D11}$ | $R^{D5}$ | H |
| $L_{C277}$ | $R^{D11}$ | $R^{D6}$ | H |
| $L_{C278}$ | $R^{D11}$ | $R^{D9}$ | H |
| $L_{C279}$ | $R^{D11}$ | $R^{D10}$ | H |
| $L_{C280}$ | $R^{D11}$ | $R^{D12}$ | H |
| $L_{C281}$ | $R^{D11}$ | $R^{D13}$ | H |
| $L_{C282}$ | $R^{D11}$ | $R^{D14}$ | H |
| $L_{C283}$ | $R^{D11}$ | $R^{D15}$ | H |
| $L_{C284}$ | $R^{D11}$ | $R^{D16}$ | H |
| $L_{C285}$ | $R^{D11}$ | $R^{D17}$ | H |
| $L_{C286}$ | $R^{D11}$ | $R^{D18}$ | H |
| $L_{C287}$ | $R^{D11}$ | $R^{D19}$ | H |
| $L_{C288}$ | $R^{D11}$ | $R^{D20}$ | H |
| $L_{C289}$ | $R^{D11}$ | $R^{D21}$ | H |
| $L_{C290}$ | $R^{D11}$ | $R^{D22}$ | H |
| $L_{C291}$ | $R^{D11}$ | $R^{D23}$ | H |
| $L_{C292}$ | $R^{D11}$ | $R^{D24}$ | H |
| $L_{C293}$ | $R^{D11}$ | $R^{D25}$ | H |

-continued

| Ligand | $R^1$ | $R^2$ | $R^3$ |
|---|---|---|---|
| $L_{C294}$ | $R^{D11}$ | $R^{D26}$ | H |
| $L_{C295}$ | $R^{D11}$ | $R^{D27}$ | H |
| $L_{C296}$ | $R^{D11}$ | $R^{D28}$ | H |
| $L_{C297}$ | $R^{D11}$ | $R^{D29}$ | H |
| $L_{C298}$ | $R^{D11}$ | $R^{D30}$ | H |
| $L_{C299}$ | $R^{D11}$ | $R^{D31}$ | H |
| $L_{C300}$ | $R^{D11}$ | $R^{D32}$ | H |
| $L_{C301}$ | $R^{D11}$ | $R^{D33}$ | H |
| $L_{C302}$ | $R^{D11}$ | $R^{D34}$ | H |
| $L_{C303}$ | $R^{D11}$ | $R^{D35}$ | H |
| $L_{C304}$ | $R^{D11}$ | $R^{D40}$ | H |
| $L_{C305}$ | $R^{D11}$ | $R^{D41}$ | H |
| $L_{C306}$ | $R^{D11}$ | $R^{D42}$ | H |
| $L_{C307}$ | $R^{D11}$ | $R^{D64}$ | H |
| $L_{C308}$ | $R^{D11}$ | $R^{D66}$ | H |
| $L_{C309}$ | $R^{D11}$ | $R^{D68}$ | H |
| $L_{C310}$ | $R^{D11}$ | $R^{D76}$ | H |
| $L_{C311}$ | $R^{D13}$ | $R^{D5}$ | H |
| $L_{C312}$ | $R^{D13}$ | $R^{D6}$ | H |
| $L_{C313}$ | $R^{D13}$ | $R^{D9}$ | H |
| $L_{C314}$ | $R^{D13}$ | $R^{D10}$ | H |
| $L_{C315}$ | $R^{D13}$ | $R^{D12}$ | H |
| $L_{C316}$ | $R^{D13}$ | $R^{D14}$ | H |
| $L_{C317}$ | $R^{D13}$ | $R^{D15}$ | H |
| $L_{C318}$ | $R^{D13}$ | $R^{D16}$ | H |
| $L_{C319}$ | $R^{D13}$ | $R^{D17}$ | H |
| $L_{C320}$ | $R^{D13}$ | $R^{D18}$ | H |
| $L_{C321}$ | $R^{D13}$ | $R^{D19}$ | H |
| $L_{C322}$ | $R^{D13}$ | $R^{D20}$ | H |
| $L_{C323}$ | $R^{D13}$ | $R^{D21}$ | H |
| $L_{C324}$ | $R^{D13}$ | $R^{D22}$ | H |
| $L_{C325}$ | $R^{D13}$ | $R^{D23}$ | H |
| $L_{C326}$ | $R^{D13}$ | $R^{D24}$ | H |
| $L_{C327}$ | $R^{D13}$ | $R^{D25}$ | H |
| $L_{C328}$ | $R^{D13}$ | $R^{D26}$ | H |
| $L_{C329}$ | $R^{D13}$ | $R^{D27}$ | H |
| $L_{C330}$ | $R^{D13}$ | $R^{D28}$ | H |
| $L_{C331}$ | $R^{D13}$ | $R^{D29}$ | H |
| $L_{C332}$ | $R^{D13}$ | $R^{D30}$ | H |
| $L_{C333}$ | $R^{D13}$ | $R^{D31}$ | H |
| $L_{C334}$ | $R^{D13}$ | $R^{D32}$ | H |
| $L_{C335}$ | $R^{D13}$ | $R^{D33}$ | H |
| $L_{C336}$ | $R^{D13}$ | $R^{D34}$ | H |
| $L_{C337}$ | $R^{D13}$ | $R^{D35}$ | H |
| $L_{C338}$ | $R^{D13}$ | $R^{D40}$ | H |
| $L_{C339}$ | $R^{D13}$ | $R^{D41}$ | H |
| $L_{C340}$ | $R^{D13}$ | $R^{D42}$ | H |
| $L_{C341}$ | $R^{D13}$ | $R^{D64}$ | H |
| $L_{C342}$ | $R^{D13}$ | $R^{D66}$ | H |
| $L_{C343}$ | $R^{D13}$ | $R^{D68}$ | H |
| $L_{C344}$ | $R^{D13}$ | $R^{D76}$ | H |
| $L_{C345}$ | $R^{D14}$ | $R^{D5}$ | H |
| $L_{C346}$ | $R^{D14}$ | $R^{D6}$ | H |
| $L_{C347}$ | $R^{D14}$ | $R^{D9}$ | H |
| $L_{C348}$ | $R^{D14}$ | $R^{D10}$ | H |
| $L_{C349}$ | $R^{D14}$ | $R^{D12}$ | H |
| $L_{C350}$ | $R^{D14}$ | $R^{D15}$ | H |
| $L_{C351}$ | $R^{D14}$ | $R^{D16}$ | H |
| $L_{C352}$ | $R^{D14}$ | $R^{D17}$ | H |
| $L_{C353}$ | $R^{D14}$ | $R^{D18}$ | H |
| $L_{C354}$ | $R^{D14}$ | $R^{D19}$ | H |
| $L_{C355}$ | $R^{D14}$ | $R^{D20}$ | H |
| $L_{C356}$ | $R^{D14}$ | $R^{D21}$ | H |
| $L_{C357}$ | $R^{D14}$ | $R^{D22}$ | H |
| $L_{C358}$ | $R^{D14}$ | $R^{D23}$ | H |
| $L_{C359}$ | $R^{D14}$ | $R^{D24}$ | H |
| $L_{C360}$ | $R^{D14}$ | $R^{D25}$ | H |
| $L_{C361}$ | $R^{D14}$ | $R^{D26}$ | H |
| $L_{C362}$ | $R^{D14}$ | $R^{D27}$ | H |
| $L_{C363}$ | $R^{D14}$ | $R^{D28}$ | H |
| $L_{C364}$ | $R^{D14}$ | $R^{D29}$ | H |
| $L_{C365}$ | $R^{D14}$ | $R^{D30}$ | H |
| $L_{C366}$ | $R^{D14}$ | $R^{D31}$ | H |
| $L_{C367}$ | $R^{D14}$ | $R^{D32}$ | H |
| $L_{C368}$ | $R^{D14}$ | $R^{D33}$ | H |
| $L_{C369}$ | $R^{D14}$ | $R^{D34}$ | H |
| $L_{C370}$ | $R^{D14}$ | $R^{D35}$ | H |

-continued

| Ligand | $R^1$ | $R^2$ | $R^3$ |
|---|---|---|---|
| $L_{C371}$ | $R^{D14}$ | $R^{D40}$ | H |
| $L_{C372}$ | $R^{D14}$ | $R^{D41}$ | H |
| $L_{C373}$ | $R^{D14}$ | $R^{D42}$ | H |
| $L_{C374}$ | $R^{D14}$ | $R^{D64}$ | H |
| $L_{C375}$ | $R^{D14}$ | $R^{D66}$ | H |
| $L_{C376}$ | $R^{D14}$ | $R^{D68}$ | H |
| $L_{C377}$ | $R^{D14}$ | $R^{D76}$ | H |
| $L_{C378}$ | $R^{D22}$ | $R^{D5}$ | H |
| $L_{C379}$ | $R^{D22}$ | $R^{D6}$ | H |
| $L_{C380}$ | $R^{D22}$ | $R^{D9}$ | H |
| $L_{C381}$ | $R^{D22}$ | $R^{D10}$ | H |
| $L_{C382}$ | $R^{D22}$ | $R^{D12}$ | H |
| $L_{C383}$ | $R^{D22}$ | $R^{D15}$ | H |
| $L_{C384}$ | $R^{D22}$ | $R^{D16}$ | H |
| $L_{C385}$ | $R^{D22}$ | $R^{D17}$ | H |
| $L_{C386}$ | $R^{D22}$ | $R^{D18}$ | H |
| $L_{C387}$ | $R^{D22}$ | $R^{D19}$ | H |
| $L_{C388}$ | $R^{D22}$ | $R^{D20}$ | H |
| $L_{C389}$ | $R^{D22}$ | $R^{D21}$ | H |
| $L_{C390}$ | $R^{D22}$ | $R^{D23}$ | H |
| $L_{C391}$ | $R^{D22}$ | $R^{D24}$ | H |
| $L_{C392}$ | $R^{D22}$ | $R^{D25}$ | H |
| $L_{C393}$ | $R^{D22}$ | $R^{D26}$ | H |
| $L_{C394}$ | $R^{D22}$ | $R^{D27}$ | H |
| $L_{C395}$ | $R^{D22}$ | $R^{D28}$ | H |
| $L_{C396}$ | $R^{D22}$ | $R^{D29}$ | H |
| $L_{C397}$ | $R^{D22}$ | $R^{D30}$ | H |
| $L_{C398}$ | $R^{D22}$ | $R^{D31}$ | H |
| $L_{C399}$ | $R^{D22}$ | $R^{D32}$ | H |
| $L_{C400}$ | $R^{D22}$ | $R^{D33}$ | H |
| $L_{C401}$ | $R^{D22}$ | $R^{D34}$ | H |
| $L_{C402}$ | $R^{D22}$ | $R^{D35}$ | H |
| $L_{C403}$ | $R^{D22}$ | $R^{D40}$ | H |
| $L_{C404}$ | $R^{D22}$ | $R^{D41}$ | H |
| $L_{C405}$ | $R^{D22}$ | $R^{D42}$ | H |
| $L_{C406}$ | $R^{D22}$ | $R^{D64}$ | H |
| $L_{C407}$ | $R^{D22}$ | $R^{D66}$ | H |
| $L_{C408}$ | $R^{D22}$ | $R^{D68}$ | H |
| $L_{C409}$ | $R^{D22}$ | $R^{D76}$ | H |
| $L_{C410}$ | $R^{D26}$ | $R^{D5}$ | H |
| $L_{C411}$ | $R^{D26}$ | $R^{D6}$ | H |
| $L_{C412}$ | $R^{D26}$ | $R^{D9}$ | H |
| $L_{C413}$ | $R^{D26}$ | $R^{D10}$ | H |
| $L_{C414}$ | $R^{D26}$ | $R^{D12}$ | H |
| $L_{C415}$ | $R^{D26}$ | $R^{D15}$ | H |
| $L_{C416}$ | $R^{D26}$ | $R^{D16}$ | H |
| $L_{C417}$ | $R^{D26}$ | $R^{D17}$ | H |
| $L_{C418}$ | $R^{D26}$ | $R^{D18}$ | H |
| $L_{C419}$ | $R^{D26}$ | $R^{D19}$ | H |
| $L_{C420}$ | $R^{D26}$ | $R^{D20}$ | H |
| $L_{C421}$ | $R^{D26}$ | $R^{D21}$ | H |
| $L_{C422}$ | $R^{D26}$ | $R^{D23}$ | H |
| $L_{C423}$ | $R^{D26}$ | $R^{D24}$ | H |
| $L_{C424}$ | $R^{D26}$ | $R^{D25}$ | H |
| $L_{C425}$ | $R^{D26}$ | $R^{D27}$ | H |
| $L_{C426}$ | $R^{D26}$ | $R^{D28}$ | H |
| $L_{C427}$ | $R^{D26}$ | $R^{D29}$ | H |
| $L_{C428}$ | $R^{D26}$ | $R^{D30}$ | H |
| $L_{C429}$ | $R^{D26}$ | $R^{D31}$ | H |
| $L_{C430}$ | $R^{D26}$ | $R^{D32}$ | H |
| $L_{C431}$ | $R^{D26}$ | $R^{D33}$ | H |
| $L_{C432}$ | $R^{D26}$ | $R^{D34}$ | H |
| $L_{C433}$ | $R^{D26}$ | $R^{D35}$ | H |
| $L_{C434}$ | $R^{D26}$ | $R^{D40}$ | H |
| $L_{C435}$ | $R^{D26}$ | $R^{D41}$ | H |
| $L_{C436}$ | $R^{D26}$ | $R^{D42}$ | H |
| $L_{C437}$ | $R^{D26}$ | $R^{D64}$ | H |
| $L_{C438}$ | $R^{D26}$ | $R^{D66}$ | H |
| $L_{C439}$ | $R^{D26}$ | $R^{D68}$ | H |
| $L_{C440}$ | $R^{D26}$ | $R^{D76}$ | H |
| $L_{C441}$ | $R^{D35}$ | $R^{D5}$ | H |
| $L_{C442}$ | $R^{D35}$ | $R^{D6}$ | H |
| $L_{C443}$ | $R^{D35}$ | $R^{D9}$ | H |
| $L_{C444}$ | $R^{D35}$ | $R^{D10}$ | H |
| $L_{C445}$ | $R^{D35}$ | $R^{D12}$ | H |
| $L_{C446}$ | $R^{D35}$ | $R^{D15}$ | H |
| $L_{C447}$ | $R^{D35}$ | $R^{D16}$ | H |

-continued

| Ligand | $R^1$ | $R^2$ | $R^3$ |
|---|---|---|---|
| $L_{C448}$ | $R^{D35}$ | $R^{D17}$ | H |
| $L_{C449}$ | $R^{D35}$ | $R^{D18}$ | H |
| $L_{C450}$ | $R^{D35}$ | $R^{D19}$ | H |
| $L_{C451}$ | $R^{D35}$ | $R^{D20}$ | H |
| $L_{C452}$ | $R^{D35}$ | $R^{D21}$ | H |
| $L_{C453}$ | $R^{D35}$ | $R^{D23}$ | H |
| $L_{C454}$ | $R^{D35}$ | $R^{D24}$ | H |
| $L_{C455}$ | $R^{D35}$ | $R^{D25}$ | H |
| $L_{C456}$ | $R^{D35}$ | $R^{D27}$ | H |
| $L_{C457}$ | $R^{D35}$ | $R^{D28}$ | H |
| $L_{C458}$ | $R^{D35}$ | $R^{D29}$ | H |
| $L_{C459}$ | $R^{D35}$ | $R^{D30}$ | H |
| $L_{C460}$ | $R^{D35}$ | $R^{D31}$ | H |
| $L_{C461}$ | $R^{D35}$ | $R^{D32}$ | H |
| $L_{C462}$ | $R^{D35}$ | $R^{D33}$ | H |
| $L_{C463}$ | $R^{D35}$ | $R^{D34}$ | H |
| $L_{C464}$ | $R^{D35}$ | $R^{D40}$ | H |
| $L_{C465}$ | $R^{D35}$ | $R^{D41}$ | H |
| $L_{C466}$ | $R^{D35}$ | $R^{D42}$ | H |
| $L_{C467}$ | $R^{D35}$ | $R^{D64}$ | H |
| $L_{C468}$ | $R^{D35}$ | $R^{D66}$ | H |
| $L_{C469}$ | $R^{D35}$ | $R^{D68}$ | H |
| $L_{C470}$ | $R^{D35}$ | $R^{D76}$ | H |
| $L_{C471}$ | $R^{D40}$ | $R^{D5}$ | H |
| $L_{C472}$ | $R^{D40}$ | $R^{D6}$ | H |
| $L_{C473}$ | $R^{D40}$ | $R^{D9}$ | H |
| $L_{C474}$ | $R^{D40}$ | $R^{D10}$ | H |
| $L_{C475}$ | $R^{D40}$ | $R^{D12}$ | H |
| $L_{C476}$ | $R^{D40}$ | $R^{D15}$ | H |
| $L_{C477}$ | $R^{D40}$ | $R^{D16}$ | H |
| $L_{C478}$ | $R^{D40}$ | $R^{D17}$ | H |
| $L_{C479}$ | $R^{D40}$ | $R^{D18}$ | H |
| $L_{C480}$ | $R^{D40}$ | $R^{D19}$ | H |
| $L_{C481}$ | $R^{D40}$ | $R^{D20}$ | H |
| $L_{C482}$ | $R^{D40}$ | $R^{D21}$ | H |
| $L_{C483}$ | $R^{D40}$ | $R^{D23}$ | H |
| $L_{C484}$ | $R^{D40}$ | $R^{D24}$ | H |
| $L_{C485}$ | $R^{D40}$ | $R^{D25}$ | H |
| $L_{C486}$ | $R^{D40}$ | $R^{D27}$ | H |
| $L_{C487}$ | $R^{D40}$ | $R^{D28}$ | H |
| $L_{C488}$ | $R^{D40}$ | $R^{D29}$ | H |
| $L_{C489}$ | $R^{D40}$ | $R^{D30}$ | H |
| $L_{C490}$ | $R^{D40}$ | $R^{D31}$ | H |
| $L_{C491}$ | $R^{D40}$ | $R^{D32}$ | H |
| $L_{C492}$ | $R^{D40}$ | $R^{D33}$ | H |
| $L_{C493}$ | $R^{D40}$ | $R^{D34}$ | H |
| $L_{C494}$ | $R^{D40}$ | $R^{D41}$ | H |
| $L_{C495}$ | $R^{D40}$ | $R^{D42}$ | H |
| $L_{C496}$ | $R^{D40}$ | $R^{D64}$ | H |
| $L_{C497}$ | $R^{D40}$ | $R^{D66}$ | H |
| $L_{C498}$ | $R^{D40}$ | $R^{D68}$ | H |
| $L_{C499}$ | $R^{D40}$ | $R^{D76}$ | H |
| $L_{C500}$ | $R^{D41}$ | $R^{D5}$ | H |
| $L_{C501}$ | $R^{D41}$ | $R^{D6}$ | H |
| $L_{C502}$ | $R^{D41}$ | $R^{D9}$ | H |
| $L_{C503}$ | $R^{D41}$ | $R^{D10}$ | H |
| $L_{C504}$ | $R^{D41}$ | $R^{D12}$ | H |
| $L_{C505}$ | $R^{D41}$ | $R^{D15}$ | H |
| $L_{C506}$ | $R^{D41}$ | $R^{D16}$ | H |
| $L_{C507}$ | $R^{D41}$ | $R^{D17}$ | H |
| $L_{C508}$ | $R^{D41}$ | $R^{D18}$ | H |
| $L_{C509}$ | $R^{D41}$ | $R^{D19}$ | H |
| $L_{C510}$ | $R^{D41}$ | $R^{D20}$ | H |
| $L_{C511}$ | $R^{D41}$ | $R^{D21}$ | H |
| $L_{C512}$ | $R^{D41}$ | $R^{D23}$ | H |
| $L_{C513}$ | $R^{D41}$ | $R^{D24}$ | H |
| $L_{C514}$ | $R^{D41}$ | $R^{D25}$ | H |
| $L_{C515}$ | $R^{D41}$ | $R^{D27}$ | H |
| $L_{C516}$ | $R^{D41}$ | $R^{D28}$ | H |
| $L_{C517}$ | $R^{D41}$ | $R^{D29}$ | H |
| $L_{C518}$ | $R^{D41}$ | $R^{D30}$ | H |
| $L_{C519}$ | $R^{D41}$ | $R^{D31}$ | H |
| $L_{C520}$ | $R^{D41}$ | $R^{D32}$ | H |
| $L_{C521}$ | $R^{D41}$ | $R^{D33}$ | H |
| $L_{C522}$ | $R^{D41}$ | $R^{D34}$ | H |
| $L_{C523}$ | $R^{D41}$ | $R^{D42}$ | H |
| $L_{C524}$ | $R^{D41}$ | $R^{D64}$ | H |

-continued

| Ligand | $R^1$ | $R^2$ | $R^3$ |
|---|---|---|---|
| $L_{C525}$ | $R^{D41}$ | $R^{D66}$ | H |
| $L_{C526}$ | $R^{D41}$ | $R^{D68}$ | H |
| $L_{C527}$ | $R^{D41}$ | $R^{D76}$ | H |
| $L_{C528}$ | $R^{D64}$ | $R^{D5}$ | H |
| $L_{C529}$ | $R^{D64}$ | $R^{D6}$ | H |
| $L_{C530}$ | $R^{D64}$ | $R^{D9}$ | H |
| $L_{C531}$ | $R^{D64}$ | $R^{D10}$ | H |
| $L_{C532}$ | $R^{D64}$ | $R^{D12}$ | H |
| $L_{C533}$ | $R^{D64}$ | $R^{D15}$ | H |
| $L_{C534}$ | $R^{D64}$ | $R^{D16}$ | H |
| $L_{C535}$ | $R^{D64}$ | $R^{D17}$ | H |
| $L_{C536}$ | $R^{D64}$ | $R^{D18}$ | H |
| $L_{C537}$ | $R^{D64}$ | $R^{D19}$ | H |
| $L_{C538}$ | $R^{D64}$ | $R^{D20}$ | H |
| $L_{C539}$ | $R^{D64}$ | $R^{D21}$ | H |
| $L_{C540}$ | $R^{D64}$ | $R^{D23}$ | H |
| $L_{C541}$ | $R^{D64}$ | $R^{D24}$ | H |
| $L_{C542}$ | $R^{D64}$ | $R^{D25}$ | H |
| $L_{C543}$ | $R^{D64}$ | $R^{D27}$ | H |
| $L_{C544}$ | $R^{D64}$ | $R^{D28}$ | H |
| $L_{C545}$ | $R^{D64}$ | $R^{D29}$ | H |
| $L_{C546}$ | $R^{D64}$ | $R^{D30}$ | H |
| $L_{C547}$ | $R^{D64}$ | $R^{D31}$ | H |
| $L_{C548}$ | $R^{D64}$ | $R^{D32}$ | H |
| $L_{C549}$ | $R^{D64}$ | $R^{D33}$ | H |
| $L_{C550}$ | $R^{D64}$ | $R^{D34}$ | H |
| $L_{C551}$ | $R^{D64}$ | $R^{D42}$ | H |
| $L_{C552}$ | $R^{D64}$ | $R^{D64}$ | H |
| $L_{C553}$ | $R^{D64}$ | $R^{D66}$ | H |
| $L_{C554}$ | $R^{D64}$ | $R^{D68}$ | H |
| $L_{C555}$ | $R^{D64}$ | $R^{D76}$ | H |
| $L_{C556}$ | $R^{D66}$ | $R^{D5}$ | H |
| $L_{C557}$ | $R^{D66}$ | $R^{D6}$ | H |
| $L_{C558}$ | $R^{D66}$ | $R^{D9}$ | H |
| $L_{C559}$ | $R^{D66}$ | $R^{D10}$ | H |
| $L_{C560}$ | $R^{D66}$ | $R^{D12}$ | H |
| $L_{C561}$ | $R^{D66}$ | $R^{D15}$ | H |
| $L_{C562}$ | $R^{D66}$ | $R^{D16}$ | H |
| $L_{C563}$ | $R^{D66}$ | $R^{D17}$ | H |
| $L_{C564}$ | $R^{D66}$ | $R^{D18}$ | H |
| $L_{C565}$ | $R^{D66}$ | $R^{D19}$ | H |
| $L_{C566}$ | $R^{D66}$ | $R^{D20}$ | H |
| $L_{C567}$ | $R^{D66}$ | $R^{D21}$ | H |
| $L_{C568}$ | $R^{D66}$ | $R^{D23}$ | H |
| $L_{C569}$ | $R^{D66}$ | $R^{D24}$ | H |
| $L_{C570}$ | $R^{D66}$ | $R^{D25}$ | H |
| $L_{C571}$ | $R^{D66}$ | $R^{D27}$ | H |
| $L_{C572}$ | $R^{D66}$ | $R^{D28}$ | H |
| $L_{C573}$ | $R^{D66}$ | $R^{D29}$ | H |
| $L_{C574}$ | $R^{D66}$ | $R^{D30}$ | H |
| $L_{C575}$ | $R^{D66}$ | $R^{D31}$ | H |
| $L_{C576}$ | $R^{D66}$ | $R^{D32}$ | H |
| $L_{C577}$ | $R^{D66}$ | $R^{D33}$ | H |
| $L_{C578}$ | $R^{D66}$ | $R^{D34}$ | H |
| $L_{C579}$ | $R^{D66}$ | $R^{D42}$ | H |
| $L_{C580}$ | $R^{D66}$ | $R^{D68}$ | H |
| $L_{C581}$ | $R^{D66}$ | $R^{D76}$ | H |
| $L_{C582}$ | $R^{D68}$ | $R^{D5}$ | H |
| $L_{C583}$ | $R^{D68}$ | $R^{D6}$ | H |
| $L_{C584}$ | $R^{D68}$ | $R^{D9}$ | H |
| $L_{C585}$ | $R^{D68}$ | $R^{D10}$ | H |
| $L_{C586}$ | $R^{D68}$ | $R^{D12}$ | H |
| $L_{C587}$ | $R^{D68}$ | $R^{D15}$ | H |
| $L_{C588}$ | $R^{D68}$ | $R^{D16}$ | H |
| $L_{C589}$ | $R^{D68}$ | $R^{D17}$ | H |
| $L_{C590}$ | $R^{D68}$ | $R^{D18}$ | H |
| $L_{C591}$ | $R^{D68}$ | $R^{D19}$ | H |
| $L_{C592}$ | $R^{D68}$ | $R^{D20}$ | H |
| $L_{C593}$ | $R^{D68}$ | $R^{D21}$ | H |
| $L_{C594}$ | $R^{D68}$ | $R^{D23}$ | H |
| $L_{C595}$ | $R^{D68}$ | $R^{D24}$ | H |
| $L_{C596}$ | $R^{D68}$ | $R^{D25}$ | H |
| $L_{C597}$ | $R^{D68}$ | $R^{D27}$ | H |
| $L_{C598}$ | $R^{D68}$ | $R^{D28}$ | H |
| $L_{C599}$ | $R^{D68}$ | $R^{D29}$ | H |
| $L_{C600}$ | $R^{D68}$ | $R^{D30}$ | H |
| $L_{C601}$ | $R^{D68}$ | $R^{D31}$ | H |

-continued

| Ligand | $R^1$ | $R^2$ | $R^3$ |
|---|---|---|---|
| $L_{C602}$ | $R^{D68}$ | $R^{D32}$ | H |
| $L_{C603}$ | $R^{D68}$ | $R^{D33}$ | H |
| $L_{C604}$ | $R^{D68}$ | $R^{D34}$ | H |
| $L_{C605}$ | $R^{D68}$ | $R^{D42}$ | H |
| $L_{C606}$ | $R^{D68}$ | $R^{D76}$ | H |
| $L_{C607}$ | $R^{D76}$ | $R^{D5}$ | H |
| $L_{C608}$ | $R^{D76}$ | $R^{D6}$ | H |
| $L_{C609}$ | $R^{D76}$ | $R^{D9}$ | H |
| $L_{C610}$ | $R^{D76}$ | $R^{D10}$ | H |
| $L_{C611}$ | $R^{D76}$ | $R^{D12}$ | H |
| $L_{C612}$ | $R^{D76}$ | $R^{D15}$ | H |
| $L_{C613}$ | $R^{D76}$ | $R^{D16}$ | H |
| $L_{C614}$ | $R^{D76}$ | $R^{D17}$ | H |
| $L_{C615}$ | $R^{D76}$ | $R^{D18}$ | H |
| $L_{C616}$ | $R^{D76}$ | $R^{D19}$ | H |
| $L_{C617}$ | $R^{D76}$ | $R^{D20}$ | H |
| $L_{C618}$ | $R^{D76}$ | $R^{D21}$ | H |
| $L_{C619}$ | $R^{D76}$ | $R^{D23}$ | H |
| $L_{C620}$ | $R^{D76}$ | $R^{D24}$ | H |
| $L_{C621}$ | $R^{D76}$ | $R^{D25}$ | H |
| $L_{C622}$ | $R^{D76}$ | $R^{D27}$ | H |
| $L_{C623}$ | $R^{D76}$ | $R^{D28}$ | H |
| $L_{C624}$ | $R^{D76}$ | $R^{D29}$ | H |
| $L_{C625}$ | $R^{D76}$ | $R^{D30}$ | H |
| $L_{C626}$ | $R^{D76}$ | $R^{D31}$ | H |
| $L_{C627}$ | $R^{D76}$ | $R^{D32}$ | H |
| $L_{C628}$ | $R^{D76}$ | $R^{D33}$ | H |
| $L_{C629}$ | $R^{D76}$ | $R^{D34}$ | H |
| $L_{C630}$ | $R^{D76}$ | $R^{D42}$ | H |
| $L_{C631}$ | $R^{D1}$ | $R^{D1}$ | $R^{D1}$ |
| $L_{C632}$ | $R^{D2}$ | $R^{D2}$ | $R^{D1}$ |
| $L_{C633}$ | $R^{D3}$ | $R^{D3}$ | $R^{D1}$ |
| $L_{C634}$ | $R^{D4}$ | $R^{D4}$ | $R^{D1}$ |
| $L_{C635}$ | $R^{D5}$ | $R^{D5}$ | $R^{D1}$ |
| $L_{C636}$ | $R^{D6}$ | $R^{D6}$ | $R^{D1}$ |
| $L_{C637}$ | $R^{D7}$ | $R^{D7}$ | $R^{D1}$ |
| $L_{C638}$ | $R^{D8}$ | $R^{D8}$ | $R^{D1}$ |
| $L_{C639}$ | $R^{D9}$ | $R^{D9}$ | $R^{D1}$ |
| $L_{C640}$ | $R^{D10}$ | $R^{D10}$ | $R^{D1}$ |
| $L_{C641}$ | $R^{D11}$ | $R^{D11}$ | $R^{D1}$ |
| $L_{C642}$ | $R^{D12}$ | $R^{D12}$ | $R^{D1}$ |
| $L_{C643}$ | $R^{D13}$ | $R^{D13}$ | $R^{D1}$ |
| $L_{C644}$ | $R^{D14}$ | $R^{D14}$ | $R^{D1}$ |
| $L_{C645}$ | $R^{D15}$ | $R^{D15}$ | $R^{D1}$ |
| $L_{C646}$ | $R^{D16}$ | $R^{D16}$ | $R^{D1}$ |
| $L_{C647}$ | $R^{D17}$ | $R^{D17}$ | $R^{D1}$ |
| $L_{C648}$ | $R^{D18}$ | $R^{D18}$ | $R^{D1}$ |
| $L_{C649}$ | $R^{D19}$ | $R^{D19}$ | $R^{D1}$ |
| $L_{C650}$ | $R^{D20}$ | $R^{D20}$ | $R^{D1}$ |
| $L_{C651}$ | $R^{D21}$ | $R^{D21}$ | $R^{D1}$ |
| $L_{C652}$ | $R^{D22}$ | $R^{D22}$ | $R^{D1}$ |
| $L_{C653}$ | $R^{D23}$ | $R^{D23}$ | $R^{D1}$ |
| $L_{C654}$ | $R^{D24}$ | $R^{D24}$ | $R^{D1}$ |
| $L_{C655}$ | $R^{D25}$ | $R^{D25}$ | $R^{D1}$ |
| $L_{C656}$ | $R^{D26}$ | $R^{D26}$ | $R^{D1}$ |
| $L_{C657}$ | $R^{D27}$ | $R^{D27}$ | $R^{D1}$ |
| $L_{C658}$ | $R^{D28}$ | $R^{D28}$ | $R^{D1}$ |
| $L_{C659}$ | $R^{D29}$ | $R^{D29}$ | $R^{D1}$ |
| $L_{C660}$ | $R^{D30}$ | $R^{D30}$ | $R^{D1}$ |
| $L_{C661}$ | $R^{D31}$ | $R^{D31}$ | $R^{D1}$ |
| $L_{C662}$ | $R^{D32}$ | $R^{D32}$ | $R^{D1}$ |
| $L_{C663}$ | $R^{D33}$ | $R^{D33}$ | $R^{D1}$ |
| $L_{C664}$ | $R^{D34}$ | $R^{D34}$ | $R^{D1}$ |
| $L_{C665}$ | $R^{D35}$ | $R^{D35}$ | $R^{D1}$ |
| $L_{C666}$ | $R^{D40}$ | $R^{D40}$ | $R^{D1}$ |
| $L_{C667}$ | $R^{D41}$ | $R^{D41}$ | $R^{D1}$ |
| $L_{C668}$ | $R^{D42}$ | $R^{D42}$ | $R^{D1}$ |
| $L_{C669}$ | $R^{D64}$ | $R^{D64}$ | $R^{D1}$ |
| $L_{C670}$ | $R^{D66}$ | $R^{D66}$ | $R^{D1}$ |
| $L_{C671}$ | $R^{D68}$ | $R^{D68}$ | $R^{D1}$ |
| $L_{C672}$ | $R^{D76}$ | $R^{D76}$ | $R^{D1}$ |
| $L_{C673}$ | $R^{D1}$ | $R^{D2}$ | $R^{D1}$ |
| $L_{C674}$ | $R^{D1}$ | $R^{D3}$ | $R^{D1}$ |
| $L_{C675}$ | $R^{D1}$ | $R^{D4}$ | $R^{D1}$ |
| $L_{C676}$ | $R^{D1}$ | $R^{D5}$ | $R^{D1}$ |
| $L_{C677}$ | $R^{D1}$ | $R^{D6}$ | $R^{D1}$ |
| $L_{C678}$ | $R^{D1}$ | $R^{D7}$ | $R^{D1}$ |

| Ligand | $R^1$ | $R^2$ | $R^3$ |
| --- | --- | --- | --- |
| $L_{C679}$ | $R^{D1}$ | $R^{D8}$ | $R^{D1}$ |
| $L_{C980}$ | $R^{D1}$ | $R^{D9}$ | $R^{D1}$ |
| $L_{C681}$ | $R^{D1}$ | $R^{D10}$ | $R^{D1}$ |
| $L_{C682}$ | $R^{D1}$ | $R^{D11}$ | $R^{D1}$ |
| $L_{C683}$ | $R^{D1}$ | $R^{D12}$ | $R^{D1}$ |
| $L_{C684}$ | $R^{D1}$ | $R^{D13}$ | $R^{D1}$ |
| $L_{C685}$ | $R^{D1}$ | $R^{D14}$ | $R^{D1}$ |
| $L_{C686}$ | $R^{D1}$ | $R^{D15}$ | $R^{D1}$ |
| $L_{C687}$ | $R^{D1}$ | $R^{D16}$ | $R^{D1}$ |
| $L_{C688}$ | $R^{D1}$ | $R^{D17}$ | $R^{D1}$ |
| $L_{C689}$ | $R^{D1}$ | $R^{D18}$ | $R^{D1}$ |
| $L_{C690}$ | $R^{D1}$ | $R^{D19}$ | $R^{D1}$ |
| $L_{C691}$ | $R^{D1}$ | $R^{D20}$ | $R^{D1}$ |
| $L_{C692}$ | $R^{D1}$ | $R^{D21}$ | $R^{D1}$ |
| $L_{C693}$ | $R^{D1}$ | $R^{D22}$ | $R^{D1}$ |
| $L_{C694}$ | $R^{D1}$ | $R^{D23}$ | $R^{D1}$ |
| $L_{C695}$ | $R^{D1}$ | $R^{D24}$ | $R^{D1}$ |
| $L_{C696}$ | $R^{D1}$ | $R^{D25}$ | $R^{D1}$ |
| $L_{C697}$ | $R^{D1}$ | $R^{D26}$ | $R^{D1}$ |
| $L_{C698}$ | $R^{D1}$ | $R^{D27}$ | $R^{D1}$ |
| $L_{C699}$ | $R^{D1}$ | $R^{D28}$ | $R^{D1}$ |
| $L_{C700}$ | $R^{D1}$ | $R^{D29}$ | $R^{D1}$ |
| $L_{C701}$ | $R^{D1}$ | $R^{D30}$ | $R^{D1}$ |
| $L_{C702}$ | $R^{D1}$ | $R^{D31}$ | $R^{D1}$ |
| $L_{C703}$ | $R^{D1}$ | $R^{D32}$ | $R^{D1}$ |
| $L_{C704}$ | $R^{D1}$ | $R^{D33}$ | $R^{D1}$ |
| $L_{C705}$ | $R^{D1}$ | $R^{D34}$ | $R^{D1}$ |
| $L_{C706}$ | $R^{D1}$ | $R^{D35}$ | $R^{D1}$ |
| $L_{C707}$ | $R^{D1}$ | $R^{D40}$ | $R^{D1}$ |
| $L_{C708}$ | $R^{D1}$ | $R^{D41}$ | $R^{D1}$ |
| $L_{C709}$ | $R^{D1}$ | $R^{D42}$ | $R^{D1}$ |
| $L_{C710}$ | $R^{D1}$ | $R^{D64}$ | $R^{D1}$ |
| $L_{C711}$ | $R^{D1}$ | $R^{D66}$ | $R^{D1}$ |
| $L_{C712}$ | $R^{D1}$ | $R^{D68}$ | $R^{D1}$ |
| $L_{C713}$ | $R^{D1}$ | $R^{D76}$ | $R^{D1}$ |
| $L_{C714}$ | $R^{D2}$ | $R^{D1}$ | $R^{D1}$ |
| $L_{C715}$ | $R^{D2}$ | $R^{D3}$ | $R^{D1}$ |
| $L_{C716}$ | $R^{D2}$ | $R^{D4}$ | $R^{D1}$ |
| $L_{C717}$ | $R^{D2}$ | $R^{D5}$ | $R^{D1}$ |
| $L_{C718}$ | $R^{D2}$ | $R^{D6}$ | $R^{D1}$ |
| $L_{C719}$ | $R^{D2}$ | $R^{D7}$ | $R^{D1}$ |
| $L_{C720}$ | $R^{D2}$ | $R^{D8}$ | $R^{D1}$ |
| $L_{C721}$ | $R^{D2}$ | $R^{D9}$ | $R^{D1}$ |
| $L_{C722}$ | $R^{D2}$ | $R^{D10}$ | $R^{D1}$ |
| $L_{C723}$ | $R^{D2}$ | $R^{D11}$ | $R^{D1}$ |
| $L_{C724}$ | $R^{D2}$ | $R^{D12}$ | $R^{D1}$ |
| $L_{C725}$ | $R^{D2}$ | $R^{D13}$ | $R^{D1}$ |
| $L_{C726}$ | $R^{D2}$ | $R^{D14}$ | $R^{D1}$ |
| $L_{C727}$ | $R^{D2}$ | $R^{D15}$ | $R^{D1}$ |
| $L_{C728}$ | $R^{D2}$ | $R^{D16}$ | $R^{D1}$ |
| $L_{C729}$ | $R^{D2}$ | $R^{D17}$ | $R^{D1}$ |
| $L_{C730}$ | $R^{D2}$ | $R^{D18}$ | $R^{D1}$ |
| $L_{C731}$ | $R^{D2}$ | $R^{D19}$ | $R^{D1}$ |
| $L_{C732}$ | $R^{D2}$ | $R^{D20}$ | $R^{D1}$ |
| $L_{C733}$ | $R^{D2}$ | $R^{D21}$ | $R^{D1}$ |
| $L_{C734}$ | $R^{D2}$ | $R^{D22}$ | $R^{D1}$ |
| $L_{C735}$ | $R^{D2}$ | $R^{D23}$ | $R^{D1}$ |
| $L_{C736}$ | $R^{D2}$ | $R^{D24}$ | $R^{D1}$ |
| $L_{C737}$ | $R^{D2}$ | $R^{D25}$ | $R^{D1}$ |
| $L_{C738}$ | $R^{D2}$ | $R^{D26}$ | $R^{D1}$ |
| $L_{C739}$ | $R^{D2}$ | $R^{D27}$ | $R^{D1}$ |
| $L_{C740}$ | $R^{D2}$ | $R^{D28}$ | $R^{D1}$ |
| $L_{C741}$ | $R^{D2}$ | $R^{D29}$ | $R^{D1}$ |
| $L_{C742}$ | $R^{D2}$ | $R^{D30}$ | $R^{D1}$ |
| $L_{C743}$ | $R^{D2}$ | $R^{D31}$ | $R^{D1}$ |
| $L_{C744}$ | $R^{D2}$ | $R^{D32}$ | $R^{D1}$ |
| $L_{C745}$ | $R^{D2}$ | $R^{D33}$ | $R^{D1}$ |
| $L_{C746}$ | $R^{D2}$ | $R^{D34}$ | $R^{D1}$ |
| $L_{C747}$ | $R^{D2}$ | $R^{D35}$ | $R^{D1}$ |
| $L_{C748}$ | $R^{D2}$ | $R^{D40}$ | $R^{D1}$ |
| $L_{C749}$ | $R^{D2}$ | $R^{D41}$ | $R^{D1}$ |
| $L_{C750}$ | $R^{D2}$ | $R^{D42}$ | $R^{D1}$ |
| $L_{C751}$ | $R^{D2}$ | $R^{D64}$ | $R^{D1}$ |
| $L_{C752}$ | $R^{D2}$ | $R^{D66}$ | $R^{D1}$ |
| $L_{C753}$ | $R^{D2}$ | $R^{D68}$ | $R^{D1}$ |
| $L_{C754}$ | $R^{D2}$ | $R^{D76}$ | $R^{D1}$ |
| $L_{C755}$ | $R^{D3}$ | $R^{D4}$ | $R^{D1}$ |

| Ligand | $R^1$ | $R^2$ | $R^3$ |
| --- | --- | --- | --- |
| $L_{C756}$ | $R^{D3}$ | $R^{D5}$ | $R^{D1}$ |
| $L_{C757}$ | $R^{D3}$ | $R^{D6}$ | $R^{D1}$ |
| $L_{C758}$ | $R^{D3}$ | $R^{D7}$ | $R^{D1}$ |
| $L_{C759}$ | $R^{D3}$ | $R^{D8}$ | $R^{D1}$ |
| $L_{C760}$ | $R^{D3}$ | $R^{D9}$ | $R^{D1}$ |
| $L_{C761}$ | $R^{D3}$ | $R^{D10}$ | $R^{D1}$ |
| $L_{C762}$ | $R^{D3}$ | $R^{D11}$ | $R^{D1}$ |
| $L_{C763}$ | $R^{D3}$ | $R^{D12}$ | $R^{D1}$ |
| $L_{C764}$ | $R^{D3}$ | $R^{D13}$ | $R^{D1}$ |
| $L_{C765}$ | $R^{D3}$ | $R^{D14}$ | $R^{D1}$ |
| $L_{C766}$ | $R^{D3}$ | $R^{D15}$ | $R^{D1}$ |
| $L_{C767}$ | $R^{D3}$ | $R^{D16}$ | $R^{D1}$ |
| $L_{C768}$ | $R^{D3}$ | $R^{D17}$ | $R^{D1}$ |
| $L_{C769}$ | $R^{D3}$ | $R^{D18}$ | $R^{D1}$ |
| $L_{C770}$ | $R^{D3}$ | $R^{D19}$ | $R^{D1}$ |
| $L_{C771}$ | $R^{D3}$ | $R^{D20}$ | $R^{D1}$ |
| $L_{C772}$ | $R^{D3}$ | $R^{D21}$ | $R^{D1}$ |
| $L_{C773}$ | $R^{D3}$ | $R^{D22}$ | $R^{D1}$ |
| $L_{C774}$ | $R^{D3}$ | $R^{D23}$ | $R^{D1}$ |
| $L_{C775}$ | $R^{D3}$ | $R^{D24}$ | $R^{D1}$ |
| $L_{C776}$ | $R^{D3}$ | $R^{D25}$ | $R^{D1}$ |
| $L_{C777}$ | $R^{D3}$ | $R^{D26}$ | $R^{D1}$ |
| $L_{C778}$ | $R^{D3}$ | $R^{D27}$ | $R^{D1}$ |
| $L_{C779}$ | $R^{D3}$ | $R^{D28}$ | $R^{D1}$ |
| $L_{C780}$ | $R^{D3}$ | $R^{D29}$ | $R^{D1}$ |
| $L_{C781}$ | $R^{D3}$ | $R^{D30}$ | $R^{D1}$ |
| $L_{C782}$ | $R^{D3}$ | $R^{D31}$ | $R^{D1}$ |
| $L_{C783}$ | $R^{D3}$ | $R^{D32}$ | $R^{D1}$ |
| $L_{C784}$ | $R^{D3}$ | $R^{D33}$ | $R^{D1}$ |
| $L_{C785}$ | $R^{D3}$ | $R^{D34}$ | $R^{D1}$ |
| $L_{C786}$ | $R^{D3}$ | $R^{D35}$ | $R^{D1}$ |
| $L_{C787}$ | $R^{D3}$ | $R^{D40}$ | $R^{D1}$ |
| $L_{C788}$ | $R^{D3}$ | $R^{D41}$ | $R^{D1}$ |
| $L_{C789}$ | $R^{D3}$ | $R^{D42}$ | $R^{D1}$ |
| $L_{C790}$ | $R^{D3}$ | $R^{D64}$ | $R^{D1}$ |
| $L_{C791}$ | $R^{D3}$ | $R^{D66}$ | $R^{D1}$ |
| $L_{C792}$ | $R^{D3}$ | $R^{D68}$ | $R^{D1}$ |
| $L_{C793}$ | $R^{D3}$ | $R^{D76}$ | $R^{D1}$ |
| $L_{C794}$ | $R^{D4}$ | $R^{D5}$ | $R^{D1}$ |
| $L_{C795}$ | $R^{D4}$ | $R^{D6}$ | $R^{D1}$ |
| $L_{C796}$ | $R^{D4}$ | $R^{D7}$ | $R^{D1}$ |
| $L_{C797}$ | $R^{D4}$ | $R^{D8}$ | $R^{D1}$ |
| $L_{C798}$ | $R^{D4}$ | $R^{D9}$ | $R^{D1}$ |
| $L_{C799}$ | $R^{D4}$ | $R^{D10}$ | $R^{D1}$ |
| $L_{C800}$ | $R^{D4}$ | $R^{D11}$ | $R^{D1}$ |
| $L_{C801}$ | $R^{D4}$ | $R^{D12}$ | $R^{D1}$ |
| $L_{C802}$ | $R^{D4}$ | $R^{D13}$ | $R^{D1}$ |
| $L_{C803}$ | $R^{D4}$ | $R^{D14}$ | $R^{D1}$ |
| $L_{C804}$ | $R^{D4}$ | $R^{D15}$ | $R^{D1}$ |
| $L_{C805}$ | $R^{D4}$ | $R^{D16}$ | $R^{D1}$ |
| $L_{C806}$ | $R^{D4}$ | $R^{D17}$ | $R^{D1}$ |
| $L_{C807}$ | $R^{D4}$ | $R^{D18}$ | $R^{D1}$ |
| $L_{C808}$ | $R^{D4}$ | $R^{D19}$ | $R^{D1}$ |
| $L_{C809}$ | $R^{D4}$ | $R^{D20}$ | $R^{D1}$ |
| $L_{C810}$ | $R^{D4}$ | $R^{D21}$ | $R^{D1}$ |
| $L_{C811}$ | $R^{D4}$ | $R^{D22}$ | $R^{D1}$ |
| $L_{C812}$ | $R^{D4}$ | $R^{D23}$ | $R^{D1}$ |
| $L_{C813}$ | $R^{D4}$ | $R^{D24}$ | $R^{D1}$ |
| $L_{C814}$ | $R^{D4}$ | $R^{D25}$ | $R^{D1}$ |
| $L_{C815}$ | $R^{D4}$ | $R^{D26}$ | $R^{D1}$ |
| $L_{C816}$ | $R^{D4}$ | $R^{D27}$ | $R^{D1}$ |
| $L_{C817}$ | $R^{D4}$ | $R^{D28}$ | $R^{D1}$ |
| $L_{C818}$ | $R^{D4}$ | $R^{D29}$ | $R^{D1}$ |
| $L_{C819}$ | $R^{D4}$ | $R^{D30}$ | $R^{D1}$ |
| $L_{C820}$ | $R^{D4}$ | $R^{D31}$ | $R^{D1}$ |
| $L_{C821}$ | $R^{D4}$ | $R^{D32}$ | $R^{D1}$ |
| $L_{C822}$ | $R^{D4}$ | $R^{D33}$ | $R^{D1}$ |
| $L_{C823}$ | $R^{D4}$ | $R^{D34}$ | $R^{D1}$ |
| $L_{C824}$ | $R^{D4}$ | $R^{D35}$ | $R^{D1}$ |
| $L_{C825}$ | $R^{D4}$ | $R^{D40}$ | $R^{D1}$ |
| $L_{C826}$ | $R^{D4}$ | $R^{D41}$ | $R^{D1}$ |
| $L_{C827}$ | $R^{D4}$ | $R^{D42}$ | $R^{D1}$ |
| $L_{C828}$ | $R^{D4}$ | $R^{D64}$ | $R^{D1}$ |
| $L_{C829}$ | $R^{D4}$ | $R^{D66}$ | $R^{D1}$ |
| $L_{C830}$ | $R^{D4}$ | $R^{D68}$ | $R^{D1}$ |
| $L_{C831}$ | $R^{D4}$ | $R^{D76}$ | $R^{D1}$ |
| $L_{C832}$ | $R^{D4}$ | $R^{D1}$ | $R^{D1}$ |

-continued

| Ligand | $R^1$ | $R^2$ | $R^3$ |
|---|---|---|---|
| $L_{C833}$ | $R^{D7}$ | $R^{D5}$ | $R^{D1}$ |
| $L_{C834}$ | $R^{D7}$ | $R^{D6}$ | $R^{D1}$ |
| $L_{C835}$ | $R^{D7}$ | $R^{D8}$ | $R^{D1}$ |
| $L_{C836}$ | $R^{D7}$ | $R^{D9}$ | $R^{D1}$ |
| $L_{C837}$ | $R^{D7}$ | $R^{D10}$ | $R^{D1}$ |
| $L_{C838}$ | $R^{D7}$ | $R^{D11}$ | $R^{D1}$ |
| $L_{C839}$ | $R^{D7}$ | $R^{D12}$ | $R^{D1}$ |
| $L_{C840}$ | $R^{D7}$ | $R^{D13}$ | $R^{D1}$ |
| $L_{C841}$ | $R^{D7}$ | $R^{D14}$ | $R^{D1}$ |
| $L_{C842}$ | $R^{D7}$ | $R^{D15}$ | $R^{D1}$ |
| $L_{C843}$ | $R^{D7}$ | $R^{D16}$ | $R^{D1}$ |
| $L_{C844}$ | $R^{D7}$ | $R^{D17}$ | $R^{D1}$ |
| $L_{C845}$ | $R^{D7}$ | $R^{D18}$ | $R^{D1}$ |
| $L_{C846}$ | $R^{D7}$ | $R^{D19}$ | $R^{D1}$ |
| $L_{C847}$ | $R^{D7}$ | $R^{D20}$ | $R^{D1}$ |
| $L_{C848}$ | $R^{D7}$ | $R^{D21}$ | $R^{D1}$ |
| $L_{C849}$ | $R^{D7}$ | $R^{D22}$ | $R^{D1}$ |
| $L_{C850}$ | $R^{D7}$ | $R^{D23}$ | $R^{D1}$ |
| $L_{C851}$ | $R^{D7}$ | $R^{D24}$ | $R^{D1}$ |
| $L_{C852}$ | $R^{D7}$ | $R^{D25}$ | $R^{D1}$ |
| $L_{C853}$ | $R^{D7}$ | $R^{D26}$ | $R^{D1}$ |
| $L_{C854}$ | $R^{D7}$ | $R^{D27}$ | $R^{D1}$ |
| $L_{C855}$ | $R^{D7}$ | $R^{D28}$ | $R^{D1}$ |
| $L_{C856}$ | $R^{D7}$ | $R^{D29}$ | $R^{D1}$ |
| $L_{C857}$ | $R^{D7}$ | $R^{D30}$ | $R^{D1}$ |
| $L_{C858}$ | $R^{D7}$ | $R^{D31}$ | $R^{D1}$ |
| $L_{C859}$ | $R^{D7}$ | $R^{D32}$ | $R^{D1}$ |
| $L_{C860}$ | $R^{D7}$ | $R^{D33}$ | $R^{D1}$ |
| $L_{C861}$ | $R^{D7}$ | $R^{D34}$ | $R^{D1}$ |
| $L_{C862}$ | $R^{D7}$ | $R^{D35}$ | $R^{D1}$ |
| $L_{C863}$ | $R^{D7}$ | $R^{D40}$ | $R^{D1}$ |
| $L_{C864}$ | $R^{D7}$ | $R^{D41}$ | $R^{D1}$ |
| $L_{C865}$ | $R^{D7}$ | $R^{D42}$ | $R^{D1}$ |
| $L_{C866}$ | $R^{D7}$ | $R^{D64}$ | $R^{D1}$ |
| $L_{C867}$ | $R^{D7}$ | $R^{D66}$ | $R^{D1}$ |
| $L_{C868}$ | $R^{D7}$ | $R^{D68}$ | $R^{D1}$ |
| $L_{C869}$ | $R^{D7}$ | $R^{D76}$ | $R^{D1}$ |
| $L_{C870}$ | $R^{D8}$ | $R^{D5}$ | $R^{D1}$ |
| $L_{C871}$ | $R^{D8}$ | $R^{D6}$ | $R^{D1}$ |
| $L_{C872}$ | $R^{D8}$ | $R^{D9}$ | $R^{D1}$ |
| $L_{C873}$ | $R^{D8}$ | $R^{D10}$ | $R^{D1}$ |
| $L_{C874}$ | $R^{D8}$ | $R^{D11}$ | $R^{D1}$ |
| $L_{C875}$ | $R^{D8}$ | $R^{D12}$ | $R^{D1}$ |
| $L_{C876}$ | $R^{D8}$ | $R^{D13}$ | $R^{D1}$ |
| $L_{C877}$ | $R^{D8}$ | $R^{D14}$ | $R^{D1}$ |
| $L_{C878}$ | $R^{D8}$ | $R^{D15}$ | $R^{D1}$ |
| $L_{C879}$ | $R^{D8}$ | $R^{D16}$ | $R^{D1}$ |
| $L_{C880}$ | $R^{D8}$ | $R^{D17}$ | $R^{D1}$ |
| $L_{C881}$ | $R^{D8}$ | $R^{D18}$ | $R^{D1}$ |
| $L_{C882}$ | $R^{D8}$ | $R^{D19}$ | $R^{D1}$ |
| $L_{C883}$ | $R^{D8}$ | $R^{D20}$ | $R^{D1}$ |
| $L_{C884}$ | $R^{D8}$ | $R^{D21}$ | $R^{D1}$ |
| $L_{C885}$ | $R^{D8}$ | $R^{D22}$ | $R^{D1}$ |
| $L_{C886}$ | $R^{D8}$ | $R^{D23}$ | $R^{D1}$ |
| $L_{C887}$ | $R^{D8}$ | $R^{D24}$ | $R^{D1}$ |
| $L_{C888}$ | $R^{D8}$ | $R^{D25}$ | $R^{D1}$ |
| $L_{C889}$ | $R^{D8}$ | $R^{D26}$ | $R^{D1}$ |
| $L_{C890}$ | $R^{D8}$ | $R^{D27}$ | $R^{D1}$ |
| $L_{C891}$ | $R^{D8}$ | $R^{D28}$ | $R^{D1}$ |
| $L_{C892}$ | $R^{D8}$ | $R^{D29}$ | $R^{D1}$ |
| $L_{C893}$ | $R^{D8}$ | $R^{D30}$ | $R^{D1}$ |
| $L_{C894}$ | $R^{D8}$ | $R^{D31}$ | $R^{D1}$ |
| $L_{C895}$ | $R^{D8}$ | $R^{D32}$ | $R^{D1}$ |
| $L_{C896}$ | $R^{D8}$ | $R^{D33}$ | $R^{D1}$ |
| $L_{C897}$ | $R^{D8}$ | $R^{D34}$ | $R^{D1}$ |
| $L_{C898}$ | $R^{D8}$ | $R^{D35}$ | $R^{D1}$ |
| $L_{C899}$ | $R^{D8}$ | $R^{D40}$ | $R^{D1}$ |
| $L_{C900}$ | $R^{D8}$ | $R^{D41}$ | $R^{D1}$ |
| $L_{C901}$ | $R^{D8}$ | $R^{D42}$ | $R^{D1}$ |
| $L_{C902}$ | $R^{D8}$ | $R^{D64}$ | $R^{D1}$ |
| $L_{C903}$ | $R^{D8}$ | $R^{D66}$ | $R^{D1}$ |
| $L_{C904}$ | $R^{D8}$ | $R^{D68}$ | $R^{D1}$ |
| $L_{C905}$ | $R^{D8}$ | $R^{D76}$ | $R^{D1}$ |
| $L_{C906}$ | $R^{D11}$ | $R^{D5}$ | $R^{D1}$ |
| $L_{C907}$ | $R^{D11}$ | $R^{D6}$ | $R^{D1}$ |
| $L_{C908}$ | $R^{D11}$ | $R^{D9}$ | $R^{D1}$ |
| $L_{C909}$ | $R^{D11}$ | $R^{D10}$ | $R^{D1}$ |

-continued

| Ligand | $R^1$ | $R^2$ | $R^3$ |
|---|---|---|---|
| $L_{C910}$ | $R^{D11}$ | $R^{D12}$ | $R^{D1}$ |
| $L_{C911}$ | $R^{D11}$ | $R^{D13}$ | $R^{D1}$ |
| $L_{C912}$ | $R^{D11}$ | $R^{D14}$ | $R^{D1}$ |
| $L_{C913}$ | $R^{D11}$ | $R^{D15}$ | $R^{D1}$ |
| $L_{C914}$ | $R^{D11}$ | $R^{D16}$ | $R^{D1}$ |
| $L_{C915}$ | $R^{D11}$ | $R^{D17}$ | $R^{D1}$ |
| $L_{C916}$ | $R^{D11}$ | $R^{D18}$ | $R^{D1}$ |
| $L_{C917}$ | $R^{D11}$ | $R^{D19}$ | $R^{D1}$ |
| $L_{C918}$ | $R^{D11}$ | $R^{D20}$ | $R^{D1}$ |
| $L_{C919}$ | $R^{D11}$ | $R^{D21}$ | $R^{D1}$ |
| $L_{C920}$ | $R^{D11}$ | $R^{D22}$ | $R^{D1}$ |
| $L_{C921}$ | $R^{D11}$ | $R^{D23}$ | $R^{D1}$ |
| $L_{C922}$ | $R^{D11}$ | $R^{D24}$ | $R^{D1}$ |
| $L_{C923}$ | $R^{D11}$ | $R^{D25}$ | $R^{D1}$ |
| $L_{C924}$ | $R^{D11}$ | $R^{D26}$ | $R^{D1}$ |
| $L_{C925}$ | $R^{D11}$ | $R^{D27}$ | $R^{D1}$ |
| $L_{C926}$ | $R^{D11}$ | $R^{D28}$ | $R^{D1}$ |
| $L_{C927}$ | $R^{D11}$ | $R^{D29}$ | $R^{D1}$ |
| $L_{C928}$ | $R^{D11}$ | $R^{D30}$ | $R^{D1}$ |
| $L_{C929}$ | $R^{D11}$ | $R^{D31}$ | $R^{D1}$ |
| $L_{C930}$ | $R^{D11}$ | $R^{D32}$ | $R^{D1}$ |
| $L_{C931}$ | $R^{D11}$ | $R^{D33}$ | $R^{D1}$ |
| $L_{C932}$ | $R^{D11}$ | $R^{D34}$ | $R^{D1}$ |
| $L_{C933}$ | $R^{D11}$ | $R^{D35}$ | $R^{D1}$ |
| $L_{C934}$ | $R^{D11}$ | $R^{D40}$ | $R^{D1}$ |
| $L_{C935}$ | $R^{D11}$ | $R^{D41}$ | $R^{D1}$ |
| $L_{C936}$ | $R^{D11}$ | $R^{D42}$ | $R^{D1}$ |
| $L_{C937}$ | $R^{D11}$ | $R^{D64}$ | $R^{D1}$ |
| $L_{C938}$ | $R^{D11}$ | $R^{D66}$ | $R^{D1}$ |
| $L_{C939}$ | $R^{D11}$ | $R^{D68}$ | $R^{D1}$ |
| $L_{C940}$ | $R^{D11}$ | $R^{D76}$ | $R^{D1}$ |
| $L_{C941}$ | $R^{D13}$ | $R^{D5}$ | $R^{D1}$ |
| $L_{C942}$ | $R^{D13}$ | $R^{D6}$ | $R^{D1}$ |
| $L_{C943}$ | $R^{D13}$ | $R^{D9}$ | $R^{D1}$ |
| $L_{C944}$ | $R^{D13}$ | $R^{D10}$ | $R^{D1}$ |
| $L_{C945}$ | $R^{D13}$ | $R^{D12}$ | $R^{D1}$ |
| $L_{C946}$ | $R^{D13}$ | $R^{D14}$ | $R^{D1}$ |
| $L_{C947}$ | $R^{D13}$ | $R^{D15}$ | $R^{D1}$ |
| $L_{C948}$ | $R^{D13}$ | $R^{D16}$ | $R^{D1}$ |
| $L_{C949}$ | $R^{D13}$ | $R^{D17}$ | $R^{D1}$ |
| $L_{C950}$ | $R^{D13}$ | $R^{D18}$ | $R^{D1}$ |
| $L_{C951}$ | $R^{D13}$ | $R^{D19}$ | $R^{D1}$ |
| $L_{C952}$ | $R^{D13}$ | $R^{D20}$ | $R^{D1}$ |
| $L_{C953}$ | $R^{D13}$ | $R^{D21}$ | $R^{D1}$ |
| $L_{C954}$ | $R^{D13}$ | $R^{D22}$ | $R^{D1}$ |
| $L_{C955}$ | $R^{D13}$ | $R^{D23}$ | $R^{D1}$ |
| $L_{C956}$ | $R^{D13}$ | $R^{D24}$ | $R^{D1}$ |
| $L_{C957}$ | $R^{D13}$ | $R^{D25}$ | $R^{D1}$ |
| $L_{C958}$ | $R^{D13}$ | $R^{D26}$ | $R^{D1}$ |
| $L_{C959}$ | $R^{D13}$ | $R^{D27}$ | $R^{D1}$ |
| $L_{C960}$ | $R^{D13}$ | $R^{D28}$ | $R^{D1}$ |
| $L_{C961}$ | $R^{D13}$ | $R^{D29}$ | $R^{D1}$ |
| $L_{C962}$ | $R^{D13}$ | $R^{D30}$ | $R^{D1}$ |
| $L_{C963}$ | $R^{D13}$ | $R^{D31}$ | $R^{D1}$ |
| $L_{C964}$ | $R^{D13}$ | $R^{D32}$ | $R^{D1}$ |
| $L_{C965}$ | $R^{D13}$ | $R^{D33}$ | $R^{D1}$ |
| $L_{C966}$ | $R^{D13}$ | $R^{D34}$ | $R^{D1}$ |
| $L_{C967}$ | $R^{D13}$ | $R^{D35}$ | $R^{D1}$ |
| $L_{C968}$ | $R^{D13}$ | $R^{D40}$ | $R^{D1}$ |
| $L_{C969}$ | $R^{D13}$ | $R^{D41}$ | $R^{D1}$ |
| $L_{C970}$ | $R^{D13}$ | $R^{D42}$ | $R^{D1}$ |
| $L_{C971}$ | $R^{D13}$ | $R^{D64}$ | $R^{D1}$ |
| $L_{C972}$ | $R^{D13}$ | $R^{D66}$ | $R^{D1}$ |
| $L_{C973}$ | $R^{D13}$ | $R^{D68}$ | $R^{D1}$ |
| $L_{C974}$ | $R^{D13}$ | $R^{D76}$ | $R^{D1}$ |
| $L_{C975}$ | $R^{D14}$ | $R^{D5}$ | $R^{D1}$ |
| $L_{C976}$ | $R^{D14}$ | $R^{D6}$ | $R^{D1}$ |
| $L_{C977}$ | $R^{D14}$ | $R^{D9}$ | $R^{D1}$ |
| $L_{C978}$ | $R^{D14}$ | $R^{D10}$ | $R^{D1}$ |
| $L_{C979}$ | $R^{D14}$ | $R^{D12}$ | $R^{D1}$ |
| $L_{C980}$ | $R^{D14}$ | $R^{D15}$ | $R^{D1}$ |
| $L_{C981}$ | $R^{D14}$ | $R^{D16}$ | $R^{D1}$ |
| $L_{C982}$ | $R^{D14}$ | $R^{D17}$ | $R^{D1}$ |
| $L_{C983}$ | $R^{D14}$ | $R^{D18}$ | $R^{D1}$ |
| $L_{C984}$ | $R^{D14}$ | $R^{D19}$ | $R^{D1}$ |
| $L_{C985}$ | $R^{D14}$ | $R^{D20}$ | $R^{D1}$ |
| $L_{C986}$ | $R^{D14}$ | $R^{D21}$ | $R^{D1}$ |

-continued

| Ligand | $R^1$ | $R^2$ | $R^3$ |
|---|---|---|---|
| $L_{C987}$ | $R^{D14}$ | $R^{D22}$ | $R^{D1}$ |
| $L_{C988}$ | $R^{D14}$ | $R^{D23}$ | $R^{D1}$ |
| $L_{C989}$ | $R^{D14}$ | $R^{D24}$ | $R^{D1}$ |
| $L_{C990}$ | $R^{D14}$ | $R^{D25}$ | $R^{D1}$ |
| $L_{C991}$ | $R^{D14}$ | $R^{D26}$ | $R^{D1}$ |
| $L_{C992}$ | $R^{D14}$ | $R^{D27}$ | $R^{D1}$ |
| $L_{C993}$ | $R^{D14}$ | $R^{D28}$ | $R^{D1}$ |
| $L_{C994}$ | $R^{D14}$ | $R^{D29}$ | $R^{D1}$ |
| $L_{C995}$ | $R^{D14}$ | $R^{D30}$ | $R^{D1}$ |
| $L_{C996}$ | $R^{D14}$ | $R^{D31}$ | $R^{D1}$ |
| $L_{C997}$ | $R^{D14}$ | $R^{D32}$ | $R^{D1}$ |
| $L_{C998}$ | $R^{D14}$ | $R^{D33}$ | $R^{D1}$ |
| $L_{C999}$ | $R^{D14}$ | $R^{D34}$ | $R^{D1}$ |
| $L_{C1000}$ | $R^{D14}$ | $R^{D35}$ | $R^{D1}$ |
| $L_{C1001}$ | $R^{D14}$ | $R^{D40}$ | $R^{D1}$ |
| $L_{C1002}$ | $R^{D14}$ | $R^{D41}$ | $R^{D1}$ |
| $L_{C1003}$ | $R^{D14}$ | $R^{D42}$ | $R^{D1}$ |
| $L_{C1004}$ | $R^{D14}$ | $R^{D64}$ | $R^{D1}$ |
| $L_{C1005}$ | $R^{D14}$ | $R^{D66}$ | $R^{D1}$ |
| $L_{C1006}$ | $R^{D14}$ | $R^{D68}$ | $R^{D1}$ |
| $L_{C1007}$ | $R^{D22}$ | $R^{D76}$ | $R^{D1}$ |
| $L_{C1008}$ | $R^{D22}$ | $R^{D5}$ | $R^{D1}$ |
| $L_{C1009}$ | $R^{D22}$ | $R^{D6}$ | $R^{D1}$ |
| $L_{C1010}$ | $R^{D22}$ | $R^{D9}$ | $R^{D1}$ |
| $L_{C1011}$ | $R^{D22}$ | $R^{D10}$ | $R^{D1}$ |
| $L_{C1012}$ | $R^{D22}$ | $R^{D12}$ | $R^{D1}$ |
| $L_{C1013}$ | $R^{D22}$ | $R^{D15}$ | $R^{D1}$ |
| $L_{C1014}$ | $R^{D22}$ | $R^{D16}$ | $R^{D1}$ |
| $L_{C1015}$ | $R^{D22}$ | $R^{D17}$ | $R^{D1}$ |
| $L_{C1016}$ | $R^{D22}$ | $R^{D18}$ | $R^{D1}$ |
| $L_{C1017}$ | $R^{D22}$ | $R^{D19}$ | $R^{D1}$ |
| $L_{C1018}$ | $R^{D22}$ | $R^{D20}$ | $R^{D1}$ |
| $L_{C1019}$ | $R^{D22}$ | $R^{D21}$ | $R^{D1}$ |
| $L_{C1020}$ | $R^{D22}$ | $R^{D23}$ | $R^{D1}$ |
| $L_{C1021}$ | $R^{D22}$ | $R^{D24}$ | $R^{D1}$ |
| $L_{C1022}$ | $R^{D22}$ | $R^{D25}$ | $R^{D1}$ |
| $L_{C1023}$ | $R^{D22}$ | $R^{D26}$ | $R^{D1}$ |
| $L_{C1024}$ | $R^{D22}$ | $R^{D27}$ | $R^{D1}$ |
| $L_{C1025}$ | $R^{D22}$ | $R^{D28}$ | $R^{D1}$ |
| $L_{C1026}$ | $R^{D22}$ | $R^{D29}$ | $R^{D1}$ |
| $L_{C1027}$ | $R^{D22}$ | $R^{D30}$ | $R^{D1}$ |
| $L_{C1028}$ | $R^{D22}$ | $R^{D31}$ | $R^{D1}$ |
| $L_{C1029}$ | $R^{D22}$ | $R^{D32}$ | $R^{D1}$ |
| $L_{C1030}$ | $R^{D22}$ | $R^{D33}$ | $R^{D1}$ |
| $L_{C1031}$ | $R^{D22}$ | $R^{D34}$ | $R^{D1}$ |
| $L_{C1032}$ | $R^{D22}$ | $R^{D35}$ | $R^{D1}$ |
| $L_{C1033}$ | $R^{D22}$ | $R^{D40}$ | $R^{D1}$ |
| $L_{C1034}$ | $R^{D22}$ | $R^{D41}$ | $R^{D1}$ |
| $L_{C1035}$ | $R^{D22}$ | $R^{D42}$ | $R^{D1}$ |
| $L_{C1036}$ | $R^{D22}$ | $R^{D64}$ | $R^{D1}$ |
| $L_{C1037}$ | $R^{D22}$ | $R^{D66}$ | $R^{D1}$ |
| $L_{C1038}$ | $R^{D22}$ | $R^{D68}$ | $R^{D1}$ |
| $L_{C1039}$ | $R^{D22}$ | $R^{D76}$ | $R^{D1}$ |
| $L_{C1040}$ | $R^{D26}$ | $R^{D5}$ | $R^{D1}$ |
| $L_{C1041}$ | $R^{D26}$ | $R^{D6}$ | $R^{D1}$ |
| $L_{C1042}$ | $R^{D26}$ | $R^{D9}$ | $R^{D1}$ |
| $L_{C1043}$ | $R^{D26}$ | $R^{D10}$ | $R^{D1}$ |
| $L_{C1044}$ | $R^{D26}$ | $R^{D12}$ | $R^{D1}$ |
| $L_{C1045}$ | $R^{D26}$ | $R^{D15}$ | $R^{D1}$ |
| $L_{C1046}$ | $R^{D26}$ | $R^{D16}$ | $R^{D1}$ |
| $L_{C1047}$ | $R^{D26}$ | $R^{D17}$ | $R^{D1}$ |
| $L_{C1048}$ | $R^{D26}$ | $R^{D18}$ | $R^{D1}$ |
| $L_{C1049}$ | $R^{D26}$ | $R^{D19}$ | $R^{D1}$ |
| $L_{C1050}$ | $R^{D26}$ | $R^{D20}$ | $R^{D1}$ |
| $L_{C1051}$ | $R^{D26}$ | $R^{D21}$ | $R^{D1}$ |
| $L_{C1052}$ | $R^{D26}$ | $R^{D23}$ | $R^{D1}$ |
| $L_{C1053}$ | $R^{D26}$ | $R^{D24}$ | $R^{D1}$ |
| $L_{C1054}$ | $R^{D26}$ | $R^{D25}$ | $R^{D1}$ |
| $L_{C1055}$ | $R^{D26}$ | $R^{D27}$ | $R^{D1}$ |
| $L_{C1056}$ | $R^{D26}$ | $R^{D28}$ | $R^{D1}$ |
| $L_{C1057}$ | $R^{D26}$ | $R^{D29}$ | $R^{D1}$ |
| $L_{C1058}$ | $R^{D26}$ | $R^{D30}$ | $R^{D1}$ |
| $L_{C1059}$ | $R^{D26}$ | $R^{D31}$ | $R^{D1}$ |
| $L_{C1060}$ | $R^{D26}$ | $R^{D32}$ | $R^{D1}$ |
| $L_{C1061}$ | $R^{D26}$ | $R^{D33}$ | $R^{D1}$ |
| $L_{C1062}$ | $R^{D26}$ | $R^{D34}$ | $R^{D1}$ |
| $L_{C1063}$ | $R^{D26}$ | $R^{D35}$ | $R^{D1}$ |

-continued

| Ligand | $R^1$ | $R^2$ | $R^3$ |
|---|---|---|---|
| $L_{C1064}$ | $R^{D26}$ | $R^{D40}$ | $R^{D1}$ |
| $L_{C1065}$ | $R^{D26}$ | $R^{D41}$ | $R^{D1}$ |
| $L_{C1066}$ | $R^{D26}$ | $R^{D42}$ | $R^{D1}$ |
| $L_{C1067}$ | $R^{D26}$ | $R^{D64}$ | $R^{D1}$ |
| $L_{C1068}$ | $R^{D26}$ | $R^{D66}$ | $R^{D1}$ |
| $L_{C1069}$ | $R^{D26}$ | $R^{D68}$ | $R^{D1}$ |
| $L_{C1070}$ | $R^{D26}$ | $R^{D76}$ | $R^{D1}$ |
| $L_{C1071}$ | $R^{D35}$ | $R^{D5}$ | $R^{D1}$ |
| $L_{C1072}$ | $R^{D35}$ | $R^{D6}$ | $R^{D1}$ |
| $L_{C1073}$ | $R^{D35}$ | $R^{D9}$ | $R^{D1}$ |
| $L_{C1074}$ | $R^{D35}$ | $R^{D10}$ | $R^{D1}$ |
| $L_{C1075}$ | $R^{D35}$ | $R^{D12}$ | $R^{D1}$ |
| $L_{C1076}$ | $R^{D35}$ | $R^{D15}$ | $R^{D1}$ |
| $L_{C1077}$ | $R^{D35}$ | $R^{D16}$ | $R^{D1}$ |
| $L_{C1078}$ | $R^{D35}$ | $R^{D17}$ | $R^{D1}$ |
| $L_{C1079}$ | $R^{D35}$ | $R^{D18}$ | $R^{D1}$ |
| $L_{C1080}$ | $R^{D35}$ | $R^{D19}$ | $R^{D1}$ |
| $L_{C1081}$ | $R^{D35}$ | $R^{D20}$ | $R^{D1}$ |
| $L_{C1082}$ | $R^{D35}$ | $R^{D21}$ | $R^{D1}$ |
| $L_{C1083}$ | $R^{D35}$ | $R^{D23}$ | $R^{D1}$ |
| $L_{C1084}$ | $R^{D35}$ | $R^{D24}$ | $R^{D1}$ |
| $L_{C1085}$ | $R^{D35}$ | $R^{D25}$ | $R^{D1}$ |
| $L_{C1086}$ | $R^{D35}$ | $R^{D27}$ | $R^{D1}$ |
| $L_{C1087}$ | $R^{D35}$ | $R^{D28}$ | $R^{D1}$ |
| $L_{C1088}$ | $R^{D35}$ | $R^{D29}$ | $R^{D1}$ |
| $L_{C1089}$ | $R^{D35}$ | $R^{D30}$ | $R^{D1}$ |
| $L_{C1090}$ | $R^{D35}$ | $R^{D31}$ | $R^{D1}$ |
| $L_{C1091}$ | $R^{D35}$ | $R^{D32}$ | $R^{D1}$ |
| $L_{C1092}$ | $R^{D35}$ | $R^{D33}$ | $R^{D1}$ |
| $L_{C1093}$ | $R^{D35}$ | $R^{D34}$ | $R^{D1}$ |
| $L_{C1094}$ | $R^{D35}$ | $R^{D40}$ | $R^{D1}$ |
| $L_{C1095}$ | $R^{D35}$ | $R^{D41}$ | $R^{D1}$ |
| $L_{C1096}$ | $R^{D35}$ | $R^{D42}$ | $R^{D1}$ |
| $L_{C1097}$ | $R^{D35}$ | $R^{D64}$ | $R^{D1}$ |
| $L_{C1098}$ | $R^{D35}$ | $R^{D66}$ | $R^{D1}$ |
| $L_{C1099}$ | $R^{D35}$ | $R^{D68}$ | $R^{D1}$ |
| $L_{C1100}$ | $R^{D35}$ | $R^{D76}$ | $R^{D1}$ |
| $L_{C1101}$ | $R^{D40}$ | $R^{D5}$ | $R^{D1}$ |
| $L_{C1102}$ | $R^{D40}$ | $R^{D6}$ | $R^{D1}$ |
| $L_{C1103}$ | $R^{D40}$ | $R^{D9}$ | $R^{D1}$ |
| $L_{C1104}$ | $R^{D40}$ | $R^{D10}$ | $R^{D1}$ |
| $L_{C1105}$ | $R^{D40}$ | $R^{D12}$ | $R^{D1}$ |
| $L_{C1106}$ | $R^{D40}$ | $R^{D15}$ | $R^{D1}$ |
| $L_{C1107}$ | $R^{D40}$ | $R^{D16}$ | $R^{D1}$ |
| $L_{C1108}$ | $R^{D40}$ | $R^{D17}$ | $R^{D1}$ |
| $L_{C1109}$ | $R^{D40}$ | $R^{D18}$ | $R^{D1}$ |
| $L_{C1110}$ | $R^{D40}$ | $R^{D19}$ | $R^{D1}$ |
| $L_{C1111}$ | $R^{D40}$ | $R^{D20}$ | $R^{D1}$ |
| $L_{C1112}$ | $R^{D40}$ | $R^{D21}$ | $R^{D1}$ |
| $L_{C1113}$ | $R^{D40}$ | $R^{D23}$ | $R^{D1}$ |
| $L_{C1114}$ | $R^{D40}$ | $R^{D24}$ | $R^{D1}$ |
| $L_{C1115}$ | $R^{D40}$ | $R^{D25}$ | $R^{D1}$ |
| $L_{C1116}$ | $R^{D40}$ | $R^{D27}$ | $R^{D1}$ |
| $L_{C1117}$ | $R^{D40}$ | $R^{D28}$ | $R^{D1}$ |
| $L_{C1118}$ | $R^{D40}$ | $R^{D29}$ | $R^{D1}$ |
| $L_{C1119}$ | $R^{D40}$ | $R^{D30}$ | $R^{D1}$ |
| $L_{C1120}$ | $R^{D40}$ | $R^{D31}$ | $R^{D1}$ |
| $L_{C1121}$ | $R^{D40}$ | $R^{D32}$ | $R^{D1}$ |
| $L_{C1122}$ | $R^{D40}$ | $R^{D33}$ | $R^{D1}$ |
| $L_{C1123}$ | $R^{D40}$ | $R^{D34}$ | $R^{D1}$ |
| $L_{C1124}$ | $R^{D40}$ | $R^{D41}$ | $R^{D1}$ |
| $L_{C1125}$ | $R^{D40}$ | $R^{D42}$ | $R^{D1}$ |
| $L_{C1126}$ | $R^{D40}$ | $R^{D64}$ | $R^{D1}$ |
| $L_{C1127}$ | $R^{D40}$ | $R^{D66}$ | $R^{D1}$ |
| $L_{C1128}$ | $R^{D40}$ | $R^{D68}$ | $R^{D1}$ |
| $L_{C1129}$ | $R^{D40}$ | $R^{D76}$ | $R^{D1}$ |
| $L_{C1130}$ | $R^{D41}$ | $R^{D5}$ | $R^{D1}$ |
| $L_{C1131}$ | $R^{D41}$ | $R^{D6}$ | $R^{D1}$ |
| $L_{C1132}$ | $R^{D41}$ | $R^{D9}$ | $R^{D1}$ |
| $L_{C1133}$ | $R^{D41}$ | $R^{D10}$ | $R^{D1}$ |
| $L_{C1134}$ | $R^{D41}$ | $R^{D12}$ | $R^{D1}$ |
| $L_{C1135}$ | $R^{D41}$ | $R^{D15}$ | $R^{D1}$ |
| $L_{C1136}$ | $R^{D41}$ | $R^{D16}$ | $R^{D1}$ |
| $L_{C1137}$ | $R^{D41}$ | $R^{D17}$ | $R^{D1}$ |
| $L_{C1138}$ | $R^{D41}$ | $R^{D18}$ | $R^{D1}$ |
| $L_{C1139}$ | $R^{D41}$ | $R^{D19}$ | $R^{D1}$ |
| $L_{C1140}$ | $R^{D41}$ | $R^{D20}$ | $R^{D1}$ |

-continued

| Ligand | $R^1$ | $R^2$ | $R^3$ |
|---|---|---|---|
| $L_{C1141}$ | $R^{D41}$ | $R^{D21}$ | $R^{D1}$ |
| $L_{C1142}$ | $R^{D41}$ | $R^{D23}$ | $R^{D1}$ |
| $L_{C1143}$ | $R^{D41}$ | $R^{D24}$ | $R^{D1}$ |
| $L_{C1144}$ | $R^{D41}$ | $R^{D25}$ | $R^{D1}$ |
| $L_{C1145}$ | $R^{D41}$ | $R^{D27}$ | $R^{D1}$ |
| $L_{C1146}$ | $R^{D41}$ | $R^{D28}$ | $R^{D1}$ |
| $L_{C1147}$ | $R^{D41}$ | $R^{D29}$ | $R^{D1}$ |
| $L_{C1148}$ | $R^{D41}$ | $R^{D30}$ | $R^{D1}$ |
| $L_{C1149}$ | $R^{D41}$ | $R^{D31}$ | $R^{D1}$ |
| $L_{C1150}$ | $R^{D41}$ | $R^{D32}$ | $R^{D1}$ |
| $L_{C1151}$ | $R^{D41}$ | $R^{D33}$ | $R^{D1}$ |
| $L_{C1152}$ | $R^{D41}$ | $R^{D34}$ | $R^{D1}$ |
| $L_{C1153}$ | $R^{D41}$ | $R^{D42}$ | $R^{D1}$ |
| $L_{C1154}$ | $R^{D41}$ | $R^{D64}$ | $R^{D1}$ |
| $L_{C1155}$ | $R^{D41}$ | $R^{D66}$ | $R^{D1}$ |
| $L_{C1156}$ | $R^{D41}$ | $R^{D68}$ | $R^{D1}$ |
| $L_{C1157}$ | $R^{D41}$ | $R^{D76}$ | $R^{D1}$ |
| $L_{C1158}$ | $R^{D64}$ | $R^{D5}$ | $R^{D1}$ |
| $L_{C1159}$ | $R^{D64}$ | $R^{D6}$ | $R^{D1}$ |
| $L_{C1160}$ | $R^{D64}$ | $R^{D9}$ | $R^{D1}$ |
| $L_{C1161}$ | $R^{D64}$ | $R^{D10}$ | $R^{D1}$ |
| $L_{C1162}$ | $R^{D64}$ | $R^{D12}$ | $R^{D1}$ |
| $L_{C1163}$ | $R^{D64}$ | $R^{D15}$ | $R^{D1}$ |
| $L_{C1164}$ | $R^{D64}$ | $R^{D16}$ | $R^{D1}$ |
| $L_{C1165}$ | $R^{D64}$ | $R^{D17}$ | $R^{D1}$ |
| $L_{C1166}$ | $R^{D64}$ | $R^{D18}$ | $R^{D1}$ |
| $L_{C1167}$ | $R^{D64}$ | $R^{D19}$ | $R^{D1}$ |
| $L_{C1168}$ | $R^{D64}$ | $R^{D20}$ | $R^{D1}$ |
| $L_{C1169}$ | $R^{D64}$ | $R^{D21}$ | $R^{D1}$ |
| $L_{C1170}$ | $R^{D64}$ | $R^{D23}$ | $R^{D1}$ |
| $L_{C1171}$ | $R^{D64}$ | $R^{D24}$ | $R^{D1}$ |
| $L_{C1172}$ | $R^{D64}$ | $R^{D25}$ | $R^{D1}$ |
| $L_{C1173}$ | $R^{D64}$ | $R^{D27}$ | $R^{D1}$ |
| $L_{C1174}$ | $R^{D64}$ | $R^{D28}$ | $R^{D1}$ |
| $L_{C1175}$ | $R^{D64}$ | $R^{D29}$ | $R^{D1}$ |
| $L_{C1176}$ | $R^{D64}$ | $R^{D30}$ | $R^{D1}$ |
| $L_{C1177}$ | $R^{D64}$ | $R^{D31}$ | $R^{D1}$ |
| $L_{C1178}$ | $R^{D64}$ | $R^{D32}$ | $R^{D1}$ |
| $L_{C1179}$ | $R^{D64}$ | $R^{D33}$ | $R^{D1}$ |
| $L_{C1180}$ | $R^{D64}$ | $R^{D34}$ | $R^{D1}$ |
| $L_{C1181}$ | $R^{D64}$ | $R^{D42}$ | $R^{D1}$ |
| $L_{C1182}$ | $R^{D64}$ | $R^{D64}$ | $R^{D1}$ |
| $L_{C1183}$ | $R^{D64}$ | $R^{D66}$ | $R^{D1}$ |
| $L_{C1184}$ | $R^{D64}$ | $R^{D68}$ | $R^{D1}$ |
| $L_{C1185}$ | $R^{D64}$ | $R^{D76}$ | $R^{D1}$ |
| $L_{C1186}$ | $R^{D66}$ | $R^{D5}$ | $R^{D1}$ |
| $L_{C1187}$ | $R^{D66}$ | $R^{D6}$ | $R^{D1}$ |
| $L_{C1188}$ | $R^{D66}$ | $R^{D9}$ | $R^{D1}$ |
| $L_{C1189}$ | $R^{D66}$ | $R^{D10}$ | $R^{D1}$ |
| $L_{C1190}$ | $R^{D66}$ | $R^{D12}$ | $R^{D1}$ |
| $L_{C1191}$ | $R^{D66}$ | $R^{D15}$ | $R^{D1}$ |
| $L_{C1192}$ | $R^{D66}$ | $R^{D16}$ | $R^{D1}$ |
| $L_{C1193}$ | $R^{D66}$ | $R^{D17}$ | $R^{D1}$ |
| $L_{C1194}$ | $R^{D66}$ | $R^{D18}$ | $R^{D1}$ |
| $L_{C1195}$ | $R^{D66}$ | $R^{D19}$ | $R^{D1}$ |
| $L_{C1196}$ | $R^{D66}$ | $R^{D20}$ | $R^{D1}$ |
| $L_{C1197}$ | $R^{D66}$ | $R^{D21}$ | $R^{D1}$ |
| $L_{C1198}$ | $R^{D66}$ | $R^{D23}$ | $R^{D1}$ |
| $L_{C1199}$ | $R^{D66}$ | $R^{D24}$ | $R^{D1}$ |
| $L_{C1200}$ | $R^{D66}$ | $R^{D25}$ | $R^{D1}$ |
| $L_{C1201}$ | $R^{D66}$ | $R^{D27}$ | $R^{D1}$ |
| $L_{C1202}$ | $R^{D66}$ | $R^{D28}$ | $R^{D1}$ |
| $L_{C1203}$ | $R^{D66}$ | $R^{D29}$ | $R^{D1}$ |
| $L_{C1204}$ | $R^{D66}$ | $R^{D30}$ | $R^{D1}$ |
| $L_{C1205}$ | $R^{D66}$ | $R^{D31}$ | $R^{D1}$ |
| $L_{C1206}$ | $R^{D66}$ | $R^{D32}$ | $R^{D1}$ |
| $L_{C1207}$ | $R^{D66}$ | $R^{D33}$ | $R^{D1}$ |
| $L_{C1208}$ | $R^{D66}$ | $R^{D34}$ | $R^{D1}$ |
| $L_{C1209}$ | $R^{D66}$ | $R^{D42}$ | $R^{D1}$ |
| $L_{C1210}$ | $R^{D66}$ | $R^{D68}$ | $R^{D1}$ |
| $L_{C1211}$ | $R^{D66}$ | $R^{D76}$ | $R^{D1}$ |
| $L_{C1212}$ | $R^{D68}$ | $R^{D5}$ | $R^{D1}$ |
| $L_{C1213}$ | $R^{D68}$ | $R^{D6}$ | $R^{D1}$ |
| $L_{C1214}$ | $R^{D68}$ | $R^{D9}$ | $R^{D1}$ |
| $L_{C1215}$ | $R^{D68}$ | $R^{D10}$ | $R^{D1}$ |
| $L_{C1216}$ | $R^{D68}$ | $R^{D12}$ | $R^{D1}$ |
| $L_{C1217}$ | $R^{D68}$ | $R^{D15}$ | $R^{D1}$ |

-continued

| Ligand | $R^1$ | $R^2$ | $R^3$ |
|---|---|---|---|
| $L_{C1218}$ | $R^{D68}$ | $R^{D16}$ | $R^{D1}$ |
| $L_{C1219}$ | $R^{D68}$ | $R^{D17}$ | $R^{D1}$ |
| $L_{C1220}$ | $R^{D68}$ | $R^{D18}$ | $R^{D1}$ |
| $L_{C1221}$ | $R^{D68}$ | $R^{D19}$ | $R^{D1}$ |
| $L_{C1222}$ | $R^{D68}$ | $R^{D20}$ | $R^{D1}$ |
| $L_{C1223}$ | $R^{D68}$ | $R^{D21}$ | $R^{D1}$ |
| $L_{C1224}$ | $R^{D68}$ | $R^{D23}$ | $R^{D1}$ |
| $L_{C1225}$ | $R^{D68}$ | $R^{D24}$ | $R^{D1}$ |
| $L_{C1226}$ | $R^{D68}$ | $R^{D25}$ | $R^{D1}$ |
| $L_{C1227}$ | $R^{D68}$ | $R^{D27}$ | $R^{D1}$ |
| $L_{C1228}$ | $R^{D68}$ | $R^{D28}$ | $R^{D1}$ |
| $L_{C1229}$ | $R^{D68}$ | $R^{D29}$ | $R^{D1}$ |
| $L_{C1230}$ | $R^{D68}$ | $R^{D30}$ | $R^{D1}$ |
| $L_{C1231}$ | $R^{D68}$ | $R^{D31}$ | $R^{D1}$ |
| $L_{C1232}$ | $R^{D68}$ | $R^{D32}$ | $R^{D1}$ |
| $L_{C1233}$ | $R^{D68}$ | $R^{D33}$ | $R^{D1}$ |
| $L_{C1234}$ | $R^{D68}$ | $R^{D34}$ | $R^{D1}$ |
| $L_{C1235}$ | $R^{D68}$ | $R^{D42}$ | $R^{D1}$ |
| $L_{C1236}$ | $R^{D68}$ | $R^{D76}$ | $R^{D1}$ |
| $L_{C1237}$ | $R^{D76}$ | $R^{D5}$ | $R^{D1}$ |
| $L_{C1238}$ | $R^{D76}$ | $R^{D6}$ | $R^{D1}$ |
| $L_{C1239}$ | $R^{D76}$ | $R^{D9}$ | $R^{D1}$ |
| $L_{C1240}$ | $R^{D76}$ | $R^{D10}$ | $R^{D1}$ |
| $L_{C1241}$ | $R^{D76}$ | $R^{D12}$ | $R^{D1}$ |
| $L_{C1242}$ | $R^{D76}$ | $R^{D15}$ | $R^{D1}$ |
| $L_{C1243}$ | $R^{D76}$ | $R^{D16}$ | $R^{D1}$ |
| $L_{C1244}$ | $R^{D76}$ | $R^{D17}$ | $R^{D1}$ |
| $L_{C1245}$ | $R^{D76}$ | $R^{D18}$ | $R^{D1}$ |
| $L_{C1246}$ | $R^{D76}$ | $R^{D19}$ | $R^{D1}$ |
| $L_{C1247}$ | $R^{D76}$ | $R^{D20}$ | $R^{D1}$ |
| $L_{C1248}$ | $R^{D76}$ | $R^{D21}$ | $R^{D1}$ |
| $L_{C1249}$ | $R^{D76}$ | $R^{D23}$ | $R^{D1}$ |
| $L_{C1250}$ | $R^{D76}$ | $R^{D24}$ | $R^{D1}$ |
| $L_{C1251}$ | $R^{D76}$ | $R^{D25}$ | $R^{D1}$ |
| $L_{C1252}$ | $R^{D76}$ | $R^{D27}$ | $R^{D1}$ |
| $L_{C1253}$ | $R^{D76}$ | $R^{D28}$ | $R^{D1}$ |
| $L_{C1254}$ | $R^{D76}$ | $R^{D29}$ | $R^{D1}$ |
| $L_{C1255}$ | $R^{D76}$ | $R^{D30}$ | $R^{D1}$ |
| $L_{C1256}$ | $R^{D76}$ | $R^{D31}$ | $R^{D1}$ |
| $L_{C1257}$ | $R^{D76}$ | $R^{D32}$ | $R^{D1}$ |
| $L_{C1258}$ | $R^{D76}$ | $R^{D33}$ | $R^{D1}$ |
| $L_{C1259}$ | $R^{D76}$ | $R^{D34}$ | $R^{D1}$ |
| $L_{C1260}$ | $R^{D76}$ | $R^{D42}$ | $R^{D1}$, |

where $R^{D1}$ to $R^{D81}$ have the following structures:

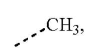

$R^{D1}$

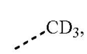

$R^{D2}$

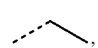

$R^{D3}$

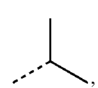

$R^{D4}$

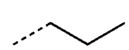

$R^{D5}$

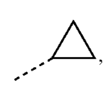

$R^{D6}$

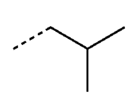

$R^{D7}$

-continued
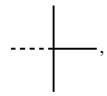
$R^{D8}$
$R^{D9}$
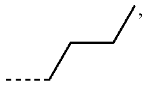
$R^{D10}$
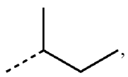
$R^{D11}$
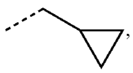
$R^{D12}$
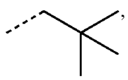
$R^{D13}$
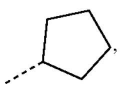
$R^{D14}$
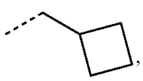
$R^{D15}$
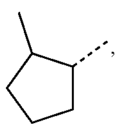
$R^{D16}$
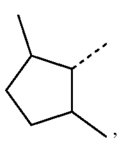
$R^{D17}$
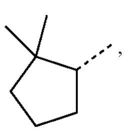
$R^{D18}$
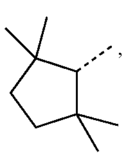
$R^{D19}$
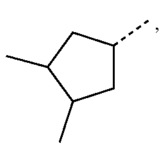
$R^{D20}$
-continued
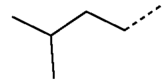
$R^{D21}$
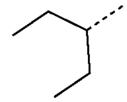
$R^{D22}$
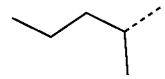
$R^{D23}$
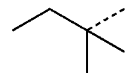
$R^{D24}$
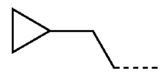
$R^{D25}$
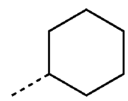
$R^{D26}$
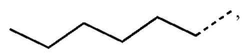
$R^{D27}$
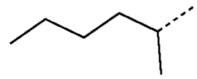
$R^{D28}$
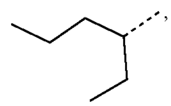
$R^{D29}$
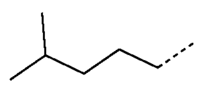
$R^{D30}$
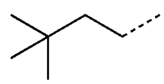
$R^{D31}$
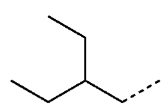
$R^{D32}$
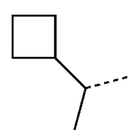
$R^{D33}$
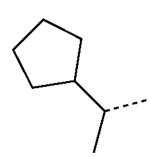
$R^{D34}$ $R^{D35}$
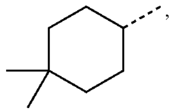
$R^{D36}$
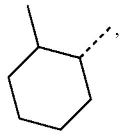
$R^{D37}$
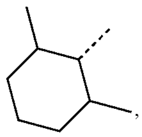
$R^{D38}$
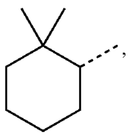
$R^{D39}$
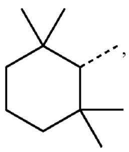
$R^{D40}$
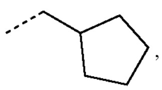
$R^{D41}$
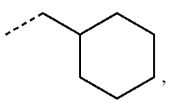
$R^{D42}$
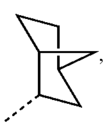
$R^{D43}$
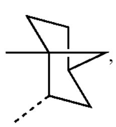
$R^{D44}$
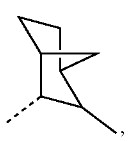
$R^{D45}$
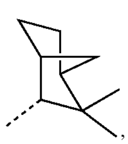
$R^{D46}$
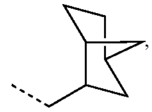
$R^{D47}$
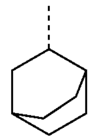
$R^{D48}$
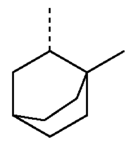
$R^{D49}$
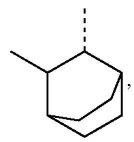
$R^{D50}$
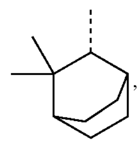
$R^{D51}$
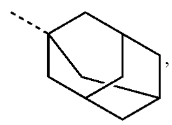
$R^{D52}$
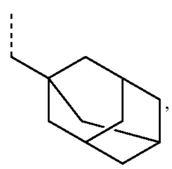
$R^{D53}$
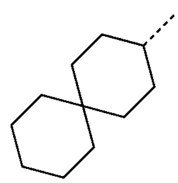
$R^{D54}$
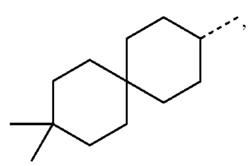
$R^{D55}$
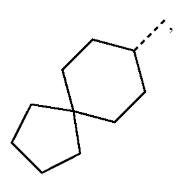

-continued $R^{D56}$

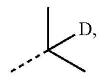

$R^{D57}$

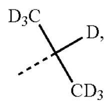

$R^{D58}$

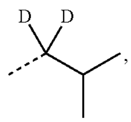

$R^{D59}$

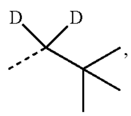

$R^{D60}$

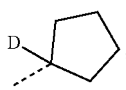

$R^{D61}$

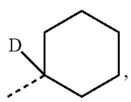

$R^{D62}$

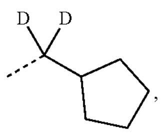

$R^{D63}$

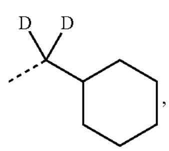

$R^{D64}$

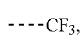

$R^{D65}$

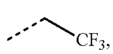

$R^{D66}$

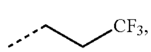

$R^{D67}$

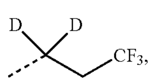

$R^{D68}$

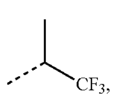

$R^{D69}$

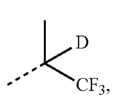

$R^{D70}$

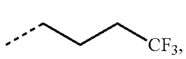

$R^{D71}$

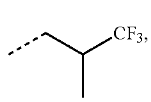

-continued $R^{D72}$

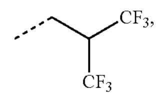

$R^{D73}$

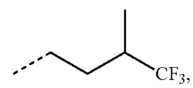

$R^{D74}$

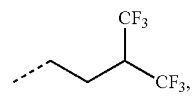

$R^{D75}$

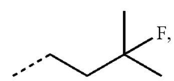

$R^{D76}$

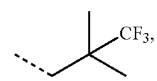

$R^{D77}$

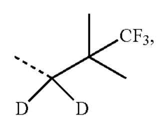

$R^{D78}$

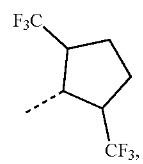

$R^{D79}$

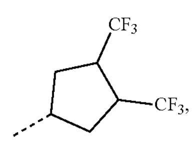

$R^{D80}$

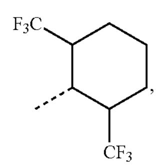

and $R^{D81}$

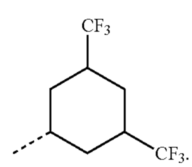

In some embodiments, an organic light emitting device (OLED) is described. The OLED can include an anode; a cathode; and an organic layer, disposed between the anode and the cathode, where the organic layer includes a compound comprising a first ligand $L_A$ of Formula I as described herein.

In some embodiments, a consumer product comprising an OLED as described herein is described.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

According to another aspect, an emissive region in an OLED (e.g., the organic layer described herein) is disclosed. The emissive region comprises a compound comprising a first ligand $L_A$ of Formula I as described herein. In some embodiments, the first compound in the emissive region is an emissive dopant or a non-emissive dopant. In some embodiments, the emissive dopant further comprises a host, wherein the host comprises at least one selected from the group consisting of metal complex, triphenylene, carbazole, dibenzothiophene, dibenzofuran, dibenzoselenophene, aza-triphenylene, aza-carbazole, aza-dibenzothiophene, aza-dibenzofuran, and aza-dibenzoselenophene. In some embodiments, the emissive region further comprises a host, wherein the host is selected from the group consisting of:

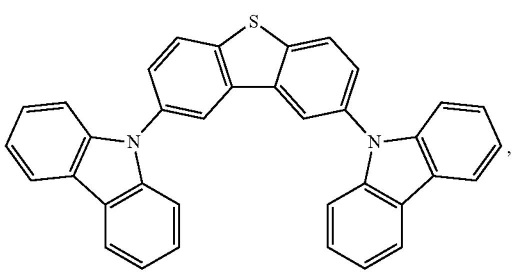

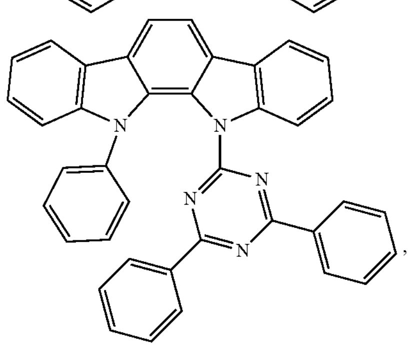

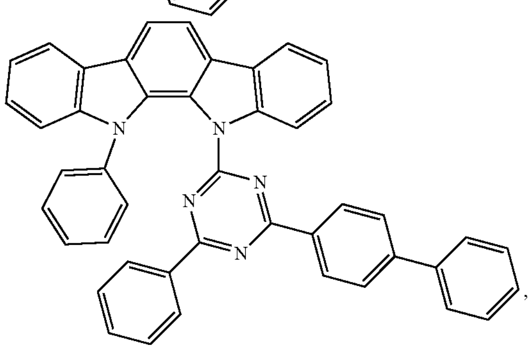

-continued

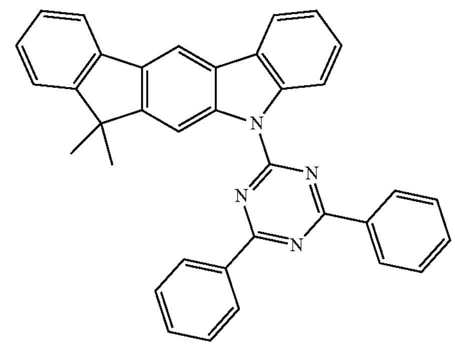

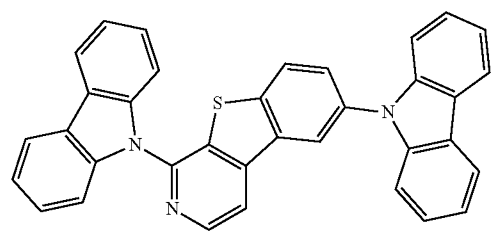

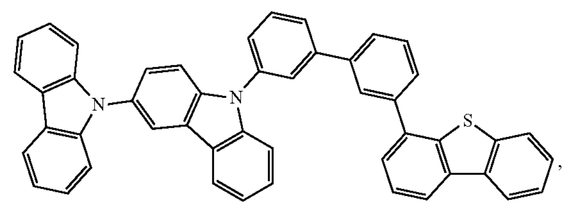

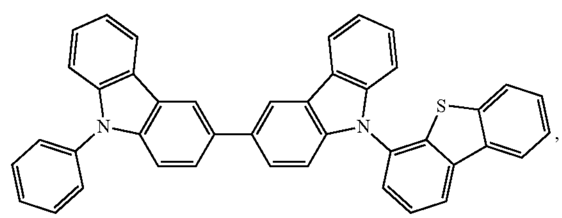

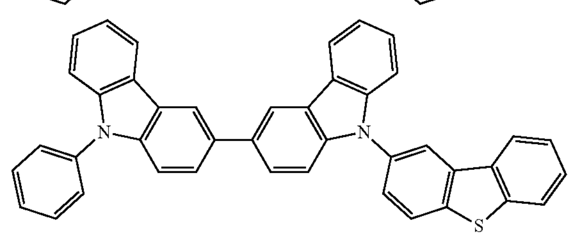

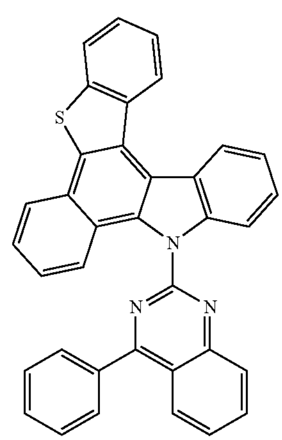

-continued
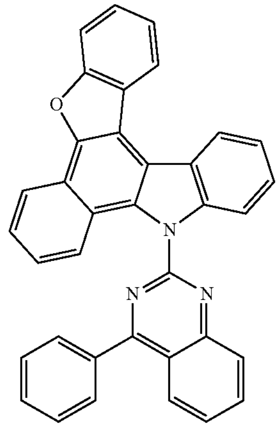
,
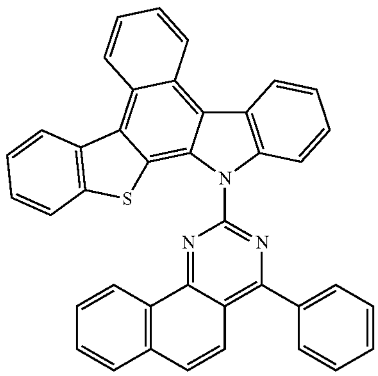
,
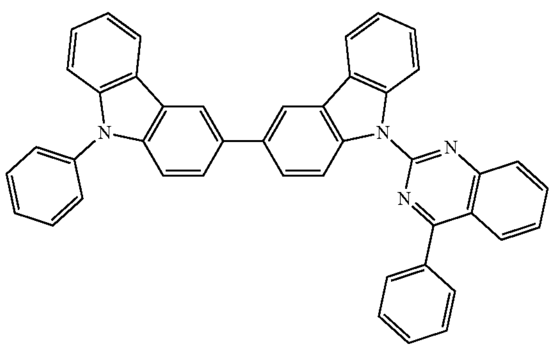
,
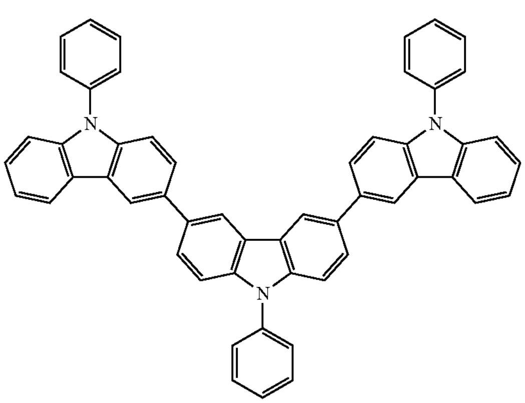
,
-continued
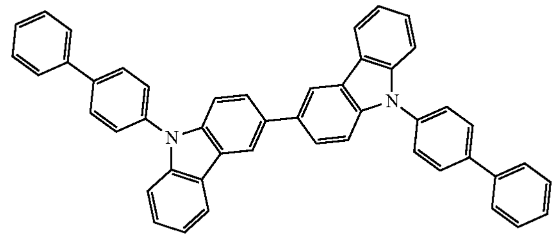
,
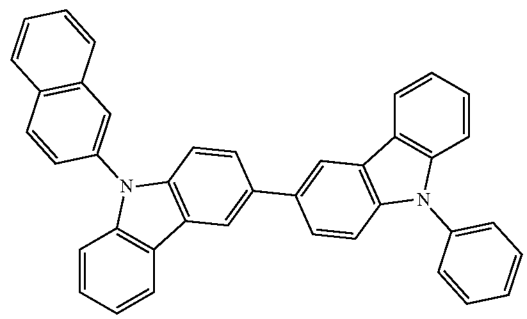
,
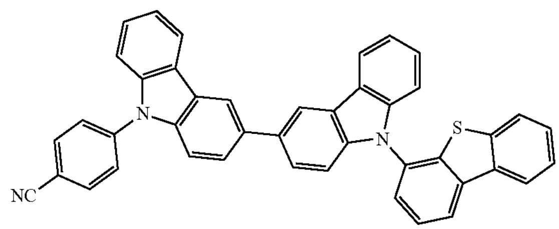
,
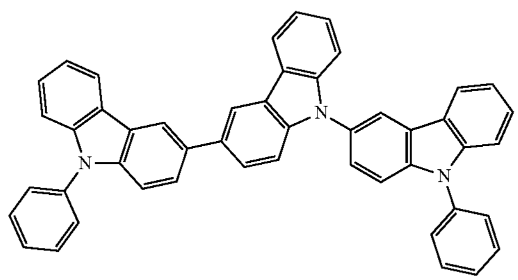
,
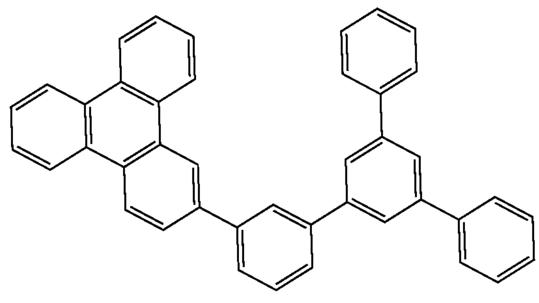
,
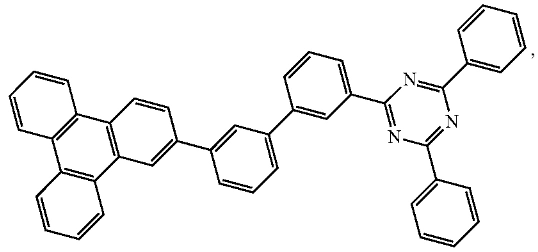
, -continued

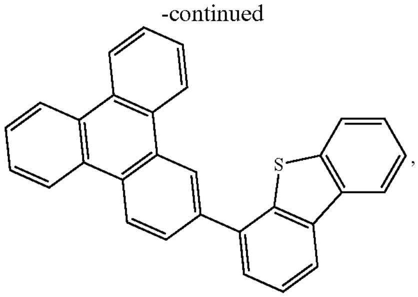

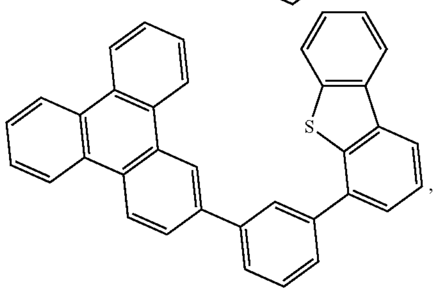

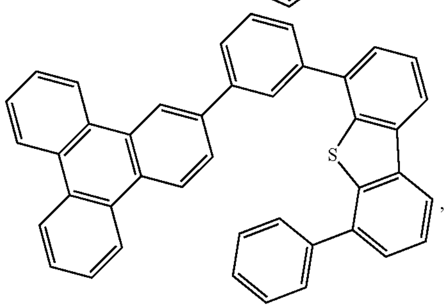

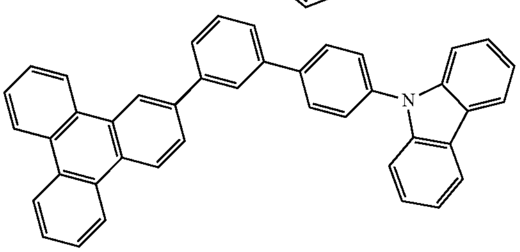

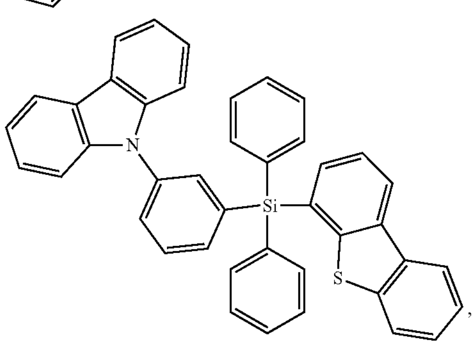

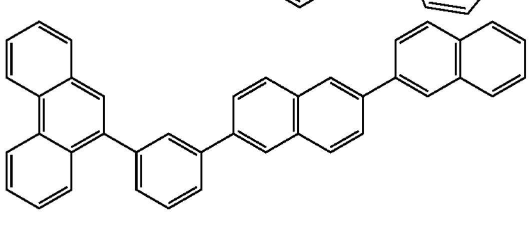

and combinations thereof.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence; see. e.g., U.S. application Ser. No. 15/700,352, which is hereby incorporated by reference in its entirety), triplet-triplet annihilation, or combinations of these processes. In some embodiments, the emissive dopant can be a racemic mixture, or can be enriched in one enantiomer.

According to another aspect, a formulation comprising the compound described herein is also disclosed.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used may be a) bipolar, b) electron transporting, c) hole transporting or d) wide band gap materials that play little role in charge transport. In some embodiments, the host can include a metal complex. The host can be a triphenylene containing benzo-fused thiophene or benzo-fused furan. Any substituent in the host can be an unfused substituent independently selected from the group consisting of $C_nH_{2n+1}$, $OC_nH_{2n+1}$, $OAr_1$, $N(C_nH_{2n+1})_2$, $N(Ar_1)(Ar_2)$, $CH{=}CH{-}C_nH_{2n+1}$, $C{\equiv}C{-}C_nH_{2n+1}$, $Ar_1$, $Ar_1{-}Ar_2$, and $C_nH_{2n}{-}Ar_1$, or the host has no substitutions. In the preceding substituents n can range from 1 to 10; and $Ar_1$ and $Ar_2$ can be independently selected from the group consisting of benzene, biphenyl, naphthalene, triphenylene, carbazole, and heteroaromatic analogs thereof. The host can be an inorganic compound. For example a Zn containing inorganic material e.g. ZnS.

The host can be a compound comprising at least one chemical group selected from the group consisting of triphenylene, carbazole, dibenzothiophene, dibenzofuran, dibenzoselenophene, azatriphenylene, azacarbazole, aza-dibenzothiophene, aza-dibenzofuran, and aza-dibenzoselenophene. The host can include a metal complex. The host can be, but is not limited to, a specific compound selected from the group consisting of:

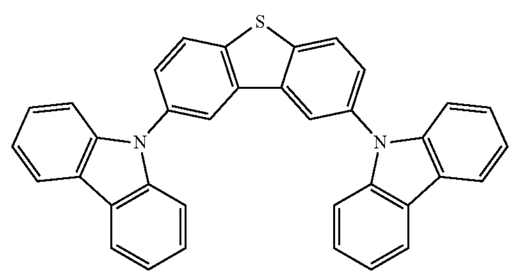

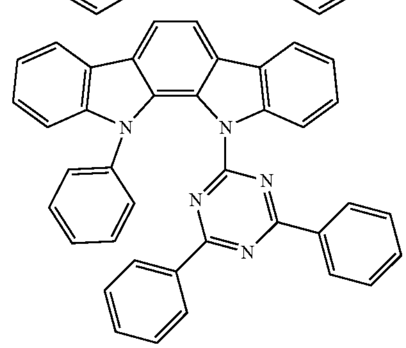

-continued
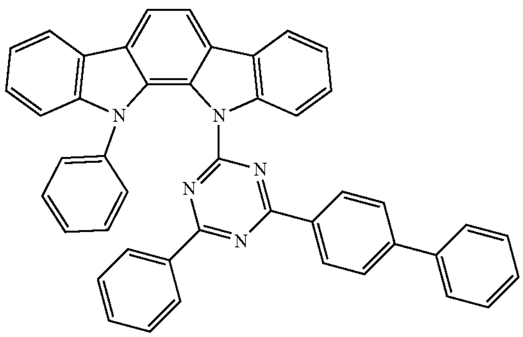
,
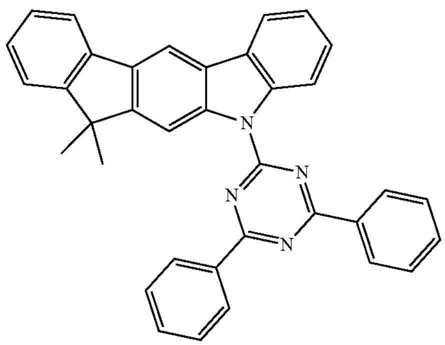
,
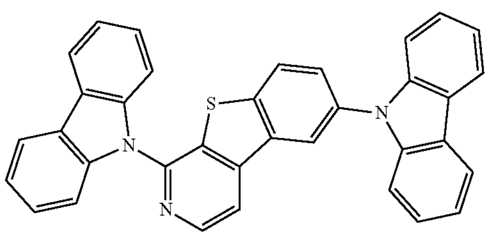
,
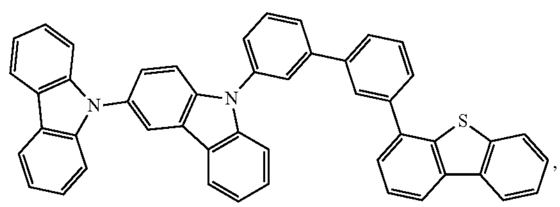
,
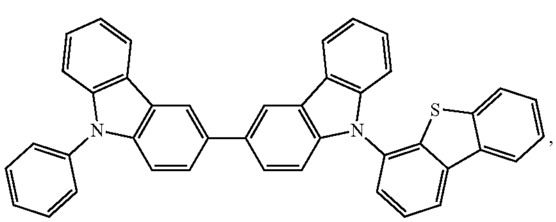
,
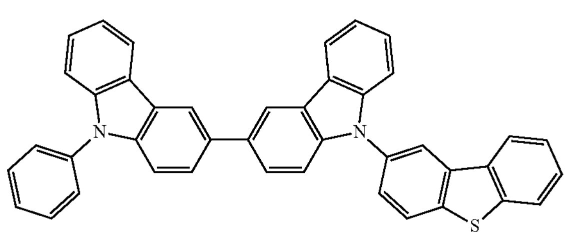
,
-continued
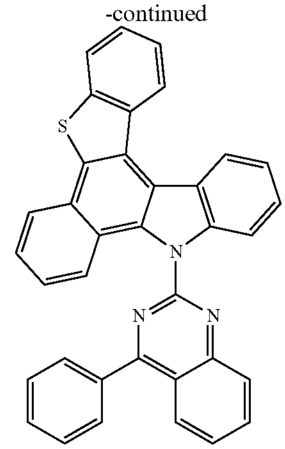
,
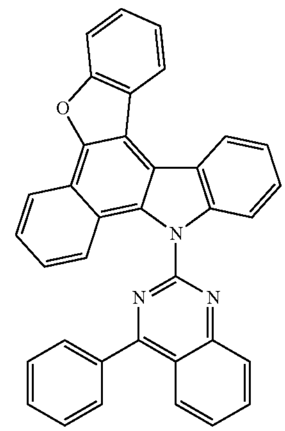
,
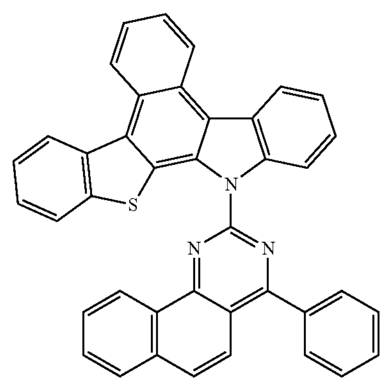
,
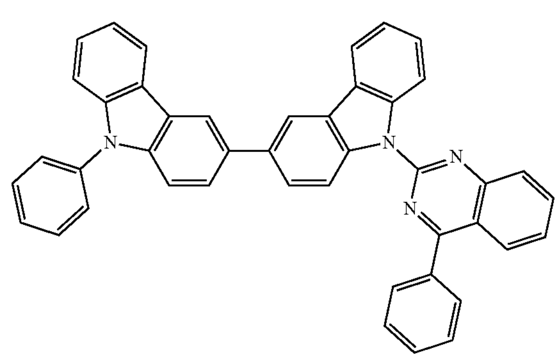
, -continued
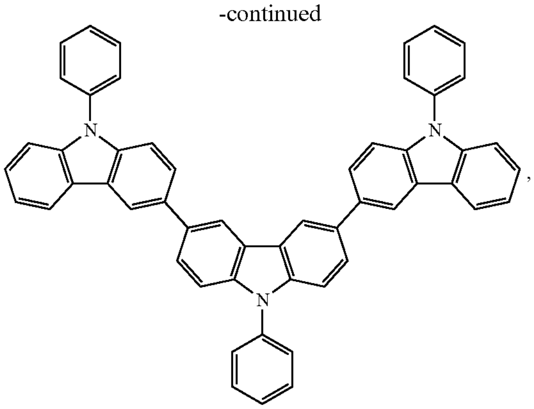
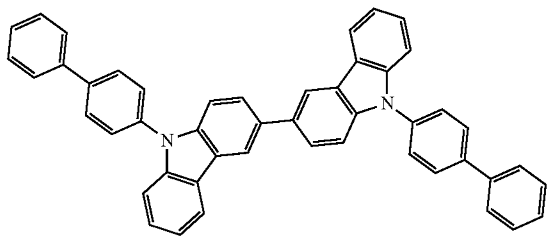
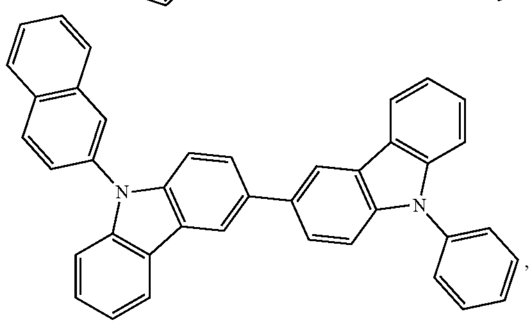
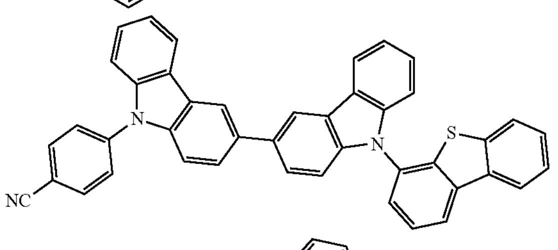
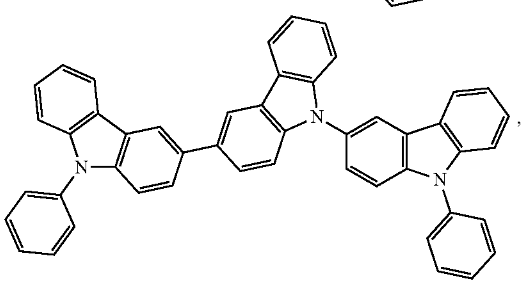
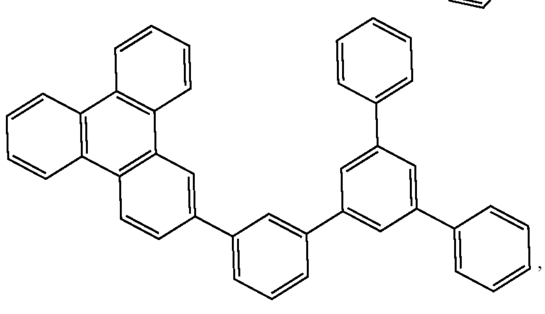
-continued
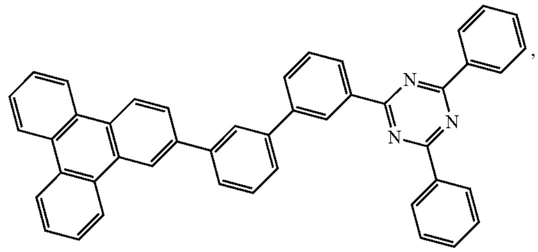
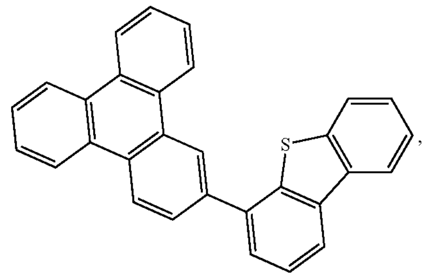
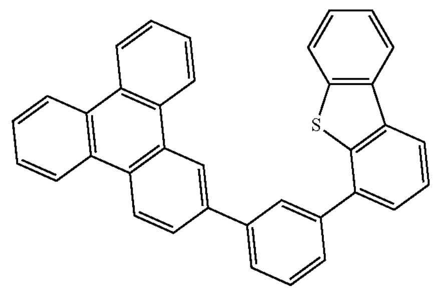
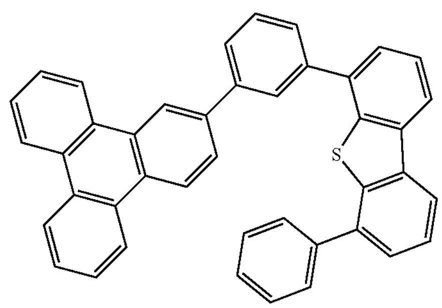
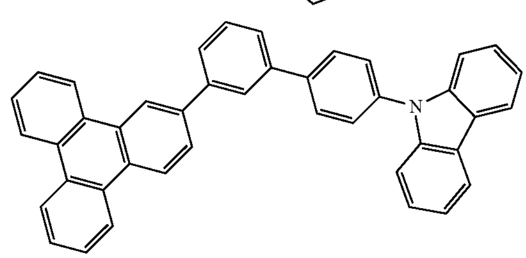
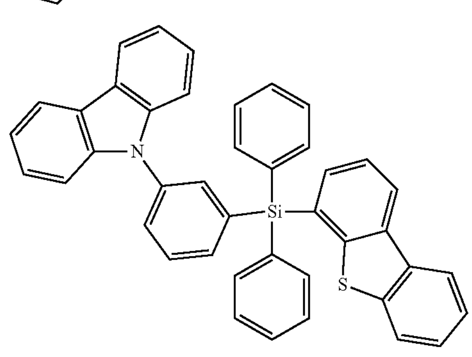

-continued

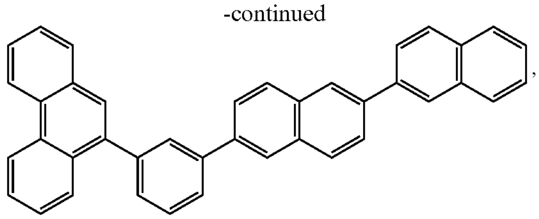

and combinations thereof. Additional information on possible hosts is provided below.

In yet another aspect of the present disclosure, a formulation that comprises the novel compound disclosed herein is described. The formulation can include one or mom components selected from the group consisting of a solvent, a host, a hole injection material, hole transport material, electron blocking material, hole blocking material, and an electron transport material, disclosed hemin.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

Non-limiting examples of the conductivity dopants that may be used in an OLED in combination with materials disclosed herein are exemplified below together with references that disclose those materials: EP01617493, EP01968131, EP2020694, EP2684932, US20050139810, US20070160905, US20090167167, US2010288362, WO06081780, WO2009003455, WO2009008277, WO2009011327, WO2014009310, US2007252140, US2015060804, US20150123047, and US2012146012.

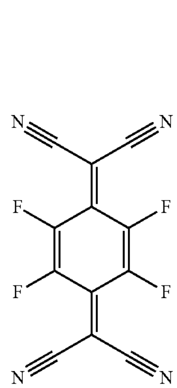

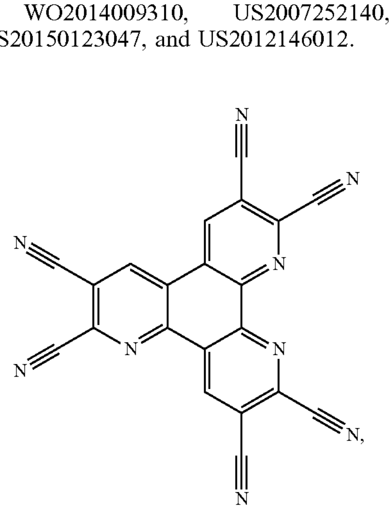

-continued

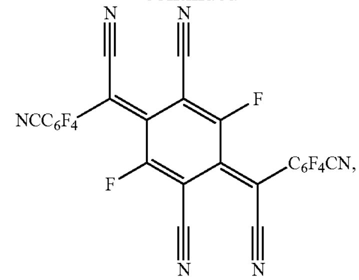

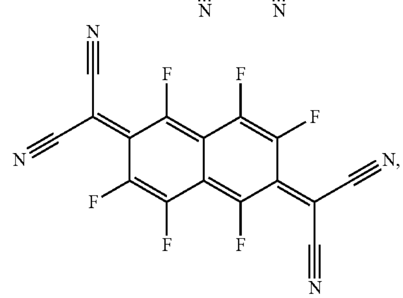

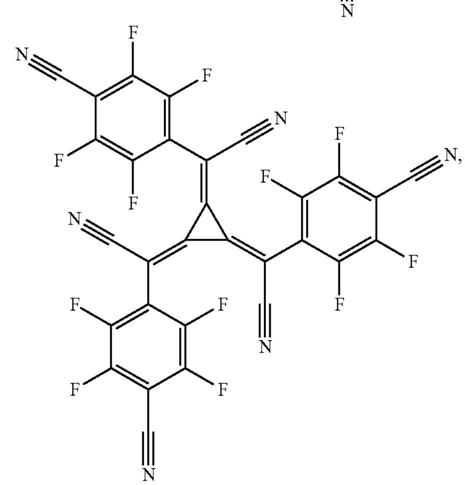

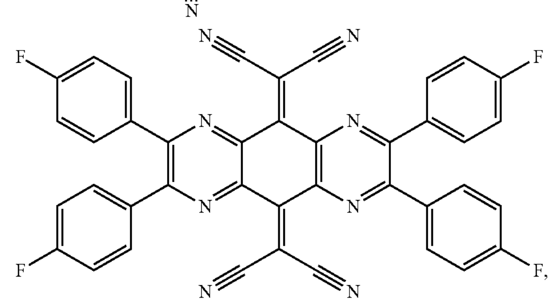

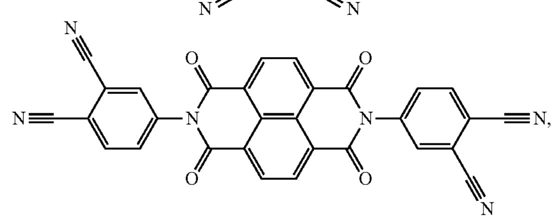

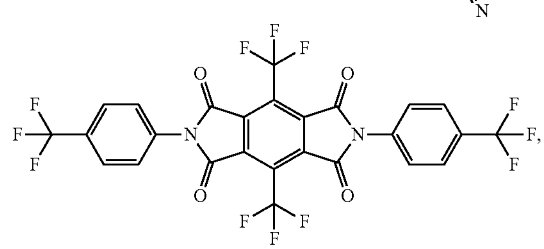

-continued

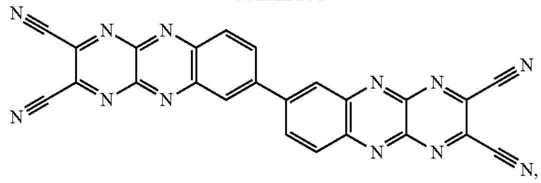

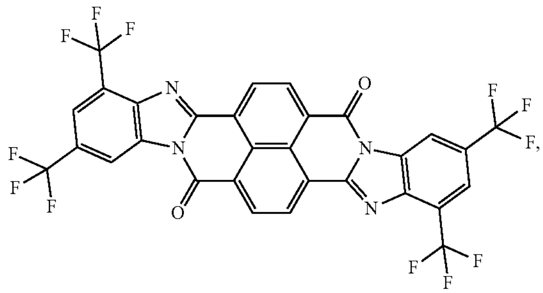

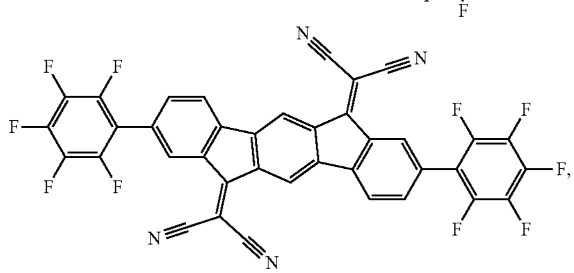

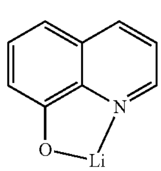

, and

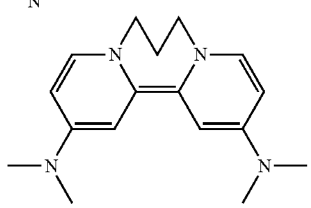

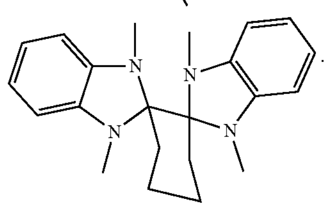

HIL/HTL:

A hole injecting/transporting material to be used in the present invention is not particularly limited, and any compound may be used as long as the compound is typically used as a hole injecting/transporting material. Examples of the material include, but are not limited to: a phthalocyanine or porphyrin derivative; an aromatic amine derivative; an indolocarbazole derivative; a polymer containing fluorohydrocarbon; a polymer with conductivity dopants; a conducting polymer, such as PEDOT/PSS; a self-assembly monomer derived from compounds such as phosphonic acid and silane derivatives; a metal oxide derivative, such as $MoO_x$; a p-type semiconducting organic compound, such as 1,4,5,8,9,12-Hexaazatriphenylenehexacarbonitrile; a metal complex, and a cross-linkable compounds.

Examples of aromatic amine derivatives used in HIL or HTL include, but not limit to the following general structures:

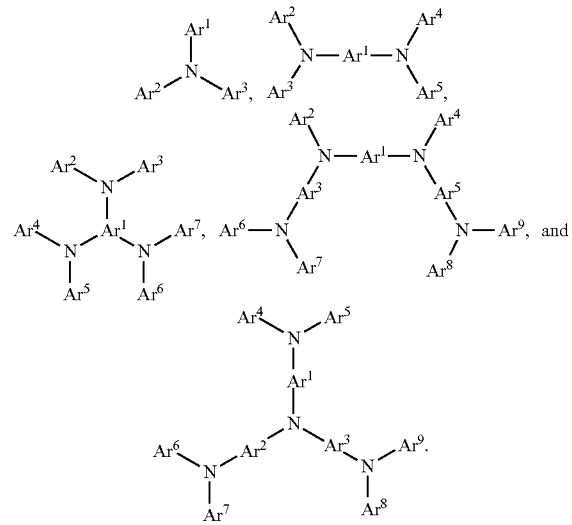

Each of $Ar^1$ to $Ar^9$ is selected from the group consisting of aromatic hydrocarbon cyclic compounds such as benzene, biphenyl, triphenyl, triphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Each Ar may be unsubstituted or may be substituted by a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof.

In one aspect, $Ar^1$ to $Ar^9$ is independently selected from the group consisting of:

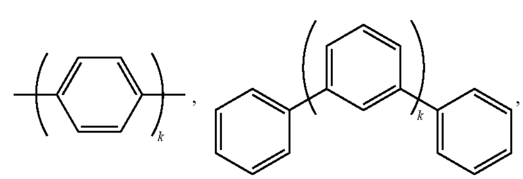

-continued

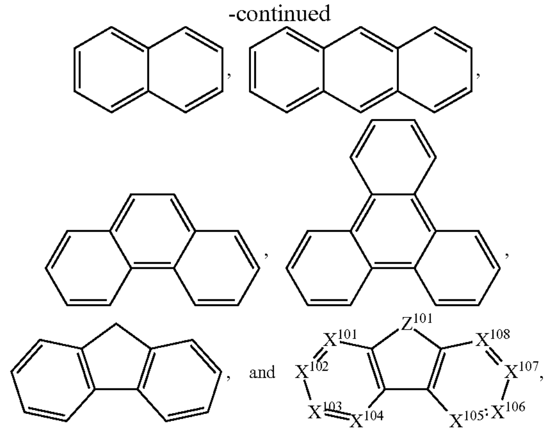

wherein k is an integer from 1 to 20; $X^{101}$ to $X^{108}$ is C (including CH) or N; $Z^{101}$ is $NAr^1$, O, or S; $Ar^1$ has the same group defined above.

Examples of metal complexes used in HIL or HTL include, but are not limited to the following general formula:

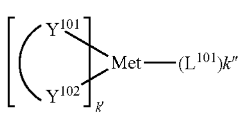

wherein Met is a metal, which can have an atomic weight greater than 40; ($Y^{101}$-$Y^{102}$) is a bidentate ligand, $Y^{101}$ and $Y^{102}$ are independently selected from C, N, O, P, and S; $L^{101}$ is an ancillary ligand; k' is an integer value from 1 to the maximum number of ligands that may be attached to the metal; and k'+k" is the maximum number of ligands that may be attached to the metal.

In one aspect, ($Y^{101}$-$Y^{102}$) is a 2-phenylpyridine derivative. In another aspect, ($Y^{101}$-$Y^{102}$) is a carbene ligand. In another aspect, Met is selected from Ir, Pt, Os, and Zn. In a further aspect, the metal complex has a smallest oxidation potential in solution vs. $Fc^+$/Fc couple less than about 0.6 V.

Non-limiting examples of the HIL and HTL materials that may be used in an OLED in combination with materials disclosed herein are exemplified below together with references that disclose those materials: CN102702075, DE102012005215, EP01624500, EP01698613, EP01806334, EP01930964, EP01972613, EP01997799, EP02011790, EP02055700, EP02055701, EP1725079, EP2085382, EP2660300, EP650955, JP07-073529, JP2005112765, JP2007091719, JP2008021687, JP2014-009196, KR20110088898, KR20130077473, TW201139402, U.S. Ser. No. 06/517,957, US20020158242, US20030162053, US20050123751, US20060182993, US20060240279, US20070145888, US20070181874, US20070278938, US20080014464, US20080091025, US20080106190, US20080124572, US20080145707, US20080220265, US20080233434, US20080303417, US2008107919, US20090115320, US20090167161, US2009066235, US2011007385, US20110163302, US2011240968, US2011278551, US2012205642, US2013241401, US20140117329, US2014183517, U.S. Pat. Nos. 5,061,569, 5,639,914, WO05075451, WO07125714, WO08023550, WO08023759, WO2009145016, WO2010061824, WO2011075644, WO2012177006, WO2013018530, WO2013039073, WO2013087142, WO2013118812, WO2013120577, WO2013157367, WO2013175747, WO2014002873, WO2014015935, WO2014015937, WO2014030872, WO2014030921, WO2014034791, WO2014104514, WO2014157018.

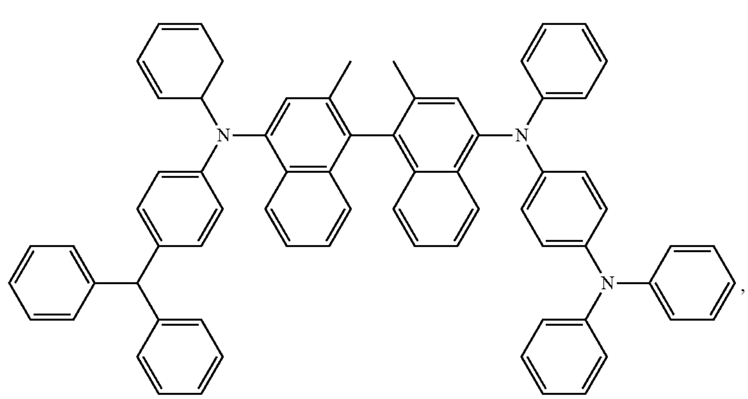

-continued
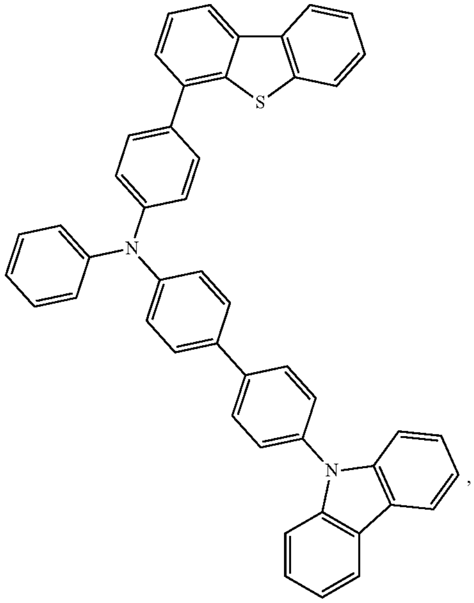
,
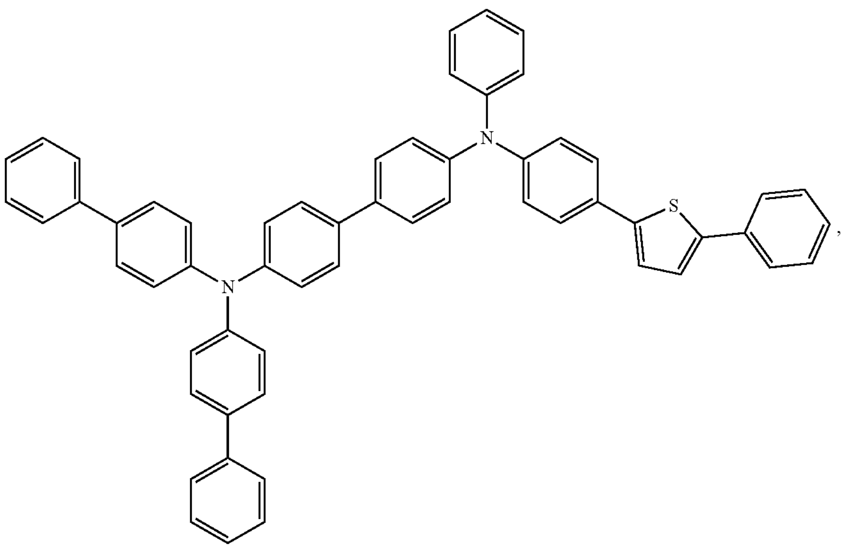
,
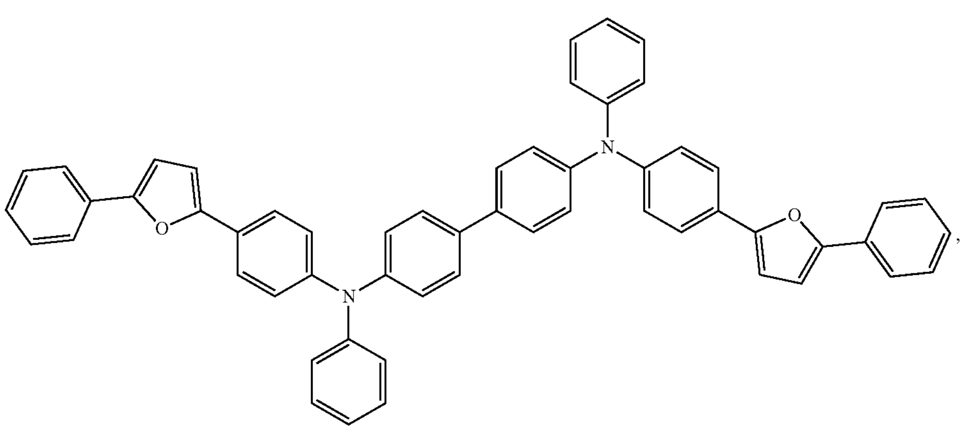
,

-continued
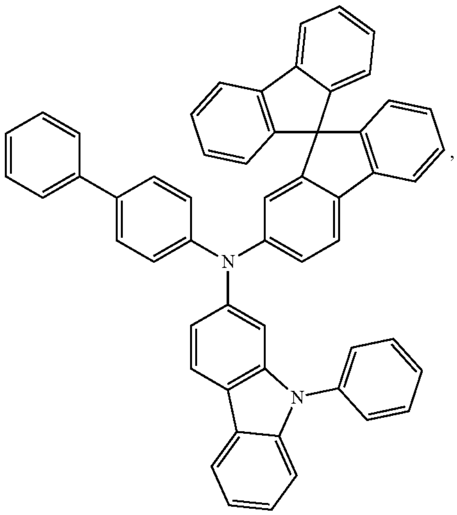
,
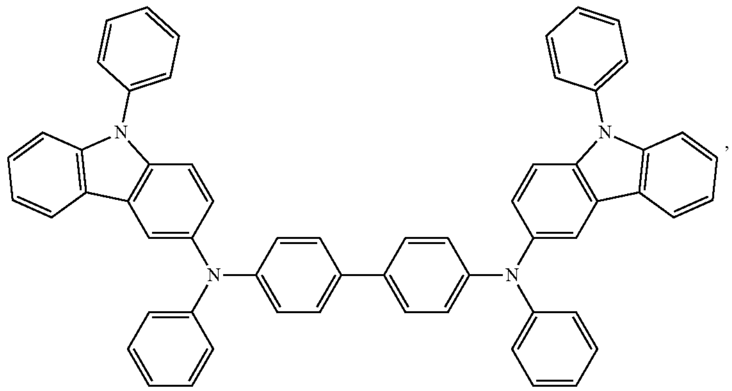
,
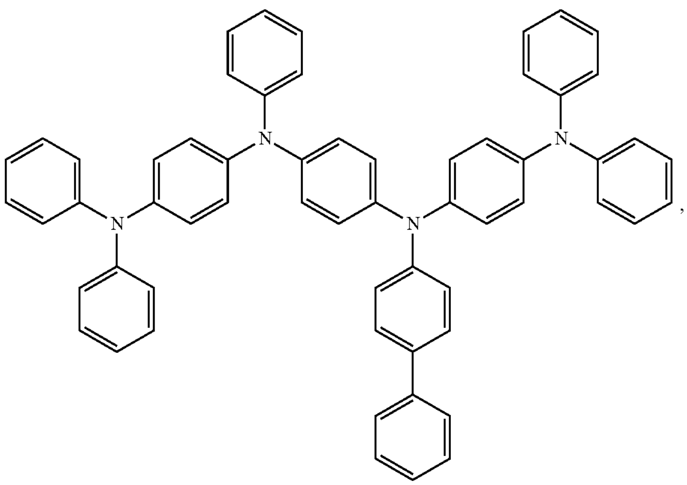
,
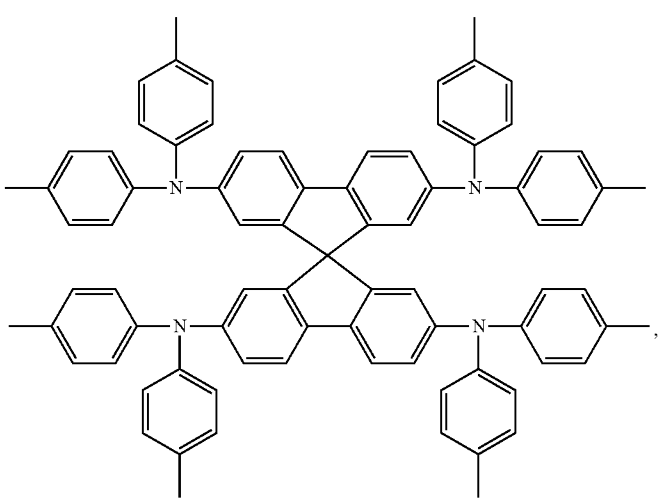
,

-continued
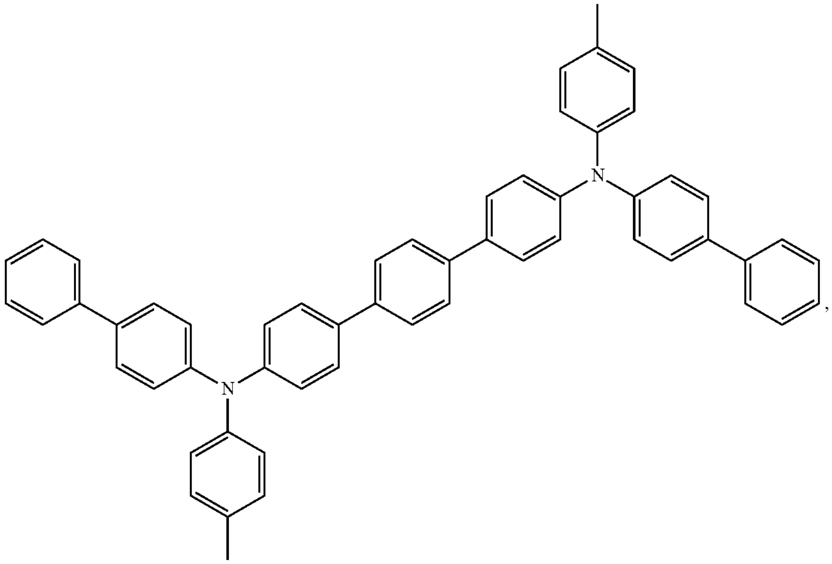
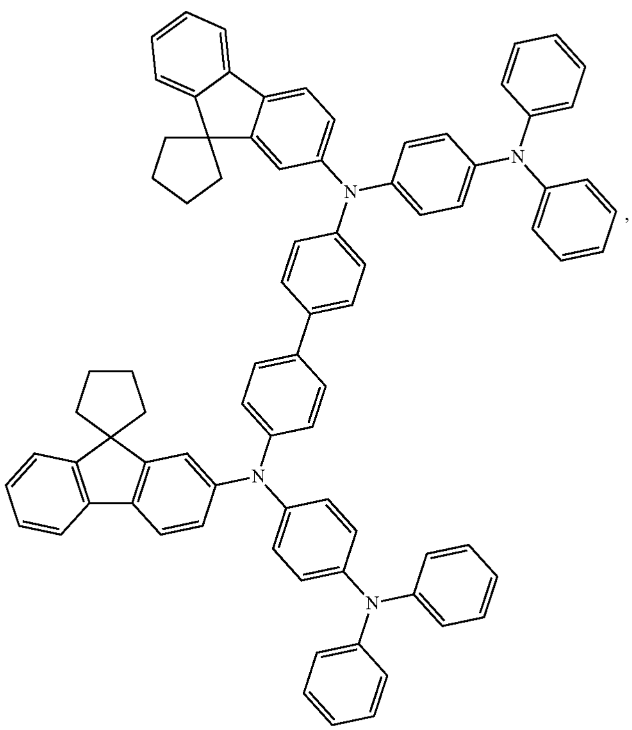
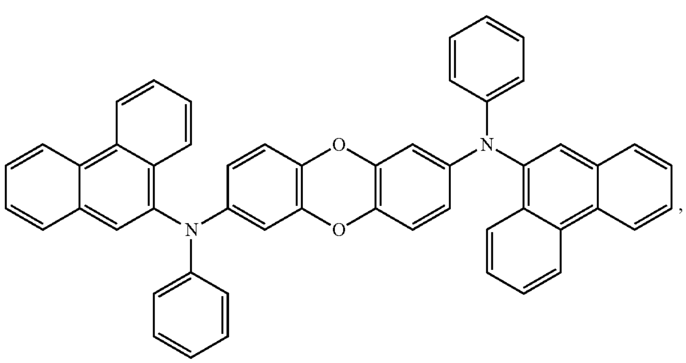

-continued
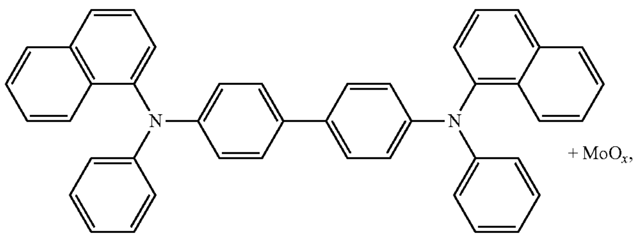
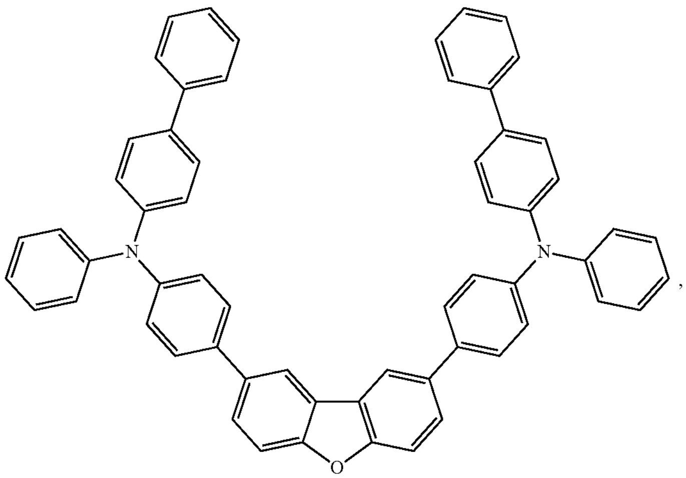
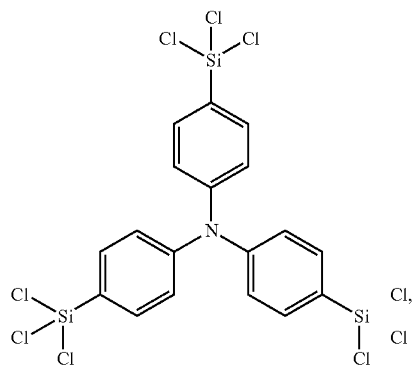
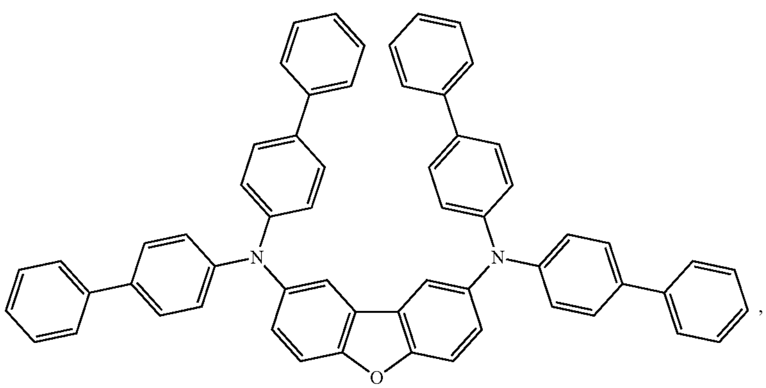
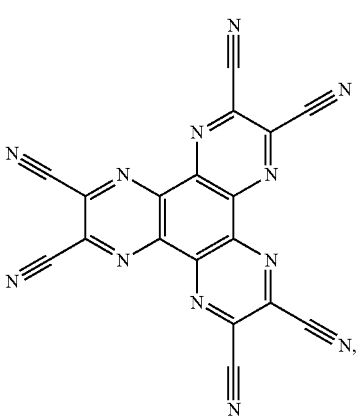

-continued
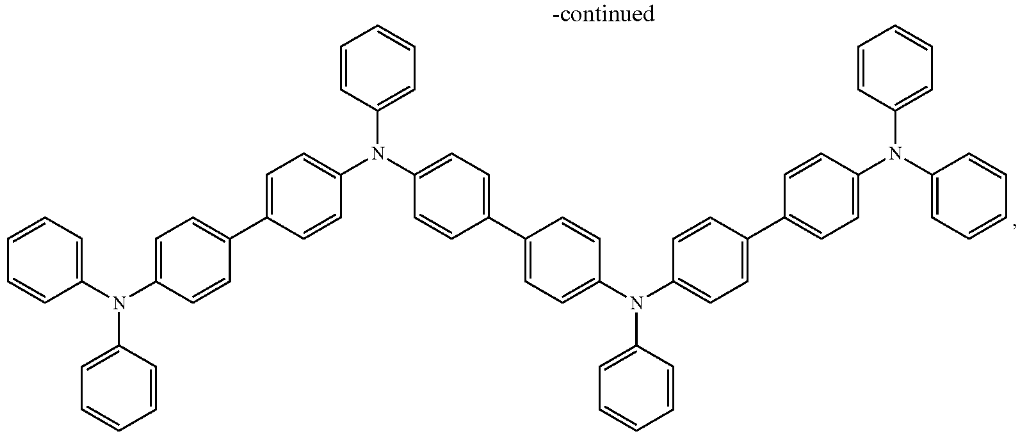
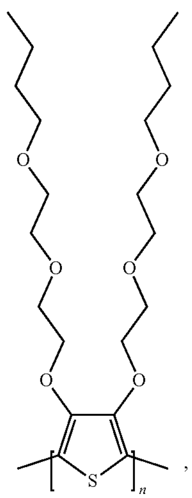
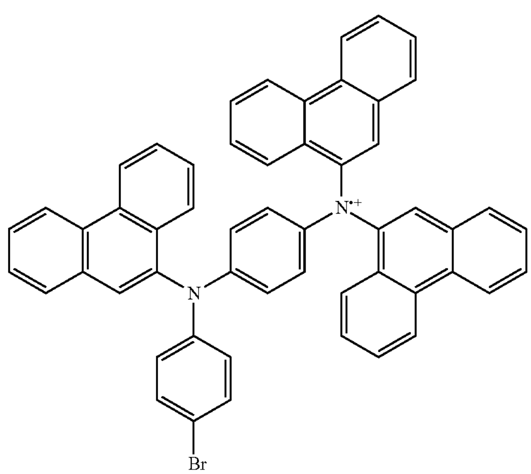
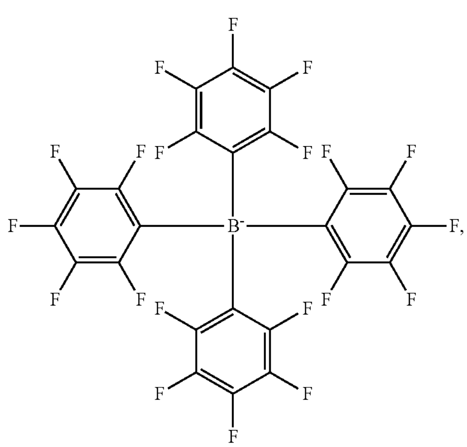
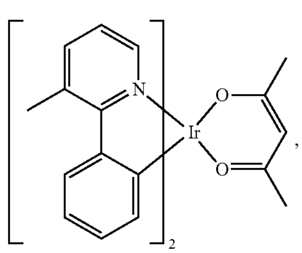

-continued
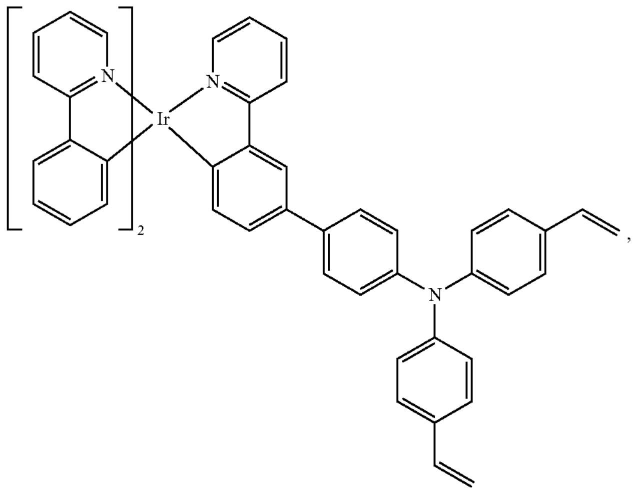
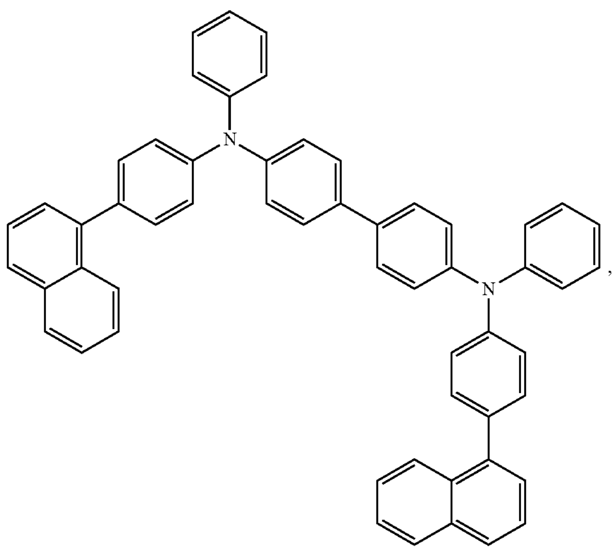
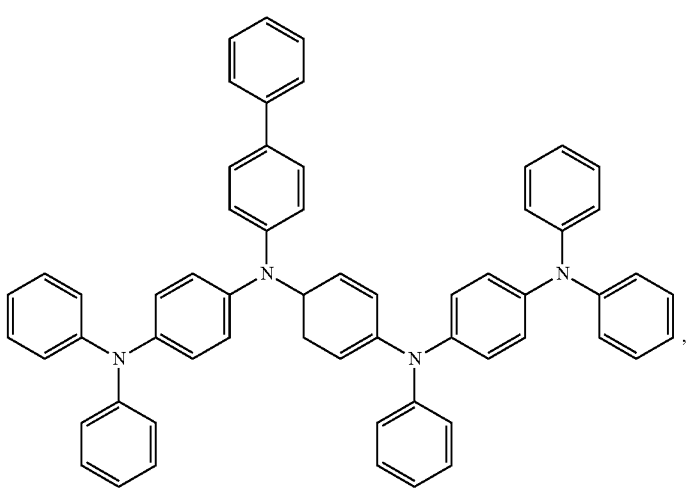

-continued
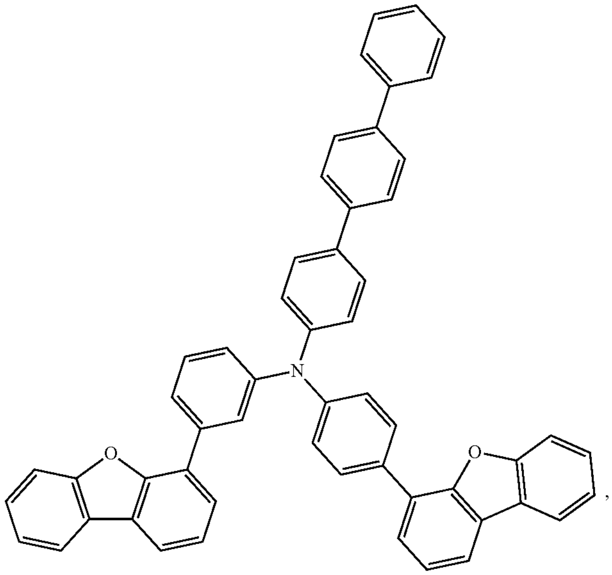
,
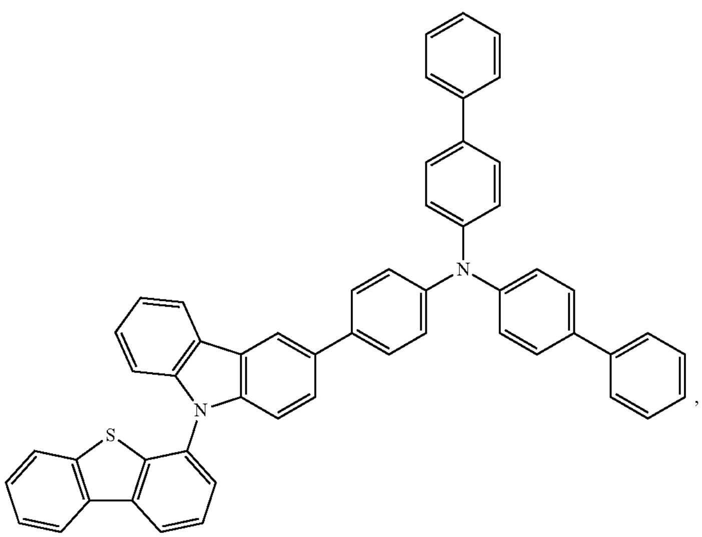
,
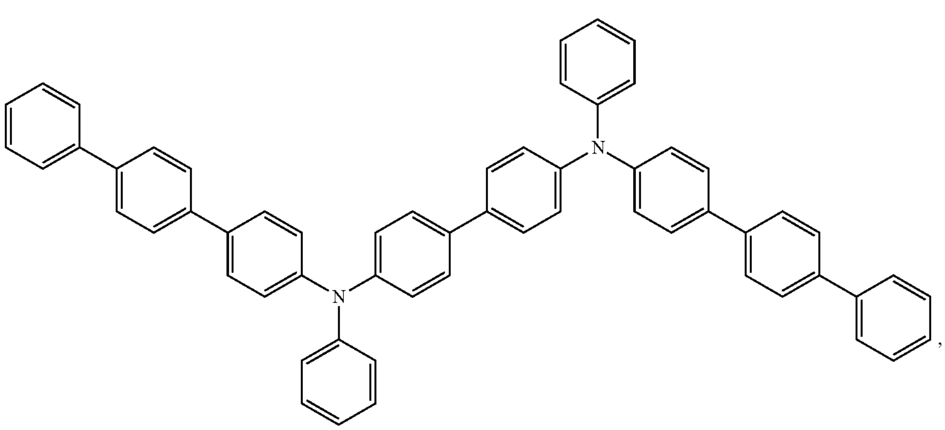
,

-continued
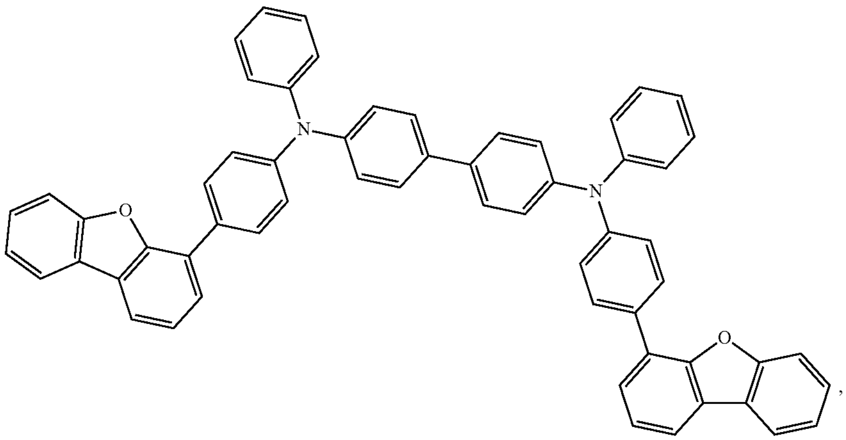
,
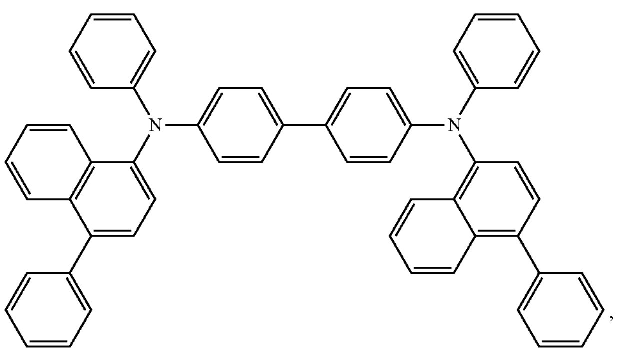
,
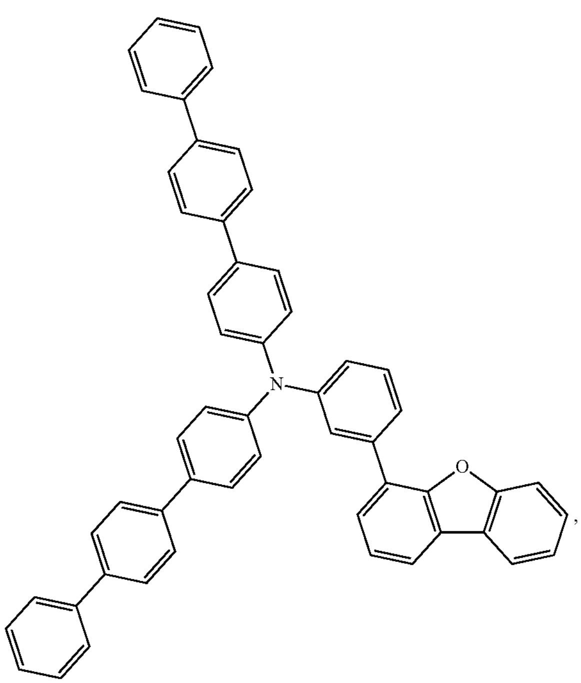
,
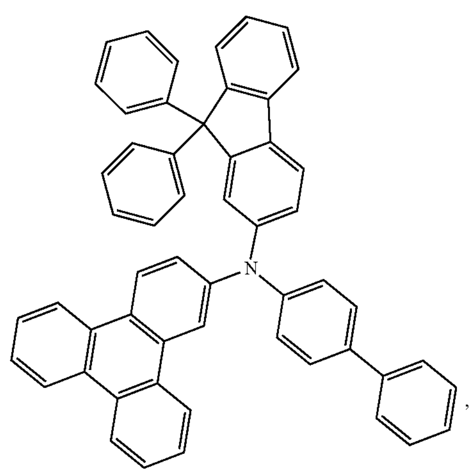
,

-continued
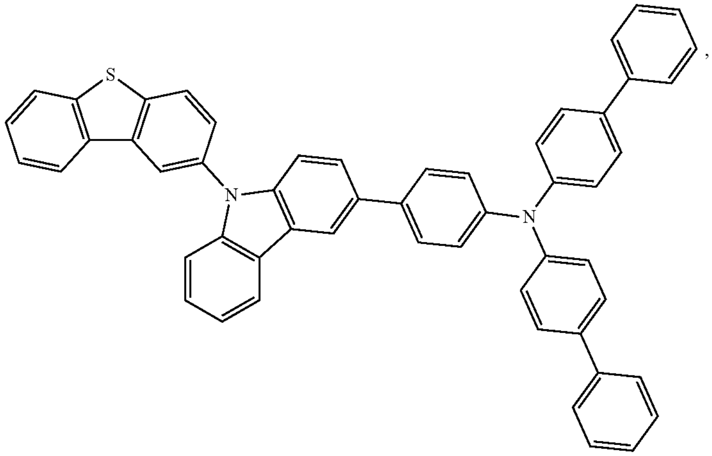
,
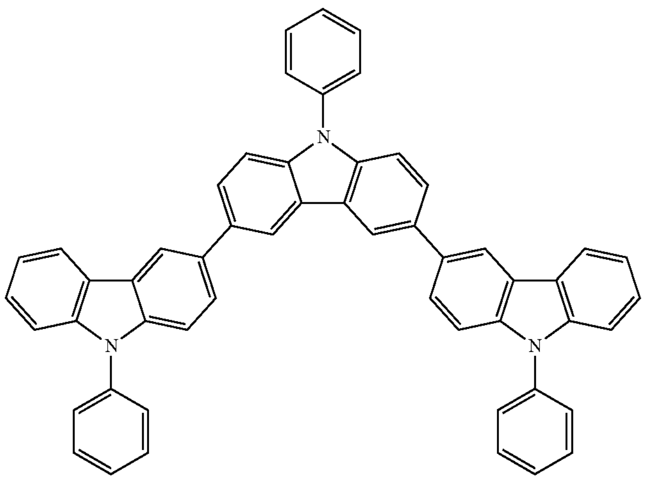
,
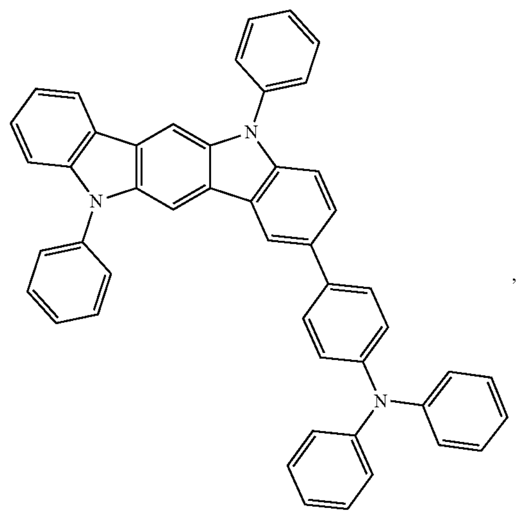
,
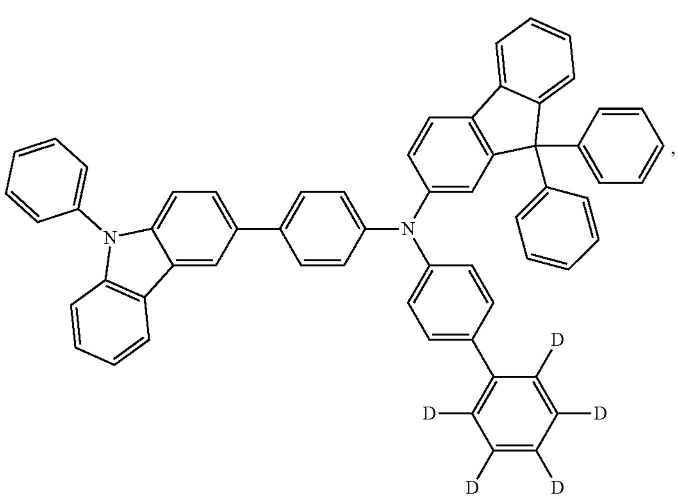
,

-continued
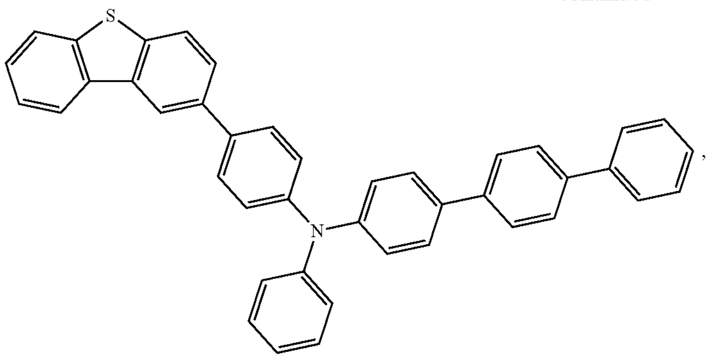
,
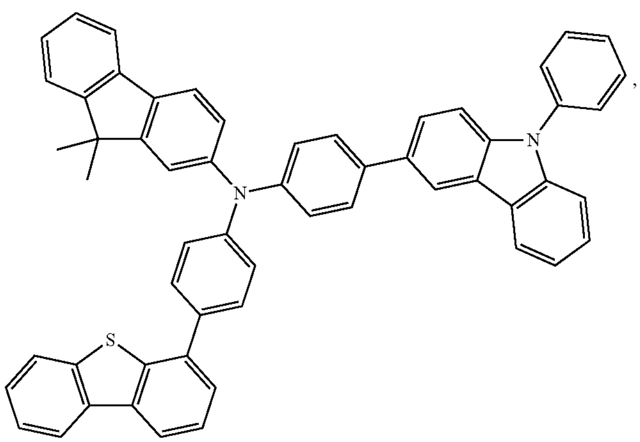
,
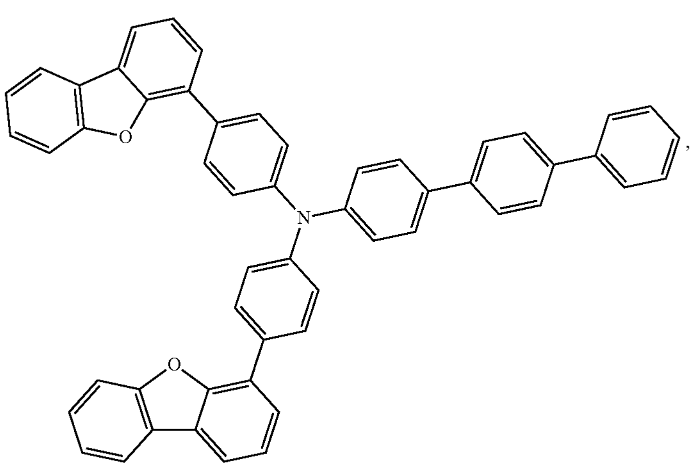
,

-continued
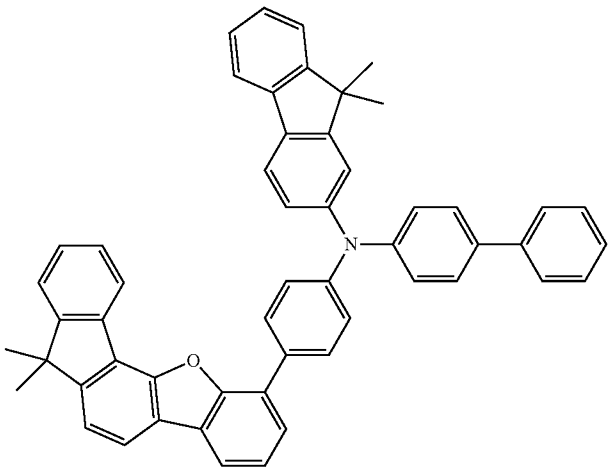
,
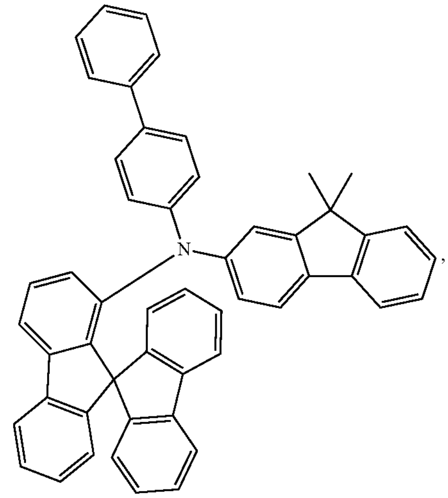
,
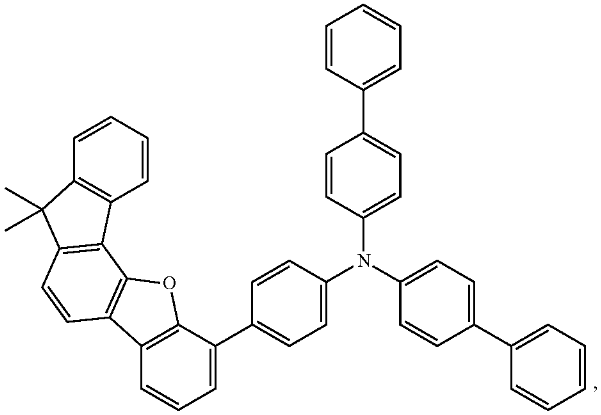
,
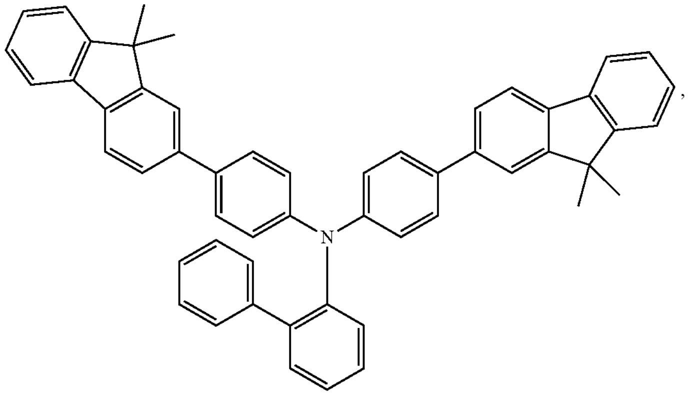
,

-continued
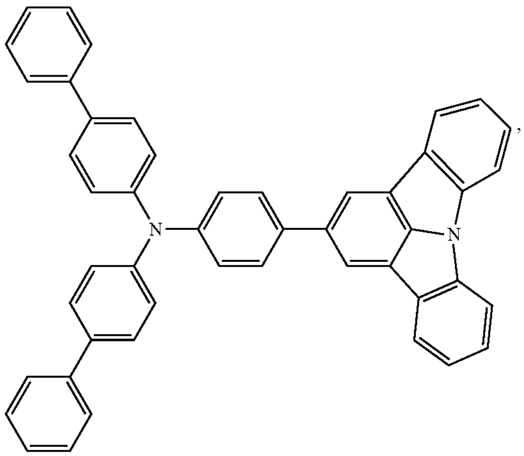
,
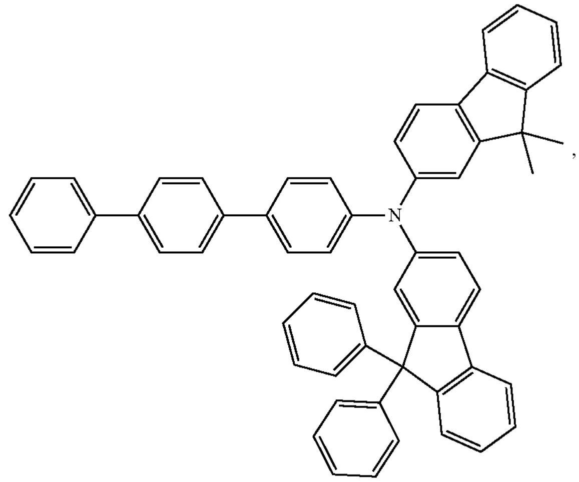
,
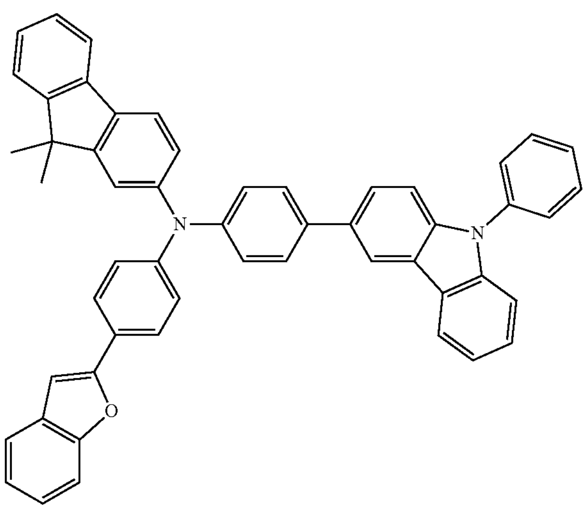
,
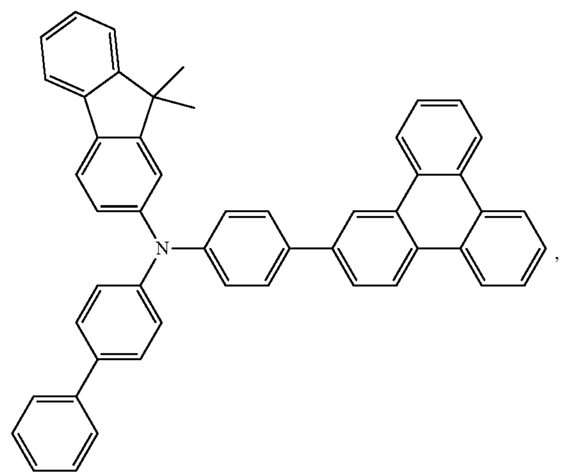
,
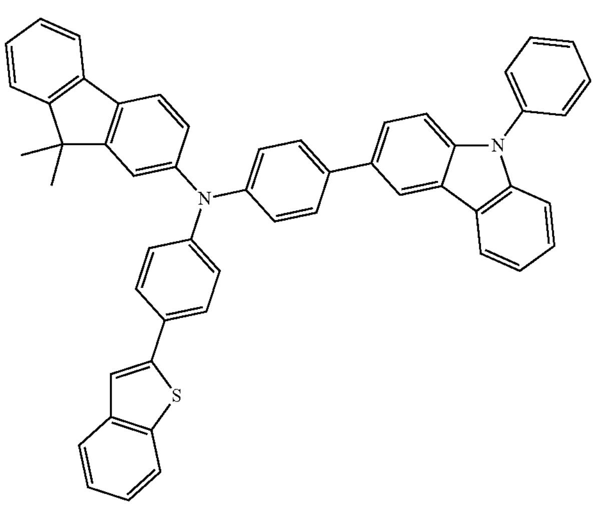
, -continued
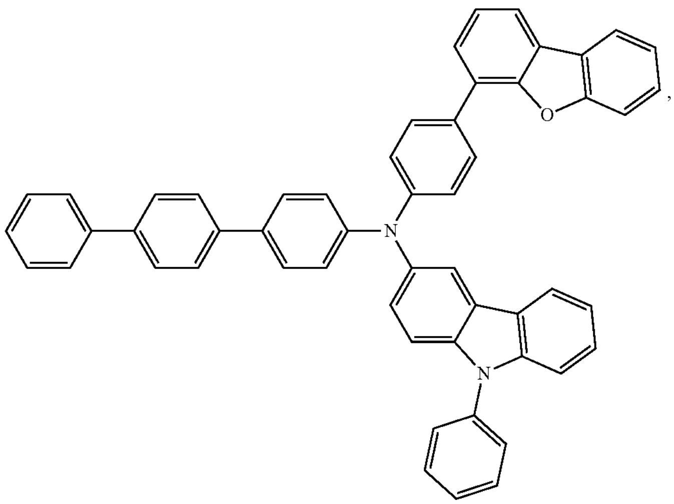
,
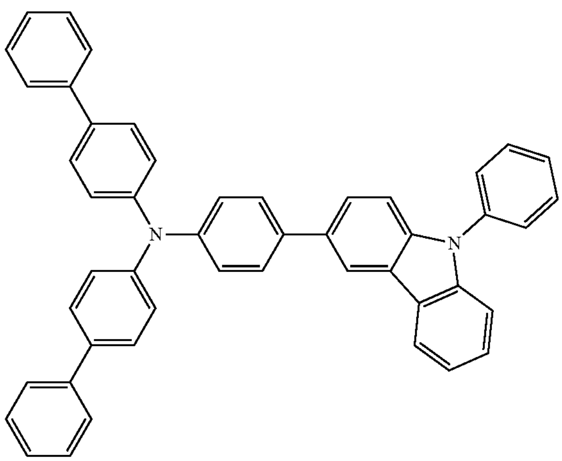
,
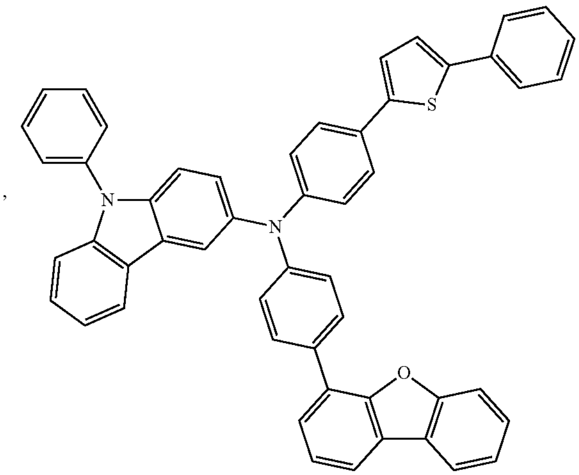
,
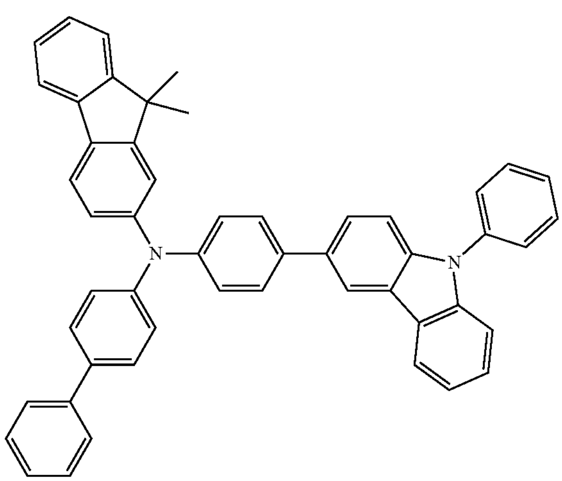
,
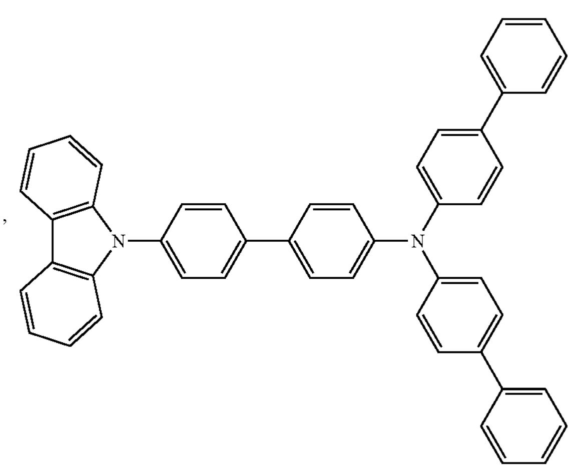
, -continued
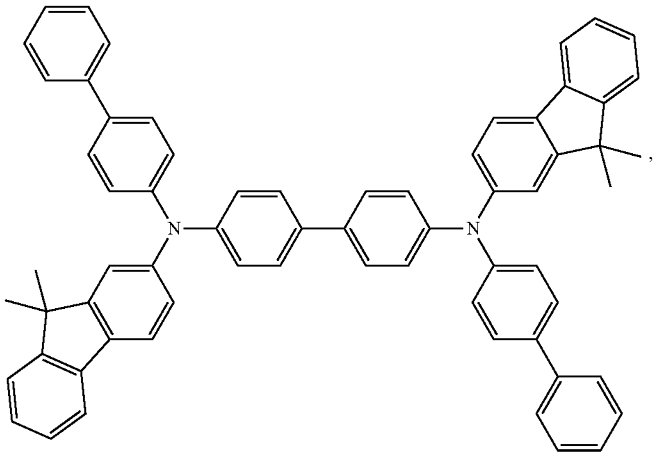
,
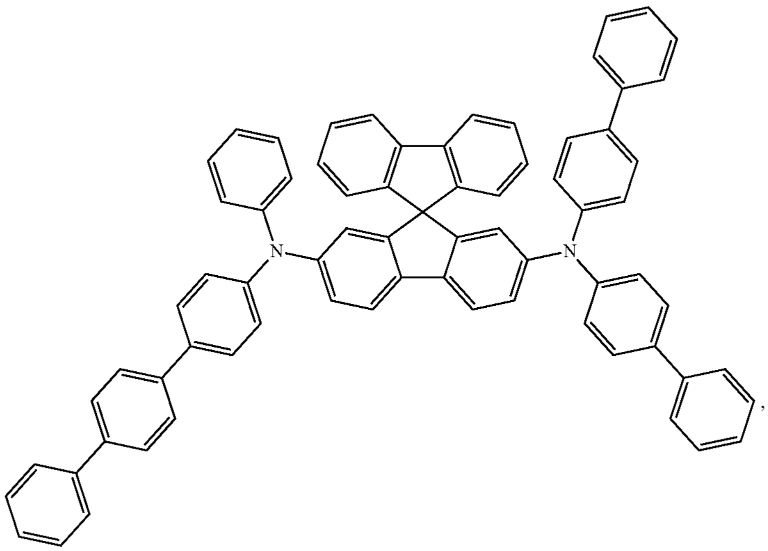
,
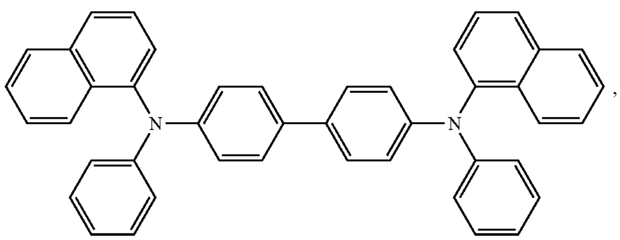
,
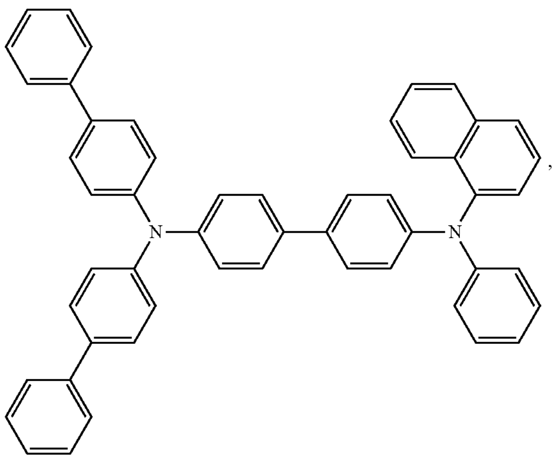
,
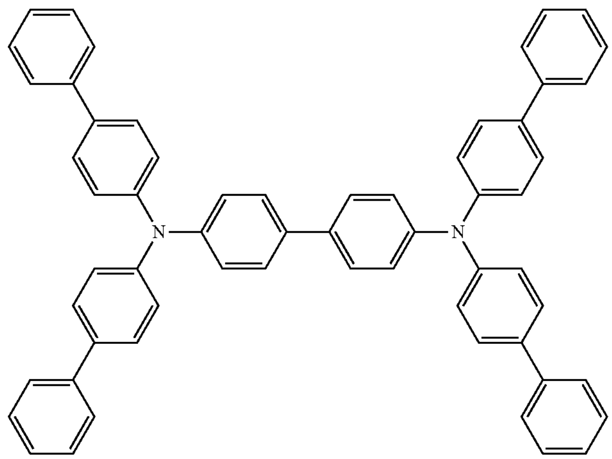
, -continued
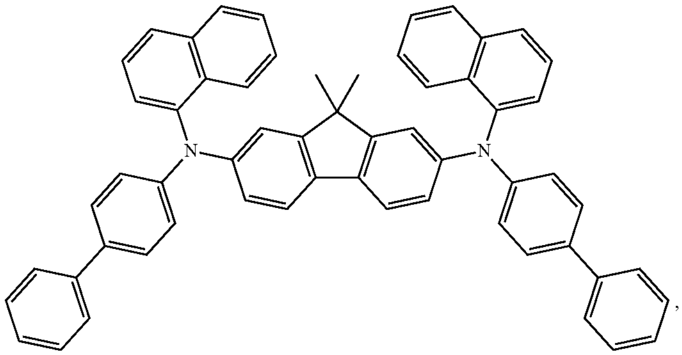
,
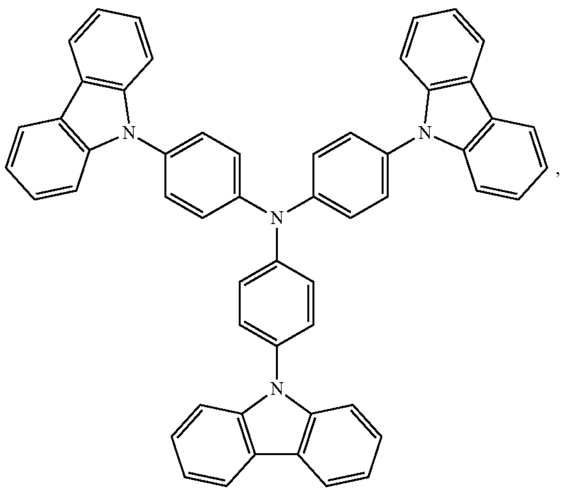
,
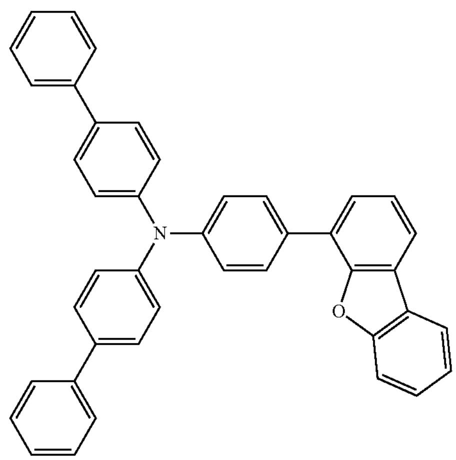
,
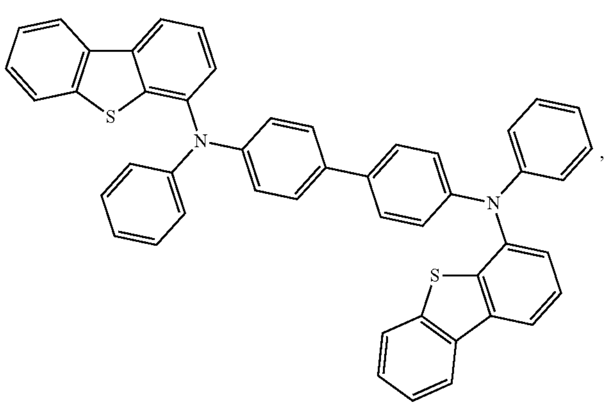
,
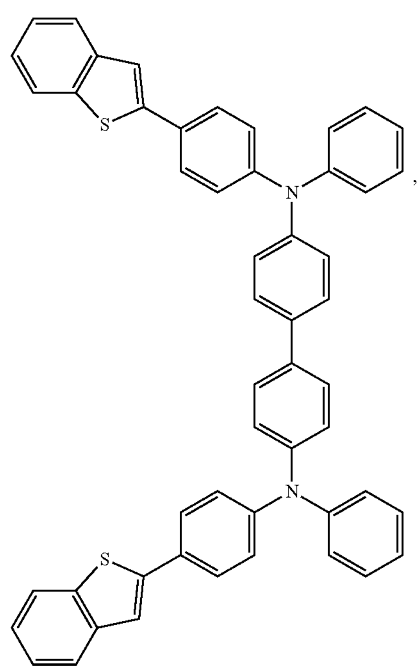
, and -continued

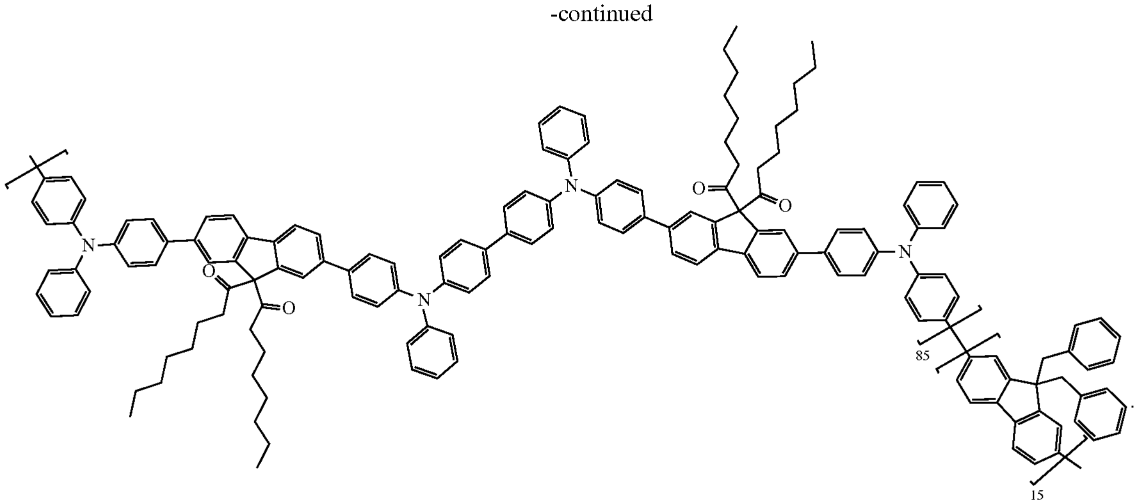

EBL:

An electron blocking layer (EBL) may be used to reduce the number of electrons and/or excitons that leave the emissive layer. The presence of such a blocking layer in a device may result in substantially higher efficiencies, and/or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and/or higher triplet energy than one or more of the hosts closest to the EBL interface. In one aspect, the compound used in EBL contains the same molecule or the same functional groups used as one of the hosts described below.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

Examples of metal complexes used as host are preferred to have the following general formula:

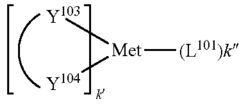

wherein Met is a metal; ($Y^{103}$-$Y^{104}$) is a bidentate ligand, $Y^{103}$ and $Y^{104}$ are independently selected from C, N, O, P, and S; $L^{101}$ is an another ligand; k' is an integer value from 1 to the maximum number of ligands that may be attached to the metal; and k'+k" is the maximum number of ligands that may be attached to the metal.

In one aspect, the metal complexes are:

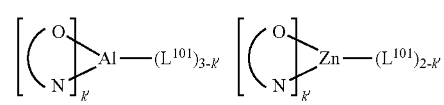

wherein (O—N) is a bidentate ligand, having metal coordinated to atoms O and N.

In another aspect, Met is selected from Ir and Pt. Ina further aspect, ($Y^{103}$-$Y^{104}$) is a carbene ligand.

In one aspect, the host compound contains at least one of the following groups selected from the group consisting of aromatic hydrocarbon cyclic compounds such as benzene, biphenyl, triphenyl, triphenylene, tetraphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Each option within each group may be unsubstituted or may be substituted by a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof.

In one aspect, the host compound contains at least one of the following groups in the molecule:

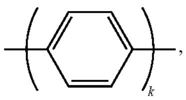

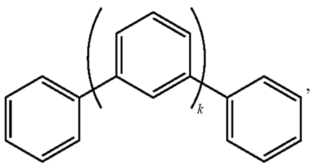

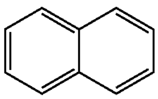

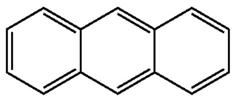

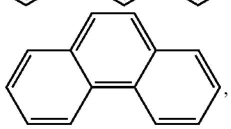

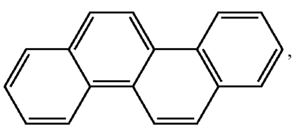

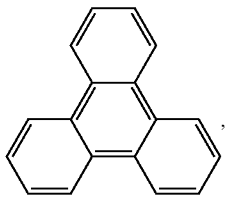

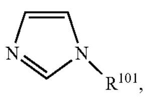

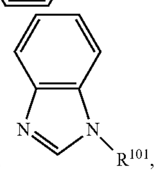

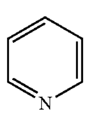

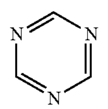

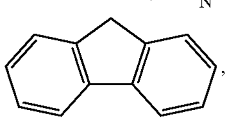

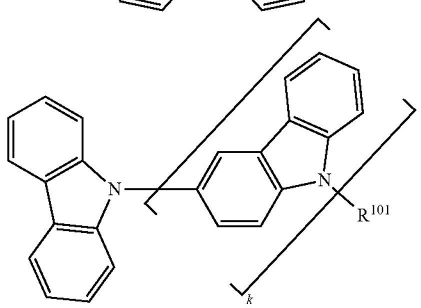

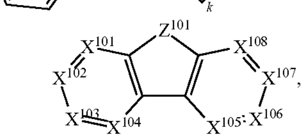

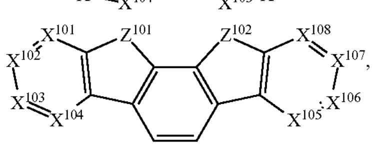

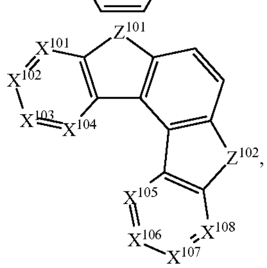

-continued

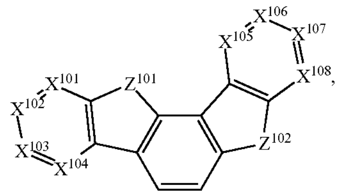

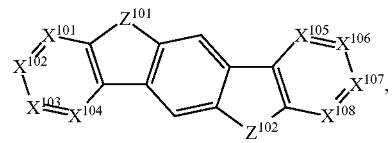

and

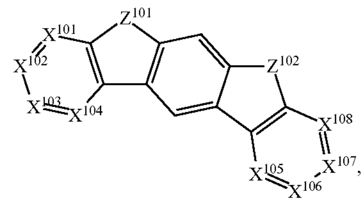

wherein $R^{101}$ is selected from the group consisting of hydrogen, deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof, and when it is aryl or heteroaryl, it has the similar definition as Ar's mentioned above. k is an integer from 0 to 20 or 1 to 20. $X^{101}$ to $X^{108}$ are independently selected from C (including CH) or N. $Z^{101}$ and $Z^{102}$ are independently selected from $NR^{101}$, O, or S.

Non-limiting examples of the host materials that may be used in an OLED in combination with materials disclosed herein are exemplified below together with references that disclose those materials: EP2034538, EP2034538A, EP2757608, JP2007254297, KR20100079458, KR20120088644, KR20120129733, KR20130115564, TW201329200, US20030175553, US20050238919, US20060280965, US20090017330, US20090030202, US20090167162, US20090302743, US20090309488, US20100012931, US20100084966, US20100187984, US2010187984, US2012075273, US2012126221, US2013009543, US2013105787, US2013175519, US2014001446, US20140183503, US20140225088, US2014034914, U.S. Pat. No. 7,154,114, WO2001039234, WO2004093207, WO2005014551, WO2005089025, WO2006072002, WO2006114966, WO2007063754, WO2008056746, WO2009003898, WO2009021126, WO2009063833, WO2009066778, WO2009066779, WO2009086028, WO2010056066, WO2010107244, WO2011081423, WO2011081431, WO2011086863, WO2012128298, WO2012133644, WO2012133649, WO2013024872, WO2013035275, WO2013081315, WO2013191404, WO2014142472, US20170263869, US20160163995, U.S. Pat. No. 9,466,803

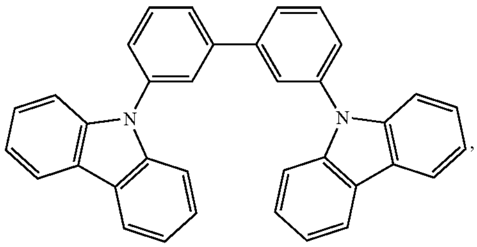
,
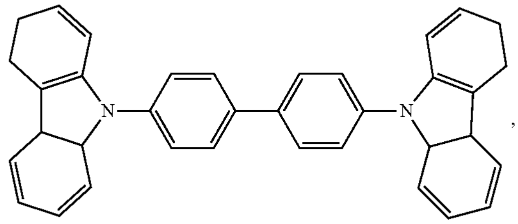
,
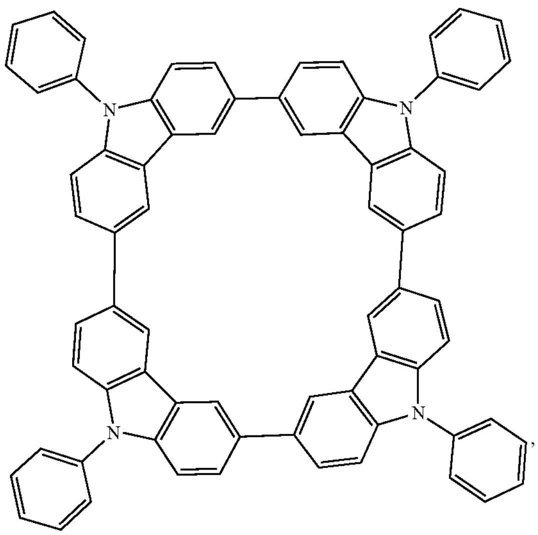
,
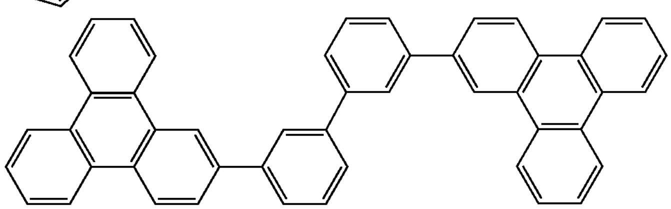
,
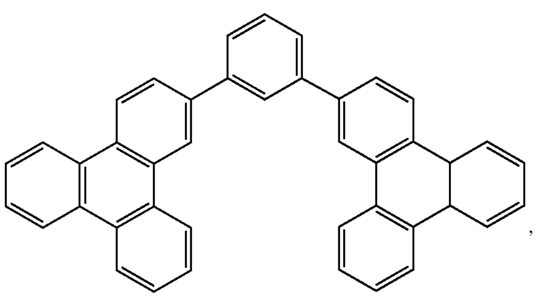
,
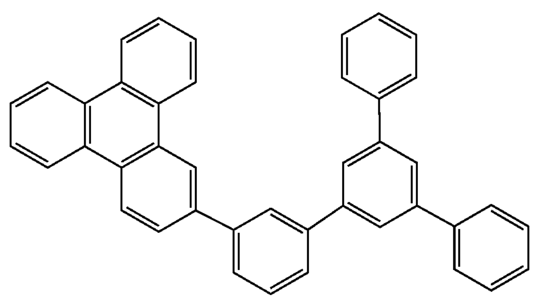
,
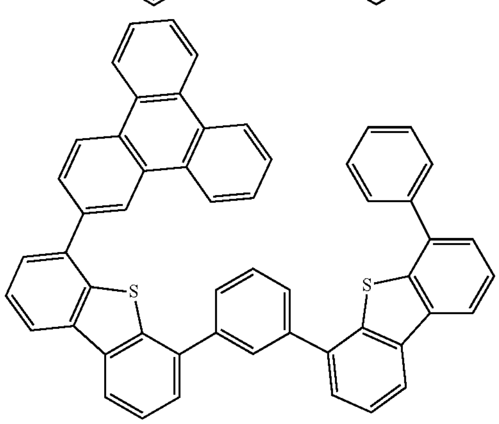
,
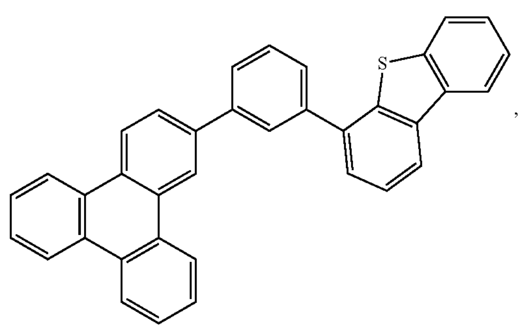
, -continued
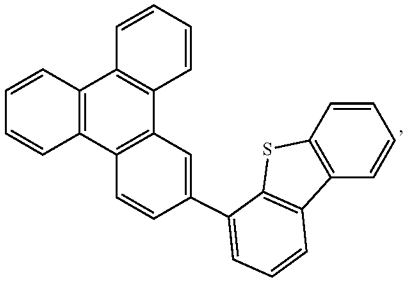
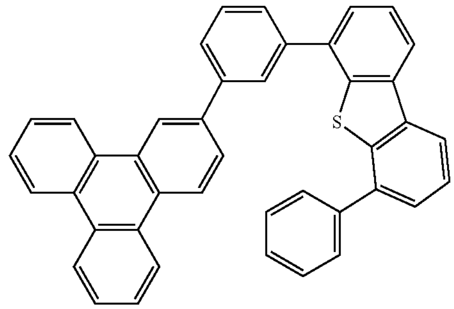
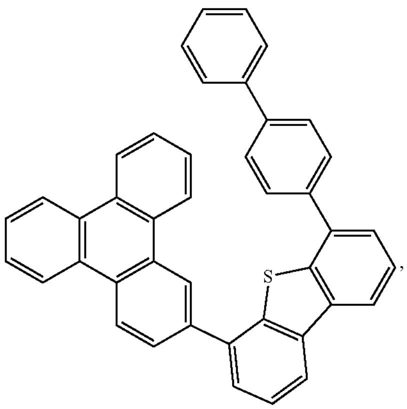
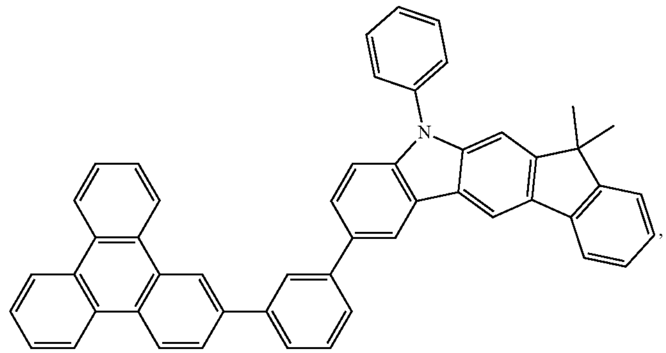
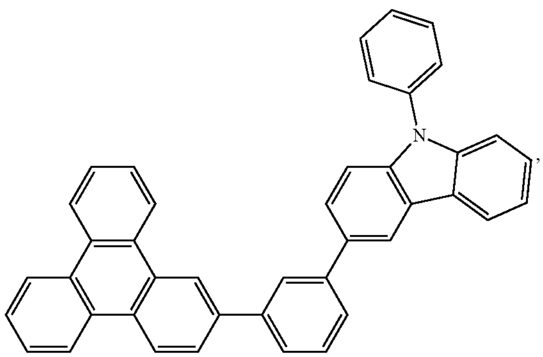
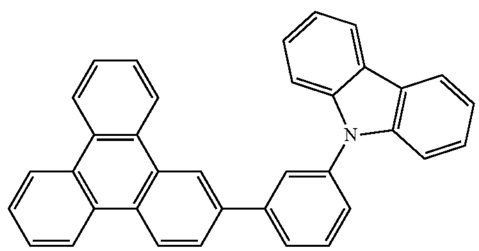
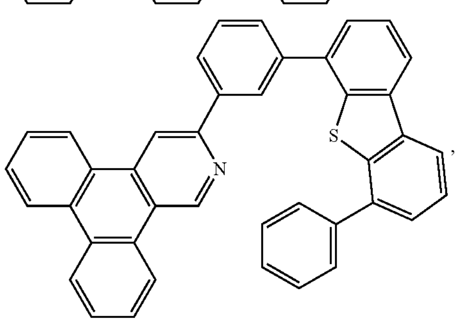
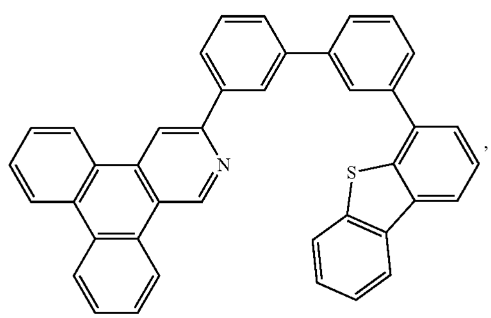
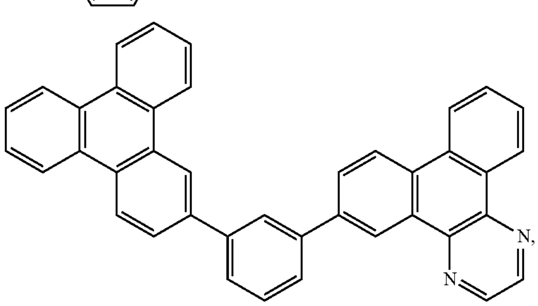
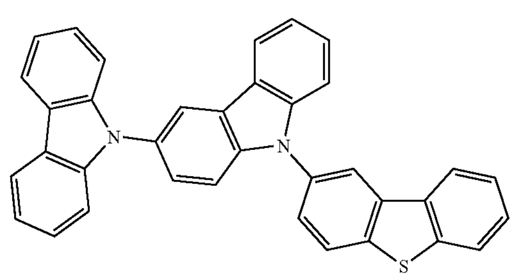

-continued
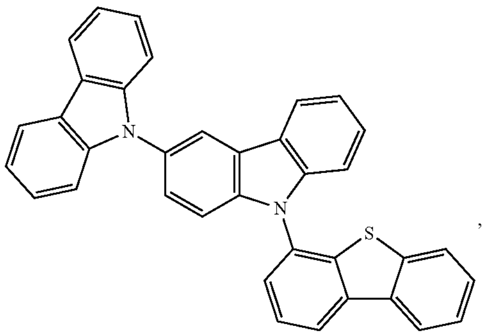,
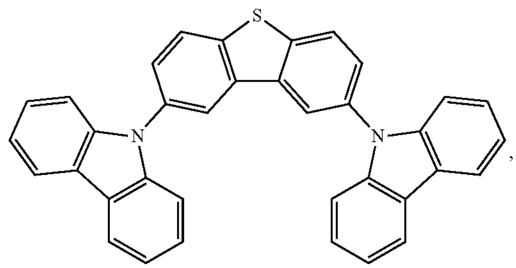,
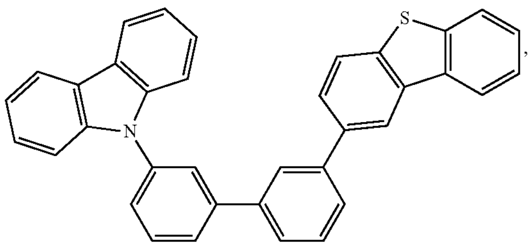,
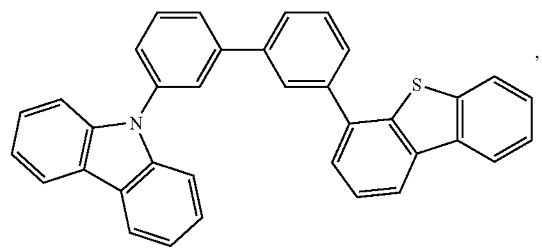,
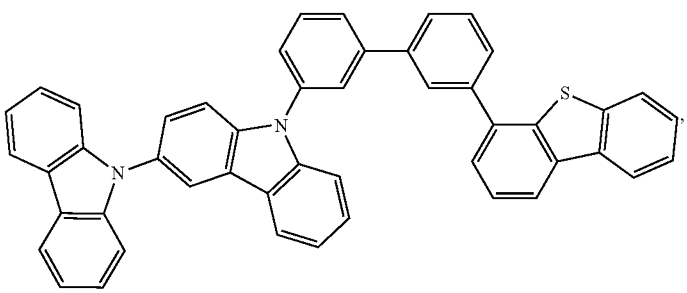,
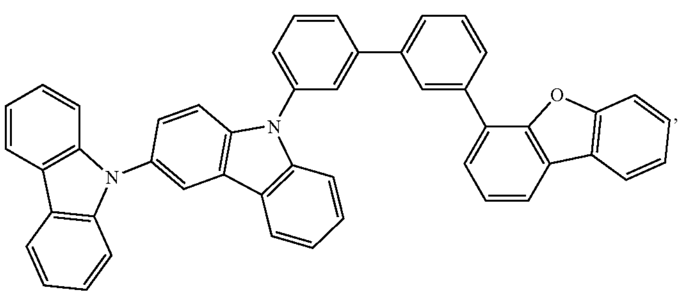,
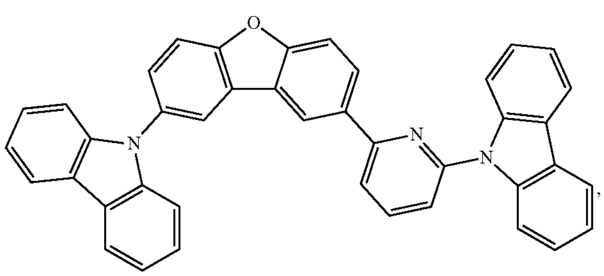,
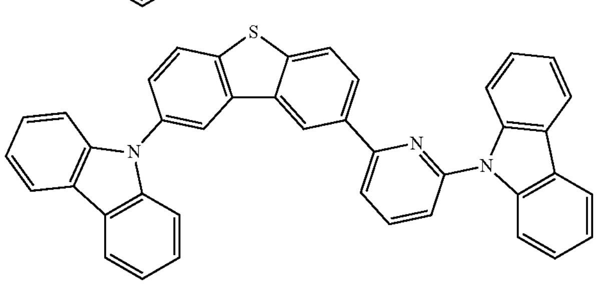, -continued
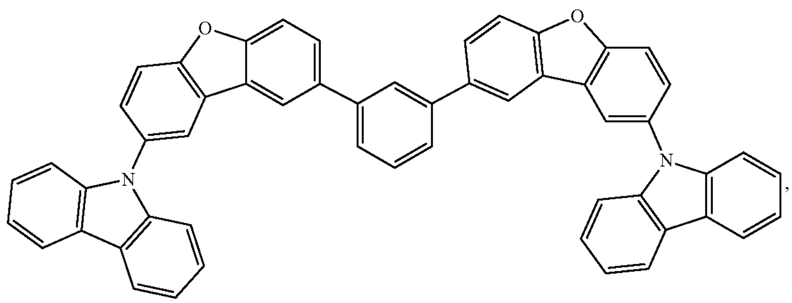
,
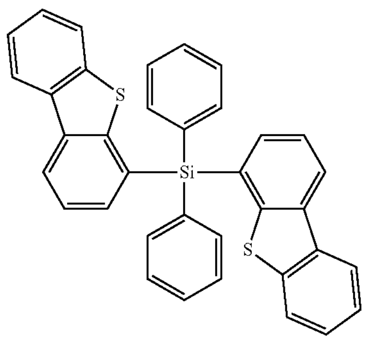
,
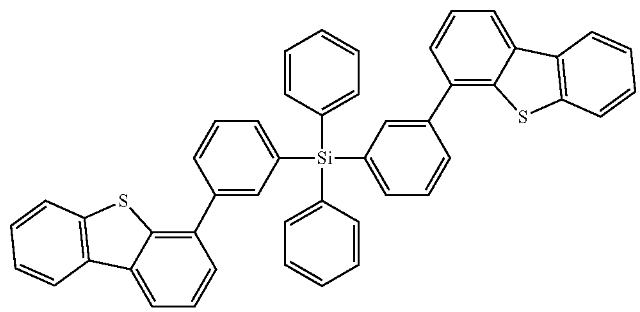
,
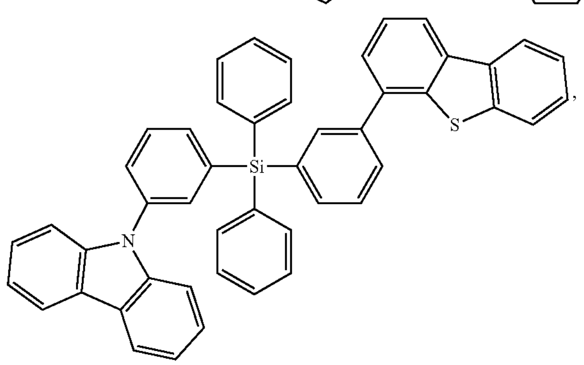
,
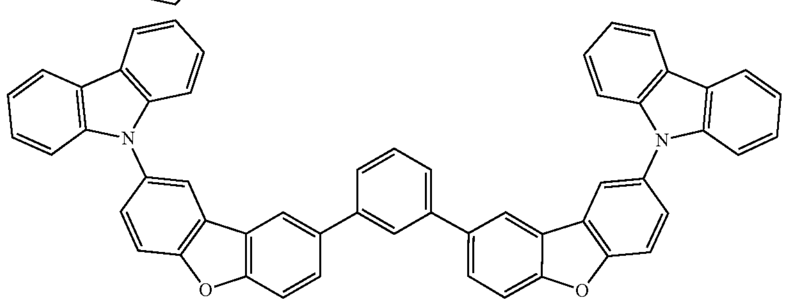
,
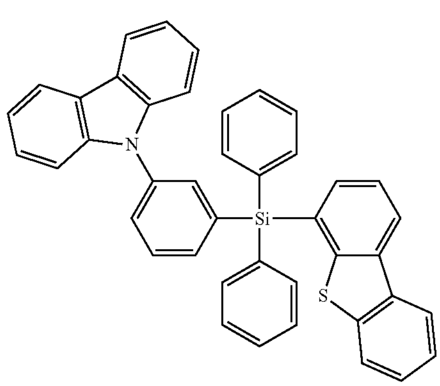
,
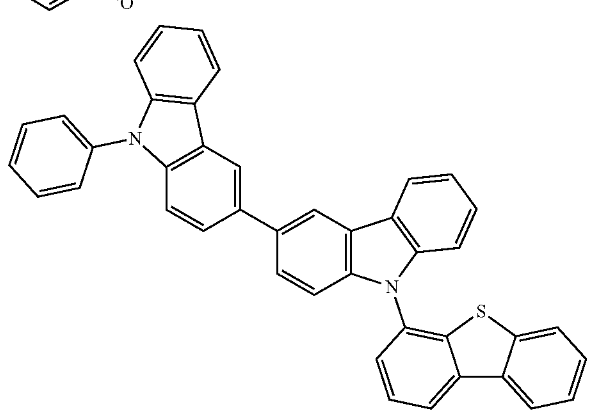
, -continued
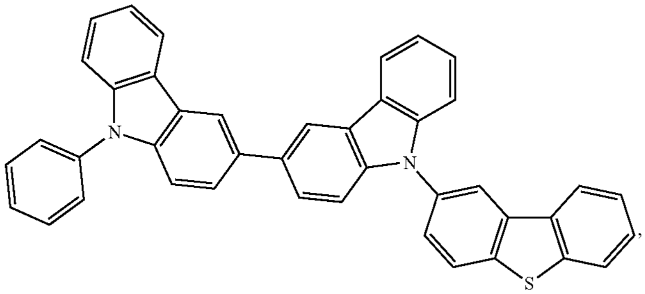
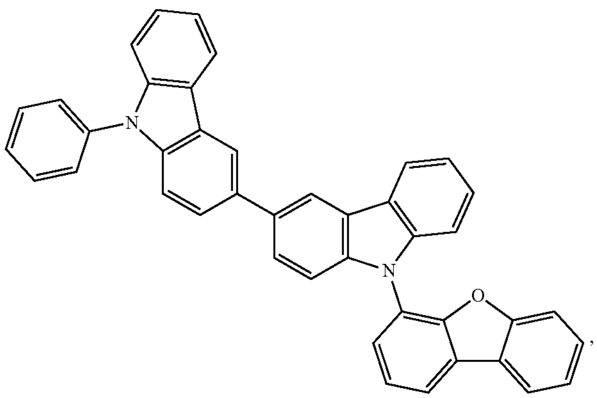
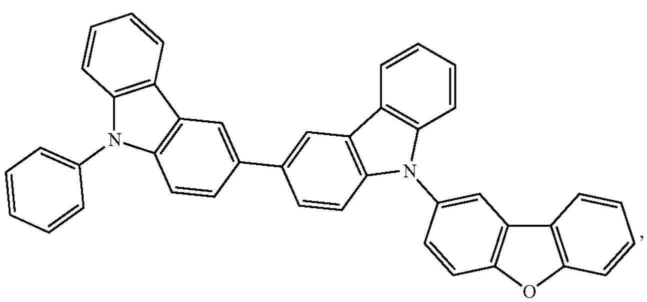
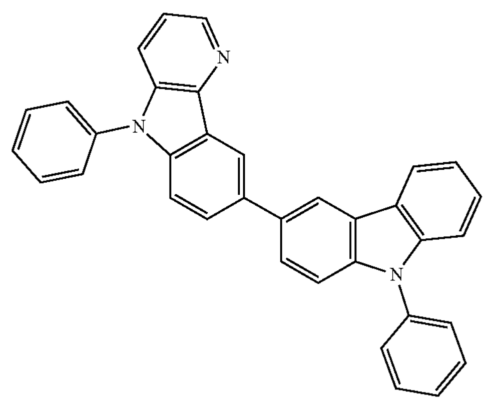
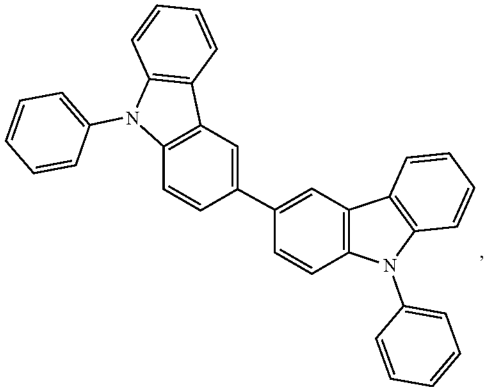
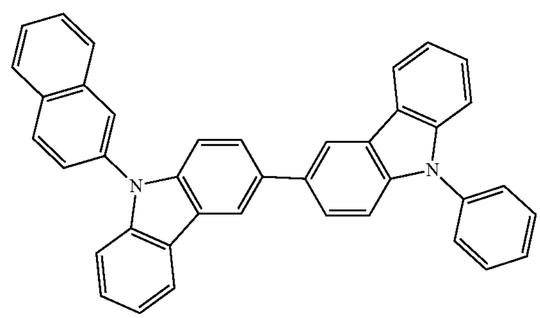

-continued
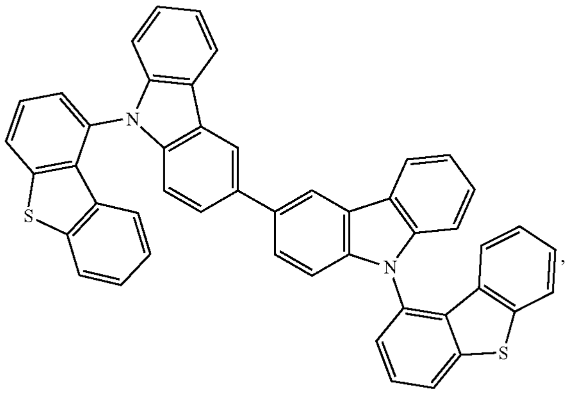
,
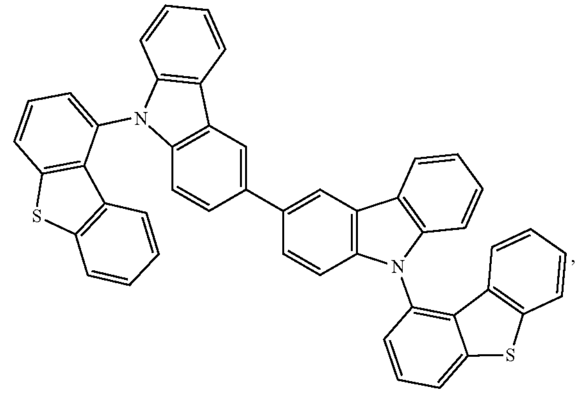
,
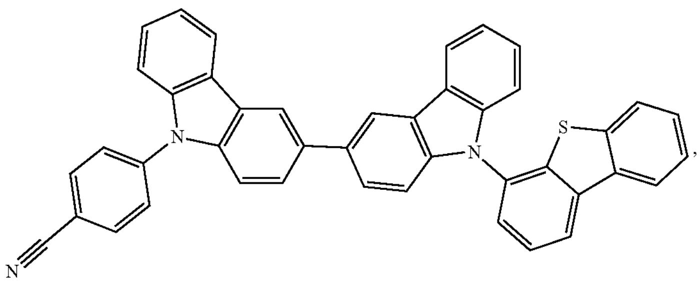
,
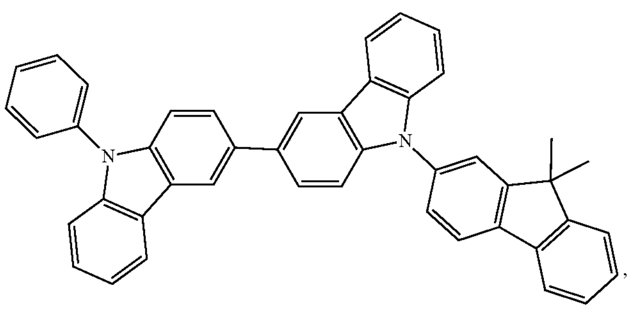
,
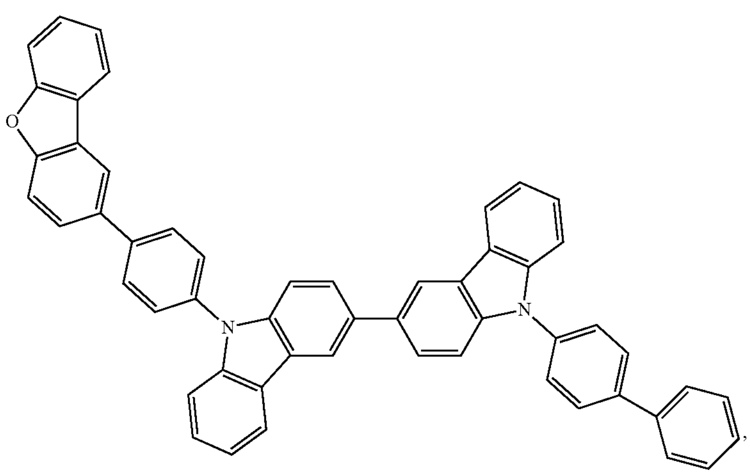
, -continued
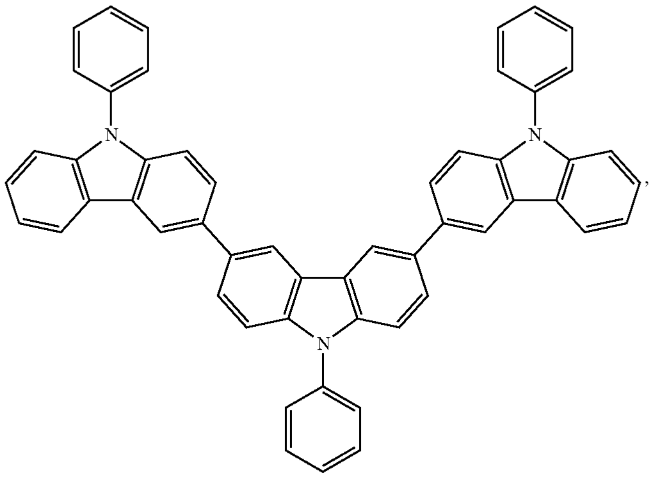
,
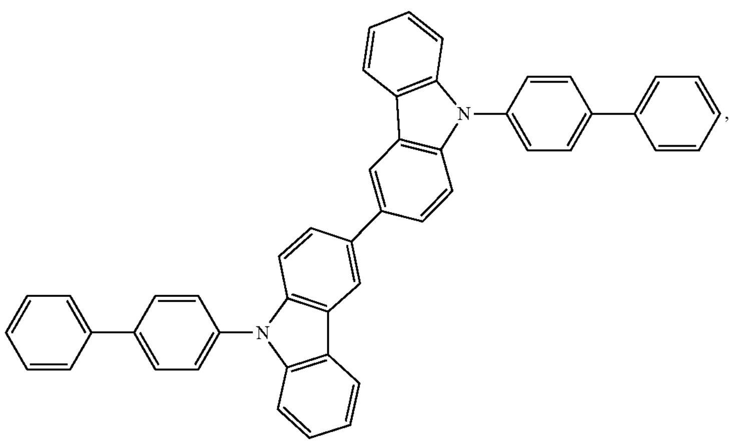
,
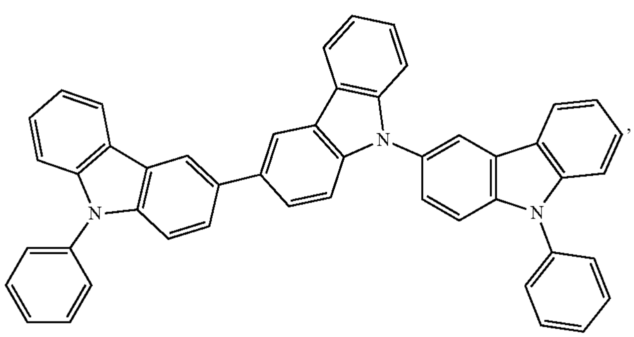
,
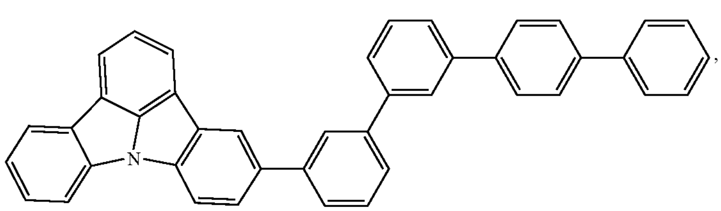
, -continued
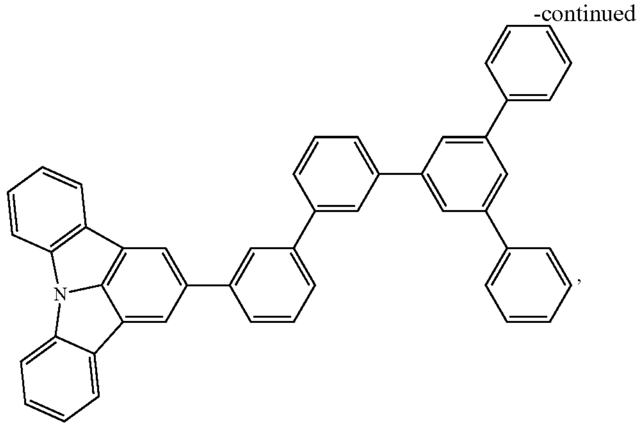
,
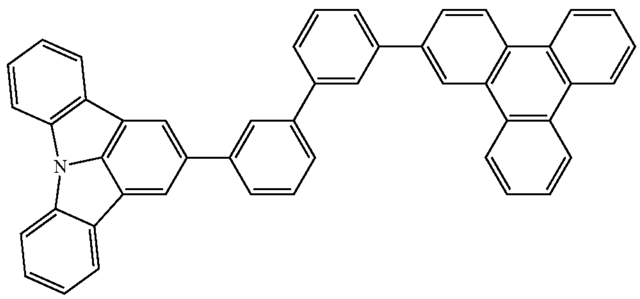
,
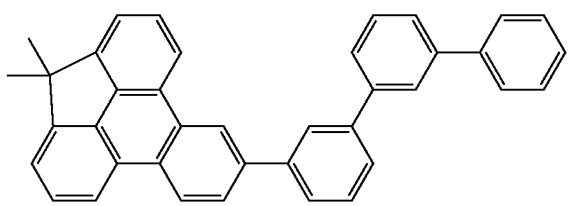
,
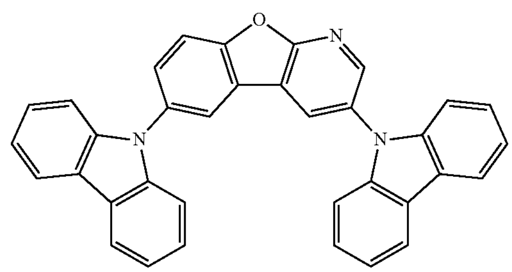
,
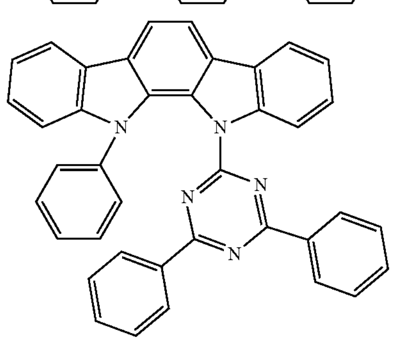
,
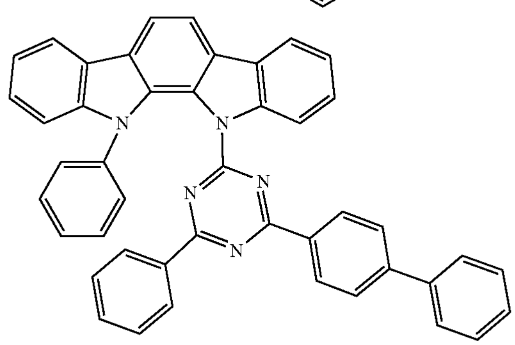
,
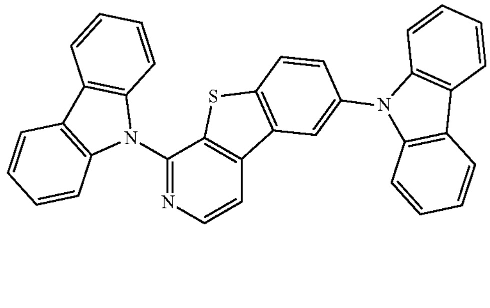
,
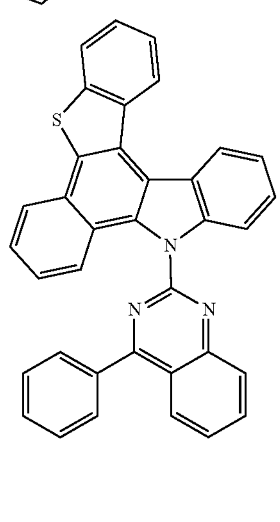
,
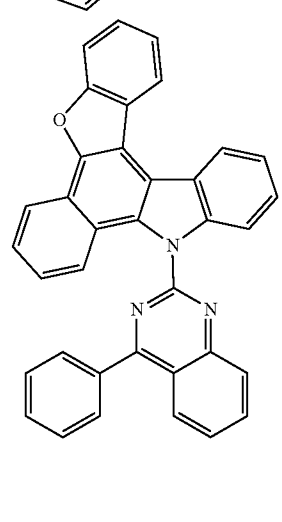
, -continued
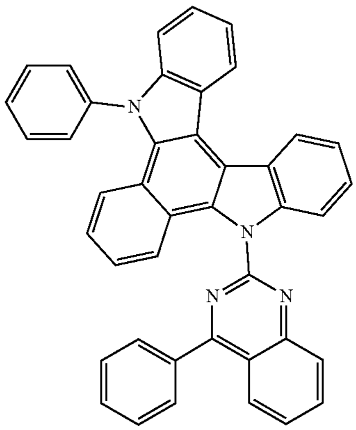
,
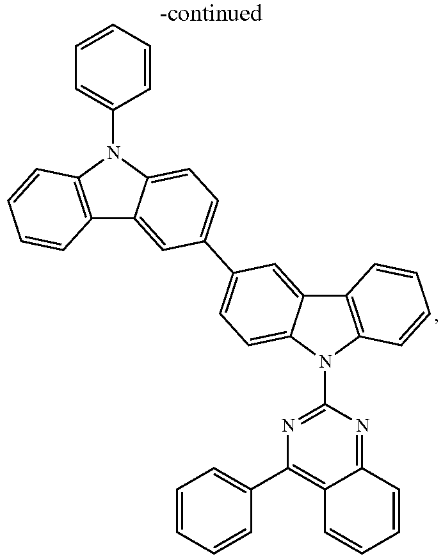
,
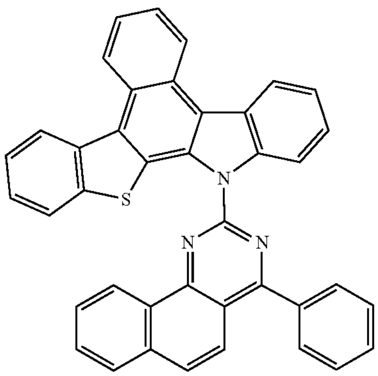
,
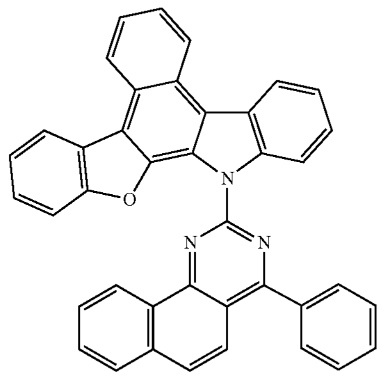
,
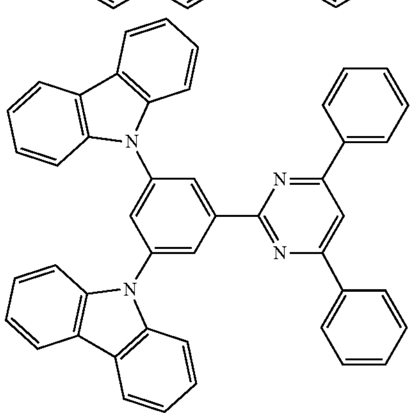
,
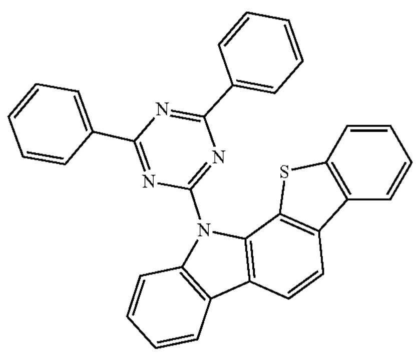
,
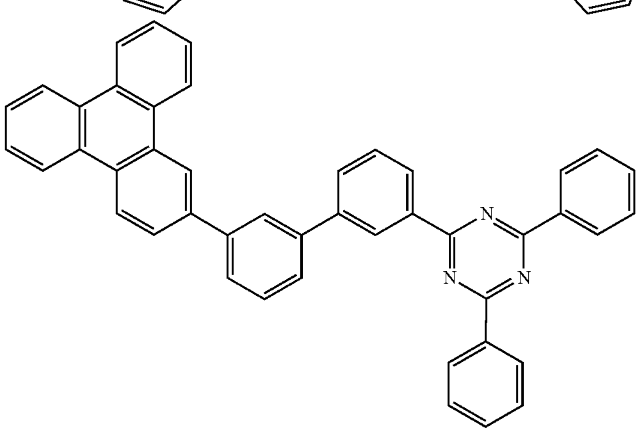
, -continued
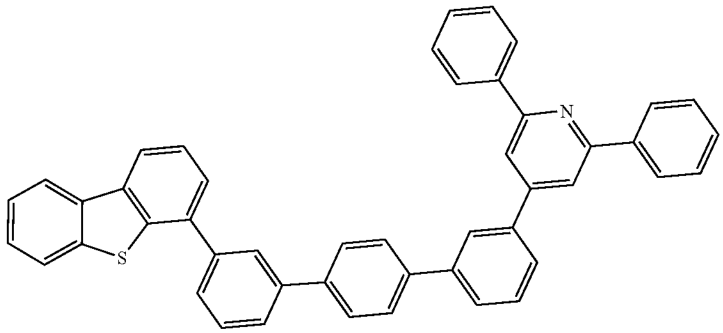
,
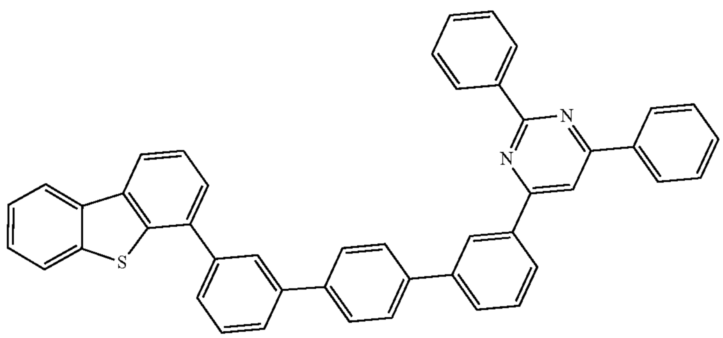
,
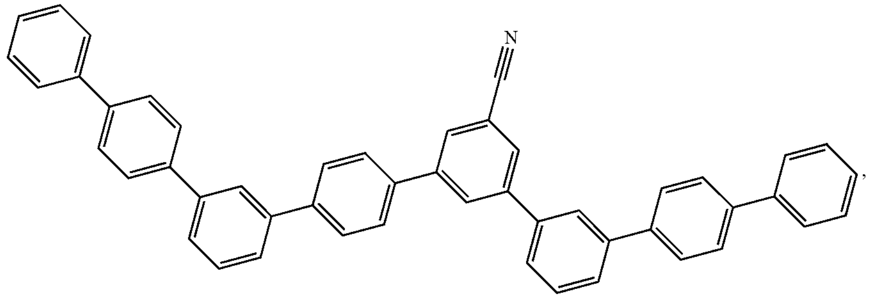
,
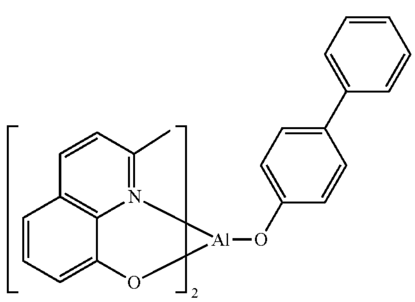
,
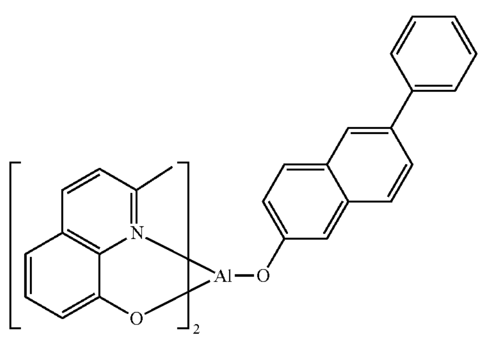
,
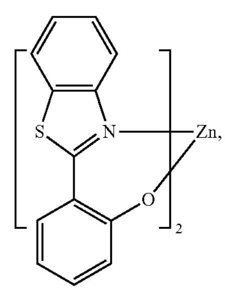
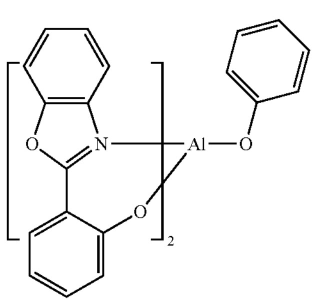
,
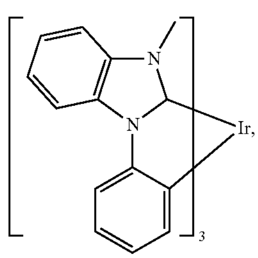
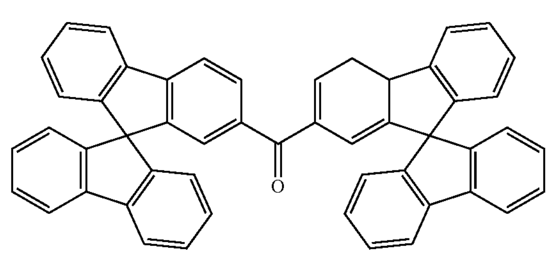
, -continued

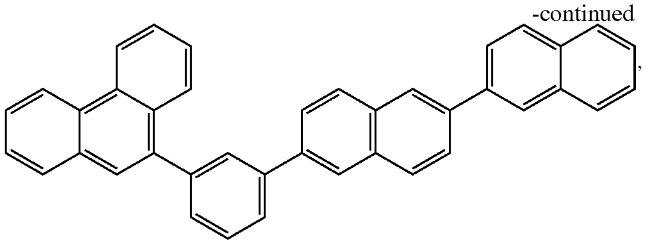

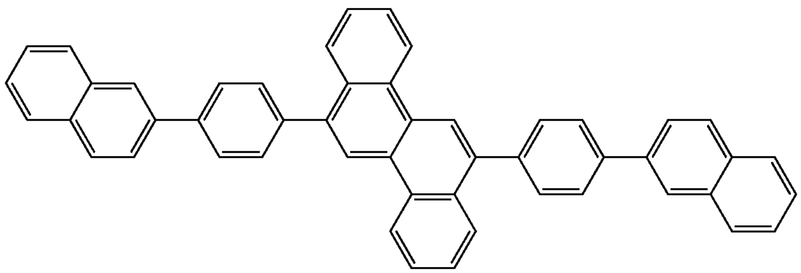

, and

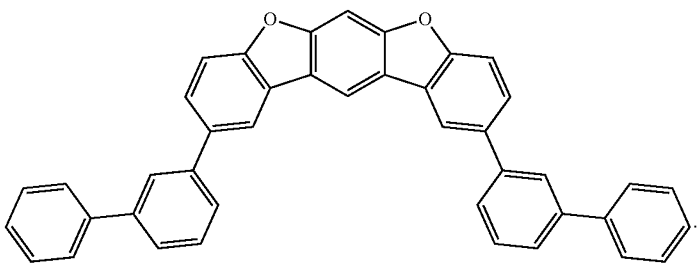

Additional Emitters:

One or mom additional emitter dopants may be used in conjunction with the compound of the present disclosure. Examples of the additional emitter dopants are not particularly limited, and any compounds may be used as long as the compounds are typically used as emitter materials. Examples of suitable emitter materials include, but are not limited to, compounds which can produce emissions via phosphorescence, fluorescence, thermally activated delayed fluorescence, i.e., TADF (also referred to as E-type delayed fluorescence), triplet-triplet annihilation, or combinations of these processes.

Non-limiting examples of the emitter materials that may be used in an OLED in combination with materials disclosed herein are exemplified below together with references that disclose those materials: CN103694277, CN1696137, EB01238981, EP01239526, EP01961743, EP1239526, EP1244155, EP1642951, EP1647554, EP1841834, EP1841834B, EP2062907, EP2730583, JP2012074444, JP2013110263, JP4478555, KR1020090133652, KR20120032054, KR20130043460, TW201332980, U.S. Ser. No. 06/699,599, U.S. Ser. No. 06/916,554, US20010019782, US20020034656, US20030068526, US20030072964, US20030138657, US20050123788, US20050244673, US2005123791, US2005260449, US20060008670, US20060065890, US20060127696, US20060134459, US20060134462, US20060202194, US20060251923, US20070034863, US20070087321, US20070103060, US20070111026, US20070190359, US20070231600, US2007034863, US2007104979, US2007104980, US2007138437, US2007224450, US2007278936, US20080020237, US20080233410, US20080261076, US20080297033, US200805851, US2008161567, US2008210930, US20090039776, US20090108737, US20090115322, US20090179555, US2009085476, US2009104472, US20100090591, US20100148663, US20100244004, US20100295032, US2010102716, US2010105902, US2010244004, US2010270916, US20110057559, US20110108822, US20110204333, US2011215710, US2011227049, US2011285275, US2012292601, US20130146848, US2013033172, US2013165653, US2013181190, US2013334521, US20140246656, US2014103305, U.S. Pat. Nos. 6,303,238, 6,413,656, 6,653,654, 6,670,645, 6,687,266, 6,835,469, 6,921,915, 7,279,704, 7,332,232, 7,378,162, 7,534,505, 7,675,228, 7,728,137, 7,740,957, 7,759,489, 7,951,947, 8,067,099, 8,592,586, 8,871,361, WO06081973, WO06121811, WO07018067, WO07108362, WO07115970, WO07115981, WO08035571, WO2002015645, WO2003040257, WO2005019373, WO2006056418, WO2008054584, WO2008078800, WO2008096609, WO2008101842, WO2009000673, WO2009050281, WO2009100991, WO2010028151, WO2010054731, WO2010086089, WO2010118029, WO2011044988, WO2011051404, WO2011107491, WO2012020327, WO2012163471, WO2013094620, WO2013107487, WO2013174471, WO2014007565, WO2014008982, WO2014023377, WO2014024131, WO2014031977, WO2014038456, WO2014112450.

-continued
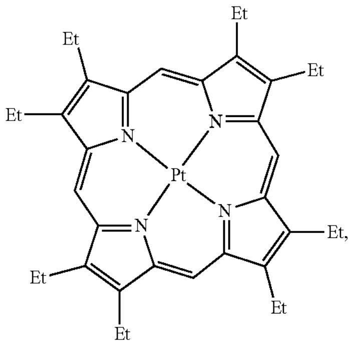
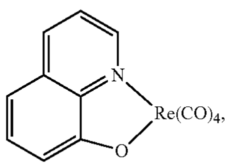
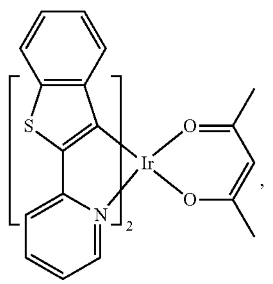
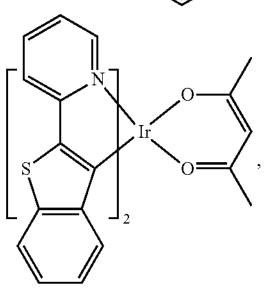
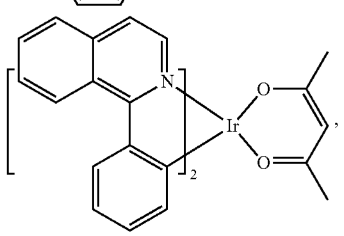
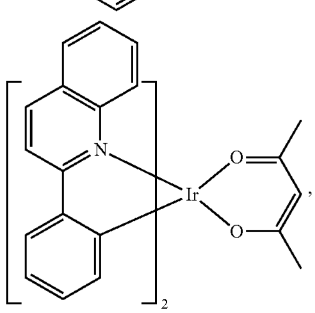
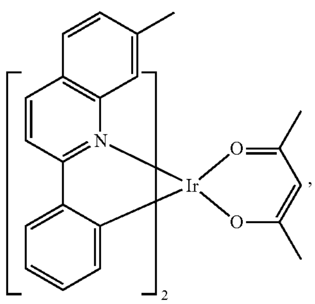
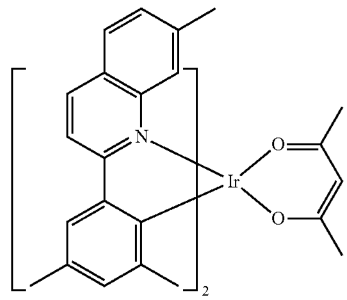
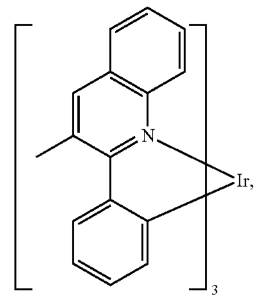
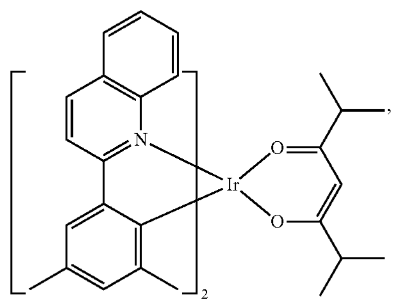
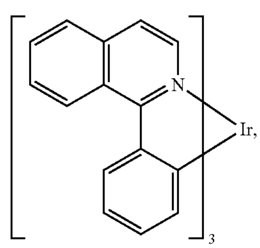
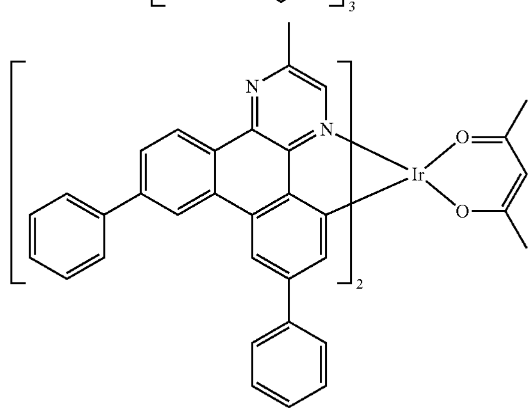

-continued
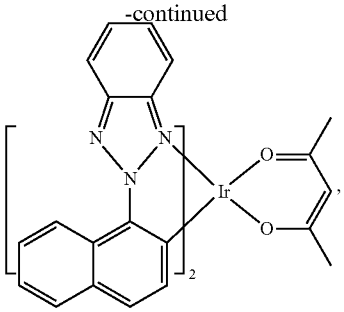
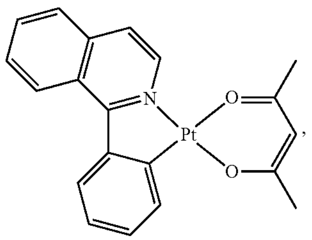
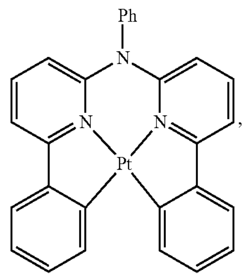
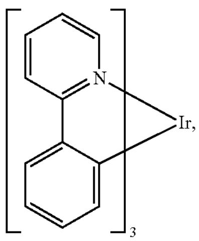
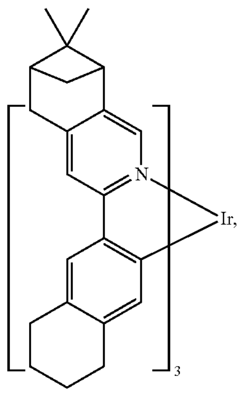
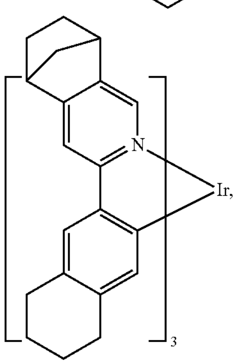
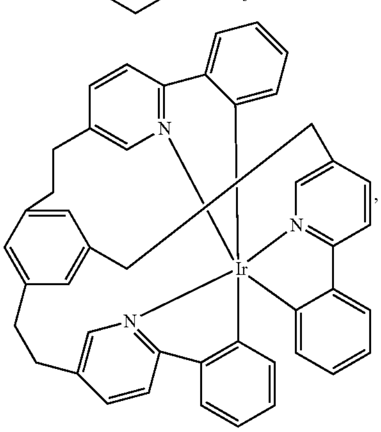
-continued
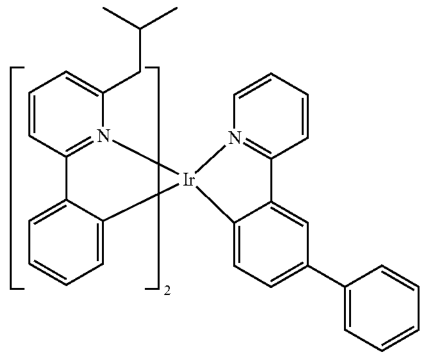
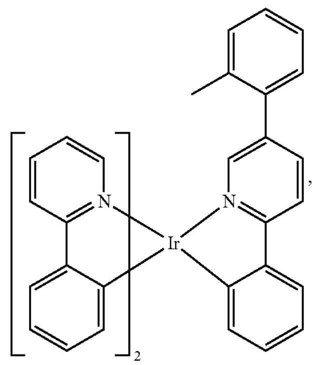
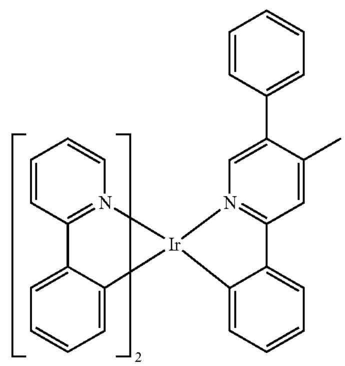
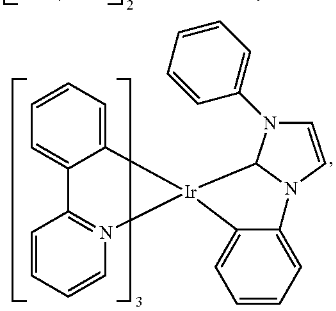
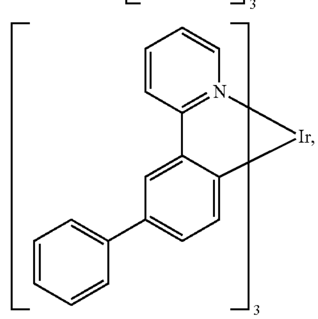
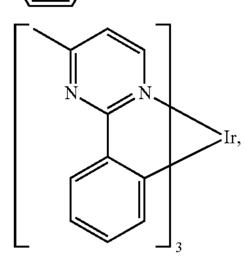

-continued
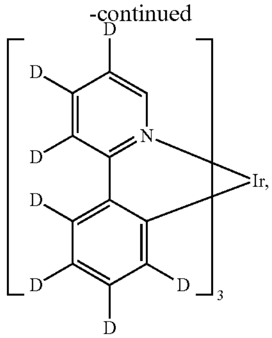
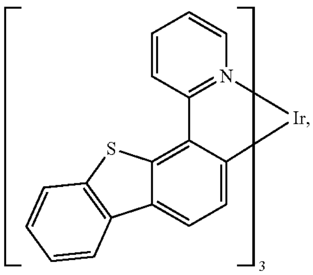
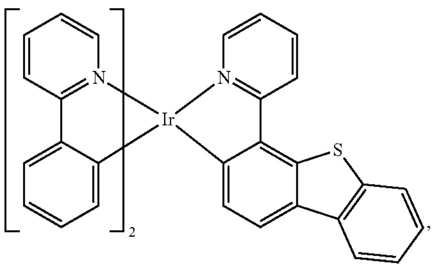
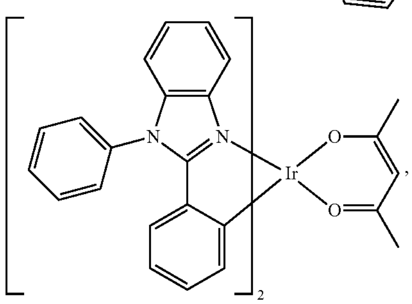
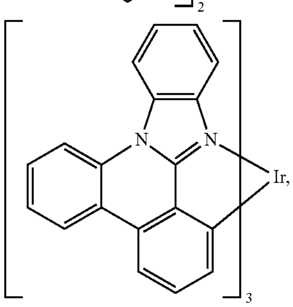
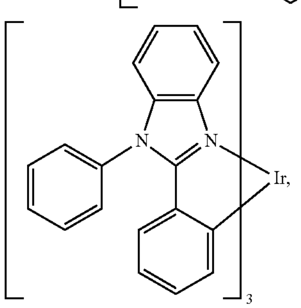
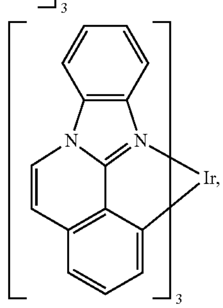
-continued
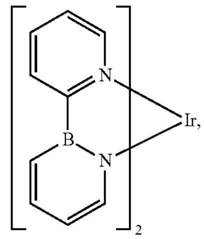
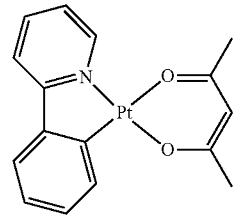
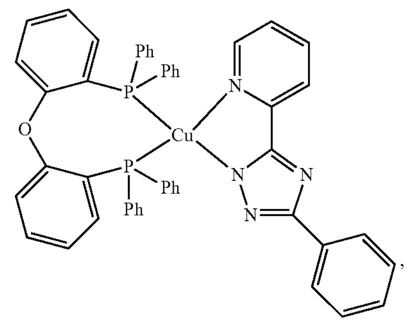
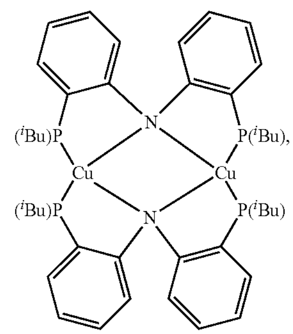
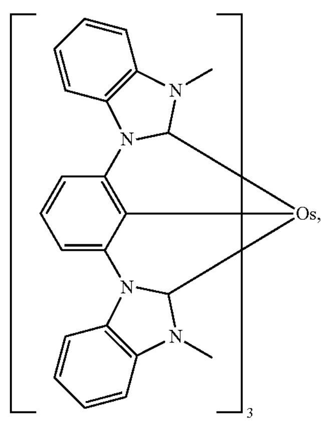
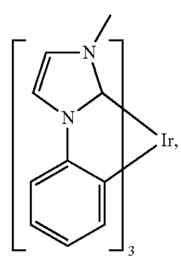
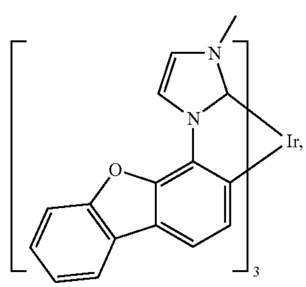

-continued
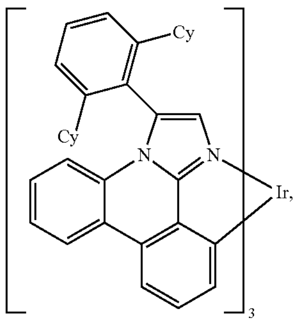
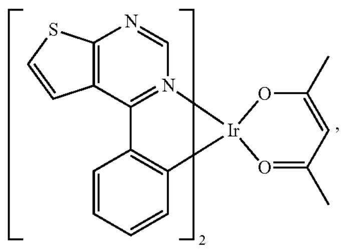
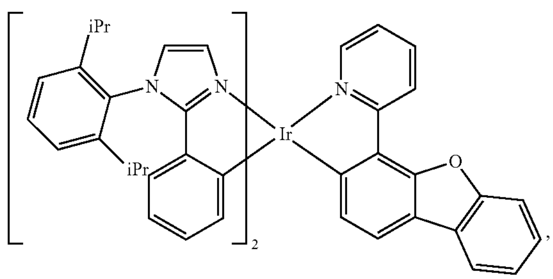
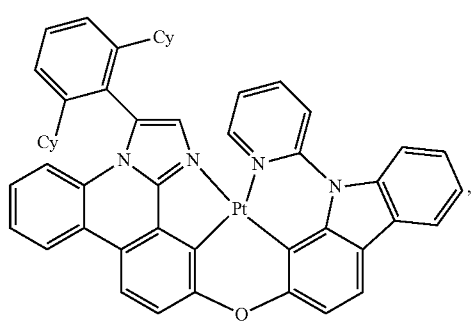
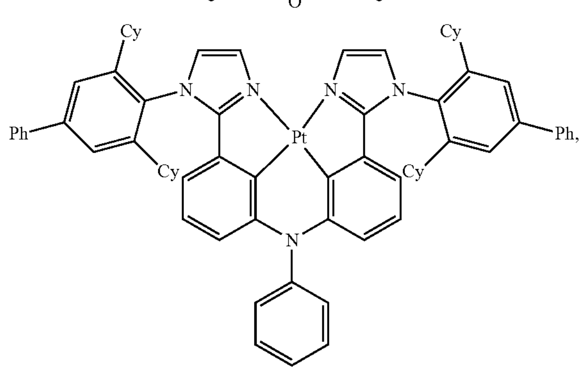
-continued
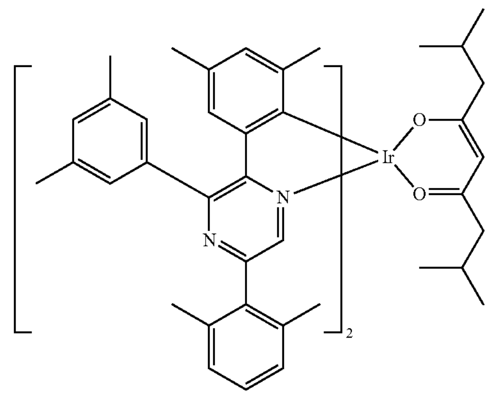
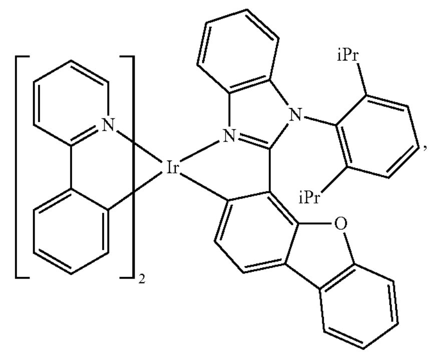
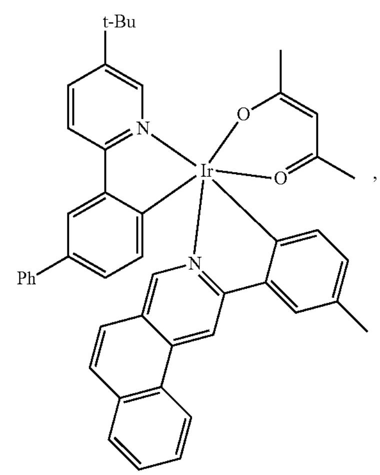
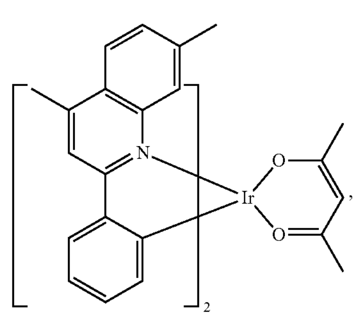

-continued
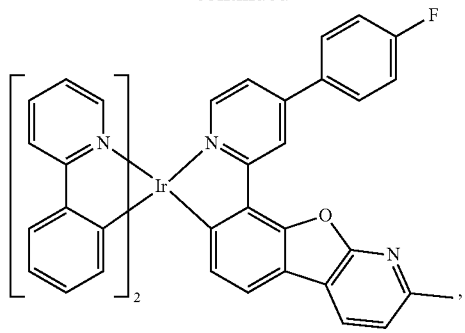
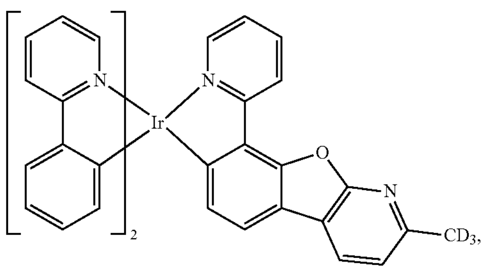
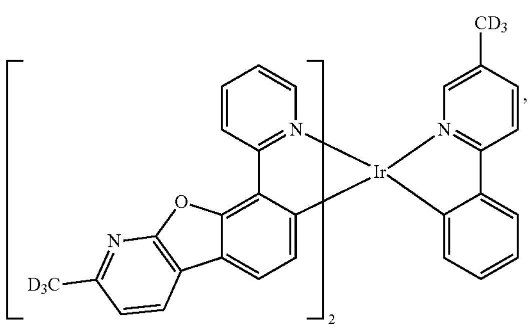
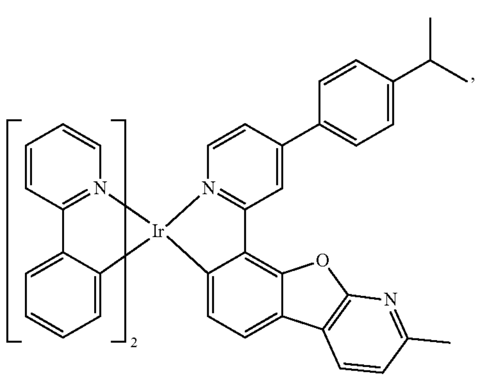
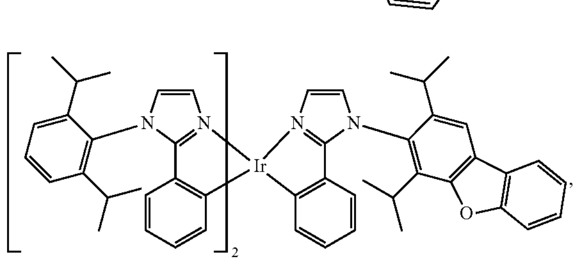
-continued
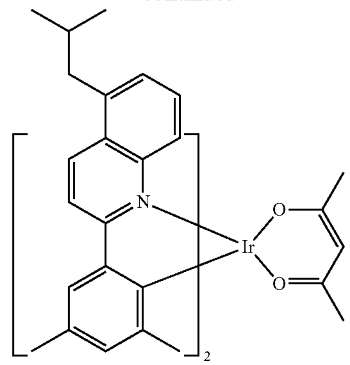
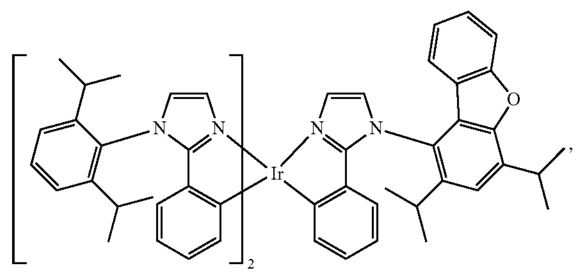
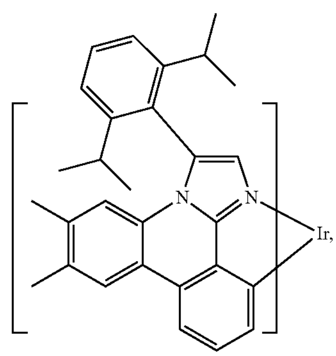
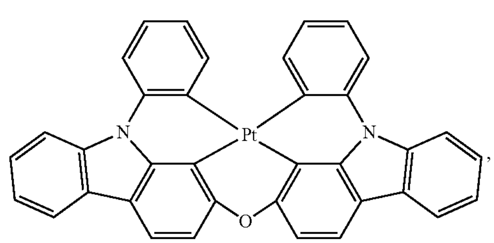
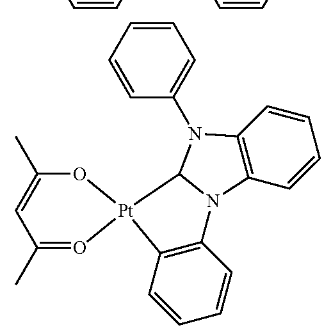

-continued
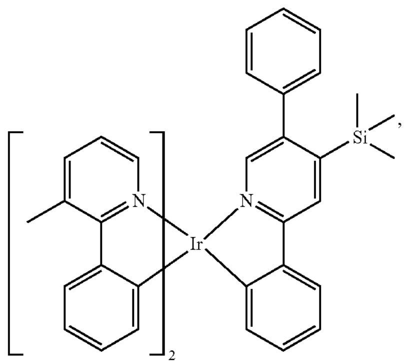
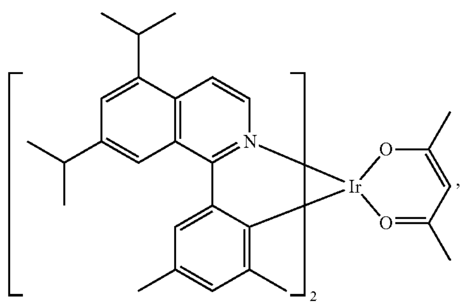
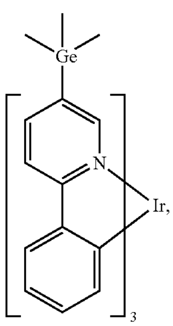
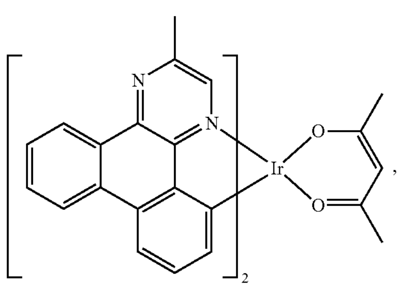
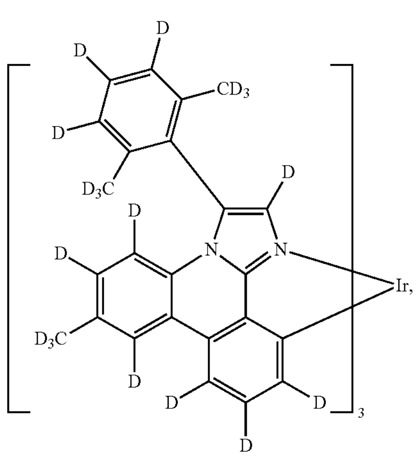
-continued
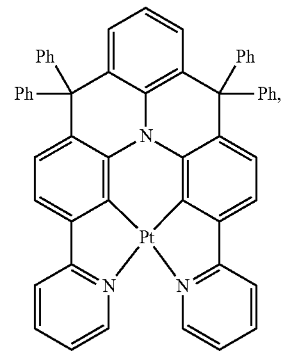
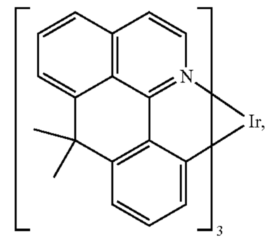
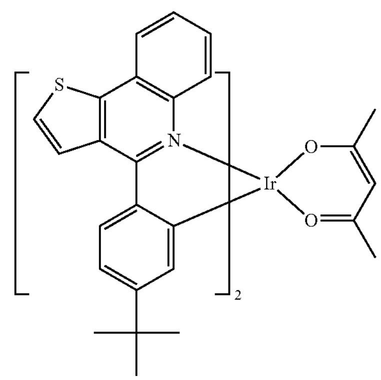
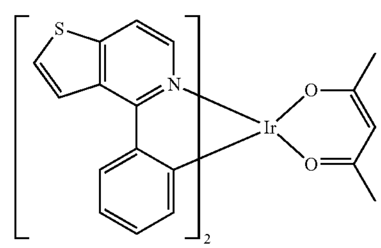
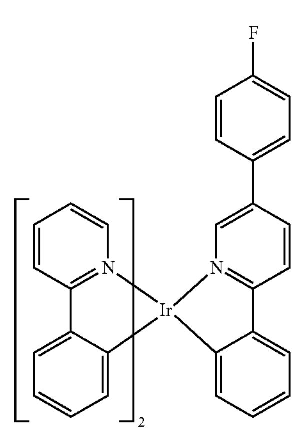

-continued
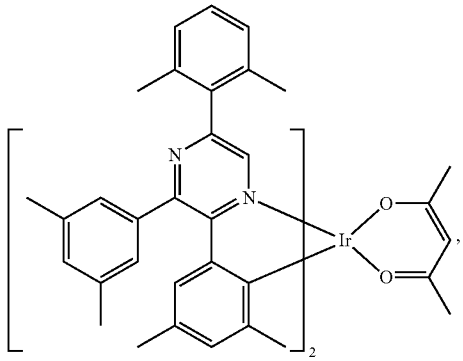
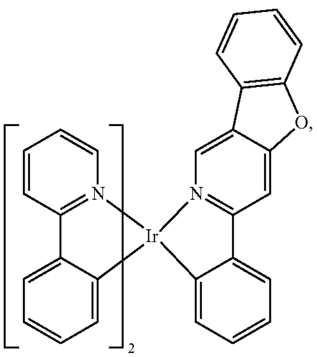
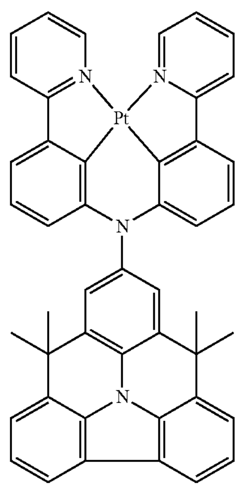
,
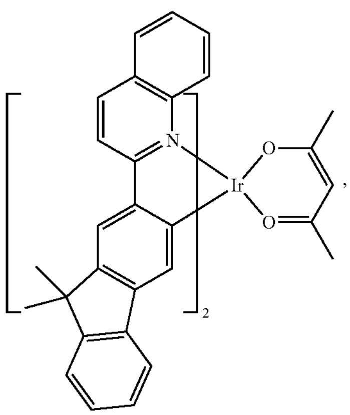
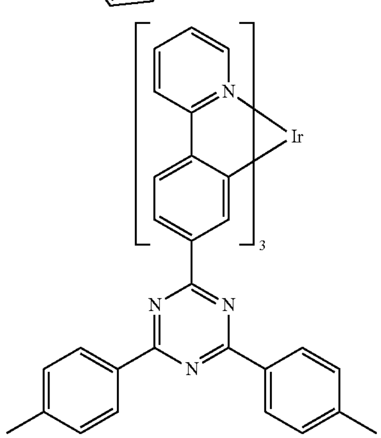
-continued
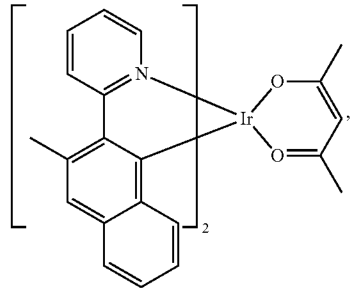
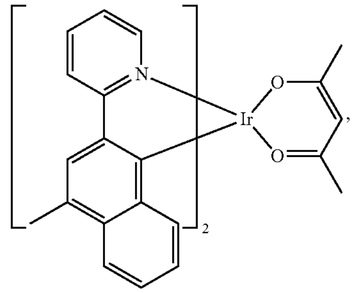
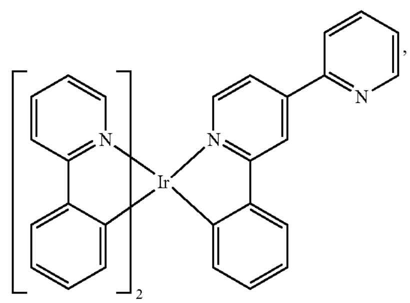
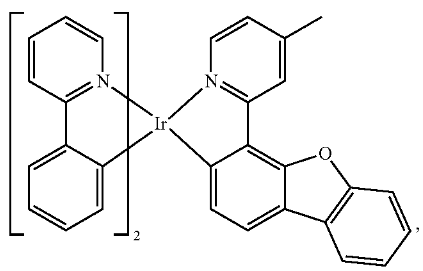
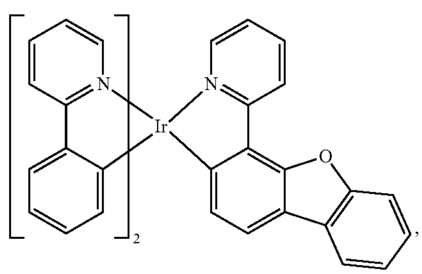
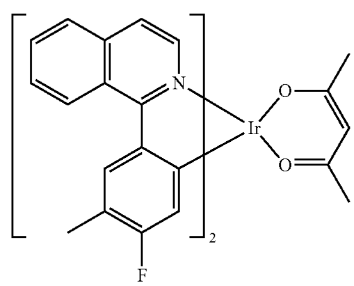

-continued
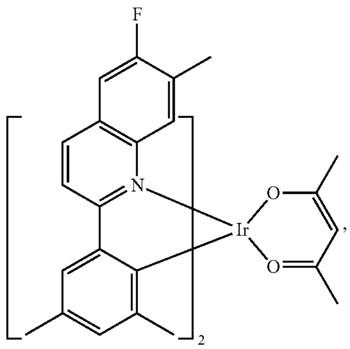
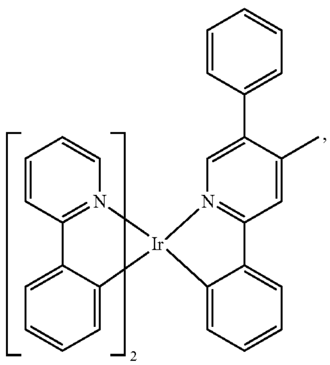
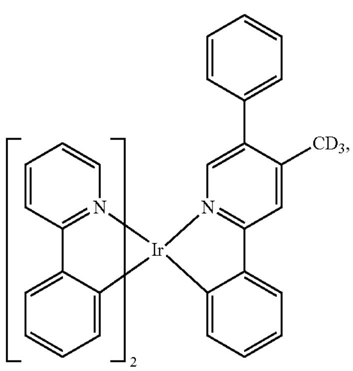
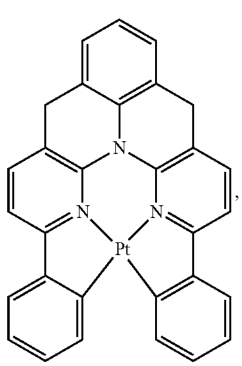
-continued
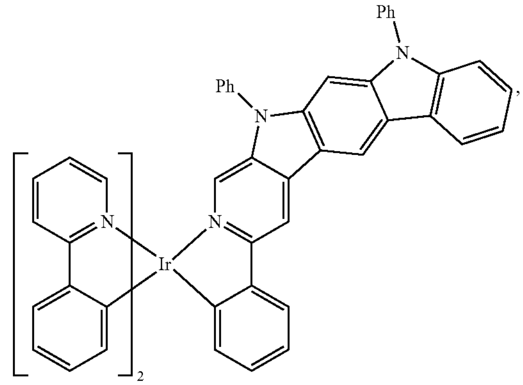
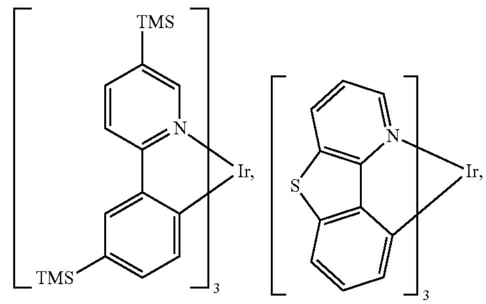
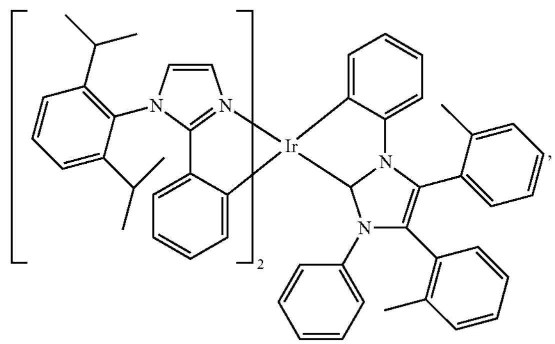
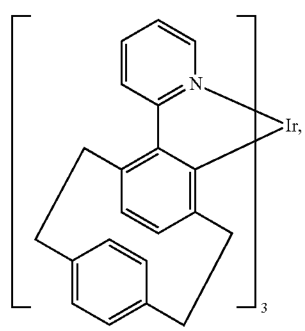
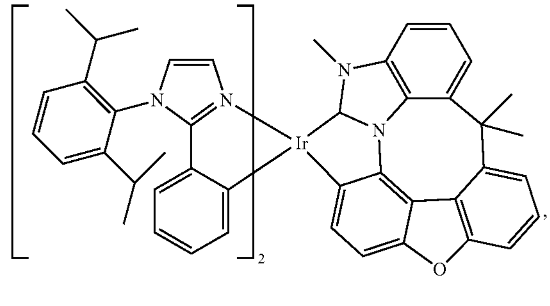

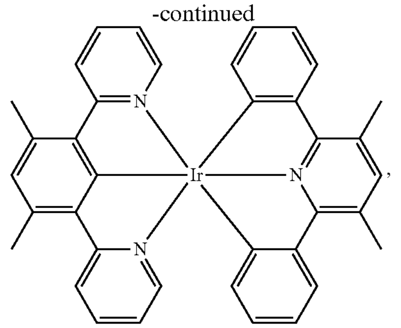
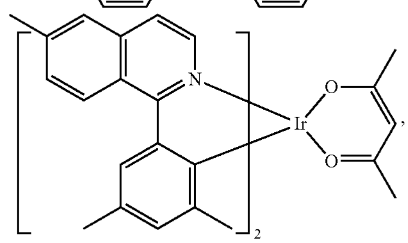
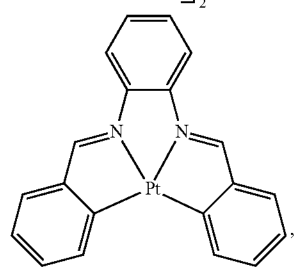
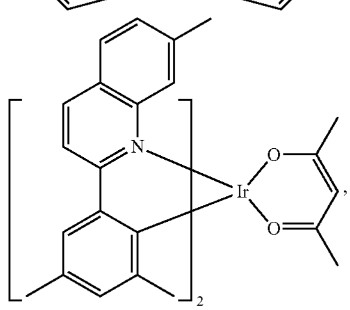
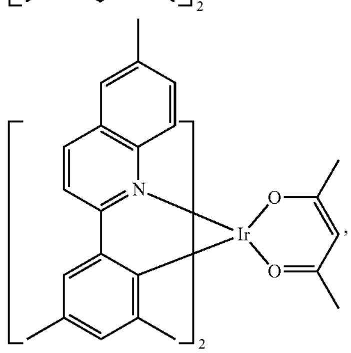
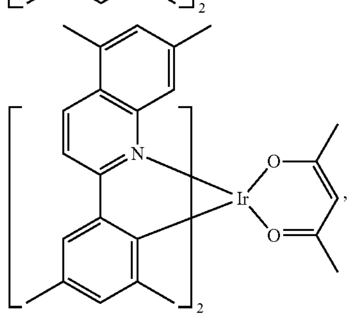
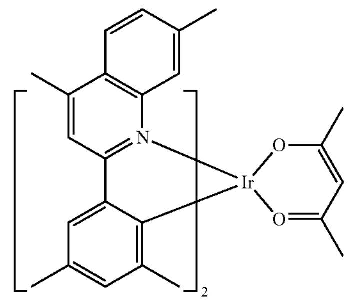
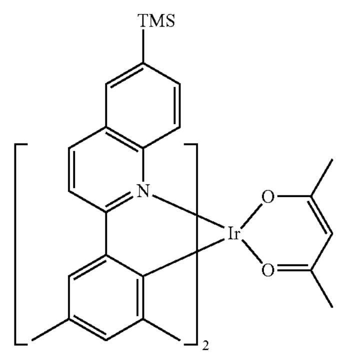
TMS
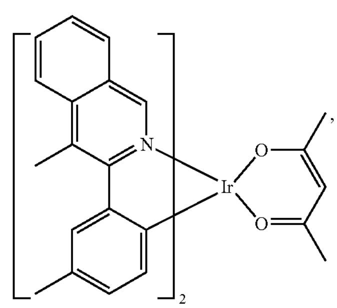
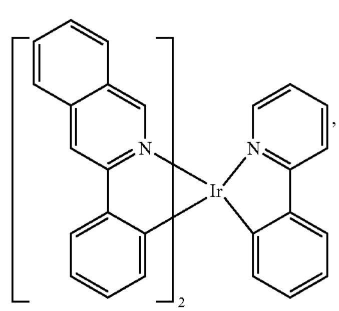
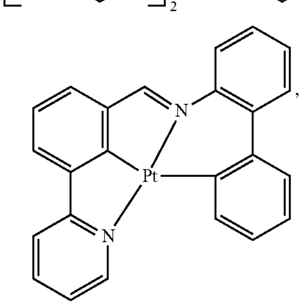

-continued
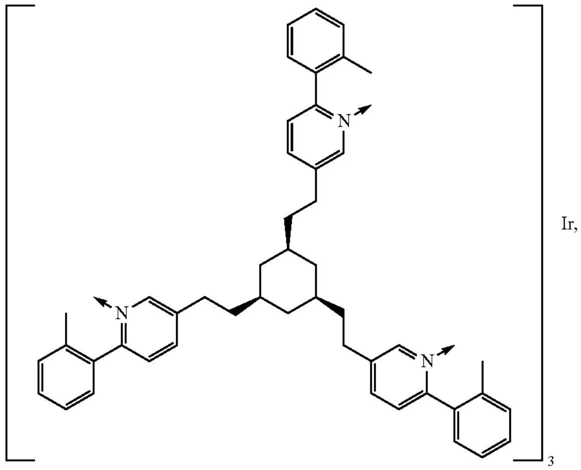
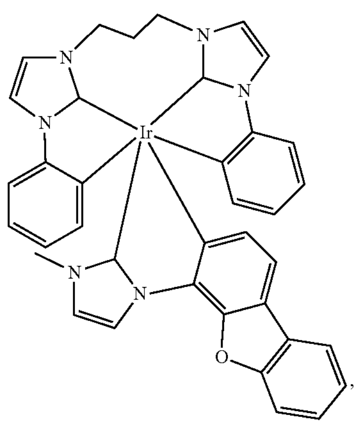
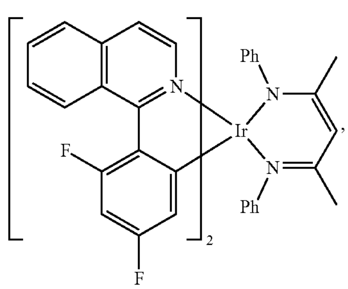
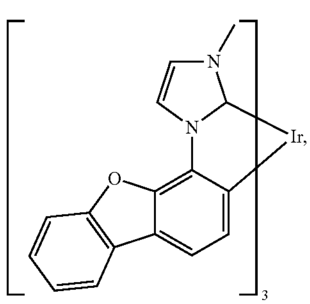
-continued
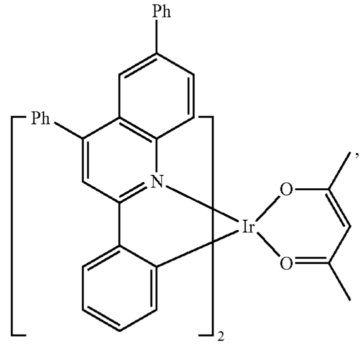
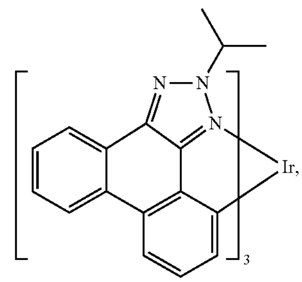
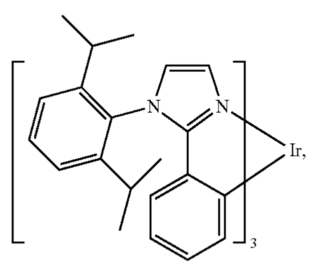
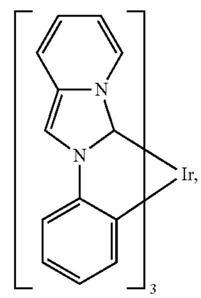
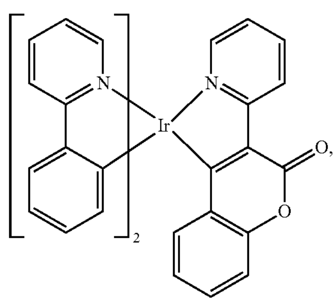
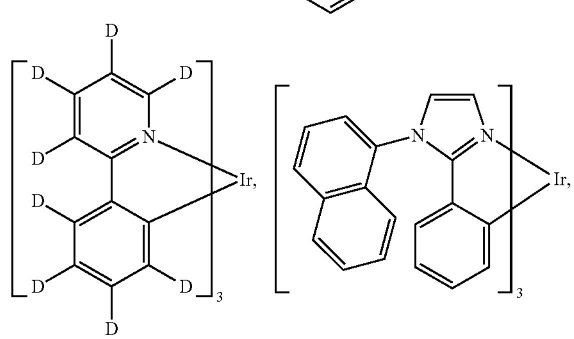

-continued

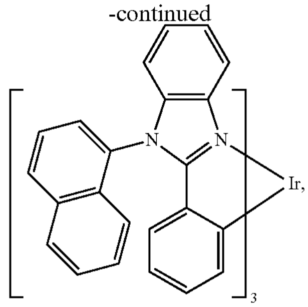

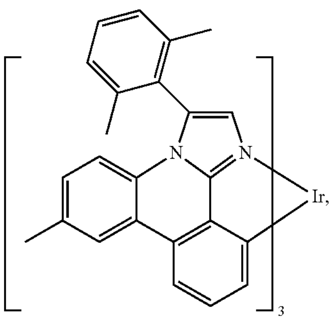

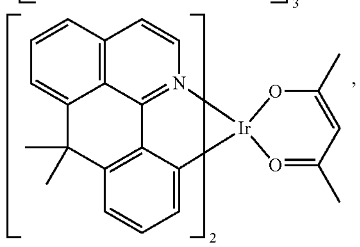

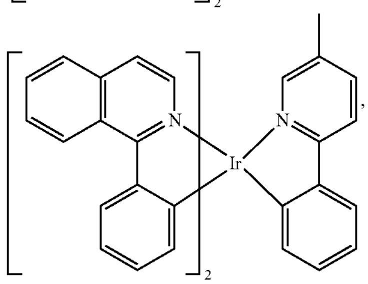

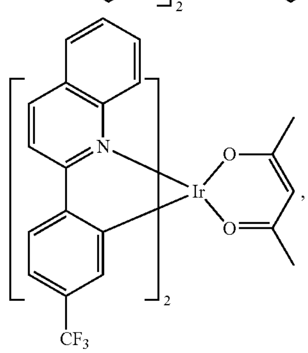

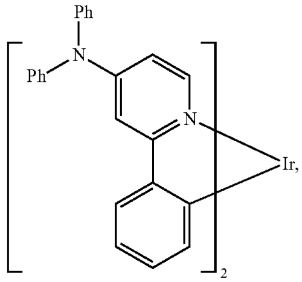 and

-continued

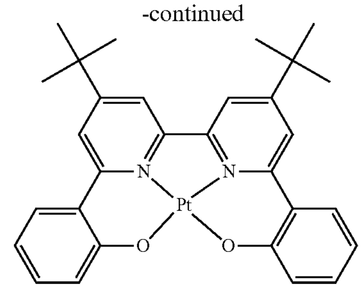

HBL:

A hole blocking layer(HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and/or higher triplet energy than the emitter closest to the HBL interface. In some embodiments, the HBL material has a lower HOMO (further from the vacuum level) and/or higher triplet energy than one or more of the hosts closest to the HBL interface.

In one aspect, compound used in HBL contains the same molecule or the same functional groups used as host described above.

In another aspect, compound used in HBL contains at least one of the following groups in the molecule:

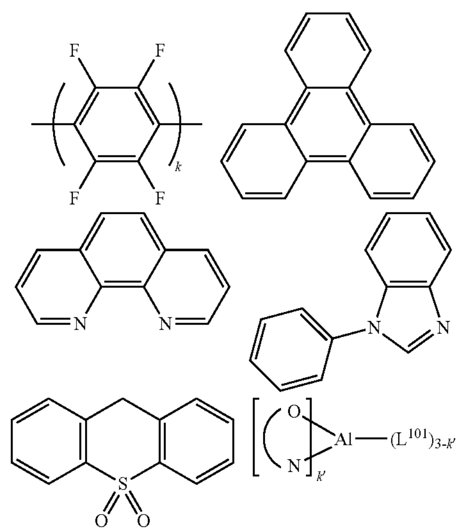

wherein k is an integer from 1 to 20; $L^{101}$ is an another ligand, k' is an integer from 1 to 3.

ETL:

Electron transport layer (ETL) may include a material capable of transporting electrons. Electron transport layer may be intrinsic (undoped), or doped. Doping may be used to enhance conductivity. Examples of the EL material are not particularly limited, and any metal complexes or organic compounds may be used as long as they are typically used to transport electrons.

In one aspect, compound used in ETL contains at least one of the following groups in the molecule:

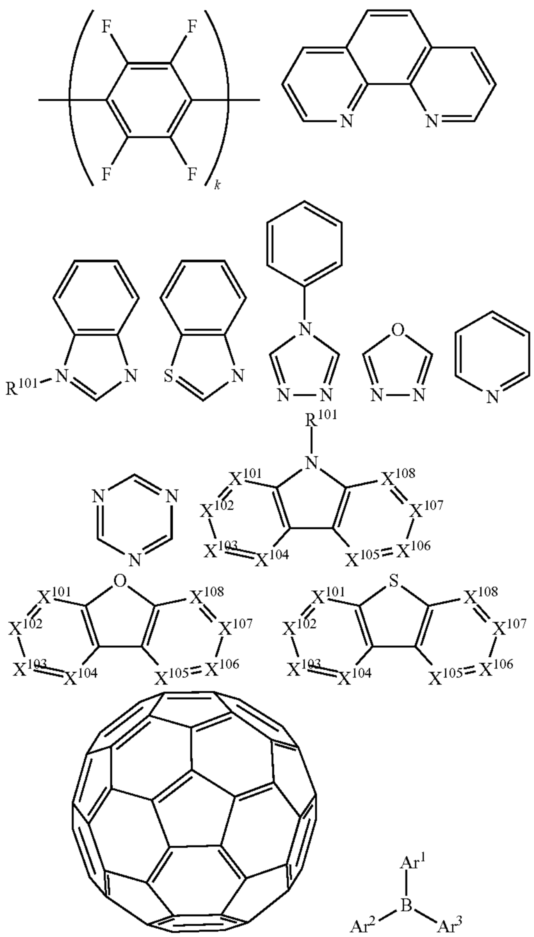

wherein $R^{101}$ is selected from the group consisting of hydrogen, deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof, when it is aryl or heteroaryl, it has the similar definition as Ar's mentioned above. $Ar^1$ to $Ar^3$ has the similar definition as Ar's mentioned above. k is an integer from 1 to 20. $X^{101}$ to $X^{108}$ is selected from C (including CH) or N.

In another aspect, the metal complexes used in ETL contains, but not limit to the following general formula:

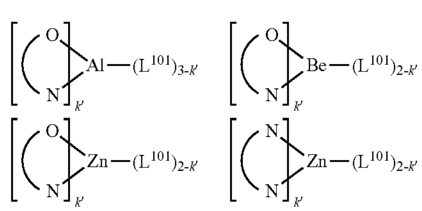

wherein (O—N) or (N—N) is a bidentate ligand, having metal coordinated to atoms O, N or N, N; $L^{101}$ is another ligand; k' is an integer value from 1 to the maximum number of ligands that may be attached to the metal.

Non-limiting examples of the ETL materials that may be used in an OLED in combination with materials disclosed herein ae exemplified below together with references that disclose those materials: CN103508940, EP01602648, EP01734038, EP01956007, JP2004-022334, JP2005149918, JP2005-268199, KR0117693, KR20130108183, US20040036077, US20070104977, US2007018155, US20090101870, US20090115316, US20090140637, US20090179554, US2009218940, US2010108990, US2011156017, US2011210320, US2012193612, US2012214993, US2014014925, US2014014927, US20140284580, U.S. Pat. Nos. 6,656,612, 8,415,031, WO2003060956, WO2007111263, WO2009148269, WO2010067894, WO2010072300, WO2011074770, WO2011105373, WO2013079217, WO2013145667, WO2013180376, WO2014104499, WO2014104535,

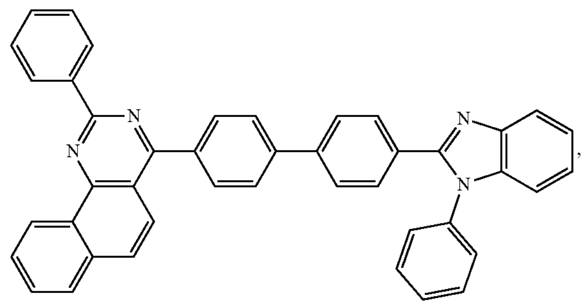

,

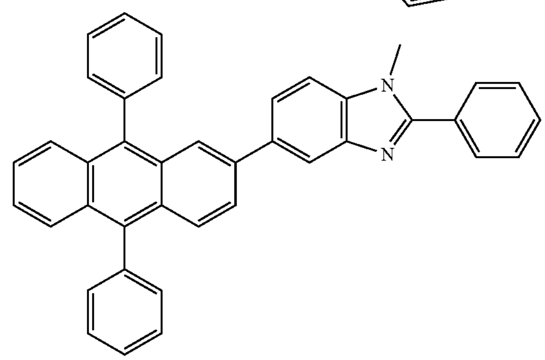

,

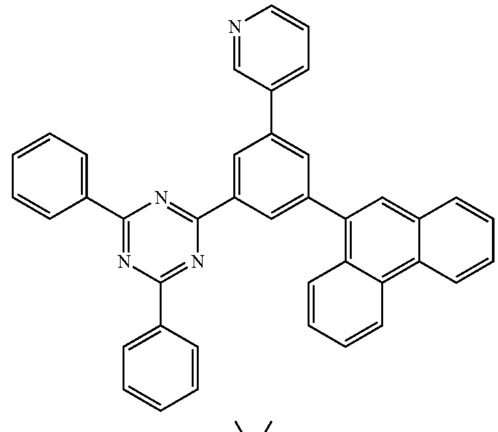

,

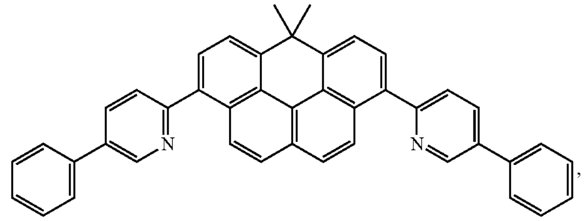

,

-continued
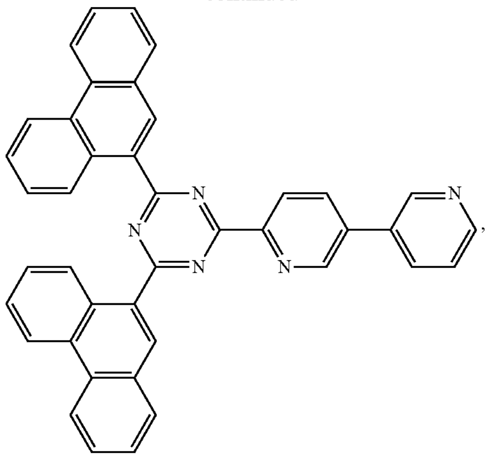
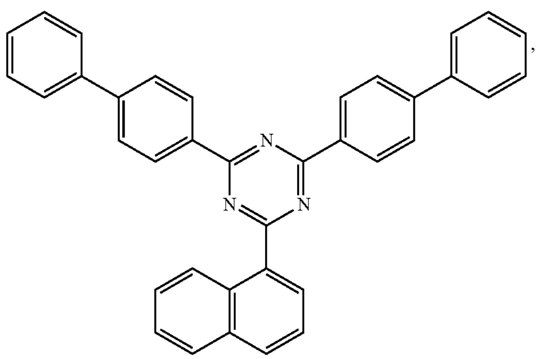
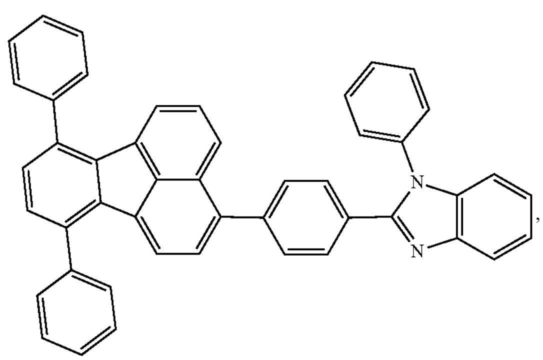
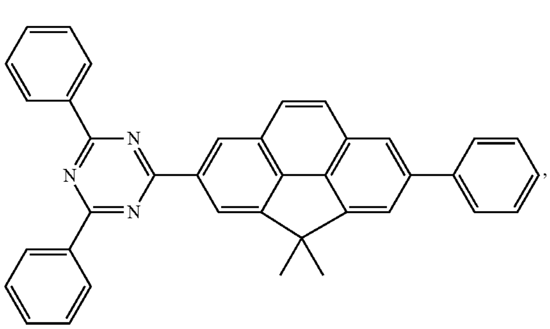
-continued
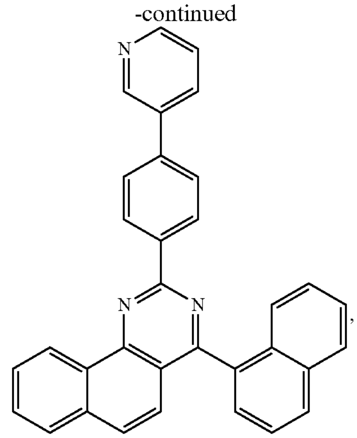
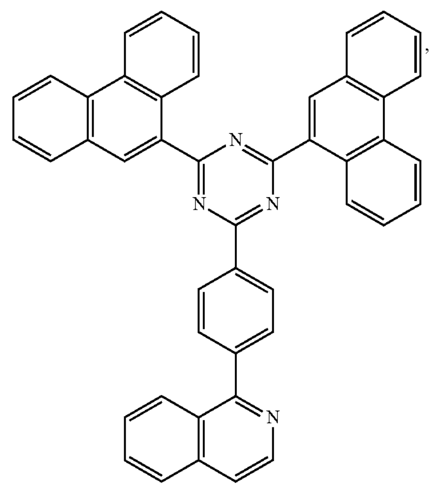
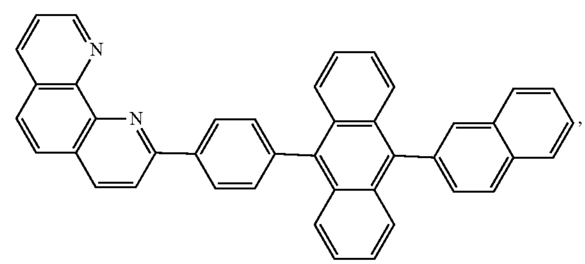
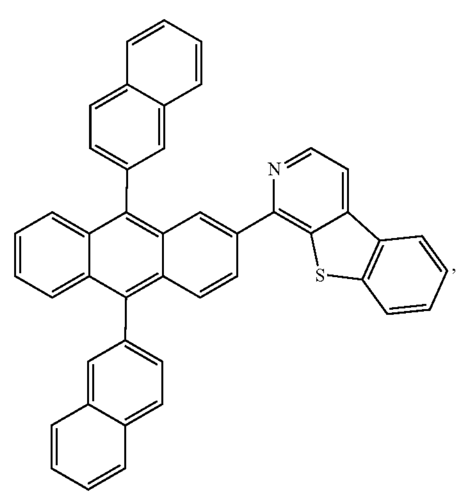

-continued
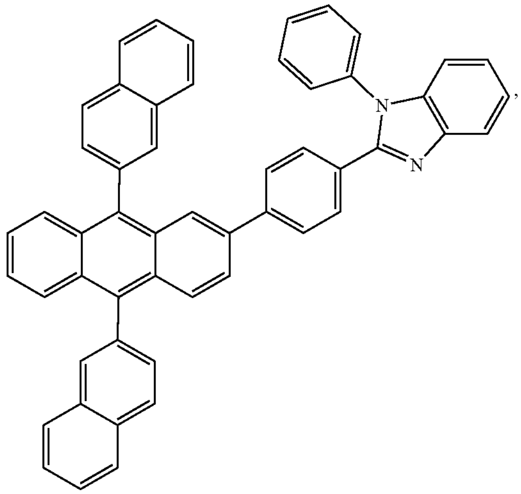
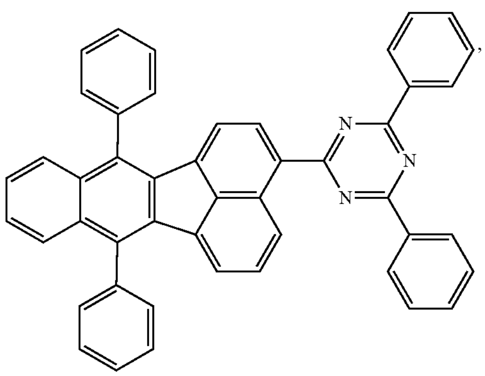
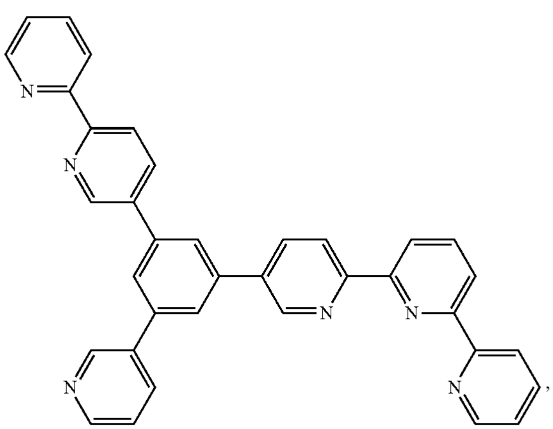
-continued
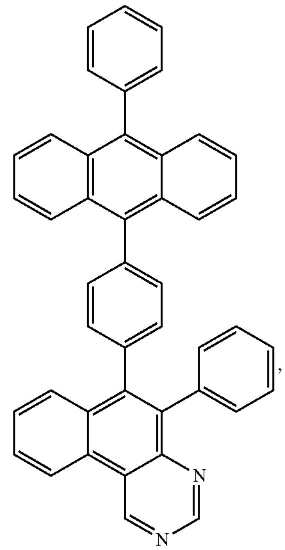 [SMILES: c1ccc(-c2c3ccccc3c(-c3ccc(-c4c(-c5ccccc5)c5ncncc5c5ccccc45)cc3)c3ccccc23)cc1]
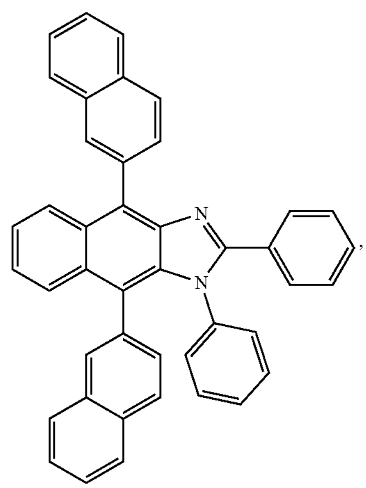
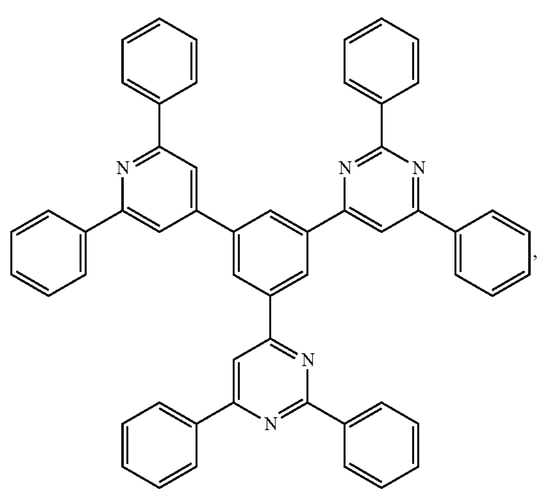

-continued
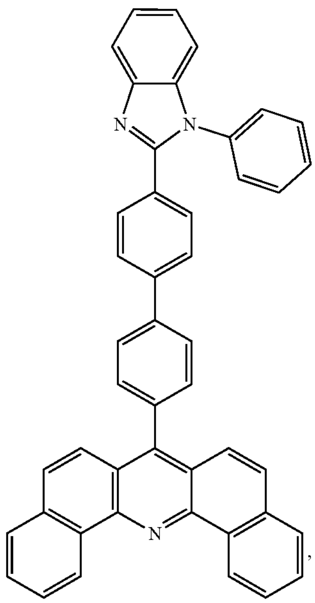
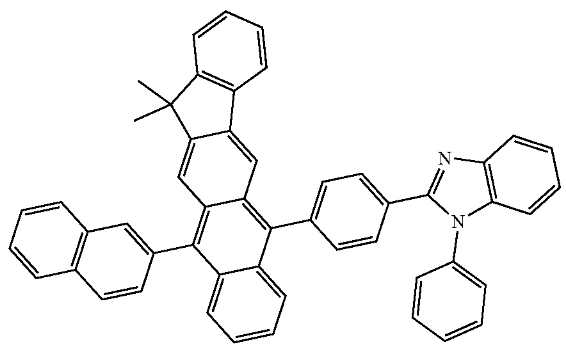
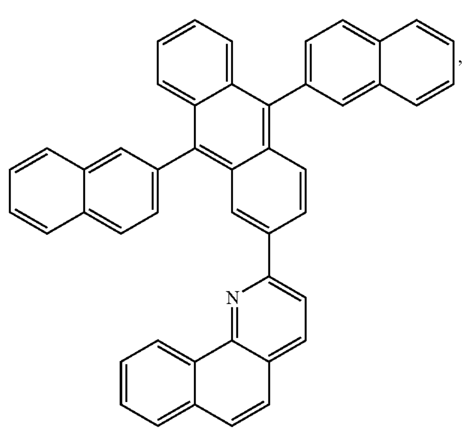
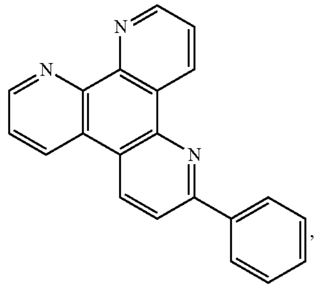
-continued
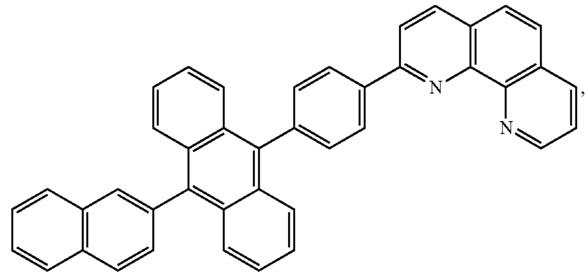
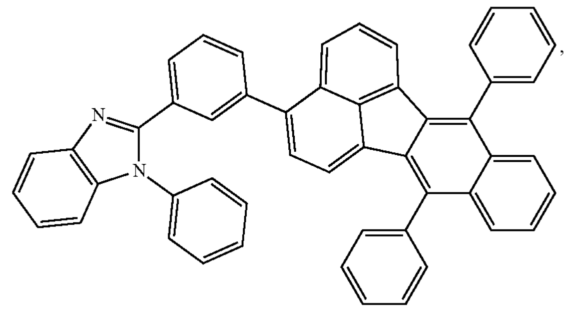
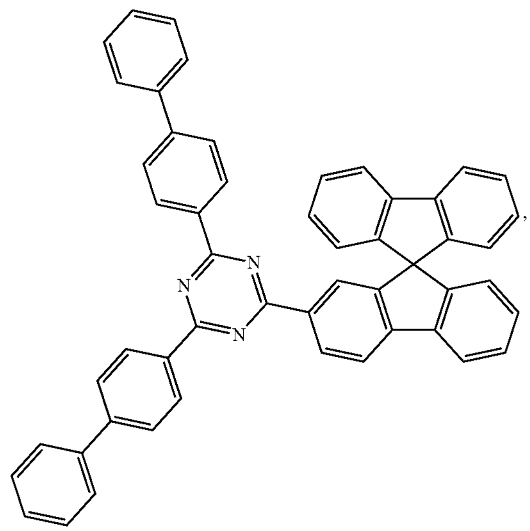
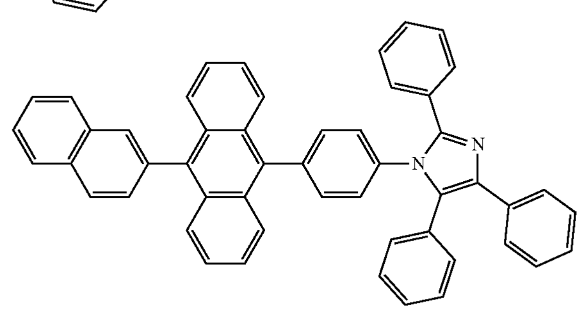
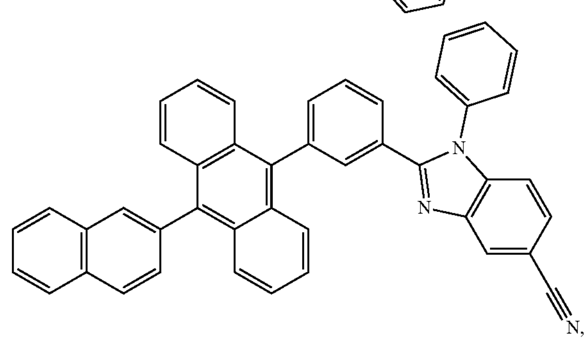

-continued

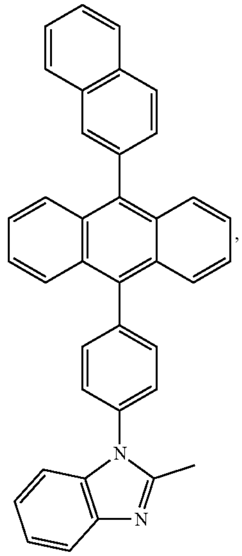

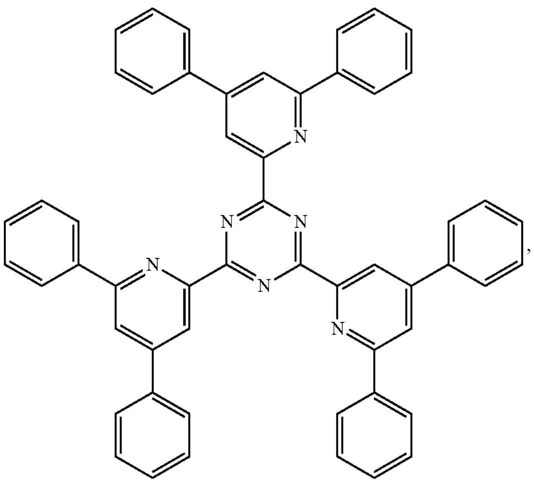

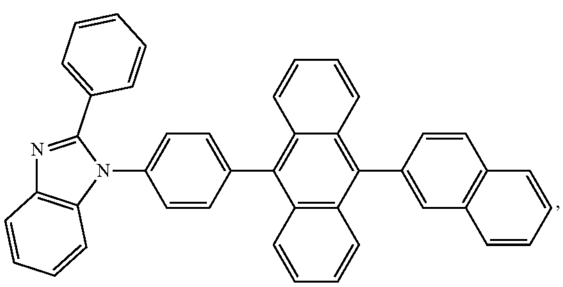

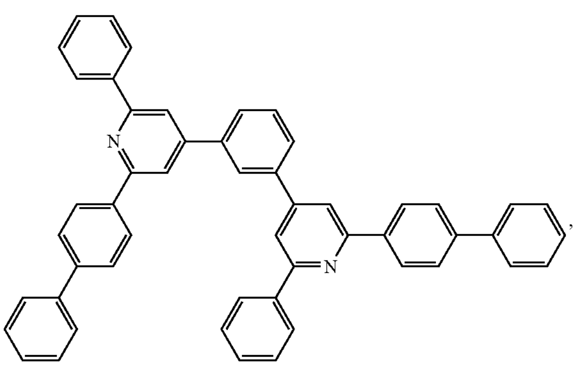

-continued

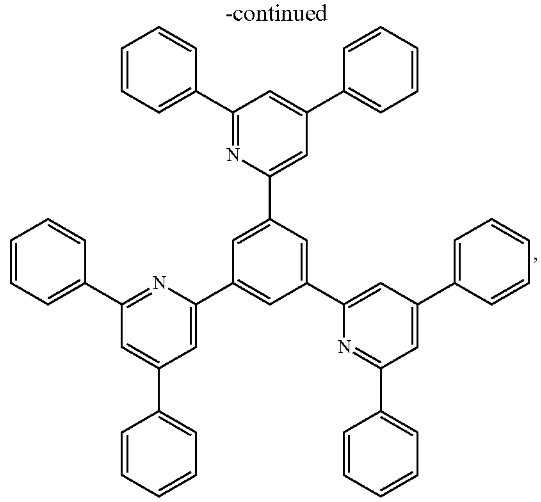

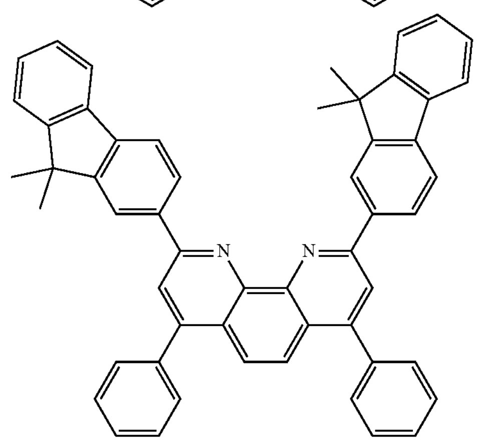

, and

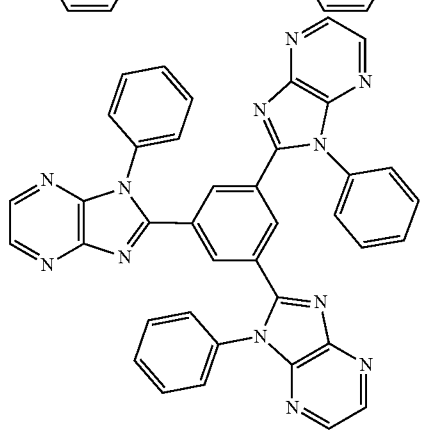

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

In any above-mentioned compounds used in each layer of the OLED device, the hydrogen atoms can be partially or fully deuterated. Thus, any specifically listed substituent, such as, without limitation, methyl, phenyl, pyridyl, etc. may be undeuterated, partially deuterated, and fully deuterated versions thereof. Similarly, classes of substituents such as, without limitation, alkyl, aryl, cycloalkyl, heteroaryl, etc. also may be undeuterated, partially deuterated, and fully deuterated versions thereof.

EXPERIMENTAL

All reactions were carried out under nitrogen protections unless specified otherwise. All solvents for reactions are anhydrous and used as received from commercial sources.

Synthesis of Compound C3086

Synthesis of 2,3,5-Tribromo-3a,6a-Dihydrothieno[3,2-b]Thiophene

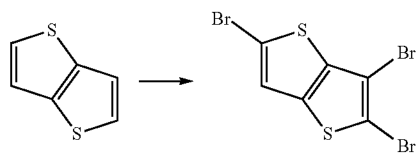 [SMILES: c1cc2sccc2s1 ; Brc1cc2sc(Br)c(Br)c2s1]

To a solution of 3a,6a-dihydrothieno[3,2-b]thiophene (30 g, 211 mmol) in $CHCl_3$ (597 mL), $Br_2$ (33.7 ml, 654 mmol) in $CHCl_3$ (400 mL) was added dropwise at 0° C. (make sure the internal temperature not to reach above 5° C.) for 1 hours. Then, the ice bath was removed and the mixture was stirred at room temperature (~22° C.) for 3 days. Then $CH_2Cl_2$ (1 L) was added, and carefully basified using concentrated NaOH (1 L) solution. The organic layer was separated and washed with water (2×1 L) and brine (1 L), then dried with $MgSO_4$ to give the product 2,3,5-tribromo-3a,6a-dihydrothieno[3,2-b]thiophene (78 g, 98% yield)

Synthesis of 3-Bromo-3a,6a-Dihydrothieno[3,2-b]Thiophene

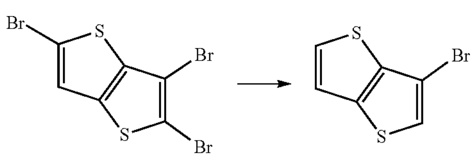 [SMILES: Brc1cc2sc(Br)c(Br)c2s1 ; Brc1csc2ccsc12]

A solution of 2,3,5-tribromo-3a,6a-dihydrothieno[3,2-b]thiophene (78 g, 206 mmol) in acetic Acid (350 mL) and toluene (350 mL) was heated to dissolve all the solids at 80° C. After forming a clear solution, Zn (81 g, 1235 mmol) was added portion wise, and also 2M HCl (20 mL) was added in portions. The resulting mixture was refluxed overnight (16 hours) at 110° C. After 16 hours, the volatiles were removed under vacuum and the resulting residue was diluted by adding water (500 mL) and DCM (2 L). Then saturated $NaHCO_3$ (1.5 L) was added carefully while stirring. A 500 mL 2N solution of HCl was added to the mixture and stirred for 20 min. The aqueous layer was extracted with dichloromethane (DCM) (2×750 mL), while the DCM layer washed with water (1 L) and brine (1 L), dried with $MgSO_4$ and evaporated to give 3-bromo-3a,6a-dihydrothieno[3,2-b]thiophene (42 g, 92% yield).

Synthesis of Ethyl (E)-3-(Thieno[3,2-b]Thiophen-3-Yl)Acrylate

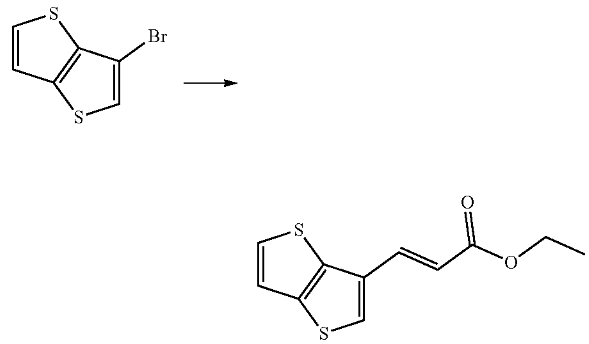

To a 500 mL sealed tube was added 3-bromothieno[3,2-b]thiophene (13 g, 59.3 mmol), ethyl acrylate (7.13 g, 71.2 mmol), triethylamine (66.2 mL, 475 mmol), $Pd(OAc)_2$ (0.666 g, 2.97 mmol), dicyclohexyl(2',6'-dimethoxy-[1,1'-biphenyl]-2-yl)phosphane (0.244 g, 0.593 mmol) and dimethylformamide (DMF) (100 mL). The mixture was sparged with $N_2$ for about 15 minutes. The resulting mixture was stirred and heated in oil bath at 130° C. for 16 hours. Upon completion, the DMF was removed and the crude product was dissolved in water (100 mL) and DCM (100 mL). The aqueous layers were further extracted with DCM (2×300 mL) and the combined DCM fractions were passed through small pad of silica and concentrated. The resulting product was used in the next reaction without further purification.

Synthesis of (E)-3-(Thieno[3,2-b]Thiophen-3-Yl) Acrylic Acid

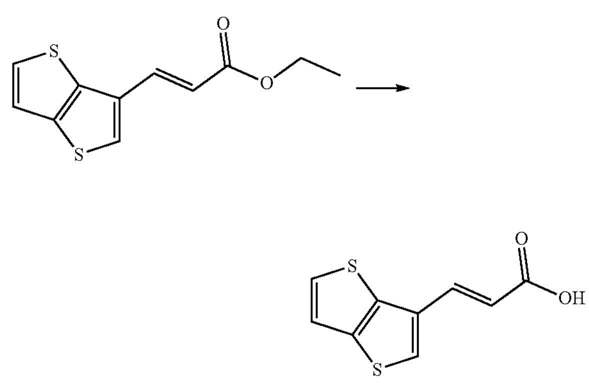

LiOH (16.9 g, 692 mmol) in water (175 mL) was added to a solution of ethyl (E)-3-(thieno[3,2-b]thiophen-3-yl) acrylate (55 g, 231 mmol) in tetrahydrofuran (THF) (450 ml). The reaction mixture was refluxed for 5 hours and then THF was evaporated. The crude product was dissolved in 1 L of water and washed with 3×750 ml diethyl ether. The aqueous layer was acidified with 2M HCl (400 mL) and the product was precipitated, filtered, and dried to give the clean product with (E)-3-(thieno[3,2-b]thiophen-3-yl)acrylic acid (37 g, 76% yield)

Synthesis of (E)-3-(3-(Azidooxy)-3-Oxoprop-1-En-1-Yl)Thieno[3,2-b]Thiophene

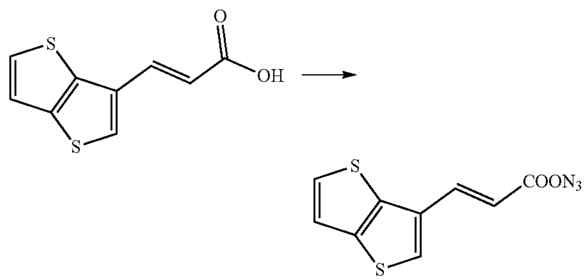

A mixture of (E)-3-(thieno[3,2-b]thiophen-3-yl)acrylic acid (7.5 g, 35.7 mmol), diphenyl phosphorazidate (11.5 mL, 53.5 mmol), and triethylamine (7.5 mL, 53.5 mmol) in toluene (70 mL) was stirred at room temperature for 1 hour. The volatiles were removed under vacuum and the crude mixture was used in the next reaction without further purification.

Synthesis of Thieno[2',3': 4,5]Thieno[2,3-c]Pyridin-5(6H)-One

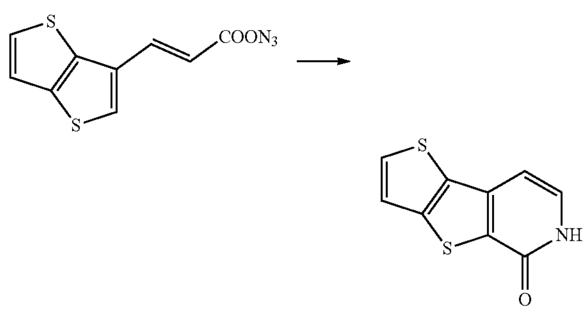

(E)-3-(3a,6a-dihydrothieno[3,2-b]thiophen-3-yl)acryloyl azide (8.3 g, 35.0 mmol) in diphenylethane (8 mL) and toluene (10 mL) was added dropwise to a solution of diphenylmethane (40 mL, 35.0 mmol) and tributylamine (8 mL, 35.0 mmol) at 170° C. for 30 minutes. The reaction mixture was then heated to 220° C. for 1 hour. The crude product was purified by column, first with DCM then THF:DCM 1:1 to afford the product. The mixture was used in the next reaction without further purification.

Synthesis of 5-Chlorothieno[2',3':4,5]Thieno[2,3-c]Pyridine

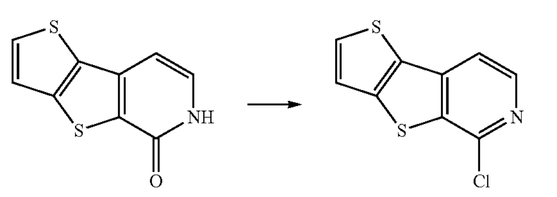 [SMILES: O=c1[nH]ccc2c1sc1ccsc12 ; Clc1nccc2c1sc1ccsc12]

3a,8b-dihydrothieno [2',3':4,5]thieno [2,3-c]pyridin-5(6H)-one (7.5 g, 35.8 mmol) and $POCl_3$ (20.04 mL, 215 mmol) were refluxed for 5 hours then concentrated. The residue was dissolved in DCM (100 mL) and neutralized with $NaHCO_3$ (150 mL). The aqueous layer was extracted with DCM (100 mL), then the combined organics washed with water (200 mL), dried, and purified by column using 100% DCM to give the resulting product 5-chloro-3a,8b dihydrothieno[2',3':4,5]thieno[2,3-c]pyridine (3.3 g, 40.4% yield).

Synthesis of 5-(4-(Tert-Butyl)Naphthalen-2-Yl)Thieno[2',3':4,5]Thieno[2,3-c]Pyridine

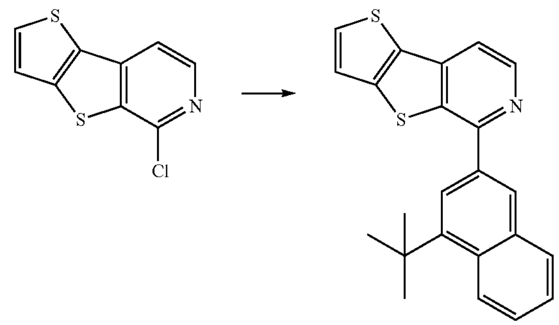 [SMILES: Clc1nccc2c1sc1ccsc12 ; CC(C)(C)c1cc(-c2nccc3c2sc2ccsc23)cc2ccccc12]

To a solution of 5-chlorothieno[2',3':4,5]thieno[2,3-c]pyridine (0.6 g, 2.66 mmol) in DME (18 mL) was added tetrakis(triphenylphosphine)palladium(0) ($Pd(PPh_3)_4$) (0.614 g, 0.532 mmol), the mixture was stirred for 10 minutes. 2-(4-(tert-butyl)naphthalen-2-yl)-4,4,5,5-tetramethyl-1,3,2-dioxaborolane (0.990 g, 3.19 mmol) and sodium carbonate (0.845 g, 7.97 mmol) in water (3.46 mL) were then added. The resulting mixture was sparged with $N_2$ for 15 minutes, and was heated at 105° C. for 16 hours. Upon completion, the reaction mixture was diluted with water (150 mL) and DCM (150 mL) and the aqueous and organic layers were separated. The aqueous layer was extracted further with DCM (2×100 mL) and the combined organics were dried with $MgSO_4$, filtered, concentrated and purified by column using 0-30% ethyl acetate in heptanes to give the desired product 5-(4-(tert-butyl)naphthalen-2-yl)thieno[2',3':4,5]thieno[2,3-c]pyridine (0.8 g, 81% yield).

Synthesis of Di-μ-Chloro-Tetrakis[((5-(4-(Tert-Butyl)Naphthalen-2-Yl)Thieno[2',3':4,5]Thieno[2,3-c]Pyridin-2-Yl)]Diiridium(III)

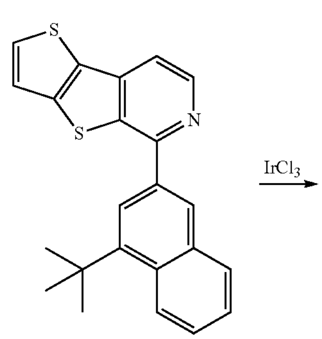

-continued

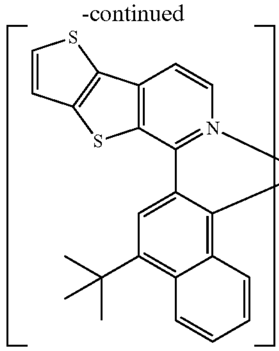

A solution of 5-(4-(tert-butyl)-naphthalen-2-yl)thieno[2',3':4,5]thieno[2,3-c]pyridine (2 g, 53.5 mmol) in 2-ethoxyethanol (18 mL) and deionized, untrafiltered (DIUF) water (6 mL) was sparged with nitrogen for 10 minutes. Iridium (III) chloride tetrahydrate (900 mg, 24.3 mmol) was added and the reaction mixture was heated at 80° C. for 18 hours. The reaction mixture was cooled to room temperature, filtered and the solid washed with methanol (3×75 mL) to give di-μ-chloro-tetrakis[((5-(4-(tert-butyl)naphthalen-2-yl) thieno[2',3':4,5]thieno [2,3-c]pyridin-2-yl)]diiridium(III) (3.3 g, Quantitative yield) as a reddish-black solid.

Synthesis of Bis[((1-(4-Tert-Butyl)Naphthyl-2-Yl-1'-Yl)-Thieno[2',3':4,5]Thieno[2,3-c]Pyridine-2-Yl)]-(3,7-Diethyl-4,6-Nonanedionato-k$_2$O,O') Iridium(III)—Compound C3086

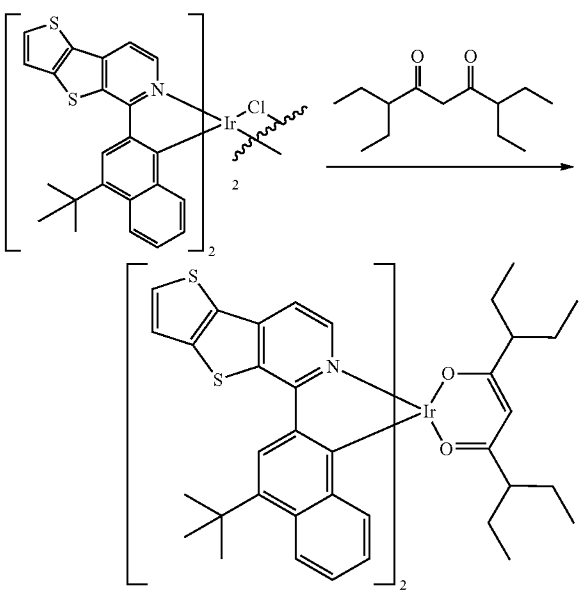

A solution of di-μ-chloro-tetrakis[((5-(4-(tert-butyl)naphthalen-2-yl)thieno-[2',3':4,5]thieno[2,3-c]pyridin-2-yl)] diiridium(III) (3 g, 1 mmol) and 3,7-diethylnonane-4,6-dione (900 mg, 4 mmol,) in 2-ethoxyethanol (30 mL) was sparged with nitrogen for 10 minutes then powdered potassium carbonate (580 mg, 14 mmol) was added. The reaction mixture was stirred at 25° C. in a flask wrapped in aluminum foil for 18 hours. Water (30 mL) was added and the suspension stirred at room temperature for 30 minutes. The suspension was filtered, then the solid was washed with water (3×5 mL), resuspended in methanol (20 mL), and the mixture stirred for another 30 minutes. The suspension was filtered and the solid washed with methanol (3×10 mL). The red solid (2 g) was dissolved in 50% dichloromethane in hexanes and chromatographed on a column of silica gel (50 g) topped with basic alumina (20 g), eluting with 50% dichloromethane in hexanes to give bis[((1-(4-tert-butyl) naphthyl-2-yl-1'-yl)-thieno[2',3':4,5]thieno[2,3-c]pyridine-2-yl)]-(3,7diethyl-4,6-nonanedionato-k$_2$O,O')-iridium(III) (1 g, 40% yield) as a red solid.

Synthesis of Comparative Compound 1

Synthesis of 3-Methylthieno[2,3-c]pyridine

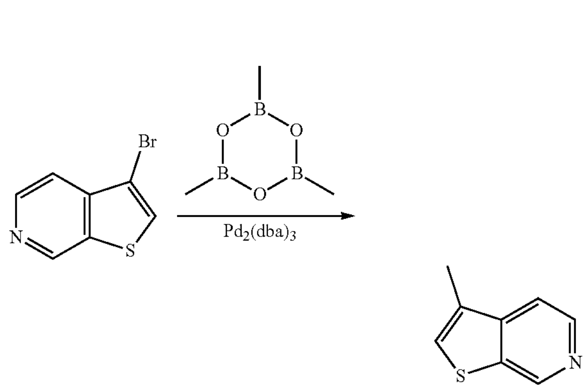

A mixture of 3-bromothieno[2,3-c]-pyridine (7.15 g, 33.4 mmol), trimethylboroxine (7.0 mL, 50.1 mmol), and 2M aqueous potassium carbonate (50 mL, 100 mmol) in 1,4-dioxane (200 mL) was sparged with nitrogen for 15 minutes. 2-Dicyclohexyl-phosphino-2',6'-dimethoxybiphenyl (1.37 g, 3.34 mmol) and tris-(dibenzylideneacetone)dipalladium (0) (0.77 g, 0.835 mmol) were added and the reaction mixture heated at reflux overnight. The reaction mixture was cooled to room temperature and the aqueous and organic layers separated. The aqueous phase was extracted with ethyl acetate (3×20 mL). The combined organic phases were washed with brine (3×50 mL) and dried over sodium sulfate, filtered, and concentrated under reduced pressure to give 3-methylthieno[2,3-c]pyridine (5.1 g, quantitative yield) an orange oil containing residual Sphos (2-dicyclohexylphosphino-2',6'-dimethoxybiphenyl).

Synthesis of 3-Methylthieno[2,3-c]Pyridine 6-Oxide

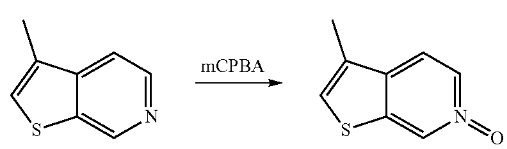

To a solution of 3-methyl-thieno[2,3-c]pyridine (2.72 g, 18.2 mmol) in dichloromethane (30 mL) at 0° C. was added meta-chloroperoxybenzoic acid (mCPBA) (8.99 g, 36.46 mmol) in portions and the reaction mixture stirred at room temperature for 1 hour. Catalytic charcoal and toluene (150 mL) were added and the mixture heated at reflux with a Dean-Stark trap for 1 hour until dichloromethane and water were removed (a safety shield was used). The crude 3-methylthieno[2,3-c]pyridine 6-oxide solution was used in the next step.

Synthesis of 7-Chloro-3-Methylthieno[2,3-c]Pyridine

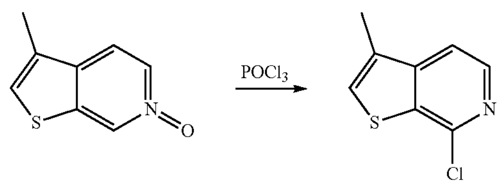

To the solution of crude 3-methylthieno[2,3-c]pyridine 6-oxide (est. 18.2 mmol) in toluene at 0° C. were added phosphorus(V) oxychloride (8.5 mL, 91.15 mmol) and pyridine (7.4 mL, 91.15 mmol). The mixture was heated at reflux for 4 hours then cooled to room temperature. Ice-water (10 mL) was added, followed by aqueous saturated sodium carbonate (100 mL), aqueous saturated brine (100 mL), and ethyl acetate (200 mL). The organic layer was separated, dried over sodium sulfate (50 g), filtered and concentrated under reduced pressure. The residue was chromatographed eluting with gradient of 0-20% ethyl acetate in heptanes to give 7-chloro-3-methylthieno-[2,3-c]pyridine (0.71 g, 21% yield over two steps) as an off-white solid.

Synthesis of 7-(4-(Tert-Butyl)Naphthalen-2-Yl)-3-Methylthieno[2,3-c]Pyridine

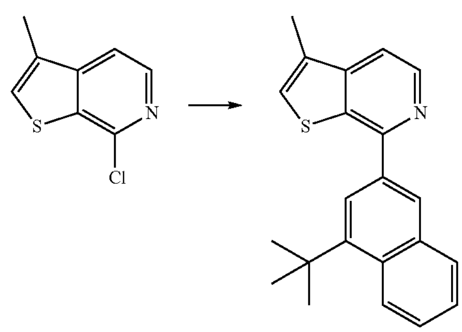 [SMILES: Cc1csc2c(Cl)nccc12 ; Cc1csc2c(-c3cc(C(C)(C)C)c4ccccc4c3)nccc12]

A mixture of 7-chloro-3-methylthieno[2,3-c]pyridine (0.71 g, 3.87 mmol), 1-tert-butylnaphalene-3-boronic acid pinacol ester (1.44 g, 4.64 mmol), potassium carbonate (1.07 g, 7.73 mmol), and trans-dichlorobis(tri-phenylphosphine) palladium(II) (0.14 g, 0.19 mmol) in 1,4-dioxane (50 mL) and water (10 mL) was sparged with nitrogen for 10 minutes. The reaction mixture was heated at reflux for 4 hours then cooled to room temperature. The layers were separated and the aqueous phase extracted with ethyl acetate (3×20 mL). The combined organic phases were washed with brine (3×50 mL), dried over sodium sulfate (50 g), filtered and concentrated under reduced pressure. The residue was chromatographed eluting with a gradient of 0-30% ethyl acetate in heptanes, to give 7-(4-(tert-butyl)naphthalen-2-yl)-3-methylthieno[2,3-c]pyridine (1.08 g, 84% yield) as an off-white solid.

Synthesis of Di-μ-Chloro-Tetrakis[(7-(4-Tert-Butylnaphthyl-1'-Yl)-3-Methylthieno[2,3-c]Pyri-Din-1-Yl)]Diiridium(III)

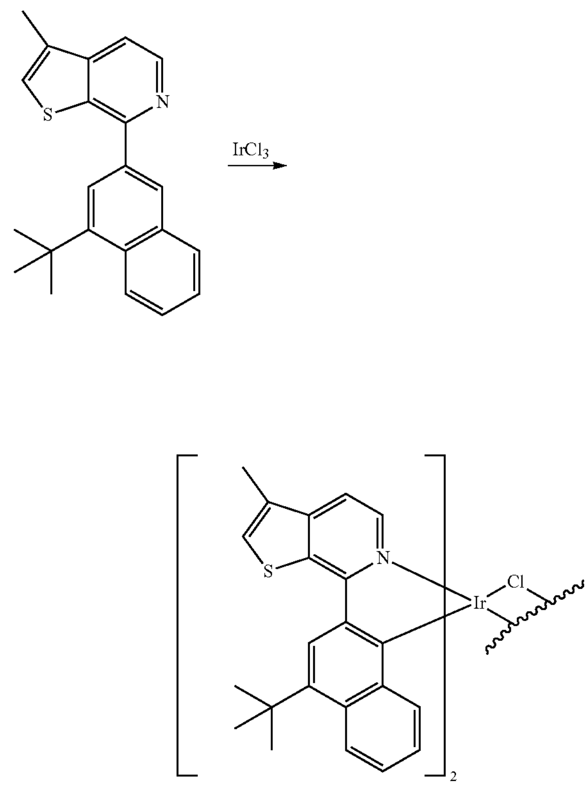

A solution of 7-(4-(tert-butyl) naphthalen-2-yl)-3-methylthieno[2,3-c]pyridine (1.07 g, 3.23 mmol) in 2-ethoxyethanol (21 mL) and DIUF water (7 mL) was sparged with nitrogen for ten minutes, then iridium chloride hydrate (0.51 g, 1.61 mmol) added. The reaction mixture was heated at reflux for 16 hours, cooled to room temperature, filtered and the filter cake was washed with water (3×10 mL) and methanol (5×10 mL). The red solid was air-dried to give di-p-chloro-tetrakis[(7-(4-tert-butyl-naphthyl-1'-yl)-3-methylthieno[2,3-c]pyridin-1-yl)]diiridium(III) (1.6 g, >100% yield).

Synthesis of Bis[(7-(4-Tert-Butylnaphthyl-1'-Yl)-3-Methylthieno[2,3-c]Pyridin-1-Yl)]-(3,7-Diethyl-4,6-Nonanedionato-$k_2$O,O')Iridium(III)

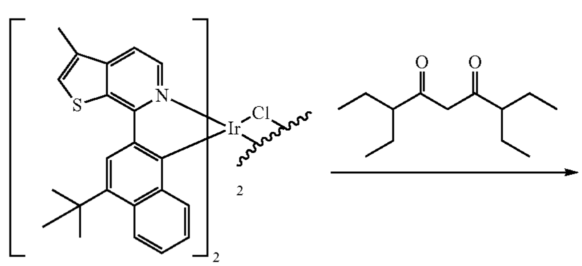

-continued

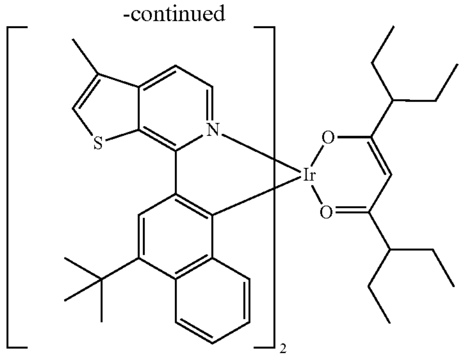

A suspension of di-p-chloro-tetrakis[(7-(4-tert-butylnaphthyl-1'-yl)-3-methylthieno [2,3-c]pyridin-1-yl)]diiridium (III) (1.6 g, ~0.81 mmol) and 2,6-dimethyl-heptane-3,5-dione (1.37 g, 6.47 mmol) in 2-ethoxyethanol (30 mL) was sparged with nitrogen for ten minutes. Powdered potassium carbonate (1.34 g, 9.70 mmol) was added and the reaction mixture stirred at room temperature in the dark for 16 hours. DIUF Water (30 mL) was added and the mixture stirred for 1 hour. The suspension was filtered and the solid washed with water (3×10 mL) and methanol (3×10 mL). The red solid was chromatographed eluting with a gradient of 0-40% dichloromethane in heptanes, to give bis[(7-(4-tert-butylnaphthyl-1'-yl)-3-methylthieno[2,3-c]-pyridin-1-yl)]-(3,7-diethyl-4,6-nonanedionato-$k_2$O,O') iridium(III) as a red solid (1.42 g, 83% yield).

Device Examples

All example devices were fabricated by high vacuum (<10-7 Torr) thermal evaporation. The anode electrode was 1,150 Å of indium tin oxide (ITO). The cathode consisted of 10 Å of Liq (8-hydroxyquinoline lithium) followed by 1,000 Å of Al. All devices were encapsulated with a glass lid sealed with an epoxy resin in a nitrogen glove box (<1 ppm of $H_2O$ and $O_2$) immediately after fabrication, and a moisture getter was incorporated inside the package. The organic stack of the device examples consisted of sequentially, from the ITO surface, 100 Å of HATCN as the hole injection layer (HIL); 450 Å of HTM as a hole transporting layer (HTL); 400 Å of an emissive layer (EML) containing Compound H as a host, (a stability dopant (SD) (18%), and Comparative Compound 1 or Compound C3086 as the emitter (3%); and 350 Å of Liq (8-hydroxyquinoline lithium) doped with 40% of ETM as the ETL. The emitter was selected to provide the desired color and device efficiency The stability dopant (SD) was added to the electron-transporting host to help transport positive charge in the emissive layer. The Comparative Example device was fabricated similarly to the device examples except that Comparative Compound 1 was used as the emitter in the EML. Table 1 shows the device layer thickness and materials. The chemical structures of the device materials are shown in FIG. 2.

The device performance data are summarized in Table 2. In terms of Maximum Wavelength of emission ($\lambda_{MAX}$), Compound C3086 exhibits a bathochromic shift of 10 nm compared to Comparative Compound 1 (621 nm vs. 611 nm). This 10 nm shift is significant in this case because $\lambda_{MAX}$=621 nm is usable as a red pixel in OLED displays and $\lambda_{MAX}$=611 nm is too blue shifted to be commercially viable. The Full Width at Half Maximum (FWHM) is also similar, Compound C3086 and Comparative Compound 1 showed a FWHM of 1.06 and 1.00 respectively. The External Quantum Efficiency (EQE) of the device is improved by using Compound C3086 compared to Comparative Compound 1 (1.17 vs 1.00). The significant improvement will lead to much better device efficiency.

TABLE 1

Device layer materials and thicknesses

| Layer | Material | Thickness [Å] |
|---|---|---|
| Anode | ITO | 1150 |
| HIL | HATCN | 100 |
| HTL | HTM | 450 |
| EML | Compound H: SD 18%: Emitter 3% | 400 |
| ETL | Liq: ETM 40% | 350 |
| EIL | Liq | 10 |
| Cathode | Al | 1000 |

TABLE 2

Performance of the devices with examples of red emitters.

| Device | | 1931 CIE | | λ max | FWHM | Voltage | LE |
|---|---|---|---|---|---|---|---|
| | | | | | | At 10 mA/cm² | |
| Example | Emitter | X | y | [nm] | [nm] | [au] | [au] |
| Example 1 | Compound C3086 | 0.67 | 0.33 | 621 | 1.06 | 1.03 | 1.17 |
| CE1 | Comparative Compound 1 | 0.66 | 0.34 | 611 | 1.00 | 1.00 | 1.00 |

COMPOUND H

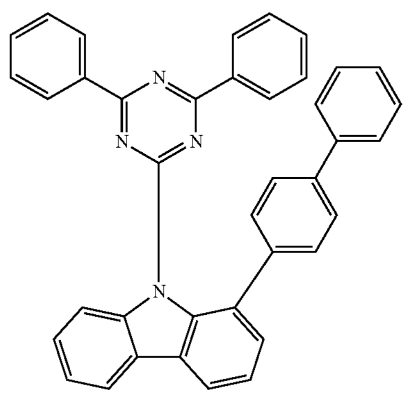

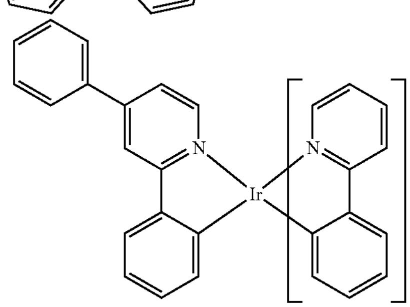

SD

-continued

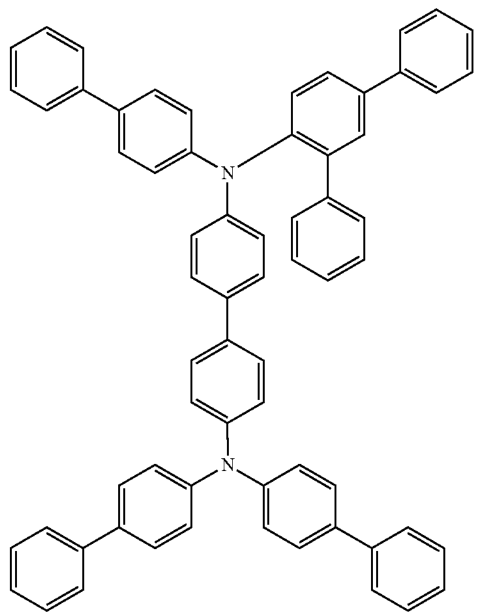

HTM

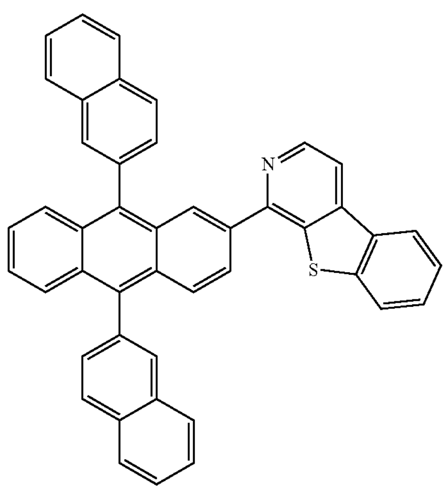

ETM

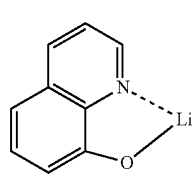

Liq

-continued

Compound C3086

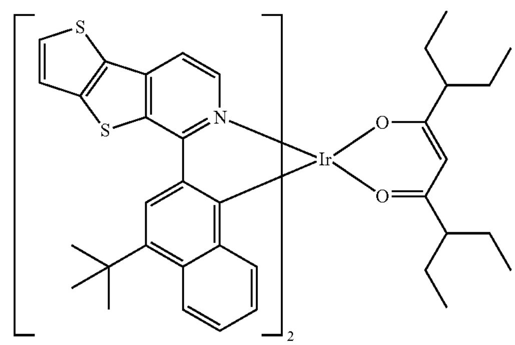

Comparative Compound 1

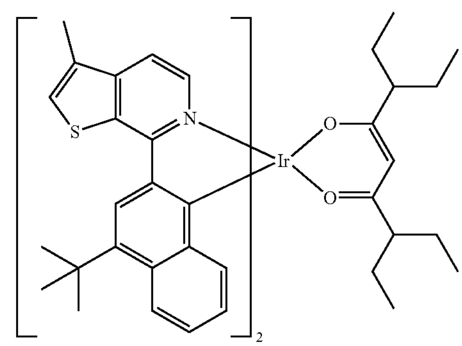

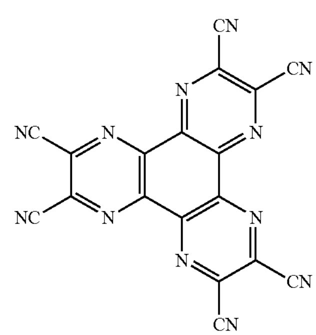

HATCN

Chemical Structures for the Materials Used in the OLED Devices

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

The invention claimed is:

1. A compound comprising a first ligand $L_A$ of Formula I

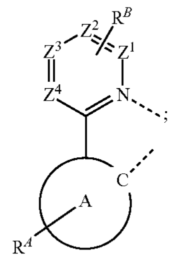

wherein ring A is a 5-membered or 6-membered carbocyclic or heterocyclic ring, wherein $Z^1$-$Z^4$ are each independently C or N;

wherein at least two consecutive $Z^1$-$Z^4$ are C, and are fused to a structure of Formula II

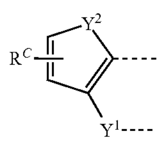

or Formula III

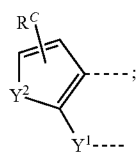

wherein $Y^1$ and $Y^2$ are each independently selected from the group consisting of O, S, Se, CRR', SiRR', and GeRR';

wherein $R^A$ and $R^C$ represent mono to a maximum possible number of substitutions on the carbon atoms of the ring attached thereto, or no substitution;

wherein $R^B$ represents di-, tri-, or tetra-substitution;

wherein each $R^A$, $R^B$, $R^C$, R, and R' is a hydrogen or a substituent selected independently from the group consisting of deuterium, fluorine, alkyl, cycloalkyl, heteroalkyl, alkoxy, aryloxy, amino, silyl, alkenyl, cycloalkenyl, heteroalkenyl, aryl, heteroaryl, nitrile, isonitrile, sulfanyl, and combinations thereof;

wherein any two substituents may be joined or fused together to form a ring;

wherein $L_A$ is complexed to a metal M by the dashed lines in Formula I to form a five-membered chelate ring, and M has an atomic weight greater than 40;

wherein M is optionally coordinated to other ligands;

wherein the ligand $L_A$ is optionally linked with other ligands to comprise a tridentate, tetradentate, pentadentate, or hexadentate ligand.

2. The compound of claim 1, wherein each $R^A$, $R^B$, $R^C$, R, and R' is independently a hydrogen or a substituent selected from the group consisting of deuterium, fluorine, alkyl, cycloalkyl, alkoxy, aryloxy, amino, silyl, aryl, heteroaryl, sulfanyl, and combinations thereof.

3. The compound of claim 1, wherein each $R^A$, $R^B$, $R^C$, R, and R' is independently a hydrogen or a substituent selected from the group consisting of deuterium, fluorine, alkyl, cycloalkyl, aryl, heteroaryl, and combinations thereof.

4. The compound of claim 1, wherein ring A is a 6-membered aromatic ring.

5. The compound of claim 1, wherein two $R^A$ join together to form a fused ring.

6. The compound of claim 1, wherein ring A is phenyl or napthyl.

7. The compound of claim 1, wherein M is selected from the group consisting of Os, Ir, Pd, Pt, Cu, and Au.

8. The compound of claim 1, wherein $Y^1$ and $Y^2$ are both S, or $Y^1$ and $Y^2$ are both O.

9. The compound of claim 1, wherein $Z^1$ to $Z^4$ are C.

10. The compound of claim 1, wherein at least one of $Z^1$ to $Z^4$ are N.

11. The compound of claim 1, wherein the compound is selected from the group consisting of:

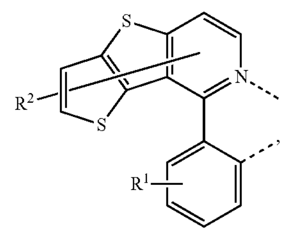

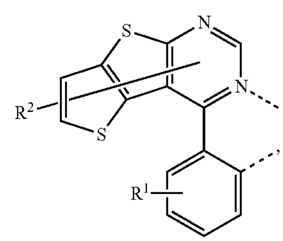

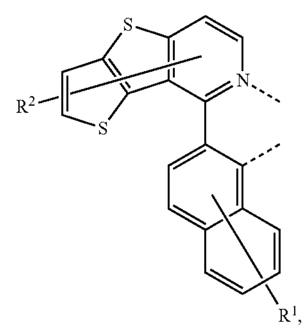

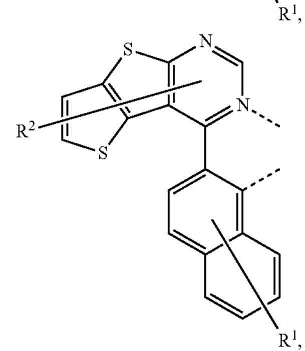

-continued
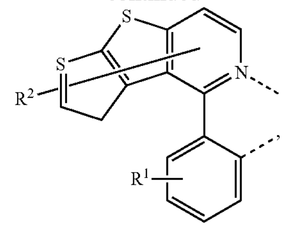
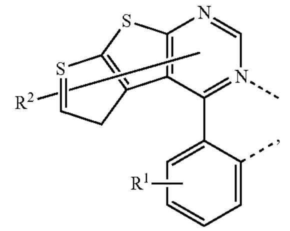
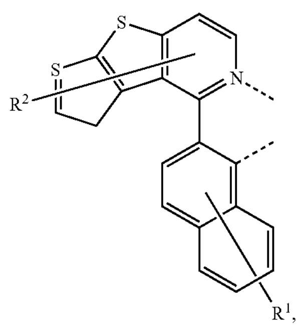
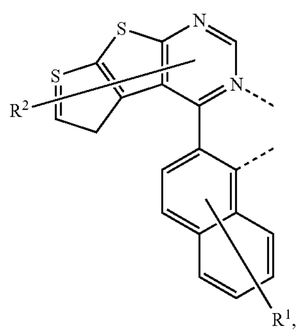
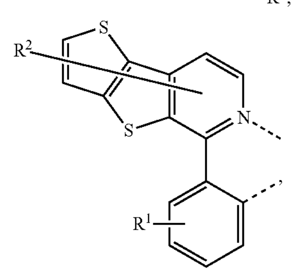
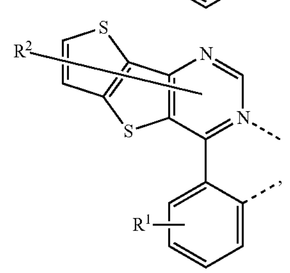
-continued
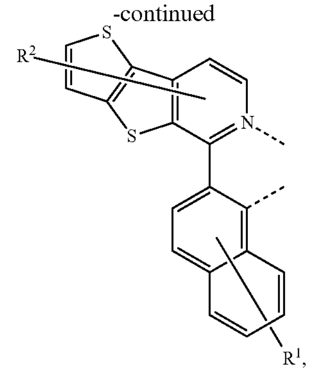
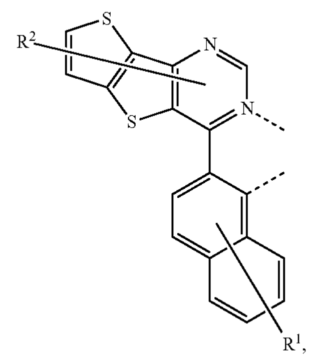
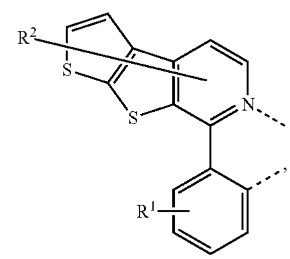
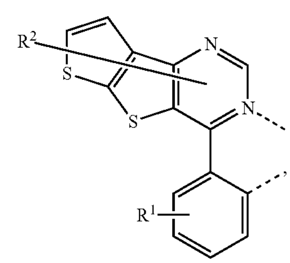
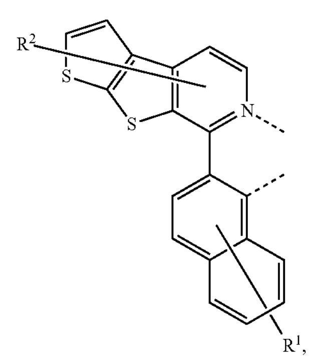

-continued
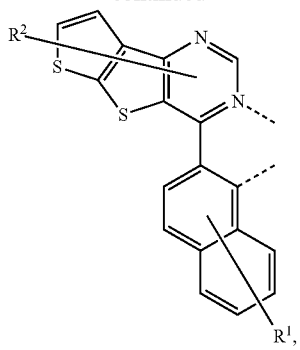
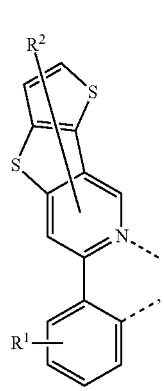
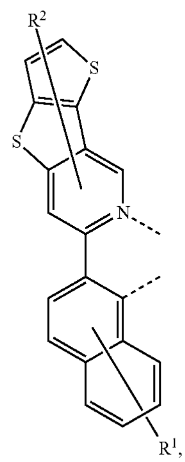
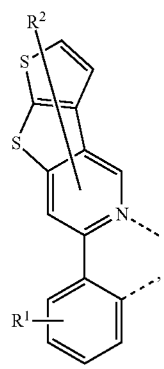
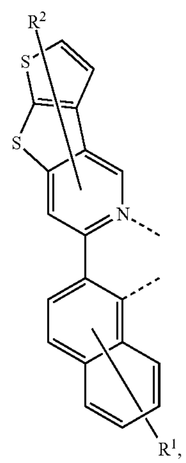
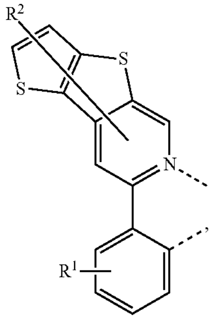
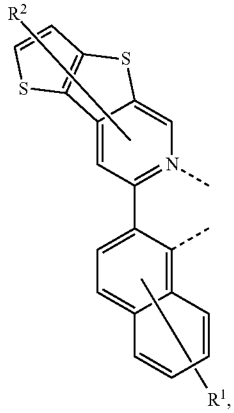
-continued
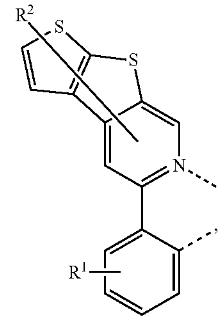
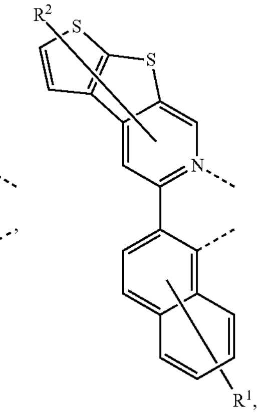
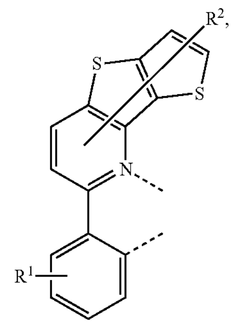
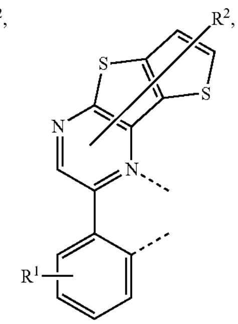
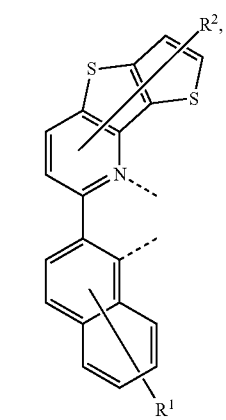
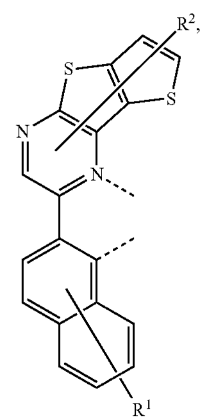
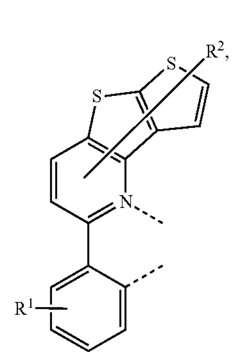
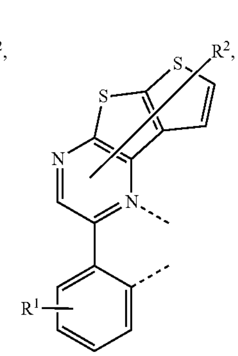

-continued

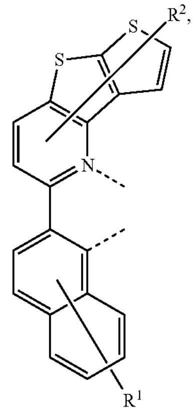

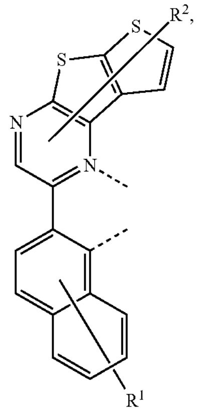

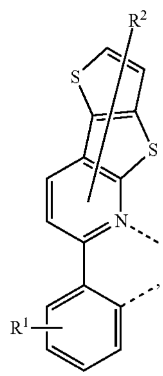

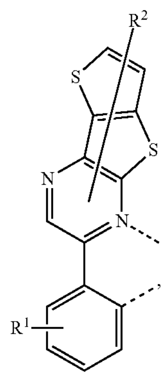

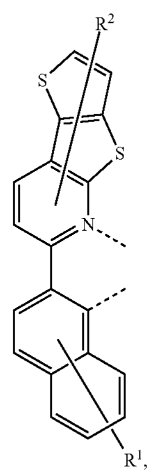

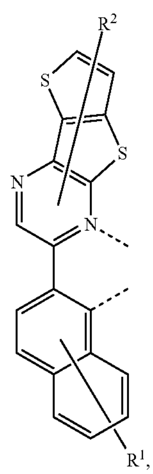

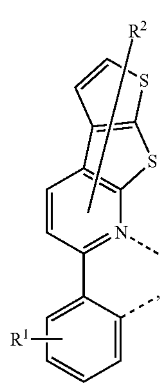

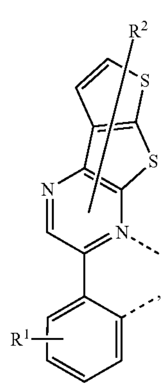

-continued

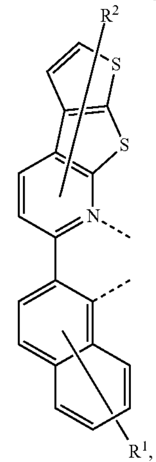

and

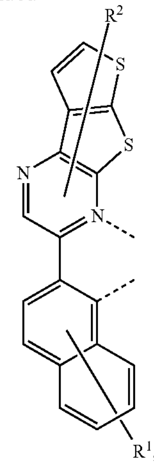

wherein each $R^1$ and $R^2$ is a hydrogen or a substituent selected independently from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof.

12. The compound of claim 1, wherein the ligand $L_A$ is selected from the group consisting of:

$L_{A1}$ through $L_{A3}$ are based on a structure of Formula IV,

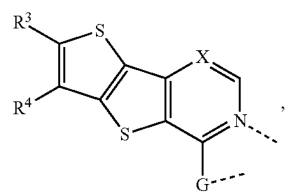

in which $R^3$, $R^4$, X and G are defined as:

| Ligand | $R^3$ | $R^4$ | G | X |
|---|---|---|---|---|
| $L_{A1}$ | H | H | $R^{C1}$ | C |
| $L_{A2}$ | $R^{B1}$ | H | $R^{C1}$ | C |
| $L_{A3}$ | $R^{B3}$ | H | $R^{C1}$ | C |
| $L_{A4}$ | $R^{B4}$ | H | $R^{C1}$ | C |
| $L_{A5}$ | $R^{B5}$ | H | $R^{C1}$ | C |
| $L_{A6}$ | $R^{B7}$ | H | $R^{C1}$ | C |
| $L_{A7}$ | $R^{A3}$ | H | $R^{C1}$ | C |
| $L_{A8}$ | $R^{A34}$ | H | $R^{C1}$ | C |
| $L_{A9}$ | $R^{A57}$ | H | $R^{C1}$ | C |
| $L_{A10}$ | H | $R^{B1}$ | $R^{C1}$ | C |
| $L_{A11}$ | H | $R^{B3}$ | $R^{C1}$ | C |
| $L_{A12}$ | H | $R^{B4}$ | $R^{C1}$ | C |
| $L_{A13}$ | H | $R^{B5}$ | $R^{C1}$ | C |
| $L_{A14}$ | H | $R^{B7}$ | $R^{C1}$ | C |
| $L_{A15}$ | H | $R^{A3}$ | $R^{C1}$ | C |
| $L_{A16}$ | H | $R^{A34}$ | $R^{C1}$ | C |
| $L_{A17}$ | H | $R^{A57}$ | $R^{C1}$ | C |
| $L_{A18}$ | $R^{B1}$ | $R^{B1}$ | $R^{C1}$ | C |
| $L_{A19}$ | $R^{B3}$ | $R^{B3}$ | $R^{C1}$ | C |
| $L_{A20}$ | $R^{B4}$ | $R^{B4}$ | $R^{C1}$ | C |
| $L_{A21}$ | $R^{B5}$ | $R^{B5}$ | $R^{C1}$ | C |
| $L_{A22}$ | $R^{B7}$ | $R^{B7}$ | $R^{C1}$ | C |
| $L_{A23}$ | $R^{A3}$ | $R^{A3}$ | $R^{C1}$ | C |
| $L_{A24}$ | $R^{A34}$ | $R^{A34}$ | $R^{C1}$ | C |
| $L_{A25}$ | $R^{A57}$ | $R^{A57}$ | $R^{C1}$ | C |
| $L_{A26}$ | $R^{B3}$ | $R^{B1}$ | $R^{C1}$ | C |

-continued

| Ligand | $R^3$ | $R^4$ | G | X |
|---|---|---|---|---|
| $L_{A27}$ | $R^{B4}$ | $R^{B1}$ | $R^{C1}$ | C |
| $L_{A28}$ | $R^{B5}$ | $R^{B1}$ | $R^{C1}$ | C |
| $L_{A29}$ | $R^{B7}$ | $R^{B1}$ | $R^{C1}$ | C |
| $L_{A30}$ | $R^{A3}$ | $R^{B1}$ | $R^{C1}$ | C |
| $L_{A31}$ | $R^{A34}$ | $R^{B1}$ | $R^{C1}$ | C |
| $L_{A32}$ | $R^{A57}$ | $R^{B1}$ | $R^{C1}$ | C |
| $L_{A33}$ | $R^{B1}$ | $R^{B3}$ | $R^{C1}$ | C |
| $L_{A34}$ | $R^{B1}$ | $R^{B4}$ | $R^{C1}$ | C |
| $L_{A35}$ | $R^{B1}$ | $R^{B5}$ | $R^{C1}$ | C |
| $L_{A36}$ | $R^{B1}$ | $R^{B7}$ | $R^{C1}$ | C |
| $L_{A37}$ | $R^{B1}$ | $R^{A3}$ | $R^{C1}$ | C |
| $L_{A38}$ | $R^{B1}$ | $R^{A34}$ | $R^{C1}$ | C |
| $L_{A39}$ | $R^{B1}$ | $R^{A57}$ | $R^{C1}$ | C |
| $L_{A40}$ | $R^{B1}$ | H | $R^{C2}$ | C |
| $L_{A41}$ | $R^{B3}$ | H | $R^{C2}$ | C |
| $L_{A42}$ | $R^{B4}$ | H | $R^{C2}$ | C |
| $L_{A43}$ | $R^{B5}$ | H | $R^{C2}$ | C |
| $L_{A44}$ | $R^{B7}$ | H | $R^{C2}$ | C |
| $L_{A45}$ | $R^{A3}$ | H | $R^{C2}$ | C |
| $L_{A46}$ | $R^{A34}$ | H | $R^{C2}$ | C |
| $L_{A47}$ | $R^{A57}$ | H | $R^{C2}$ | C |
| $L_{A48}$ | H | $R^{B1}$ | $R^{C2}$ | C |
| $L_{A49}$ | H | $R^{B3}$ | $R^{C2}$ | C |
| $L_{A50}$ | H | $R^{B4}$ | $R^{C2}$ | C |
| $L_{A51}$ | H | $R^{B5}$ | $R^{C2}$ | C |
| $L_{A52}$ | H | $R^{B7}$ | $R^{C2}$ | C |
| $L_{A53}$ | H | $R^{A3}$ | $R^{C2}$ | C |
| $L_{A54}$ | H | $R^{A34}$ | $R^{C2}$ | C |
| $L_{A55}$ | H | $R^{A57}$ | $R^{C2}$ | C |
| $L_{A56}$ | $R^{B1}$ | $R^{B1}$ | $R^{C2}$ | C |
| $L_{A57}$ | $R^{B3}$ | $R^{B3}$ | $R^{C2}$ | C |
| $L_{A58}$ | $R^{B4}$ | $R^{B4}$ | $R^{C2}$ | C |
| $L_{A59}$ | $R^{B5}$ | $R^{B5}$ | $R^{C2}$ | C |
| $L_{A60}$ | $R^{B7}$ | $R^{B7}$ | $R^{C2}$ | C |
| $L_{A61}$ | $R^{A3}$ | $R^{A3}$ | $R^{C2}$ | C |
| $L_{A62}$ | $R^{A34}$ | $R^{A34}$ | $R^{C2}$ | C |
| $L_{A63}$ | $R^{A57}$ | $R^{A57}$ | $R^{C2}$ | C |
| $L_{A64}$ | $R^{B3}$ | $R^{B1}$ | $R^{C2}$ | C |
| $L_{A65}$ | $R^{B4}$ | $R^{B1}$ | $R^{C2}$ | C |
| $L_{A66}$ | $R^{B5}$ | $R^{B1}$ | $R^{C2}$ | C |
| $L_{A67}$ | $R^{B7}$ | $R^{B1}$ | $R^{C2}$ | C |
| $L_{A68}$ | $R^{A3}$ | $R^{B1}$ | $R^{C2}$ | C |
| $L_{A69}$ | $R^{A34}$ | $R^{B1}$ | $R^{C2}$ | C |
| $L_{A70}$ | $R^{A57}$ | $R^{B1}$ | $R^{C2}$ | C |
| $L_{A71}$ | $R^{B1}$ | $R^{B3}$ | $R^{C2}$ | C |
| $L_{A72}$ | $R^{B1}$ | $R^{B4}$ | $R^{C2}$ | C |
| $L_{A73}$ | $R^{B1}$ | $R^{B5}$ | $R^{C2}$ | C |
| $L_{A74}$ | $R^{B1}$ | $R^{B7}$ | $R^{C2}$ | C |
| $L_{A75}$ | $R^{B1}$ | $R^{A3}$ | $R^{C2}$ | C |
| $L_{A76}$ | $R^{B1}$ | $R^{A34}$ | $R^{C2}$ | C |
| $L_{A77}$ | $R^{B1}$ | $R^{A57}$ | $R^{C2}$ | C |
| $L_{A78}$ | $R^{B1}$ | H | $R^{C3}$ | C |
| $L_{A79}$ | $R^{B3}$ | H | $R^{C3}$ | C |
| $L_{A80}$ | $R^{B4}$ | H | $R^{C3}$ | C |
| $L_{A81}$ | $R^{B5}$ | H | $R^{C3}$ | C |
| $L_{A82}$ | $R^{B7}$ | H | $R^{C3}$ | C |
| $L_{A83}$ | $R^{A3}$ | H | $R^{C3}$ | C |
| $L_{A84}$ | $R^{A34}$ | H | $R^{C3}$ | C |
| $L_{A85}$ | $R^{A57}$ | H | $R^{C3}$ | C |
| $L_{A86}$ | H | $R^{B1}$ | $R^{C3}$ | C |
| $L_{A97}$ | H | $R^{B3}$ | $R^{C3}$ | C |
| $L_{A88}$ | H | $R^{B4}$ | $R^{C3}$ | C |
| $L_{A89}$ | H | $R^{B5}$ | $R^{C3}$ | C |
| $L_{A90}$ | H | $R^{B7}$ | $R^{C3}$ | C |
| $L_{A91}$ | H | $R^{A3}$ | $R^{C3}$ | C |
| $L_{A92}$ | H | $R^{A34}$ | $R^{C3}$ | C |
| $L_{A93}$ | H | $R^{A57}$ | $R^{C3}$ | C |
| $L_{A94}$ | $R^{B1}$ | $R^{B1}$ | $R^{C3}$ | C |
| $L_{A95}$ | $R^{B3}$ | $R^{B3}$ | $R^{C3}$ | C |
| $L_{A96}$ | $R^{B4}$ | $R^{B4}$ | $R^{C3}$ | C |
| $L_{A97}$ | $R^{B5}$ | $R^{B5}$ | $R^{C3}$ | C |
| $L_{A98}$ | $R^{B7}$ | $R^{B7}$ | $R^{C3}$ | C |
| $L_{A99}$ | $R^{A3}$ | $R^{A3}$ | $R^{C3}$ | C |
| $L_{A100}$ | $R^{A34}$ | $R^{A34}$ | $R^{C3}$ | C |
| $L_{A101}$ | $R^{A57}$ | $R^{A57}$ | $R^{C3}$ | C |
| $L_{A102}$ | $R^{B3}$ | $R^{B1}$ | $R^{C3}$ | C |
| $L_{A103}$ | $R^{B4}$ | $R^{B1}$ | $R^{C3}$ | C |

-continued

| Ligand | $R^3$ | $R^4$ | G | X |
|---|---|---|---|---|
| $L_{A104}$ | $R^{B5}$ | $R^{B1}$ | $R^{C3}$ | C |
| $L_{A105}$ | $R^{B7}$ | $R^{B1}$ | $R^{C3}$ | C |
| $L_{A106}$ | $R^{A3}$ | $R^{B1}$ | $R^{C3}$ | C |
| $L_{A107}$ | $R^{A34}$ | $R^{B1}$ | $R^{C3}$ | C |
| $L_{A108}$ | $R^{A57}$ | $R^{B1}$ | $R^{C3}$ | C |
| $L_{A109}$ | $R^{B1}$ | $R^{B3}$ | $R^{C3}$ | C |
| $L_{A110}$ | $R^{B1}$ | $R^{B4}$ | $R^{C3}$ | C |
| $L_{A111}$ | $R^{B1}$ | $R^{B5}$ | $R^{C3}$ | C |
| $L_{A112}$ | $R^{B1}$ | $R^{B7}$ | $R^{C3}$ | C |
| $L_{A113}$ | $R^{B1}$ | $R^{A3}$ | $R^{C3}$ | C |
| $L_{A114}$ | $R^{B1}$ | $R^{A34}$ | $R^{C3}$ | C |
| $L_{A115}$ | H | H | $R^{C3}$ | C |
| $L_{A116}$ | $R^{B1}$ | H | $R^{C8}$ | C |
| $L_{A117}$ | $R^{B3}$ | H | $R^{C8}$ | C |
| $L_{A118}$ | $R^{B4}$ | H | $R^{C8}$ | C |
| $L_{A119}$ | $R^{B5}$ | H | $R^{C8}$ | C |
| $L_{A120}$ | $R^{B7}$ | H | $R^{C8}$ | C |
| $L_{A121}$ | $R^{A3}$ | H | $R^{C8}$ | C |
| $L_{A122}$ | $R^{A34}$ | H | $R^{C8}$ | C |
| $L_{A123}$ | $R^{A57}$ | H | $R^{C8}$ | C |
| $L_{A124}$ | H | $R^{B1}$ | $R^{C8}$ | C |
| $L_{A125}$ | H | $R^{B3}$ | $R^{C8}$ | C |
| $L_{A126}$ | H | $R^{B4}$ | $R^{C8}$ | C |
| $L_{A127}$ | H | $R^{B5}$ | $R^{C8}$ | C |
| $L_{A128}$ | H | $R^{B7}$ | $R^{C8}$ | C |
| $L_{A129}$ | H | $R^{A3}$ | $R^{C8}$ | C |
| $L_{A130}$ | H | $R^{A34}$ | $R^{C8}$ | C |
| $L_{A131}$ | H | $R^{A57}$ | $R^{C8}$ | C |
| $L_{A132}$ | $R^{B1}$ | $R^{B1}$ | $R^{C8}$ | C |
| $L_{A133}$ | $R^{B3}$ | $R^{B3}$ | $R^{C8}$ | C |
| $L_{A134}$ | $R^{B4}$ | $R^{B4}$ | $R^{C8}$ | C |
| $L_{A135}$ | $R^{B5}$ | $R^{B5}$ | $R^{C8}$ | C |
| $L_{A136}$ | $R^{B7}$ | $R^{B7}$ | $R^{C8}$ | C |
| $L_{A137}$ | $R^{A3}$ | $R^{A3}$ | $R^{C8}$ | C |
| $L_{A138}$ | $R^{A34}$ | $R^{A34}$ | $R^{C8}$ | C |
| $L_{A139}$ | $R^{A57}$ | $R^{A57}$ | $R^{C8}$ | C |
| $L_{A140}$ | $R^{B3}$ | $R^{B1}$ | $R^{C8}$ | C |
| $L_{A141}$ | $R^{B4}$ | $R^{B1}$ | $R^{C8}$ | C |
| $L_{A142}$ | $R^{B5}$ | $R^{B1}$ | $R^{C8}$ | C |
| $L_{A143}$ | $R^{B7}$ | $R^{B1}$ | $R^{C8}$ | C |
| $L_{A144}$ | $R^{A3}$ | $R^{B1}$ | $R^{C8}$ | C |
| $L_{A145}$ | $R^{A34}$ | $R^{B1}$ | $R^{C8}$ | C |
| $L_{A146}$ | $R^{A57}$ | $R^{B1}$ | $R^{C8}$ | C |
| $L_{A147}$ | $R^{B1}$ | $R^{B3}$ | $R^{C8}$ | C |
| $L_{A148}$ | $R^{B1}$ | $R^{B4}$ | $R^{C8}$ | C |
| $L_{A149}$ | $R^{B1}$ | $R^{B5}$ | $R^{C8}$ | C |
| $L_{A150}$ | $R^{B1}$ | $R^{B7}$ | $R^{C8}$ | C |
| $L_{A151}$ | $R^{B1}$ | $R^{A3}$ | $R^{C8}$ | C |
| $L_{A152}$ | $R^{B1}$ | $R^{A34}$ | $R^{C8}$ | C |
| $L_{A153}$ | $R^{B1}$ | $R^{A57}$ | $R^{C8}$ | C |
| $L_{A154}$ | $R^{B1}$ | H | $R^{C9}$ | C |
| $L_{A155}$ | $R^{B3}$ | H | $R^{C9}$ | C |
| $L_{A156}$ | $R^{B4}$ | H | $R^{C9}$ | C |
| $L_{A157}$ | $R^{B5}$ | H | $R^{C9}$ | C |
| $L_{A158}$ | $R^{B7}$ | H | $R^{C9}$ | C |
| $L_{A159}$ | $R^{A3}$ | H | $R^{C9}$ | C |
| $L_{A160}$ | $R^{A34}$ | H | $R^{C9}$ | C |
| $L_{A161}$ | $R^{A57}$ | H | $R^{C9}$ | C |
| $L_{A162}$ | H | $R^{B1}$ | $R^{C9}$ | C |
| $L_{A163}$ | H | $R^{B3}$ | $R^{C9}$ | C |
| $L_{A164}$ | H | $R^{B4}$ | $R^{C9}$ | C |
| $L_{A165}$ | H | $R^{B5}$ | $R^{C9}$ | C |
| $L_{A166}$ | H | $R^{B7}$ | $R^{C9}$ | C |
| $L_{A167}$ | H | $R^{A3}$ | $R^{C9}$ | C |
| $L_{A168}$ | H | $R^{A34}$ | $R^{C9}$ | C |
| $L_{A169}$ | H | $R^{A57}$ | $R^{C9}$ | C |
| $L_{A170}$ | $R^{B1}$ | $R^{B1}$ | $R^{C9}$ | C |
| $L_{A171}$ | $R^{B3}$ | $R^{B3}$ | $R^{C9}$ | C |
| $L_{A172}$ | $R^{B4}$ | $R^{B4}$ | $R^{C9}$ | C |
| $L_{A173}$ | $R^{B5}$ | $R^{B5}$ | $R^{C9}$ | C |
| $L_{A174}$ | $R^{B7}$ | $R^{B7}$ | $R^{C9}$ | C |
| $L_{A175}$ | $R^{A3}$ | $R^{A3}$ | $R^{C9}$ | C |
| $L_{A176}$ | $R^{A34}$ | $R^{A34}$ | $R^{C9}$ | C |
| $L_{A177}$ | $R^{A57}$ | $R^{A57}$ | $R^{C9}$ | C |
| $L_{A178}$ | $R^{B3}$ | $R^{B1}$ | $R^{C9}$ | C |
| $L_{A179}$ | $R^{B4}$ | $R^{B1}$ | $R^{C9}$ | C |
| $L_{A180}$ | $R^{B5}$ | $R^{B1}$ | $R^{C9}$ | C |

-continued

| Ligand | $R^3$ | $R^4$ | G | X |
|---|---|---|---|---|
| $L_{A181}$ | $R^{B7}$ | $R^{B1}$ | $R^{C9}$ | C |
| $L_{A182}$ | $R^{A3}$ | $R^{B1}$ | $R^{C9}$ | C |
| $L_{A183}$ | $R^{A34}$ | $R^{B1}$ | $R^{C9}$ | C |
| $L_{A184}$ | $R^{A57}$ | $R^{B1}$ | $R^{C9}$ | C |
| $L_{A185}$ | $R^{B1}$ | $R^{B3}$ | $R^{C9}$ | C |
| $L_{A186}$ | $R^{B1}$ | $R^{B4}$ | $R^{C9}$ | C |
| $L_{A187}$ | $R^{B1}$ | $R^{B5}$ | $R^{C9}$ | C |
| $L_{A188}$ | $R^{B1}$ | $R^{B7}$ | $R^{C9}$ | C |
| $L_{A189}$ | $R^{B1}$ | $R^{A3}$ | $R^{C9}$ | C |
| $L_{A190}$ | $R^{B1}$ | $R^{A34}$ | $R^{C9}$ | C |
| $L_{A191}$ | $R^{B1}$ | $R^{A57}$ | $R^{C9}$ | C |
| $L_{A192}$ | $R^{B1}$ | H | $R^{C1}$ | N |
| $L_{A193}$ | $R^{B3}$ | H | $R^{C1}$ | N |
| $L_{A194}$ | $R^{B4}$ | H | $R^{C1}$ | N |
| $L_{A195}$ | $R^{B5}$ | H | $R^{C1}$ | N |
| $L_{A196}$ | $R^{B7}$ | H | $R^{C1}$ | N |
| $L_{A197}$ | $R^{A3}$ | H | $R^{C1}$ | N |
| $L_{A198}$ | $R^{A34}$ | H | $R^{C1}$ | N |
| $L_{A199}$ | $R^{A57}$ | H | $R^{C1}$ | N |
| $L_{A200}$ | H | $R^{B1}$ | $R^{C1}$ | N |
| $L_{A201}$ | H | $R^{B3}$ | $R^{C1}$ | N |
| $L_{A202}$ | H | $R^{B4}$ | $R^{C1}$ | N |
| $L_{A203}$ | H | $R^{B5}$ | $R^{C1}$ | N |
| $L_{A204}$ | H | $R^{B7}$ | $R^{C1}$ | N |
| $L_{A205}$ | H | $R^{A3}$ | $R^{C1}$ | N |
| $L_{A206}$ | H | $R^{A34}$ | $R^{C1}$ | N |
| $L_{A207}$ | H | $R^{A57}$ | $R^{C1}$ | N |
| $L_{A208}$ | $R^{B1}$ | $R^{B1}$ | $R^{C1}$ | N |
| $L_{A209}$ | $R^{B3}$ | $R^{B3}$ | $R^{C1}$ | N |
| $L_{A210}$ | $R^{B4}$ | $R^{B4}$ | $R^{C1}$ | N |
| $L_{A211}$ | $R^{B5}$ | $R^{B5}$ | $R^{C1}$ | N |
| $L_{A212}$ | $R^{B7}$ | $R^{B7}$ | $R^{C1}$ | N |
| $L_{A213}$ | $R^{A3}$ | $R^{A3}$ | $R^{C1}$ | N |
| $L_{A214}$ | $R^{A34}$ | $R^{A34}$ | $R^{C1}$ | N |
| $L_{A215}$ | $R^{A57}$ | $R^{A57}$ | $R^{C1}$ | N |
| $L_{A216}$ | $R^{B3}$ | $R^{B1}$ | $R^{C1}$ | N |
| $L_{A217}$ | $R^{B4}$ | $R^{B1}$ | $R^{C1}$ | N |
| $L_{A218}$ | $R^{B5}$ | $R^{B1}$ | $R^{C1}$ | N |
| $L_{A219}$ | $R^{B7}$ | $R^{B1}$ | $R^{C1}$ | N |
| $L_{A220}$ | $R^{A3}$ | $R^{B1}$ | $R^{C1}$ | N |
| $L_{A221}$ | $R^{A34}$ | $R^{B1}$ | $R^{C1}$ | N |
| $L_{A222}$ | $R^{A57}$ | $R^{B1}$ | $R^{C1}$ | N |
| $L_{A223}$ | $R^{B1}$ | $R^{B3}$ | $R^{C1}$ | N |
| $L_{A224}$ | $R^{B1}$ | $R^{B4}$ | $R^{C1}$ | N |
| $L_{A225}$ | $R^{B1}$ | $R^{B5}$ | $R^{C1}$ | N |
| $L_{A226}$ | $R^{B1}$ | $R^{B7}$ | $R^{C1}$ | N |
| $L_{A227}$ | $R^{B1}$ | $R^{A3}$ | $R^{C1}$ | N |
| $L_{A228}$ | $R^{B1}$ | $R^{A34}$ | $R^{C1}$ | N |
| $L_{A229}$ | $R^{B1}$ | $R^{A57}$ | $R^{C1}$ | N |
| $L_{A230}$ | $R^{B1}$ | H | $R^{C2}$ | N |
| $L_{A231}$ | $R^{B3}$ | H | $R^{C2}$ | N |
| $L_{A232}$ | $R^{B4}$ | H | $R^{C2}$ | N |
| $L_{A233}$ | $R^{B5}$ | H | $R^{C2}$ | N |
| $L_{A234}$ | $R^{B7}$ | H | $R^{C2}$ | N |
| $L_{A235}$ | $R^{A3}$ | H | $R^{C2}$ | N |
| $L_{A236}$ | $R^{A34}$ | H | $R^{C2}$ | N |
| $L_{A237}$ | $R^{A57}$ | H | $R^{C2}$ | N |
| $L_{A238}$ | H | $R^{B1}$ | $R^{C2}$ | N |
| $L_{A239}$ | H | $R^{B3}$ | $R^{C2}$ | N |
| $L_{A240}$ | H | $R^{B4}$ | $R^{C2}$ | N |
| $L_{A241}$ | H | $R^{B5}$ | $R^{C2}$ | N |
| $L_{A242}$ | H | $R^{B7}$ | $R^{C2}$ | N |
| $L_{A243}$ | H | $R^{A3}$ | $R^{C2}$ | N |
| $L_{A244}$ | H | $R^{A34}$ | $R^{C2}$ | N |
| $L_{A245}$ | H | $R^{A57}$ | $R^{C2}$ | N |
| $L_{A246}$ | $R^{B1}$ | $R^{B1}$ | $R^{C2}$ | N |
| $L_{A247}$ | $R^{B3}$ | $R^{B3}$ | $R^{C2}$ | N |
| $L_{A248}$ | $R^{B4}$ | $R^{B4}$ | $R^{C2}$ | N |
| $L_{A249}$ | $R^{B5}$ | $R^{B5}$ | $R^{C2}$ | N |
| $L_{A250}$ | $R^{B7}$ | $R^{B7}$ | $R^{C2}$ | N |
| $L_{A251}$ | $R^{A3}$ | $R^{A3}$ | $R^{C2}$ | N |
| $L_{A252}$ | $R^{A34}$ | $R^{A34}$ | $R^{C2}$ | N |
| $L_{A253}$ | $R^{A57}$ | $R^{A57}$ | $R^{C2}$ | N |
| $L_{A254}$ | $R^{B3}$ | $R^{B1}$ | $R^{C2}$ | N |
| $L_{A255}$ | $R^{B4}$ | $R^{B1}$ | $R^{C2}$ | N |
| $L_{A256}$ | $R^{B5}$ | $R^{B1}$ | $R^{C2}$ | N |
| $L_{A257}$ | $R^{B7}$ | $R^{B1}$ | $R^{C2}$ | N |
| $L_{A258}$ | $R^{A3}$ | $R^{B1}$ | $R^{C2}$ | N |
| $L_{A259}$ | $R^{A34}$ | $R^{B1}$ | $R^{C2}$ | N |
| $L_{A260}$ | $R^{A57}$ | $R^{B1}$ | $R^{C2}$ | N |
| $L_{A261}$ | $R^{B1}$ | $R^{B3}$ | $R^{C2}$ | N |
| $L_{A262}$ | $R^{B1}$ | $R^{B4}$ | $R^{C2}$ | N |
| $L_{A263}$ | $R^{B1}$ | $R^{B5}$ | $R^{C2}$ | N |
| $L_{A264}$ | $R^{B1}$ | $R^{B7}$ | $R^{C2}$ | N |
| $L_{A265}$ | $R^{B1}$ | $R^{A3}$ | $R^{C2}$ | N |
| $L_{A266}$ | $R^{B1}$ | $R^{A34}$ | $R^{C2}$ | N |
| $L_{A267}$ | $R^{B1}$ | $R^{A57}$ | $R^{C2}$ | N |
| $L_{A268}$ | $R^{B1}$ | H | $R^{C3}$ | N |
| $L_{A269}$ | $R^{B3}$ | H | $R^{C3}$ | N |
| $L_{A270}$ | $R^{B4}$ | H | $R^{C3}$ | N |
| $L_{A271}$ | $R^{B5}$ | H | $R^{C3}$ | N |
| $L_{A272}$ | $R^{B7}$ | H | $R^{C3}$ | N |
| $L_{A273}$ | $R^{A3}$ | H | $R^{C3}$ | N |
| $L_{A274}$ | $R^{A34}$ | H | $R^{C3}$ | N |
| $L_{A275}$ | $R^{A57}$ | H | $R^{C3}$ | N |
| $L_{A276}$ | H | $R^{B1}$ | $R^{C3}$ | N |
| $L_{A277}$ | H | $R^{B3}$ | $R^{C3}$ | N |
| $L_{A278}$ | H | $R^{B4}$ | $R^{C3}$ | N |
| $L_{A279}$ | H | $R^{B5}$ | $R^{C3}$ | N |
| $L_{A280}$ | H | $R^{B7}$ | $R^{C3}$ | N |
| $L_{A281}$ | H | $R^{A3}$ | $R^{C3}$ | N |
| $L_{A282}$ | H | $R^{A34}$ | $R^{C3}$ | N |
| $L_{A283}$ | H | $R^{A57}$ | $R^{C3}$ | N |
| $L_{A284}$ | $R^{B1}$ | $R^{B1}$ | $R^{C3}$ | N |
| $L_{A285}$ | $R^{B3}$ | $R^{B3}$ | $R^{C3}$ | N |
| $L_{A286}$ | $R^{B4}$ | $R^{B4}$ | $R^{C3}$ | N |
| $L_{A287}$ | $R^{B5}$ | $R^{B5}$ | $R^{C3}$ | N |
| $L_{A288}$ | $R^{B7}$ | $R^{B7}$ | $R^{C3}$ | N |
| $L_{A289}$ | $R^{A3}$ | $R^{A3}$ | $R^{C3}$ | N |
| $L_{A290}$ | $R^{A34}$ | $R^{A34}$ | $R^{C3}$ | N |
| $L_{A291}$ | $R^{A57}$ | $R^{A57}$ | $R^{C3}$ | N |
| $L_{A292}$ | $R^{B3}$ | $R^{B1}$ | $R^{C3}$ | N |
| $L_{A293}$ | $R^{B4}$ | $R^{B1}$ | $R^{C3}$ | N |
| $L_{A294}$ | $R^{B5}$ | $R^{B1}$ | $R^{C3}$ | N |
| $L_{A295}$ | $R^{B7}$ | $R^{B1}$ | $R^{C3}$ | N |
| $L_{A296}$ | $R^{A3}$ | $R^{B1}$ | $R^{C3}$ | N |
| $L_{A297}$ | $R^{A34}$ | $R^{B1}$ | $R^{C3}$ | N |
| $L_{A298}$ | $R^{A57}$ | $R^{B1}$ | $R^{C3}$ | N |
| $L_{A299}$ | $R^{B1}$ | $R^{B3}$ | $R^{C3}$ | N |
| $L_{A300}$ | $R^{B1}$ | $R^{B4}$ | $R^{C3}$ | N |
| $L_{A301}$ | $R^{B1}$ | $R^{B5}$ | $R^{C3}$ | N |
| $L_{A302}$ | $R^{B1}$ | $R^{B7}$ | $R^{C3}$ | N |
| $L_{A303}$ | $R^{B1}$ | $R^{A3}$ | $R^{C3}$ | N |
| $L_{A304}$ | $R^{B1}$ | $R^{A34}$ | $R^{C3}$ | N |
| $L_{A305}$ | $R^{B1}$ | $R^{A57}$ | $R^{C3}$ | N |
| $L_{A306}$ | $R^{B1}$ | H | $R^{C8}$ | N |
| $L_{A307}$ | $R^{B3}$ | H | $R^{C8}$ | N |
| $L_{A309}$ | $R^{B4}$ | H | $R^{C8}$ | N |
| $L_{A309}$ | $R^{B5}$ | H | $R^{C8}$ | N |
| $L_{A310}$ | $R^{B7}$ | H | $R^{C8}$ | N |
| $L_{A311}$ | $R^{A3}$ | H | $R^{C8}$ | N |
| $L_{A312}$ | $R^{A34}$ | H | $R^{C8}$ | N |
| $L_{A313}$ | $R^{A57}$ | H | $R^{C8}$ | N |
| $L_{A314}$ | H | $R^{B1}$ | $R^{C8}$ | N |
| $L_{A315}$ | H | $R^{B3}$ | $R^{C8}$ | N |
| $L_{A316}$ | H | $R^{B4}$ | $R^{C8}$ | N |
| $L_{A317}$ | H | $R^{B5}$ | $R^{C8}$ | N |
| $L_{A318}$ | H | $R^{B7}$ | $R^{C8}$ | N |
| $L_{A319}$ | H | $R^{A3}$ | $R^{C8}$ | N |
| $L_{A320}$ | H | $R^{A34}$ | $R^{C8}$ | N |
| $L_{A321}$ | H | $R^{A57}$ | $R^{C8}$ | N |
| $L_{A322}$ | $R^{B1}$ | $R^{B1}$ | $R^{C8}$ | N |
| $L_{A323}$ | $R^{B3}$ | $R^{B3}$ | $R^{C8}$ | N |
| $L_{A324}$ | $R^{B4}$ | $R^{B4}$ | $R^{C8}$ | N |
| $L_{A325}$ | $R^{B5}$ | $R^{B5}$ | $R^{C8}$ | N |
| $L_{A326}$ | $R^{B7}$ | $R^{B7}$ | $R^{C8}$ | N |
| $L_{A327}$ | $R^{A3}$ | $R^{A3}$ | $R^{C8}$ | N |
| $L_{A328}$ | $R^{A34}$ | $R^{A34}$ | $R^{C8}$ | N |
| $L_{A329}$ | $R^{A57}$ | $R^{A57}$ | $R^{C8}$ | N |
| $L_{A330}$ | $R^{B3}$ | $R^{B1}$ | $R^{C8}$ | N |
| $L_{A331}$ | $R^{B4}$ | $R^{B1}$ | $R^{C8}$ | N |
| $L_{A332}$ | $R^{B5}$ | $R^{B1}$ | $R^{C8}$ | N |
| $L_{A333}$ | $R^{B7}$ | $R^{B1}$ | $R^{C8}$ | N |
| $L_{A334}$ | $R^{A3}$ | $R^{B1}$ | $R^{C8}$ | N |

-continued

| Ligand | $R^3$ | $R^4$ | G | X |
|---|---|---|---|---|
| $L_{A4335}$ | $R^{A34}$ | $R^{B1}$ | $R^{C8}$ | N |
| $L_{A4336}$ | $R^{A57}$ | $R^{B1}$ | $R^{C8}$ | N |
| $L_{A4337}$ | $R^{B1}$ | $R^{B3}$ | $R^{C8}$ | N |
| $L_{A4338}$ | $R^{B1}$ | $R^{B4}$ | $R^{C8}$ | N |
| $L_{A4339}$ | $R^{B1}$ | $R^{B5}$ | $R^{C8}$ | N |
| $L_{A4340}$ | $R^{B1}$ | $R^{B7}$ | $R^{C8}$ | N |
| $L_{A4341}$ | $R^{B1}$ | $R^{A3}$ | $R^{C8}$ | N |
| $L_{A4342}$ | $R^{B1}$ | $R^{A34}$ | $R^{C8}$ | N |
| $L_{A4343}$ | $R^{B1}$ | $R^{A57}$ | $R^{C8}$ | N |
| $L_{A4344}$ | $R^{B1}$ | H | $R^{C9}$ | N |
| $L_{A4345}$ | $R^{B3}$ | H | $R^{C9}$ | N |
| $L_{A4346}$ | $R^{B4}$ | H | $R^{C9}$ | N |
| $L_{A4347}$ | $R^{B5}$ | H | $R^{C9}$ | N |
| $L_{A4348}$ | $R^{B7}$ | H | $R^{C9}$ | N |
| $L_{A4349}$ | $R^{A3}$ | H | $R^{C9}$ | N |
| $L_{A4350}$ | $R^{A34}$ | H | $R^{C9}$ | N |
| $L_{A4351}$ | $R^{A57}$ | H | $R^{C9}$ | N |
| $L_{A4352}$ | H | $R^{B1}$ | $R^{C9}$ | N |
| $L_{A4353}$ | H | $R^{B3}$ | $R^{C9}$ | N |
| $L_{A4354}$ | H | $R^{B4}$ | $R^{C9}$ | N |
| $L_{A4355}$ | H | $R^{B5}$ | $R^{C9}$ | N |
| $L_{A4356}$ | H | $R^{B7}$ | $R^{C9}$ | N |
| $L_{A4357}$ | H | $R^{A3}$ | $R^{C9}$ | N |
| $L_{A4358}$ | H | $R^{A34}$ | $R^{C9}$ | N |
| $L_{A4359}$ | H | $R^{A57}$ | $R^{C9}$ | N |
| $L_{A4360}$ | $R^{B1}$ | $R^{B1}$ | $R^{C9}$ | N |
| $L_{A4361}$ | $R^{B3}$ | $R^{B3}$ | $R^{C9}$ | N |
| $L_{A4362}$ | $R^{B4}$ | $R^{B4}$ | $R^{C9}$ | N |
| $L_{A4363}$ | $R^{B5}$ | $R^{B5}$ | $R^{C9}$ | N |
| $L_{A4364}$ | $R^{B7}$ | $R^{B7}$ | $R^{C9}$ | N |
| $L_{A4365}$ | $R^{A3}$ | $R^{A3}$ | $R^{C9}$ | N |
| $L_{A4366}$ | $R^{A34}$ | $R^{A34}$ | $R^{C9}$ | N |
| $L_{A4367}$ | $R^{A57}$ | $R^{A57}$ | $R^{C9}$ | N |
| $L_{A4368}$ | $R^{B3}$ | $R^{B1}$ | $R^{C9}$ | N |
| $L_{A4369}$ | $R^{B4}$ | $R^{B1}$ | $R^{C9}$ | N |
| $L_{A4370}$ | $R^{B5}$ | $R^{B1}$ | $R^{C9}$ | N |
| $L_{A4371}$ | $R^{B7}$ | $R^{B1}$ | $R^{C9}$ | N |
| $L_{A4372}$ | $R^{A3}$ | $R^{B1}$ | $R^{C9}$ | N |
| $L_{A4373}$ | $R^{A34}$ | $R^{B1}$ | $R^{C9}$ | N |
| $L_{A4374}$ | $R^{A57}$ | $R^{B1}$ | $R^{C9}$ | N |
| $L_{A4375}$ | $R^{B1}$ | $R^{B3}$ | $R^{C9}$ | N |
| $L_{A4376}$ | $R^{B1}$ | $R^{B4}$ | $R^{C9}$ | N |
| $L_{A4377}$ | $R^{B1}$ | $R^{B5}$ | $R^{C9}$ | N |
| $L_{A4378}$ | $R^{B1}$ | $R^{B7}$ | $R^{C9}$ | N |
| $L_{A4379}$ | $R^{B1}$ | $R^{A3}$ | $R^{C9}$ | N |
| $L_{A4380}$ | $R^{B1}$ | $R^{A34}$ | $R^{C9}$ | N |
| $L_{A4381}$ | $R^{B1}$ | $R^{A57}$ | $R^{C9}$ | N |

$L_{A382}$ through $L_{A762}$ are based on a structure of Formula V,

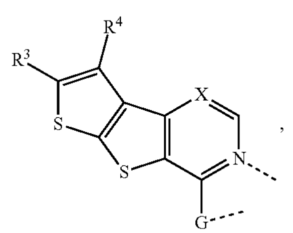

in which $R^3$, $R^4$, X and G are defined as:

| Ligand | $R^3$ | $R^4$ | G | X |
|---|---|---|---|---|
| $L_{A4382}$ | H | H | $R^{C1}$ | C |
| $L_{A4383}$ | $R^{B1}$ | H | $R^{C1}$ | C |
| $L_{A4384}$ | $R^{B3}$ | H | $R^{C1}$ | C |
| $L_{A4385}$ | $R^{B4}$ | H | $R^{C1}$ | C |
| $L_{A4386}$ | $R^{B5}$ | H | $R^{C1}$ | C |
| $L_{A4387}$ | $R^{B7}$ | H | $R^{C1}$ | C |
| $L_{A4388}$ | $R^{A3}$ | H | $R^{C1}$ | C |
| $L_{A4389}$ | $R^{A34}$ | H | $R^{C1}$ | C |
| $L_{A4390}$ | $R^{A57}$ | H | $R^{C1}$ | C |
| $L_{A4391}$ | H | $R^{B1}$ | $R^{C1}$ | C |
| $L_{A4392}$ | H | $R^{B3}$ | $R^{C1}$ | C |
| $L_{A4393}$ | H | $R^{B4}$ | $R^{C1}$ | C |
| $L_{A4394}$ | H | $R^{B5}$ | $R^{C1}$ | C |
| $L_{A4395}$ | H | $R^{B7}$ | $R^{C1}$ | C |
| $L_{A4396}$ | H | $R^{A3}$ | $R^{C1}$ | C |
| $L_{A4397}$ | H | $R^{A34}$ | $R^{C1}$ | C |
| $L_{A4398}$ | H | $R^{A57}$ | $R^{C1}$ | C |
| $L_{A4399}$ | $R^{B1}$ | $R^{B1}$ | $R^{C1}$ | C |
| $L_{A4400}$ | $R^{B3}$ | $R^{B3}$ | $R^{C1}$ | C |
| $L_{A4401}$ | $R^{B4}$ | $R^{B4}$ | $R^{C1}$ | C |
| $L_{A4402}$ | $R^{B5}$ | $R^{B5}$ | $R^{C1}$ | C |
| $L_{A4403}$ | $R^{B7}$ | $R^{B7}$ | $R^{C1}$ | C |
| $L_{A4404}$ | $R^{A3}$ | $R^{A3}$ | $R^{C1}$ | C |
| $L_{A4405}$ | $R^{A34}$ | $R^{A34}$ | $R^{C1}$ | C |
| $L_{A4406}$ | $R^{A57}$ | $R^{A57}$ | $R^{C1}$ | C |
| $L_{A4407}$ | $R^{B3}$ | $R^{B1}$ | $R^{C1}$ | C |
| $L_{A4408}$ | $R^{B4}$ | $R^{B1}$ | $R^{C1}$ | C |
| $L_{A4409}$ | $R^{B5}$ | $R^{B1}$ | $R^{C1}$ | C |
| $L_{A4410}$ | $R^{B7}$ | $R^{B1}$ | $R^{C1}$ | C |
| $L_{A4411}$ | $R^{A3}$ | $R^{B1}$ | $R^{C1}$ | C |
| $L_{A4412}$ | $R^{A34}$ | $R^{B1}$ | $R^{C1}$ | C |
| $L_{A4413}$ | $R^{A57}$ | $R^{B1}$ | $R^{C1}$ | C |
| $L_{A4414}$ | $R^{B1}$ | $R^{B3}$ | $R^{C1}$ | C |
| $L_{A4415}$ | $R^{B1}$ | $R^{B4}$ | $R^{C1}$ | C |
| $L_{A4416}$ | $R^{B1}$ | $R^{B5}$ | $R^{C1}$ | C |
| $L_{A4417}$ | $R^{B1}$ | $R^{B7}$ | $R^{C1}$ | C |
| $L_{A4418}$ | $R^{B1}$ | $R^{A3}$ | $R^{C1}$ | C |
| $L_{A4419}$ | $R^{B1}$ | $R^{A34}$ | $R^{C1}$ | C |
| $L_{A4420}$ | $R^{B1}$ | $R^{A57}$ | $R^{C1}$ | C |
| $L_{A4421}$ | $R^{B1}$ | H | $R^{C2}$ | C |
| $L_{A4422}$ | $R^{B3}$ | H | $R^{C2}$ | C |
| $L_{A4423}$ | $R^{B4}$ | H | $R^{C2}$ | C |
| $L_{A4424}$ | $R^{B5}$ | H | $R^{C2}$ | C |
| $L_{A4425}$ | $R^{B7}$ | H | $R^{C2}$ | C |
| $L_{A4426}$ | $R^{A3}$ | H | $R^{C2}$ | C |
| $L_{A4427}$ | $R^{A34}$ | H | $R^{C2}$ | C |
| $L_{A4428}$ | $R^{A57}$ | H | $R^{C2}$ | C |
| $L_{A4429}$ | H | $R^{B1}$ | $R^{C2}$ | C |
| $L_{A4430}$ | H | $R^{B3}$ | $R^{C2}$ | C |
| $L_{A4431}$ | H | $R^{B4}$ | $R^{C2}$ | C |
| $L_{A4432}$ | H | $R^{B5}$ | $R^{C2}$ | C |
| $L_{A4433}$ | H | $R^{B7}$ | $R^{C2}$ | C |
| $L_{A4434}$ | H | $R^{A3}$ | $R^{C2}$ | C |
| $L_{A4435}$ | H | $R^{A34}$ | $R^{C2}$ | C |
| $L_{A4436}$ | H | $R^{A57}$ | $R^{C2}$ | C |
| $L_{A4437}$ | $R^{B1}$ | $R^{B1}$ | $R^{C2}$ | C |
| $L_{A4438}$ | $R^{B3}$ | $R^{B3}$ | $R^{C2}$ | C |
| $L_{A4439}$ | $R^{B4}$ | $R^{B4}$ | $R^{C2}$ | C |
| $L_{A4440}$ | $R^{B5}$ | $R^{B5}$ | $R^{C2}$ | C |
| $L_{A4441}$ | $R^{B7}$ | $R^{B7}$ | $R^{C2}$ | C |
| $L_{A4442}$ | $R^{A3}$ | $R^{A3}$ | $R^{C2}$ | C |
| $L_{A4443}$ | $R^{A34}$ | $R^{A34}$ | $R^{C2}$ | C |
| $L_{A4444}$ | $R^{A57}$ | $R^{A57}$ | $R^{C2}$ | C |
| $L_{A4445}$ | $R^{B3}$ | $R^{B1}$ | $R^{C2}$ | C |
| $L_{A4446}$ | $R^{B4}$ | $R^{B1}$ | $R^{C2}$ | C |
| $L_{A4447}$ | $R^{B5}$ | $R^{B1}$ | $R^{C2}$ | C |
| $L_{A4448}$ | $R^{B7}$ | $R^{B1}$ | $R^{C2}$ | C |
| $L_{A4449}$ | $R^{A3}$ | $R^{B1}$ | $R^{C2}$ | C |
| $L_{A4450}$ | $R^{A34}$ | $R^{B1}$ | $R^{C2}$ | C |
| $L_{A4451}$ | $R^{A57}$ | $R^{B1}$ | $R^{C2}$ | C |
| $L_{A4452}$ | $R^{B1}$ | $R^{B3}$ | $R^{C2}$ | C |
| $L_{A4453}$ | $R^{B1}$ | $R^{B4}$ | $R^{C2}$ | C |
| $L_{A4454}$ | $R^{B1}$ | $R^{B5}$ | $R^{C2}$ | C |
| $L_{A4455}$ | $R^{B1}$ | $R^{B7}$ | $R^{C2}$ | C |
| $L_{A4456}$ | $R^{B1}$ | $R^{A3}$ | $R^{C2}$ | C |
| $L_{A4457}$ | $R^{B1}$ | $R^{A34}$ | $R^{C2}$ | C |
| $L_{A4458}$ | $R^{B1}$ | $R^{A57}$ | $R^{C2}$ | C |
| $L_{A4459}$ | $R^{B1}$ | H | $R^{C3}$ | C |
| $L_{A4460}$ | $R^{B3}$ | H | $R^{C3}$ | C |
| $L_{A4461}$ | $R^{B4}$ | H | $R^{C3}$ | C |
| $L_{A4462}$ | $R^{B5}$ | H | $R^{C3}$ | C |
| $L_{A4463}$ | $R^{B7}$ | H | $R^{C3}$ | C |
| $L_{A4464}$ | $R^{A3}$ | H | $R^{C3}$ | C |
| $L_{A4465}$ | $R^{A34}$ | H | $R^{C3}$ | C |

-continued

| Ligand | $R^3$ | $R^4$ | G | X |
|---|---|---|---|---|
| $L_{A4466}$ | $R^{A57}$ | H | $R^{C3}$ | C |
| $L_{A4467}$ | H | $R^{B1}$ | $R^{C3}$ | C |
| $L_{A4468}$ | H | $R^{B3}$ | $R^{C3}$ | C |
| $L_{A4469}$ | H | $R^{B4}$ | $R^{C3}$ | C |
| $L_{A4470}$ | H | $R^{B5}$ | $R^{C3}$ | C |
| $L_{A4471}$ | H | $R^{B7}$ | $R^{C3}$ | C |
| $L_{A4472}$ | H | $R^{A3}$ | $R^{C3}$ | C |
| $L_{A4473}$ | H | $R^{A34}$ | $R^{C3}$ | C |
| $L_{A4474}$ | H | $R^{A57}$ | $R^{C3}$ | C |
| $L_{A4475}$ | $R^{B1}$ | $R^{B1}$ | $R^{C3}$ | C |
| $L_{A4476}$ | $R^{B3}$ | $R^{B3}$ | $R^{C3}$ | C |
| $L_{A4477}$ | $R^{B4}$ | $R^{B4}$ | $R^{C3}$ | C |
| $L_{A4478}$ | $R^{B5}$ | $R^{B5}$ | $R^{C3}$ | C |
| $L_{A4479}$ | $R^{B7}$ | $R^{B7}$ | $R^{C3}$ | C |
| $L_{A4480}$ | $R^{A3}$ | $R^{A3}$ | $R^{C3}$ | C |
| $L_{A4481}$ | $R^{A34}$ | $R^{A34}$ | $R^{C3}$ | C |
| $L_{A4482}$ | $R^{A57}$ | $R^{A57}$ | $R^{C3}$ | C |
| $L_{A4483}$ | $R^{B3}$ | $R^{B1}$ | $R^{C3}$ | C |
| $L_{A4484}$ | $R^{B4}$ | $R^{B1}$ | $R^{C3}$ | C |
| $L_{A4485}$ | $R^{B5}$ | $R^{B1}$ | $R^{C3}$ | C |
| $L_{A4486}$ | $R^{B7}$ | $R^{B1}$ | $R^{C3}$ | C |
| $L_{A4487}$ | $R^{A3}$ | $R^{B1}$ | $R^{C3}$ | C |
| $L_{A4488}$ | $R^{A34}$ | $R^{B1}$ | $R^{C3}$ | C |
| $L_{A4489}$ | $R^{A57}$ | $R^{B1}$ | $R^{C3}$ | C |
| $L_{A4490}$ | $R^{B1}$ | $R^{B3}$ | $R^{C3}$ | C |
| $L_{A4491}$ | $R^{B1}$ | $R^{B4}$ | $R^{C3}$ | C |
| $L_{A4492}$ | $R^{B1}$ | $R^{B5}$ | $R^{C3}$ | C |
| $L_{A4493}$ | $R^{B1}$ | $R^{B7}$ | $R^{C3}$ | C |
| $L_{A4494}$ | $R^{B1}$ | $R^{A3}$ | $R^{C3}$ | C |
| $L_{A4495}$ | $R^{B1}$ | $R^{A34}$ | $R^{C3}$ | C |
| $L_{A4496}$ | $R^{B1}$ | $R^{A57}$ | $R^{C3}$ | C |
| $L_{A4497}$ | $R^{B1}$ | H | $R^{C8}$ | C |
| $L_{A4498}$ | $R^{B3}$ | H | $R^{C8}$ | C |
| $L_{A4499}$ | $R^{B4}$ | H | $R^{C8}$ | C |
| $L_{A4500}$ | $R^{B5}$ | H | $R^{C8}$ | C |
| $L_{A4501}$ | $R^{B7}$ | H | $R^{C8}$ | C |
| $L_{A4502}$ | $R^{A3}$ | H | $R^{C8}$ | C |
| $L_{A4503}$ | $R^{A34}$ | H | $R^{C8}$ | C |
| $L_{A4504}$ | $R^{A57}$ | H | $R^{C8}$ | C |
| $L_{A4505}$ | H | $R^{B1}$ | $R^{C8}$ | C |
| $L_{A4506}$ | H | $R^{B3}$ | $R^{C8}$ | C |
| $L_{A4502}$ | H | $R^{B4}$ | $R^{C8}$ | C |
| $L_{A4508}$ | H | $R^{B5}$ | $R^{C8}$ | C |
| $L_{A4509}$ | H | $R^{B7}$ | $R^{C8}$ | C |
| $L_{A4510}$ | H | $R^{A3}$ | $R^{C8}$ | C |
| $L_{A4511}$ | H | $R^{A34}$ | $R^{C8}$ | C |
| $L_{A4512}$ | H | $R^{A57}$ | $R^{C8}$ | C |
| $L_{A4513}$ | $R^{B1}$ | $R^{B1}$ | $R^{C8}$ | C |
| $L_{A4514}$ | $R^{B3}$ | $R^{B3}$ | $R^{C8}$ | C |
| $L_{A4515}$ | $R^{B4}$ | $R^{B4}$ | $R^{C8}$ | C |
| $L_{A4516}$ | $R^{B5}$ | $R^{B5}$ | $R^{C8}$ | C |
| $L_{A4512}$ | $R^{B7}$ | $R^{B7}$ | $R^{C8}$ | C |
| $L_{A4518}$ | $R^{A3}$ | $R^{A3}$ | $R^{C8}$ | C |
| $L_{A4519}$ | $R^{A34}$ | $R^{A34}$ | $R^{C8}$ | C |
| $L_{A4520}$ | $R^{A57}$ | $R^{A57}$ | $R^{C8}$ | C |
| $L_{A4521}$ | $R^{B3}$ | $R^{B1}$ | $R^{C8}$ | C |
| $L_{A4522}$ | $R^{B4}$ | $R^{B1}$ | $R^{C8}$ | C |
| $L_{A4523}$ | $R^{B5}$ | $R^{B1}$ | $R^{C8}$ | C |
| $L_{A4524}$ | $R^{B7}$ | $R^{B1}$ | $R^{C8}$ | C |
| $L_{A4525}$ | $R^{A3}$ | $R^{B1}$ | $R^{C8}$ | C |
| $L_{A4526}$ | $R^{A34}$ | $R^{B1}$ | $R^{C8}$ | C |
| $L_{A4527}$ | $R^{A57}$ | $R^{B1}$ | $R^{C8}$ | C |
| $L_{A4528}$ | $R^{B1}$ | $R^{B3}$ | $R^{C8}$ | C |
| $L_{A4529}$ | $R^{B1}$ | $R^{B4}$ | $R^{C8}$ | C |
| $L_{A4530}$ | $R^{B1}$ | $R^{B5}$ | $R^{C8}$ | C |
| $L_{A4531}$ | $R^{B1}$ | $R^{B7}$ | $R^{C8}$ | C |
| $L_{A4532}$ | $R^{B1}$ | $R^{A3}$ | $R^{C8}$ | C |
| $L_{A4533}$ | $R^{B1}$ | $R^{A34}$ | $R^{C8}$ | C |
| $L_{A4534}$ | $R^{B1}$ | $R^{A57}$ | $R^{C8}$ | C |
| $L_{A4535}$ | $R^{B1}$ | H | $R^{C9}$ | C |
| $L_{A4536}$ | $R^{B3}$ | H | $R^{C9}$ | C |
| $L_{A4537}$ | $R^{B4}$ | H | $R^{C9}$ | C |
| $L_{A4538}$ | $R^{B5}$ | H | $R^{C9}$ | C |
| $L_{A4539}$ | $R^{B7}$ | H | $R^{C9}$ | C |
| $L_{A4540}$ | $R^{A3}$ | H | $R^{C9}$ | C |
| $L_{A4541}$ | $R^{A34}$ | H | $R^{C9}$ | C |
| $L_{A4542}$ | $R^{A57}$ | H | $R^{C9}$ | C |

-continued

| Ligand | $R^3$ | $R^4$ | G | X |
|---|---|---|---|---|
| $L_{A4543}$ | H | $R^{B1}$ | $R^{C9}$ | C |
| $L_{A4544}$ | H | $R^{B3}$ | $R^{C9}$ | C |
| $L_{A4545}$ | H | $R^{B4}$ | $R^{C9}$ | C |
| $L_{A4546}$ | H | $R^{B5}$ | $R^{C9}$ | C |
| $L_{A4547}$ | H | $R^{B7}$ | $R^{C9}$ | C |
| $L_{A4548}$ | H | $R^{A3}$ | $R^{C9}$ | C |
| $L_{A4549}$ | H | $R^{A34}$ | $R^{C9}$ | C |
| $L_{A4550}$ | H | $R^{A57}$ | $R^{C9}$ | C |
| $L_{A4551}$ | $R^{B1}$ | $R^{B1}$ | $R^{C9}$ | C |
| $L_{A4552}$ | $R^{B3}$ | $R^{B3}$ | $R^{C9}$ | C |
| $L_{A4553}$ | $R^{B4}$ | $R^{B4}$ | $R^{C9}$ | C |
| $L_{A4554}$ | $R^{B5}$ | $R^{B5}$ | $R^{C9}$ | C |
| $L_{A4555}$ | $R^{B7}$ | $R^{B7}$ | $R^{C9}$ | C |
| $L_{A4556}$ | $R^{A3}$ | $R^{A3}$ | $R^{C9}$ | C |
| $L_{A4557}$ | $R^{A34}$ | $R^{A34}$ | $R^{C9}$ | C |
| $L_{A4558}$ | $R^{A57}$ | $R^{A57}$ | $R^{C9}$ | C |
| $L_{A4559}$ | $R^{B3}$ | $R^{B1}$ | $R^{C9}$ | C |
| $L_{A4560}$ | $R^{B4}$ | $R^{B1}$ | $R^{C9}$ | C |
| $L_{A4561}$ | $R^{B5}$ | $R^{B1}$ | $R^{C9}$ | C |
| $L_{A4562}$ | $R^{B7}$ | $R^{B1}$ | $R^{C9}$ | C |
| $L_{A4563}$ | $R^{A3}$ | $R^{B1}$ | $R^{C9}$ | C |
| $L_{A4564}$ | $R^{A34}$ | $R^{B1}$ | $R^{C9}$ | C |
| $L_{A4565}$ | $R^{A57}$ | $R^{B1}$ | $R^{C9}$ | C |
| $L_{A4566}$ | $R^{B1}$ | $R^{B3}$ | $R^{C9}$ | C |
| $L_{A4567}$ | $R^{B1}$ | $R^{B4}$ | $R^{C9}$ | C |
| $L_{A4568}$ | $R^{B1}$ | $R^{B5}$ | $R^{C9}$ | C |
| $L_{A4569}$ | $R^{B1}$ | $R^{B7}$ | $R^{C9}$ | C |
| $L_{A4570}$ | $R^{B1}$ | $R^{A3}$ | $R^{C9}$ | C |
| $L_{A4571}$ | $R^{B1}$ | $R^{A34}$ | $R^{C9}$ | C |
| $L_{A4572}$ | $R^{B1}$ | $R^{A57}$ | $R^{C9}$ | C |
| $L_{A4573}$ | $R^{B1}$ | H | $R^{C1}$ | N |
| $L_{A4574}$ | $R^{B3}$ | H | $R^{C1}$ | N |
| $L_{A4575}$ | $R^{B4}$ | H | $R^{C1}$ | N |
| $L_{A4576}$ | $R^{B5}$ | H | $R^{C1}$ | N |
| $L_{A4577}$ | $R^{B7}$ | H | $R^{C1}$ | N |
| $L_{A4578}$ | $R^{A3}$ | H | $R^{C1}$ | N |
| $L_{A4579}$ | $R^{A34}$ | H | $R^{C1}$ | N |
| $L_{A4580}$ | $R^{A57}$ | H | $R^{C1}$ | N |
| $L_{A4581}$ | H | $R^{B1}$ | $R^{C1}$ | N |
| $L_{A4582}$ | H | $R^{B3}$ | $R^{C1}$ | N |
| $L_{A4583}$ | H | $R^{B4}$ | $R^{C1}$ | N |
| $L_{A4584}$ | H | $R^{B5}$ | $R^{C1}$ | N |
| $L_{A4585}$ | H | $R^{B7}$ | $R^{C1}$ | N |
| $L_{A4586}$ | H | $R^{A3}$ | $R^{C1}$ | N |
| $L_{A4587}$ | H | $R^{A34}$ | $R^{C1}$ | N |
| $L_{A4588}$ | H | $R^{A57}$ | $R^{C1}$ | N |
| $L_{A4589}$ | $R^{B1}$ | $R^{B1}$ | $R^{C1}$ | N |
| $L_{A4590}$ | $R^{B3}$ | $R^{B3}$ | $R^{C1}$ | N |
| $L_{A4591}$ | $R^{B4}$ | $R^{B4}$ | $R^{C1}$ | N |
| $L_{A4592}$ | $R^{B5}$ | $R^{B5}$ | $R^{C1}$ | N |
| $L_{A4593}$ | $R^{B7}$ | $R^{B7}$ | $R^{C1}$ | N |
| $L_{A4594}$ | $R^{A3}$ | $R^{A3}$ | $R^{C1}$ | N |
| $L_{A4595}$ | $R^{A34}$ | $R^{A34}$ | $R^{C1}$ | N |
| $L_{A4596}$ | $R^{A57}$ | $R^{A57}$ | $R^{C1}$ | N |
| $L_{A4597}$ | $R^{B3}$ | $R^{B1}$ | $R^{C1}$ | N |
| $L_{A4598}$ | $R^{B4}$ | $R^{B1}$ | $R^{C1}$ | N |
| $L_{A4599}$ | $R^{B5}$ | $R^{B1}$ | $R^{C1}$ | N |
| $L_{A4600}$ | $R^{B7}$ | $R^{B1}$ | $R^{C1}$ | N |
| $L_{A4601}$ | $R^{A3}$ | $R^{B1}$ | $R^{C1}$ | N |
| $L_{A4602}$ | $R^{A34}$ | $R^{B1}$ | $R^{C1}$ | N |
| $L_{A4603}$ | $R^{A57}$ | $R^{B1}$ | $R^{C1}$ | N |
| $L_{A4604}$ | $R^{B1}$ | $R^{B3}$ | $R^{C1}$ | N |
| $L_{A4605}$ | $R^{B1}$ | $R^{B4}$ | $R^{C1}$ | N |
| $L_{A4606}$ | $R^{B1}$ | $R^{B5}$ | $R^{C1}$ | N |
| $L_{A4607}$ | $R^{B1}$ | $R^{B7}$ | $R^{C1}$ | N |
| $L_{A4608}$ | $R^{B1}$ | $R^{A3}$ | $R^{C1}$ | N |
| $L_{A4609}$ | $R^{B1}$ | $R^{A34}$ | $R^{C1}$ | N |
| $L_{A4610}$ | $R^{B1}$ | $R^{A57}$ | $R^{C1}$ | N |
| $L_{A4611}$ | $R^{B1}$ | H | $R^{C2}$ | N |
| $L_{A4612}$ | $R^{B3}$ | H | $R^{C2}$ | N |
| $L_{A4613}$ | $R^{B4}$ | H | $R^{C2}$ | N |
| $L_{A4614}$ | $R^{B5}$ | H | $R^{C2}$ | N |
| $L_{A4615}$ | $R^{B7}$ | H | $R^{C2}$ | N |
| $L_{A4616}$ | $R^{A3}$ | H | $R^{C2}$ | N |
| $L_{A4617}$ | $R^{A34}$ | H | $R^{C2}$ | N |
| $L_{A4618}$ | $R^{A57}$ | H | $R^{C2}$ | N |
| $L_{A4619}$ | H | $R^{B1}$ | $R^{C2}$ | N |

-continued

| Ligand | $R^3$ | $R^4$ | G | X |
|---|---|---|---|---|
| $L_{A620}$ | H | $R^{B3}$ | $R^{C2}$ | N |
| $L_{A621}$ | H | $R^{B4}$ | $R^{C2}$ | N |
| $L_{A622}$ | H | $R^{B5}$ | $R^{C2}$ | N |
| $L_{A623}$ | H | $R^{B7}$ | $R^{C2}$ | N |
| $L_{A624}$ | H | $R^{A3}$ | $R^{C2}$ | N |
| $L_{A625}$ | H | $R^{A34}$ | $R^{C2}$ | N |
| $L_{A626}$ | H | $R^{A57}$ | $R^{C2}$ | N |
| $L_{A627}$ | $R^{B1}$ | $R^{B1}$ | $R^{C2}$ | N |
| $L_{A628}$ | $R^{B3}$ | $R^{B3}$ | $R^{C2}$ | N |
| $L_{A629}$ | $R^{B4}$ | $R^{B4}$ | $R^{C2}$ | N |
| $L_{A630}$ | $R^{B5}$ | $R^{B5}$ | $R^{C2}$ | N |
| $L_{A631}$ | $R^{B7}$ | $R^{B7}$ | $R^{C2}$ | N |
| $L_{A632}$ | $R^{A3}$ | $R^{A3}$ | $R^{C2}$ | N |
| $L_{A633}$ | $R^{A34}$ | $R^{A34}$ | $R^{C2}$ | N |
| $L_{A634}$ | $R^{A57}$ | $R^{A57}$ | $R^{C2}$ | N |
| $L_{A635}$ | $R^{B3}$ | $R^{B1}$ | $R^{C2}$ | N |
| $L_{A636}$ | $R^{B4}$ | $R^{B1}$ | $R^{C2}$ | N |
| $L_{A637}$ | $R^{B5}$ | $R^{B1}$ | $R^{C2}$ | N |
| $L_{A638}$ | $R^{B7}$ | $R^{B1}$ | $R^{C2}$ | N |
| $L_{A639}$ | $R^{A3}$ | $R^{B1}$ | $R^{C2}$ | N |
| $L_{A640}$ | $R^{A34}$ | $R^{B1}$ | $R^{C2}$ | N |
| $L_{A641}$ | $R^{A57}$ | $R^{B1}$ | $R^{C2}$ | N |
| $L_{A642}$ | $R^{B1}$ | $R^{B3}$ | $R^{C2}$ | N |
| $L_{A643}$ | $R^{B1}$ | $R^{B4}$ | $R^{C2}$ | N |
| $L_{A644}$ | $R^{B1}$ | $R^{B5}$ | $R^{C2}$ | N |
| $L_{A645}$ | $R^{B1}$ | $R^{B7}$ | $R^{C2}$ | N |
| $L_{A646}$ | $R^{B1}$ | $R^{A3}$ | $R^{C2}$ | N |
| $L_{A647}$ | $R^{B1}$ | $R^{A34}$ | $R^{C2}$ | N |
| $L_{A648}$ | $R^{B1}$ | $R^{A57}$ | $R^{C2}$ | N |
| $L_{A649}$ | $R^{B1}$ | H | $R^{C3}$ | N |
| $L_{A650}$ | $R^{B3}$ | H | $R^{C3}$ | N |
| $L_{A651}$ | $R^{B4}$ | H | $R^{C3}$ | N |
| $L_{A652}$ | $R^{B5}$ | H | $R^{C3}$ | N |
| $L_{A653}$ | $R^{B7}$ | H | $R^{C3}$ | N |
| $L_{A654}$ | $R^{A3}$ | H | $R^{C3}$ | N |
| $L_{A655}$ | $R^{A34}$ | H | $R^{C3}$ | N |
| $L_{A656}$ | $R^{A57}$ | H | $R^{C3}$ | N |
| $L_{A657}$ | H | $R^{B1}$ | $R^{C3}$ | N |
| $L_{A658}$ | H | $R^{B3}$ | $R^{C3}$ | N |
| $L_{A659}$ | H | $R^{B4}$ | $R^{C3}$ | N |
| $L_{A660}$ | H | $R^{B5}$ | $R^{C3}$ | N |
| $L_{A661}$ | H | $R^{B7}$ | $R^{C3}$ | N |
| $L_{A662}$ | H | $R^{A3}$ | $R^{C3}$ | N |
| $L_{A663}$ | H | $R^{A34}$ | $R^{C3}$ | N |
| $L_{A664}$ | H | $R^{A57}$ | $R^{C3}$ | N |
| $L_{A665}$ | $R^{B1}$ | $R^{B1}$ | $R^{C3}$ | N |
| $L_{A666}$ | $R^{B3}$ | $R^{B3}$ | $R^{C3}$ | N |
| $L_{A667}$ | $R^{B4}$ | $R^{B4}$ | $R^{C3}$ | N |
| $L_{A668}$ | $R^{B5}$ | $R^{B5}$ | $R^{C3}$ | N |
| $L_{A669}$ | $R^{B7}$ | $R^{B7}$ | $R^{C3}$ | N |
| $L_{A670}$ | $R^{A3}$ | $R^{A3}$ | $R^{C3}$ | N |
| $L_{A671}$ | $R^{A34}$ | $R^{A34}$ | $R^{C3}$ | N |
| $L_{A672}$ | $R^{A57}$ | $R^{A57}$ | $R^{C3}$ | N |
| $L_{A673}$ | $R^{B3}$ | $R^{B1}$ | $R^{C3}$ | N |
| $L_{A674}$ | $R^{B4}$ | $R^{B1}$ | $R^{C3}$ | N |
| $L_{A675}$ | $R^{B5}$ | $R^{B1}$ | $R^{C3}$ | N |
| $L_{A676}$ | $R^{B7}$ | $R^{B1}$ | $R^{C3}$ | N |
| $L_{A677}$ | $R^{A3}$ | $R^{B1}$ | $R^{C3}$ | N |
| $L_{A678}$ | $R^{A34}$ | $R^{B1}$ | $R^{C3}$ | N |
| $L_{A679}$ | $R^{A57}$ | $R^{B1}$ | $R^{C3}$ | N |
| $L_{A680}$ | $R^{B1}$ | $R^{B3}$ | $R^{C3}$ | N |
| $L_{A681}$ | $R^{B1}$ | $R^{B4}$ | $R^{C3}$ | N |
| $L_{A682}$ | $R^{B1}$ | $R^{B5}$ | $R^{C3}$ | N |
| $L_{A683}$ | $R^{B1}$ | $R^{B7}$ | $R^{C3}$ | N |
| $L_{A684}$ | $R^{B1}$ | $R^{A3}$ | $R^{C3}$ | N |
| $L_{A685}$ | $R^{B1}$ | $R^{A34}$ | $R^{C3}$ | N |
| $L_{A686}$ | $R^{B1}$ | $R^{A57}$ | $R^{C3}$ | N |
| $L_{A687}$ | $R^{B1}$ | H | $R^{C8}$ | N |
| $L_{A688}$ | $R^{B3}$ | H | $R^{C8}$ | N |
| $L_{A689}$ | $R^{B4}$ | H | $R^{C8}$ | N |
| $L_{A690}$ | $R^{B5}$ | H | $R^{C8}$ | N |
| $L_{A691}$ | $R^{B7}$ | H | $R^{C8}$ | N |
| $L_{A692}$ | $R^{A3}$ | H | $R^{C8}$ | N |
| $L_{A693}$ | $R^{A34}$ | H | $R^{C8}$ | N |
| $L_{A694}$ | $R^{A57}$ | H | $R^{C8}$ | N |
| $L_{A695}$ | H | $R^{B1}$ | $R^{C8}$ | N |
| $L_{A696}$ | H | $R^{B3}$ | $R^{C8}$ | N |

-continued

| Ligand | $R^3$ | $R^4$ | G | X |
|---|---|---|---|---|
| $L_{A697}$ | H | $R^{B4}$ | $R^{C8}$ | N |
| $L_{A698}$ | H | $R^{B5}$ | $R^{C8}$ | N |
| $L_{A699}$ | H | $R^{B7}$ | $R^{C8}$ | N |
| $L_{A700}$ | H | $R^{A3}$ | $R^{C8}$ | N |
| $L_{A701}$ | H | $R^{A34}$ | $R^{C8}$ | N |
| $L_{A702}$ | H | $R^{A57}$ | $R^{C8}$ | N |
| $L_{A703}$ | $R^{B1}$ | $R^{B1}$ | $R^{C8}$ | N |
| $L_{A704}$ | $R^{B3}$ | $R^{B3}$ | $R^{C8}$ | N |
| $L_{A705}$ | $R^{B4}$ | $R^{B4}$ | $R^{C8}$ | N |
| $L_{A706}$ | $R^{B5}$ | $R^{B5}$ | $R^{C8}$ | N |
| $L_{A707}$ | $R^{B7}$ | $R^{B7}$ | $R^{C8}$ | N |
| $L_{A708}$ | $R^{A3}$ | $R^{A3}$ | $R^{C8}$ | N |
| $L_{A709}$ | $R^{A34}$ | $R^{A34}$ | $R^{C8}$ | N |
| $L_{A710}$ | $R^{A57}$ | $R^{A57}$ | $R^{C8}$ | N |
| $L_{A711}$ | $R^{B3}$ | $R^{B1}$ | $R^{C8}$ | N |
| $L_{A712}$ | $R^{B4}$ | $R^{B1}$ | $R^{C8}$ | N |
| $L_{A713}$ | $R^{B5}$ | $R^{B1}$ | $R^{C8}$ | N |
| $L_{A714}$ | $R^{B7}$ | $R^{B1}$ | $R^{C8}$ | N |
| $L_{A715}$ | $R^{A3}$ | $R^{B1}$ | $R^{C8}$ | N |
| $L_{A716}$ | $R^{A34}$ | $R^{B1}$ | $R^{C8}$ | N |
| $L_{A717}$ | $R^{A57}$ | $R^{B1}$ | $R^{C8}$ | N |
| $L_{A718}$ | $R^{B1}$ | $R^{B3}$ | $R^{C8}$ | N |
| $L_{A719}$ | $R^{B1}$ | $R^{B4}$ | $R^{C8}$ | N |
| $L_{A720}$ | $R^{B1}$ | $R^{B5}$ | $R^{C8}$ | N |
| $L_{A721}$ | $R^{B1}$ | $R^{B7}$ | $R^{C8}$ | N |
| $L_{A722}$ | $R^{B1}$ | $R^{A3}$ | $R^{C8}$ | N |
| $L_{A723}$ | $R^{B1}$ | $R^{A34}$ | $R^{C8}$ | N |
| $L_{A724}$ | $R^{B1}$ | $R^{A57}$ | $R^{C8}$ | N |
| $L_{A725}$ | $R^{B1}$ | H | $R^{C9}$ | N |
| $L_{A726}$ | $R^{B3}$ | H | $R^{C9}$ | N |
| $L_{A727}$ | $R^{B4}$ | H | $R^{C9}$ | N |
| $L_{A728}$ | $R^{B5}$ | H | $R^{C9}$ | N |
| $L_{A729}$ | $R^{B7}$ | H | $R^{C9}$ | N |
| $L_{A730}$ | $R^{A3}$ | H | $R^{C9}$ | N |
| $L_{A731}$ | $R^{A34}$ | H | $R^{C9}$ | N |
| $L_{A732}$ | $R^{A57}$ | H | $R^{C9}$ | N |
| $L_{A733}$ | H | $R^{B1}$ | $R^{C9}$ | N |
| $L_{A734}$ | H | $R^{B3}$ | $R^{C9}$ | N |
| $L_{A735}$ | H | $R^{B4}$ | $R^{C9}$ | N |
| $L_{A736}$ | H | $R^{B5}$ | $R^{C9}$ | N |
| $L_{A737}$ | H | $R^{B7}$ | $R^{C9}$ | N |
| $L_{A738}$ | H | $R^{A3}$ | $R^{C9}$ | N |
| $L_{A739}$ | H | $R^{A34}$ | $R^{C9}$ | N |
| $L_{A740}$ | H | $R^{A57}$ | $R^{C9}$ | N |
| $L_{A741}$ | $R^{B1}$ | $R^{B1}$ | $R^{C9}$ | N |
| $L_{A742}$ | $R^{B3}$ | $R^{B3}$ | $R^{C9}$ | N |
| $L_{A743}$ | $R^{B4}$ | $R^{B4}$ | $R^{C9}$ | N |
| $L_{A744}$ | $R^{B5}$ | $R^{B5}$ | $R^{C9}$ | N |
| $L_{A745}$ | $R^{B7}$ | $R^{B7}$ | $R^{C9}$ | N |
| $L_{A746}$ | $R^{A3}$ | $R^{A3}$ | $R^{C9}$ | N |
| $L_{A747}$ | $R^{A34}$ | $R^{A34}$ | $R^{C9}$ | N |
| $L_{A748}$ | $R^{A57}$ | $R^{A57}$ | $R^{C9}$ | N |
| $L_{A749}$ | $R^{B3}$ | $R^{B1}$ | $R^{C9}$ | N |
| $L_{A750}$ | $R^{B4}$ | $R^{B1}$ | $R^{C9}$ | N |
| $L_{A751}$ | $R^{B5}$ | $R^{B1}$ | $R^{C9}$ | N |
| $L_{A752}$ | $R^{B7}$ | $R^{B1}$ | $R^{C9}$ | N |
| $L_{A753}$ | $R^{A3}$ | $R^{B1}$ | $R^{C9}$ | N |
| $L_{A754}$ | $R^{A34}$ | $R^{B1}$ | $R^{C9}$ | N |
| $L_{A755}$ | $R^{A57}$ | $R^{B1}$ | $R^{C9}$ | N |
| $L_{A756}$ | $R^{B1}$ | $R^{B3}$ | $R^{C9}$ | N |
| $L_{A757}$ | $R^{B1}$ | $R^{B4}$ | $R^{C9}$ | N |
| $L_{A758}$ | $R^{B1}$ | $R^{B5}$ | $R^{C9}$ | N |
| $L_{A759}$ | $R^{B1}$ | $R^{B7}$ | $R^{C9}$ | N |
| $L_{A760}$ | $R^{B1}$ | $R^{A3}$ | $R^{C9}$ | N |

-continued

| Ligand | $R^3$ | $R^4$ | G | X |
|---|---|---|---|---|
| $L_{A4761}$ | $R^{B1}$ | $R^{A34}$ | $R^{C9}$ | N |
| $L_{A4762}$ | $R^{B1}$ | $R^{A57}$ | $R^{C9}$ | N |

$L_{A4763}$ through $L_{A1143}$ are based on a structure of Formula V,

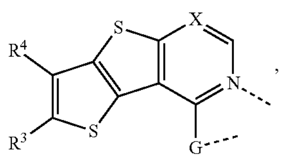

which $R^3$, $R^4$, X and G are defined as:

| Ligand | $R^3$ | $R^4$ | G | X |
|---|---|---|---|---|
| $L_{A4763}$ | H | H | $R^{C1}$ | C |
| $L_{A4764}$ | $R^{B1}$ | H | $R^{C1}$ | C |
| $L_{A4765}$ | $R^{B3}$ | H | $R^{C1}$ | C |
| $L_{A4766}$ | $R^{B4}$ | H | $R^{C1}$ | C |
| $L_{A4767}$ | $R^{B5}$ | H | $R^{C1}$ | C |
| $L_{A4768}$ | $R^{B7}$ | H | $R^{C1}$ | C |
| $L_{A4769}$ | $R^{A3}$ | H | $R^{C1}$ | C |
| $L_{A4770}$ | $R^{A34}$ | H | $R^{C1}$ | C |
| $L_{A4771}$ | $R^{A57}$ | H | $R^{C1}$ | C |
| $L_{A4772}$ | H | $R^{B1}$ | $R^{C1}$ | C |
| $L_{A4773}$ | H | $R^{B3}$ | $R^{C1}$ | C |
| $L_{A4774}$ | H | $R^{B4}$ | $R^{C1}$ | C |
| $L_{A4775}$ | H | $R^{B5}$ | $R^{C1}$ | C |
| $L_{A4776}$ | H | $R^{B7}$ | $R^{C1}$ | C |
| $L_{A4777}$ | H | $R^{A3}$ | $R^{C1}$ | C |
| $L_{A4778}$ | H | $R^{A34}$ | $R^{C1}$ | C |
| $L_{A4779}$ | H | $R^{A57}$ | $R^{C1}$ | C |
| $L_{A4780}$ | $R^{B1}$ | $R^{B1}$ | $R^{C1}$ | C |
| $L_{A4781}$ | $R^{B3}$ | $R^{B3}$ | $R^{C1}$ | C |
| $L_{A4782}$ | $R^{B4}$ | $R^{B4}$ | $R^{C1}$ | C |
| $L_{A4783}$ | $R^{B5}$ | $R^{B5}$ | $R^{C1}$ | C |
| $L_{A4784}$ | $R^{B7}$ | $R^{B7}$ | $R^{C1}$ | C |
| $L_{A4785}$ | $R^{A3}$ | $R^{A3}$ | $R^{C1}$ | C |
| $L_{A4786}$ | $R^{A34}$ | $R^{A34}$ | $R^{C1}$ | C |
| $L_{A4787}$ | $R^{A57}$ | $R^{A57}$ | $R^{C1}$ | C |
| $L_{A4788}$ | $R^{B3}$ | $R^{B1}$ | $R^{C1}$ | C |
| $L_{A4789}$ | $R^{B4}$ | $R^{B1}$ | $R^{C1}$ | C |
| $L_{A4790}$ | $R^{B5}$ | $R^{B1}$ | $R^{C1}$ | C |
| $L_{A4791}$ | $R^{B7}$ | $R^{B1}$ | $R^{C1}$ | C |
| $L_{A4792}$ | $R^{A3}$ | $R^{B1}$ | $R^{C1}$ | C |
| $L_{A4793}$ | $R^{A34}$ | $R^{B1}$ | $R^{C1}$ | C |
| $L_{A4794}$ | $R^{A57}$ | $R^{B1}$ | $R^{C1}$ | C |
| $L_{A4795}$ | $R^{B1}$ | $R^{B3}$ | $R^{C1}$ | C |
| $L_{A4796}$ | $R^{B1}$ | $R^{B4}$ | $R^{C1}$ | C |
| $L_{A4797}$ | $R^{B1}$ | $R^{B5}$ | $R^{C1}$ | C |
| $L_{A4798}$ | $R^{B1}$ | $R^{B7}$ | $R^{C1}$ | C |
| $L_{A4799}$ | $R^{B1}$ | $R^{B3}$ | $R^{C1}$ | C |
| $L_{A4800}$ | $R^{B1}$ | $R^{A3}$ | $R^{C1}$ | C |
| $L_{A4801}$ | $R^{B1}$ | $R^{A57}$ | $R^{C1}$ | C |
| $L_{A4802}$ | $R^{B1}$ | H | $R^{C2}$ | C |
| $L_{A4803}$ | $R^{B3}$ | H | $R^{C2}$ | C |
| $L_{A4804}$ | $R^{B4}$ | H | $R^{C2}$ | C |
| $L_{A4805}$ | $R^{B5}$ | H | $R^{C2}$ | C |
| $L_{A4806}$ | $R^{B7}$ | H | $R^{C2}$ | C |
| $L_{A4807}$ | $R^{A3}$ | H | $R^{C2}$ | C |
| $L_{A4808}$ | $R^{A34}$ | H | $R^{C2}$ | C |
| $L_{A4809}$ | $R^{A57}$ | H | $R^{C2}$ | C |
| $L_{A4810}$ | H | $R^{B1}$ | $R^{C2}$ | C |
| $L_{A4811}$ | H | $R^{B3}$ | $R^{C2}$ | C |
| $L_{A4812}$ | H | $R^{B4}$ | $R^{C2}$ | C |
| $L_{A4813}$ | H | $R^{B5}$ | $R^{C2}$ | C |
| $L_{A4814}$ | H | $R^{B7}$ | $R^{C2}$ | C |
| $L_{A4815}$ | H | $R^{A3}$ | $R^{C2}$ | C |
| $L_{A4816}$ | H | $R^{A34}$ | $R^{C2}$ | C |
| $L_{A4817}$ | H | $R^{A57}$ | $R^{C2}$ | C |
| $L_{A4818}$ | $R^{B1}$ | $R^{B1}$ | $R^{C2}$ | C |

-continued

| Ligand | $R^3$ | $R^4$ | G | X |
|---|---|---|---|---|
| $L_{A4819}$ | $R^{B3}$ | $R^{B3}$ | $R^{C2}$ | C |
| $L_{A4820}$ | $R^{B4}$ | $R^{B4}$ | $R^{C2}$ | C |
| $L_{A4821}$ | $R^{B5}$ | $R^{B5}$ | $R^{C2}$ | C |
| $L_{A4822}$ | $R^{B7}$ | $R^{B7}$ | $R^{C2}$ | C |
| $L_{A4823}$ | $R^{A3}$ | $R^{A3}$ | $R^{C2}$ | C |
| $L_{A4824}$ | $R^{A34}$ | $R^{A34}$ | $R^{C2}$ | C |
| $L_{A4825}$ | $R^{A57}$ | $R^{A57}$ | $R^{C2}$ | C |
| $L_{A4826}$ | $R^{B3}$ | $R^{B1}$ | $R^{C2}$ | C |
| $L_{A4827}$ | $R^{B4}$ | $R^{B1}$ | $R^{C2}$ | C |
| $L_{A4828}$ | $R^{B5}$ | $R^{B1}$ | $R^{C2}$ | C |
| $L_{A4829}$ | $R^{B7}$ | $R^{B1}$ | $R^{C2}$ | C |
| $L_{A4830}$ | $R^{A3}$ | $R^{B1}$ | $R^{C2}$ | C |
| $L_{A4831}$ | $R^{A34}$ | $R^{B1}$ | $R^{C2}$ | C |
| $L_{A4832}$ | $R^{A57}$ | $R^{B1}$ | $R^{C2}$ | C |
| $L_{A4833}$ | $R^{B1}$ | $R^{B3}$ | $R^{C2}$ | C |
| $L_{A4834}$ | $R^{B1}$ | $R^{B4}$ | $R^{C2}$ | C |
| $L_{A4835}$ | $R^{B1}$ | $R^{B5}$ | $R^{C2}$ | C |
| $L_{A4836}$ | $R^{B1}$ | $R^{B7}$ | $R^{C2}$ | C |
| $L_{A4837}$ | $R^{B1}$ | $R^{A3}$ | $R^{C2}$ | C |
| $L_{A4838}$ | $R^{B1}$ | $R^{A34}$ | $R^{C2}$ | C |
| $L_{A4839}$ | $R^{B1}$ | $R^{A57}$ | $R^{C2}$ | C |
| $L_{A4840}$ | $R^{B1}$ | H | $R^{C3}$ | C |
| $L_{A4841}$ | $R^{B3}$ | H | $R^{C3}$ | C |
| $L_{A4842}$ | $R^{B4}$ | H | $R^{C3}$ | C |
| $L_{A4843}$ | $R^{B5}$ | H | $R^{C3}$ | C |
| $L_{A4844}$ | $R^{B7}$ | H | $R^{C3}$ | C |
| $L_{A4845}$ | $R^{A3}$ | H | $R^{C3}$ | C |
| $L_{A4846}$ | $R^{A34}$ | H | $R^{C3}$ | C |
| $L_{A4847}$ | $R^{A57}$ | H | $R^{C3}$ | C |
| $L_{A4848}$ | H | $R^{B1}$ | $R^{C3}$ | C |
| $L_{A4849}$ | H | $R^{B3}$ | $R^{C3}$ | C |
| $L_{A4850}$ | H | $R^{B4}$ | $R^{C3}$ | C |
| $L_{A4851}$ | H | $R^{B5}$ | $R^{C3}$ | C |
| $L_{A4852}$ | H | $R^{B7}$ | $R^{C3}$ | C |
| $L_{A4853}$ | H | $R^{A3}$ | $R^{C3}$ | C |
| $L_{A4854}$ | H | $R^{A34}$ | $R^{C3}$ | C |
| $L_{A4855}$ | H | $R^{A57}$ | $R^{C3}$ | C |
| $L_{A4856}$ | $R^{B1}$ | $R^{B1}$ | $R^{C3}$ | C |
| $L_{A4857}$ | $R^{B3}$ | $R^{B3}$ | $R^{C3}$ | C |
| $L_{A4858}$ | $R^{B4}$ | $R^{B4}$ | $R^{C3}$ | C |
| $L_{A4859}$ | $R^{B5}$ | $R^{B5}$ | $R^{C3}$ | C |
| $L_{A4860}$ | $R^{B7}$ | $R^{B7}$ | $R^{C3}$ | C |
| $L_{A4861}$ | $R^{A3}$ | $R^{A3}$ | $R^{C3}$ | C |
| $L_{A4862}$ | $R^{A34}$ | $R^{A34}$ | $R^{C3}$ | C |
| $L_{A4863}$ | $R^{A57}$ | $R^{A57}$ | $R^{C3}$ | C |
| $L_{A4864}$ | $R^{B3}$ | $R^{B1}$ | $R^{C3}$ | C |
| $L_{A4865}$ | $R^{B4}$ | $R^{B1}$ | $R^{C3}$ | C |
| $L_{A4866}$ | $R^{B5}$ | $R^{B1}$ | $R^{C3}$ | C |
| $L_{A4867}$ | $R^{B7}$ | $R^{B1}$ | $R^{C3}$ | C |
| $L_{A4868}$ | $R^{A3}$ | $R^{B1}$ | $R^{C3}$ | C |
| $L_{A4869}$ | $R^{A34}$ | $R^{B1}$ | $R^{C3}$ | C |
| $L_{A4870}$ | $R^{A57}$ | $R^{B1}$ | $R^{C3}$ | C |
| $L_{A4871}$ | $R^{B1}$ | $R^{B3}$ | $R^{C3}$ | C |
| $L_{A4872}$ | $R^{B1}$ | $R^{B4}$ | $R^{C3}$ | C |
| $L_{A4873}$ | $R^{B1}$ | $R^{B5}$ | $R^{C3}$ | C |
| $L_{A4874}$ | $R^{B1}$ | $R^{B7}$ | $R^{C3}$ | C |
| $L_{A4875}$ | $R^{B1}$ | $R^{A3}$ | $R^{C3}$ | C |
| $L_{A4876}$ | $R^{B1}$ | $R^{A34}$ | $R^{C3}$ | C |
| $L_{A4877}$ | $R^{B1}$ | $R^{A57}$ | $R^{C3}$ | C |
| $L_{A4878}$ | $R^{B1}$ | H | $R^{C8}$ | C |
| $L_{A4879}$ | $R^{B3}$ | H | $R^{C8}$ | C |
| $L_{A4880}$ | $R^{B4}$ | H | $R^{C8}$ | C |
| $L_{A4881}$ | $R^{B5}$ | H | $R^{C8}$ | C |
| $L_{A4882}$ | $R^{B7}$ | H | $R^{C8}$ | C |
| $L_{A4883}$ | $R^{A3}$ | H | $R^{C8}$ | C |
| $L_{A4884}$ | $R^{A34}$ | H | $R^{C8}$ | C |
| $L_{A4885}$ | $R^{A57}$ | H | $R^{C8}$ | C |
| $L_{A4886}$ | H | $R^{B1}$ | $R^{C8}$ | C |
| $L_{A4887}$ | H | $R^{B3}$ | $R^{C8}$ | C |
| $L_{A4888}$ | H | $R^{B4}$ | $R^{C8}$ | C |
| $L_{A4889}$ | H | $R^{B5}$ | $R^{C8}$ | C |
| $L_{A4890}$ | H | $R^{B7}$ | $R^{C8}$ | C |
| $L_{A4891}$ | H | $R^{B3}$ | $R^{C8}$ | C |
| $L_{A4892}$ | H | $R^{A34}$ | $R^{C8}$ | C |
| $L_{A4893}$ | H | $R^{A57}$ | $R^{C8}$ | C |
| $L_{A4894}$ | $R^{B1}$ | $R^{B1}$ | $R^{C8}$ | C |
| $L_{A4895}$ | $R^{B3}$ | $R^{B3}$ | $R^{C8}$ | C |

-continued

| Ligand | $R^3$ | $R^4$ | G | X |
|---|---|---|---|---|
| $L_{A4896}$ | $R^{B4}$ | $R^{B4}$ | $R^{C8}$ | C |
| $L_{A4897}$ | $R^{B5}$ | $R^{B5}$ | $R^{C8}$ | C |
| $L_{A4898}$ | $R^{B7}$ | $R^{B7}$ | $R^{C8}$ | C |
| $L_{A4899}$ | $R^{A3}$ | $R^{A3}$ | $R^{C8}$ | C |
| $L_{A4900}$ | $R^{A34}$ | $R^{A34}$ | $R^{C8}$ | C |
| $L_{A4901}$ | $R^{A57}$ | $R^{A57}$ | $R^{C8}$ | C |
| $L_{A4902}$ | $R^{B3}$ | $R^{B1}$ | $R^{C8}$ | C |
| $L_{A4903}$ | $R^{B4}$ | $R^{B1}$ | $R^{C8}$ | C |
| $L_{A4904}$ | $R^{B5}$ | $R^{B1}$ | $R^{C8}$ | C |
| $L_{A4905}$ | $R^{B7}$ | $R^{B1}$ | $R^{C8}$ | C |
| $L_{A4906}$ | $R^{A3}$ | $R^{B1}$ | $R^{C8}$ | C |
| $L_{A4907}$ | $R^{A34}$ | $R^{B1}$ | $R^{C8}$ | C |
| $L_{A4908}$ | $R^{A57}$ | $R^{B1}$ | $R^{C8}$ | C |
| $L_{A4909}$ | $R^{B1}$ | $R^{B3}$ | $R^{C8}$ | C |
| $L_{A4910}$ | $R^{B1}$ | $R^{B4}$ | $R^{C8}$ | C |
| $L_{A4911}$ | $R^{B1}$ | $R^{B5}$ | $R^{C8}$ | C |
| $L_{A4912}$ | $R^{B1}$ | $R^{B7}$ | $R^{C8}$ | C |
| $L_{A4913}$ | $R^{B1}$ | $R^{A3}$ | $R^{C8}$ | C |
| $L_{A4914}$ | $R^{B1}$ | $R^{A34}$ | $R^{C8}$ | C |
| $L_{A4915}$ | $R^{B1}$ | $R^{A57}$ | $R^{C8}$ | C |
| $L_{A4916}$ | $R^{B1}$ | H | $R^{C9}$ | C |
| $L_{A4917}$ | $R^{B3}$ | H | $R^{C9}$ | C |
| $L_{A4918}$ | $R^{B4}$ | H | $R^{C9}$ | C |
| $L_{A4919}$ | $R^{B5}$ | H | $R^{C9}$ | C |
| $L_{A4920}$ | $R^{B7}$ | H | $R^{C9}$ | C |
| $L_{A4921}$ | $R^{A3}$ | H | $R^{C9}$ | C |
| $L_{A4922}$ | $R^{A34}$ | H | $R^{C9}$ | C |
| $L_{A4923}$ | $R^{A57}$ | H | $R^{C9}$ | C |
| $L_{A4924}$ | H | $R^{B1}$ | $R^{C9}$ | C |
| $L_{A4925}$ | H | $R^{B3}$ | $R^{C9}$ | C |
| $L_{A4926}$ | H | $R^{B4}$ | $R^{C9}$ | C |
| $L_{A4927}$ | H | $R^{B5}$ | $R^{C9}$ | C |
| $L_{A4928}$ | H | $R^{B7}$ | $R^{C9}$ | C |
| $L_{A4929}$ | H | $R^{A3}$ | $R^{C9}$ | C |
| $L_{A4930}$ | H | $R^{A34}$ | $R^{C9}$ | C |
| $L_{A4931}$ | H | $R^{A57}$ | $R^{C9}$ | C |
| $L_{A4932}$ | $R^{B1}$ | $R^{B1}$ | $R^{C9}$ | C |
| $L_{A4933}$ | $R^{B3}$ | $R^{B3}$ | $R^{C9}$ | C |
| $L_{A4934}$ | $R^{B4}$ | $R^{B4}$ | $R^{C9}$ | C |
| $L_{A4935}$ | $R^{B5}$ | $R^{B5}$ | $R^{C9}$ | C |
| $L_{A4936}$ | $R^{B7}$ | $R^{B7}$ | $R^{C9}$ | C |
| $L_{A4937}$ | $R^{A3}$ | $R^{A3}$ | $R^{C9}$ | C |
| $L_{A4938}$ | $R^{A34}$ | $R^{A34}$ | $R^{C9}$ | C |
| $L_{A4939}$ | $R^{A57}$ | $R^{A57}$ | $R^{C9}$ | C |
| $L_{A4940}$ | $R^{B3}$ | $R^{B1}$ | $R^{C9}$ | C |
| $L_{A4941}$ | $R^{B4}$ | $R^{B1}$ | $R^{C9}$ | C |
| $L_{A4942}$ | $R^{B5}$ | $R^{B1}$ | $R^{C9}$ | C |
| $L_{A4943}$ | $R^{B7}$ | $R^{B1}$ | $R^{C9}$ | C |
| $L_{A4944}$ | $R^{A3}$ | $R^{B1}$ | $R^{C9}$ | C |
| $L_{A4945}$ | $R^{A34}$ | $R^{B1}$ | $R^{C9}$ | C |
| $L_{A4946}$ | $R^{A57}$ | $R^{B1}$ | $R^{C9}$ | C |
| $L_{A4947}$ | $R^{B1}$ | $R^{B3}$ | $R^{C9}$ | C |
| $L_{A4948}$ | $R^{B1}$ | $R^{B4}$ | $R^{C9}$ | C |
| $L_{A4949}$ | $R^{B1}$ | $R^{B5}$ | $R^{C9}$ | C |
| $L_{A4950}$ | $R^{B1}$ | $R^{B7}$ | $R^{C9}$ | C |
| $L_{A4951}$ | $R^{B1}$ | $R^{A3}$ | $R^{C9}$ | C |
| $L_{A4952}$ | $R^{B1}$ | $R^{A34}$ | $R^{C9}$ | C |
| $L_{A4953}$ | $R^{B1}$ | $R^{A57}$ | $R^{C9}$ | C |
| $L_{A4954}$ | $R^{B1}$ | H | $R^{C1}$ | N |
| $L_{A4955}$ | $R^{B3}$ | H | $R^{C1}$ | N |
| $L_{A4956}$ | $R^{B4}$ | H | $R^{C1}$ | N |
| $L_{A4957}$ | $R^{BB}$ | H | $R^{C1}$ | N |
| $L_{A4958}$ | $R^{B7}$ | H | $R^{C1}$ | N |
| $L_{A4959}$ | $R^{A3}$ | H | $R^{C1}$ | N |
| $L_{A4960}$ | $R^{A34}$ | H | $R^{C1}$ | N |
| $L_{A4961}$ | $R^{A57}$ | H | $R^{C1}$ | N |
| $L_{A4962}$ | H | $R^{B1}$ | $R^{C1}$ | N |
| $L_{A4963}$ | H | $R^{B3}$ | $R^{C1}$ | N |
| $L_{A4964}$ | H | $R^{B4}$ | $R^{C1}$ | N |
| $L_{A4965}$ | H | $R^{B5}$ | $R^{C1}$ | N |
| $L_{A4966}$ | H | $R^{B7}$ | $R^{C1}$ | N |
| $L_{A4967}$ | H | $R^{A3}$ | $R^{C1}$ | N |
| $L_{A4968}$ | H | $R^{A34}$ | $R^{C1}$ | N |
| $L_{A4969}$ | H | $R^{A57}$ | $R^{C1}$ | N |
| $L_{A4970}$ | $R^{B1}$ | $R^{B1}$ | $R^{C1}$ | N |
| $L_{A4971}$ | $R^{B3}$ | $R^{B3}$ | $R^{C1}$ | N |
| $L_{A4972}$ | $R^{B4}$ | $R^{B4}$ | $R^{C1}$ | N |

-continued

| Ligand | $R^3$ | $R^4$ | G | X |
|---|---|---|---|---|
| $L_{A4973}$ | $R^{B5}$ | $R^{B5}$ | $R^{C1}$ | N |
| $L_{A4974}$ | $R^{B7}$ | $R^{B7}$ | $R^{C1}$ | N |
| $L_{A4975}$ | $R^{A3}$ | $R^{A3}$ | $R^{C1}$ | N |
| $L_{A4976}$ | $R^{A34}$ | $R^{A34}$ | $R^{C1}$ | N |
| $L_{A4977}$ | $R^{A57}$ | $R^{A57}$ | $R^{C1}$ | N |
| $L_{A4978}$ | $R^{B3}$ | $R^{B1}$ | $R^{C1}$ | N |
| $L_{A4979}$ | $R^{B4}$ | $R^{B1}$ | $R^{C1}$ | N |
| $L_{A4980}$ | $R^{B5}$ | $R^{B1}$ | $R^{C1}$ | N |
| $L_{A4981}$ | $R^{B7}$ | $R^{B1}$ | $R^{C1}$ | N |
| $L_{A4982}$ | $R^{A3}$ | $R^{B1}$ | $R^{C1}$ | N |
| $L_{A4983}$ | $R^{A34}$ | $R^{B1}$ | $R^{C1}$ | N |
| $L_{A4984}$ | $R^{A57}$ | $R^{B1}$ | $R^{C1}$ | N |
| $L_{A4985}$ | $R^{B1}$ | $R^{B3}$ | $R^{C1}$ | N |
| $L_{A4986}$ | $R^{B1}$ | $R^{B4}$ | $R^{C1}$ | N |
| $L_{A4987}$ | $R^{B1}$ | $R^{B5}$ | $R^{C1}$ | N |
| $L_{A4988}$ | $R^{B1}$ | $R^{B7}$ | $R^{C1}$ | N |
| $L_{A4989}$ | $R^{B1}$ | $R^{A3}$ | $R^{C1}$ | N |
| $L_{A4990}$ | $R^{B1}$ | $R^{A34}$ | $R^{C1}$ | N |
| $L_{A4991}$ | $R^{B1}$ | $R^{A57}$ | $R^{C1}$ | N |
| $L_{A4992}$ | $R^{B1}$ | H | $R^{C2}$ | N |
| $L_{A4993}$ | $R^{B3}$ | H | $R^{C2}$ | N |
| $L_{A4994}$ | $R^{B4}$ | H | $R^{C2}$ | N |
| $L_{A4995}$ | $R^{B5}$ | H | $R^{C2}$ | N |
| $L_{A4996}$ | $R^{B7}$ | H | $R^{C2}$ | N |
| $L_{A4997}$ | $R^{A3}$ | H | $R^{C2}$ | N |
| $L_{A4998}$ | $R^{A34}$ | H | $R^{C2}$ | N |
| $L_{A4999}$ | $R^{A57}$ | H | $R^{C2}$ | N |
| $L_{A1000}$ | H | $R^{B1}$ | $R^{C2}$ | N |
| $L_{A1001}$ | H | $R^{B3}$ | $R^{C2}$ | N |
| $L_{A1002}$ | H | $R^{B4}$ | $R^{C2}$ | N |
| $L_{A1003}$ | H | $R^{B5}$ | $R^{C2}$ | N |
| $L_{A1004}$ | H | $R^{B7}$ | $R^{C2}$ | N |
| $L_{A1005}$ | H | $R^{A3}$ | $R^{C2}$ | N |
| $L_{A1006}$ | H | $R^{A34}$ | $R^{C2}$ | N |
| $L_{A1007}$ | H | $R^{A57}$ | $R^{C2}$ | N |
| $L_{A1008}$ | $R^{B1}$ | $R^{B1}$ | $R^{C2}$ | N |
| $L_{A1009}$ | $R^{B3}$ | $R^{B3}$ | $R^{C2}$ | N |
| $L_{A1010}$ | $R^{B4}$ | $R^{B4}$ | $R^{C2}$ | N |
| $L_{A1011}$ | $R^{B5}$ | $R^{B5}$ | $R^{C2}$ | N |
| $L_{A1012}$ | $R^{B7}$ | $R^{B7}$ | $R^{C2}$ | N |
| $L_{A1013}$ | $R^{A3}$ | $R^{A3}$ | $R^{C2}$ | N |
| $L_{A1014}$ | $R^{A34}$ | $R^{A34}$ | $R^{C2}$ | N |
| $L_{A1015}$ | $R^{A57}$ | $R^{A57}$ | $R^{C2}$ | N |
| $L_{A1016}$ | $R^{B3}$ | $R^{B1}$ | $R^{C2}$ | N |
| $L_{A1017}$ | $R^{B4}$ | $R^{B1}$ | $R^{C2}$ | N |
| $L_{A1018}$ | $R^{B5}$ | $R^{B1}$ | $R^{C2}$ | N |
| $L_{A1019}$ | $R^{B7}$ | $R^{B1}$ | $R^{C2}$ | N |
| $L_{A1020}$ | $R^{A3}$ | $R^{B1}$ | $R^{C2}$ | N |
| $L_{A1021}$ | $R^{A34}$ | $R^{B1}$ | $R^{C2}$ | N |
| $L_{A1022}$ | $R^{A57}$ | $R^{B1}$ | $R^{C2}$ | N |
| $L_{A1023}$ | $R^{B1}$ | $R^{B3}$ | $R^{C2}$ | N |
| $L_{A1024}$ | $R^{B1}$ | $R^{B4}$ | $R^{C2}$ | N |
| $L_{A1025}$ | $R^{B1}$ | $R^{B5}$ | $R^{C2}$ | N |
| $L_{A1026}$ | $R^{B1}$ | $R^{B7}$ | $R^{C2}$ | N |
| $L_{A1027}$ | $R^{B1}$ | $R^{A3}$ | $R^{C2}$ | N |
| $L_{A1028}$ | $R^{B1}$ | $R^{A34}$ | $R^{C2}$ | N |
| $L_{A1029}$ | $R^{B1}$ | $R^{A57}$ | $R^{C2}$ | N |
| $L_{A1030}$ | $R^{B1}$ | H | $R^{C3}$ | N |
| $L_{A1031}$ | $R^{B3}$ | H | $R^{C3}$ | N |
| $L_{A1032}$ | $R^{B4}$ | H | $R^{C3}$ | N |
| $L_{A1033}$ | $R^{B5}$ | H | $R^{C3}$ | N |
| $L_{A1034}$ | $R^{B7}$ | H | $R^{C3}$ | N |
| $L_{A1035}$ | $R^{A3}$ | H | $R^{C3}$ | N |
| $L_{A1036}$ | $R^{A34}$ | H | $R^{C3}$ | N |
| $L_{A1037}$ | $R^{A57}$ | H | $R^{C3}$ | N |
| $L_{A1038}$ | H | $R^{B1}$ | $R^{C3}$ | N |
| $L_{A1039}$ | H | $R^{B3}$ | $R^{C3}$ | N |
| $L_{A1040}$ | H | $R^{B4}$ | $R^{C3}$ | N |
| $L_{A1041}$ | H | $R^{B5}$ | $R^{C3}$ | N |
| $L_{A1042}$ | H | $R^{B7}$ | $R^{C3}$ | N |
| $L_{A1043}$ | H | $R^{A3}$ | $R^{C3}$ | N |
| $L_{A1044}$ | H | $R^{A34}$ | $R^{C3}$ | N |
| $L_{A1045}$ | H | $R^{A57}$ | $R^{C3}$ | N |
| $L_{A1046}$ | $R^{B1}$ | $R^{B1}$ | $R^{C3}$ | N |
| $L_{A1047}$ | $R^{B3}$ | $R^{B3}$ | $R^{C3}$ | N |
| $L_{A1048}$ | $R^{B4}$ | $R^{B4}$ | $R^{C3}$ | N |
| $L_{A1049}$ | $R^{B5}$ | $R^{B5}$ | $R^{C3}$ | N |

-continued

| Ligand | $R^3$ | $R^4$ | G | X |
|---|---|---|---|---|
| $L_{A1050}$ | $R^{B7}$ | $R^{B7}$ | $R^{C3}$ | N |
| $L_{A1051}$ | $R^{A3}$ | $R^{A3}$ | $R^{C3}$ | N |
| $L_{A1052}$ | $R^{A34}$ | $R^{A34}$ | $R^{C3}$ | N |
| $L_{A1053}$ | $R^{A57}$ | $R^{A57}$ | $R^{C3}$ | N |
| $L_{A1054}$ | $R^{B3}$ | $R^{B1}$ | $R^{C3}$ | N |
| $L_{A1055}$ | $R^{B4}$ | $R^{B1}$ | $R^{C3}$ | N |
| $L_{A1056}$ | $R^{B5}$ | $R^{B1}$ | $R^{C3}$ | N |
| $L_{A1057}$ | $R^{B7}$ | $R^{B1}$ | $R^{C3}$ | N |
| $L_{A1058}$ | $R^{A3}$ | $R^{B1}$ | $R^{C3}$ | N |
| $L_{A1059}$ | $R^{A34}$ | $R^{B1}$ | $R^{C3}$ | N |
| $L_{A1060}$ | $R^{A57}$ | $R^{B1}$ | $R^{C3}$ | N |
| $L_{A1061}$ | $R^{B1}$ | $R^{B3}$ | $R^{C3}$ | N |
| $L_{A1062}$ | $R^{B1}$ | $R^{B4}$ | $R^{C3}$ | N |
| $L_{A1063}$ | $R^{B1}$ | $R^{B5}$ | $R^{C3}$ | N |
| $L_{A1064}$ | $R^{B1}$ | $R^{B7}$ | $R^{C3}$ | N |
| $L_{A1065}$ | $R^{B1}$ | $R^{A3}$ | $R^{C3}$ | N |
| $L_{A1066}$ | $R^{B1}$ | $R^{A34}$ | $R^{C3}$ | N |
| $L_{A1067}$ | $R^{B1}$ | $R^{A57}$ | $R^{C3}$ | N |
| $L_{A1068}$ | $R^{B1}$ | H | $R^{C8}$ | N |
| $L_{A1069}$ | $R^{B3}$ | H | $R^{C8}$ | N |
| $L_{A1070}$ | $R^{B4}$ | H | $R^{C8}$ | N |
| $L_{A1071}$ | $R^{B5}$ | H | $R^{C8}$ | N |
| $L_{A1072}$ | $R^{B7}$ | H | $R^{C8}$ | N |
| $L_{A1073}$ | $R^{A3}$ | H | $R^{C8}$ | N |
| $L_{A1074}$ | $R^{A34}$ | H | $R^{C8}$ | N |
| $L_{A1075}$ | $R^{A57}$ | H | $R^{C8}$ | N |
| $L_{A1076}$ | H | $R^{B1}$ | $R^{C8}$ | N |
| $L_{A1077}$ | H | $R^{B3}$ | $R^{C8}$ | N |
| $L_{A1078}$ | H | $R^{B4}$ | $R^{C8}$ | N |
| $L_{A1079}$ | H | $R^{B5}$ | $R^{C8}$ | N |
| $L_{A1080}$ | H | $R^{B7}$ | $R^{C8}$ | N |
| $L_{A1081}$ | H | $R^{A3}$ | $R^{C8}$ | N |
| $L_{A1082}$ | H | $R^{A34}$ | $R^{C8}$ | N |
| $L_{A1083}$ | H | $R^{A57}$ | $R^{C8}$ | N |
| $L_{A1084}$ | $R^{B1}$ | $R^{B1}$ | $R^{C8}$ | N |
| $L_{A1085}$ | $R^{B3}$ | $R^{B3}$ | $R^{C8}$ | N |
| $L_{A1086}$ | $R^{B4}$ | $R^{B4}$ | $R^{C8}$ | N |
| $L_{A1087}$ | $R^{B5}$ | $R^{B5}$ | $R^{C8}$ | N |
| $L_{A1088}$ | $R^{B7}$ | $R^{B7}$ | $R^{C8}$ | N |
| $L_{A1089}$ | $R^{A3}$ | $R^{A3}$ | $R^{C8}$ | N |
| $L_{A1090}$ | $R^{A34}$ | $R^{A34}$ | $R^{C8}$ | N |
| $L_{A1091}$ | $R^{A57}$ | $R^{A57}$ | $R^{C8}$ | N |
| $L_{A1092}$ | $R^{B3}$ | $R^{B1}$ | $R^{C8}$ | N |
| $L_{A1093}$ | $R^{B4}$ | $R^{B1}$ | $R^{C8}$ | N |
| $L_{A1094}$ | $R^{B5}$ | $R^{B1}$ | $R^{C8}$ | N |
| $L_{A1095}$ | $R^{B7}$ | $R^{B1}$ | $R^{C8}$ | N |
| $L_{A1096}$ | $R^{A3}$ | $R^{B1}$ | $R^{C8}$ | N |
| $L_{A1097}$ | $R^{A34}$ | $R^{B1}$ | $R^{C8}$ | N |
| $L_{A1098}$ | $R^{A57}$ | $R^{B1}$ | $R^{C8}$ | N |
| $L_{A1099}$ | $R^{B1}$ | $R^{B3}$ | $R^{C8}$ | N |
| $L_{A1100}$ | $R^{B1}$ | $R^{B4}$ | $R^{C8}$ | N |
| $L_{A1101}$ | $R^{B1}$ | $R^{B5}$ | $R^{C8}$ | N |
| $L_{A1102}$ | $R^{B1}$ | $R^{B7}$ | $R^{C8}$ | N |
| $L_{A1103}$ | $R^{B1}$ | $R^{A3}$ | $R^{C8}$ | N |
| $L_{A1104}$ | $R^{B1}$ | $R^{A34}$ | $R^{C8}$ | N |
| $L_{A1105}$ | $R^{B1}$ | $R^{A57}$ | $R^{C8}$ | N |
| $L_{A1106}$ | $R^{B1}$ | H | $R^{C9}$ | N |
| $L_{A1107}$ | $R^{B3}$ | H | $R^{C9}$ | N |
| $L_{A1108}$ | $R^{B4}$ | H | $R^{C9}$ | N |
| $L_{A1109}$ | $R^{B5}$ | H | $R^{C9}$ | N |
| $L_{A1110}$ | $R^{B7}$ | H | $R^{C9}$ | N |
| $L_{A1111}$ | $R^{A3}$ | H | $R^{C9}$ | N |
| $L_{A1112}$ | $R^{A34}$ | H | $R^{C9}$ | N |
| $L_{A1113}$ | $R^{A57}$ | H | $R^{C9}$ | N |
| $L_{A1114}$ | H | $R^{B1}$ | $R^{C9}$ | N |
| $L_{A1115}$ | H | $R^{B3}$ | $R^{C9}$ | N |
| $L_{A1116}$ | H | $R^{B4}$ | $R^{C9}$ | N |
| $L_{A1117}$ | H | $R^{B5}$ | $R^{C9}$ | N |
| $L_{A1118}$ | H | $R^{B7}$ | $R^{C9}$ | N |
| $L_{A1119}$ | H | $R^{A3}$ | $R^{C9}$ | N |
| $L_{A1120}$ | H | $R^{A34}$ | $R^{C9}$ | N |
| $L_{A1121}$ | H | $R^{A57}$ | $R^{C9}$ | N |
| $L_{A1122}$ | $R^{B1}$ | $R^{B1}$ | $R^{C9}$ | N |
| $L_{A1123}$ | $R^{B3}$ | $R^{B3}$ | $R^{C9}$ | N |
| $L_{A1124}$ | $R^{B4}$ | $R^{B4}$ | $R^{C9}$ | N |
| $L_{A1125}$ | $R^{B5}$ | $R^{B5}$ | $R^{C9}$ | N |
| $L_{A1126}$ | $R^{B7}$ | $R^{B7}$ | $R^{C9}$ | N |
| $L_{A1127}$ | $R^{A3}$ | $R^{A3}$ | $R^{C9}$ | N |
| $L_{A1128}$ | $R^{A34}$ | $R^{A34}$ | $R^{C9}$ | N |
| $L_{A1129}$ | $R^{A57}$ | $R^{A57}$ | $R^{C9}$ | N |
| $L_{A1130}$ | $R^{B3}$ | $R^{B1}$ | $R^{C9}$ | N |
| $L_{A1131}$ | $R^{B4}$ | $R^{B1}$ | $R^{C9}$ | N |
| $L_{A1132}$ | $R^{B5}$ | $R^{B1}$ | $R^{C9}$ | N |
| $L_{A1133}$ | $R^{B7}$ | $R^{B1}$ | $R^{C9}$ | N |
| $L_{A1134}$ | $R^{A3}$ | $R^{B1}$ | $R^{C9}$ | N |
| $L_{A1135}$ | $R^{A34}$ | $R^{B1}$ | $R^{C9}$ | N |
| $L_{A1136}$ | $R^{A57}$ | $R^{B1}$ | $R^{C9}$ | N |
| $L_{A1137}$ | $R^{B1}$ | $R^{B3}$ | $R^{C9}$ | N |
| $L_{A1138}$ | $R^{B1}$ | $R^{B4}$ | $R^{C9}$ | N |
| $L_{A1139}$ | $R^{B1}$ | $R^{B5}$ | $R^{C9}$ | N |
| $L_{A1140}$ | $R^{B1}$ | $R^{B7}$ | $R^{C9}$ | N |
| $L_{A1141}$ | $R^{B1}$ | $R^{A3}$ | $R^{C9}$ | N |
| $L_{A1142}$ | $R^{B1}$ | $R^{A34}$ | $R^{C9}$ | N |
| $L_{A1143}$ | $R^{B1}$ | $R^{A57}$ | $R^{C9}$ | N |

$L_{A1144}$ through $L_{A1524}$ are based on a structure of Formula V,

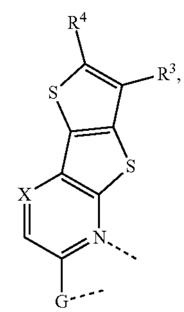

in which $R^3$, $R^4$, X and G are defined as:

| Ligand | $R^3$ | $R^4$ | G | X |
|---|---|---|---|---|
| $L_{A1144}$ | H | H | $R^{C1}$ | C |
| $L_{A1145}$ | $R^{B1}$ | H | $R^{C1}$ | C |
| $L_{A1146}$ | $R^{B3}$ | H | $R^{C1}$ | C |
| $L_{A1147}$ | $R^{B4}$ | H | $R^{C1}$ | C |
| $L_{A1148}$ | $R^{B5}$ | H | $R^{C1}$ | C |
| $L_{A1149}$ | $R^{B7}$ | H | $R^{C1}$ | C |
| $L_{A1150}$ | $R^{A3}$ | H | $R^{C1}$ | C |
| $L_{A1151}$ | $R^{A34}$ | H | $R^{C1}$ | C |
| $L_{A1152}$ | $R^{A57}$ | H | $R^{C1}$ | C |
| $L_{A1153}$ | H | $R^{B1}$ | $R^{C1}$ | C |
| $L_{A1154}$ | H | $R^{B3}$ | $R^{C1}$ | C |
| $L_{A1155}$ | H | $R^{B4}$ | $R^{C1}$ | C |
| $L_{A1156}$ | H | $R^{B5}$ | $R^{C1}$ | C |
| $L_{A1157}$ | H | $R^{B7}$ | $R^{C1}$ | C |
| $L_{A1158}$ | H | $R^{A3}$ | $R^{C1}$ | C |
| $L_{A1159}$ | H | $R^{A34}$ | $R^{C1}$ | C |
| $L_{A1160}$ | H | $R^{A57}$ | $R^{C1}$ | C |
| $L_{A1161}$ | $R^{B1}$ | $R^{B1}$ | $R^{C1}$ | C |
| $L_{A1162}$ | $R^{B3}$ | $R^{B3}$ | $R^{C1}$ | C |
| $L_{A1163}$ | $R^{B4}$ | $R^{B4}$ | $R^{C1}$ | C |
| $L_{A1164}$ | $R^{B5}$ | $R^{B5}$ | $R^{C1}$ | C |
| $L_{A1165}$ | $R^{B7}$ | $R^{B7}$ | $R^{C1}$ | C |
| $L_{A1166}$ | $R^{A3}$ | $R^{A3}$ | $R^{C1}$ | C |
| $L_{A1167}$ | $R^{A34}$ | $R^{A34}$ | $R^{C1}$ | C |
| $L_{A1168}$ | $R^{A57}$ | $R^{A57}$ | $R^{C1}$ | C |
| $L_{A1169}$ | $R^{B3}$ | $R^{B1}$ | $R^{C1}$ | C |
| $L_{A1170}$ | $R^{B4}$ | $R^{B1}$ | $R^{C1}$ | C |
| $L_{A1171}$ | $R^{B5}$ | $R^{B1}$ | $R^{C1}$ | C |
| $L_{A1172}$ | $R^{B7}$ | $R^{B1}$ | $R^{C1}$ | C |
| $L_{A1173}$ | $R^{A3}$ | $R^{B1}$ | $R^{C1}$ | C |
| $L_{A1174}$ | $R^{A34}$ | $R^{B1}$ | $R^{C1}$ | C |
| $L_{A1175}$ | $R^{A57}$ | $R^{B1}$ | $R^{C1}$ | C |
| $L_{A1176}$ | $R^{B1}$ | $R^{B3}$ | $R^{C1}$ | C |

-continued

| Ligand | $R^3$ | $R^4$ | G | X |
|---|---|---|---|---|
| $L_{A1177}$ | $R^{B1}$ | $R^{B4}$ | $R^{C1}$ | C |
| $L_{A1178}$ | $R^{B1}$ | $R^{B5}$ | $R^{C1}$ | C |
| $L_{A1179}$ | $R^{B1}$ | $R^{B7}$ | $R^{C1}$ | C |
| $L_{A1180}$ | $R^{B1}$ | $R^{A3}$ | $R^{C1}$ | C |
| $L_{A1181}$ | $R^{B1}$ | $R^{A34}$ | $R^{C1}$ | C |
| $L_{A1182}$ | $R^{B1}$ | $R^{A57}$ | $R^{C1}$ | C |
| $L_{A1183}$ | $R^{B1}$ | H | $R^{C2}$ | C |
| $L_{A1184}$ | $R^{B3}$ | H | $R^{C2}$ | C |
| $L_{A1185}$ | $R^{B4}$ | H | $R^{C2}$ | C |
| $L_{A1186}$ | $R^{B5}$ | H | $R^{C2}$ | C |
| $L_{A1187}$ | $R^{B7}$ | H | $R^{C2}$ | C |
| $L_{A1188}$ | $R^{A3}$ | H | $R^{C2}$ | C |
| $L_{A1189}$ | $R^{A34}$ | H | $R^{C2}$ | C |
| $L_{A1190}$ | $R^{A57}$ | H | $R^{C2}$ | C |
| $L_{A1191}$ | H | $R^{B1}$ | $R^{C2}$ | C |
| $L_{A1192}$ | H | $R^{B3}$ | $R^{C2}$ | C |
| $L_{A1193}$ | H | $R^{B4}$ | $R^{C2}$ | C |
| $L_{A1194}$ | H | $R^{B5}$ | $R^{C2}$ | C |
| $L_{A1195}$ | H | $R^{B7}$ | $R^{C2}$ | C |
| $L_{A1196}$ | H | $R^{A3}$ | $R^{C2}$ | C |
| $L_{A1197}$ | H | $R^{A34}$ | $R^{C2}$ | C |
| $L_{A1198}$ | H | $R^{A57}$ | $R^{C2}$ | C |
| $L_{A1199}$ | $R^{B1}$ | $R^{B1}$ | $R^{C2}$ | C |
| $L_{A1200}$ | $R^{B3}$ | $R^{B3}$ | $R^{C2}$ | C |
| $L_{A1201}$ | $R^{B4}$ | $R^{B4}$ | $R^{C2}$ | C |
| $L_{A1202}$ | $R^{B5}$ | $R^{B5}$ | $R^{C2}$ | C |
| $L_{A1203}$ | $R^{B7}$ | $R^{B7}$ | $R^{C2}$ | C |
| $L_{A1204}$ | $R^{A3}$ | $R^{A3}$ | $R^{C2}$ | C |
| $L_{A1205}$ | $R^{A34}$ | $R^{A34}$ | $R^{C2}$ | C |
| $L_{A1206}$ | $R^{A57}$ | $R^{A57}$ | $R^{C2}$ | C |
| $L_{A1207}$ | $R^{B3}$ | $R^{B1}$ | $R^{C2}$ | C |
| $L_{A1208}$ | $R^{B4}$ | $R^{B1}$ | $R^{C2}$ | C |
| $L_{A1209}$ | $R^{B5}$ | $R^{B1}$ | $R^{C2}$ | C |
| $L_{A1210}$ | $R^{B7}$ | $R^{B1}$ | $R^{C2}$ | C |
| $L_{A1211}$ | $R^{A3}$ | $R^{B1}$ | $R^{C2}$ | C |
| $L_{A1212}$ | $R^{A34}$ | $R^{B1}$ | $R^{C2}$ | C |
| $L_{A1213}$ | $R^{A57}$ | $R^{B1}$ | $R^{C2}$ | C |
| $L_{A1214}$ | $R^{B1}$ | $R^{B3}$ | $R^{C2}$ | C |
| $L_{A1215}$ | $R^{B1}$ | $R^{B4}$ | $R^{C2}$ | C |
| $L_{A1216}$ | $R^{B1}$ | $R^{B5}$ | $R^{C2}$ | C |
| $L_{A1217}$ | $R^{B1}$ | $R^{B7}$ | $R^{C2}$ | C |
| $L_{A1218}$ | $R^{B1}$ | $R^{A3}$ | $R^{C2}$ | C |
| $L_{A1219}$ | $R^{B1}$ | $R^{A34}$ | $R^{C2}$ | C |
| $L_{A1220}$ | $R^{B1}$ | $R^{A57}$ | $R^{C2}$ | C |
| $L_{A1221}$ | $R^{B1}$ | H | $R^{C3}$ | C |
| $L_{A1222}$ | $R^{B3}$ | H | $R^{C3}$ | C |
| $L_{A1223}$ | $R^{B4}$ | H | $R^{C3}$ | C |
| $L_{A1224}$ | $R^{B5}$ | H | $R^{C3}$ | C |
| $L_{A1225}$ | $R^{B7}$ | H | $R^{C3}$ | C |
| $L_{A1226}$ | $R^{A3}$ | H | $R^{C3}$ | C |
| $L_{A1227}$ | $R^{A34}$ | H | $R^{C3}$ | C |
| $L_{A1228}$ | $R^{A57}$ | H | $R^{C3}$ | C |
| $L_{A1229}$ | H | $R^{B1}$ | $R^{C3}$ | C |
| $L_{A1230}$ | H | $R^{B3}$ | $R^{C3}$ | C |
| $L_{A1231}$ | H | $R^{B4}$ | $R^{C3}$ | C |
| $L_{A1232}$ | H | $R^{B5}$ | $R^{C3}$ | C |
| $L_{A1233}$ | H | $R^{B7}$ | $R^{C3}$ | C |
| $L_{A1234}$ | H | $R^{A3}$ | $R^{C3}$ | C |
| $L_{A1235}$ | H | $R^{A34}$ | $R^{C3}$ | C |
| $L_{A1236}$ | H | $R^{A57}$ | $R^{C3}$ | C |
| $L_{A1237}$ | $R^{B1}$ | $R^{B1}$ | $R^{C3}$ | C |
| $L_{A1238}$ | $R^{B3}$ | $R^{B3}$ | $R^{C3}$ | C |
| $L_{A1239}$ | $R^{B4}$ | $R^{B4}$ | $R^{C3}$ | C |
| $L_{A1240}$ | $R^{B5}$ | $R^{B5}$ | $R^{C3}$ | C |
| $L_{A1241}$ | $R^{B7}$ | $R^{B7}$ | $R^{C3}$ | C |
| $L_{A1242}$ | $R^{A3}$ | $R^{A3}$ | $R^{C3}$ | C |
| $L_{A1243}$ | $R^{A34}$ | $R^{A34}$ | $R^{C3}$ | C |
| $L_{A1244}$ | $R^{A57}$ | $R^{A57}$ | $R^{C3}$ | C |
| $L_{A1245}$ | $R^{B3}$ | $R^{B1}$ | $R^{C3}$ | C |
| $L_{A1246}$ | $R^{B4}$ | $R^{B1}$ | $R^{C3}$ | C |
| $L_{A1247}$ | $R^{B5}$ | $R^{B1}$ | $R^{C3}$ | C |
| $L_{A1248}$ | $R^{B7}$ | $R^{B1}$ | $R^{C3}$ | C |
| $L_{A1249}$ | $R^{A3}$ | $R^{B1}$ | $R^{C3}$ | C |
| $L_{A1250}$ | $R^{A34}$ | $R^{B1}$ | $R^{C3}$ | C |
| $L_{A1251}$ | $R^{A57}$ | $R^{B1}$ | $R^{C3}$ | C |
| $L_{A1252}$ | $R^{B1}$ | $R^{B3}$ | $R^{C3}$ | C |
| $L_{A1253}$ | $R^{B1}$ | $R^{B4}$ | $R^{C3}$ | C |
| $L_{A1254}$ | $R^{B1}$ | $R^{B5}$ | $R^{C3}$ | C |
| $L_{A1255}$ | $R^{B1}$ | $R^{B7}$ | $R^{C3}$ | C |
| $L_{A1256}$ | $R^{B1}$ | $R^{A3}$ | $R^{C3}$ | C |
| $L_{A1257}$ | $R^{B1}$ | $R^{A34}$ | $R^{C3}$ | C |
| $L_{A1258}$ | $R^{B1}$ | $R^{A57}$ | $R^{C3}$ | C |
| $L_{A1259}$ | $R^{B1}$ | H | $R^{C8}$ | C |
| $L_{A1260}$ | $R^{B3}$ | H | $R^{C8}$ | C |
| $L_{A1261}$ | $R^{B4}$ | H | $R^{C8}$ | C |
| $L_{A1262}$ | $R^{B5}$ | H | $R^{C8}$ | C |
| $L_{A1263}$ | $R^{B7}$ | H | $R^{C8}$ | C |
| $L_{A1264}$ | $R^{A3}$ | H | $R^{C8}$ | C |
| $L_{A1265}$ | $R^{A34}$ | H | $R^{C8}$ | C |
| $L_{A1266}$ | $R^{A57}$ | H | $R^{C8}$ | C |
| $L_{A1267}$ | H | $R^{B1}$ | $R^{C8}$ | C |
| $L_{A1268}$ | H | $R^{B3}$ | $R^{C8}$ | C |
| $L_{A1269}$ | H | $R^{B4}$ | $R^{C8}$ | C |
| $L_{A1270}$ | H | $R^{B5}$ | $R^{C8}$ | C |
| $L_{A1271}$ | H | $R^{B7}$ | $R^{C8}$ | C |
| $L_{A1272}$ | H | $R^{A3}$ | $R^{C8}$ | C |
| $L_{A1273}$ | H | $R^{A34}$ | $R^{C8}$ | C |
| $L_{A1274}$ | H | $R^{A57}$ | $R^{C8}$ | C |
| $L_{A1275}$ | $R^{B1}$ | $R^{B1}$ | $R^{C8}$ | C |
| $L_{A1276}$ | $R^{B3}$ | $R^{B3}$ | $R^{C8}$ | C |
| $L_{A1277}$ | $R^{B4}$ | $R^{B4}$ | $R^{C8}$ | C |
| $L_{A1278}$ | $R^{B5}$ | $R^{B5}$ | $R^{C8}$ | C |
| $L_{A1279}$ | $R^{B7}$ | $R^{B7}$ | $R^{C8}$ | C |
| $L_{A1280}$ | $R^{A3}$ | $R^{A3}$ | $R^{C8}$ | C |
| $L_{A1281}$ | $R^{A34}$ | $R^{A34}$ | $R^{C8}$ | C |
| $L_{A1282}$ | $R^{A57}$ | $R^{A57}$ | $R^{C8}$ | C |
| $L_{A1283}$ | $R^{B3}$ | $R^{B1}$ | $R^{C8}$ | C |
| $L_{A1284}$ | $R^{B4}$ | $R^{B1}$ | $R^{C8}$ | C |
| $L_{A1285}$ | $R^{B5}$ | $R^{B1}$ | $R^{C8}$ | C |
| $L_{A1286}$ | $R^{B7}$ | $R^{B1}$ | $R^{C8}$ | C |
| $L_{A1287}$ | $R^{A3}$ | $R^{B1}$ | $R^{C8}$ | C |
| $L_{A1288}$ | $R^{A34}$ | $R^{B1}$ | $R^{C8}$ | C |
| $L_{A1289}$ | $R^{A57}$ | $R^{B1}$ | $R^{C8}$ | C |
| $L_{A1290}$ | $R^{B1}$ | $R^{B3}$ | $R^{C8}$ | C |
| $L_{A1291}$ | $R^{B1}$ | $R^{B4}$ | $R^{C8}$ | C |
| $L_{A1292}$ | $R^{B1}$ | $R^{B5}$ | $R^{C8}$ | C |
| $L_{A1293}$ | $R^{B1}$ | $R^{B7}$ | $R^{C8}$ | C |
| $L_{A1294}$ | $R^{B1}$ | $R^{A3}$ | $R^{C8}$ | C |
| $L_{A1295}$ | $R^{B1}$ | $R^{A34}$ | $R^{C8}$ | C |
| $L_{A1296}$ | $R^{B1}$ | $R^{A57}$ | $R^{C8}$ | C |
| $L_{A1297}$ | $R^{B1}$ | H | $R^{C9}$ | C |
| $L_{A1298}$ | $R^{B3}$ | H | $R^{C9}$ | C |
| $L_{A1299}$ | $R^{B4}$ | H | $R^{C9}$ | C |
| $L_{A1300}$ | $R^{B5}$ | H | $R^{C9}$ | C |
| $L_{A1301}$ | $R^{B7}$ | H | $R^{C9}$ | C |
| $L_{A1302}$ | $R^{A3}$ | H | $R^{C9}$ | C |
| $L_{A1303}$ | $R^{A34}$ | H | $R^{C9}$ | C |
| $L_{A1304}$ | $R^{A57}$ | H | $R^{C9}$ | C |
| $L_{A1305}$ | H | $R^{B1}$ | $R^{C9}$ | C |
| $L_{A1306}$ | H | $R^{B3}$ | $R^{C9}$ | C |
| $L_{A1307}$ | H | $R^{B4}$ | $R^{C9}$ | C |
| $L_{A1308}$ | H | $R^{B5}$ | $R^{C9}$ | C |
| $L_{A1309}$ | H | $R^{B7}$ | $R^{C9}$ | C |
| $L_{A1310}$ | H | $R^{A3}$ | $R^{C9}$ | C |
| $L_{A1311}$ | H | $R^{A34}$ | $R^{C9}$ | C |
| $L_{A1312}$ | H | $R^{A57}$ | $R^{C9}$ | C |
| $L_{A1313}$ | $R^{B1}$ | $R^{B1}$ | $R^{C9}$ | C |
| $L_{A1314}$ | $R^{B3}$ | $R^{B3}$ | $R^{C9}$ | C |
| $L_{A1315}$ | $R^{B4}$ | $R^{B4}$ | $R^{C9}$ | C |
| $L_{A1316}$ | $R^{B5}$ | $R^{B5}$ | $R^{C9}$ | C |
| $L_{A1317}$ | $R^{B7}$ | $R^{B7}$ | $R^{C9}$ | C |
| $L_{A1318}$ | $R^{A3}$ | $R^{A3}$ | $R^{C9}$ | C |
| $L_{A1319}$ | $R^{A34}$ | $R^{A34}$ | $R^{C9}$ | C |
| $L_{A1320}$ | $R^{A57}$ | $R^{A57}$ | $R^{C9}$ | C |
| $L_{A1321}$ | $R^{B3}$ | $R^{B1}$ | $R^{C9}$ | C |
| $L_{A1322}$ | $R^{B4}$ | $R^{B1}$ | $R^{C9}$ | C |
| $L_{A1323}$ | $R^{B5}$ | $R^{B1}$ | $R^{C9}$ | C |
| $L_{A1324}$ | $R^{B7}$ | $R^{B1}$ | $R^{C9}$ | C |
| $L_{A1325}$ | $R^{A3}$ | $R^{B1}$ | $R^{C9}$ | C |
| $L_{A1326}$ | $R^{A34}$ | $R^{B1}$ | $R^{C9}$ | C |
| $L_{A1327}$ | $R^{A57}$ | $R^{B1}$ | $R^{C9}$ | C |
| $L_{A1328}$ | $R^{B1}$ | $R^{B3}$ | $R^{C9}$ | C |
| $L_{A1329}$ | $R^{B1}$ | $R^{B4}$ | $R^{C9}$ | C |
| $L_{A1330}$ | $R^{B1}$ | $R^{B5}$ | $R^{C9}$ | C |

-continued

| Ligand | $R^3$ | $R^4$ | G | X |
|---|---|---|---|---|
| $L_{A1331}$ | $R^{B1}$ | $R^{B7}$ | $R^{C9}$ | C |
| $L_{A1332}$ | $R^{B1}$ | $R^{A3}$ | $R^{C9}$ | C |
| $L_{A1333}$ | $R^{B1}$ | $R^{A34}$ | $R^{C9}$ | C |
| $L_{A1334}$ | $R^{B1}$ | $R^{A57}$ | $R^{C9}$ | C |
| $L_{A1335}$ | $R^{B1}$ | H | $R^{C1}$ | N |
| $L_{A1336}$ | $R^{B3}$ | H | $R^{C1}$ | N |
| $L_{A1337}$ | $R^{B4}$ | H | $R^{C1}$ | N |
| $L_{A1338}$ | $R^{B5}$ | H | $R^{C1}$ | N |
| $L_{A1339}$ | $R^{B7}$ | H | $R^{C1}$ | N |
| $L_{A1340}$ | $R^{A3}$ | H | $R^{C1}$ | N |
| $L_{A1341}$ | $R^{A34}$ | H | $R^{C1}$ | N |
| $L_{A1342}$ | $R^{A57}$ | H | $R^{C1}$ | N |
| $L_{A1343}$ | H | $R^{B1}$ | $R^{C1}$ | N |
| $L_{A1344}$ | H | $R^{B3}$ | $R^{C1}$ | N |
| $L_{A1345}$ | H | $R^{B4}$ | $R^{C1}$ | N |
| $L_{A1346}$ | H | $R^{B5}$ | $R^{C1}$ | N |
| $L_{A1347}$ | H | $R^{B7}$ | $R^{C1}$ | N |
| $L_{A1348}$ | H | $R^{A3}$ | $R^{C1}$ | N |
| $L_{A1349}$ | H | $R^{A34}$ | $R^{C1}$ | N |
| $L_{A1350}$ | H | $R^{A57}$ | $R^{C1}$ | N |
| $L_{A1351}$ | $R^{B1}$ | $R^{B1}$ | $R^{C1}$ | N |
| $L_{A1352}$ | $R^{B3}$ | $R^{B3}$ | $R^{C1}$ | N |
| $L_{A1353}$ | $R^{B4}$ | $R^{B4}$ | $R^{C1}$ | N |
| $L_{A1354}$ | $R^{B5}$ | $R^{B5}$ | $R^{C1}$ | N |
| $L_{A1355}$ | $R^{B7}$ | $R^{B7}$ | $R^{C1}$ | N |
| $L_{A1356}$ | $R^{A3}$ | $R^{A3}$ | $R^{C1}$ | N |
| $L_{A1357}$ | $R^{A34}$ | $R^{A34}$ | $R^{C1}$ | N |
| $L_{A1358}$ | $R^{A57}$ | $R^{A57}$ | $R^{C1}$ | N |
| $L_{A1359}$ | $R^{B3}$ | $R^{B1}$ | $R^{C1}$ | N |
| $L_{A1360}$ | $R^{B4}$ | $R^{B1}$ | $R^{C1}$ | N |
| $L_{A1361}$ | $R^{B5}$ | $R^{B1}$ | $R^{C1}$ | N |
| $L_{A1362}$ | $R^{B7}$ | $R^{B1}$ | $R^{C1}$ | N |
| $L_{A1363}$ | $R^{A3}$ | $R^{B1}$ | $R^{C1}$ | N |
| $L_{A1364}$ | $R^{A34}$ | $R^{B1}$ | $R^{C1}$ | N |
| $L_{A1365}$ | $R^{A57}$ | $R^{B1}$ | $R^{C1}$ | N |
| $L_{A1366}$ | $R^{B1}$ | $R^{B3}$ | $R^{C1}$ | N |
| $L_{A1367}$ | $R^{B1}$ | $R^{B4}$ | $R^{C1}$ | N |
| $L_{A1368}$ | $R^{B1}$ | $R^{B5}$ | $R^{C1}$ | N |
| $L_{A1369}$ | $R^{B1}$ | $R^{B7}$ | $R^{C1}$ | N |
| $L_{A1370}$ | $R^{B1}$ | $R^{A3}$ | $R^{C1}$ | N |
| $L_{A1371}$ | $R^{B1}$ | $R^{A34}$ | $R^{C1}$ | N |
| $L_{A1372}$ | $R^{B1}$ | $R^{A57}$ | $R^{C1}$ | N |
| $L_{A1373}$ | $R^{B1}$ | H | $R^{C2}$ | N |
| $L_{A1374}$ | $R^{B3}$ | H | $R^{C2}$ | N |
| $L_{A1375}$ | $R^{B4}$ | H | $R^{C2}$ | N |
| $L_{A1376}$ | $R^{B5}$ | H | $R^{C2}$ | N |
| $L_{A1377}$ | $R^{B7}$ | H | $R^{C2}$ | N |
| $L_{A1378}$ | $R^{A3}$ | H | $R^{C2}$ | N |
| $L_{A1379}$ | $R^{A34}$ | H | $R^{C2}$ | N |
| $L_{A1380}$ | $R^{A57}$ | H | $R^{C2}$ | N |
| $L_{A1381}$ | H | $R^{B1}$ | $R^{C2}$ | N |
| $L_{A1382}$ | H | $R^{B3}$ | $R^{C2}$ | N |
| $L_{A1383}$ | H | $R^{B4}$ | $R^{C2}$ | N |
| $L_{A1384}$ | H | $R^{B5}$ | $R^{C2}$ | N |
| $L_{A1385}$ | H | $R^{B7}$ | $R^{C2}$ | N |
| $L_{A1386}$ | H | $R^{A3}$ | $R^{C2}$ | N |
| $L_{A1387}$ | H | $R^{A34}$ | $R^{C2}$ | N |
| $L_{A1388}$ | H | $R^{A57}$ | $R^{C2}$ | N |
| $L_{A1389}$ | $R^{B1}$ | $R^{B1}$ | $R^{C2}$ | N |
| $L_{A1390}$ | $R^{B3}$ | $R^{B3}$ | $R^{C2}$ | N |
| $L_{A1391}$ | $R^{B4}$ | $R^{B4}$ | $R^{C2}$ | N |
| $L_{A1392}$ | $R^{B5}$ | $R^{B5}$ | $R^{C2}$ | N |
| $L_{A1393}$ | $R^{B7}$ | $R^{B7}$ | $R^{C2}$ | N |
| $L_{A1394}$ | $R^{A3}$ | $R^{A3}$ | $R^{C2}$ | N |
| $L_{A1395}$ | $R^{A34}$ | $R^{A34}$ | $R^{C2}$ | N |
| $L_{A1396}$ | $R^{A57}$ | $R^{A57}$ | $R^{C2}$ | N |
| $L_{A1397}$ | $R^{B3}$ | $R^{B1}$ | $R^{C2}$ | N |
| $L_{A1398}$ | $R^{B4}$ | $R^{B1}$ | $R^{C2}$ | N |
| $L_{A1399}$ | $R^{B5}$ | $R^{B1}$ | $R^{C2}$ | N |
| $L_{A1400}$ | $R^{B7}$ | $R^{B1}$ | $R^{C2}$ | N |
| $L_{A1401}$ | $R^{A3}$ | $R^{B1}$ | $R^{C2}$ | N |
| $L_{A1402}$ | $R^{A34}$ | $R^{B1}$ | $R^{C2}$ | N |
| $L_{A1403}$ | $R^{A57}$ | $R^{B1}$ | $R^{C2}$ | N |
| $L_{A1404}$ | $R^{B1}$ | $R^{B3}$ | $R^{C2}$ | N |
| $L_{A1405}$ | $R^{B1}$ | $R^{B4}$ | $R^{C2}$ | N |
| $L_{A1406}$ | $R^{B1}$ | $R^{B5}$ | $R^{C2}$ | N |
| $L_{A1407}$ | $R^{B1}$ | $R^{B7}$ | $R^{C2}$ | N |

-continued

| Ligand | $R^3$ | $R^4$ | G | X |
|---|---|---|---|---|
| $L_{A1408}$ | $R^{B1}$ | $R^{A3}$ | $R^{C2}$ | N |
| $L_{A1409}$ | $R^{B1}$ | $R^{A34}$ | $R^{C2}$ | N |
| $L_{A1410}$ | $R^{B1}$ | $R^{A57}$ | $R^{C2}$ | N |
| $L_{A1411}$ | $R^{B1}$ | H | $R^{C3}$ | N |
| $L_{A1412}$ | $R^{B3}$ | H | $R^{C3}$ | N |
| $L_{A1413}$ | $R^{B4}$ | H | $R^{C3}$ | N |
| $L_{A1414}$ | $R^{B5}$ | H | $R^{C3}$ | N |
| $L_{A1415}$ | $R^{B7}$ | H | $R^{C3}$ | N |
| $L_{A1416}$ | $R^{A3}$ | H | $R^{C3}$ | N |
| $L_{A1417}$ | $R^{A34}$ | H | $R^{C3}$ | N |
| $L_{A1418}$ | $R^{A57}$ | H | $R^{C3}$ | N |
| $L_{A1419}$ | H | $R^{B1}$ | $R^{C3}$ | N |
| $L_{A1420}$ | H | $R^{B3}$ | $R^{C3}$ | N |
| $L_{A1421}$ | H | $R^{B4}$ | $R^{C3}$ | N |
| $L_{A1422}$ | H | $R^{B5}$ | $R^{C3}$ | N |
| $L_{A1423}$ | H | $R^{B7}$ | $R^{C3}$ | N |
| $L_{A1424}$ | H | $R^{A3}$ | $R^{C3}$ | N |
| $L_{A1425}$ | H | $R^{A34}$ | $R^{C3}$ | N |
| $L_{A1426}$ | H | $R^{A57}$ | $R^{C3}$ | N |
| $L_{A1427}$ | $R^{B1}$ | $R^{B1}$ | $R^{C3}$ | N |
| $L_{A1428}$ | $R^{B3}$ | $R^{B3}$ | $R^{C3}$ | N |
| $L_{A1429}$ | $R^{B4}$ | $R^{B4}$ | $R^{C3}$ | N |
| $L_{A1430}$ | $R^{B5}$ | $R^{B5}$ | $R^{C3}$ | N |
| $L_{A1431}$ | $R^{B7}$ | $R^{B7}$ | $R^{C3}$ | N |
| $L_{A1432}$ | $R^{A3}$ | $R^{A3}$ | $R^{C3}$ | N |
| $L_{A1433}$ | $R^{A34}$ | $R^{A34}$ | $R^{C3}$ | N |
| $L_{A1434}$ | $R^{A57}$ | $R^{A57}$ | $R^{C3}$ | N |
| $L_{A1435}$ | $R^{B3}$ | $R^{B1}$ | $R^{C3}$ | N |
| $L_{A1436}$ | $R^{B4}$ | $R^{B1}$ | $R^{C3}$ | N |
| $L_{A1437}$ | $R^{B5}$ | $R^{B1}$ | $R^{C3}$ | N |
| $L_{A1438}$ | $R^{B7}$ | $R^{B1}$ | $R^{C3}$ | N |
| $L_{A1439}$ | $R^{A3}$ | $R^{B1}$ | $R^{C3}$ | N |
| $L_{A1440}$ | $R^{A34}$ | $R^{B1}$ | $R^{C3}$ | N |
| $L_{A1441}$ | $R^{A57}$ | $R^{B1}$ | $R^{C3}$ | N |
| $L_{A1442}$ | $R^{B1}$ | $R^{B3}$ | $R^{C3}$ | N |
| $L_{A1443}$ | $R^{B1}$ | $R^{B4}$ | $R^{C3}$ | N |
| $L_{A1444}$ | $R^{B1}$ | $R^{B5}$ | $R^{C3}$ | N |
| $L_{A1445}$ | $R^{B1}$ | $R^{B7}$ | $R^{C3}$ | N |
| $L_{A1446}$ | $R^{B1}$ | $R^{A3}$ | $R^{C3}$ | N |
| $L_{A1447}$ | $R^{B1}$ | $R^{A34}$ | $R^{C3}$ | N |
| $L_{A1448}$ | $R^{B1}$ | $R^{A57}$ | $R^{C3}$ | N |
| $L_{A1449}$ | $R^{B1}$ | H | $R^{C8}$ | N |
| $L_{A1450}$ | $R^{B3}$ | H | $R^{C8}$ | N |
| $L_{A1451}$ | $R^{B4}$ | H | $R^{C8}$ | N |
| $L_{A1452}$ | $R^{B5}$ | H | $R^{C8}$ | N |
| $L_{A1453}$ | $R^{B7}$ | H | $R^{C8}$ | N |
| $L_{A1454}$ | $R^{A3}$ | H | $R^{C8}$ | N |
| $L_{A1455}$ | $R^{A34}$ | H | $R^{C8}$ | N |
| $L_{A1456}$ | $R^{A57}$ | H | $R^{C8}$ | N |
| $L_{A1457}$ | H | $R^{B1}$ | $R^{C8}$ | N |
| $L_{A1458}$ | H | $R^{B3}$ | $R^{C8}$ | N |
| $L_{A1459}$ | H | $R^{B4}$ | $R^{C8}$ | N |
| $L_{A1460}$ | H | $R^{B5}$ | $R^{C8}$ | N |
| $L_{A1461}$ | H | $R^{B7}$ | $R^{C8}$ | N |
| $L_{A1462}$ | H | $R^{A3}$ | $R^{C8}$ | N |
| $L_{A1463}$ | H | $R^{A34}$ | $R^{C8}$ | N |
| $L_{A1464}$ | H | $R^{A57}$ | $R^{C8}$ | N |
| $L_{A1465}$ | $R^{B1}$ | $R^{B1}$ | $R^{C8}$ | N |
| $L_{A1466}$ | $R^{B3}$ | $R^{B3}$ | $R^{C8}$ | N |
| $L_{A1467}$ | $R^{B4}$ | $R^{B4}$ | $R^{C8}$ | N |
| $L_{A1468}$ | $R^{B5}$ | $R^{B5}$ | $R^{C8}$ | N |
| $L_{A1469}$ | $R^{B7}$ | $R^{B7}$ | $R^{C8}$ | N |
| $L_{A1470}$ | $R^{A3}$ | $R^{A3}$ | $R^{C8}$ | N |
| $L_{A1471}$ | $R^{A34}$ | $R^{A34}$ | $R^{C8}$ | N |
| $L_{A1472}$ | $R^{A57}$ | $R^{A57}$ | $R^{C8}$ | N |
| $L_{A1473}$ | $R^{B3}$ | $R^{B1}$ | $R^{C8}$ | N |
| $L_{A1474}$ | $R^{B4}$ | $R^{B1}$ | $R^{C8}$ | N |
| $L_{A1475}$ | $R^{B5}$ | $R^{B1}$ | $R^{C8}$ | N |
| $L_{A1476}$ | $R^{B7}$ | $R^{B1}$ | $R^{C8}$ | N |
| $L_{A1477}$ | $R^{A3}$ | $R^{B1}$ | $R^{C8}$ | N |
| $L_{A1478}$ | $R^{A34}$ | $R^{B1}$ | $R^{C8}$ | N |
| $L_{A1479}$ | $R^{A57}$ | $R^{B1}$ | $R^{C8}$ | N |
| $L_{A1480}$ | $R^{B1}$ | $R^{B3}$ | $R^{C8}$ | N |
| $L_{A1481}$ | $R^{B1}$ | $R^{B4}$ | $R^{C8}$ | N |
| $L_{A1482}$ | $R^{B1}$ | $R^{B5}$ | $R^{C8}$ | N |
| $L_{A1483}$ | $R^{B1}$ | $R^{B7}$ | $R^{C8}$ | N |
| $L_{A1484}$ | $R^{B1}$ | $R^{A3}$ | $R^{C8}$ | N |

-continued

| Ligand | $R^3$ | $R^4$ | G | X |
|---|---|---|---|---|
| $L_{A1485}$ | $R^{B1}$ | $R^{A34}$ | $R^{C8}$ | N |
| $L_{A1486}$ | $R^{B1}$ | $R^{A57}$ | $R^{C8}$ | N |
| $L_{A1487}$ | $R^{B1}$ | H | $R^{C9}$ | N |
| $L_{A1488}$ | $R^{B3}$ | H | $R^{C9}$ | N |
| $L_{A1489}$ | $R^{B4}$ | H | $R^{C9}$ | N |
| $L_{A1490}$ | $R^{B5}$ | H | $R^{C9}$ | N |
| $L_{A1491}$ | $R^{B7}$ | H | $R^{C9}$ | N |
| $L_{A1492}$ | $R^{A3}$ | H | $R^{C9}$ | N |
| $L_{A1493}$ | $R^{A34}$ | H | $R^{C9}$ | N |
| $L_{A1494}$ | $R^{A57}$ | H | $R^{C9}$ | N |
| $L_{A1495}$ | H | $R^{B1}$ | $R^{C9}$ | N |
| $L_{A1496}$ | H | $R^{B3}$ | $R^{C9}$ | N |
| $L_{A1497}$ | H | $R^{B4}$ | $R^{C9}$ | N |
| $L_{A1498}$ | H | $R^{B5}$ | $R^{C9}$ | N |
| $L_{A1499}$ | H | $R^{B7}$ | $R^{C9}$ | N |
| $L_{A1500}$ | H | $R^{A3}$ | $R^{C9}$ | N |
| $L_{A1501}$ | H | $R^{A34}$ | $R^{C9}$ | N |
| $L_{A1502}$ | H | $R^{A57}$ | $R^{C9}$ | N |
| $L_{A1503}$ | $R^{B1}$ | $R^{B1}$ | $R^{C9}$ | N |
| $L_{A1504}$ | $R^{B3}$ | $R^{B3}$ | $R^{C9}$ | N |
| $L_{A1505}$ | $R^{B4}$ | $R^{B4}$ | $R^{C9}$ | N |
| $L_{A1506}$ | $R^{B5}$ | $R^{B5}$ | $R^{C9}$ | N |
| $L_{A1507}$ | $R^{B7}$ | $R^{B7}$ | $R^{C9}$ | N |
| $L_{A1508}$ | $R^{A3}$ | $R^{A3}$ | $R^{C9}$ | N |
| $L_{A1509}$ | $R^{A34}$ | $R^{A34}$ | $R^{C9}$ | N |
| $L_{A1510}$ | $R^{A57}$ | $R^{A57}$ | $R^{C9}$ | N |
| $L_{A1511}$ | $R^{B3}$ | $R^{B1}$ | $R^{C8}$ | N |
| $L_{A1512}$ | $R^{B4}$ | $R^{B1}$ | $R^{C9}$ | N |
| $L_{A1513}$ | $R^{B5}$ | $R^{B1}$ | $R^{C9}$ | N |
| $L_{A1514}$ | $R^{B7}$ | $R^{B1}$ | $R^{C9}$ | N |
| $L_{A1515}$ | $R^{A3}$ | $R^{B1}$ | $R^{C9}$ | N |
| $L_{A1516}$ | $R^{A34}$ | $R^{B1}$ | $R^{C9}$ | N |
| $L_{A1517}$ | $R^{A57}$ | $R^{B1}$ | $R^{C9}$ | N |
| $L_{A1518}$ | $R^{B1}$ | $R^{B3}$ | $R^{C9}$ | N |
| $L_{A1519}$ | $R^{B1}$ | $R^{B4}$ | $R^{C9}$ | N |
| $L_{A1520}$ | $R^{B1}$ | $R^{B5}$ | $R^{C9}$ | N |
| $L_{A1521}$ | $R^{B1}$ | $R^{B7}$ | $R^{C9}$ | N |
| $L_{A1522}$ | $R^{B1}$ | $R^{A3}$ | $R^{C9}$ | N |
| $L_{A1523}$ | $R^{B1}$ | $R^{A34}$ | $R^{C9}$ | N |
| $L_{A1524}$ | $R^{B1}$ | $R^{A57}$ | $R^{C9}$ | N |

$L_{A1525}$ through $L_{A1905}$ are based on a structure of Formula V,

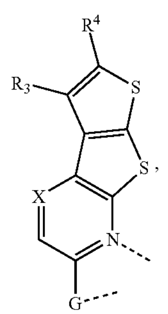

in which $R^3$, $R^4$, X and G are defined as:

| Ligand | $R^3$ | $R^4$ | G | X |
|---|---|---|---|---|
| $L_{A1525}$ | H | H | $R^{C1}$ | C |
| $L_{A1526}$ | $R^{B1}$ | H | $R^{C1}$ | C |
| $L_{A1527}$ | $R^{B3}$ | H | $R^{C1}$ | C |
| $L_{A1528}$ | $R^{B4}$ | H | $R^{C1}$ | C |
| $L_{A1529}$ | $R^{B5}$ | H | $R^{C1}$ | C |
| $L_{A1530}$ | $R^{B7}$ | H | $R^{C1}$ | C |
| $L_{A1531}$ | $R^{A3}$ | H | $R^{C1}$ | C |
| $L_{A1532}$ | $R^{A34}$ | H | $R^{C1}$ | C |
| $L_{A1533}$ | $R^{A57}$ | H | $R^{C1}$ | C |
| $L_{A1534}$ | H | $R^{B1}$ | $R^{C1}$ | C |

-continued

| Ligand | $R^3$ | $R^4$ | G | X |
|---|---|---|---|---|
| $L_{A1535}$ | H | $R^{B3}$ | $R^{C1}$ | C |
| $L_{A1536}$ | H | $R^{B4}$ | $R^{C1}$ | C |
| $L_{A1537}$ | H | $R^{B5}$ | $R^{C1}$ | C |
| $L_{A1538}$ | H | $R^{B7}$ | $R^{C1}$ | C |
| $L_{A1539}$ | H | $R^{A3}$ | $R^{C1}$ | C |
| $L_{A1540}$ | H | $R^{A34}$ | $R^{C1}$ | C |
| $L_{A1541}$ | H | $R^{A57}$ | $R^{C1}$ | C |
| $L_{A1542}$ | $R^{B1}$ | $R^{B1}$ | $R^{C1}$ | C |
| $L_{A1543}$ | $R^{B3}$ | $R^{B3}$ | $R^{C1}$ | C |
| $L_{A1544}$ | $R^{B4}$ | $R^{B4}$ | $R^{C1}$ | C |
| $L_{A1545}$ | $R^{B5}$ | $R^{B5}$ | $R^{C1}$ | C |
| $L_{A1546}$ | $R^{B7}$ | $R^{B7}$ | $R^{C1}$ | C |
| $L_{A1547}$ | $R^{A3}$ | $R^{A3}$ | $R^{C1}$ | C |
| $L_{A1548}$ | $R^{A34}$ | $R^{A34}$ | $R^{C1}$ | C |
| $L_{A1549}$ | $R^{A57}$ | $R^{A57}$ | $R^{C1}$ | C |
| $L_{A1550}$ | $R^{B3}$ | $R^{B1}$ | $R^{C1}$ | C |
| $L_{A1551}$ | $R^{B4}$ | $R^{B1}$ | $R^{C1}$ | C |
| $L_{A1552}$ | $R^{B5}$ | $R^{B1}$ | $R^{C1}$ | C |
| $L_{A1553}$ | $R^{B7}$ | $R^{B1}$ | $R^{C1}$ | C |
| $L_{A1554}$ | $R^{A3}$ | $R^{B1}$ | $R^{C1}$ | C |
| $L_{A1555}$ | $R^{A34}$ | $R^{B1}$ | $R^{C1}$ | C |
| $L_{A1556}$ | $R^{A57}$ | $R^{B1}$ | $R^{C1}$ | C |
| $L_{A1557}$ | $R^{B1}$ | $R^{B3}$ | $R^{C1}$ | C |
| $L_{A1558}$ | $R^{B1}$ | $R^{B4}$ | $R^{C1}$ | C |
| $L_{A1559}$ | $R^{B1}$ | $R^{B5}$ | $R^{C1}$ | C |
| $L_{A1560}$ | $R^{B1}$ | $R^{B7}$ | $R^{C1}$ | C |
| $L_{A1561}$ | $R^{B1}$ | $R^{A3}$ | $R^{C1}$ | C |
| $L_{A1562}$ | $R^{B1}$ | $R^{A34}$ | $R^{C1}$ | C |
| $L_{A1563}$ | $R^{B1}$ | $R^{A57}$ | $R^{C1}$ | C |
| $L_{A1564}$ | $R^{B1}$ | H | $R^{C2}$ | C |
| $L_{A1565}$ | $R^{B3}$ | H | $R^{C2}$ | C |
| $L_{A1566}$ | $R^{B4}$ | H | $R^{C2}$ | C |
| $L_{A1567}$ | $R^{B5}$ | H | $R^{C2}$ | C |
| $L_{A1568}$ | $R^{B7}$ | H | $R^{C2}$ | C |
| $L_{A1569}$ | $R^{A3}$ | H | $R^{C2}$ | C |
| $L_{A1570}$ | $R^{A34}$ | H | $R^{C2}$ | C |
| $L_{A1571}$ | $R^{A57}$ | H | $R^{C2}$ | C |
| $L_{A1572}$ | H | $R^{B1}$ | $R^{C2}$ | C |
| $L_{A1573}$ | H | $R^{B3}$ | $R^{C2}$ | C |
| $L_{A1574}$ | H | $R^{B4}$ | $R^{C2}$ | C |
| $L_{A1575}$ | H | $R^{B5}$ | $R^{C2}$ | C |
| $L_{A1576}$ | H | $R^{B7}$ | $R^{C2}$ | C |
| $L_{A1577}$ | H | $R^{A3}$ | $R^{C2}$ | C |
| $L_{A1578}$ | H | $R^{A34}$ | $R^{C2}$ | C |
| $L_{A1579}$ | H | $R^{A57}$ | $R^{C2}$ | C |
| $L_{A1580}$ | $R^{B1}$ | $R^{B1}$ | $R^{C2}$ | C |
| $L_{A1581}$ | $R^{B3}$ | $R^{B3}$ | $R^{C2}$ | C |
| $L_{A1582}$ | $R^{B4}$ | $R^{B4}$ | $R^{C2}$ | C |
| $L_{A1583}$ | $R^{B5}$ | $R^{B5}$ | $R^{C2}$ | C |
| $L_{A1584}$ | $R^{B7}$ | $R^{B7}$ | $R^{C2}$ | C |
| $L_{A1585}$ | $R^{A3}$ | $R^{A3}$ | $R^{C2}$ | C |
| $L_{A1586}$ | $R^{A34}$ | $R^{A34}$ | $R^{C2}$ | C |
| $L_{A1587}$ | $R^{A57}$ | $R^{A57}$ | $R^{C2}$ | C |
| $L_{A1588}$ | $R^{B3}$ | $R^{B1}$ | $R^{C2}$ | C |
| $L_{A1589}$ | $R^{B4}$ | $R^{B1}$ | $R^{C2}$ | C |
| $L_{A1590}$ | $R^{B5}$ | $R^{B1}$ | $R^{C2}$ | C |
| $L_{A1591}$ | $R^{B7}$ | $R^{B1}$ | $R^{C2}$ | C |
| $L_{A1592}$ | $R^{A3}$ | $R^{B1}$ | $R^{C2}$ | C |
| $L_{A1593}$ | $R^{A34}$ | $R^{B1}$ | $R^{C2}$ | C |
| $L_{A1594}$ | $R^{A57}$ | $R^{B1}$ | $R^{C2}$ | C |
| $L_{A1595}$ | $R^{B1}$ | $R^{B3}$ | $R^{C2}$ | C |
| $L_{A1596}$ | $R^{B1}$ | $R^{B4}$ | $R^{C2}$ | C |
| $L_{A1597}$ | $R^{B1}$ | $R^{B5}$ | $R^{C2}$ | C |
| $L_{A1598}$ | $R^{B1}$ | $R^{B7}$ | $R^{C2}$ | C |
| $L_{A1599}$ | $R^{B1}$ | $R^{A3}$ | $R^{C2}$ | C |
| $L_{A1600}$ | $R^{B1}$ | $R^{A34}$ | $R^{C2}$ | C |
| $L_{A1601}$ | $R^{B1}$ | $R^{A57}$ | $R^{C2}$ | C |
| $L_{A1602}$ | $R^{B1}$ | H | $R^{C3}$ | C |
| $L_{A1603}$ | $R^{B3}$ | H | $R^{C3}$ | C |
| $L_{A1604}$ | $R^{B4}$ | H | $R^{C3}$ | C |
| $L_{A1605}$ | $R^{B5}$ | H | $R^{C3}$ | C |
| $L_{A1606}$ | $R^{B7}$ | H | $R^{C3}$ | C |
| $L_{A1607}$ | $R^{A3}$ | H | $R^{C3}$ | C |
| $L_{A1608}$ | $R^{A34}$ | H | $R^{C3}$ | C |
| $L_{A1609}$ | $R^{A57}$ | H | $R^{C3}$ | C |
| $L_{A1610}$ | H | $R^{B1}$ | $R^{C3}$ | C |
| $L_{A1611}$ | H | $R^{B3}$ | $R^{C3}$ | C |

-continued

| Ligand | $R^3$ | $R^4$ | G | X |
|---|---|---|---|---|
| $L_{A1612}$ | H | $R^{B4}$ | $R^{C3}$ | C |
| $L_{A1613}$ | H | $R^{B5}$ | $R^{C3}$ | C |
| $L_{A1614}$ | H | $R^{B7}$ | $R^{C3}$ | C |
| $L_{A1615}$ | H | $R^{A3}$ | $R^{C3}$ | C |
| $L_{A1616}$ | H | $R^{A34}$ | $R^{C3}$ | C |
| $L_{A1617}$ | H | $R^{A57}$ | $R^{C3}$ | C |
| $L_{A1618}$ | $R^{B1}$ | $R^{B1}$ | $R^{C3}$ | C |
| $L_{A1619}$ | $R^{B3}$ | $R^{B3}$ | $R^{C3}$ | C |
| $L_{A1620}$ | $R^{B4}$ | $R^{B4}$ | $R^{C3}$ | C |
| $L_{A1621}$ | $R^{B5}$ | $R^{B5}$ | $R^{C3}$ | C |
| $L_{A1622}$ | $R^{B7}$ | $R^{B7}$ | $R^{C3}$ | C |
| $L_{A1623}$ | $R^{A3}$ | $R^{A3}$ | $R^{C3}$ | C |
| $L_{A1624}$ | $R^{A34}$ | $R^{A34}$ | $R^{C3}$ | C |
| $L_{A1625}$ | $R^{A57}$ | $R^{A57}$ | $R^{C3}$ | C |
| $L_{A1626}$ | $R^{B3}$ | $R^{B1}$ | $R^{C3}$ | C |
| $L_{A1627}$ | $R^{B4}$ | $R^{B1}$ | $R^{C3}$ | C |
| $L_{A1628}$ | $R^{B5}$ | $R^{B1}$ | $R^{C3}$ | C |
| $L_{A1629}$ | $R^{B7}$ | $R^{B1}$ | $R^{C3}$ | C |
| $L_{A1630}$ | $R^{A3}$ | $R^{B1}$ | $R^{C3}$ | C |
| $L_{A1631}$ | $R^{A34}$ | $R^{B1}$ | $R^{C3}$ | C |
| $L_{A1632}$ | $R^{A57}$ | $R^{B1}$ | $R^{C3}$ | C |
| $L_{A1633}$ | $R^{B1}$ | $R^{B3}$ | $R^{C3}$ | C |
| $L_{A1634}$ | $R^{B1}$ | $R^{B4}$ | $R^{C3}$ | C |
| $L_{A1635}$ | $R^{B1}$ | $R^{B5}$ | $R^{C3}$ | C |
| $L_{A1636}$ | $R^{B1}$ | $R^{B7}$ | $R^{C3}$ | C |
| $L_{A1637}$ | $R^{B1}$ | $R^{A3}$ | $R^{C3}$ | C |
| $L_{A1638}$ | $R^{B1}$ | $R^{A34}$ | $R^{C3}$ | C |
| $L_{A1639}$ | $R^{B1}$ | $R^{A57}$ | $R^{C3}$ | C |
| $L_{A1640}$ | $R^{B1}$ | H | $R^{C8}$ | C |
| $L_{A1641}$ | $R^{B3}$ | H | $R^{C8}$ | C |
| $L_{A1642}$ | $R^{B4}$ | H | $R^{C8}$ | C |
| $L_{A1643}$ | $R^{B5}$ | H | $R^{C8}$ | C |
| $L_{A1644}$ | $R^{B7}$ | H | $R^{C8}$ | C |
| $L_{A1645}$ | $R^{A3}$ | H | $R^{C8}$ | C |
| $L_{A1646}$ | $R^{A34}$ | H | $R^{C8}$ | C |
| $L_{A1647}$ | $R^{A57}$ | H | $R^{C8}$ | C |
| $L_{A1648}$ | H | $R^{B1}$ | $R^{C8}$ | C |
| $L_{A1649}$ | H | $R^{B3}$ | $R^{C8}$ | C |
| $L_{A1650}$ | H | $R^{B4}$ | $R^{C8}$ | C |
| $L_{A1651}$ | H | $R^{B5}$ | $R^{C8}$ | C |
| $L_{A1652}$ | H | $R^{B7}$ | $R^{C8}$ | C |
| $L_{A1653}$ | H | $R^{A3}$ | $R^{C8}$ | C |
| $L_{A1654}$ | H | $R^{A34}$ | $R^{C8}$ | C |
| $L_{A1655}$ | H | $R^{A57}$ | $R^{C8}$ | C |
| $L_{A1656}$ | $R^{B1}$ | $R^{B1}$ | $R^{C8}$ | C |
| $L_{A1657}$ | $R^{B3}$ | $R^{B3}$ | $R^{C8}$ | C |
| $L_{A1658}$ | $R^{B4}$ | $R^{B4}$ | $R^{C8}$ | C |
| $L_{A1659}$ | $R^{B5}$ | $R^{B5}$ | $R^{C8}$ | C |
| $L_{A1660}$ | $R^{B7}$ | $R^{B7}$ | $R^{C8}$ | C |
| $L_{A1661}$ | $R^{A3}$ | $R^{A3}$ | $R^{C8}$ | C |
| $L_{A1662}$ | $R^{A34}$ | $R^{A34}$ | $R^{C8}$ | C |
| $L_{A1663}$ | $R^{A57}$ | $R^{A57}$ | $R^{C8}$ | C |
| $L_{A1664}$ | $R^{B3}$ | $R^{B1}$ | $R^{C8}$ | C |
| $L_{A1665}$ | $R^{B4}$ | $R^{B1}$ | $R^{C8}$ | C |
| $L_{A1666}$ | $R^{B5}$ | $R^{B1}$ | $R^{C8}$ | C |
| $L_{A1667}$ | $R^{B7}$ | $R^{B1}$ | $R^{C8}$ | C |
| $L_{A1668}$ | $R^{A3}$ | $R^{B1}$ | $R^{C8}$ | C |
| $L_{A1669}$ | $R^{A34}$ | $R^{B1}$ | $R^{C8}$ | C |
| $L_{A1670}$ | $R^{A57}$ | $R^{B1}$ | $R^{C8}$ | C |
| $L_{A1671}$ | $R^{B1}$ | $R^{B3}$ | $R^{C8}$ | C |
| $L_{A1672}$ | $R^{B1}$ | $R^{B4}$ | $R^{C8}$ | C |
| $L_{A1673}$ | $R^{B1}$ | $R^{B5}$ | $R^{C8}$ | C |
| $L_{A1674}$ | $R^{B1}$ | $R^{B7}$ | $R^{C8}$ | C |
| $L_{A1675}$ | $R^{B1}$ | $R^{A3}$ | $R^{C8}$ | C |
| $L_{A1676}$ | $R^{B1}$ | $R^{A34}$ | $R^{C8}$ | C |
| $L_{A1677}$ | $R^{B1}$ | $R^{A57}$ | $R^{C8}$ | C |
| $L_{A1678}$ | $R^{B1}$ | H | $R^{C9}$ | C |
| $L_{A1679}$ | $R^{B3}$ | H | $R^{C9}$ | C |
| $L_{A1680}$ | $R^{B4}$ | H | $R^{C9}$ | C |
| $L_{A1681}$ | $R^{B5}$ | H | $R^{C9}$ | C |
| $L_{A1682}$ | $R^{B7}$ | H | $R^{C9}$ | C |
| $L_{A1683}$ | $R^{A3}$ | H | $R^{C9}$ | C |
| $L_{A1684}$ | $R^{A34}$ | H | $R^{C9}$ | C |
| $L_{A1685}$ | $R^{A57}$ | H | $R^{C9}$ | C |
| $L_{A1686}$ | H | $R^{B1}$ | $R^{C9}$ | C |
| $L_{A1687}$ | H | $R^{B3}$ | $R^{C9}$ | C |
| $L_{A1688}$ | H | $R^{B4}$ | $R^{C9}$ | C |

-continued

| Ligand | $R^3$ | $R^4$ | G | X |
|---|---|---|---|---|
| $L_{A1689}$ | H | $R^{B5}$ | $R^{C9}$ | C |
| $L_{A1690}$ | H | $R^{B7}$ | $R^{C9}$ | C |
| $L_{A1691}$ | H | $R^{A3}$ | $R^{C9}$ | C |
| $L_{A1692}$ | H | $R^{A34}$ | $R^{C9}$ | C |
| $L_{A1693}$ | H | $R^{A57}$ | $R^{C9}$ | C |
| $L_{A1694}$ | $R^{B1}$ | $R^{B1}$ | $R^{C9}$ | C |
| $L_{A1695}$ | $R^{B3}$ | $R^{B3}$ | $R^{C9}$ | C |
| $L_{A1696}$ | $R^{B4}$ | $R^{B4}$ | $R^{C9}$ | C |
| $L_{A1697}$ | $R^{B5}$ | $R^{B5}$ | $R^{C9}$ | C |
| $L_{A1698}$ | $R^{B7}$ | $R^{B7}$ | $R^{C9}$ | C |
| $L_{A1699}$ | $R^{A3}$ | $R^{A3}$ | $R^{C9}$ | C |
| $L_{A1700}$ | $R^{A34}$ | $R^{A34}$ | $R^{C9}$ | C |
| $L_{A1701}$ | $R^{A57}$ | $R^{A57}$ | $R^{C9}$ | C |
| $L_{A1702}$ | $R^{B3}$ | $R^{B1}$ | $R^{C9}$ | C |
| $L_{A1703}$ | $R^{B4}$ | $R^{B1}$ | $R^{C9}$ | C |
| $L_{A1704}$ | $R^{B5}$ | $R^{B1}$ | $R^{C9}$ | C |
| $L_{A1705}$ | $R^{B7}$ | $R^{B1}$ | $R^{C9}$ | C |
| $L_{A1706}$ | $R^{A3}$ | $R^{B1}$ | $R^{C9}$ | C |
| $L_{A1707}$ | $R^{A34}$ | $R^{B1}$ | $R^{C9}$ | C |
| $L_{A1708}$ | $R^{A57}$ | $R^{B1}$ | $R^{C9}$ | C |
| $L_{A1709}$ | $R^{B1}$ | $R^{B3}$ | $R^{C9}$ | C |
| $L_{A1710}$ | $R^{B1}$ | $R^{B4}$ | $R^{C9}$ | C |
| $L_{A1711}$ | $R^{B1}$ | $R^{B5}$ | $R^{C9}$ | C |
| $L_{A1712}$ | $R^{B1}$ | $R^{B7}$ | $R^{C9}$ | C |
| $L_{A1713}$ | $R^{B1}$ | $R^{A3}$ | $R^{C9}$ | C |
| $L_{A1714}$ | $R^{B1}$ | $R^{A34}$ | $R^{C9}$ | C |
| $L_{A1715}$ | $R^{B1}$ | $R^{A57}$ | $R^{C9}$ | C |
| $L_{A1716}$ | $R^{B1}$ | H | $R^{C1}$ | N |
| $L_{A1717}$ | $R^{B3}$ | H | $R^{C1}$ | N |
| $L_{A1718}$ | $R^{B4}$ | H | $R^{C1}$ | N |
| $L_{A1719}$ | $R^{B5}$ | H | $R^{C1}$ | N |
| $L_{A1720}$ | $R^{B7}$ | H | $R^{C1}$ | N |
| $L_{A1721}$ | $R^{A3}$ | H | $R^{C1}$ | N |
| $L_{A1722}$ | $R^{A34}$ | H | $R^{C1}$ | N |
| $L_{A1723}$ | $R^{A57}$ | H | $R^{C1}$ | N |
| $L_{A1724}$ | H | $R^{B1}$ | $R^{C1}$ | N |
| $L_{A1725}$ | H | $R^{B3}$ | $R^{C1}$ | N |
| $L_{A1726}$ | H | $R^{B4}$ | $R^{C1}$ | N |
| $L_{A1727}$ | H | $R^{B5}$ | $R^{C1}$ | N |
| $L_{A1728}$ | H | $R^{B7}$ | $R^{C1}$ | N |
| $L_{A1729}$ | H | $R^{A3}$ | $R^{C1}$ | N |
| $L_{A1730}$ | H | $R^{A34}$ | $R^{C1}$ | N |
| $L_{A1731}$ | H | $R^{A57}$ | $R^{C1}$ | N |
| $L_{A1732}$ | $R^{B1}$ | $R^{B1}$ | $R^{C1}$ | N |
| $L_{A1733}$ | $R^{B3}$ | $R^{B3}$ | $R^{C1}$ | N |
| $L_{A1734}$ | $R^{B4}$ | $R^{B4}$ | $R^{C1}$ | N |
| $L_{A1735}$ | $R^{B5}$ | $R^{B5}$ | $R^{C1}$ | N |
| $L_{A1736}$ | $R^{B7}$ | $R^{B7}$ | $R^{C1}$ | N |
| $L_{A1737}$ | $R^{A3}$ | $R^{A3}$ | $R^{C1}$ | N |
| $L_{A1738}$ | $R^{A34}$ | $R^{A34}$ | $R^{C1}$ | N |
| $L_{A1739}$ | $R^{A57}$ | $R^{A57}$ | $R^{C1}$ | N |
| $L_{A1740}$ | $R^{B3}$ | $R^{B1}$ | $R^{C1}$ | N |
| $L_{A1741}$ | $R^{B4}$ | $R^{B1}$ | $R^{C1}$ | N |
| $L_{A1742}$ | $R^{B5}$ | $R^{B1}$ | $R^{C1}$ | N |
| $L_{A1743}$ | $R^{B7}$ | $R^{B1}$ | $R^{C1}$ | N |
| $L_{A1744}$ | $R^{A3}$ | $R^{B1}$ | $R^{C1}$ | N |
| $L_{A1745}$ | $R^{A34}$ | $R^{B1}$ | $R^{C1}$ | N |
| $L_{A1746}$ | $R^{A57}$ | $R^{B1}$ | $R^{C1}$ | N |
| $L_{A1747}$ | $R^{B1}$ | $R^{B3}$ | $R^{C1}$ | N |
| $L_{A1748}$ | $R^{B1}$ | $R^{B4}$ | $R^{C1}$ | N |
| $L_{A1749}$ | $R^{B1}$ | $R^{B5}$ | $R^{C1}$ | N |
| $L_{A1750}$ | $R^{B1}$ | $R^{B7}$ | $R^{C1}$ | N |
| $L_{A1751}$ | $R^{B1}$ | $R^{A3}$ | $R^{C1}$ | N |
| $L_{A1752}$ | $R^{B1}$ | $R^{A34}$ | $R^{C1}$ | N |
| $L_{A1753}$ | $R^{B1}$ | $R^{A57}$ | $R^{C1}$ | N |
| $L_{A1754}$ | $R^{B1}$ | H | $R^{C2}$ | N |
| $L_{A1755}$ | $R^{B3}$ | H | $R^{C2}$ | N |
| $L_{A1756}$ | $R^{B4}$ | H | $R^{C2}$ | N |
| $L_{A1757}$ | $R^{B5}$ | H | $R^{C2}$ | N |
| $L_{A1758}$ | $R^{B7}$ | H | $R^{C2}$ | N |
| $L_{A1759}$ | $R^{A3}$ | H | $R^{C2}$ | N |
| $L_{A1760}$ | $R^{A34}$ | H | $R^{C2}$ | N |
| $L_{A1761}$ | $R^{A57}$ | H | $R^{C2}$ | N |
| $L_{A1762}$ | H | $R^{B1}$ | $R^{C2}$ | N |
| $L_{A1763}$ | H | $R^{B3}$ | $R^{C2}$ | N |
| $L_{A1764}$ | H | $R^{B4}$ | $R^{C2}$ | N |
| $L_{A1765}$ | H | $R^{B5}$ | $R^{C2}$ | N |

-continued

| Ligand | $R^3$ | $R^4$ | G | X |
|---|---|---|---|---|
| $L_{A1766}$ | H | $R^{B7}$ | $R^{C2}$ | N |
| $L_{A1767}$ | H | $R^{A3}$ | $R^{C2}$ | N |
| $L_{A1768}$ | H | $R^{A34}$ | $R^{C2}$ | N |
| $L_{A1769}$ | H | $R^{A57}$ | $R^{C2}$ | N |
| $L_{A1770}$ | $R^{B1}$ | $R^{B1}$ | $R^{C2}$ | N |
| $L_{A1771}$ | $R^{B3}$ | $R^{B3}$ | $R^{C2}$ | N |
| $L_{A1772}$ | $R^{B4}$ | $R^{B4}$ | $R^{C2}$ | N |
| $L_{A1773}$ | $R^{B5}$ | $R^{B5}$ | $R^{C2}$ | N |
| $L_{A1774}$ | $R^{B7}$ | $R^{B7}$ | $R^{C2}$ | N |
| $L_{A1775}$ | $R^{A3}$ | $R^{A3}$ | $R^{C2}$ | N |
| $L_{A1776}$ | $R^{A34}$ | $R^{A34}$ | $R^{C2}$ | N |
| $L_{A1777}$ | $R^{A57}$ | $R^{A57}$ | $R^{C2}$ | N |
| $L_{A1778}$ | $R^{B3}$ | $R^{B1}$ | $R^{C2}$ | N |
| $L_{A1779}$ | $R^{B4}$ | $R^{B1}$ | $R^{C2}$ | N |
| $L_{A1780}$ | $R^{B5}$ | $R^{B1}$ | $R^{C2}$ | N |
| $L_{A1781}$ | $R^{B7}$ | $R^{B1}$ | $R^{C2}$ | N |
| $L_{A1782}$ | $R^{A3}$ | $R^{B1}$ | $R^{C2}$ | N |
| $L_{A1783}$ | $R^{A34}$ | $R^{B1}$ | $R^{C2}$ | N |
| $L_{A1784}$ | $R^{A57}$ | $R^{B1}$ | $R^{C2}$ | N |
| $L_{A1785}$ | $R^{B1}$ | $R^{B3}$ | $R^{C2}$ | N |
| $L_{A1786}$ | $R^{B1}$ | $R^{B4}$ | $R^{C2}$ | N |
| $L_{A1787}$ | $R^{B1}$ | $R^{B5}$ | $R^{C2}$ | N |
| $L_{A1788}$ | $R^{B1}$ | $R^{B7}$ | $R^{C2}$ | N |
| $L_{A1789}$ | $R^{B1}$ | $R^{A3}$ | $R^{C2}$ | N |
| $L_{A1790}$ | $R^{B1}$ | $R^{A34}$ | $R^{C2}$ | N |
| $L_{A1791}$ | $R^{B1}$ | $R^{A57}$ | $R^{C2}$ | N |
| $L_{A1792}$ | $R^{B1}$ | H | $R^{C3}$ | N |
| $L_{A1793}$ | $R^{B3}$ | H | $R^{C3}$ | N |
| $L_{A1794}$ | $R^{B4}$ | H | $R^{C3}$ | N |
| $L_{A1795}$ | $R^{B5}$ | H | $R^{C3}$ | N |
| $L_{A1796}$ | $R^{B7}$ | H | $R^{C3}$ | N |
| $L_{A1797}$ | $R^{A3}$ | H | $R^{C3}$ | N |
| $L_{A1798}$ | $R^{A34}$ | H | $R^{C3}$ | N |
| $L_{A1799}$ | $R^{A57}$ | H | $R^{C3}$ | N |
| $L_{A1800}$ | H | $R^{B1}$ | $R^{C3}$ | N |
| $L_{A1801}$ | H | $R^{B3}$ | $R^{C3}$ | N |
| $L_{A1802}$ | H | $R^{B4}$ | $R^{C3}$ | N |
| $L_{A1803}$ | H | $R^{B5}$ | $R^{C3}$ | N |
| $L_{A1804}$ | H | $R^{B7}$ | $R^{C3}$ | N |
| $L_{A1805}$ | H | $R^{A3}$ | $R^{C3}$ | N |
| $L_{A1806}$ | H | $R^{A34}$ | $R^{C3}$ | N |
| $L_{A1807}$ | H | $R^{A57}$ | $R^{C3}$ | N |
| $L_{A1808}$ | $R^{B1}$ | $R^{B1}$ | $R^{C3}$ | N |
| $L_{A1809}$ | $R^{B3}$ | $R^{B3}$ | $R^{C3}$ | N |
| $L_{A1810}$ | $R^{B4}$ | $R^{B4}$ | $R^{C3}$ | N |
| $L_{A1811}$ | $R^{B5}$ | $R^{B5}$ | $R^{C3}$ | N |
| $L_{A1812}$ | $R^{B7}$ | $R^{B7}$ | $R^{C3}$ | N |
| $L_{A1813}$ | $R^{A3}$ | $R^{A3}$ | $R^{C3}$ | N |
| $L_{A1814}$ | $R^{A34}$ | $R^{A34}$ | $R^{C3}$ | N |
| $L_{A1815}$ | $R^{A57}$ | $R^{A57}$ | $R^{C3}$ | N |
| $L_{A1816}$ | $R^{B3}$ | $R^{B1}$ | $R^{C3}$ | N |
| $L_{A1817}$ | $R^{B4}$ | $R^{B1}$ | $R^{C3}$ | N |
| $L_{A1818}$ | $R^{B5}$ | $R^{B1}$ | $R^{C3}$ | N |
| $L_{A1819}$ | $R^{B7}$ | $R^{B1}$ | $R^{C3}$ | N |
| $L_{A1820}$ | $R^{A3}$ | $R^{B1}$ | $R^{C3}$ | N |
| $L_{A1821}$ | $R^{A34}$ | $R^{B1}$ | $R^{C3}$ | N |
| $L_{A1822}$ | $R^{A57}$ | $R^{B1}$ | $R^{C3}$ | N |
| $L_{A1823}$ | $R^{B1}$ | $R^{B3}$ | $R^{C3}$ | N |
| $L_{A1824}$ | $R^{B1}$ | $R^{B4}$ | $R^{C3}$ | N |
| $L_{A1825}$ | $R^{B1}$ | $R^{B5}$ | $R^{C3}$ | N |
| $L_{A1826}$ | $R^{B1}$ | $R^{B7}$ | $R^{C3}$ | N |
| $L_{A1827}$ | $R^{B1}$ | $R^{A3}$ | $R^{C3}$ | N |
| $L_{A1828}$ | $R^{B1}$ | $R^{A34}$ | $R^{C3}$ | N |
| $L_{A1829}$ | $R^{B1}$ | $R^{A57}$ | $R^{C3}$ | N |
| $L_{A1830}$ | $R^{B1}$ | H | $R^{C8}$ | N |
| $L_{A1831}$ | $R^{B3}$ | H | $R^{C8}$ | N |
| $L_{A1832}$ | $R^{B4}$ | H | $R^{C8}$ | N |
| $L_{A1833}$ | $R^{B5}$ | H | $R^{C8}$ | N |
| $L_{A1834}$ | $R^{B7}$ | H | $R^{C8}$ | N |
| $L_{A1835}$ | $R^{A3}$ | H | $R^{C8}$ | N |
| $L_{A1836}$ | $R^{A34}$ | H | $R^{C8}$ | N |
| $L_{A1837}$ | $R^{A57}$ | H | $R^{C8}$ | N |
| $L_{A1838}$ | H | $R^{B1}$ | $R^{C8}$ | N |
| $L_{A1839}$ | H | $R^{B3}$ | $R^{C8}$ | N |
| $L_{A1840}$ | H | $R^{B4}$ | $R^{C8}$ | N |
| $L_{A1841}$ | H | $R^{B5}$ | $R^{C8}$ | N |
| $L_{A1842}$ | H | $R^{B7}$ | $R^{C8}$ | N |

-continued

| Ligand | $R^3$ | $R^4$ | G | X |
|---|---|---|---|---|
| $L_{A1843}$ | H | $R^{A3}$ | $R^{C8}$ | N |
| $L_{A1844}$ | H | $R^{A34}$ | $R^{C8}$ | N |
| $L_{A1845}$ | H | $R^{A57}$ | $R^{C8}$ | N |
| $L_{A1846}$ | $R^{B1}$ | $R^{B1}$ | $R^{C8}$ | N |
| $L_{A1847}$ | $R^{B3}$ | $R^{B3}$ | $R^{C8}$ | N |
| $L_{A1848}$ | $R^{B4}$ | $R^{B4}$ | $R^{C8}$ | N |
| $L_{A1849}$ | $R^{B5}$ | $R^{B5}$ | $R^{C8}$ | N |
| $L_{A1850}$ | $R^{B7}$ | $R^{B7}$ | $R^{C8}$ | N |
| $L_{A1851}$ | $R^{A3}$ | $R^{A3}$ | $R^{C8}$ | N |
| $L_{A1852}$ | $R^{A34}$ | $R^{A34}$ | $R^{C8}$ | N |
| $L_{A1853}$ | $R^{A57}$ | $R^{A57}$ | $R^{C8}$ | N |
| $L_{A1854}$ | $R^{B3}$ | $R^{B1}$ | $R^{C8}$ | N |
| $L_{A1855}$ | $R^{B4}$ | $R^{B1}$ | $R^{C8}$ | N |
| $L_{A1856}$ | $R^{B5}$ | $R^{B1}$ | $R^{C8}$ | N |
| $L_{A1857}$ | $R^{B7}$ | $R^{B1}$ | $R^{C8}$ | N |
| $L_{A1858}$ | $R^{A3}$ | $R^{B1}$ | $R^{C8}$ | N |
| $L_{A1859}$ | $R^{A34}$ | $R^{B1}$ | $R^{C8}$ | N |
| $L_{A1860}$ | $R^{A57}$ | $R^{B1}$ | $R^{C8}$ | N |
| $L_{A1861}$ | $R^{B1}$ | $R^{B3}$ | $R^{C8}$ | N |
| $L_{A1862}$ | $R^{B1}$ | $R^{B4}$ | $R^{C8}$ | N |
| $L_{A1863}$ | $R^{B1}$ | $R^{B5}$ | $R^{C8}$ | N |
| $L_{A1864}$ | $R^{B1}$ | $R^{B7}$ | $R^{C8}$ | N |
| $L_{A1865}$ | $R^{B1}$ | $R^{A3}$ | $R^{C8}$ | N |
| $L_{A1866}$ | $R^{B1}$ | $R^{A34}$ | $R^{C8}$ | N |
| $L_{A1867}$ | $R^{B1}$ | $R^{A57}$ | $R^{C8}$ | N |
| $L_{A1868}$ | $R^{B1}$ | H | $R^{C9}$ | N |
| $L_{A1869}$ | $R^{B3}$ | H | $R^{C9}$ | N |
| $L_{A1870}$ | $R^{B4}$ | H | $R^{C9}$ | N |
| $L_{A1871}$ | $R^{B5}$ | H | $R^{C9}$ | N |
| $L_{A1872}$ | $R^{B7}$ | H | $R^{C9}$ | N |
| $L_{A1873}$ | $R^{A3}$ | H | $R^{C9}$ | N |
| $L_{A1874}$ | $R^{A34}$ | H | $R^{C9}$ | N |
| $L_{A1875}$ | $R^{A57}$ | H | $R^{C9}$ | N |
| $L_{A1876}$ | H | $R^{B1}$ | $R^{C9}$ | N |
| $L_{A1877}$ | H | $R^{B3}$ | $R^{C9}$ | N |
| $L_{A1878}$ | H | $R^{B4}$ | $R^{C9}$ | N |
| $L_{A1879}$ | H | $R^{B5}$ | $R^{C9}$ | N |
| $L_{A1880}$ | H | $R^{B7}$ | $R^{C9}$ | N |
| $L_{A1881}$ | H | $R^{A3}$ | $R^{C9}$ | N |
| $L_{A1882}$ | H | $R^{A34}$ | $R^{C9}$ | N |
| $L_{A1883}$ | H | $R^{A57}$ | $R^{C9}$ | N |
| $L_{A1884}$ | $R^{B1}$ | $R^{B1}$ | $R^{C9}$ | N |
| $L_{A1885}$ | $R^{B3}$ | $R^{B3}$ | $R^{C9}$ | N |
| $L_{A1886}$ | $R^{B4}$ | $R^{B4}$ | $R^{C9}$ | N |
| $L_{A1887}$ | $R^{B5}$ | $R^{B5}$ | $R^{C9}$ | N |
| $L_{A1888}$ | $R^{B7}$ | $R^{B7}$ | $R^{C9}$ | N |
| $L_{A1889}$ | $R^{A3}$ | $R^{A3}$ | $R^{C9}$ | N |
| $L_{A1890}$ | $R^{A34}$ | $R^{A34}$ | $R^{C9}$ | N |
| $L_{A1891}$ | $R^{A57}$ | $R^{A57}$ | $R^{C9}$ | N |
| $L_{A1892}$ | $R^{B3}$ | $R^{B1}$ | $R^{C9}$ | N |
| $L_{A1893}$ | $R^{B4}$ | $R^{B1}$ | $R^{C9}$ | N |
| $L_{A1894}$ | $R^{B5}$ | $R^{B1}$ | $R^{C9}$ | N |
| $L_{A1895}$ | $R^{B7}$ | $R^{B1}$ | $R^{C9}$ | N |
| $L_{A1896}$ | $R^{A3}$ | $R^{B1}$ | $R^{C9}$ | N |
| $L_{A1897}$ | $R^{A34}$ | $R^{B1}$ | $R^{C9}$ | N |
| $L_{A1898}$ | $R^{A57}$ | $R^{B1}$ | $R^{C9}$ | N |
| $L_{A1899}$ | $R^{B1}$ | $R^{B3}$ | $R^{C9}$ | N |
| $L_{A1900}$ | $R^{B1}$ | $R^{B4}$ | $R^{C9}$ | N |
| $L_{A1901}$ | $R^{B1}$ | $R^{B5}$ | $R^{C9}$ | N |
| $L_{A1902}$ | $R^{B1}$ | $R^{B7}$ | $R^{C9}$ | N |
| $L_{A1903}$ | $R^{B1}$ | $R^{A3}$ | $R^{C9}$ | N |

-continued

| Ligand | $R^3$ | $R^4$ | G | X |
|---|---|---|---|---|
| $L_{A1904}$ | $R^{B1}$ | $R^{A34}$ | $R^{C9}$ | N |
| $L_{A1905}$ | $R^{B1}$ | $R^{A57}$ | $R^{C9}$ | N |

$L_{A1906}$ through $L_{A2286}$ are based on a structure of Formula V,

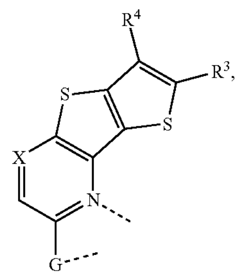

in which $R^3$, $R^4$, X and G are defined as:

| Ligand | $R^3$ | $R^4$ | G | X |
|---|---|---|---|---|
| $L_{A1906}$ | H | H | $R^{C1}$ | C |
| $L_{A1907}$ | $R^{B1}$ | H | $R^{C1}$ | C |
| $L_{A1908}$ | $R^{B3}$ | H | $R^{C1}$ | C |
| $L_{A1909}$ | $R^{B4}$ | H | $R^{C1}$ | C |
| $L_{A1910}$ | $R^{B5}$ | H | $R^{C1}$ | C |
| $L_{A1911}$ | $R^{B7}$ | H | $R^{C1}$ | C |
| $L_{A1912}$ | $R^{A3}$ | H | $R^{C1}$ | C |
| $L_{A1913}$ | $R^{A34}$ | H | $R^{C1}$ | C |
| $L_{A1914}$ | $R^{A57}$ | H | $R^{C1}$ | C |
| $L_{A1915}$ | H | $R^{B1}$ | $R^{C1}$ | C |
| $L_{A1916}$ | H | $R^{B3}$ | $R^{C1}$ | C |
| $L_{A1917}$ | H | $R^{B4}$ | $R^{C1}$ | C |
| $L_{A1918}$ | H | $R^{B5}$ | $R^{C1}$ | C |
| $L_{A1919}$ | H | $R^{B7}$ | $R^{C1}$ | C |
| $L_{A1920}$ | H | $R^{A3}$ | $R^{C1}$ | C |
| $L_{A1921}$ | H | $R^{A34}$ | $R^{C1}$ | C |
| $L_{A1922}$ | H | $R^{A57}$ | $R^{C1}$ | C |
| $L_{A1923}$ | $R^{B1}$ | $R^{B1}$ | $R^{C1}$ | C |
| $L_{A1924}$ | $R^{B3}$ | $R^{B3}$ | $R^{C1}$ | C |
| $L_{A1925}$ | $R^{B4}$ | $R^{B4}$ | $R^{C1}$ | C |
| $L_{A1926}$ | $R^{B5}$ | $R^{B5}$ | $R^{C1}$ | C |
| $L_{A1927}$ | $R^{B7}$ | $R^{B7}$ | $R^{C1}$ | C |
| $L_{A1928}$ | $R^{A3}$ | $R^{A3}$ | $R^{C1}$ | C |
| $L_{A1929}$ | $R^{A34}$ | $R^{A34}$ | $R^{C1}$ | C |
| $L_{A1930}$ | $R^{A57}$ | $R^{A57}$ | $R^{C1}$ | C |
| $L_{A1931}$ | $R^{B3}$ | $R^{B1}$ | $R^{C1}$ | C |
| $L_{A1932}$ | $R^{B4}$ | $R^{B1}$ | $R^{C1}$ | C |
| $L_{A1933}$ | $R^{B5}$ | $R^{B1}$ | $R^{C1}$ | C |
| $L_{A1934}$ | $R^{B7}$ | $R^{B1}$ | $R^{C1}$ | C |
| $L_{A1935}$ | $R^{A3}$ | $R^{B1}$ | $R^{C1}$ | C |
| $L_{A1936}$ | $R^{A34}$ | $R^{B1}$ | $R^{C1}$ | C |
| $L_{A1937}$ | $R^{A57}$ | $R^{B1}$ | $R^{C1}$ | C |
| $L_{A1938}$ | $R^{B1}$ | $R^{B3}$ | $R^{C1}$ | C |
| $L_{A1939}$ | $R^{B1}$ | $R^{B4}$ | $R^{C1}$ | C |
| $L_{A1940}$ | $R^{B1}$ | $R^{B5}$ | $R^{C1}$ | C |
| $L_{A1941}$ | $R^{B1}$ | $R^{B7}$ | $R^{C1}$ | C |
| $L_{A1942}$ | $R^{B1}$ | $R^{A3}$ | $R^{C1}$ | C |
| $L_{A1943}$ | $R^{B1}$ | $R^{A34}$ | $R^{C1}$ | C |
| $L_{A1944}$ | $R^{B1}$ | $R^{A57}$ | $R^{C1}$ | C |
| $L_{A1945}$ | $R^{B1}$ | H | $R^{C2}$ | C |
| $L_{A1946}$ | $R^{B3}$ | H | $R^{C2}$ | C |
| $L_{A1947}$ | $R^{B4}$ | H | $R^{C2}$ | C |
| $L_{A1948}$ | $R^{B5}$ | H | $R^{C2}$ | C |
| $L_{A1949}$ | $R^{B7}$ | H | $R^{C2}$ | C |
| $L_{A1950}$ | $R^{A3}$ | H | $R^{C2}$ | C |
| $L_{A1951}$ | $R^{A34}$ | H | $R^{C2}$ | C |
| $L_{A1952}$ | $R^{A57}$ | H | $R^{C2}$ | C |
| $L_{A1953}$ | H | $R^{B1}$ | $R^{C2}$ | C |
| $L_{A1954}$ | H | $R^{B3}$ | $R^{C2}$ | C |
| $L_{A1955}$ | H | $R^{B4}$ | $R^{C2}$ | C |

-continued

| Ligand | $R^3$ | $R^4$ | G | X |
|---|---|---|---|---|
| $L_{A1956}$ | H | $R^{B5}$ | $R^{C2}$ | C |
| $L_{A1957}$ | H | $R^{B7}$ | $R^{C2}$ | C |
| $L_{A1958}$ | H | $R^{A3}$ | $R^{C2}$ | C |
| $L_{A1959}$ | H | $R^{A34}$ | $R^{C2}$ | C |
| $L_{A1960}$ | H | $R^{A57}$ | $R^{C2}$ | C |
| $L_{A1961}$ | $R^{B1}$ | $R^{B1}$ | $R^{C2}$ | C |
| $L_{A1962}$ | $R^{B3}$ | $R^{B3}$ | $R^{C2}$ | C |
| $L_{A1963}$ | $R^{B4}$ | $R^{B4}$ | $R^{C2}$ | C |
| $L_{A1964}$ | $R^{B5}$ | $R^{B5}$ | $R^{C2}$ | C |
| $L_{A1965}$ | $R^{B7}$ | $R^{B7}$ | $R^{C2}$ | C |
| $L_{A1966}$ | $R^{A3}$ | $R^{A3}$ | $R^{C2}$ | C |
| $L_{A1967}$ | $R^{A34}$ | $R^{A34}$ | $R^{C2}$ | C |
| $L_{A1968}$ | $R^{A57}$ | $R^{A57}$ | $R^{C2}$ | C |
| $L_{A1969}$ | $R^{B3}$ | $R^{B1}$ | $R^{C2}$ | C |
| $L_{A1970}$ | $R^{B4}$ | $R^{B1}$ | $R^{C2}$ | C |
| $L_{A1971}$ | $R^{B5}$ | $R^{B1}$ | $R^{C2}$ | C |
| $L_{A1972}$ | $R^{B7}$ | $R^{B1}$ | $R^{C2}$ | C |
| $L_{A1973}$ | $R^{A3}$ | $R^{B1}$ | $R^{C2}$ | C |
| $L_{A1974}$ | $R^{A34}$ | $R^{B1}$ | $R^{C2}$ | C |
| $L_{A1975}$ | $R^{A57}$ | $R^{B1}$ | $R^{C2}$ | C |
| $L_{A1976}$ | $R^{B1}$ | $R^{B3}$ | $R^{C2}$ | C |
| $L_{A1977}$ | $R^{B1}$ | $R^{B4}$ | $R^{C2}$ | C |
| $L_{A1978}$ | $R^{B1}$ | $R^{B5}$ | $R^{C2}$ | C |
| $L_{A1979}$ | $R^{B1}$ | $R^{B7}$ | $R^{C2}$ | C |
| $L_{A1980}$ | $R^{B1}$ | $R^{A3}$ | $R^{C2}$ | C |
| $L_{A1981}$ | $R^{B1}$ | $R^{A34}$ | $R^{C2}$ | C |
| $L_{A1982}$ | $R^{B1}$ | $R^{A57}$ | $R^{C2}$ | C |
| $L_{A1983}$ | $R^{B1}$ | H | $R^{C3}$ | C |
| $L_{A1984}$ | $R^{B3}$ | H | $R^{C3}$ | C |
| $L_{A1985}$ | $R^{B4}$ | H | $R^{C3}$ | C |
| $L_{A1986}$ | $R^{B5}$ | H | $R^{C3}$ | C |
| $L_{A1987}$ | $R^{B7}$ | H | $R^{C3}$ | C |
| $L_{A1988}$ | $R^{A3}$ | H | $R^{C3}$ | C |
| $L_{A1989}$ | $R^{A34}$ | H | $R^{C3}$ | C |
| $L_{A1990}$ | $R^{A57}$ | H | $R^{C3}$ | C |
| $L_{A1991}$ | H | $R^{B1}$ | $R^{C3}$ | C |
| $L_{A1992}$ | H | $R^{B3}$ | $R^{C3}$ | C |
| $L_{A1993}$ | H | $R^{B4}$ | $R^{C3}$ | C |
| $L_{A1994}$ | H | $R^{B5}$ | $R^{C3}$ | C |
| $L_{A1995}$ | H | $R^{B7}$ | $R^{C3}$ | C |
| $L_{A1996}$ | H | $R^{A3}$ | $R^{C3}$ | C |
| $L_{A1997}$ | H | $R^{A34}$ | $R^{C3}$ | C |
| $L_{A1998}$ | H | $R^{A57}$ | $R^{C3}$ | C |
| $L_{A1999}$ | $R^{B1}$ | $R^{B1}$ | $R^{C3}$ | C |
| $L_{A2000}$ | $R^{B3}$ | $R^{B3}$ | $R^{C3}$ | C |
| $L_{A2001}$ | $R^{B4}$ | $R^{B4}$ | $R^{C3}$ | C |
| $L_{A2002}$ | $R^{B5}$ | $R^{B5}$ | $R^{C3}$ | C |
| $L_{A2003}$ | $R^{B7}$ | $R^{B7}$ | $R^{C3}$ | C |
| $L_{A2004}$ | $R^{A3}$ | $R^{A3}$ | $R^{C3}$ | C |
| $L_{A2005}$ | $R^{A34}$ | $R^{A34}$ | $R^{C3}$ | C |
| $L_{A2006}$ | $R^{A57}$ | $R^{A57}$ | $R^{C3}$ | C |
| $L_{A2007}$ | $R^{B3}$ | $R^{B1}$ | $R^{C3}$ | C |
| $L_{A2008}$ | $R^{B4}$ | $R^{B1}$ | $R^{C3}$ | C |
| $L_{A2009}$ | $R^{B5}$ | $R^{B1}$ | $R^{C3}$ | C |
| $L_{A2010}$ | $R^{B7}$ | $R^{B1}$ | $R^{C3}$ | C |
| $L_{A2011}$ | $R^{A3}$ | $R^{B1}$ | $R^{C3}$ | C |
| $L_{A2012}$ | $R^{A34}$ | $R^{B1}$ | $R^{C3}$ | C |
| $L_{A2013}$ | $R^{A57}$ | $R^{B1}$ | $R^{C3}$ | C |
| $L_{A2014}$ | $R^{B1}$ | $R^{B3}$ | $R^{C3}$ | C |
| $L_{A2015}$ | $R^{B1}$ | $R^{B4}$ | $R^{C3}$ | C |
| $L_{A2016}$ | $R^{B1}$ | $R^{B5}$ | $R^{C3}$ | C |
| $L_{A2017}$ | $R^{B1}$ | $R^{B7}$ | $R^{C3}$ | C |
| $L_{A2018}$ | $R^{B1}$ | $R^{A3}$ | $R^{C3}$ | C |
| $L_{A2019}$ | $R^{B1}$ | $R^{A34}$ | $R^{C3}$ | C |
| $L_{A2020}$ | $R^{B1}$ | $R^{A57}$ | $R^{C3}$ | C |
| $L_{A2021}$ | $R^{B1}$ | H | $R^{C8}$ | C |
| $L_{A2022}$ | $R^{B3}$ | H | $R^{C8}$ | C |
| $L_{A2023}$ | $R^{B4}$ | H | $R^{C8}$ | C |
| $L_{A2024}$ | $R^{B5}$ | H | $R^{C8}$ | C |
| $L_{A2025}$ | $R^{B7}$ | H | $R^{C8}$ | C |
| $L_{A2026}$ | $R^{A3}$ | H | $R^{C8}$ | C |
| $L_{A2027}$ | $R^{A34}$ | H | $R^{C8}$ | C |
| $L_{A2028}$ | $R^{A57}$ | H | $R^{C8}$ | C |
| $L_{A2029}$ | H | $R^{B1}$ | $R^{C8}$ | C |
| $L_{A2030}$ | H | $R^{B3}$ | $R^{C8}$ | C |
| $L_{A2031}$ | H | $R^{B4}$ | $R^{C8}$ | C |
| $L_{A2032}$ | H | $R^{B5}$ | $R^{C8}$ | C |

| Ligand | $R^3$ | $R^4$ | G | X |
|---|---|---|---|---|
| $L_{A2033}$ | H | $R^{B7}$ | $R^{C8}$ | C |
| $L_{A2034}$ | H | $R^{A3}$ | $R^{C8}$ | C |
| $L_{A2035}$ | H | $R^{A34}$ | $R^{C8}$ | C |
| $L_{A2036}$ | H | $R^{A57}$ | $R^{C8}$ | C |
| $L_{A2037}$ | $R^{B1}$ | $R^{B1}$ | $R^{C8}$ | C |
| $L_{A2038}$ | $R^{B3}$ | $R^{B3}$ | $R^{C8}$ | C |
| $L_{A2039}$ | $R^{B4}$ | $R^{B4}$ | $R^{C8}$ | C |
| $L_{A2040}$ | $R^{B5}$ | $R^{B5}$ | $R^{C8}$ | C |
| $L_{A2041}$ | $R^{B7}$ | $R^{B7}$ | $R^{C8}$ | C |
| $L_{A2042}$ | $R^{A3}$ | $R^{A3}$ | $R^{C8}$ | C |
| $L_{A2043}$ | $R^{A34}$ | $R^{A34}$ | $R^{C8}$ | C |
| $L_{A2044}$ | $R^{A57}$ | $R^{A57}$ | $R^{C8}$ | C |
| $L_{A2045}$ | $R^{B3}$ | $R^{B1}$ | $R^{C8}$ | C |
| $L_{A2046}$ | $R^{B4}$ | $R^{B1}$ | $R^{C8}$ | C |
| $L_{A2047}$ | $R^{B5}$ | $R^{B1}$ | $R^{C8}$ | C |
| $L_{A2048}$ | $R^{B7}$ | $R^{B1}$ | $R^{C8}$ | C |
| $L_{A2049}$ | $R^{A3}$ | $R^{B1}$ | $R^{C8}$ | C |
| $L_{A2050}$ | $R^{A34}$ | $R^{B1}$ | $R^{C8}$ | C |
| $L_{A2051}$ | $R^{A57}$ | $R^{B1}$ | $R^{C8}$ | C |
| $L_{A2052}$ | $R^{B1}$ | $R^{B3}$ | $R^{C8}$ | C |
| $L_{A2053}$ | $R^{B1}$ | $R^{B4}$ | $R^{C8}$ | C |
| $L_{A2054}$ | $R^{B1}$ | $R^{B5}$ | $R^{C8}$ | C |
| $L_{A2055}$ | $R^{B1}$ | $R^{B7}$ | $R^{C8}$ | C |
| $L_{A2056}$ | $R^{B1}$ | $R^{A3}$ | $R^{C8}$ | C |
| $L_{A2057}$ | $R^{B1}$ | $R^{A34}$ | $R^{C8}$ | C |
| $L_{A2058}$ | $R^{B1}$ | $R^{A57}$ | $R^{C8}$ | C |
| $L_{A2059}$ | $R^{B1}$ | H | $R^{C9}$ | C |
| $L_{A2060}$ | $R^{B3}$ | H | $R^{C9}$ | C |
| $L_{A2061}$ | $R^{B4}$ | H | $R^{C9}$ | C |
| $L_{A2062}$ | $R^{B5}$ | H | $R^{C9}$ | C |
| $L_{A2063}$ | $R^{B7}$ | H | $R^{C9}$ | C |
| $L_{A2064}$ | $R^{A3}$ | H | $R^{C9}$ | C |
| $L_{A2065}$ | $R^{A34}$ | H | $R^{C9}$ | C |
| $L_{A2066}$ | $R^{A57}$ | H | $R^{C9}$ | C |
| $L_{A2067}$ | H | $R^{B1}$ | $R^{C9}$ | C |
| $L_{A2068}$ | H | $R^{B3}$ | $R^{C9}$ | C |
| $L_{A2069}$ | H | $R^{B4}$ | $R^{C9}$ | C |
| $L_{A2070}$ | H | $R^{B5}$ | $R^{C9}$ | C |
| $L_{A2071}$ | H | $R^{B7}$ | $R^{C9}$ | C |
| $L_{A2072}$ | H | $R^{A3}$ | $R^{C9}$ | C |
| $L_{A2073}$ | H | $R^{A34}$ | $R^{C9}$ | C |
| $L_{A2074}$ | H | $R^{A57}$ | $R^{C9}$ | C |
| $L_{A2075}$ | $R^{B1}$ | $R^{B1}$ | $R^{C9}$ | C |
| $L_{A2076}$ | $R^{B3}$ | $R^{B3}$ | $R^{C9}$ | C |
| $L_{A2077}$ | $R^{B4}$ | $R^{B4}$ | $R^{C9}$ | C |
| $L_{A2078}$ | $R^{B5}$ | $R^{B5}$ | $R^{C9}$ | C |
| $L_{A2079}$ | $R^{B7}$ | $R^{B7}$ | $R^{C9}$ | C |
| $L_{A2080}$ | $R^{A3}$ | $R^{A3}$ | $R^{C9}$ | C |
| $L_{A2081}$ | $R^{A34}$ | $R^{A34}$ | $R^{C9}$ | C |
| $L_{A2082}$ | $R^{A57}$ | $R^{A57}$ | $R^{C9}$ | C |
| $L_{A2083}$ | $R^{B3}$ | $R^{B1}$ | $R^{C9}$ | C |
| $L_{A2084}$ | $R^{B4}$ | $R^{B1}$ | $R^{C9}$ | C |
| $L_{A2085}$ | $R^{B5}$ | $R^{B1}$ | $R^{C9}$ | C |
| $L_{A2086}$ | $R^{B7}$ | $R^{B1}$ | $R^{C9}$ | C |
| $L_{A2087}$ | $R^{A3}$ | $R^{B1}$ | $R^{C9}$ | C |
| $L_{A2088}$ | $R^{A34}$ | $R^{B1}$ | $R^{C9}$ | C |
| $L_{A2089}$ | $R^{A57}$ | $R^{B1}$ | $R^{C9}$ | C |
| $L_{A2090}$ | $R^{B1}$ | $R^{B3}$ | $R^{C9}$ | C |
| $L_{A2091}$ | $R^{B1}$ | $R^{B4}$ | $R^{C9}$ | C |
| $L_{A2092}$ | $R^{B1}$ | $R^{B5}$ | $R^{C9}$ | C |
| $L_{A2093}$ | $R^{B1}$ | $R^{B7}$ | $R^{C9}$ | C |
| $L_{A2094}$ | $R^{B1}$ | $R^{A3}$ | $R^{C9}$ | C |
| $L_{A2095}$ | $R^{B1}$ | $R^{A34}$ | $R^{C9}$ | C |
| $L_{A2096}$ | $R^{B1}$ | $R^{A57}$ | $R^{C9}$ | C |
| $L_{A2097}$ | $R^{B1}$ | H | $R^{C1}$ | N |
| $L_{A2098}$ | $R^{B3}$ | H | $R^{C1}$ | N |
| $L_{A2099}$ | $R^{B4}$ | H | $R^{C1}$ | N |
| $L_{A2100}$ | $R^{B5}$ | H | $R^{C1}$ | N |
| $L_{A2101}$ | $R^{B7}$ | H | $R^{C1}$ | N |
| $L_{A2102}$ | $R^{A3}$ | H | $R^{C1}$ | N |
| $L_{A2103}$ | $R^{A34}$ | H | $R^{C1}$ | N |
| $L_{A2104}$ | $R^{A57}$ | H | $R^{C1}$ | N |
| $L_{A2105}$ | H | $R^{B1}$ | $R^{C1}$ | N |
| $L_{A2106}$ | H | $R^{B3}$ | $R^{C1}$ | N |
| $L_{A2107}$ | H | $R^{B4}$ | $R^{C1}$ | N |
| $L_{A2108}$ | H | $R^{B5}$ | $R^{C1}$ | N |
| $L_{A2109}$ | H | $R^{B7}$ | $R^{C1}$ | N |
| $L_{A2110}$ | H | $R^{A3}$ | $R^{C1}$ | N |
| $L_{A2111}$ | H | $R^{A34}$ | $R^{C1}$ | N |
| $L_{A2112}$ | H | $R^{A57}$ | $R^{C1}$ | N |
| $L_{A2113}$ | $R^{B1}$ | $R^{B1}$ | $R^{C1}$ | N |
| $L_{A2114}$ | $R^{B3}$ | $R^{B3}$ | $R^{C1}$ | N |
| $L_{A2115}$ | $R^{B4}$ | $R^{B4}$ | $R^{C1}$ | N |
| $L_{A2116}$ | $R^{B5}$ | $R^{B5}$ | $R^{C1}$ | N |
| $L_{A2117}$ | $R^{B7}$ | $R^{B7}$ | $R^{C1}$ | N |
| $L_{A2118}$ | $R^{A3}$ | $R^{A3}$ | $R^{C1}$ | N |
| $L_{A2119}$ | $R^{A34}$ | $R^{A34}$ | $R^{C1}$ | N |
| $L_{A2120}$ | $R^{A57}$ | $R^{A57}$ | $R^{C1}$ | N |
| $L_{A2121}$ | $R^{B3}$ | $R^{B1}$ | $R^{C1}$ | N |
| $L_{A2122}$ | $R^{B4}$ | $R^{B1}$ | $R^{C1}$ | N |
| $L_{A2123}$ | $R^{B5}$ | $R^{B1}$ | $R^{C1}$ | N |
| $L_{A2124}$ | $R^{B7}$ | $R^{B1}$ | $R^{C1}$ | N |
| $L_{A2125}$ | $R^{A3}$ | $R^{B1}$ | $R^{C1}$ | N |
| $L_{A2126}$ | $R^{A34}$ | $R^{B1}$ | $R^{C1}$ | N |
| $L_{A2127}$ | $R^{A57}$ | $R^{B1}$ | $R^{C1}$ | N |
| $L_{A2128}$ | $R^{B1}$ | $R^{B3}$ | $R^{C1}$ | N |
| $L_{A2129}$ | $R^{B1}$ | $R^{B4}$ | $R^{C1}$ | N |
| $L_{A2130}$ | $R^{B1}$ | $R^{B5}$ | $R^{C1}$ | N |
| $L_{A2131}$ | $R^{B1}$ | $R^{B7}$ | $R^{C1}$ | N |
| $L_{A2132}$ | $R^{B1}$ | $R^{A3}$ | $R^{C1}$ | N |
| $L_{A2133}$ | $R^{B1}$ | $R^{A34}$ | $R^{C1}$ | N |
| $L_{A2134}$ | $R^{B1}$ | $R^{A57}$ | $R^{C1}$ | N |
| $L_{A2135}$ | $R^{B1}$ | H | $R^{C2}$ | N |
| $L_{A2136}$ | $R^{B3}$ | H | $R^{C2}$ | N |
| $L_{A2137}$ | $R^{B4}$ | H | $R^{C2}$ | N |
| $L_{A2138}$ | $R^{B5}$ | H | $R^{C2}$ | N |
| $L_{A2139}$ | $R^{B7}$ | H | $R^{C2}$ | N |
| $L_{A2140}$ | $R^{A3}$ | H | $R^{C2}$ | N |
| $L_{A2141}$ | $R^{A34}$ | H | $R^{C2}$ | N |
| $L_{A2142}$ | $R^{A57}$ | H | $R^{C2}$ | N |
| $L_{A2143}$ | H | $R^{B1}$ | $R^{C2}$ | N |
| $L_{A2144}$ | H | $R^{B3}$ | $R^{C2}$ | N |
| $L_{A2145}$ | H | $R^{B4}$ | $R^{C2}$ | N |
| $L_{A2146}$ | H | $R^{B5}$ | $R^{C2}$ | N |
| $L_{A2147}$ | H | $R^{B7}$ | $R^{C2}$ | N |
| $L_{A2148}$ | H | $R^{A3}$ | $R^{C2}$ | N |
| $L_{A2149}$ | H | $R^{A34}$ | $R^{C2}$ | N |
| $L_{A2150}$ | H | $R^{A57}$ | $R^{C2}$ | N |
| $L_{A2151}$ | $R^{B1}$ | $R^{B1}$ | $R^{C2}$ | N |
| $L_{A2152}$ | $R^{B3}$ | $R^{B3}$ | $R^{C2}$ | N |
| $L_{A2153}$ | $R^{B4}$ | $R^{B4}$ | $R^{C2}$ | N |
| $L_{A2154}$ | $R^{B5}$ | $R^{B5}$ | $R^{C2}$ | N |
| $L_{A2155}$ | $R^{B7}$ | $R^{B7}$ | $R^{C2}$ | N |
| $L_{A2156}$ | $R^{A3}$ | $R^{A3}$ | $R^{C2}$ | N |
| $L_{A2157}$ | $R^{A34}$ | $R^{A34}$ | $R^{C2}$ | N |
| $L_{A2158}$ | $R^{A57}$ | $R^{A57}$ | $R^{C2}$ | N |
| $L_{A2159}$ | $R^{B3}$ | $R^{B1}$ | $R^{C2}$ | N |
| $L_{A2160}$ | $R^{B4}$ | $R^{B1}$ | $R^{C2}$ | N |
| $L_{A2161}$ | $R^{B5}$ | $R^{B1}$ | $R^{C2}$ | N |
| $L_{A2162}$ | $R^{B7}$ | $R^{B1}$ | $R^{C2}$ | N |
| $L_{A2163}$ | $R^{A3}$ | $R^{B1}$ | $R^{C2}$ | N |
| $L_{A2164}$ | $R^{A34}$ | $R^{B1}$ | $R^{C2}$ | N |
| $L_{A2165}$ | $R^{A57}$ | $R^{B1}$ | $R^{C2}$ | N |
| $L_{A2166}$ | $R^{B1}$ | $R^{B3}$ | $R^{C2}$ | N |
| $L_{A2167}$ | $R^{B1}$ | $R^{B4}$ | $R^{C2}$ | N |
| $L_{A2168}$ | $R^{B1}$ | $R^{B5}$ | $R^{C2}$ | N |
| $L_{A2169}$ | $R^{B1}$ | $R^{B7}$ | $R^{C2}$ | N |
| $L_{A2170}$ | $R^{B1}$ | $R^{A3}$ | $R^{C2}$ | N |
| $L_{A2171}$ | $R^{B1}$ | $R^{A34}$ | $R^{C2}$ | N |
| $L_{A2172}$ | $R^{B1}$ | $R^{A57}$ | $R^{C2}$ | N |
| $L_{A2173}$ | $R^{B1}$ | H | $R^{C3}$ | N |
| $L_{A2174}$ | $R^{B3}$ | H | $R^{C3}$ | N |
| $L_{A2175}$ | $R^{B4}$ | H | $R^{C3}$ | N |
| $L_{A2176}$ | $R^{B5}$ | H | $R^{C3}$ | N |
| $L_{A2177}$ | $R^{B7}$ | H | $R^{C3}$ | N |
| $L_{A2178}$ | $R^{A3}$ | H | $R^{C3}$ | N |
| $L_{A2179}$ | $R^{A34}$ | H | $R^{C3}$ | N |
| $L_{A2180}$ | $R^{A57}$ | H | $R^{C3}$ | N |
| $L_{A2181}$ | H | $R^{B1}$ | $R^{C3}$ | N |
| $L_{A2182}$ | H | $R^{B3}$ | $R^{C3}$ | N |
| $L_{A2183}$ | H | $R^{B4}$ | $R^{C3}$ | N |
| $L_{A2184}$ | H | $R^{B5}$ | $R^{C3}$ | N |
| $L_{A2185}$ | H | $R^{B7}$ | $R^{C3}$ | N |
| $L_{A2186}$ | H | $R^{A3}$ | $R^{C3}$ | N |

-continued

| Ligand | $R^3$ | $R^4$ | G | X |
|---|---|---|---|---|
| $L_{A2187}$ | H | $R^{A34}$ | $R^{C3}$ | N |
| $L_{A2188}$ | H | $R^{A57}$ | $R^{C3}$ | N |
| $L_{A2189}$ | $R^{B1}$ | $R^{B1}$ | $R^{C3}$ | N |
| $L_{A2190}$ | $R^{B3}$ | $R^{B3}$ | $R^{C3}$ | N |
| $L_{A2191}$ | $R^{B4}$ | $R^{B4}$ | $R^{C3}$ | N |
| $L_{A2192}$ | $R^{B5}$ | $R^{B5}$ | $R^{C3}$ | N |
| $L_{A2193}$ | $R^{B7}$ | $R^{B7}$ | $R^{C3}$ | N |
| $L_{A2194}$ | $R^{A3}$ | $R^{A3}$ | $R^{C3}$ | N |
| $L_{A2195}$ | $R^{A34}$ | $R^{A34}$ | $R^{C3}$ | N |
| $L_{A2196}$ | $R^{A57}$ | $R^{A57}$ | $R^{C3}$ | N |
| $L_{A2197}$ | $R^{B3}$ | $R^{B1}$ | $R^{C3}$ | N |
| $L_{A2198}$ | $R^{B4}$ | $R^{B1}$ | $R^{C3}$ | N |
| $L_{A2199}$ | $R^{B5}$ | $R^{B1}$ | $R^{C3}$ | N |
| $L_{A2200}$ | $R^{B7}$ | $R^{B1}$ | $R^{C3}$ | N |
| $L_{A2201}$ | $R^{A3}$ | $R^{B1}$ | $R^{C3}$ | N |
| $L_{A2202}$ | $R^{A34}$ | $R^{B1}$ | $R^{C3}$ | N |
| $L_{A2203}$ | $R^{A57}$ | $R^{B1}$ | $R^{C3}$ | N |
| $L_{A2204}$ | $R^{B1}$ | $R^{B3}$ | $R^{C3}$ | N |
| $L_{A2205}$ | $R^{B1}$ | $R^{B4}$ | $R^{C3}$ | N |
| $L_{A2206}$ | $R^{B1}$ | $R^{B5}$ | $R^{C3}$ | N |
| $L_{A2207}$ | $R^{B1}$ | $R^{B7}$ | $R^{C3}$ | N |
| $L_{A2208}$ | $R^{B1}$ | $R^{A3}$ | $R^{C3}$ | N |
| $L_{A2209}$ | $R^{B1}$ | $R^{A34}$ | $R^{C3}$ | N |
| $L_{A2210}$ | $R^{B1}$ | $R^{A57}$ | $R^{C3}$ | N |
| $L_{A2211}$ | $R^{B1}$ | H | $R^{C8}$ | N |
| $L_{A2212}$ | $R^{B3}$ | H | $R^{C8}$ | N |
| $L_{A2213}$ | $R^{B4}$ | H | $R^{C8}$ | N |
| $L_{A2214}$ | $R^{B5}$ | H | $R^{C8}$ | N |
| $L_{A2215}$ | $R^{B7}$ | H | $R^{C8}$ | N |
| $L_{A2216}$ | $R^{A3}$ | H | $R^{C8}$ | N |
| $L_{A2217}$ | $R^{A34}$ | H | $R^{C8}$ | N |
| $L_{A2218}$ | $R^{A57}$ | H | $R^{C8}$ | N |
| $L_{A2219}$ | H | $R^{B1}$ | $R^{C8}$ | N |
| $L_{A2220}$ | H | $R^{B3}$ | $R^{C8}$ | N |
| $L_{A2221}$ | H | $R^{B4}$ | $R^{C8}$ | N |
| $L_{A2222}$ | H | $R^{B5}$ | $R^{C8}$ | N |
| $L_{A2223}$ | H | $R^{B7}$ | $R^{C8}$ | N |
| $L_{A2224}$ | H | $R^{A3}$ | $R^{C8}$ | N |
| $L_{A2225}$ | H | $R^{A34}$ | $R^{C8}$ | N |
| $L_{A2226}$ | H | $R^{A57}$ | $R^{C8}$ | N |
| $L_{A2227}$ | $R^{B1}$ | $R^{B1}$ | $R^{C8}$ | N |
| $L_{A2228}$ | $R^{B3}$ | $R^{B3}$ | $R^{C8}$ | N |
| $L_{A2229}$ | $R^{B4}$ | $R^{B4}$ | $R^{C8}$ | N |
| $L_{A2230}$ | $R^{B5}$ | $R^{B5}$ | $R^{C8}$ | N |
| $L_{A2231}$ | $R^{B7}$ | $R^{B7}$ | $R^{C8}$ | N |
| $L_{A2232}$ | $R^{A3}$ | $R^{A3}$ | $R^{C8}$ | N |
| $L_{A2233}$ | $R^{A34}$ | $R^{A34}$ | $R^{C8}$ | N |
| $L_{A2234}$ | $R^{A57}$ | $R^{A57}$ | $R^{C8}$ | N |
| $L_{A2235}$ | $R^{B3}$ | $R^{B1}$ | $R^{C8}$ | N |
| $L_{A2236}$ | $R^{B4}$ | $R^{B1}$ | $R^{C8}$ | N |
| $L_{A2237}$ | $R^{B5}$ | $R^{B1}$ | $R^{C8}$ | N |
| $L_{A2238}$ | $R^{B7}$ | $R^{B1}$ | $R^{C8}$ | N |
| $L_{A2239}$ | $R^{A3}$ | $R^{B1}$ | $R^{C8}$ | N |
| $L_{A2240}$ | $R^{A34}$ | $R^{B1}$ | $R^{C8}$ | N |
| $L_{A2241}$ | $R^{A57}$ | $R^{B1}$ | $R^{C8}$ | N |
| $L_{A2242}$ | $R^{B1}$ | $R^{B3}$ | $R^{C8}$ | N |
| $L_{A2243}$ | $R^{B1}$ | $R^{B4}$ | $R^{C8}$ | N |
| $L_{A2244}$ | $R^{B1}$ | $R^{B5}$ | $R^{C8}$ | N |
| $L_{A2245}$ | $R^{B1}$ | $R^{B7}$ | $R^{C8}$ | N |
| $L_{A2246}$ | $R^{B1}$ | $R^{A3}$ | $R^{C8}$ | N |
| $L_{A2247}$ | $R^{B1}$ | $R^{A34}$ | $R^{C8}$ | N |
| $L_{A2248}$ | $R^{B1}$ | $R^{A57}$ | $R^{C8}$ | N |
| $L_{A2249}$ | $R^{B1}$ | H | $R^{C9}$ | N |
| $L_{A2250}$ | $R^{B3}$ | H | $R^{C9}$ | N |
| $L_{A2251}$ | $R^{B4}$ | H | $R^{C9}$ | N |
| $L_{A2252}$ | $R^{B5}$ | H | $R^{C9}$ | N |
| $L_{A2253}$ | $R^{B7}$ | H | $R^{C9}$ | N |
| $L_{A2254}$ | $R^{A3}$ | H | $R^{C9}$ | N |
| $L_{A2255}$ | $R^{A34}$ | H | $R^{C9}$ | N |
| $L_{A2256}$ | $R^{A57}$ | H | $R^{C9}$ | N |
| $L_{A2257}$ | H | $R^{B1}$ | $R^{C9}$ | N |
| $L_{A2258}$ | H | $R^{B3}$ | $R^{C9}$ | N |
| $L_{A2259}$ | H | $R^{B4}$ | $R^{C9}$ | N |
| $L_{A2260}$ | H | $R^{B5}$ | $R^{C9}$ | N |
| $L_{A2261}$ | H | $R^{B7}$ | $R^{C9}$ | N |
| $L_{A2262}$ | H | $R^{A3}$ | $R^{C9}$ | N |
| $L_{A2263}$ | H | $R^{A34}$ | $R^{C9}$ | N |

-continued

| Ligand | $R^3$ | $R^4$ | G | X |
|---|---|---|---|---|
| $L_{A2264}$ | H | $R^{A57}$ | $R^{C9}$ | N |
| $L_{A2265}$ | $R^{B1}$ | $R^{B1}$ | $R^{C9}$ | N |
| $L_{A2266}$ | $R^{B3}$ | $R^{B3}$ | $R^{C9}$ | N |
| $L_{A2267}$ | $R^{B4}$ | $R^{B4}$ | $R^{C9}$ | N |
| $L_{A2268}$ | $R^{B5}$ | $R^{B5}$ | $R^{C9}$ | N |
| $L_{A2269}$ | $R^{B7}$ | $R^{B7}$ | $R^{C9}$ | N |
| $L_{A2270}$ | $R^{A3}$ | $R^{A3}$ | $R^{C9}$ | N |
| $L_{A2271}$ | $R^{A34}$ | $R^{A34}$ | $R^{C9}$ | N |
| $L_{A2272}$ | $R^{A57}$ | $R^{A57}$ | $R^{C9}$ | N |
| $L_{A2273}$ | $R^{B3}$ | $R^{B1}$ | $R^{C9}$ | N |
| $L_{A2274}$ | $R^{B4}$ | $R^{B1}$ | $R^{C9}$ | N |
| $L_{A2275}$ | $R^{B5}$ | $R^{B1}$ | $R^{C9}$ | N |
| $L_{A2276}$ | $R^{B7}$ | $R^{B1}$ | $R^{C9}$ | N |
| $L_{A2277}$ | $R^{A3}$ | $R^{B1}$ | $R^{C9}$ | N |
| $L_{A2278}$ | $R^{A34}$ | $R^{B1}$ | $R^{C9}$ | N |
| $L_{A2279}$ | $R^{A57}$ | $R^{B1}$ | $R^{C9}$ | N |
| $L_{A2280}$ | $R^{B1}$ | $R^{B3}$ | $R^{C9}$ | N |
| $L_{A2281}$ | $R^{B1}$ | $R^{B4}$ | $R^{C9}$ | N |
| $L_{A2282}$ | $R^{B1}$ | $R^{B5}$ | $R^{C9}$ | N |
| $L_{A2283}$ | $R^{B1}$ | $R^{B7}$ | $R^{C9}$ | N |
| $L_{A2284}$ | $R^{B1}$ | $R^{A3}$ | $R^{C9}$ | N |
| $L_{A2285}$ | $R^{B1}$ | $R^{A34}$ | $R^{C9}$ | N |
| $L_{A2286}$ | $R^{B1}$ | $R^{A57}$ | $R^{C9}$ | N |

$L_{A2287}$ through $L_{A2667}$ are based on a structure of Formula V,

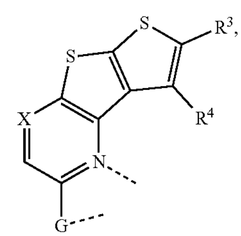

in which $R^3$, $R^4$, X and G are defined as:

| Ligand | $R^3$ | $R^4$ | G | X |
|---|---|---|---|---|
| $L_{A2287}$ | H | H | $R^{C1}$ | C |
| $L_{A2288}$ | $R^{B1}$ | H | $R^{C1}$ | C |
| $L_{A2289}$ | $R^{B3}$ | H | $R^{C1}$ | C |
| $L_{A2290}$ | $R^{B4}$ | H | $R^{C1}$ | C |
| $L_{A2291}$ | $R^{B5}$ | H | $R^{C1}$ | C |
| $L_{A2292}$ | $R^{B7}$ | H | $R^{C1}$ | C |
| $L_{A2293}$ | $R^{A3}$ | H | $R^{C1}$ | C |
| $L_{A2294}$ | $R^{A34}$ | H | $R^{C1}$ | C |
| $L_{A2295}$ | $R^{A57}$ | H | $R^{C1}$ | C |
| $L_{A2296}$ | H | $R^{B1}$ | $R^{C1}$ | C |
| $L_{A2297}$ | H | $R^{B3}$ | $R^{C1}$ | C |
| $L_{A2298}$ | H | $R^{B4}$ | $R^{C1}$ | C |
| $L_{A2299}$ | H | $R^{B5}$ | $R^{C1}$ | C |
| $L_{A2300}$ | H | $R^{B7}$ | $R^{C1}$ | C |
| $L_{A2301}$ | H | $R^{A3}$ | $R^{C1}$ | C |
| $L_{A2302}$ | H | $R^{A34}$ | $R^{C1}$ | C |
| $L_{A2303}$ | H | $R^{A57}$ | $R^{C1}$ | C |
| $L_{A2304}$ | $R^{B1}$ | $R^{B1}$ | $R^{C1}$ | C |
| $L_{A2305}$ | $R^{B3}$ | $R^{B3}$ | $R^{C1}$ | C |
| $L_{A2306}$ | $R^{B4}$ | $R^{B4}$ | $R^{C1}$ | C |
| $L_{A2307}$ | $R^{B5}$ | $R^{B5}$ | $R^{C1}$ | C |
| $L_{A2308}$ | $R^{B7}$ | $R^{B7}$ | $R^{C1}$ | C |
| $L_{A2309}$ | $R^{A3}$ | $R^{A3}$ | $R^{C1}$ | C |
| $L_{A2310}$ | $R^{A34}$ | $R^{A34}$ | $R^{C1}$ | C |
| $L_{A2311}$ | $R^{A57}$ | $R^{A57}$ | $R^{C1}$ | C |
| $L_{A2312}$ | $R^{B3}$ | $R^{B1}$ | $R^{C1}$ | C |
| $L_{A2313}$ | $R^{B4}$ | $R^{B1}$ | $R^{C1}$ | C |
| $L_{A2314}$ | $R^{B5}$ | $R^{B1}$ | $R^{C1}$ | C |
| $L_{A2315}$ | $R^{B7}$ | $R^{B1}$ | $R^{C1}$ | C |
| $L_{A2316}$ | $R^{A3}$ | $R^{B1}$ | $R^{C1}$ | C |
| $L_{A2317}$ | $R^{A34}$ | $R^{B1}$ | $R^{C1}$ | C |

-continued

| Ligand | $R^3$ | $R^4$ | G | X |
|---|---|---|---|---|
| $L_{A2318}$ | $R^{A57}$ | $R^{B1}$ | $R^{C1}$ | C |
| $L_{A2319}$ | $R^{B1}$ | $R^{B3}$ | $R^{C1}$ | C |
| $L_{A2320}$ | $R^{B1}$ | $R^{B4}$ | $R^{C1}$ | C |
| $L_{A2321}$ | $R^{B1}$ | $R^{B5}$ | $R^{C1}$ | C |
| $L_{A2322}$ | $R^{B1}$ | $R^{B7}$ | $R^{C1}$ | C |
| $L_{A2323}$ | $R^{B1}$ | $R^{A3}$ | $R^{C1}$ | C |
| $L_{A2324}$ | $R^{B1}$ | $R^{A34}$ | $R^{C1}$ | C |
| $L_{A2325}$ | $R^{B1}$ | $R^{A57}$ | $R^{C1}$ | C |
| $L_{A2326}$ | $R^{B1}$ | H | $R^{C2}$ | C |
| $L_{A2327}$ | $R^{B3}$ | H | $R^{C2}$ | C |
| $L_{A2328}$ | $R^{B4}$ | H | $R^{C2}$ | C |
| $L_{A2329}$ | $R^{B5}$ | H | $R^{C2}$ | C |
| $L_{A2330}$ | $R^{B7}$ | H | $R^{C2}$ | C |
| $L_{A2331}$ | $R^{A3}$ | H | $R^{C2}$ | C |
| $L_{A2332}$ | $R^{A34}$ | H | $R^{C2}$ | C |
| $L_{A2333}$ | $R^{A57}$ | H | $R^{C2}$ | C |
| $L_{A2334}$ | H | $R^{B1}$ | $R^{C2}$ | C |
| $L_{A2335}$ | H | $R^{B3}$ | $R^{C2}$ | C |
| $L_{A2336}$ | H | $R^{B4}$ | $R^{C2}$ | C |
| $L_{A2337}$ | H | $R^{B5}$ | $R^{C2}$ | C |
| $L_{A2338}$ | H | $R^{B7}$ | $R^{C2}$ | C |
| $L_{A2339}$ | H | $R^{A3}$ | $R^{C2}$ | C |
| $L_{A2340}$ | H | $R^{A34}$ | $R^{C2}$ | C |
| $L_{A2341}$ | H | $R^{A57}$ | $R^{C2}$ | C |
| $L_{A2342}$ | $R^{B1}$ | $R^{B1}$ | $R^{C2}$ | C |
| $L_{A2343}$ | $R^{B3}$ | $R^{B3}$ | $R^{C2}$ | C |
| $L_{A2344}$ | $R^{B4}$ | $R^{B4}$ | $R^{C2}$ | C |
| $L_{A2345}$ | $R^{B5}$ | $R^{B5}$ | $R^{C2}$ | C |
| $L_{A2346}$ | $R^{B7}$ | $R^{B7}$ | $R^{C2}$ | C |
| $L_{A2347}$ | $R^{A3}$ | $R^{A3}$ | $R^{C2}$ | C |
| $L_{A2348}$ | $R^{A34}$ | $R^{A34}$ | $R^{C2}$ | C |
| $L_{A2349}$ | $R^{A57}$ | $R^{A57}$ | $R^{C2}$ | C |
| $L_{A2350}$ | $R^{B3}$ | $R^{B1}$ | $R^{C2}$ | C |
| $L_{A2351}$ | $R^{B4}$ | $R^{B1}$ | $R^{C2}$ | C |
| $L_{A2352}$ | $R^{B5}$ | $R^{B1}$ | $R^{C2}$ | C |
| $L_{A2353}$ | $R^{B7}$ | $R^{B1}$ | $R^{C2}$ | C |
| $L_{A2354}$ | $R^{A3}$ | $R^{B1}$ | $R^{C2}$ | C |
| $L_{A2355}$ | $R^{A34}$ | $R^{B1}$ | $R^{C2}$ | C |
| $L_{A2356}$ | $R^{A57}$ | $R^{B1}$ | $R^{C2}$ | C |
| $L_{A2357}$ | $R^{B1}$ | $R^{B3}$ | $R^{C2}$ | C |
| $L_{A2358}$ | $R^{B1}$ | $R^{B4}$ | $R^{C2}$ | C |
| $L_{A2359}$ | $R^{B1}$ | $R^{B5}$ | $R^{C2}$ | C |
| $L_{A2360}$ | $R^{B1}$ | $R^{B7}$ | $R^{C2}$ | C |
| $L_{A2361}$ | $R^{B1}$ | $R^{A3}$ | $R^{C2}$ | C |
| $L_{A2362}$ | $R^{B1}$ | $R^{A34}$ | $R^{C2}$ | C |
| $L_{A2363}$ | $R^{B1}$ | $R^{A57}$ | $R^{C2}$ | C |
| $L_{A2364}$ | $R^{B1}$ | H | $R^{C3}$ | C |
| $L_{A2365}$ | $R^{B3}$ | H | $R^{C3}$ | C |
| $L_{A2366}$ | $R^{B4}$ | H | $R^{C3}$ | C |
| $L_{A2367}$ | $R^{B5}$ | H | $R^{C3}$ | C |
| $L_{A2368}$ | $R^{B7}$ | H | $R^{C3}$ | C |
| $L_{A2369}$ | $R^{A3}$ | H | $R^{C3}$ | C |
| $L_{A2370}$ | $R^{A34}$ | H | $R^{C3}$ | C |
| $L_{A2371}$ | $R^{A57}$ | H | $R^{C3}$ | C |
| $L_{A2372}$ | H | $R^{B1}$ | $R^{C3}$ | C |
| $L_{A2373}$ | H | $R^{B3}$ | $R^{C3}$ | C |
| $L_{A2374}$ | H | $R^{B4}$ | $R^{C3}$ | C |
| $L_{A2375}$ | H | $R^{B5}$ | $R^{C3}$ | C |
| $L_{A2376}$ | H | $R^{B7}$ | $R^{C3}$ | C |
| $L_{A2377}$ | H | $R^{A3}$ | $R^{C3}$ | C |
| $L_{A2378}$ | H | $R^{A34}$ | $R^{C3}$ | C |
| $L_{A2379}$ | H | $R^{A57}$ | $R^{C3}$ | C |
| $L_{A2380}$ | $R^{B1}$ | $R^{B1}$ | $R^{C3}$ | C |
| $L_{A2381}$ | $R^{B3}$ | $R^{B3}$ | $R^{C3}$ | C |
| $L_{A2382}$ | $R^{B4}$ | $R^{B4}$ | $R^{C3}$ | C |
| $L_{A2383}$ | $R^{B5}$ | $R^{B5}$ | $R^{C3}$ | C |
| $L_{A2384}$ | $R^{B7}$ | $R^{B7}$ | $R^{C3}$ | C |
| $L_{A2385}$ | $R^{A3}$ | $R^{A3}$ | $R^{C3}$ | C |
| $L_{A2386}$ | $R^{A34}$ | $R^{A34}$ | $R^{C3}$ | C |
| $L_{A2387}$ | $R^{A57}$ | $R^{A57}$ | $R^{C3}$ | C |
| $L_{A2388}$ | $R^{B3}$ | $R^{B1}$ | $R^{C3}$ | C |
| $L_{A2389}$ | $R^{B4}$ | $R^{B1}$ | $R^{C3}$ | C |
| $L_{A2390}$ | $R^{B5}$ | $R^{B1}$ | $R^{C3}$ | C |
| $L_{A2391}$ | $R^{B7}$ | $R^{B1}$ | $R^{C3}$ | C |
| $L_{A2392}$ | $R^{A3}$ | $R^{B1}$ | $R^{C3}$ | C |
| $L_{A2393}$ | $R^{A34}$ | $R^{B1}$ | $R^{C3}$ | C |
| $L_{A2394}$ | $R^{A57}$ | $R^{B1}$ | $R^{C3}$ | C |

-continued

| Ligand | $R^3$ | $R^4$ | G | X |
|---|---|---|---|---|
| $L_{A2395}$ | $R^{B1}$ | $R^{B3}$ | $R^{C3}$ | C |
| $L_{A2396}$ | $R^{B1}$ | $R^{B4}$ | $R^{C3}$ | C |
| $L_{A2397}$ | $R^{B1}$ | $R^{B5}$ | $R^{C3}$ | C |
| $L_{A2398}$ | $R^{B1}$ | $R^{B7}$ | $R^{C3}$ | C |
| $L_{A2399}$ | $R^{B1}$ | $R^{A3}$ | $R^{C3}$ | C |
| $L_{A2400}$ | $R^{B1}$ | $R^{A34}$ | $R^{C3}$ | C |
| $L_{A2401}$ | $R^{B1}$ | $R^{A57}$ | $R^{C3}$ | C |
| $L_{A2402}$ | $R^{B1}$ | H | $R^{C8}$ | C |
| $L_{A2403}$ | $R^{B3}$ | H | $R^{C8}$ | C |
| $L_{A2404}$ | $R^{B4}$ | H | $R^{C8}$ | C |
| $L_{A2405}$ | $R^{B5}$ | H | $R^{C8}$ | C |
| $L_{A2406}$ | $R^{B7}$ | H | $R^{C8}$ | C |
| $L_{A2407}$ | $R^{A3}$ | H | $R^{C8}$ | C |
| $L_{A2408}$ | $R^{A34}$ | H | $R^{C8}$ | C |
| $L_{A2409}$ | $R^{A57}$ | H | $R^{C8}$ | C |
| $L_{A2410}$ | H | $R^{B1}$ | $R^{C8}$ | C |
| $L_{A2411}$ | H | $R^{B3}$ | $R^{C8}$ | C |
| $L_{A2412}$ | H | $R^{B4}$ | $R^{C8}$ | C |
| $L_{A2413}$ | H | $R^{B5}$ | $R^{C8}$ | C |
| $L_{A2414}$ | H | $R^{B7}$ | $R^{C8}$ | C |
| $L_{A2415}$ | H | $R^{A3}$ | $R^{C8}$ | C |
| $L_{A2416}$ | H | $R^{A34}$ | $R^{C8}$ | C |
| $L_{A2417}$ | H | $R^{A57}$ | $R^{C8}$ | C |
| $L_{A2418}$ | $R^{B1}$ | $R^{B1}$ | $R^{C8}$ | C |
| $L_{A2419}$ | $R^{B3}$ | $R^{B3}$ | $R^{C8}$ | C |
| $L_{A2420}$ | $R^{B4}$ | $R^{B4}$ | $R^{C8}$ | C |
| $L_{A2421}$ | $R^{B5}$ | $R^{B5}$ | $R^{C8}$ | C |
| $L_{A2422}$ | $R^{B7}$ | $R^{B7}$ | $R^{C8}$ | C |
| $L_{A2423}$ | $R^{A3}$ | $R^{A3}$ | $R^{C8}$ | C |
| $L_{A2424}$ | $R^{A34}$ | $R^{A34}$ | $R^{C8}$ | C |
| $L_{A2425}$ | $R^{A57}$ | $R^{A57}$ | $R^{C8}$ | C |
| $L_{A2426}$ | $R^{B3}$ | $R^{B1}$ | $R^{C8}$ | C |
| $L_{A2427}$ | $R^{B4}$ | $R^{B1}$ | $R^{C8}$ | C |
| $L_{A2428}$ | $R^{B5}$ | $R^{B1}$ | $R^{C8}$ | C |
| $L_{A2429}$ | $R^{B7}$ | $R^{B1}$ | $R^{C8}$ | C |
| $L_{A2430}$ | $R^{A3}$ | $R^{B1}$ | $R^{C8}$ | C |
| $L_{A2431}$ | $R^{A34}$ | $R^{B1}$ | $R^{C8}$ | C |
| $L_{A2432}$ | $R^{A57}$ | $R^{B1}$ | $R^{C8}$ | C |
| $L_{A2433}$ | $R^{B1}$ | $R^{B3}$ | $R^{C8}$ | C |
| $L_{A2434}$ | $R^{B1}$ | $R^{B4}$ | $R^{C8}$ | C |
| $L_{A2435}$ | $R^{B1}$ | $R^{B5}$ | $R^{C8}$ | C |
| $L_{A2436}$ | $R^{B1}$ | $R^{B7}$ | $R^{C8}$ | C |
| $L_{A2437}$ | $R^{B1}$ | $R^{A3}$ | $R^{C8}$ | C |
| $L_{A2438}$ | $R^{B1}$ | $R^{A34}$ | $R^{C8}$ | C |
| $L_{A2439}$ | $R^{B1}$ | $R^{A57}$ | $R^{C8}$ | C |
| $L_{A2440}$ | $R^{B1}$ | H | $R^{C9}$ | C |
| $L_{A2441}$ | $R^{B3}$ | H | $R^{C9}$ | C |
| $L_{A2442}$ | $R^{B4}$ | H | $R^{C9}$ | C |
| $L_{A2443}$ | $R^{B5}$ | H | $R^{C9}$ | C |
| $L_{A2444}$ | $R^{B7}$ | H | $R^{C9}$ | C |
| $L_{A2445}$ | $R^{A3}$ | H | $R^{C9}$ | C |
| $L_{A2446}$ | $R^{A34}$ | H | $R^{C9}$ | C |
| $L_{A2447}$ | $R^{A57}$ | H | $R^{C9}$ | C |
| $L_{A2448}$ | H | $R^{B1}$ | $R^{C9}$ | C |
| $L_{A2449}$ | H | $R^{B3}$ | $R^{C9}$ | C |
| $L_{A2450}$ | H | $R^{B4}$ | $R^{C9}$ | C |
| $L_{A2451}$ | H | $R^{B5}$ | $R^{C9}$ | C |
| $L_{A2452}$ | H | $R^{B7}$ | $R^{C9}$ | C |
| $L_{A2453}$ | H | $R^{A3}$ | $R^{C9}$ | C |
| $L_{A2454}$ | H | $R^{A34}$ | $R^{C9}$ | C |
| $L_{A2455}$ | H | $R^{A57}$ | $R^{C9}$ | C |
| $L_{A2456}$ | $R^{B1}$ | $R^{B1}$ | $R^{C9}$ | C |
| $L_{A2457}$ | $R^{B3}$ | $R^{B3}$ | $R^{C9}$ | C |
| $L_{A2458}$ | $R^{B4}$ | $R^{B4}$ | $R^{C9}$ | C |
| $L_{A2459}$ | $R^{B5}$ | $R^{B5}$ | $R^{C9}$ | C |
| $L_{A2460}$ | $R^{B7}$ | $R^{B7}$ | $R^{C9}$ | C |
| $L_{A2461}$ | $R^{A3}$ | $R^{A3}$ | $R^{C9}$ | C |
| $L_{A2462}$ | $R^{A34}$ | $R^{A34}$ | $R^{C9}$ | C |
| $L_{A2463}$ | $R^{A57}$ | $R^{A57}$ | $R^{C9}$ | C |
| $L_{A2464}$ | $R^{B3}$ | $R^{B1}$ | $R^{C9}$ | C |
| $L_{A2465}$ | $R^{B4}$ | $R^{B1}$ | $R^{C9}$ | C |
| $L_{A2466}$ | $R^{B5}$ | $R^{B1}$ | $R^{C9}$ | C |
| $L_{A2467}$ | $R^{B7}$ | $R^{B1}$ | $R^{C9}$ | C |
| $L_{A2468}$ | $R^{A3}$ | $R^{B1}$ | $R^{C9}$ | C |
| $L_{A2469}$ | $R^{A34}$ | $R^{B1}$ | $R^{C9}$ | C |
| $L_{A2470}$ | $R^{A57}$ | $R^{B1}$ | $R^{C9}$ | C |
| $L_{A2471}$ | $R^{B1}$ | $R^{B3}$ | $R^{C9}$ | C |

-continued

| Ligand | $R^3$ | $R^4$ | G | X |
|---|---|---|---|---|
| $L_{A2472}$ | $R^{B1}$ | $R^{B4}$ | $R^{C9}$ | C |
| $L_{A2473}$ | $R^{B1}$ | $R^{B5}$ | $R^{C9}$ | C |
| $L_{A2474}$ | $R^{B1}$ | $R^{B7}$ | $R^{C9}$ | C |
| $L_{A2475}$ | $R^{B1}$ | $R^{A3}$ | $R^{C9}$ | C |
| $L_{A2476}$ | $R^{B1}$ | $R^{A34}$ | $R^{C9}$ | C |
| $L_{A2477}$ | $R^{B1}$ | $R^{A57}$ | $R^{C9}$ | C |
| $L_{A2478}$ | $R^{B1}$ | H | $R^{C1}$ | N |
| $L_{A2479}$ | $R^{B3}$ | H | $R^{C1}$ | N |
| $L_{A2480}$ | $R^{B4}$ | H | $R^{C1}$ | N |
| $L_{A2481}$ | $R^{B5}$ | H | $R^{C1}$ | N |
| $L_{A2482}$ | $R^{B7}$ | H | $R^{C1}$ | N |
| $L_{A2483}$ | $R^{A3}$ | H | $R^{C1}$ | N |
| $L_{A2484}$ | $R^{A34}$ | H | $R^{C1}$ | N |
| $L_{A2485}$ | $R^{A57}$ | H | $R^{C1}$ | N |
| $L_{A2486}$ | H | $R^{B1}$ | $R^{C1}$ | N |
| $L_{A2487}$ | H | $R^{B3}$ | $R^{C1}$ | N |
| $L_{A2488}$ | H | $R^{B4}$ | $R^{C1}$ | N |
| $L_{A2489}$ | H | $R^{B5}$ | $R^{C1}$ | N |
| $L_{A2490}$ | H | $R^{B7}$ | $R^{C1}$ | N |
| $L_{A2491}$ | H | $R^{A3}$ | $R^{C1}$ | N |
| $L_{A2492}$ | H | $R^{A34}$ | $R^{C1}$ | N |
| $L_{A2493}$ | H | $R^{A57}$ | $R^{C1}$ | N |
| $L_{A2494}$ | $R^{B1}$ | $R^{B1}$ | $R^{C1}$ | N |
| $L_{A2495}$ | $R^{B3}$ | $R^{B3}$ | $R^{C1}$ | N |
| $L_{A2496}$ | $R^{B4}$ | $R^{B4}$ | $R^{C1}$ | N |
| $L_{A2497}$ | $R^{B5}$ | $R^{B5}$ | $R^{C1}$ | N |
| $L_{A2498}$ | $R^{B7}$ | $R^{B7}$ | $R^{C1}$ | N |
| $L_{A2499}$ | $R^{A3}$ | $R^{A3}$ | $R^{C1}$ | N |
| $L_{A2500}$ | $R^{A34}$ | $R^{A34}$ | $R^{C1}$ | N |
| $L_{A2501}$ | $R^{A57}$ | $R^{A57}$ | $R^{C1}$ | N |
| $L_{A2502}$ | $R^{B3}$ | $R^{B1}$ | $R^{C1}$ | N |
| $L_{A2503}$ | $R^{B4}$ | $R^{B1}$ | $R^{C1}$ | N |
| $L_{A2504}$ | $R^{B5}$ | $R^{B1}$ | $R^{C1}$ | N |
| $L_{A2505}$ | $R^{B7}$ | $R^{B1}$ | $R^{C1}$ | N |
| $L_{A2506}$ | $R^{A3}$ | $R^{B1}$ | $R^{C1}$ | N |
| $L_{A2507}$ | $R^{A34}$ | $R^{B1}$ | $R^{C1}$ | N |
| $L_{A2508}$ | $R^{A57}$ | $R^{B1}$ | $R^{C1}$ | N |
| $L_{A2509}$ | $R^{B1}$ | $R^{B3}$ | $R^{C1}$ | N |
| $L_{A2510}$ | $R^{B1}$ | $R^{B4}$ | $R^{C1}$ | N |
| $L_{A2511}$ | $R^{B1}$ | $R^{B5}$ | $R^{C1}$ | N |
| $L_{A2512}$ | $R^{B1}$ | $R^{B7}$ | $R^{C1}$ | N |
| $L_{A2513}$ | $R^{B1}$ | $R^{A3}$ | $R^{C1}$ | N |
| $L_{A2514}$ | $R^{B1}$ | $R^{A34}$ | $R^{C1}$ | N |
| $L_{A2515}$ | $R^{B1}$ | $R^{A57}$ | $R^{C1}$ | N |
| $L_{A2516}$ | $R^{B1}$ | H | $R^{C2}$ | N |
| $L_{A2517}$ | $R^{B3}$ | H | $R^{C2}$ | N |
| $L_{A2518}$ | $R^{B4}$ | H | $R^{C2}$ | N |
| $L_{A2519}$ | $R^{B5}$ | H | $R^{C2}$ | N |
| $L_{A2520}$ | $R^{B7}$ | H | $R^{C2}$ | N |
| $L_{A2521}$ | $R^{A3}$ | H | $R^{C2}$ | N |
| $L_{A2522}$ | $R^{A34}$ | H | $R^{C2}$ | N |
| $L_{A2523}$ | $R^{A57}$ | H | $R^{C2}$ | N |
| $L_{A2524}$ | H | $R^{B1}$ | $R^{C2}$ | N |
| $L_{A2525}$ | H | $R^{B3}$ | $R^{C2}$ | N |
| $L_{A2526}$ | H | $R^{B4}$ | $R^{C2}$ | N |
| $L_{A2527}$ | H | $R^{B5}$ | $R^{C2}$ | N |
| $L_{A2528}$ | H | $R^{B7}$ | $R^{C2}$ | N |
| $L_{A2529}$ | H | $R^{A3}$ | $R^{C2}$ | N |
| $L_{A2530}$ | H | $R^{A34}$ | $R^{C2}$ | N |
| $L_{A2531}$ | H | $R^{A57}$ | $R^{C2}$ | N |
| $L_{A2532}$ | $R^{B1}$ | $R^{B1}$ | $R^{C2}$ | N |
| $L_{A2533}$ | $R^{B3}$ | $R^{B3}$ | $R^{C2}$ | N |
| $L_{A2534}$ | $R^{B4}$ | $R^{B4}$ | $R^{C2}$ | N |
| $L_{A2535}$ | $R^{B5}$ | $R^{B5}$ | $R^{C2}$ | N |
| $L_{A2536}$ | $R^{B7}$ | $R^{B7}$ | $R^{C2}$ | N |
| $L_{A2537}$ | $R^{A3}$ | $R^{A3}$ | $R^{C2}$ | N |
| $L_{A2538}$ | $R^{A34}$ | $R^{A34}$ | $R^{C2}$ | N |
| $L_{A2539}$ | $R^{A57}$ | $R^{A57}$ | $R^{C2}$ | N |
| $L_{A2540}$ | $R^{B3}$ | $R^{B1}$ | $R^{C2}$ | N |
| $L_{A2541}$ | $R^{B4}$ | $R^{B1}$ | $R^{C2}$ | N |
| $L_{A2542}$ | $R^{B5}$ | $R^{B1}$ | $R^{C2}$ | N |
| $L_{A2543}$ | $R^{B7}$ | $R^{B1}$ | $R^{C2}$ | N |
| $L_{A2544}$ | $R^{A3}$ | $R^{B1}$ | $R^{C2}$ | N |
| $L_{A2545}$ | $R^{A34}$ | $R^{B1}$ | $R^{C2}$ | N |
| $L_{A2546}$ | $R^{A57}$ | $R^{B1}$ | $R^{C2}$ | N |
| $L_{A2547}$ | $R^{B1}$ | $R^{B3}$ | $R^{C2}$ | N |
| $L_{A2548}$ | $R^{B1}$ | $R^{B4}$ | $R^{C2}$ | N |

-continued

| Ligand | $R^3$ | $R^4$ | G | X |
|---|---|---|---|---|
| $L_{A2549}$ | $R^{B1}$ | $R^{B5}$ | $R^{C2}$ | N |
| $L_{A2550}$ | $R^{B1}$ | $R^{B7}$ | $R^{C2}$ | N |
| $L_{A2551}$ | $R^{B1}$ | $R^{A3}$ | $R^{C2}$ | N |
| $L_{A2552}$ | $R^{B1}$ | $R^{A34}$ | $R^{C2}$ | N |
| $L_{A2553}$ | $R^{B1}$ | $R^{A57}$ | $R^{C2}$ | N |
| $L_{A2554}$ | $R^{B1}$ | H | $R^{C3}$ | N |
| $L_{A2555}$ | $R^{B3}$ | H | $R^{C3}$ | N |
| $L_{A2556}$ | $R^{B4}$ | H | $R^{C3}$ | N |
| $L_{A2557}$ | $R^{B5}$ | H | $R^{C3}$ | N |
| $L_{A2558}$ | $R^{B7}$ | H | $R^{C3}$ | N |
| $L_{A2559}$ | $R^{A3}$ | H | $R^{C3}$ | N |
| $L_{A2560}$ | $R^{A34}$ | H | $R^{C3}$ | N |
| $L_{A2561}$ | $R^{A57}$ | H | $R^{C3}$ | N |
| $L_{A2562}$ | H | $R^{B1}$ | $R^{C3}$ | N |
| $L_{A2563}$ | H | $R^{B3}$ | $R^{C3}$ | N |
| $L_{A2564}$ | H | $R^{B4}$ | $R^{C3}$ | N |
| $L_{A2565}$ | H | $R^{B5}$ | $R^{C3}$ | N |
| $L_{A2566}$ | H | $R^{B7}$ | $R^{C3}$ | N |
| $L_{A2567}$ | H | $R^{A3}$ | $R^{C3}$ | N |
| $L_{A2568}$ | H | $R^{A34}$ | $R^{C3}$ | N |
| $L_{A2569}$ | H | $R^{A57}$ | $R^{C3}$ | N |
| $L_{A2570}$ | $R^{B1}$ | $R^{B1}$ | $R^{C3}$ | N |
| $L_{A2571}$ | $R^{B3}$ | $R^{B3}$ | $R^{C3}$ | N |
| $L_{A2572}$ | $R^{B4}$ | $R^{B4}$ | $R^{C3}$ | N |
| $L_{A2573}$ | $R^{B5}$ | $R^{B5}$ | $R^{C3}$ | N |
| $L_{A2574}$ | $R^{B7}$ | $R^{B7}$ | $R^{C3}$ | N |
| $L_{A2575}$ | $R^{A3}$ | $R^{A3}$ | $R^{C3}$ | N |
| $L_{A2576}$ | $R^{A34}$ | $R^{A34}$ | $R^{C3}$ | N |
| $L_{A2577}$ | $R^{A57}$ | $R^{A57}$ | $R^{C3}$ | N |
| $L_{A2578}$ | $R^{B3}$ | $R^{B1}$ | $R^{C3}$ | N |
| $L_{A2579}$ | $R^{B4}$ | $R^{B1}$ | $R^{C3}$ | N |
| $L_{A2580}$ | $R^{B5}$ | $R^{B1}$ | $R^{C3}$ | N |
| $L_{A2581}$ | $R^{B7}$ | $R^{B1}$ | $R^{C3}$ | N |
| $L_{A2582}$ | $R^{A3}$ | $R^{B1}$ | $R^{C3}$ | N |
| $L_{A2583}$ | $R^{A34}$ | $R^{B1}$ | $R^{C3}$ | N |
| $L_{A2584}$ | $R^{A57}$ | $R^{B1}$ | $R^{C3}$ | N |
| $L_{A2585}$ | $R^{B1}$ | $R^{B3}$ | $R^{C3}$ | N |
| $L_{A2586}$ | $R^{B1}$ | $R^{B4}$ | $R^{C3}$ | N |
| $L_{A2587}$ | $R^{B1}$ | $R^{B5}$ | $R^{C3}$ | N |
| $L_{A2588}$ | $R^{B1}$ | $R^{B7}$ | $R^{C3}$ | N |
| $L_{A2589}$ | $R^{B1}$ | $R^{A3}$ | $R^{C3}$ | N |
| $L_{A2590}$ | $R^{B1}$ | $R^{A34}$ | $R^{C3}$ | N |
| $L_{A2591}$ | $R^{B1}$ | $R^{A57}$ | $R^{C3}$ | N |
| $L_{A2592}$ | $R^{B1}$ | H | $R^{C8}$ | N |
| $L_{A2593}$ | $R^{B3}$ | H | $R^{C8}$ | N |
| $L_{A2594}$ | $R^{B4}$ | H | $R^{C8}$ | N |
| $L_{A2595}$ | $R^{B5}$ | H | $R^{C8}$ | N |
| $L_{A2596}$ | $R^{B7}$ | H | $R^{C8}$ | N |
| $L_{A2597}$ | $R^{A3}$ | H | $R^{C8}$ | N |
| $L_{A2598}$ | $R^{A34}$ | H | $R^{C8}$ | N |
| $L_{A2599}$ | $R^{A57}$ | H | $R^{C8}$ | N |
| $L_{A2600}$ | H | $R^{B1}$ | $R^{C8}$ | N |
| $L_{A2601}$ | H | $R^{B3}$ | $R^{C8}$ | N |
| $L_{A2602}$ | H | $R^{B4}$ | $R^{C8}$ | N |
| $L_{A2603}$ | H | $R^{B5}$ | $R^{C8}$ | N |
| $L_{A2604}$ | H | $R^{B7}$ | $R^{C8}$ | N |
| $L_{A2605}$ | H | $R^{A3}$ | $R^{C8}$ | N |
| $L_{A2606}$ | H | $R^{A34}$ | $R^{C8}$ | N |
| $L_{A2607}$ | H | $R^{A57}$ | $R^{C8}$ | N |
| $L_{A2608}$ | $R^{B1}$ | $R^{B1}$ | $R^{C8}$ | N |
| $L_{A2609}$ | $R^{B3}$ | $R^{B3}$ | $R^{C8}$ | N |
| $L_{A2610}$ | $R^{B4}$ | $R^{B4}$ | $R^{C8}$ | N |
| $L_{A2611}$ | $R^{B5}$ | $R^{B5}$ | $R^{C8}$ | N |
| $L_{A2612}$ | $R^{B7}$ | $R^{B7}$ | $R^{C8}$ | N |
| $L_{A2613}$ | $R^{A3}$ | $R^{A3}$ | $R^{C8}$ | N |
| $L_{A2614}$ | $R^{A34}$ | $R^{A34}$ | $R^{C8}$ | N |
| $L_{A2615}$ | $R^{A57}$ | $R^{A57}$ | $R^{C8}$ | N |
| $L_{A2616}$ | $R^{B3}$ | $R^{B1}$ | $R^{C8}$ | N |
| $L_{A2617}$ | $R^{B4}$ | $R^{B1}$ | $R^{C8}$ | N |
| $L_{A2618}$ | $R^{B5}$ | $R^{B1}$ | $R^{C8}$ | N |
| $L_{A2619}$ | $R^{B7}$ | $R^{B1}$ | $R^{C8}$ | N |
| $L_{A2620}$ | $R^{A3}$ | $R^{B1}$ | $R^{C8}$ | N |
| $L_{A2621}$ | $R^{A34}$ | $R^{B1}$ | $R^{C8}$ | N |
| $L_{A2622}$ | $R^{A57}$ | $R^{B1}$ | $R^{C8}$ | N |
| $L_{A2623}$ | $R^{B1}$ | $R^{B3}$ | $R^{C8}$ | N |
| $L_{A2624}$ | $R^{B1}$ | $R^{B4}$ | $R^{C8}$ | N |
| $L_{A2625}$ | $R^{B1}$ | $R^{B5}$ | $R^{C8}$ | N |

-continued

| Ligand | $R^3$ | $R^4$ | G | X |
|---|---|---|---|---|
| $L_{A2626}$ | $R^{B1}$ | $R^{B7}$ | $R^{C8}$ | N |
| $L_{A2627}$ | $R^{B1}$ | $R^{A3}$ | $R^{C8}$ | N |
| $L_{A2628}$ | $R^{B1}$ | $R^{A34}$ | $R^{C8}$ | N |
| $L_{A2629}$ | $R^{B1}$ | $R^{A57}$ | $R^{C8}$ | N |
| $L_{A2630}$ | $R^{B1}$ | H | $R^{C9}$ | N |
| $L_{A2631}$ | $R^{B3}$ | H | $R^{C9}$ | N |
| $L_{A2632}$ | $R^{B4}$ | H | $R^{C9}$ | N |
| $L_{A2633}$ | $R^{B5}$ | H | $R^{C9}$ | N |
| $L_{A2634}$ | $R^{B7}$ | H | $R^{C9}$ | N |
| $L_{A2635}$ | $R^{A3}$ | H | $R^{C9}$ | N |
| $L_{A2636}$ | $R^{A34}$ | H | $R^{C9}$ | N |
| $L_{A2637}$ | $R^{A57}$ | H | $R^{C9}$ | N |
| $L_{A2638}$ | H | $R^{B1}$ | $R^{C9}$ | N |
| $L_{A2639}$ | H | $R^{B3}$ | $R^{C9}$ | N |
| $L_{A2640}$ | H | $R^{B4}$ | $R^{C9}$ | N |
| $L_{A2641}$ | H | $R^{B5}$ | $R^{C9}$ | N |
| $L_{A2642}$ | H | $R^{B7}$ | $R^{C9}$ | N |
| $L_{A2643}$ | H | $R^{A3}$ | $R^{C9}$ | N |
| $L_{A2644}$ | H | $R^{A34}$ | $R^{C9}$ | N |
| $L_{A2645}$ | H | $R^{A57}$ | $R^{C9}$ | N |
| $L_{A2646}$ | $R^{B1}$ | $R^{B1}$ | $R^{C9}$ | N |
| $L_{A2647}$ | $R^{B3}$ | $R^{B3}$ | $R^{C9}$ | N |
| $L_{A2648}$ | $R^{B4}$ | $R^{B4}$ | $R^{C9}$ | N |
| $L_{A2649}$ | $R^{B5}$ | $R^{B5}$ | $R^{C9}$ | N |
| $L_{A2650}$ | $R^{B7}$ | $R^{B7}$ | $R^{C9}$ | N |
| $L_{A2651}$ | $R^{A3}$ | $R^{A3}$ | $R^{C9}$ | N |
| $L_{A2652}$ | $R^{A34}$ | $R^{A34}$ | $R^{C9}$ | N |
| $L_{A2653}$ | $R^{A57}$ | $R^{A57}$ | $R^{C9}$ | N |
| $L_{A2654}$ | $R^{B3}$ | $R^{B1}$ | $R^{C9}$ | N |
| $L_{A2655}$ | $R^{B4}$ | $R^{B1}$ | $R^{C9}$ | N |
| $L_{A2656}$ | $R^{B5}$ | $R^{B1}$ | $R^{C9}$ | N |
| $L_{A2657}$ | $R^{B7}$ | $R^{B1}$ | $R^{C9}$ | N |
| $L_{A2658}$ | $R^{A3}$ | $R^{B1}$ | $R^{C9}$ | N |
| $L_{A2659}$ | $R^{A34}$ | $R^{B1}$ | $R^{C9}$ | N |
| $L_{A2660}$ | $R^{A57}$ | $R^{B1}$ | $R^{C9}$ | N |
| $L_{A2661}$ | $R^{B1}$ | $R^{B3}$ | $R^{C9}$ | N |
| $L_{A2662}$ | $R^{B1}$ | $R^{B4}$ | $R^{C9}$ | N |
| $L_{A2663}$ | $R^{B1}$ | $R^{B5}$ | $R^{C9}$ | N |
| $L_{A2664}$ | $R^{B1}$ | $R^{B7}$ | $R^{C9}$ | N |
| $L_{A2665}$ | $R^{B1}$ | $R^{A3}$ | $R^{C9}$ | N |
| $L_{A2666}$ | $R^{B1}$ | $R^{A34}$ | $R^{C9}$ | N |
| $L_{A2667}$ | $R^{B1}$ | $R^{A57}$ | $R^{C9}$ | N |

wherein $R^{A1}$ to $R^{A51}$ have the following structures:

$R^{A1}$

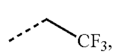

$R^{A2}$

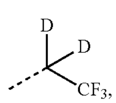

$R^{A3}$

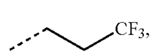

$R^{A4}$

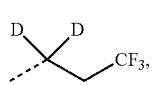

$R^{A5}$

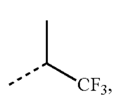

$R^{A6}$

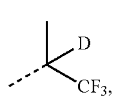

-continued $R^{A7}$

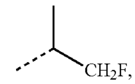

$R^{A8}$

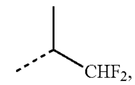

$R^{A9}$

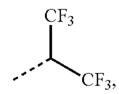

$R^{A10}$

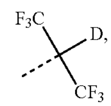

$R^{A11}$

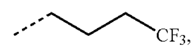

$R^{A12}$

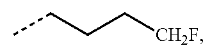

$R^{A13}$

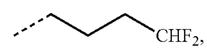

$R^{A14}$

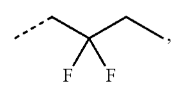

$R^{A15}$

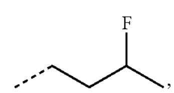

$R^{A16}$

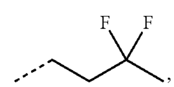

$R^{A17}$

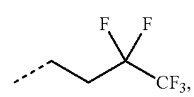

$R^{A18}$

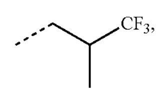

$R^{A19}$

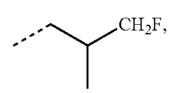

$R^{A20}$

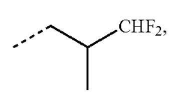

$R^{A21}$

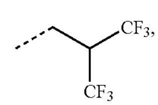

$R^{A22}$

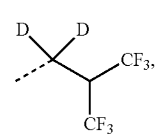

$R^{A23}$
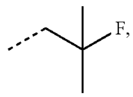
$R^{A24}$
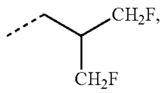
$R^{A25}$
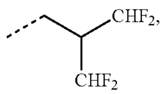
$R^{A26}$
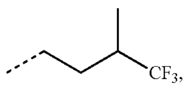
$R^{A27}$
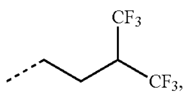
$R^{A28}$
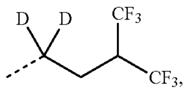
$R^{A29}$
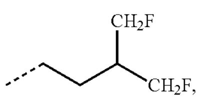
$R^{A30}$
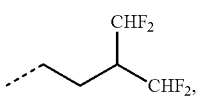
$R^{A31}$
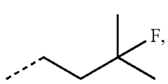
$R^{A32}$
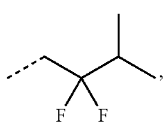
$R^{A33}$
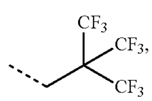
$R^{A34}$
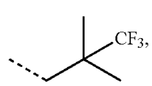
$R^{A35}$
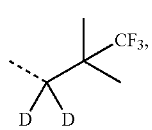
$R^{A36}$
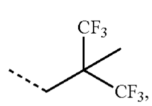
$R^{A37}$
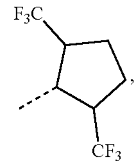
$R^{A38}$
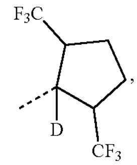
$R^{A39}$
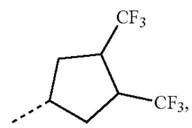
$R^{A40}$
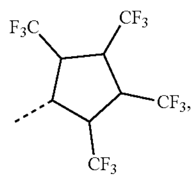
$R^{A41}$
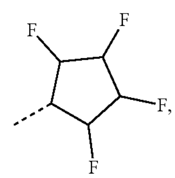
$R^{A42}$
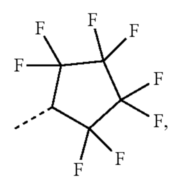
$R^{A43}$
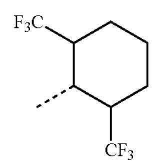
$R^{A44}$
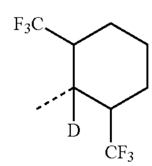
$R^{A45}$
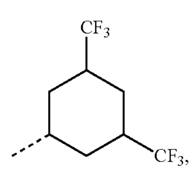

-continued
$R^{A46}$
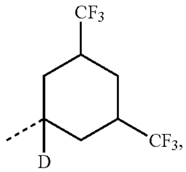
$R^{A47}$
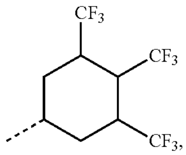
$R^{A48}$
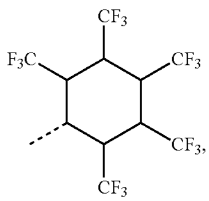
$R^{A49}$
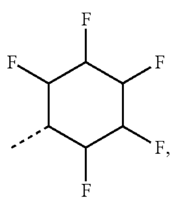
$R^{A50}$
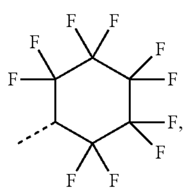
$R^{A51}$
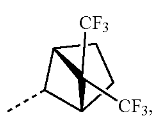
$R^{A52}$
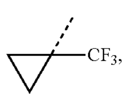
$R^{A53}$
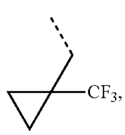
$R^{A54}$
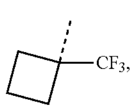
$R^{A55}$
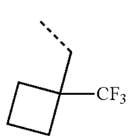
-continued
$R^{A56}$
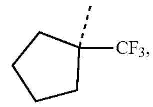
$R^{A57}$
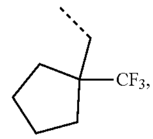
$R^{A58}$
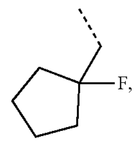
$R^{A59}$
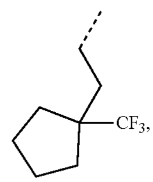
$R^{A60}$
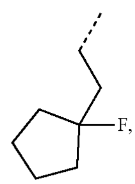
$R^{A61}$
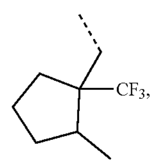
$R^{A62}$
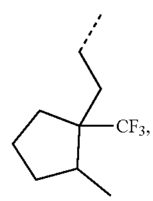
$R^{A63}$
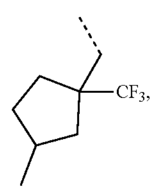
$R^{A64}$
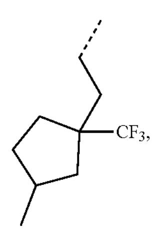

-continued
$R^{A465}$
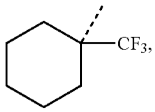
$R^{A466}$
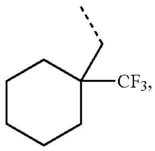
$R^{A467}$
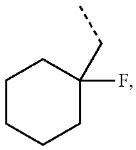
$R^{A468}$
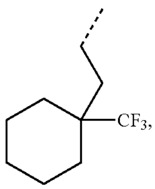
$R^{A469}$
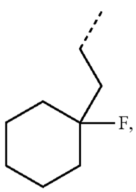
$R^{A470}$
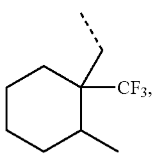
$R^{A471}$
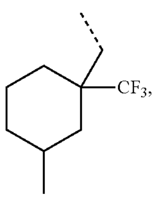
$R^{A472}$
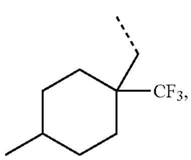
and
$R^{A473}$
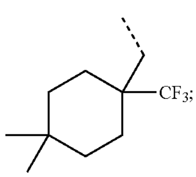
wherein $R^{B1}$ to $R^{B2}$ have the following structures:
$R^{B1}$
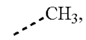
$R^{B2}$
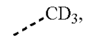
$R^{B3}$
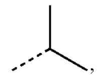
$R^{B4}$
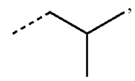
$R^{B5}$
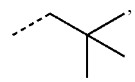
$R^{B6}$
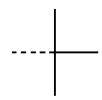
$R^{B7}$
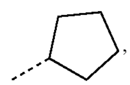
$R^{B8}$
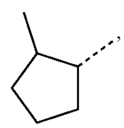
$R^{B9}$
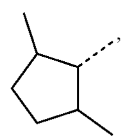
$R^{B10}$
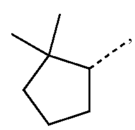
$R^{B11}$
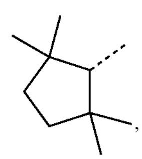
$R^{B12}$
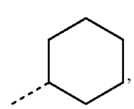
$R^{B13}$
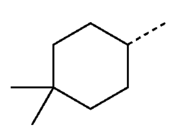

-continued
$R^{B14}$
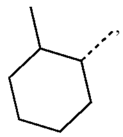
$R^{B15}$
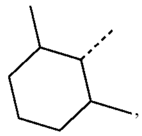
$R^{B16}$
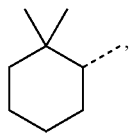
$R^{B17}$
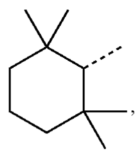
$R^{B18}$
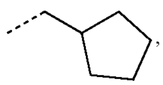
$R^{B19}$
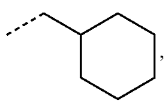
$R^{B20}$
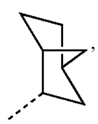
$R^{B21}$
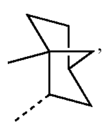
$R^{B22}$
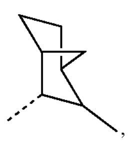
$R^{B23}$
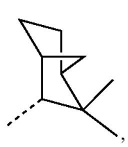
$R^{B24}$
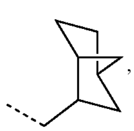
-continued
$R^{B25}$
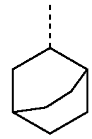
$R^{B26}$
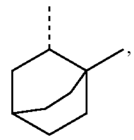
$R^{B27}$
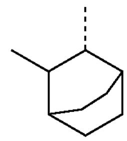
$R^{B28}$
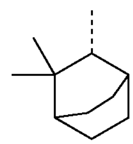
$R^{B29}$
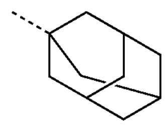
$R^{B30}$
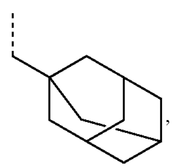
$R^{B31}$
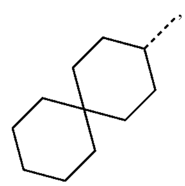
$R^{B32}$
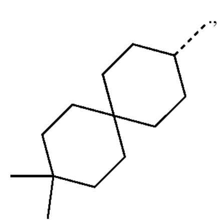
$R^{B33}$
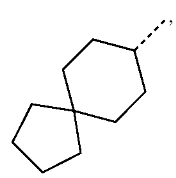

-continued
$R^{B34}$
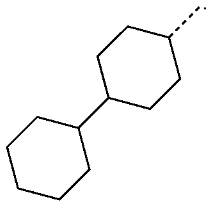
$R^{B35}$
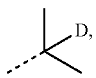
$R^{B36}$
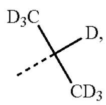
$R^{B37}$
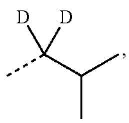
$R^{B38}$
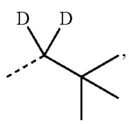
$R^{B39}$
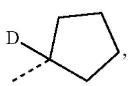
$R^{B40}$
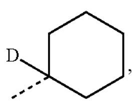
$R^{B41}$
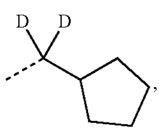
and
$R^{B42}$
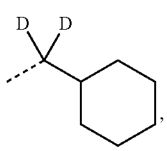
and
wherein $R^{C1}$ to $R^{C19}$ have the following structures:
$R^{C1}$
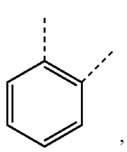
-continued
$R^{C2}$
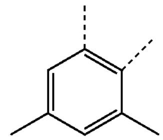
$R^{C3}$
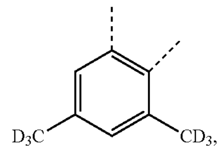
$R^{C4}$
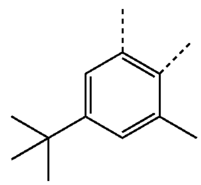
$R^{C5}$
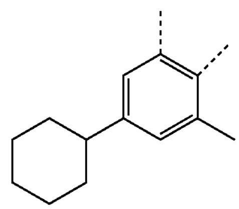
$R^{C6}$
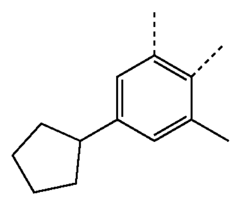
$R^{C7}$
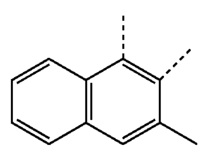
$R^{C8}$
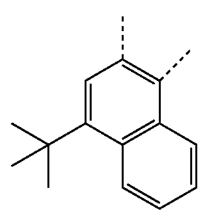
$R^{C9}$
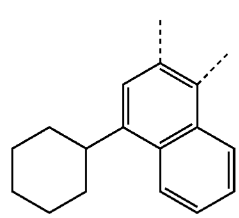

-continued $R^{C10}$

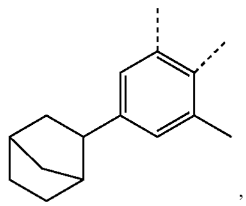

$R^{C11}$

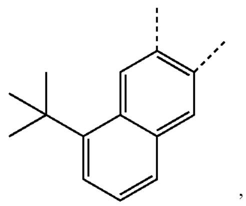

$R^{C12}$

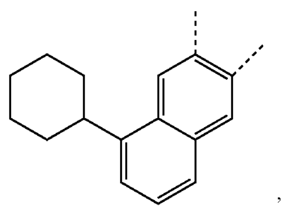

$R^{C13}$

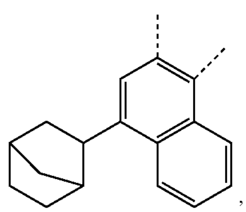

$R^{C14}$

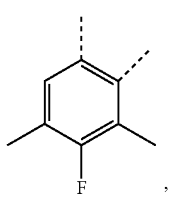

$R^{C15}$

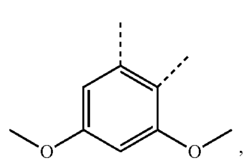

$R^{C16}$

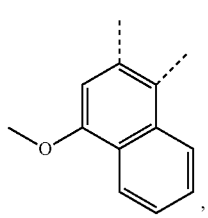

-continued $R^{C17}$

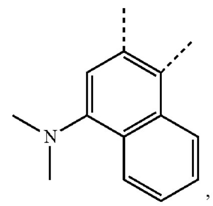

$R^{C18}$

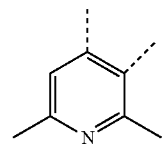

and $R^{C19}$

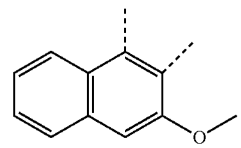

13. The compound of claim 1, wherein the compound has a formula of $M(L_A)_x(L_B)_y(L_C)_z$ wherein $L_B$ and $L_C$ am each a bidentate ligand; and wherein x is 1, 2, or 3; y is 0, 1, or 2; z is 0, 1, or 2; and x+y+z is the oxidation state of the metal M.

14. The compound of claim 13, wherein $L_B$ and $L_C$ are each independently selected from the group consisting of:

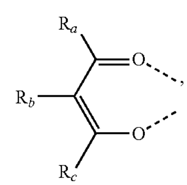

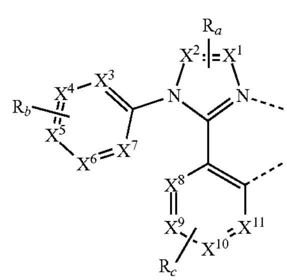

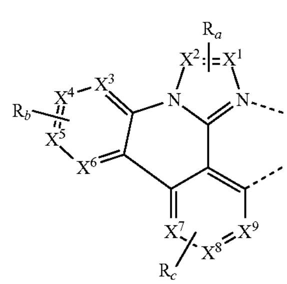

-continued

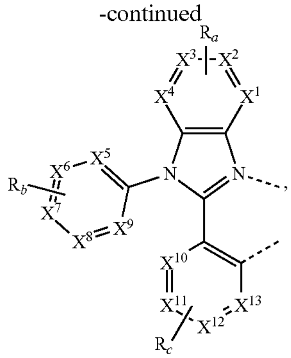

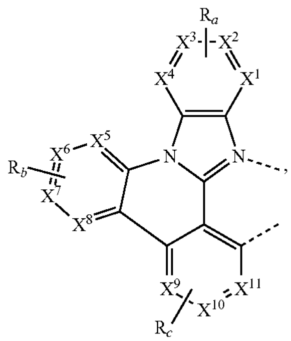

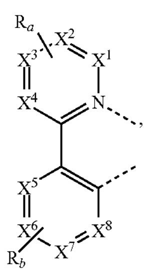

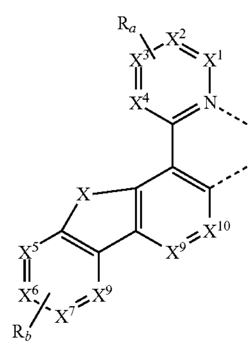

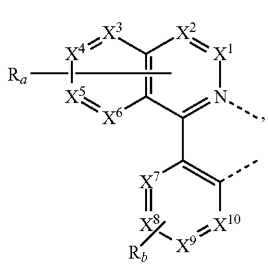

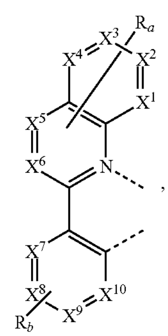

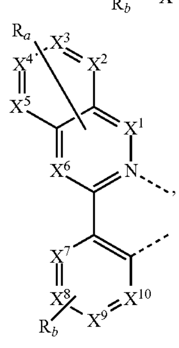

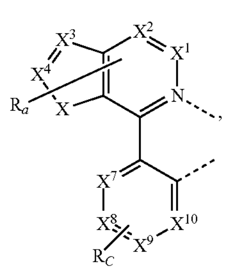

-continued

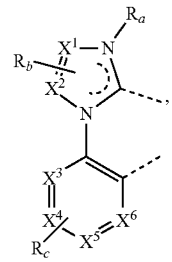

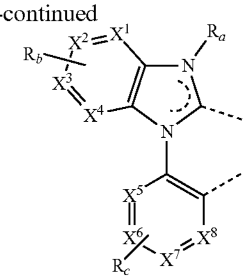

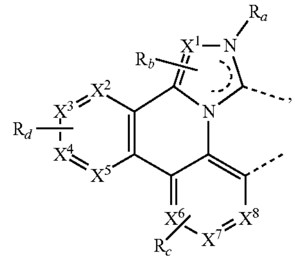

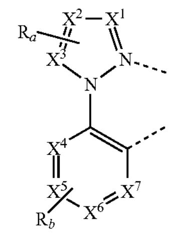

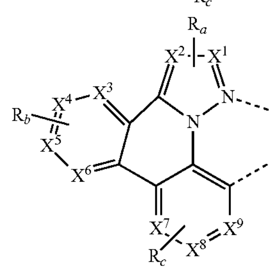

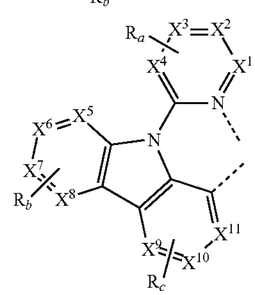

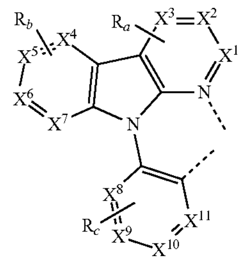

and

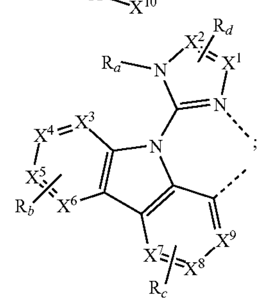

wherein each $X_1$ to $X^3$ are independently selected from the group consisting of carbon and nitrogen;

wherein X is selected from the group consisting of BR', NR', PR', O, S, Se, C═O, S═O, $SO_2$, CR'R", SiR'R", and GeR'R";

wherein R' and R" are optionally fused or joined to form a ring, wherein each $R_a$, $R_b$, $R_c$, and $R_d$ may represent from mono substitution to the possible maximum number of substitution on the carbon atoms of the ring attached thereto, or no substitution;

wherein R', R", $R_a$, $R_b$, $R_c$, and $R_d$ are each independently selected from the group consisting of hydrogen, deuterium, fluorine, alkyl, cycloalkyl, heteroalkyl, alkoxy, aryloxy, amino, silyl, alkenyl, cycloalkenyl, heteroalkenyl, aryl, heteroaryl, nitrile, isonitrile, and combinations thereof; and wherein any two adjacent substitutents of $R_a$, $R_b$, $R_c$, and $R_d$ are optionally fused or joined to form a ring or form a multidentate ligand.

15. The compound of claim 12, wherein the compound is the Compound Ax having the formula $Ir(L_{Ai})_3$, or the Compound Cr having the formula $Ir(L_{Ai})_2(L_{Cj})$;

wherein x=i, and z=1260i+j−1260;

wherein, is an integer from 1 to 2667, and j is an integer from 1 to 1260;

and wherein $L_{C1}$ through $L_{C1260}$ are based on a structure of Formula X,

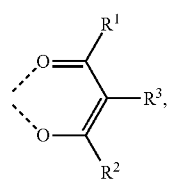

in which $R^1$, $R^2$, and $R^3$ are defined as:

| Ligand | $R^1$ | $R^2$ | $R^3$ |
|---|---|---|---|
| $L_{C1}$ | $R^{D1}$ | $R^{D1}$ | H |
| $L_{C2}$ | $R^{D2}$ | $R^{D2}$ | H |
| $L_{C3}$ | $R^{D3}$ | $R^{D3}$ | H |
| $L_{C4}$ | $R^{D4}$ | $R^{D4}$ | H |
| $L_{C5}$ | $R^{D5}$ | $R^{D5}$ | H |
| $L_{C6}$ | $R^{D6}$ | $R^{D6}$ | H |
| $L_{C7}$ | $R^{D7}$ | $R^{D7}$ | H |
| $L_{C8}$ | $R^{D8}$ | $R^{D8}$ | H |
| $L_{C9}$ | $R^{D9}$ | $R^{D9}$ | H |
| $L_{C10}$ | $R^{D10}$ | $R^{D10}$ | H |
| $L_{C11}$ | $R^{D11}$ | $R^{D11}$ | H |
| $L_{C12}$ | $R^{D12}$ | $R^{D12}$ | H |
| $L_{C13}$ | $R^{D13}$ | $R^{D13}$ | H |
| $L_{C14}$ | $R^{D14}$ | $R^{D14}$ | H |
| $L_{C15}$ | $R^{D15}$ | $R^{D15}$ | H |
| $L_{C16}$ | $R^{D16}$ | $R^{D16}$ | H |
| $L_{C17}$ | $R^{D17}$ | $R^{D17}$ | H |
| $L_{C18}$ | $R^{D18}$ | $R^{D18}$ | H |
| $L_{C19}$ | $R^{D19}$ | $R^{D19}$ | H |
| $L_{C20}$ | $R^{D20}$ | $R^{D20}$ | H |
| $L_{C21}$ | $R^{D21}$ | $R^{D21}$ | H |
| $L_{C22}$ | $R^{D22}$ | $R^{D22}$ | H |
| $L_{C23}$ | $R^{D23}$ | $R^{D23}$ | H |
| $L_{C24}$ | $R^{D24}$ | $R^{D24}$ | H |
| $L_{C25}$ | $R^{D25}$ | $R^{D25}$ | H |
| $L_{C26}$ | $R^{D26}$ | $R^{D26}$ | H |
| $L_{C27}$ | $R^{D27}$ | $R^{D27}$ | H |
| $L_{C28}$ | $R^{D28}$ | $R^{D28}$ | H |
| $L_{C29}$ | $R^{D29}$ | $R^{D29}$ | H |
| $L_{C30}$ | $R^{D30}$ | $R^{D30}$ | H |
| $L_{C31}$ | $R^{D31}$ | $R^{D31}$ | H |
| $L_{C32}$ | $R^{D32}$ | $R^{D32}$ | H |
| $L_{C33}$ | $R^{D33}$ | $R^{D33}$ | H |
| $L_{C34}$ | $R^{D34}$ | $R^{D34}$ | H |
| $L_{C35}$ | $R^{D35}$ | $R^{D35}$ | H |
| $L_{C36}$ | $R^{D40}$ | $R^{D40}$ | H |
| $L_{C37}$ | $R^{D41}$ | $R^{D41}$ | H |
| $L_{C38}$ | $R^{D42}$ | $R^{D42}$ | H |
| $L_{C39}$ | $R^{D64}$ | $R^{D64}$ | H |
| $L_{C40}$ | $R^{D66}$ | $R^{D66}$ | H |
| $L_{C41}$ | $R^{D68}$ | $R^{D68}$ | H |
| $L_{C42}$ | $R^{D76}$ | $R^{D76}$ | H |
| $L_{C43}$ | $R^{D1}$ | $R^{D2}$ | H |
| $L_{C44}$ | $R^{D1}$ | $R^{D3}$ | H |
| $L_{C45}$ | $R^{D1}$ | $R^{D4}$ | H |

-continued

| Ligand | $R^1$ | $R^2$ | $R^3$ |
|---|---|---|---|
| $L_{C46}$ | $R^{D1}$ | $R^{D5}$ | H |
| $L_{C47}$ | $R^{D1}$ | $R^{D6}$ | H |
| $L_{C48}$ | $R^{D1}$ | $R^{D7}$ | H |
| $L_{C49}$ | $R^{D1}$ | $R^{D8}$ | H |
| $L_{C50}$ | $R^{D1}$ | $R^{D9}$ | H |
| $L_{C51}$ | $R^{D1}$ | $R^{D10}$ | H |
| $L_{C52}$ | $R^{D1}$ | $R^{D11}$ | H |
| $L_{C53}$ | $R^{D1}$ | $R^{D12}$ | H |
| $L_{C54}$ | $R^{D1}$ | $R^{D13}$ | H |
| $L_{C55}$ | $R^{D1}$ | $R^{D14}$ | H |
| $L_{C56}$ | $R^{D1}$ | $R^{D15}$ | H |
| $L_{C57}$ | $R^{D1}$ | $R^{D16}$ | H |
| $L_{C58}$ | $R^{D1}$ | $R^{D17}$ | H |
| $L_{C59}$ | $R^{D1}$ | $R^{D18}$ | H |
| $L_{C60}$ | $R^{D1}$ | $R^{D19}$ | H |
| $L_{C61}$ | $R^{D1}$ | $R^{D20}$ | H |
| $L_{C62}$ | $R^{D1}$ | $R^{D21}$ | H |
| $L_{C63}$ | $R^{D1}$ | $R^{D22}$ | H |
| $L_{C64}$ | $R^{D1}$ | $R^{D23}$ | H |
| $L_{C65}$ | $R^{D1}$ | $R^{D24}$ | H |
| $L_{C66}$ | $R^{D1}$ | $R^{D25}$ | H |
| $L_{C67}$ | $R^{D1}$ | $R^{D26}$ | H |
| $L_{C68}$ | $R^{D1}$ | $R^{D27}$ | H |
| $L_{C69}$ | $R^{D1}$ | $R^{D28}$ | H |
| $L_{C70}$ | $R^{D1}$ | $R^{D29}$ | H |
| $L_{C71}$ | $R^{D1}$ | $R^{D30}$ | H |
| $L_{C72}$ | $R^{D1}$ | $R^{D31}$ | H |
| $L_{C73}$ | $R^{D1}$ | $R^{D32}$ | H |
| $L_{C74}$ | $R^{D1}$ | $R^{D33}$ | H |
| $L_{C75}$ | $R^{D1}$ | $R^{D34}$ | H |
| $L_{C76}$ | $R^{D1}$ | $R^{D35}$ | H |
| $L_{C77}$ | $R^{D1}$ | $R^{D40}$ | H |
| $L_{C78}$ | $R^{D1}$ | $R^{D41}$ | H |
| $L_{C79}$ | $R^{D1}$ | $R^{D42}$ | H |
| $L_{C80}$ | $R^{D1}$ | $R^{D64}$ | H |
| $L_{C81}$ | $R^{D1}$ | $R^{D66}$ | H |
| $L_{C82}$ | $R^{D1}$ | $R^{D68}$ | H |
| $L_{C83}$ | $R^{D1}$ | $R^{D76}$ | H |
| $L_{C84}$ | $R^{D2}$ | $R^{D1}$ | H |
| $L_{C85}$ | $R^{D2}$ | $R^{D3}$ | H |
| $L_{C86}$ | $R^{D2}$ | $R^{D4}$ | H |
| $L_{C87}$ | $R^{D2}$ | $R^{D5}$ | H |
| $L_{C88}$ | $R^{D2}$ | $R^{D6}$ | H |
| $L_{C89}$ | $R^{D2}$ | $R^{D7}$ | H |
| $L_{C90}$ | $R^{D2}$ | $R^{D8}$ | H |
| $L_{C91}$ | $R^{D2}$ | $R^{D9}$ | H |
| $L_{C92}$ | $R^{D2}$ | $R^{D10}$ | H |
| $L_{C93}$ | $R^{D2}$ | $R^{D11}$ | H |
| $L_{C94}$ | $R^{D2}$ | $R^{D12}$ | H |
| $L_{C95}$ | $R^{D2}$ | $R^{D13}$ | H |
| $L_{C96}$ | $R^{D2}$ | $R^{D14}$ | H |
| $L_{C97}$ | $R^{D2}$ | $R^{D15}$ | H |
| $L_{C98}$ | $R^{D2}$ | $R^{D16}$ | H |
| $L_{C99}$ | $R^{D2}$ | $R^{D17}$ | H |
| $L_{C100}$ | $R^{D2}$ | $R^{D18}$ | H |
| $L_{C101}$ | $R^{D2}$ | $R^{D19}$ | H |
| $L_{C102}$ | $R^{D2}$ | $R^{D20}$ | H |
| $L_{C103}$ | $R^{D2}$ | $R^{D21}$ | H |
| $L_{C104}$ | $R^{D2}$ | $R^{D22}$ | H |
| $L_{C105}$ | $R^{D2}$ | $R^{D23}$ | H |
| $L_{C106}$ | $R^{D2}$ | $R^{D24}$ | H |
| $L_{C107}$ | $R^{D2}$ | $R^{D25}$ | H |
| $L_{C108}$ | $R^{D2}$ | $R^{D26}$ | H |
| $L_{C109}$ | $R^{D2}$ | $R^{D27}$ | H |
| $L_{C110}$ | $R^{D2}$ | $R^{D28}$ | H |
| $L_{C111}$ | $R^{D2}$ | $R^{D29}$ | H |
| $L_{C112}$ | $R^{D2}$ | $R^{D30}$ | H |
| $L_{C113}$ | $R^{D2}$ | $R^{D31}$ | H |
| $L_{C114}$ | $R^{D2}$ | $R^{D32}$ | H |
| $L_{C115}$ | $R^{D2}$ | $R^{D33}$ | H |
| $L_{C116}$ | $R^{D2}$ | $R^{D34}$ | H |
| $L_{C117}$ | $R^{D2}$ | $R^{D35}$ | H |
| $L_{C118}$ | $R^{D2}$ | $R^{D40}$ | H |
| $L_{C119}$ | $R^{D2}$ | $R^{D41}$ | H |
| $L_{C120}$ | $R^{D2}$ | $R^{D42}$ | H |
| $L_{C121}$ | $R^{D2}$ | $R^{D64}$ | H |
| $L_{C122}$ | $R^{D2}$ | $R^{D66}$ | H |

-continued

| Ligand | $R^1$ | $R^2$ | $R^3$ |
|---|---|---|---|
| $L_{C123}$ | $R^{D2}$ | $R^{D68}$ | H |
| $L_{C124}$ | $R^{D2}$ | $R^{D76}$ | H |
| $L_{C125}$ | $R^{D3}$ | $R^{D4}$ | H |
| $L_{C126}$ | $R^{D3}$ | $R^{D5}$ | H |
| $L_{C127}$ | $R^{D3}$ | $R^{D6}$ | H |
| $L_{C128}$ | $R^{D3}$ | $R^{D7}$ | H |
| $L_{C129}$ | $R^{D3}$ | $R^{D8}$ | H |
| $L_{C130}$ | $R^{D3}$ | $R^{D9}$ | H |
| $L_{C131}$ | $R^{D3}$ | $R^{D10}$ | H |
| $L_{C132}$ | $R^{D3}$ | $R^{D11}$ | H |
| $L_{C133}$ | $R^{D3}$ | $R^{D12}$ | H |
| $L_{C134}$ | $R^{D3}$ | $R^{D13}$ | H |
| $L_{C135}$ | $R^{D3}$ | $R^{D14}$ | H |
| $L_{C136}$ | $R^{D3}$ | $R^{D15}$ | H |
| $L_{C137}$ | $R^{D3}$ | $R^{D16}$ | H |
| $L_{C138}$ | $R^{D3}$ | $R^{D17}$ | H |
| $L_{C139}$ | $R^{D3}$ | $R^{D18}$ | H |
| $L_{C140}$ | $R^{D3}$ | $R^{D19}$ | H |
| $L_{C141}$ | $R^{D3}$ | $R^{D20}$ | H |
| $L_{C142}$ | $R^{D3}$ | $R^{D21}$ | H |
| $L_{C143}$ | $R^{D3}$ | $R^{D22}$ | H |
| $L_{C144}$ | $R^{D3}$ | $R^{D23}$ | H |
| $L_{C145}$ | $R^{D3}$ | $R^{D24}$ | H |
| $L_{C146}$ | $R^{D3}$ | $R^{D25}$ | H |
| $L_{C147}$ | $R^{D3}$ | $R^{D26}$ | H |
| $L_{C148}$ | $R^{D3}$ | $R^{D27}$ | H |
| $L_{C149}$ | $R^{D3}$ | $R^{D28}$ | H |
| $L_{C150}$ | $R^{D3}$ | $R^{D29}$ | H |
| $L_{C151}$ | $R^{D3}$ | $R^{D30}$ | H |
| $L_{C152}$ | $R^{D3}$ | $R^{D31}$ | H |
| $L_{C153}$ | $R^{D3}$ | $R^{D32}$ | H |
| $L_{C154}$ | $R^{D3}$ | $R^{D33}$ | H |
| $L_{C155}$ | $R^{D3}$ | $R^{D34}$ | H |
| $L_{C156}$ | $R^{D3}$ | $R^{D35}$ | H |
| $L_{C157}$ | $R^{D3}$ | $R^{D40}$ | H |
| $L_{C158}$ | $R^{D3}$ | $R^{D41}$ | H |
| $L_{C159}$ | $R^{D3}$ | $R^{D42}$ | H |
| $L_{C160}$ | $R^{D3}$ | $R^{D64}$ | H |
| $L_{C161}$ | $R^{D3}$ | $R^{D66}$ | H |
| $L_{C162}$ | $R^{D3}$ | $R^{D68}$ | H |
| $L_{C163}$ | $R^{D3}$ | $R^{D76}$ | H |
| $L_{C164}$ | $R^{D4}$ | $R^{D5}$ | H |
| $L_{C165}$ | $R^{D4}$ | $R^{D6}$ | H |
| $L_{C166}$ | $R^{D4}$ | $R^{D7}$ | H |
| $L_{C167}$ | $R^{D4}$ | $R^{D8}$ | H |
| $L_{C168}$ | $R^{D4}$ | $R^{D9}$ | H |
| $L_{C169}$ | $R^{D4}$ | $R^{D10}$ | H |
| $L_{C170}$ | $R^{D4}$ | $R^{D11}$ | H |
| $L_{C171}$ | $R^{D4}$ | $R^{D12}$ | H |
| $L_{C172}$ | $R^{D4}$ | $R^{D13}$ | H |
| $L_{C173}$ | $R^{D4}$ | $R^{D14}$ | H |
| $L_{C174}$ | $R^{D4}$ | $R^{D15}$ | H |
| $L_{C175}$ | $R^{D4}$ | $R^{D16}$ | H |
| $L_{C176}$ | $R^{D4}$ | $R^{D17}$ | H |
| $L_{C177}$ | $R^{D4}$ | $R^{D18}$ | H |
| $L_{C178}$ | $R^{D4}$ | $R^{D19}$ | H |
| $L_{C179}$ | $R^{D4}$ | $R^{D20}$ | H |
| $L_{C180}$ | $R^{D4}$ | $R^{D21}$ | H |
| $L_{C181}$ | $R^{D4}$ | $R^{D22}$ | H |
| $L_{C182}$ | $R^{D4}$ | $R^{D23}$ | H |
| $L_{C183}$ | $R^{D4}$ | $R^{D24}$ | H |
| $L_{C184}$ | $R^{D4}$ | $R^{D25}$ | H |
| $L_{C185}$ | $R^{D4}$ | $R^{D26}$ | H |
| $L_{C186}$ | $R^{D4}$ | $R^{D27}$ | H |
| $L_{C187}$ | $R^{D4}$ | $R^{D28}$ | H |
| $L_{C188}$ | $R^{D4}$ | $R^{D29}$ | H |
| $L_{C189}$ | $R^{D4}$ | $R^{D30}$ | H |
| $L_{C190}$ | $R^{D4}$ | $R^{D31}$ | H |
| $L_{C191}$ | $R^{D4}$ | $R^{D32}$ | H |
| $L_{C192}$ | $R^{D4}$ | $R^{D33}$ | H |
| $L_{C193}$ | $R^{D4}$ | $R^{D34}$ | H |
| $L_{C194}$ | $R^{D4}$ | $R^{D35}$ | H |
| $L_{C195}$ | $R^{D4}$ | $R^{D40}$ | H |
| $L_{C196}$ | $R^{D4}$ | $R^{D41}$ | H |
| $L_{C197}$ | $R^{D4}$ | $R^{D42}$ | H |
| $L_{C198}$ | $R^{D4}$ | $R^{D64}$ | H |
| $L_{C199}$ | $R^{D4}$ | $R^{D66}$ | H |

-continued

| Ligand | $R^1$ | $R^2$ | $R^3$ |
|---|---|---|---|
| $L_{C200}$ | $R^{D4}$ | $R^{D68}$ | H |
| $L_{C201}$ | $R^{D4}$ | $R^{D76}$ | H |
| $L_{C202}$ | $R^{D4}$ | $R^{D1}$ | H |
| $L_{C203}$ | $R^{D7}$ | $R^{D5}$ | H |
| $L_{C204}$ | $R^{D7}$ | $R^{D6}$ | H |
| $L_{C205}$ | $R^{D7}$ | $R^{D8}$ | H |
| $L_{C206}$ | $R^{D7}$ | $R^{D9}$ | H |
| $L_{C207}$ | $R^{D7}$ | $R^{D10}$ | H |
| $L_{C208}$ | $R^{D7}$ | $R^{D11}$ | H |
| $L_{C209}$ | $R^{D7}$ | $R^{D12}$ | H |
| $L_{C210}$ | $R^{D7}$ | $R^{D13}$ | H |
| $L_{C211}$ | $R^{D7}$ | $R^{D14}$ | H |
| $L_{C212}$ | $R^{D7}$ | $R^{D15}$ | H |
| $L_{C213}$ | $R^{D7}$ | $R^{D16}$ | H |
| $L_{C214}$ | $R^{D7}$ | $R^{D17}$ | H |
| $L_{C215}$ | $R^{D7}$ | $R^{D18}$ | H |
| $L_{C216}$ | $R^{D7}$ | $R^{D19}$ | H |
| $L_{C217}$ | $R^{D7}$ | $R^{D20}$ | H |
| $L_{C218}$ | $R^{D7}$ | $R^{D21}$ | H |
| $L_{C219}$ | $R^{D7}$ | $R^{D22}$ | H |
| $L_{C220}$ | $R^{D7}$ | $R^{D23}$ | H |
| $L_{C221}$ | $R^{D7}$ | $R^{D24}$ | H |
| $L_{C222}$ | $R^{D7}$ | $R^{D25}$ | H |
| $L_{C223}$ | $R^{D7}$ | $R^{D26}$ | H |
| $L_{C224}$ | $R^{D7}$ | $R^{D27}$ | H |
| $L_{C225}$ | $R^{D7}$ | $R^{D28}$ | H |
| $L_{C226}$ | $R^{D7}$ | $R^{D29}$ | H |
| $L_{C227}$ | $R^{D7}$ | $R^{D30}$ | H |
| $L_{C228}$ | $R^{D7}$ | $R^{D31}$ | H |
| $L_{C229}$ | $R^{D7}$ | $R^{D32}$ | H |
| $L_{C230}$ | $R^{D7}$ | $R^{D33}$ | H |
| $L_{C231}$ | $R^{D7}$ | $R^{D34}$ | H |
| $L_{C232}$ | $R^{D7}$ | $R^{D35}$ | H |
| $L_{C233}$ | $R^{D7}$ | $R^{D40}$ | H |
| $L_{C234}$ | $R^{D7}$ | $R^{D41}$ | H |
| $L_{C235}$ | $R^{D7}$ | $R^{D42}$ | H |
| $L_{C236}$ | $R^{D7}$ | $R^{D64}$ | H |
| $L_{C237}$ | $R^{D7}$ | $R^{D66}$ | H |
| $L_{C238}$ | $R^{D7}$ | $R^{D68}$ | H |
| $L_{C239}$ | $R^{D7}$ | $R^{D76}$ | H |
| $L_{C240}$ | $R^{D8}$ | $R^{D5}$ | H |
| $L_{C241}$ | $R^{D8}$ | $R^{D6}$ | H |
| $L_{C242}$ | $R^{D8}$ | $R^{D9}$ | H |
| $L_{C243}$ | $R^{D8}$ | $R^{D10}$ | H |
| $L_{C244}$ | $R^{D8}$ | $R^{D11}$ | H |
| $L_{C245}$ | $R^{D8}$ | $R^{D12}$ | H |
| $L_{C246}$ | $R^{D8}$ | $R^{D13}$ | H |
| $L_{C247}$ | $R^{D8}$ | $R^{D14}$ | H |
| $L_{C248}$ | $R^{D8}$ | $R^{D15}$ | H |
| $L_{C249}$ | $R^{D8}$ | $R^{D16}$ | H |
| $L_{C250}$ | $R^{D8}$ | $R^{D17}$ | H |
| $L_{C251}$ | $R^{D8}$ | $R^{D18}$ | H |
| $L_{C252}$ | $R^{D8}$ | $P^{D19}$ | H |
| $L_{C253}$ | $R^{D8}$ | $R^{D20}$ | H |
| $L_{C254}$ | $R^{D8}$ | $R^{D21}$ | H |
| $L_{C255}$ | $R^{D8}$ | $R^{D22}$ | H |
| $L_{C256}$ | $R^{D8}$ | $R^{D23}$ | H |
| $L_{C257}$ | $R^{D8}$ | $R^{D24}$ | H |
| $L_{C258}$ | $R^{D8}$ | $R^{D25}$ | H |
| $L_{C259}$ | $R^{D8}$ | $R^{D26}$ | H |
| $L_{C260}$ | $R^{D8}$ | $R^{D27}$ | H |
| $L_{C261}$ | $R^{D8}$ | $R^{D28}$ | H |
| $L_{C262}$ | $R^{D8}$ | $R^{D29}$ | H |
| $L_{C263}$ | $R^{D8}$ | $R^{D30}$ | H |
| $L_{C264}$ | $R^{D8}$ | $R^{D31}$ | H |
| $L_{C265}$ | $R^{D8}$ | $R^{D32}$ | H |
| $L_{C266}$ | $R^{D8}$ | $R^{D33}$ | H |
| $L_{C267}$ | $R^{D8}$ | $R^{D34}$ | H |
| $L_{C268}$ | $R^{D8}$ | $R^{D35}$ | H |
| $L_{C269}$ | $R^{D8}$ | $R^{D40}$ | H |
| $L_{C270}$ | $R^{D8}$ | $R^{D41}$ | H |
| $L_{C271}$ | $R^{D8}$ | $R^{D42}$ | H |
| $L_{C272}$ | $R^{D8}$ | $R^{D64}$ | H |
| $L_{C273}$ | $R^{D8}$ | $R^{D66}$ | H |
| $L_{C274}$ | $R^{D8}$ | $R^{D68}$ | H |
| $L_{C275}$ | $R^{D8}$ | $R^{D76}$ | H |
| $L_{C276}$ | $R^{D11}$ | $R^{D5}$ | H |

-continued

| Ligand | $R^1$ | $R^2$ | $R^3$ |
|---|---|---|---|
| $L_{C277}$ | $R^{D11}$ | $R^{D6}$ | H |
| $L_{C278}$ | $R^{D11}$ | $R^{D9}$ | H |
| $L_{C279}$ | $R^{D11}$ | $R^{D10}$ | H |
| $L_{C280}$ | $R^{D11}$ | $R^{D12}$ | H |
| $L_{C281}$ | $R^{D11}$ | $R^{D13}$ | H |
| $L_{C282}$ | $R^{D11}$ | $R^{D14}$ | H |
| $L_{C283}$ | $R^{D11}$ | $R^{D15}$ | H |
| $L_{C284}$ | $R^{D11}$ | $R^{D16}$ | H |
| $L_{C285}$ | $R^{D11}$ | $R^{D17}$ | H |
| $L_{C286}$ | $R^{D11}$ | $R^{D18}$ | H |
| $L_{C287}$ | $R^{D11}$ | $R^{D19}$ | H |
| $L_{C288}$ | $R^{D11}$ | $R^{D20}$ | H |
| $L_{C289}$ | $R^{D11}$ | $R^{D21}$ | H |
| $L_{C290}$ | $R^{D11}$ | $R^{D22}$ | H |
| $L_{C291}$ | $R^{D11}$ | $R^{D23}$ | H |
| $L_{C292}$ | $R^{D11}$ | $R^{D24}$ | H |
| $L_{C293}$ | $R^{D11}$ | $R^{D25}$ | H |
| $L_{C294}$ | $R^{D11}$ | $R^{D26}$ | H |
| $L_{C295}$ | $R^{D11}$ | $R^{D27}$ | H |
| $L_{C296}$ | $R^{D11}$ | $R^{D28}$ | H |
| $L_{C297}$ | $R^{D11}$ | $R^{D29}$ | H |
| $L_{C298}$ | $R^{D11}$ | $R^{D30}$ | H |
| $L_{C299}$ | $R^{D11}$ | $R^{D31}$ | H |
| $L_{C300}$ | $R^{D11}$ | $R^{D32}$ | H |
| $L_{C301}$ | $R^{D11}$ | $R^{D33}$ | H |
| $L_{C302}$ | $R^{D11}$ | $R^{D34}$ | H |
| $L_{C303}$ | $R^{D11}$ | $R^{D35}$ | H |
| $L_{C304}$ | $R^{D11}$ | $R^{D40}$ | H |
| $L_{C305}$ | $R^{D11}$ | $R^{D41}$ | H |
| $L_{C306}$ | $R^{D11}$ | $R^{D42}$ | H |
| $L_{C307}$ | $R^{D11}$ | $R^{D64}$ | H |
| $L_{C308}$ | $R^{D11}$ | $R^{D66}$ | H |
| $L_{C309}$ | $R^{D11}$ | $R^{D68}$ | H |
| $L_{C310}$ | $R^{D11}$ | $R^{D76}$ | H |
| $L_{C311}$ | $R^{D13}$ | $R^{D5}$ | H |
| $L_{C312}$ | $R^{D13}$ | $R^{D6}$ | H |
| $L_{C313}$ | $R^{D13}$ | $R^{D9}$ | H |
| $L_{C314}$ | $R^{D13}$ | $R^{D10}$ | H |
| $L_{C315}$ | $R^{D13}$ | $R^{D12}$ | H |
| $L_{C316}$ | $R^{D13}$ | $R^{D14}$ | H |
| $L_{C317}$ | $R^{D13}$ | $R^{D15}$ | H |
| $L_{C318}$ | $R^{D13}$ | $R^{D16}$ | H |
| $L_{C319}$ | $R^{D13}$ | $R^{D17}$ | H |
| $L_{C320}$ | $R^{D13}$ | $R^{D18}$ | H |
| $L_{C321}$ | $R^{D13}$ | $R^{D19}$ | H |
| $L_{C322}$ | $R^{D13}$ | $R^{D20}$ | H |
| $L_{C323}$ | $R^{D13}$ | $R^{D21}$ | H |
| $L_{C324}$ | $R^{D13}$ | $R^{D22}$ | H |
| $L_{C325}$ | $R^{D13}$ | $R^{D23}$ | H |
| $L_{C326}$ | $R^{D13}$ | $R^{D24}$ | H |
| $L_{C327}$ | $R^{D13}$ | $R^{D25}$ | H |
| $L_{C328}$ | $R^{D13}$ | $R^{D26}$ | H |
| $L_{C329}$ | $R^{D13}$ | $R^{D27}$ | H |
| $L_{C330}$ | $R^{D13}$ | $R^{D28}$ | H |
| $L_{C331}$ | $R^{D13}$ | $R^{D29}$ | H |
| $L_{C332}$ | $R^{D13}$ | $R^{D30}$ | H |
| $L_{C333}$ | $R^{D13}$ | $R^{D31}$ | H |
| $L_{C334}$ | $R^{D13}$ | $R^{D32}$ | H |
| $L_{C335}$ | $R^{D13}$ | $R^{D33}$ | H |
| $L_{C336}$ | $R^{D13}$ | $R^{D34}$ | H |
| $L_{C337}$ | $R^{D13}$ | $R^{D35}$ | H |
| $L_{C338}$ | $R^{D13}$ | $R^{D40}$ | H |
| $L_{C339}$ | $R^{D13}$ | $R^{D41}$ | H |
| $L_{C340}$ | $R^{D13}$ | $R^{D42}$ | H |
| $L_{C341}$ | $R^{D13}$ | $R^{D64}$ | H |
| $L_{C342}$ | $R^{D13}$ | $R^{D66}$ | H |
| $L_{C343}$ | $R^{D13}$ | $R^{D68}$ | H |
| $L_{C344}$ | $R^{D13}$ | $R^{D76}$ | H |
| $L_{C345}$ | $R^{D14}$ | $R^{D5}$ | H |
| $L_{C346}$ | $R^{D14}$ | $R^{D6}$ | H |
| $L_{C347}$ | $R^{D14}$ | $R^{D9}$ | H |
| $L_{C348}$ | $R^{D14}$ | $R^{D10}$ | H |
| $L_{C349}$ | $R^{D14}$ | $R^{D12}$ | H |
| $L_{C350}$ | $R^{D14}$ | $R^{D15}$ | H |
| $L_{C351}$ | $R^{D14}$ | $R^{D16}$ | H |
| $L_{C352}$ | $R^{D14}$ | $R^{D17}$ | H |
| $L_{C353}$ | $R^{D14}$ | $R^{D18}$ | H |
| $L_{C354}$ | $R^{D14}$ | $R^{D19}$ | H |
| $L_{C355}$ | $R^{D14}$ | $R^{D20}$ | H |
| $L_{C356}$ | $R^{D14}$ | $R^{D21}$ | H |
| $L_{C357}$ | $R^{D14}$ | $R^{D22}$ | H |
| $L_{C358}$ | $R^{D14}$ | $R^{D23}$ | H |
| $L_{C359}$ | $R^{D14}$ | $R^{D24}$ | H |
| $L_{C360}$ | $R^{D14}$ | $R^{D25}$ | H |
| $L_{C361}$ | $R^{D14}$ | $R^{D26}$ | H |
| $L_{C362}$ | $R^{D14}$ | $R^{D27}$ | H |
| $L_{C363}$ | $R^{D14}$ | $R^{D28}$ | H |
| $L_{C364}$ | $R^{D14}$ | $R^{D29}$ | H |
| $L_{C365}$ | $R^{D14}$ | $R^{D30}$ | H |
| $L_{C366}$ | $R^{D14}$ | $R^{D3}$ | H |
| $L_{C367}$ | $R^{D14}$ | $R^{D32}$ | H |
| $L_{C368}$ | $R^{D14}$ | $R^{D33}$ | H |
| $L_{C369}$ | $R^{D14}$ | $R^{D34}$ | H |
| $L_{C370}$ | $R^{D14}$ | $R^{D35}$ | H |
| $L_{C371}$ | $R^{D14}$ | $R^{D40}$ | H |
| $L_{C372}$ | $R^{D14}$ | $R^{D41}$ | H |
| $L_{C373}$ | $R^{D14}$ | $R^{D42}$ | H |
| $L_{C374}$ | $R^{D14}$ | $R^{D64}$ | H |
| $L_{C375}$ | $R^{D14}$ | $R^{D66}$ | H |
| $L_{C376}$ | $R^{D14}$ | $R^{D68}$ | H |
| $L_{C377}$ | $R^{D14}$ | $R^{D76}$ | H |
| $L_{C378}$ | $R^{D22}$ | $R^{D5}$ | H |
| $L_{C379}$ | $R^{D22}$ | $R^{D6}$ | H |
| $L_{C380}$ | $R^{D22}$ | $R^{D9}$ | H |
| $L_{C381}$ | $R^{D22}$ | $R^{D10}$ | H |
| $L_{C382}$ | $R^{D22}$ | $R^{D12}$ | H |
| $L_{C383}$ | $R^{D22}$ | $R^{D15}$ | H |
| $L_{C384}$ | $R^{D22}$ | $R^{D16}$ | H |
| $L_{C385}$ | $R^{D22}$ | $R^{D17}$ | H |
| $L_{C386}$ | $R^{D22}$ | $R^{D18}$ | H |
| $L_{C387}$ | $R^{D22}$ | $R^{D19}$ | H |
| $L_{C388}$ | $R^{D22}$ | $R^{D20}$ | H |
| $L_{C389}$ | $R^{D22}$ | $R^{D21}$ | H |
| $L_{C390}$ | $R^{D22}$ | $R^{D23}$ | H |
| $L_{C391}$ | $R^{D22}$ | $R^{D24}$ | H |
| $L_{C392}$ | $R^{D22}$ | $R^{D25}$ | H |
| $L_{C393}$ | $R^{D22}$ | $R^{D26}$ | H |
| $L_{C394}$ | $R^{D22}$ | $R^{D27}$ | H |
| $L_{C395}$ | $R^{D22}$ | $R^{D28}$ | H |
| $L_{C396}$ | $R^{D22}$ | $R^{D29}$ | H |
| $L_{C397}$ | $R^{D22}$ | $R^{D30}$ | H |
| $L_{C398}$ | $R^{D22}$ | $R^{D31}$ | H |
| $L_{C399}$ | $R^{D22}$ | $R^{D32}$ | H |
| $L_{C400}$ | $R^{D22}$ | $R^{D33}$ | H |
| $L_{C401}$ | $R^{D22}$ | $R^{D34}$ | H |
| $L_{C402}$ | $R^{D22}$ | $R^{D35}$ | H |
| $L_{C403}$ | $R^{D22}$ | $R^{D40}$ | H |
| $L_{C404}$ | $R^{D22}$ | $R^{D41}$ | H |
| $L_{C405}$ | $R^{D22}$ | $R^{D42}$ | H |
| $L_{C406}$ | $R^{D22}$ | $R^{D64}$ | H |
| $L_{C407}$ | $R^{D22}$ | $R^{D66}$ | H |
| $L_{C408}$ | $R^{D22}$ | $R^{D68}$ | H |
| $L_{C409}$ | $R^{D22}$ | $R^{D76}$ | H |
| $L_{C410}$ | $R^{D26}$ | $R^{D5}$ | H |
| $L_{C411}$ | $R^{D26}$ | $R^{D6}$ | H |
| $L_{C412}$ | $R^{D26}$ | $R^{D9}$ | H |
| $L_{C413}$ | $R^{D26}$ | $R^{D10}$ | H |
| $L_{C414}$ | $R^{D26}$ | $R^{D12}$ | H |
| $L_{C415}$ | $R^{D26}$ | $R^{D15}$ | H |
| $L_{C416}$ | $R^{D26}$ | $R^{D16}$ | H |
| $L_{C417}$ | $R^{D26}$ | $R^{D17}$ | H |
| $L_{C418}$ | $R^{D26}$ | $R^{D18}$ | H |
| $L_{C419}$ | $R^{D26}$ | $R^{D19}$ | H |
| $L_{C420}$ | $R^{D26}$ | $R^{D20}$ | H |
| $L_{C421}$ | $R^{D26}$ | $R^{D21}$ | H |
| $L_{C422}$ | $R^{D26}$ | $R^{D23}$ | H |
| $L_{C423}$ | $R^{D26}$ | $R^{D24}$ | H |
| $L_{C424}$ | $R^{D26}$ | $R^{D25}$ | H |
| $L_{C425}$ | $R^{D26}$ | $R^{D27}$ | H |
| $L_{C426}$ | $R^{D26}$ | $R^{D28}$ | H |
| $L_{C427}$ | $R^{D26}$ | $R^{D29}$ | H |
| $L_{C428}$ | $R^{D26}$ | $R^{D30}$ | H |
| $L_{C429}$ | $R^{D26}$ | $R^{D31}$ | H |
| $L_{C430}$ | $R^{D26}$ | $R^{D32}$ | H |

-continued

| Ligand | $R^1$ | $R^2$ | $R^3$ |
|---|---|---|---|
| $L_{C431}$ | $R^{D26}$ | $R^{D33}$ | H |
| $L_{C432}$ | $R^{D26}$ | $R^{D34}$ | H |
| $L_{C433}$ | $R^{D26}$ | $R^{D35}$ | H |
| $L_{C434}$ | $R^{D26}$ | $R^{D40}$ | H |
| $L_{C435}$ | $R^{D26}$ | $R^{D41}$ | H |
| $L_{C436}$ | $R^{D26}$ | $R^{D42}$ | H |
| $L_{C437}$ | $R^{D26}$ | $R^{D64}$ | H |
| $L_{C438}$ | $R^{D26}$ | $R^{D66}$ | H |
| $L_{C439}$ | $R^{D26}$ | $R^{D68}$ | H |
| $L_{C440}$ | $R^{D26}$ | $R^{D76}$ | H |
| $L_{C441}$ | $R^{D35}$ | $R^{D5}$ | H |
| $L_{C442}$ | $R^{D35}$ | $R^{D6}$ | H |
| $L_{C443}$ | $R^{D35}$ | $R^{D9}$ | H |
| $L_{C444}$ | $R^{D35}$ | $R^{D10}$ | H |
| $L_{C445}$ | $R^{D35}$ | $R^{D12}$ | H |
| $L_{C446}$ | $R^{D35}$ | $R^{D15}$ | H |
| $L_{C447}$ | $R^{D35}$ | $R^{D16}$ | H |
| $L_{C448}$ | $R^{D35}$ | $R^{D17}$ | H |
| $L_{C449}$ | $R^{D35}$ | $R^{D18}$ | H |
| $L_{C450}$ | $R^{D35}$ | $R^{D19}$ | H |
| $L_{C451}$ | $R^{D35}$ | $R^{D20}$ | H |
| $L_{C452}$ | $R^{D35}$ | $R^{D21}$ | H |
| $L_{C453}$ | $R^{D35}$ | $R^{D23}$ | H |
| $L_{C454}$ | $R^{D35}$ | $R^{D24}$ | H |
| $L_{C455}$ | $R^{D35}$ | $R^{D25}$ | H |
| $L_{C456}$ | $R^{D35}$ | $R^{D27}$ | H |
| $L_{C457}$ | $R^{D35}$ | $R^{D28}$ | H |
| $L_{C458}$ | $R^{D35}$ | $R^{D29}$ | H |
| $L_{C459}$ | $R^{D35}$ | $R^{D30}$ | H |
| $L_{C460}$ | $R^{D35}$ | $R^{D31}$ | H |
| $L_{C461}$ | $R^{D35}$ | $R^{D32}$ | H |
| $L_{C462}$ | $R^{D35}$ | $R^{D33}$ | H |
| $L_{C463}$ | $R^{D35}$ | $R^{D34}$ | H |
| $L_{C464}$ | $R^{D35}$ | $R^{D40}$ | H |
| $L_{C465}$ | $R^{D35}$ | $R^{D41}$ | H |
| $L_{C466}$ | $R^{D35}$ | $R^{D42}$ | H |
| $L_{C467}$ | $R^{D35}$ | $R^{D64}$ | H |
| $L_{C468}$ | $R^{D35}$ | $R^{D66}$ | H |
| $L_{C469}$ | $R^{D35}$ | $R^{D68}$ | H |
| $L_{C470}$ | $R^{D35}$ | $R^{D76}$ | H |
| $L_{C471}$ | $R^{D40}$ | $R^{D5}$ | H |
| $L_{C472}$ | $R^{D40}$ | $R^{D6}$ | H |
| $L_{C473}$ | $R^{D40}$ | $R^{D9}$ | H |
| $L_{C474}$ | $R^{D40}$ | $R^{D10}$ | H |
| $L_{C475}$ | $R^{D40}$ | $R^{D12}$ | H |
| $L_{C476}$ | $R^{D40}$ | $R^{D15}$ | H |
| $L_{C477}$ | $R^{D40}$ | $R^{D16}$ | H |
| $L_{C478}$ | $R^{D40}$ | $R^{D17}$ | H |
| $L_{C479}$ | $R^{D40}$ | $R^{D18}$ | H |
| $L_{C480}$ | $R^{D40}$ | $R^{D19}$ | H |
| $L_{C481}$ | $R^{D40}$ | $R^{D20}$ | H |
| $L_{C482}$ | $R^{D40}$ | $R^{D21}$ | H |
| $L_{C483}$ | $R^{D40}$ | $R^{D23}$ | H |
| $L_{C484}$ | $R^{D40}$ | $R^{D24}$ | H |
| $L_{C485}$ | $R^{D40}$ | $R^{D25}$ | H |
| $L_{C486}$ | $R^{D40}$ | $R^{D27}$ | H |
| $L_{C487}$ | $R^{D40}$ | $R^{D28}$ | H |
| $L_{C488}$ | $R^{D40}$ | $R^{D29}$ | H |
| $L_{C489}$ | $R^{D40}$ | $R^{D30}$ | H |
| $L_{C490}$ | $R^{D40}$ | $R^{D31}$ | H |
| $L_{C491}$ | $R^{D40}$ | $R^{D32}$ | H |
| $L_{C492}$ | $R^{D40}$ | $R^{D33}$ | H |
| $L_{C493}$ | $R^{D40}$ | $R^{D34}$ | H |
| $L_{C494}$ | $R^{D40}$ | $R^{D41}$ | H |
| $L_{C495}$ | $R^{D40}$ | $R^{D42}$ | H |
| $L_{C496}$ | $R^{D40}$ | $R^{D64}$ | H |
| $L_{C497}$ | $R^{D40}$ | $R^{D66}$ | H |
| $L_{C498}$ | $R^{D40}$ | $R^{D68}$ | H |
| $L_{C499}$ | $R^{D40}$ | $R^{D76}$ | H |
| $L_{C500}$ | $R^{D41}$ | $R^{D5}$ | H |
| $L_{C501}$ | $R^{D41}$ | $R^{D6}$ | H |
| $L_{C502}$ | $R^{D41}$ | $R^{D9}$ | H |
| $L_{C503}$ | $R^{D41}$ | $R^{D10}$ | H |
| $L_{C504}$ | $R^{D41}$ | $R^{D12}$ | H |
| $L_{C505}$ | $R^{D41}$ | $R^{D15}$ | H |
| $L_{C506}$ | $R^{D41}$ | $R^{D16}$ | H |
| $L_{C507}$ | $R^{D41}$ | $R^{D17}$ | H |

-continued

| Ligand | $R^1$ | $R^2$ | $R^3$ |
|---|---|---|---|
| $L_{C508}$ | $R^{D41}$ | $R^{D18}$ | H |
| $L_{C509}$ | $R^{D41}$ | $R^{D19}$ | H |
| $L_{C510}$ | $R^{D41}$ | $R^{D20}$ | H |
| $L_{C511}$ | $R^{D41}$ | $R^{D21}$ | H |
| $L_{C512}$ | $R^{D41}$ | $R^{D23}$ | H |
| $L_{C513}$ | $R^{D41}$ | $R^{D24}$ | H |
| $L_{C514}$ | $R^{D41}$ | $R^{D25}$ | H |
| $L_{C515}$ | $R^{D41}$ | $R^{D27}$ | H |
| $L_{C516}$ | $R^{D41}$ | $R^{D28}$ | H |
| $L_{C517}$ | $R^{D41}$ | $R^{D29}$ | H |
| $L_{C518}$ | $R^{D41}$ | $R^{D30}$ | H |
| $L_{C519}$ | $R^{D41}$ | $R^{D31}$ | H |
| $L_{C520}$ | $R^{D41}$ | $R^{D32}$ | H |
| $L_{C521}$ | $R^{D41}$ | $R^{D33}$ | H |
| $L_{C522}$ | $R^{D41}$ | $R^{D34}$ | H |
| $L_{C523}$ | $R^{D41}$ | $R^{D42}$ | H |
| $L_{C524}$ | $R^{D41}$ | $R^{D64}$ | H |
| $L_{C525}$ | $R^{D41}$ | $R^{D66}$ | H |
| $L_{C526}$ | $R^{D41}$ | $R^{D68}$ | H |
| $L_{C527}$ | $R^{D41}$ | $R^{D76}$ | H |
| $L_{C528}$ | $R^{D64}$ | $R^{D5}$ | H |
| $L_{C529}$ | $R^{D64}$ | $R^{D6}$ | H |
| $L_{C530}$ | $R^{D64}$ | $R^{D9}$ | H |
| $L_{C531}$ | $R^{D64}$ | $R^{D10}$ | H |
| $L_{C532}$ | $R^{D64}$ | $R^{D12}$ | H |
| $L_{C533}$ | $R^{D64}$ | $R^{D15}$ | H |
| $L_{C534}$ | $R^{D64}$ | $R^{D16}$ | H |
| $L_{C535}$ | $R^{D64}$ | $R^{D17}$ | H |
| $L_{C536}$ | $R^{D64}$ | $R^{D18}$ | H |
| $L_{C537}$ | $R^{D64}$ | $R^{D19}$ | H |
| $L_{C538}$ | $R^{D64}$ | $R^{D20}$ | H |
| $L_{C539}$ | $R^{D64}$ | $R^{D21}$ | H |
| $L_{C540}$ | $R^{D64}$ | $R^{D23}$ | H |
| $L_{C541}$ | $R^{D64}$ | $R^{D24}$ | H |
| $L_{C542}$ | $R^{D64}$ | $R^{D25}$ | H |
| $L_{C543}$ | $R^{D64}$ | $R^{D27}$ | H |
| $L_{C544}$ | $R^{D64}$ | $R^{D28}$ | H |
| $L_{C545}$ | $R^{D64}$ | $R^{D29}$ | H |
| $L_{C546}$ | $R^{D64}$ | $R^{D30}$ | H |
| $L_{C547}$ | $R^{D64}$ | $R^{D31}$ | H |
| $L_{C548}$ | $R^{D64}$ | $R^{D32}$ | H |
| $L_{C549}$ | $R^{D64}$ | $R^{D33}$ | H |
| $L_{C550}$ | $R^{D64}$ | $R^{D34}$ | H |
| $L_{C551}$ | $R^{D64}$ | $R^{D42}$ | H |
| $L_{C552}$ | $R^{D64}$ | $R^{D64}$ | H |
| $L_{C553}$ | $R^{D64}$ | $R^{D66}$ | H |
| $L_{C554}$ | $R^{D64}$ | $R^{D68}$ | H |
| $L_{C555}$ | $R^{D64}$ | $R^{D76}$ | H |
| $L_{C556}$ | $R^{D66}$ | $R^{D5}$ | H |
| $L_{C557}$ | $R^{D66}$ | $R^{D6}$ | H |
| $L_{C558}$ | $R^{D66}$ | $R^{D9}$ | H |
| $L_{C559}$ | $R^{D66}$ | $R^{D10}$ | H |
| $L_{C560}$ | $R^{D66}$ | $R^{D12}$ | H |
| $L_{C561}$ | $R^{D66}$ | $R^{D15}$ | H |
| $L_{C562}$ | $R^{D66}$ | $R^{D16}$ | H |
| $L_{C563}$ | $R^{D66}$ | $R^{D17}$ | H |
| $L_{C564}$ | $R^{D66}$ | $R^{D18}$ | H |
| $L_{C565}$ | $R^{D66}$ | $R^{D19}$ | H |
| $L_{C566}$ | $R^{D66}$ | $R^{D20}$ | H |
| $L_{C567}$ | $R^{D66}$ | $R^{D21}$ | H |
| $L_{C568}$ | $R^{D66}$ | $R^{D23}$ | H |
| $L_{C569}$ | $R^{D66}$ | $R^{D24}$ | H |
| $L_{C570}$ | $R^{D66}$ | $R^{D25}$ | H |
| $L_{C571}$ | $R^{D66}$ | $R^{D27}$ | H |
| $L_{C572}$ | $R^{D66}$ | $R^{D28}$ | H |
| $L_{C573}$ | $R^{D66}$ | $R^{D29}$ | H |
| $L_{C574}$ | $R^{D66}$ | $R^{D30}$ | H |
| $L_{C575}$ | $R^{D66}$ | $R^{D31}$ | H |
| $L_{C576}$ | $R^{D66}$ | $R^{D32}$ | H |
| $L_{C577}$ | $R^{D66}$ | $R^{D33}$ | H |
| $L_{C578}$ | $R^{D66}$ | $R^{D34}$ | H |
| $L_{C579}$ | $R^{D66}$ | $R^{D42}$ | H |
| $L_{C580}$ | $R^{D66}$ | $R^{D68}$ | H |
| $L_{C581}$ | $R^{D66}$ | $R^{D76}$ | H |
| $L_{C582}$ | $R^{D68}$ | $R^{D5}$ | H |
| $L_{C583}$ | $R^{D68}$ | $R^{D6}$ | H |
| $L_{C584}$ | $R^{D68}$ | $R^{D9}$ | H |

-continued

| Ligand | $R^1$ | $R^2$ | $R^3$ |
|---|---|---|---|
| $L_{C585}$ | $R^{D68}$ | $R^{D10}$ | H |
| $L_{C586}$ | $R^{D68}$ | $R^{D12}$ | H |
| $L_{C587}$ | $R^{D68}$ | $R^{D15}$ | H |
| $L_{C588}$ | $R^{D68}$ | $R^{D16}$ | H |
| $L_{C589}$ | $R^{D68}$ | $R^{D17}$ | H |
| $L_{C590}$ | $R^{D68}$ | $R^{D18}$ | H |
| $L_{C591}$ | $R^{D68}$ | $R^{D19}$ | H |
| $L_{C592}$ | $R^{D68}$ | $R^{D20}$ | H |
| $L_{C593}$ | $R^{D68}$ | $R^{D21}$ | H |
| $L_{C594}$ | $R^{D68}$ | $R^{D23}$ | H |
| $L_{C595}$ | $R^{D68}$ | $R^{D24}$ | H |
| $L_{C596}$ | $R^{D68}$ | $R^{D25}$ | H |
| $L_{C597}$ | $R^{D68}$ | $R^{D27}$ | H |
| $L_{C598}$ | $R^{D68}$ | $R^{D28}$ | H |
| $L_{C599}$ | $R^{D68}$ | $R^{D29}$ | H |
| $L_{C600}$ | $R^{D68}$ | $R^{D30}$ | H |
| $L_{C601}$ | $R^{D68}$ | $R^{D31}$ | H |
| $L_{C602}$ | $R^{D68}$ | $R^{D32}$ | H |
| $L_{C603}$ | $R^{D68}$ | $R^{D33}$ | H |
| $L_{C604}$ | $R^{D68}$ | $R^{D34}$ | H |
| $L_{C605}$ | $R^{D68}$ | $R^{D42}$ | H |
| $L_{C606}$ | $R^{D68}$ | $R^{D76}$ | H |
| $L_{C607}$ | $R^{D76}$ | $R^{D5}$ | H |
| $L_{C608}$ | $R^{D76}$ | $R^{D6}$ | H |
| $L_{C609}$ | $R^{D76}$ | $R^{D9}$ | H |
| $L_{C610}$ | $R^{D76}$ | $R^{D10}$ | H |
| $L_{C611}$ | $R^{D76}$ | $R^{D12}$ | H |
| $L_{C612}$ | $R^{D76}$ | $R^{D15}$ | H |
| $L_{C613}$ | $R^{D76}$ | $R^{D16}$ | H |
| $L_{C614}$ | $R^{D76}$ | $R^{D17}$ | H |
| $L_{C615}$ | $R^{D76}$ | $R^{D18}$ | H |
| $L_{C616}$ | $R^{D76}$ | $R^{D19}$ | H |
| $L_{C617}$ | $R^{D76}$ | $R^{D20}$ | H |
| $L_{C618}$ | $R^{D76}$ | $R^{D21}$ | H |
| $L_{C619}$ | $R^{D76}$ | $R^{D23}$ | H |
| $L_{C620}$ | $R^{D76}$ | $R^{D24}$ | H |
| $L_{C621}$ | $R^{D76}$ | $R^{D25}$ | H |
| $L_{C622}$ | $R^{D76}$ | $R^{D27}$ | H |
| $L_{C623}$ | $R^{D76}$ | $R^{D28}$ | H |
| $L_{C624}$ | $R^{D76}$ | $R^{D29}$ | H |
| $L_{C625}$ | $R^{D76}$ | $R^{D30}$ | H |
| $L_{C626}$ | $R^{D76}$ | $R^{D31}$ | H |
| $L_{C627}$ | $R^{D76}$ | $R^{D32}$ | H |
| $L_{C628}$ | $R^{D76}$ | $R^{D33}$ | H |
| $L_{C629}$ | $R^{D76}$ | $R^{D34}$ | H |
| $L_{C630}$ | $R^{D76}$ | $R^{D42}$ | H |
| $L_{C631}$ | $R^{D1}$ | $R^{D1}$ | $R^{D1}$ |
| $L_{C632}$ | $R^{D2}$ | $R^{D2}$ | $R^{D1}$ |
| $L_{C633}$ | $R^{D3}$ | $R^{D3}$ | $R^{D1}$ |
| $L_{C634}$ | $R^{D4}$ | $R^{D4}$ | $R^{D1}$ |
| $L_{C635}$ | $R^{D5}$ | $R^{D5}$ | $R^{D1}$ |
| $L_{C636}$ | $R^{D6}$ | $R^{D6}$ | $R^{D1}$ |
| $L_{C637}$ | $R^{D7}$ | $R^{D7}$ | $R^{D1}$ |
| $L_{C638}$ | $R^{D8}$ | $R^{D8}$ | $R^{D1}$ |
| $L_{C639}$ | $R^{D9}$ | $R^{D9}$ | $R^{D1}$ |
| $L_{C640}$ | $R^{D10}$ | $R^{D10}$ | $R^{D1}$ |
| $L_{C641}$ | $R^{D11}$ | $R^{D11}$ | $R^{D1}$ |
| $L_{C642}$ | $R^{D12}$ | $R^{D12}$ | $R^{D1}$ |
| $L_{C643}$ | $R^{D13}$ | $R^{D13}$ | $R^{D1}$ |
| $L_{C644}$ | $R^{D14}$ | $R^{D14}$ | $R^{D1}$ |
| $L_{C645}$ | $R^{D15}$ | $R^{D15}$ | $R^{D1}$ |
| $L_{C646}$ | $R^{D16}$ | $R^{D16}$ | $R^{D1}$ |
| $L_{C647}$ | $R^{D17}$ | $R^{D17}$ | $R^{D1}$ |
| $L_{C648}$ | $R^{D18}$ | $R^{D18}$ | $R^{D1}$ |
| $L_{C649}$ | $R^{D19}$ | $R^{D19}$ | $R^{D1}$ |
| $L_{C650}$ | $R^{D20}$ | $R^{D20}$ | $R^{D1}$ |
| $L_{C651}$ | $R^{D21}$ | $R^{D21}$ | $R^{D1}$ |
| $L_{C652}$ | $R^{D22}$ | $R^{D22}$ | $R^{D1}$ |
| $L_{C653}$ | $R^{D23}$ | $R^{D23}$ | $R^{D1}$ |
| $L_{C654}$ | $R^{D24}$ | $R^{D24}$ | $R^{D1}$ |
| $L_{C655}$ | $R^{D25}$ | $R^{D25}$ | $R^{D1}$ |
| $L_{C656}$ | $R^{D26}$ | $R^{D26}$ | $R^{D1}$ |
| $L_{C657}$ | $R^{D27}$ | $R^{D27}$ | $R^{D1}$ |
| $L_{C658}$ | $R^{D28}$ | $R^{D28}$ | $R^{D1}$ |
| $L_{C659}$ | $R^{D29}$ | $R^{D29}$ | $R^{D1}$ |
| $L_{C660}$ | $R^{D30}$ | $R^{D30}$ | $R^{D1}$ |
| $L_{C661}$ | $R^{D31}$ | $R^{D31}$ | $R^{D1}$ |

-continued

| Ligand | $R^1$ | $R^2$ | $R^3$ |
|---|---|---|---|
| $L_{C662}$ | $R^{D32}$ | $R^{D32}$ | $R^{D1}$ |
| $L_{C663}$ | $R^{D33}$ | $R^{D33}$ | $R^{D1}$ |
| $L_{C664}$ | $R^{D34}$ | $R^{D34}$ | $R^{D1}$ |
| $L_{C665}$ | $R^{D35}$ | $R^{D35}$ | $R^{D1}$ |
| $L_{C666}$ | $R^{D40}$ | $R^{D40}$ | $R^{D1}$ |
| $L_{C667}$ | $R^{D41}$ | $R^{D41}$ | $R^{D1}$ |
| $L_{C668}$ | $R^{D42}$ | $R^{D42}$ | $R^{D1}$ |
| $L_{C669}$ | $R^{D64}$ | $R^{D64}$ | $R^{D1}$ |
| $L_{C670}$ | $R^{D66}$ | $R^{D66}$ | $R^{D1}$ |
| $L_{C671}$ | $R^{D68}$ | $R^{D68}$ | $R^{D1}$ |
| $L_{C672}$ | $R^{D76}$ | $R^{D76}$ | $R^{D1}$ |
| $L_{C673}$ | $R^{D1}$ | $R^{D2}$ | $R^{D1}$ |
| $L_{C674}$ | $R^{D1}$ | $R^{D3}$ | $R^{D1}$ |
| $L_{C675}$ | $R^{D1}$ | $R^{D4}$ | $R^{D1}$ |
| $L_{C676}$ | $R^{D1}$ | $R^{D5}$ | $R^{D1}$ |
| $L_{C677}$ | $R^{D1}$ | $R^{D6}$ | $R^{D1}$ |
| $L_{C678}$ | $R^{D1}$ | $R^{D7}$ | $R^{D1}$ |
| $L_{C679}$ | $R^{D1}$ | $R^{D8}$ | $R^{D1}$ |
| $L_{C680}$ | $R^{D1}$ | $R^{D9}$ | $R^{D1}$ |
| $L_{C681}$ | $R^{D1}$ | $R^{D10}$ | $R^{D1}$ |
| $L_{C682}$ | $R^{D1}$ | $R^{D11}$ | $R^{D1}$ |
| $L_{C683}$ | $R^{D1}$ | $R^{D12}$ | $R^{D1}$ |
| $L_{C684}$ | $R^{D1}$ | $R^{D13}$ | $R^{D1}$ |
| $L_{C685}$ | $R^{D1}$ | $R^{D14}$ | $R^{D1}$ |
| $L_{C686}$ | $R^{D1}$ | $R^{D15}$ | $R^{D1}$ |
| $L_{C687}$ | $R^{D1}$ | $R^{D16}$ | $R^{D1}$ |
| $L_{C688}$ | $R^{D1}$ | $R^{D17}$ | $R^{D1}$ |
| $L_{C689}$ | $R^{D1}$ | $R^{D18}$ | $R^{D1}$ |
| $L_{C690}$ | $R^{D1}$ | $R^{D19}$ | $R^{D1}$ |
| $L_{C691}$ | $R^{D1}$ | $R^{D20}$ | $R^{D1}$ |
| $L_{C692}$ | $R^{D1}$ | $R^{D21}$ | $R^{D1}$ |
| $L_{C693}$ | $R^{D1}$ | $R^{D22}$ | $R^{D1}$ |
| $L_{C694}$ | $R^{D1}$ | $R^{D23}$ | $R^{D1}$ |
| $L_{C695}$ | $R^{D1}$ | $R^{D24}$ | $R^{D1}$ |
| $L_{C696}$ | $R^{D1}$ | $R^{D25}$ | $R^{D1}$ |
| $L_{C697}$ | $R^{D1}$ | $R^{D26}$ | $R^{D1}$ |
| $L_{C698}$ | $R^{D1}$ | $R^{D27}$ | $R^{D1}$ |
| $L_{C699}$ | $R^{D1}$ | $R^{D28}$ | $R^{D1}$ |
| $L_{C700}$ | $R^{D1}$ | $R^{D29}$ | $R^{D1}$ |
| $L_{C701}$ | $R^{D1}$ | $R^{D30}$ | $R^{D1}$ |
| $L_{C702}$ | $R^{D1}$ | $R^{D31}$ | $R^{D1}$ |
| $L_{C703}$ | $R^{D1}$ | $R^{D32}$ | $R^{D1}$ |
| $L_{C704}$ | $R^{D1}$ | $R^{D33}$ | $R^{D1}$ |
| $L_{C705}$ | $R^{D1}$ | $R^{D34}$ | $R^{D1}$ |
| $L_{C706}$ | $R^{D1}$ | $R^{D35}$ | $R^{D1}$ |
| $L_{C707}$ | $R^{D1}$ | $R^{D40}$ | $R^{D1}$ |
| $L_{C708}$ | $R^{D1}$ | $R^{D41}$ | $R^{D1}$ |
| $L_{C709}$ | $R^{D1}$ | $R^{D42}$ | $R^{D1}$ |
| $L_{C710}$ | $R^{D1}$ | $R^{D64}$ | $R^{D1}$ |
| $L_{C711}$ | $R^{D1}$ | $R^{D66}$ | $R^{D1}$ |
| $L_{C712}$ | $R^{D1}$ | $R^{D68}$ | $R^{D1}$ |
| $L_{C713}$ | $R^{D1}$ | $R^{D76}$ | $R^{D1}$ |
| $L_{C714}$ | $R^{D2}$ | $R^{D1}$ | $R^{D1}$ |
| $L_{C715}$ | $R^{D2}$ | $R^{D3}$ | $R^{D1}$ |
| $L_{C716}$ | $R^{D2}$ | $R^{D4}$ | $R^{D1}$ |
| $L_{C717}$ | $R^{D2}$ | $R^{D5}$ | $R^{D1}$ |
| $L_{C718}$ | $R^{D2}$ | $R^{D6}$ | $R^{D1}$ |
| $L_{C719}$ | $R^{D2}$ | $R^{D7}$ | $R^{D1}$ |
| $L_{C720}$ | $R^{D2}$ | $R^{D8}$ | $R^{D1}$ |
| $L_{C721}$ | $R^{D2}$ | $R^{D9}$ | $R^{D1}$ |
| $L_{C722}$ | $R^{D2}$ | $R^{D10}$ | $R^{D1}$ |
| $L_{C723}$ | $R^{D2}$ | $R^{D11}$ | $R^{D1}$ |
| $L_{C724}$ | $R^{D2}$ | $R^{D12}$ | $R^{D1}$ |
| $L_{C725}$ | $R^{D2}$ | $R^{D13}$ | $R^{D1}$ |
| $L_{C726}$ | $R^{D2}$ | $R^{D14}$ | $R^{D1}$ |
| $L_{C727}$ | $R^{D2}$ | $R^{D15}$ | $R^{D1}$ |
| $L_{C728}$ | $R^{D2}$ | $R^{D16}$ | $R^{D1}$ |
| $L_{C729}$ | $R^{D2}$ | $R^{D17}$ | $R^{D1}$ |
| $L_{C730}$ | $R^{D2}$ | $R^{D18}$ | $R^{D1}$ |
| $L_{C731}$ | $R^{D2}$ | $R^{D19}$ | $R^{D1}$ |
| $L_{C732}$ | $R^{D2}$ | $R^{D20}$ | $R^{D1}$ |
| $L_{C733}$ | $R^{D2}$ | $R^{D21}$ | $R^{D1}$ |
| $L_{C734}$ | $R^{D2}$ | $R^{D22}$ | $R^{D1}$ |
| $L_{C735}$ | $R^{D2}$ | $R^{D23}$ | $R^{D1}$ |
| $L_{C736}$ | $R^{D2}$ | $R^{D24}$ | $R^{D1}$ |
| $L_{C737}$ | $R^{D2}$ | $R^{D25}$ | $R^{D1}$ |
| $L_{C738}$ | $R^{D2}$ | $R^{D26}$ | $R^{D1}$ |

-continued

| Ligand | $R^1$ | $R^2$ | $R^3$ |
|---|---|---|---|
| $L_{C739}$ | $R^{D2}$ | $R^{D27}$ | $R^{D1}$ |
| $L_{C740}$ | $R^{D2}$ | $R^{D28}$ | $R^{D1}$ |
| $L_{C741}$ | $R^{D2}$ | $R^{D29}$ | $R^{D1}$ |
| $L_{C742}$ | $R^{D2}$ | $R^{D30}$ | $R^{D1}$ |
| $L_{C743}$ | $R^{D2}$ | $R^{D31}$ | $R^{D1}$ |
| $L_{C744}$ | $R^{D2}$ | $R^{D32}$ | $R^{D1}$ |
| $L_{C745}$ | $R^{D2}$ | $R^{D33}$ | $R^{D1}$ |
| $L_{C746}$ | $R^{D2}$ | $R^{D34}$ | $R^{D1}$ |
| $L_{C747}$ | $R^{D2}$ | $R^{D35}$ | $R^{D1}$ |
| $L_{C748}$ | $R^{D2}$ | $R^{D40}$ | $R^{D1}$ |
| $L_{C749}$ | $R^{D2}$ | $R^{D41}$ | $R^{D1}$ |
| $L_{C750}$ | $R^{D2}$ | $R^{D42}$ | $R^{D1}$ |
| $L_{C751}$ | $R^{D2}$ | $R^{D64}$ | $R^{D1}$ |
| $L_{C752}$ | $R^{D2}$ | $R^{D66}$ | $R^{D1}$ |
| $L_{C753}$ | $R^{D2}$ | $R^{D68}$ | $R^{D1}$ |
| $L_{C754}$ | $R^{D2}$ | $R^{D76}$ | $R^{D1}$ |
| $L_{C755}$ | $R^{D3}$ | $R^{D4}$ | $R^{D1}$ |
| $L_{C756}$ | $R^{D3}$ | $R^{D5}$ | $R^{D1}$ |
| $L_{C757}$ | $R^{D3}$ | $R^{D6}$ | $R^{D1}$ |
| $L_{C758}$ | $R^{D3}$ | $R^{D7}$ | $R^{D1}$ |
| $L_{C759}$ | $R^{D3}$ | $R^{D8}$ | $R^{D1}$ |
| $L_{C760}$ | $R^{D3}$ | $R^{D9}$ | $R^{D1}$ |
| $L_{C761}$ | $R^{D3}$ | $R^{D10}$ | $R^{D1}$ |
| $L_{C762}$ | $R^{D3}$ | $R^{D11}$ | $R^{D1}$ |
| $L_{C763}$ | $R^{D3}$ | $R^{D12}$ | $R^{D1}$ |
| $L_{C764}$ | $R^{D3}$ | $R^{D13}$ | $R^{D1}$ |
| $L_{C765}$ | $R^{D3}$ | $R^{D14}$ | $R^{D1}$ |
| $L_{C766}$ | $R^{D3}$ | $R^{D15}$ | $R^{D1}$ |
| $L_{C767}$ | $R^{D3}$ | $R^{D16}$ | $R^{D1}$ |
| $L_{C768}$ | $R^{D3}$ | $R^{D17}$ | $R^{D1}$ |
| $L_{C769}$ | $R^{D3}$ | $R^{D18}$ | $R^{D1}$ |
| $L_{C770}$ | $R^{D3}$ | $R^{D19}$ | $R^{D1}$ |
| $L_{C771}$ | $R^{D3}$ | $R^{D20}$ | $R^{D1}$ |
| $L_{C772}$ | $R^{D3}$ | $R^{D21}$ | $R^{D1}$ |
| $L_{C773}$ | $R^{D3}$ | $R^{D22}$ | $R^{D1}$ |
| $L_{C774}$ | $R^{D3}$ | $R^{D23}$ | $R^{D1}$ |
| $L_{C775}$ | $R^{D3}$ | $R^{D24}$ | $R^{D1}$ |
| $L_{C776}$ | $R^{D3}$ | $R^{D25}$ | $R^{D1}$ |
| $L_{C777}$ | $R^{D3}$ | $R^{D26}$ | $R^{D1}$ |
| $L_{C778}$ | $R^{D3}$ | $R^{D27}$ | $R^{D1}$ |
| $L_{C779}$ | $R^{D3}$ | $R^{D28}$ | $R^{D1}$ |
| $L_{C780}$ | $R^{D3}$ | $R^{D29}$ | $R^{D1}$ |
| $L_{C781}$ | $R^{D3}$ | $R^{D30}$ | $R^{D1}$ |
| $L_{C782}$ | $R^{D3}$ | $R^{D31}$ | $R^{D1}$ |
| $L_{C783}$ | $R^{D3}$ | $R^{D32}$ | $R^{D1}$ |
| $L_{C784}$ | $R^{D3}$ | $R^{D33}$ | $R^{D1}$ |
| $L_{C785}$ | $R^{D3}$ | $R^{D34}$ | $R^{D1}$ |
| $L_{C786}$ | $R^{D3}$ | $R^{D35}$ | $R^{D1}$ |
| $L_{C787}$ | $R^{D3}$ | $R^{D40}$ | $R^{D1}$ |
| $L_{C788}$ | $R^{D3}$ | $R^{D41}$ | $R^{D1}$ |
| $L_{C789}$ | $R^{D3}$ | $R^{D42}$ | $R^{D1}$ |
| $L_{C790}$ | $R^{D3}$ | $R^{D64}$ | $R^{D1}$ |
| $L_{C791}$ | $R^{D3}$ | $R^{D66}$ | $R^{D1}$ |
| $L_{C792}$ | $R^{D3}$ | $R^{D68}$ | $R^{D1}$ |
| $L_{C793}$ | $R^{D3}$ | $R^{D76}$ | $R^{D1}$ |
| $L_{C794}$ | $R^{D4}$ | $R^{D5}$ | $R^{D1}$ |
| $L_{C795}$ | $R^{D4}$ | $R^{D6}$ | $R^{D1}$ |
| $L_{C796}$ | $R^{D4}$ | $R^{D7}$ | $R^{D1}$ |
| $L_{C797}$ | $R^{D4}$ | $R^{D8}$ | $R^{D1}$ |
| $L_{C798}$ | $R^{D4}$ | $R^{D9}$ | $R^{D1}$ |
| $L_{C799}$ | $R^{D4}$ | $R^{D10}$ | $R^{D1}$ |
| $L_{C800}$ | $R^{D4}$ | $R^{D11}$ | $R^{D1}$ |
| $L_{C801}$ | $R^{D4}$ | $R^{D12}$ | $R^{D1}$ |
| $L_{C802}$ | $R^{D4}$ | $R^{D13}$ | $R^{D1}$ |
| $L_{C803}$ | $R^{D4}$ | $R^{D14}$ | $R^{D1}$ |
| $L_{C804}$ | $R^{D4}$ | $R^{D15}$ | $R^{D1}$ |
| $L_{C805}$ | $R^{D4}$ | $R^{D16}$ | $R^{D1}$ |
| $L_{C806}$ | $R^{D4}$ | $R^{D17}$ | $R^{D1}$ |
| $L_{C807}$ | $R^{D4}$ | $R^{D18}$ | $R^{D1}$ |
| $L_{C808}$ | $R^{D4}$ | $R^{D19}$ | $R^{D1}$ |
| $L_{C809}$ | $R^{D4}$ | $R^{D20}$ | $R^{D1}$ |
| $L_{C810}$ | $R^{D4}$ | $R^{D21}$ | $R^{D1}$ |
| $L_{C811}$ | $R^{D4}$ | $R^{D22}$ | $R^{D1}$ |
| $L_{C812}$ | $R^{D4}$ | $R^{D23}$ | $R^{D1}$ |
| $L_{C813}$ | $R^{D4}$ | $R^{D24}$ | $R^{D1}$ |
| $L_{C814}$ | $R^{D4}$ | $R^{D25}$ | $R^{D1}$ |
| $L_{C815}$ | $R^{D4}$ | $R^{D26}$ | $R^{D1}$ |

-continued

| Ligand | $R^1$ | $R^2$ | $R^3$ |
|---|---|---|---|
| $L_{C816}$ | $R^{D4}$ | $R^{D27}$ | $R^{D1}$ |
| $L_{C817}$ | $R^{D4}$ | $R^{D28}$ | $R^{D1}$ |
| $L_{C818}$ | $R^{D4}$ | $R^{D29}$ | $R^{D1}$ |
| $L_{C819}$ | $R^{D4}$ | $R^{D30}$ | $R^{D1}$ |
| $L_{C820}$ | $R^{D4}$ | $R^{D31}$ | $R^{D1}$ |
| $L_{C821}$ | $R^{D4}$ | $R^{D32}$ | $R^{D1}$ |
| $L_{C822}$ | $R^{D4}$ | $R^{D33}$ | $R^{D1}$ |
| $L_{C823}$ | $R^{D4}$ | $R^{D34}$ | $R^{D1}$ |
| $L_{C824}$ | $R^{D4}$ | $R^{D35}$ | $R^{D1}$ |
| $L_{C825}$ | $R^{D4}$ | $R^{D40}$ | $R^{D1}$ |
| $L_{C826}$ | $R^{D4}$ | $R^{D41}$ | $R^{D1}$ |
| $L_{C827}$ | $R^{D4}$ | $R^{D42}$ | $R^{D1}$ |
| $L_{C828}$ | $R^{D4}$ | $R^{D64}$ | $R^{D1}$ |
| $L_{C829}$ | $R^{D4}$ | $R^{D66}$ | $R^{D1}$ |
| $L_{C830}$ | $R^{D4}$ | $R^{D68}$ | $R^{D1}$ |
| $L_{C831}$ | $R^{D4}$ | $R^{D76}$ | $R^{D1}$ |
| $L_{C832}$ | $R^{D4}$ | $R^{D1}$ | $R^{D1}$ |
| $L_{C833}$ | $R^{D7}$ | $R^{D5}$ | $R^{D1}$ |
| $L_{C834}$ | $R^{D7}$ | $R^{D6}$ | $R^{D1}$ |
| $L_{C835}$ | $R^{D7}$ | $R^{D8}$ | $R^{D1}$ |
| $L_{C836}$ | $R^{D7}$ | $R^{D9}$ | $R^{D1}$ |
| $L_{C837}$ | $R^{D7}$ | $R^{D10}$ | $R^{D1}$ |
| $L_{C838}$ | $R^{D7}$ | $R^{D11}$ | $R^{D1}$ |
| $L_{C839}$ | $R^{D7}$ | $R^{D12}$ | $R^{D1}$ |
| $L_{C840}$ | $R^{D7}$ | $R^{D13}$ | $R^{D1}$ |
| $L_{C841}$ | $R^{D7}$ | $R^{D14}$ | $R^{D1}$ |
| $L_{C842}$ | $R^{D7}$ | $R^{D15}$ | $R^{D1}$ |
| $L_{C843}$ | $R^{D7}$ | $R^{D16}$ | $R^{D1}$ |
| $L_{C844}$ | $R^{D7}$ | $R^{D17}$ | $R^{D1}$ |
| $L_{C845}$ | $R^{D7}$ | $R^{D18}$ | $R^{D1}$ |
| $L_{C846}$ | $R^{D7}$ | $R^{D19}$ | $R^{D1}$ |
| $L_{C847}$ | $R^{D7}$ | $R^{D20}$ | $R^{D1}$ |
| $L_{C848}$ | $R^{D7}$ | $R^{D21}$ | $R^{D1}$ |
| $L_{C849}$ | $R^{D7}$ | $R^{D22}$ | $R^{D1}$ |
| $L_{C850}$ | $R^{D7}$ | $R^{D23}$ | $R^{D1}$ |
| $L_{C851}$ | $R^{D7}$ | $R^{D24}$ | $R^{D1}$ |
| $L_{C852}$ | $R^{D7}$ | $R^{D25}$ | $R^{D1}$ |
| $L_{C853}$ | $R^{D7}$ | $R^{D26}$ | $R^{D1}$ |
| $L_{C854}$ | $R^{D7}$ | $R^{D27}$ | $R^{D1}$ |
| $L_{C855}$ | $R^{D7}$ | $R^{D28}$ | $R^{D1}$ |
| $L_{C856}$ | $R^{D7}$ | $R^{D29}$ | $R^{D1}$ |
| $L_{C857}$ | $R^{D7}$ | $R^{D30}$ | $R^{D1}$ |
| $L_{C858}$ | $R^{D7}$ | $R^{D31}$ | $R^{D1}$ |
| $L_{C859}$ | $R^{D7}$ | $R^{D32}$ | $R^{D1}$ |
| $L_{C860}$ | $R^{D7}$ | $R^{D33}$ | $R^{D1}$ |
| $L_{C861}$ | $R^{D7}$ | $R^{D34}$ | $R^{D1}$ |
| $L_{C862}$ | $R^{D7}$ | $R^{D35}$ | $R^{D1}$ |
| $L_{C863}$ | $R^{D7}$ | $R^{D40}$ | $R^{D1}$ |
| $L_{C864}$ | $R^{D7}$ | $R^{D41}$ | $R^{D1}$ |
| $L_{C865}$ | $R^{D7}$ | $R^{D42}$ | $R^{D1}$ |
| $L_{C866}$ | $R^{D7}$ | $R^{D64}$ | $R^{D1}$ |
| $L_{C867}$ | $R^{D7}$ | $R^{D66}$ | $R^{D1}$ |
| $L_{C868}$ | $R^{D7}$ | $R^{D68}$ | $R^{D1}$ |
| $L_{C869}$ | $R^{D7}$ | $R^{D76}$ | $R^{D1}$ |
| $L_{C870}$ | $R^{D8}$ | $R^{D5}$ | $R^{D1}$ |
| $L_{C871}$ | $R^{D8}$ | $R^{D6}$ | $R^{D1}$ |
| $L_{C872}$ | $R^{D8}$ | $R^{D9}$ | $R^{D1}$ |
| $L_{C873}$ | $R^{D8}$ | $R^{D10}$ | $R^{D1}$ |
| $L_{C874}$ | $R^{D8}$ | $R^{D11}$ | $R^{D1}$ |
| $L_{C875}$ | $R^{D8}$ | $R^{D12}$ | $R^{D1}$ |
| $L_{C876}$ | $R^{D8}$ | $R^{D13}$ | $R^{D1}$ |
| $L_{C877}$ | $R^{D8}$ | $R^{D14}$ | $R^{D1}$ |
| $L_{C878}$ | $R^{D8}$ | $R^{D15}$ | $R^{D1}$ |
| $L_{C879}$ | $R^{D8}$ | $R^{D16}$ | $R^{D1}$ |
| $L_{C880}$ | $R^{D8}$ | $R^{D17}$ | $R^{D1}$ |
| $L_{C881}$ | $R^{D8}$ | $R^{D18}$ | $R^{D1}$ |
| $L_{C882}$ | $R^{D8}$ | $R^{D19}$ | $R^{D1}$ |
| $L_{C883}$ | $R^{D8}$ | $R^{D20}$ | $R^{D1}$ |
| $L_{C884}$ | $R^{D8}$ | $R^{D21}$ | $R^{D1}$ |
| $L_{C885}$ | $R^{D8}$ | $R^{D22}$ | $R^{D1}$ |
| $L_{C886}$ | $R^{D8}$ | $R^{D23}$ | $R^{D1}$ |
| $L_{C887}$ | $R^{D8}$ | $R^{D24}$ | $R^{D1}$ |
| $L_{C888}$ | $R^{D8}$ | $R^{D25}$ | $R^{D1}$ |
| $L_{C889}$ | $R^{D8}$ | $R^{D26}$ | $R^{D1}$ |
| $L_{C890}$ | $R^{D8}$ | $R^{D27}$ | $R^{D1}$ |
| $L_{C891}$ | $R^{D8}$ | $R^{D28}$ | $R^{D1}$ |
| $L_{C892}$ | $R^{D8}$ | $R^{D29}$ | $R^{D1}$ |

-continued

| Ligand | $R^1$ | $R^2$ | $R^3$ |
|---|---|---|---|
| $L_{C893}$ | $R^{D8}$ | $R^{D30}$ | $R^{D1}$ |
| $L_{C894}$ | $R^{D8}$ | $R^{D31}$ | $R^{D1}$ |
| $L_{C895}$ | $R^{D8}$ | $R^{D32}$ | $R^{D1}$ |
| $L_{C896}$ | $R^{D8}$ | $R^{D33}$ | $R^{D1}$ |
| $L_{C897}$ | $R^{D8}$ | $R^{D34}$ | $R^{D1}$ |
| $L_{C898}$ | $R^{D8}$ | $R^{D35}$ | $R^{D1}$ |
| $L_{C899}$ | $R^{D8}$ | $R^{D40}$ | $R^{D1}$ |
| $L_{C900}$ | $R^{D8}$ | $R^{D41}$ | $R^{D1}$ |
| $L_{C901}$ | $R^{D8}$ | $R^{D42}$ | $R^{D1}$ |
| $L_{C902}$ | $R^{D8}$ | $R^{D64}$ | $R^{D1}$ |
| $L_{C903}$ | $R^{D8}$ | $R^{D66}$ | $R^{D1}$ |
| $L_{C904}$ | $R^{D8}$ | $R^{D68}$ | $R^{D1}$ |
| $L_{C905}$ | $R^{D8}$ | $R^{D76}$ | $R^{D1}$ |
| $L_{C906}$ | $R^{D11}$ | $R^{D5}$ | $R^{D1}$ |
| $L_{C907}$ | $R^{D11}$ | $R^{D6}$ | $R^{D1}$ |
| $L_{C908}$ | $R^{D11}$ | $R^{D9}$ | $R^{D1}$ |
| $L_{C909}$ | $R^{D11}$ | $R^{D10}$ | $R^{D1}$ |
| $L_{C910}$ | $R^{D11}$ | $R^{D12}$ | $R^{D1}$ |
| $L_{C911}$ | $R^{D11}$ | $R^{D13}$ | $R^{D1}$ |
| $L_{C912}$ | $R^{D11}$ | $R^{D14}$ | $R^{D1}$ |
| $L_{C913}$ | $R^{D11}$ | $R^{D15}$ | $R^{D1}$ |
| $L_{C914}$ | $R^{D11}$ | $R^{D16}$ | $R^{D1}$ |
| $L_{C915}$ | $R^{D11}$ | $R^{D17}$ | $R^{D1}$ |
| $L_{C916}$ | $R^{D11}$ | $R^{D18}$ | $R^{D1}$ |
| $L_{C917}$ | $R^{D11}$ | $R^{D19}$ | $R^{D1}$ |
| $L_{C918}$ | $R^{D11}$ | $R^{D20}$ | $R^{D1}$ |
| $L_{C919}$ | $R^{D11}$ | $R^{D21}$ | $R^{D1}$ |
| $L_{C920}$ | $R^{D11}$ | $R^{D22}$ | $R^{D1}$ |
| $L_{C921}$ | $R^{D11}$ | $R^{D23}$ | $R^{D1}$ |
| $L_{C922}$ | $R^{D11}$ | $R^{D24}$ | $R^{D1}$ |
| $L_{C923}$ | $R^{D11}$ | $R^{D25}$ | $R^{D1}$ |
| $L_{C924}$ | $R^{D11}$ | $R^{D26}$ | $R^{D1}$ |
| $L_{C925}$ | $R^{D11}$ | $R^{D27}$ | $R^{D1}$ |
| $L_{C926}$ | $R^{D11}$ | $R^{D28}$ | $R^{D1}$ |
| $L_{C927}$ | $R^{D11}$ | $R^{D29}$ | $R^{D1}$ |
| $L_{C928}$ | $R^{D11}$ | $R^{D30}$ | $R^{D1}$ |
| $L_{C929}$ | $R^{D11}$ | $R^{D31}$ | $R^{D1}$ |
| $L_{C930}$ | $R^{D11}$ | $R^{D32}$ | $R^{D1}$ |
| $L_{C931}$ | $R^{D11}$ | $R^{D33}$ | $R^{D1}$ |
| $L_{C932}$ | $R^{D11}$ | $R^{D34}$ | $R^{D1}$ |
| $L_{C933}$ | $R^{D11}$ | $R^{D35}$ | $R^{D1}$ |
| $L_{C934}$ | $R^{D11}$ | $R^{D40}$ | $R^{D1}$ |
| $L_{C935}$ | $R^{D11}$ | $R^{D41}$ | $R^{D1}$ |
| $L_{C936}$ | $R^{D11}$ | $R^{D42}$ | $R^{D1}$ |
| $L_{C937}$ | $R^{D11}$ | $R^{D64}$ | $R^{D1}$ |
| $L_{C938}$ | $R^{D11}$ | $R^{D66}$ | $R^{D1}$ |
| $L_{C939}$ | $R^{D11}$ | $R^{D68}$ | $R^{D1}$ |
| $L_{C940}$ | $R^{D11}$ | $R^{D76}$ | $R^{D1}$ |
| $L_{C941}$ | $R^{D13}$ | $R^{D5}$ | $R^{D1}$ |
| $L_{C942}$ | $R^{D13}$ | $R^{D6}$ | $R^{D1}$ |
| $L_{C943}$ | $R^{D13}$ | $R^{D9}$ | $R^{D1}$ |
| $L_{C944}$ | $R^{D13}$ | $R^{D10}$ | $R^{D1}$ |
| $L_{C945}$ | $R^{D13}$ | $R^{D12}$ | $R^{D1}$ |
| $L_{C946}$ | $R^{D13}$ | $R^{D14}$ | $R^{D1}$ |
| $L_{C947}$ | $R^{D13}$ | $R^{D15}$ | $R^{D1}$ |
| $L_{C948}$ | $R^{D13}$ | $R^{D16}$ | $R^{D1}$ |
| $L_{C949}$ | $R^{D13}$ | $R^{D17}$ | $R^{D1}$ |
| $L_{C950}$ | $R^{D13}$ | $R^{D18}$ | $R^{D1}$ |
| $L_{C951}$ | $R^{D13}$ | $R^{D19}$ | $R^{D1}$ |
| $L_{C952}$ | $R^{D13}$ | $R^{D20}$ | $R^{D1}$ |
| $L_{C953}$ | $R^{D13}$ | $R^{D21}$ | $R^{D1}$ |
| $L_{C954}$ | $R^{D13}$ | $R^{D22}$ | $R^{D1}$ |
| $L_{C955}$ | $R^{D13}$ | $R^{D23}$ | $R^{D1}$ |
| $L_{C956}$ | $R^{D13}$ | $R^{D24}$ | $R^{D1}$ |
| $L_{C957}$ | $R^{D13}$ | $R^{D25}$ | $R^{D1}$ |
| $L_{C958}$ | $R^{D13}$ | $R^{D26}$ | $R^{D1}$ |
| $L_{C959}$ | $R^{D13}$ | $R^{D27}$ | $R^{D1}$ |
| $L_{C960}$ | $R^{D13}$ | $R^{D28}$ | $R^{D1}$ |
| $L_{C961}$ | $R^{D13}$ | $R^{D29}$ | $R^{D1}$ |
| $L_{C962}$ | $R^{D13}$ | $R^{D30}$ | $R^{D1}$ |
| $L_{C963}$ | $R^{D13}$ | $R^{D31}$ | $R^{D1}$ |
| $L_{C964}$ | $R^{D13}$ | $R^{D32}$ | $R^{D1}$ |
| $L_{C965}$ | $R^{D13}$ | $R^{D33}$ | $R^{D1}$ |
| $L_{C966}$ | $R^{D13}$ | $R^{D34}$ | $R^{D1}$ |
| $L_{C967}$ | $R^{D13}$ | $R^{D35}$ | $R^{D1}$ |
| $L_{C968}$ | $R^{D13}$ | $R^{D40}$ | $R^{D1}$ |
| $L_{C969}$ | $R^{D13}$ | $R^{D41}$ | $R^{D1}$ |

-continued

| Ligand | $R^1$ | $R^2$ | $R^3$ |
|---|---|---|---|
| $L_{C970}$ | $R^{D13}$ | $R^{D42}$ | $R^{D1}$ |
| $L_{C971}$ | $R^{D13}$ | $R^{D64}$ | $R^{D1}$ |
| $L_{C972}$ | $R^{D13}$ | $R^{D66}$ | $R^{D1}$ |
| $L_{C973}$ | $R^{D13}$ | $R^{D68}$ | $R^{D1}$ |
| $L_{C974}$ | $R^{D13}$ | $R^{D76}$ | $R^{D1}$ |
| $L_{C975}$ | $R^{D14}$ | $R^{D5}$ | $R^{D1}$ |
| $L_{C976}$ | $R^{D14}$ | $R^{D6}$ | $R^{D1}$ |
| $L_{C977}$ | $R^{D14}$ | $R^{D9}$ | $R^{D1}$ |
| $L_{C978}$ | $R^{D14}$ | $R^{D10}$ | $R^{D1}$ |
| $L_{C979}$ | $R^{D14}$ | $R^{D12}$ | $R^{D1}$ |
| $L_{C980}$ | $R^{D14}$ | $R^{D15}$ | $R^{D1}$ |
| $L_{C981}$ | $R^{D14}$ | $R^{D16}$ | $R^{D1}$ |
| $L_{C982}$ | $R^{D14}$ | $R^{D17}$ | $R^{D1}$ |
| $L_{C983}$ | $R^{D14}$ | $R^{D18}$ | $R^{D1}$ |
| $L_{C984}$ | $R^{D14}$ | $R^{D19}$ | $R^{D1}$ |
| $L_{C985}$ | $R^{D14}$ | $R^{D20}$ | $R^{D1}$ |
| $L_{C986}$ | $R^{D14}$ | $R^{D21}$ | $R^{D1}$ |
| $L_{C987}$ | $R^{D14}$ | $R^{D22}$ | $R^{D1}$ |
| $L_{C988}$ | $R^{D14}$ | $R^{D23}$ | $R^{D1}$ |
| $L_{C989}$ | $R^{D14}$ | $R^{D24}$ | $R^{D1}$ |
| $L_{C990}$ | $R^{D14}$ | $R^{D25}$ | $R^{D1}$ |
| $L_{C991}$ | $R^{D14}$ | $R^{D26}$ | $R^{D1}$ |
| $L_{C992}$ | $R^{D14}$ | $R^{D27}$ | $R^{D1}$ |
| $L_{C993}$ | $R^{D14}$ | $R^{D28}$ | $R^{D1}$ |
| $L_{C994}$ | $R^{D14}$ | $R^{D29}$ | $R^{D1}$ |
| $L_{C995}$ | $R^{D14}$ | $R^{D30}$ | $R^{D1}$ |
| $L_{C996}$ | $R^{D14}$ | $R^{D31}$ | $R^{D1}$ |
| $L_{C997}$ | $R^{D14}$ | $R^{D32}$ | $R^{D1}$ |
| $L_{C998}$ | $R^{D14}$ | $R^{D33}$ | $R^{D1}$ |
| $L_{C999}$ | $R^{D14}$ | $R^{D34}$ | $R^{D1}$ |
| $L_{C1000}$ | $R^{D14}$ | $R^{D35}$ | $R^{D1}$ |
| $L_{C1001}$ | $R^{D14}$ | $R^{D40}$ | $R^{D1}$ |
| $L_{C1002}$ | $R^{D14}$ | $R^{D41}$ | $R^{D1}$ |
| $L_{C1003}$ | $R^{D14}$ | $R^{D42}$ | $R^{D1}$ |
| $L_{C1004}$ | $R^{D14}$ | $R^{D64}$ | $R^{D1}$ |
| $L_{C1005}$ | $R^{D14}$ | $R^{D66}$ | $R^{D1}$ |
| $L_{C1006}$ | $R^{D14}$ | $R^{D68}$ | $R^{D1}$ |
| $L_{C1007}$ | $R^{D14}$ | $R^{D76}$ | $R^{D1}$ |
| $L_{C1008}$ | $R^{D22}$ | $R^{D5}$ | $R^{D1}$ |
| $L_{C1009}$ | $R^{D22}$ | $R^{D6}$ | $R^{D1}$ |
| $L_{C1010}$ | $R^{D22}$ | $R^{D9}$ | $R^{D1}$ |
| $L_{C1011}$ | $R^{D22}$ | $R^{D10}$ | $R^{D1}$ |
| $L_{C1012}$ | $R^{D22}$ | $R^{D12}$ | $R^{D1}$ |
| $L_{C1013}$ | $R^{D22}$ | $R^{D15}$ | $R^{D1}$ |
| $L_{C1014}$ | $R^{D22}$ | $R^{D16}$ | $R^{D1}$ |
| $L_{C1015}$ | $R^{D22}$ | $R^{D17}$ | $R^{D1}$ |
| $L_{C1016}$ | $R^{D22}$ | $R^{D18}$ | $R^{D1}$ |
| $L_{C1017}$ | $R^{D22}$ | $R^{D19}$ | $R^{D1}$ |
| $L_{C1018}$ | $R^{D22}$ | $R^{D20}$ | $R^{D1}$ |
| $L_{C1019}$ | $R^{D22}$ | $R^{D21}$ | $R^{D1}$ |
| $L_{C1020}$ | $R^{D22}$ | $R^{D23}$ | $R^{D1}$ |
| $L_{C1021}$ | $R^{D22}$ | $R^{D24}$ | $R^{D1}$ |
| $L_{C1022}$ | $R^{D22}$ | $R^{D25}$ | $R^{D1}$ |
| $L_{C1023}$ | $R^{D22}$ | $R^{D26}$ | $R^{D1}$ |
| $L_{C1024}$ | $R^{D22}$ | $R^{D27}$ | $R^{D1}$ |
| $L_{C1025}$ | $R^{D22}$ | $R^{D28}$ | $R^{D1}$ |
| $L_{C1026}$ | $R^{D22}$ | $R^{D29}$ | $R^{D1}$ |
| $L_{C1027}$ | $R^{D22}$ | $R^{D30}$ | $R^{D1}$ |
| $L_{C1028}$ | $R^{D22}$ | $R^{D31}$ | $R^{D1}$ |
| $L_{C1029}$ | $R^{D22}$ | $R^{D32}$ | $R^{D1}$ |
| $L_{C1030}$ | $R^{D22}$ | $R^{D33}$ | $R^{D1}$ |
| $L_{C1031}$ | $R^{D22}$ | $R^{D34}$ | $R^{D1}$ |
| $L_{C1032}$ | $R^{D22}$ | $R^{D35}$ | $R^{D1}$ |
| $L_{C1033}$ | $R^{D22}$ | $R^{D40}$ | $R^{D1}$ |
| $L_{C1034}$ | $R^{D22}$ | $R^{D41}$ | $R^{D1}$ |
| $L_{C1035}$ | $R^{D22}$ | $R^{D42}$ | $R^{D1}$ |
| $L_{C1036}$ | $R^{D22}$ | $R^{D64}$ | $R^{D1}$ |
| $L_{C1037}$ | $R^{D22}$ | $R^{D66}$ | $R^{D1}$ |
| $L_{C1038}$ | $R^{D22}$ | $R^{D68}$ | $R^{D1}$ |
| $L_{C1039}$ | $R^{D22}$ | $R^{D76}$ | $R^{D1}$ |
| $L_{C1040}$ | $R^{D26}$ | $R^{D5}$ | $R^{D1}$ |
| $L_{C1041}$ | $R^{D26}$ | $R^{D6}$ | $R^{D1}$ |
| $L_{C1042}$ | $R^{D26}$ | $R^{D9}$ | $R^{D1}$ |
| $L_{C1043}$ | $R^{D26}$ | $R^{D10}$ | $R^{D1}$ |
| $L_{C1044}$ | $R^{D26}$ | $R^{D12}$ | $R^{D1}$ |
| $L_{C1045}$ | $R^{D26}$ | $R^{D15}$ | $R^{D1}$ |
| $L_{C1046}$ | $R^{D26}$ | $R^{D16}$ | $R^{D1}$ |

-continued

| Ligand | $R^1$ | $R^2$ | $R^3$ |
|---|---|---|---|
| $L_{C1047}$ | $R^{D26}$ | $R^{D17}$ | $R^{D1}$ |
| $L_{C1048}$ | $R^{D26}$ | $R^{D18}$ | $R^{D1}$ |
| $L_{C1049}$ | $R^{D26}$ | $R^{D19}$ | $R^{D1}$ |
| $L_{C1050}$ | $R^{D26}$ | $R^{D20}$ | $R^{D1}$ |
| $L_{C1051}$ | $R^{D26}$ | $R^{D21}$ | $R^{D1}$ |
| $L_{C1052}$ | $R^{D26}$ | $R^{D23}$ | $R^{D1}$ |
| $L_{C1053}$ | $R^{D26}$ | $R^{D24}$ | $R^{D1}$ |
| $L_{C1054}$ | $R^{D26}$ | $R^{D25}$ | $R^{D1}$ |
| $L_{C1055}$ | $R^{D26}$ | $R^{D27}$ | $R^{D1}$ |
| $L_{C1056}$ | $R^{D26}$ | $R^{D28}$ | $R^{D1}$ |
| $L_{C1057}$ | $R^{D26}$ | $R^{D29}$ | $R^{D1}$ |
| $L_{C1058}$ | $R^{D26}$ | $R^{D30}$ | $R^{D1}$ |
| $L_{C1059}$ | $R^{D26}$ | $R^{D31}$ | $R^{D1}$ |
| $L_{C1060}$ | $R^{D26}$ | $R^{D32}$ | $R^{D1}$ |
| $L_{C1061}$ | $R^{D26}$ | $R^{D33}$ | $R^{D1}$ |
| $L_{C1062}$ | $R^{D26}$ | $R^{D34}$ | $R^{D1}$ |
| $L_{C1063}$ | $R^{D26}$ | $R^{D35}$ | $R^{D1}$ |
| $L_{C1064}$ | $R^{D26}$ | $R^{D40}$ | $R^{D1}$ |
| $L_{C1065}$ | $R^{D26}$ | $R^{D41}$ | $R^{D1}$ |
| $L_{C1066}$ | $R^{D26}$ | $R^{D42}$ | $R^{D1}$ |
| $L_{C1067}$ | $R^{D26}$ | $R^{D64}$ | $R^{D1}$ |
| $L_{C1068}$ | $R^{D26}$ | $R^{D66}$ | $R^{D1}$ |
| $L_{C1069}$ | $R^{D26}$ | $R^{D68}$ | $R^{D1}$ |
| $L_{C1070}$ | $R^{D26}$ | $R^{D76}$ | $R^{D1}$ |
| $L_{C1071}$ | $R^{D35}$ | $R^{D5}$ | $R^{D1}$ |
| $L_{C1072}$ | $R^{D35}$ | $R^{D6}$ | $R^{D1}$ |
| $L_{C1073}$ | $R^{D35}$ | $R^{D9}$ | $R^{D1}$ |
| $L_{C1074}$ | $R^{D35}$ | $R^{D10}$ | $R^{D1}$ |
| $L_{C1075}$ | $R^{D35}$ | $R^{D12}$ | $R^{D1}$ |
| $L_{C1076}$ | $R^{D35}$ | $R^{D15}$ | $R^{D1}$ |
| $L_{C1077}$ | $R^{D35}$ | $R^{D16}$ | $R^{D1}$ |
| $L_{C1078}$ | $R^{D35}$ | $R^{D17}$ | $R^{D1}$ |
| $L_{C1079}$ | $R^{D35}$ | $R^{D18}$ | $R^{D1}$ |
| $L_{C1080}$ | $R^{D35}$ | $R^{D19}$ | $R^{D1}$ |
| $L_{C1081}$ | $R^{D35}$ | $R^{D20}$ | $R^{D1}$ |
| $L_{C1082}$ | $R^{D35}$ | $R^{D21}$ | $R^{D1}$ |
| $L_{C1083}$ | $R^{D35}$ | $R^{D23}$ | $R^{D1}$ |
| $L_{C1084}$ | $R^{D35}$ | $R^{D24}$ | $R^{D1}$ |
| $L_{C1085}$ | $R^{D35}$ | $R^{D25}$ | $R^{D1}$ |
| $L_{C1086}$ | $R^{D35}$ | $R^{D27}$ | $R^{D1}$ |
| $L_{C1087}$ | $R^{D35}$ | $R^{D28}$ | $R^{D1}$ |
| $L_{C1088}$ | $R^{D35}$ | $R^{D29}$ | $R^{D1}$ |
| $L_{C1089}$ | $R^{D35}$ | $R^{D30}$ | $R^{D1}$ |
| $L_{C1090}$ | $R^{D35}$ | $R^{D31}$ | $R^{D1}$ |
| $L_{C1091}$ | $R^{D35}$ | $R^{D32}$ | $R^{D1}$ |
| $L_{C1092}$ | $R^{D35}$ | $R^{D33}$ | $R^{D1}$ |
| $L_{C1093}$ | $R^{D35}$ | $R^{D34}$ | $R^{D1}$ |
| $L_{C1094}$ | $R^{D35}$ | $R^{D40}$ | $R^{D1}$ |
| $L_{C1095}$ | $R^{D35}$ | $R^{D41}$ | $R^{D1}$ |
| $L_{C1096}$ | $R^{D35}$ | $R^{D42}$ | $R^{D1}$ |
| $L_{C1097}$ | $R^{D35}$ | $R^{D64}$ | $R^{D1}$ |
| $L_{C1098}$ | $R^{D35}$ | $R^{D66}$ | $R^{D1}$ |
| $L_{C1099}$ | $R^{D35}$ | $R^{D68}$ | $R^{D1}$ |
| $L_{C1100}$ | $R^{D35}$ | $R^{D76}$ | $R^{D1}$ |
| $L_{C1101}$ | $R^{D40}$ | $R^{D5}$ | $R^{D1}$ |
| $L_{C1102}$ | $R^{D40}$ | $R^{D6}$ | $R^{D1}$ |
| $L_{C1103}$ | $R^{D40}$ | $R^{D9}$ | $R^{D1}$ |
| $L_{C1104}$ | $R^{D40}$ | $R^{D10}$ | $R^{D1}$ |
| $L_{C1105}$ | $R^{D40}$ | $R^{D12}$ | $R^{D1}$ |
| $L_{C1106}$ | $R^{D40}$ | $R^{D15}$ | $R^{D1}$ |
| $L_{C1107}$ | $R^{D40}$ | $R^{D16}$ | $R^{D1}$ |
| $L_{C1108}$ | $R^{D40}$ | $R^{D17}$ | $R^{D1}$ |
| $L_{C1109}$ | $R^{D40}$ | $R^{D18}$ | $R^{D1}$ |
| $L_{C1110}$ | $R^{D40}$ | $R^{D19}$ | $R^{D1}$ |
| $L_{C1111}$ | $R^{D40}$ | $R^{D20}$ | $R^{D1}$ |
| $L_{C1112}$ | $R^{D40}$ | $R^{D21}$ | $R^{D1}$ |
| $L_{C1113}$ | $R^{D40}$ | $R^{D23}$ | $R^{D1}$ |
| $L_{C1114}$ | $R^{D40}$ | $R^{D24}$ | $R^{D1}$ |
| $L_{C1115}$ | $R^{D40}$ | $R^{D25}$ | $R^{D1}$ |
| $L_{C1116}$ | $R^{D40}$ | $R^{D27}$ | $R^{D1}$ |
| $L_{C1117}$ | $R^{D40}$ | $R^{D28}$ | $R^{D1}$ |
| $L_{C1118}$ | $R^{D40}$ | $R^{D29}$ | $R^{D1}$ |
| $L_{C1119}$ | $R^{D40}$ | $R^{D30}$ | $R^{D1}$ |
| $L_{C1120}$ | $R^{D40}$ | $R^{D31}$ | $R^{D1}$ |
| $L_{C1121}$ | $R^{D40}$ | $R^{D32}$ | $R^{D1}$ |
| $L_{C1122}$ | $R^{D40}$ | $R^{D33}$ | $R^{D1}$ |
| $L_{C1123}$ | $R^{D40}$ | $R^{D34}$ | $R^{D1}$ |

-continued

| Ligand | $R^1$ | $R^2$ | $R^3$ |
|---|---|---|---|
| $L_{C1124}$ | $R^{D40}$ | $R^{D41}$ | $R^{D1}$ |
| $L_{C1125}$ | $R^{D40}$ | $R^{D42}$ | $R^{D1}$ |
| $L_{C1126}$ | $R^{D40}$ | $R^{D64}$ | $R^{D1}$ |
| $L_{C1127}$ | $R^{D40}$ | $R^{D66}$ | $R^{D1}$ |
| $L_{C1128}$ | $R^{D40}$ | $R^{D68}$ | $R^{D1}$ |
| $L_{C1129}$ | $R^{D40}$ | $R^{D76}$ | $R^{D1}$ |
| $L_{C1130}$ | $R^{D41}$ | $R^{D5}$ | $R^{D1}$ |
| $L_{C1131}$ | $R^{D41}$ | $R^{D6}$ | $R^{D1}$ |
| $L_{C1132}$ | $R^{D41}$ | $R^{D9}$ | $R^{D1}$ |
| $L_{C1133}$ | $R^{D41}$ | $R^{D10}$ | $R^{D1}$ |
| $L_{C1134}$ | $R^{D41}$ | $R^{D12}$ | $R^{D1}$ |
| $L_{C1135}$ | $R^{D41}$ | $R^{D15}$ | $R^{D1}$ |
| $L_{C1136}$ | $R^{D41}$ | $R^{D16}$ | $R^{D1}$ |
| $L_{C1137}$ | $R^{D41}$ | $R^{D17}$ | $R^{D1}$ |
| $L_{C1138}$ | $R^{D41}$ | $R^{D18}$ | $R^{D1}$ |
| $L_{C1139}$ | $R^{D41}$ | $R^{D19}$ | $R^{D1}$ |
| $L_{C1140}$ | $R^{D41}$ | $R^{D20}$ | $R^{D1}$ |
| $L_{C1141}$ | $R^{D41}$ | $R^{D21}$ | $R^{D1}$ |
| $L_{C1142}$ | $R^{D41}$ | $R^{D23}$ | $R^{D1}$ |
| $L_{C1143}$ | $R^{D41}$ | $R^{D24}$ | $R^{D1}$ |
| $L_{C1144}$ | $R^{D41}$ | $R^{D25}$ | $R^{D1}$ |
| $L_{C1145}$ | $R^{D41}$ | $R^{D27}$ | $R^{D1}$ |
| $L_{C1146}$ | $R^{D41}$ | $R^{D28}$ | $R^{D1}$ |
| $L_{C1147}$ | $R^{D41}$ | $R^{D29}$ | $R^{D1}$ |
| $L_{C1148}$ | $R^{D41}$ | $R^{D30}$ | $R^{D1}$ |
| $L_{C1149}$ | $R^{D41}$ | $R^{D31}$ | $R^{D1}$ |
| $L_{C1150}$ | $R^{D41}$ | $R^{D32}$ | $R^{D1}$ |
| $L_{C1151}$ | $R^{D41}$ | $R^{D33}$ | $R^{D1}$ |
| $L_{C1152}$ | $R^{D41}$ | $R^{D34}$ | $R^{D1}$ |
| $L_{C1153}$ | $R^{D41}$ | $R^{D42}$ | $R^{D1}$ |
| $L_{C1154}$ | $R^{D41}$ | $R^{D64}$ | $R^{D1}$ |
| $L_{C1155}$ | $R^{D41}$ | $R^{D66}$ | $R^{D1}$ |
| $L_{C1156}$ | $R^{D41}$ | $R^{D68}$ | $R^{D1}$ |
| $L_{C1157}$ | $R^{D41}$ | $R^{D76}$ | $R^{D1}$ |
| $L_{C1158}$ | $R^{D64}$ | $R^{D5}$ | $R^{D1}$ |
| $L_{C1159}$ | $R^{D64}$ | $R^{D6}$ | $R^{D1}$ |
| $L_{C1160}$ | $R^{D64}$ | $R^{D9}$ | $R^{D1}$ |
| $L_{C1161}$ | $R^{D64}$ | $R^{D10}$ | $R^{D1}$ |
| $L_{C1162}$ | $R^{D64}$ | $R^{D12}$ | $R^{D1}$ |
| $L_{C1163}$ | $R^{D64}$ | $R^{D15}$ | $R^{D1}$ |
| $L_{C1164}$ | $R^{D64}$ | $R^{D16}$ | $R^{D1}$ |
| $L_{C1165}$ | $R^{D64}$ | $R^{D17}$ | $R^{D1}$ |
| $L_{C1166}$ | $R^{D64}$ | $R^{D18}$ | $R^{D1}$ |
| $L_{C1167}$ | $R^{D64}$ | $R^{D19}$ | $R^{D1}$ |
| $L_{C1168}$ | $R^{D64}$ | $R^{D20}$ | $R^{D1}$ |
| $L_{C1169}$ | $R^{D64}$ | $R^{D21}$ | $R^{D1}$ |
| $L_{C1170}$ | $R^{D64}$ | $R^{D23}$ | $R^{D1}$ |
| $L_{C1171}$ | $R^{D64}$ | $R^{D24}$ | $R^{D1}$ |
| $L_{C1172}$ | $R^{D64}$ | $R^{D25}$ | $R^{D1}$ |
| $L_{C1173}$ | $R^{D64}$ | $R^{D27}$ | $R^{D1}$ |
| $L_{C1174}$ | $R^{D64}$ | $R^{D28}$ | $R^{D1}$ |
| $L_{C1175}$ | $R^{D64}$ | $R^{D29}$ | $R^{D1}$ |
| $L_{C1176}$ | $R^{D64}$ | $R^{D30}$ | $R^{D1}$ |
| $L_{C1177}$ | $R^{D64}$ | $R^{D31}$ | $R^{D1}$ |
| $L_{C1178}$ | $R^{D64}$ | $R^{D32}$ | $R^{D1}$ |
| $L_{C1179}$ | $R^{D64}$ | $R^{D33}$ | $R^{D1}$ |
| $L_{C1180}$ | $R^{D64}$ | $R^{D34}$ | $R^{D1}$ |
| $L_{C1181}$ | $R^{D64}$ | $R^{D42}$ | $R^{D1}$ |
| $L_{C1182}$ | $R^{D64}$ | $R^{D64}$ | $R^{D1}$ |
| $L_{C1183}$ | $R^{D64}$ | $R^{D66}$ | $R^{D1}$ |
| $L_{C1184}$ | $R^{D64}$ | $R^{D68}$ | $R^{D1}$ |
| $L_{C1185}$ | $R^{D64}$ | $R^{D76}$ | $R^{D1}$ |
| $L_{C1186}$ | $R^{D66}$ | $R^{D5}$ | $R^{D1}$ |
| $L_{C1187}$ | $R^{D66}$ | $R^{D6}$ | $R^{D1}$ |
| $L_{C1188}$ | $R^{D66}$ | $R^{D9}$ | $R^{D1}$ |
| $L_{C1189}$ | $R^{D66}$ | $R^{D10}$ | $R^{D1}$ |
| $L_{C1190}$ | $R^{D66}$ | $R^{D12}$ | $R^{D1}$ |
| $L_{C1191}$ | $R^{D66}$ | $R^{D15}$ | $R^{D1}$ |
| $L_{C1192}$ | $R^{D66}$ | $R^{D16}$ | $R^{D1}$ |
| $L_{C1193}$ | $R^{D66}$ | $R^{D17}$ | $R^{D1}$ |
| $L_{C1194}$ | $R^{D66}$ | $R^{D18}$ | $R^{D1}$ |
| $L_{C1195}$ | $R^{D66}$ | $R^{D19}$ | $R^{D1}$ |
| $L_{C1196}$ | $R^{D66}$ | $R^{D20}$ | $R^{D1}$ |
| $L_{C1197}$ | $R^{D66}$ | $R^{D21}$ | $R^{D1}$ |
| $L_{C1198}$ | $R^{D66}$ | $R^{D23}$ | $R^{D1}$ |
| $L_{C1199}$ | $R^{D66}$ | $R^{D24}$ | $R^{D1}$ |
| $L_{C1200}$ | $R^{D66}$ | $R^{D25}$ | $R^{D1}$ |

-continued

| Ligand | $R^1$ | $R^2$ | $R^3$ |
|---|---|---|---|
| $L_{C1201}$ | $R^{D66}$ | $R^{D27}$ | $R^{D1}$ |
| $L_{C1202}$ | $R^{D66}$ | $R^{D28}$ | $R^{D1}$ |
| $L_{C1203}$ | $R^{D66}$ | $R^{D29}$ | $R^{D1}$ |
| $L_{C1204}$ | $R^{D66}$ | $R^{D30}$ | $R^{D1}$ |
| $L_{C1205}$ | $R^{D66}$ | $R^{D31}$ | $R^{D1}$ |
| $L_{C1206}$ | $R^{D66}$ | $R^{D32}$ | $R^{D1}$ |
| $L_{C1207}$ | $R^{D66}$ | $R^{D33}$ | $R^{D1}$ |
| $L_{C1208}$ | $R^{D66}$ | $R^{D34}$ | $R^{D1}$ |
| $L_{C1209}$ | $R^{D66}$ | $R^{D42}$ | $R^{D1}$ |
| $L_{C1210}$ | $R^{D66}$ | $R^{D68}$ | $R^{D1}$ |
| $L_{C1211}$ | $R^{D66}$ | $R^{D76}$ | $R^{D1}$ |
| $L_{C1212}$ | $R^{D68}$ | $R^{D5}$ | $R^{D1}$ |
| $L_{C1213}$ | $R^{D68}$ | $R^{D6}$ | $R^{D1}$ |
| $L_{C1214}$ | $R^{D68}$ | $R^{D9}$ | $R^{D1}$ |
| $L_{C1215}$ | $R^{D68}$ | $R^{D10}$ | $R^{D1}$ |
| $L_{C1216}$ | $R^{D68}$ | $R^{D12}$ | $R^{D1}$ |
| $L_{C1217}$ | $R^{D68}$ | $R^{D15}$ | $R^{D1}$ |
| $L_{C1218}$ | $R^{D68}$ | $R^{D16}$ | $R^{D1}$ |
| $L_{C1219}$ | $R^{D68}$ | $R^{D17}$ | $R^{D1}$ |
| $L_{C1220}$ | $R^{D68}$ | $R^{D18}$ | $R^{D1}$ |
| $L_{C1221}$ | $R^{D68}$ | $R^{D19}$ | $R^{D1}$ |
| $L_{C1222}$ | $R^{D68}$ | $R^{D20}$ | $R^{D1}$ |
| $L_{C1223}$ | $R^{D68}$ | $R^{D21}$ | $R^{D1}$ |
| $L_{C1224}$ | $R^{D68}$ | $R^{D23}$ | $R^{D1}$ |
| $L_{C1225}$ | $R^{D68}$ | $R^{D24}$ | $R^{D1}$ |
| $L_{C1226}$ | $R^{D68}$ | $R^{D25}$ | $R^{D1}$ |
| $L_{C1227}$ | $R^{D68}$ | $R^{D27}$ | $R^{D1}$ |
| $L_{C1228}$ | $R^{D68}$ | $R^{D28}$ | $R^{D1}$ |
| $L_{C1229}$ | $R^{D68}$ | $R^{D29}$ | $R^{D1}$ |
| $L_{C1230}$ | $R^{D68}$ | $R^{D30}$ | $R^{D1}$ |
| $L_{C1231}$ | $R^{D68}$ | $R^{D31}$ | $R^{D1}$ |
| $L_{C1232}$ | $R^{D68}$ | $R^{D32}$ | $R^{D1}$ |
| $L_{C1233}$ | $R^{D68}$ | $R^{D33}$ | $R^{D1}$ |
| $L_{C1234}$ | $R^{D68}$ | $R^{D34}$ | $R^{D1}$ |
| $L_{C1235}$ | $R^{D68}$ | $R^{D42}$ | $R^{D1}$ |
| $L_{C1236}$ | $R^{D68}$ | $R^{D76}$ | $R^{D1}$ |
| $L_{C1237}$ | $R^{D76}$ | $R^{D5}$ | $R^{D1}$ |
| $L_{C1238}$ | $R^{D76}$ | $R^{D6}$ | $R^{D1}$ |
| $L_{C1239}$ | $R^{D76}$ | $R^{D9}$ | $R^{D1}$ |
| $L_{C1240}$ | $R^{D76}$ | $R^{D10}$ | $R^{D1}$ |
| $L_{C1241}$ | $R^{D76}$ | $R^{D12}$ | $R^{D1}$ |
| $L_{C1242}$ | $R^{D76}$ | $R^{D15}$ | $R^{D1}$ |
| $L_{C1243}$ | $R^{D76}$ | $R^{D16}$ | $R^{D1}$ |
| $L_{C1244}$ | $R^{D76}$ | $R^{D17}$ | $R^{D1}$ |
| $L_{C1245}$ | $R^{D76}$ | $R^{D18}$ | $R^{D1}$ |
| $L_{C1246}$ | $R^{D76}$ | $R^{D19}$ | $R^{D1}$ |
| $L_{C1247}$ | $R^{D76}$ | $R^{D20}$ | $R^{D1}$ |
| $L_{C1248}$ | $R^{D76}$ | $R^{D21}$ | $R^{D1}$ |
| $L_{C1249}$ | $R^{D76}$ | $R^{D23}$ | $R^{D1}$ |
| $L_{C1250}$ | $R^{D76}$ | $R^{D24}$ | $R^{D1}$ |
| $L_{C1251}$ | $R^{D76}$ | $R^{D25}$ | $R^{D1}$ |
| $L_{C1252}$ | $R^{D76}$ | $R^{D27}$ | $R^{D1}$ |
| $L_{C1253}$ | $R^{D76}$ | $R^{D28}$ | $R^{D1}$ |
| $L_{C1254}$ | $R^{D76}$ | $R^{D29}$ | $R^{D1}$ |
| $L_{C1255}$ | $R^{D76}$ | $R^{D30}$ | $R^{D1}$ |
| $L_{C1256}$ | $R^{D76}$ | $R^{D31}$ | $R^{D1}$ |
| $L_{C1257}$ | $R^{D76}$ | $R^{D32}$ | $R^{D1}$ |
| $L_{C1258}$ | $R^{D76}$ | $R^{D33}$ | $R^{D1}$ |
| $L_{C1259}$ | $R^{D76}$ | $R^{D34}$ | $R^{D1}$ |
| $L_{C1260}$ | $R^{D76}$ | $R^{D42}$ | $R^{D1}$ |

wherein $R^{D1}$ to $R^{D81}$ has the following structures:

$R^{D1}$

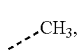

$R^{D2}$

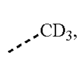

$R^{D3}$

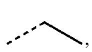

-continued $R^{D4}$

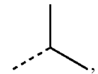

$R^{D5}$

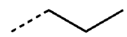

$R^{D6}$

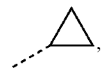

$R^{D7}$

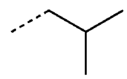

$R^{D8}$

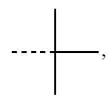

$R^{D9}$

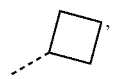

$R^{D10}$

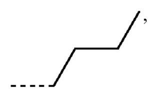

$R^{D11}$

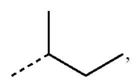

$R^{D12}$

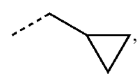

$R^{D13}$

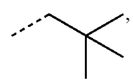

$R^{D14}$

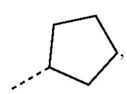

$R^{D15}$

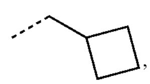

$R^{D16}$

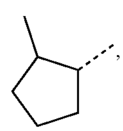

$R^{D17}$

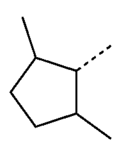

$R^{D18}$

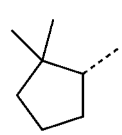

-continued
$R^{D19}$
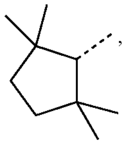
$R^{D20}$
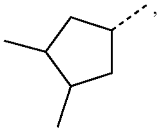
$R^{D21}$
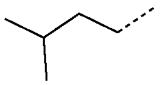
$R^{D22}$
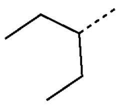
$R^{D23}$
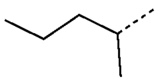
$R^{D24}$
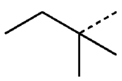
$R^{D25}$
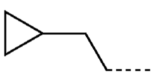
$R^{D26}$
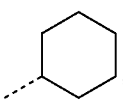
$R^{D27}$
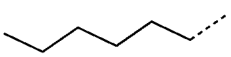
$R^{D28}$
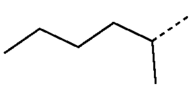
$R^{D29}$
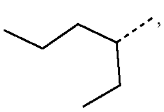
$R^{D30}$
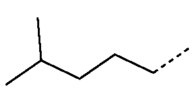
$R^{D31}$
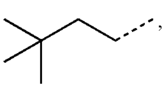
$R^{D32}$
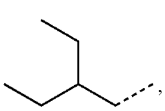
-continued
$R^{D33}$
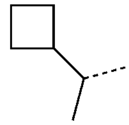
$R^{D34}$
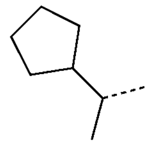
$R^{D35}$
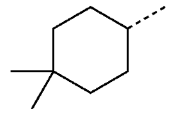
$R^{D36}$
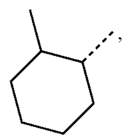
$R^{D37}$
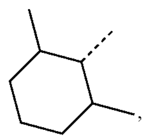
$R^{D38}$
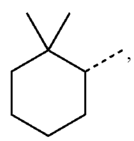
$R^{D39}$
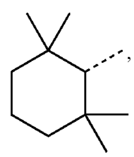
$R^{D40}$
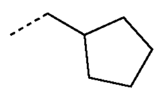
$R^{D41}$
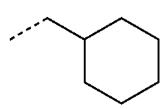
$R^{D42}$
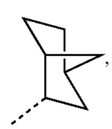
$R^{D43}$
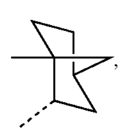

-continued
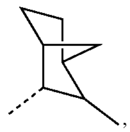
$R^{D44}$
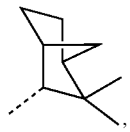
$R^{D45}$
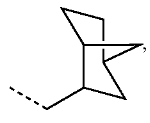
$R^{D46}$
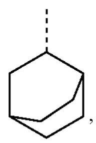
$R^{D47}$
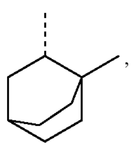
$R^{D48}$
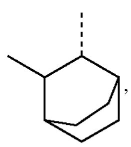
$R^{D49}$
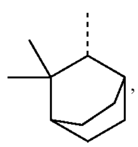
$R^{D50}$
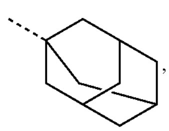
$R^{D51}$
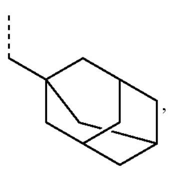
$R^{D52}$
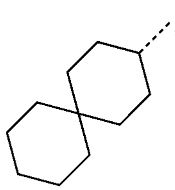
$R^{D53}$
-continued
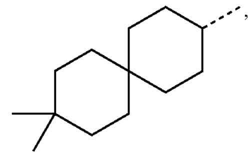
$R^{D54}$
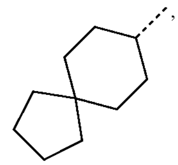
$R^{D55}$
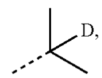
$R^{D56}$
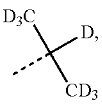
$R^{D57}$
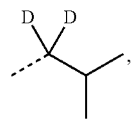
$R^{D58}$
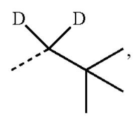
$R^{D59}$
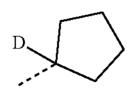
$R^{D60}$
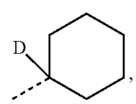
$R^{D61}$
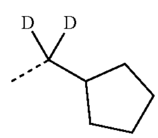
$R^{D62}$
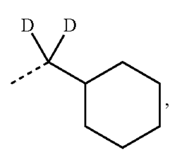
$R^{D63}$
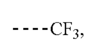
$R^{D64}$
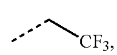
$R^{D65}$
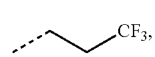
$R^{D66}$
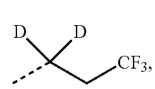
$R^{D67}$ -continued $R^{D68}$

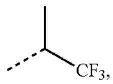

$R^{D69}$

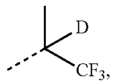

$R^{D70}$

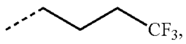

$R^{D71}$

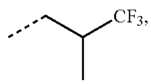

$R^{D72}$

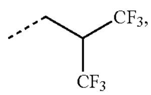

$R^{D73}$

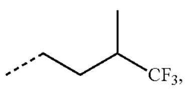

$R^{D74}$

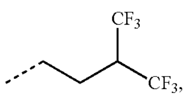

$R^{D75}$

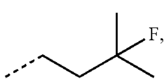

$R^{D76}$

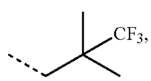

$R^{D77}$

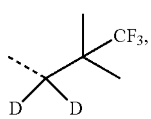

$R^{D78}$

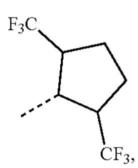

$R^{D79}$

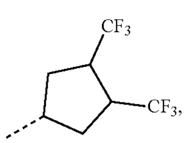

$R^{D80}$

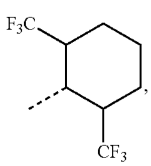

and

-continued $R^{D81}$

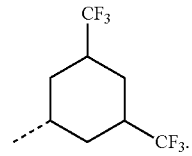

16. An organic light emitting device (OLED) comprising:
an anode;
a cathode; and
an organic layer, disposed between the anode and the cathode, comprising a compound comprising a first ligand $L_A$ of Formula I

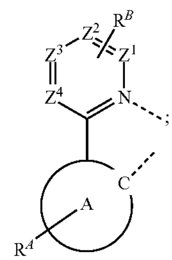

wherein ring A is a 5-membered or 6-membered carbocyclic or heterocyclic ring,
wherein $Z^1$-$Z^4$ are each independently C or N;
wherein at least two consecutive $Z^1$-$Z^4$ are C, and are fused to a structure of Formula II

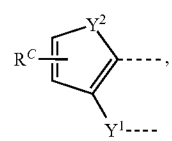

or Formula III

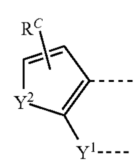

wherein $Y^1$ and $Y^2$ are each independently selected from the group consisting of O, S, Se, CRR', SiRR', and GeRR';
wherein $R^A$ and $R^C$ represent mono to the maximum possible number of substitutions on the carbon atoms of the ring attached thereto, or no substitution;
wherein $R^B$ represents di-, tri-, or tetra-substitution;
wherein each $R^A$, $R^B$, $R^C$, R, and R' is hydrogen or a substituent selected independently from the group consisting of deuterium, fluorine, alkyl, cycloalkyl, heteroalkyl, alkoxy, aryloxy, amino, silyl, alkenyl, cycloalkenyl, heteroalkenyl, aryl, heteroaryl, nitrile, isonitrile, sulfanyl, and combinations thereof;
wherein any two substituents may be joined or fused together to form a ring;

wherein $L_A$ is complexed to a metal M by the dashed lines in Formula I to form a five-membered chelate ring, and M has an atomic weight greater than 40;

wherein M is optionally coordinated to other ligands;

wherein the ligand $L_A$ is optionally linked with other ligands to comprise a tridentate, tetradentate, pentadentate, or hexadentate ligand.

17. The OLED of claim 16, wherein the organic layer is an emissive layer and the compound is an emissive dopant or a non-emissive dopant.

18. The OLED of claim 16, wherein the organic layer further comprises a host, wherein host comprises at least one chemical group selected from the group consisting of triphenylene, carbazole, dibenzothiophene, dibenzofuran, dibenzoselenophene, azatriphenylene, azacarbazole, aza-dibenzothiophene, aza-dibenzofuran, and aza-dibenzoselenophene.

19. A consumer product comprising an organic light-emitting device (OLED) comprising:

an anode;

a cathode; and an organic layer, disposed between the anode and the cathode, comprising a compound comprising a first ligand $L_A$ of Formula I

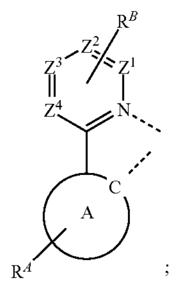

wherein ring A is a 5-membered or 6-membered carbocyclic or heterocyclic ring;

wherein $Z^1$-$Z^4$ are each independently C or N;

wherein at least two consecutive $Z^1$-$Z^4$ are C, and are fused to a structure of Formula II

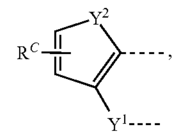

or Formula III

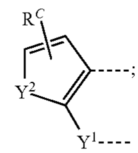

wherein $Y^1$ and $Y^2$ are each independently selected from the group consisting of O, S, Se, CRR', SiRR', and GeRR';

wherein $R^A$ and $R^C$ represent mono to the maximum possible number of substitutions on the carbon atoms of the ring attached thereto, or no substitution;

wherein $R^B$ represents di-, tri-, or tetra-substitution;

wherein each $R^A$, $R_B$, $R^C$, R, and R' is hydrogen or a substituent selected independently from the group consisting of deuterium, fluorine, alkyl, cycloalkyl, heteroalkyl, alkoxy, aryloxy, amino, silyl, alkenyl, cycloalkenyl, heteroalkenyl, aryl, heteroaryl, nitrile, isonitrile, sulfanyl, and combinations thereof;

wherein any two substituents may be joined or fused together to form a ring;

wherein $L_A$ is complexed to a metal M by the dashed lines in Formula I to form a five-membered chelate ring, and M has an atomic weight greater than 40;

wherein M is optionally coordinated to other ligands;

wherein the ligand $L_A$ is optionally linked with other ligands to comprise a tridentate, tetradentate, pentadentate, or hexadentate ligand.

20. A formulation comprising a compound of claim 1.

* * * * *